US011793075B2

(12) United States Patent
Kim et al.

(10) Patent No.: US 11,793,075 B2
(45) Date of Patent: Oct. 17, 2023

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Bitnari Kim, Gyeonggi-do (KR); Su-Hyun Lee, Gyeonggi-do (KR); Doo-Hyeon Moon, Gyeonggi-do (KR); So-Young Jung, Gyeonggi-do (KR); Du-Yong Park, Gyeonggi-do (KR); Hae-Yeon Kim, Gyeonggi-do (KR); Sang-Hee Cho, Gyeonggi-do (KR); Jin-Ri Hong, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 471 days.

(21) Appl. No.: 16/908,973

(22) Filed: Jun. 23, 2020

(65) Prior Publication Data

US 2021/0013427 A1 Jan. 14, 2021

(30) Foreign Application Priority Data

| | | |
|---|---|---|
| Jul. 8, 2019 | (KR) | 10-2019-0082067 |
| Jan. 10, 2020 | (KR) | 10-2020-0003574 |
| Jun. 2, 2020 | (KR) | 10-2020-0066488 |

(51) Int. Cl.
*H10K 85/60* (2023.01)

(52) U.S. Cl.
CPC ....... *H10K 85/6576* (2023.02); *H10K 85/622* (2023.02); *H10K 85/631* (2023.02); *H10K 85/654* (2023.02); *H10K 85/656* (2023.02); *H10K 85/6572* (2023.02); *H10K 85/6574* (2023.02)

(58) Field of Classification Search
None
See application file for complete search history.

(56) References Cited

U.S. PATENT DOCUMENTS

2019/0214572 A1* 7/2019 Cho ........................ C09K 11/06

FOREIGN PATENT DOCUMENTS

| | | | | |
|---|---|---|---|---|
| CN | 108329272 | * | 7/2018 | H01L 51/50 |
| KR | 20190013353 A | | 2/2019 | |

* cited by examiner

*Primary Examiner* — Gregory D Clark
(74) *Attorney, Agent, or Firm* — G. Creston Campbell

(57) ABSTRACT

The present disclosure relates to a plurality of host materials and an organic electroluminescent device comprising the same. By comprising the host materials according to the present disclosure, an organic electroluminescent device having a high power efficiency and/or long lifespan can be provided.

14 Claims, No Drawings

PLURALITY OF HOST MATERIALS AND ORGANIC ELECTROLUMINESCENT DEVICE COMPRISING THE SAME

TECHNICAL FIELD

The present disclosure relates to a plurality of host materials and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer [Appl. Phys. Lett. 51, 913, 1987].

The most important factor determining luminous efficiency in an organic EL device is light-emitting materials. The light-emitting materials are required to have the following features: high quantum efficiency, high movement degree of an electron and a hole, and uniformity and stability of the formed light-emitting material layer. The light-emitting material is classified into a host material and a dopant material in a functional aspect. In order to improve color purity, luminous efficiency and stability, a host and a dopant can be mixed and used. As a solvent in a solid state and an energy transmitter, the preferable characteristics of a host material should have high purity and a suitable molecular weight in order to be deposited under vacuum. Furthermore, a host material is required to have high glass transition temperature and pyrolysis temperature to achieve thermal stability, high electrochemical stability to achieve long lifespan, easy formability of an amorphous thin film, good adhesion with adjacent layers, and no movement between layers. When using such a dopant/host material system, the selection of the host materials is important since the host materials greatly affect the efficiency and lifespan of the light-emitting device.

Various compounds have been known as such host materials; however in the case of organic electroluminescent devices using conventionally known materials, there has been a demand for new materials due to high driving voltage, low efficiency and short lifespan. Accordingly, there is a need to develop the host materials that enable implementation of an organic electroluminescent device having a low voltage drive and excellent lifespan characteristic even at high luminance.

KR 2019-0013353 A discloses an organic optoelectronic device using a compound having benzonaphtho-based heteroaryl moiety as a basic skeleton with a compound having carbazole-carbazole moiety, as a host of a light-emitting layer. However, the prior art does not disclose a plurality of host materials using phenanthro-based heteroaryl moiety as a basic skeleton the same as the present disclosure.

DISCLOSURE OF INVENTION

Technical Problem

The object of the present disclosure is firstly, to provide a plurality of host materials which are able to produce an organic electroluminescent device having high power efficiency, and/or long lifespan, and secondly, to provide an organic electroluminescent device comprising the host materials.

Solution to Problem

As a result of intensive studies to solve the technical problem above, the present inventors found that the aforementioned objective can be achieved by a plurality of host materials comprising a first host material comprising a compound represented by the following formula 1 and a second host material comprising a compound represented by the following formula 2, so that the present invention was completed.

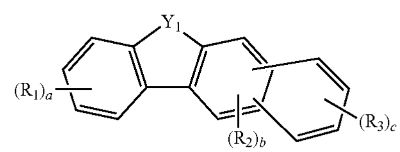

(1)

In formula 1, $Y_1$ represents O, S, $CR_{11}R_{12}$, or $NR_{13}$;

$R_{11}$ to $R_{13}$ each independently represent hydrogen, deuterium, halogen, cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or $R_{11}$ and $R_{12}$ may be linked to each other to form a ring;

$R_1$ to $R_3$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted (C1-C30)alkyl(C6-C30)arylamino, a substituted or unsubstituted mono- or di-(C6-C30)arylamino, a substituted or unsubstituted mono- or di-(3- to 30-membered)heteroarylamino, or a substituted or unsubstituted (C6-C30)aryl(3- to 30-membered)heteroarylamino; or may be linked to an adjacent substituent to form a ring;

provided that at least one of $R_{13}$, $R_2$, and $R_3$ represent(s) $-L_1-(Ar_1)_d$;

$L_1$ represents a single bond, a substituted or unsubstituted (C6-C30)arylene, or a substituted or unsubstituted (3- to 30-membered)heteroarylene;

$Ar_1$ each independently represent(s) a substituted or unsubstituted (3- to 30-membered)heteroaryl containing at least one nitrogen (N);

a and c each independently represent an integer of 1 to 4, b and d represent an integer of 1 or 2; and when a to d are 2 or more, each $R_1$, each $R_2$, each $R_3$, and each $Ar_1$ may be the same or different, (2)

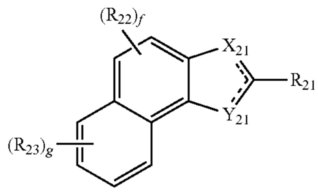

in formula 2, $X_{21}$ and $Y_{21}$ each independently represent —N═, —$NR_{24}$—, —O—, or —S—, provided that one of $X_{21}$ and $Y_{21}$ represents —N═, and the other represents —$NR_{24}$—, —O—, or —S—;

$R_{21}$ represents a substituted or unsubstituted (C6-C30)aryl or a substituted or unsubstituted (3- to 30-membered)heteroaryl;

$R_{22}$ to $R_{24}$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30)aliphatic ring and (C6-C30)aromatic ring, a substituted or unsubstituted mono- or di-(C1-C30)alkylamino, a substituted or unsubstituted mono- or di-(C6-C30)arylamino, a substituted or unsubstituted (C1-C30)alkyl(C6-C30)arylamino, a substituted or unsubstituted mono- or di-(3- to 30-membered)heteroarylamino, or a substituted or unsubstituted (C6-C30)aryl(3- to 30-membered)heteroarylamino; or may be linked to an adjacent substituent to form a ring;

provided that at least one of $R_{22}$ and $R_{23}$ represent(s) -$L_{21}$-$Ar_{21}$;

$L_{21}$ represents a single bond or a substituted or unsubstituted (C6-C30)arylene;

$Ar_{21}$ represents a substituted or unsubstituted (C6-C30) aryl, a substituted or unsubstituted (3- to 30-membered) heteroaryl, a substituted or unsubstituted fused ring of (C3-C30)aliphatic ring and (C6-C30)aromatic ring, a substituted or unsubstituted mono- or di-(C1-C30)alkylamino, a substituted or unsubstituted mono- or di-(C6-C30)arylamino, a substituted or unsubstituted (C1-C30)alkyl(C6-C30)arylamino, a substituted or unsubstituted mono- or di-(3- to 30-membered)heteroarylamino, or a substituted or unsubstituted (C6-C30)aryl(3- to 30-membered)heteroarylamino;

f represents an integer of 1 or 2, g represents an integer of 1 to 4; and when f and g are equal to 2 or more, each $R_{22}$ and each $R_{23}$ may be the same or different.

Advantageous Effects of Invention

By using a plurality of host materials according to the present disclosure, an organic electroluminescent device having high power efficiency and/or long lifespan can be prepared.

MODE FOR THE INVENTION

Hereinafter, the present disclosure will be described in detail. However, the following description is intended to explain the invention, and is not meant in any way to restrict the scope of the invention.

The present disclosure relates to a plurality of host materials comprising at least one first host material(s) comprising a compound represented by the above formula 1 and at least one second host material(s) comprising a compound represented by the above formula 2, and an organic electroluminescent device comprising the host materials.

Herein, "organic electroluminescent material" means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, or an electron injection material, etc.

Herein, "a plurality of host materials" means a host material comprising a combination of at least two compounds, which may be comprised in any light-emitting layer constituting an organic electroluminescent device. It may mean both a material before being comprised in an organic electroluminescent device (e.g., before vapor deposition) and a material after being comprised in an organic electroluminescent device (e.g., after vapor deposition). In one embodiment, a plurality of host materials of the present disclosure may be a combination of at least two host materials, and selectively, conventional materials comprised in organic electroluminescent materials may be additionally comprised. The at least two compounds comprised in the plurality of host materials of the present disclosure may be comprised together in one light-emitting layer, or may each be comprised in separate light-emitting layers by a method known in the field. For example, the at least two compounds may be mixture-evaporated or co-evaporated, or may be individually evaporated.

Herein, "hole transport zone" means a region in which holes move between a first electrode and a light-emitting layer and may include, for example, at least one of a hole injection layer, a hole transport layer, a hole auxiliary layer, a light-emitting auxiliary layer, and an electron blocking layer. The hole injection layer, the hole transport layer, the hole auxiliary layer, the light-emitting auxiliary layer, and the electron blocking layer can be a single layer or a multi-layer of which two or more layers are stacked. According to one embodiment of the present disclosure, the hole transport zone may comprise a first and a second hole transport layers. The second hole transport layer may be at least one layer of a plurality of transport layers, and further include one or more layers of a hole auxiliary layer, a light-emitting auxiliary layer, and an electron blocking layer. Further, according to another embodiment of the present disclosure, the hole transport zone may comprise a first and a second hole transport layers. The first hole transport layer may be placed between a first electrode and a light-emitting layer, and the second hole transport layer may be placed between a first hole transport layer and a light-emitting layer. Further, the second hole transport layer may be a layer serving as a hole transport layer, a light-emitting auxiliary layer, a hole auxiliary layer, and/or an electron blocking layer.

Herein, "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tent-butyl, etc. Herein, "(C3-C30)cycloalkyl" is a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. Herein, "(C3-C30)cycloalkenyl" is meant to be a mono- or polycyclic hydrocarbon having a 3 to 30 carbon atom ring backbone, which has a double bond(s), in which the number of carbon atoms is preferably 3 to 20, and more preferably 3 to 7. The above cycloalkenyl may include cyclopropenyl, cyclobutenyl, cyclopentenyl, etc. Herein, "(3- to 7-membered)heterocycloalkyl" is a cycloalkyl having 3 to 7 ring backbone atoms, preferably 5 to 7 ring backbone atoms and at least one heteroatom selected from the group consisting of B, N, O, S, Si, and P, preferably O, S, and N, and includes tetrahydrofuran, pyrrolidine, thiolan, tetrahydropyran, etc. Herein, "(C6-C30)aryl(ene)" is a monocyclic or fused ring radical derived from an aromatic hydrocarbon having 6 to 30 ring backbone carbon atoms, in which the number of the ring backbone carbon atoms is preferably 6 to 20, more preferably 6 to 15, may be partially saturated, and may comprise a spiro structure. Examples of the aryl specifically include phenyl, biphenyl, terphenyl, quaterphenyl, naphthyl, binaphthyl, phenylnaphthyl, naphthyl phenyl, fluorenyl, phenylfluorenyl, dimethylfluorenyl, diphenylfluorenyl, benzofluorenyl, diphenylbenzofluorenyl, di benzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluorene-fluorene]yl, spiro[fluorene-benzofluorene]yl, azulenyl, etc. More specifically, the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, etc. Herein, "(3- to 30-membered)heteroaryl(ene)" is an aryl having 3 to 30 ring backbone atoms, in which the number of ring backbone atoms is preferably 5 to 25, including at least one, preferably 1 to 4 heteroatoms selected from the group consisting of B, N, O, S, Si, P, and Ge. The above heteroaryl may be a monocyclic ring, or a fused ring condensed with at least one benzene ring; and may be partially saturated. Also, the above heteroaryl may be one formed by linking at least one heteroaryl or aryl group to a heteroaryl group via a single bond(s). Examples of the heteroaryl specifically may include a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acrylidinyl, silafluorenyl, germafluorenyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazole-1-yl, azacarbazole-2-yl, azacarbazole-3-yl, azacarbazole-4-yl, azacarbazole-5-yl, azacarbazole-6-yl, azacarbazole-7-yl, azacarbazole-8-yl, azacarbazole-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acrylidinyl, 2-acrylidinyl, 3-acrylidinyl, 4-acrylidinyl, 9-acrylidinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, etc. Herein, "fused ring of (C3-C30)aliphatic ring and (C6-C30) aromatic ring" means a functional group of a ring in which at least one aliphatic ring having 3 to 30 ring backbone atoms, preferably 3 to 25, more preferably 3 to 18, and at least one aromatic ring having 6 to 30 ring backbone atoms, preferably 6 to 25, more preferably 6 to 18, are fused, e.g., a fused ring of at least one benzene and at least one cyclohexane, or a fused ring of at least one naphthalene and at least one cyclopentane. Wherein a carbon atom(s) of fused ring of (C3-C30)aliphatic ring and (C6-C30)aromatic ring may be replaced at least one heteroatom(s) selected from the group consisting of B, N, O, S, Si and P, preferably N, O and S. Herein, "Halogen" includes F, Cl, Br, and I.

In addition, "ortho (o-)," "meta (m-)," and "para (p-)" are meant to signify the substitution position of all substituents. Ortho position is a compound with substituents, which are adjacent to each other, e.g., at the 1 and 2 positions on benzene. Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, "a ring formed in link to an adjacent substituent" means a substituted or unsubstituted (3- to 30-membered) mono- or polycyclic, alicyclic, aromatic ring, or a combination thereof, formed by linking or fusing two or more adjacent substituents; preferably, may be a substituted or unsubstituted (3- to 26-membered) mono- or polycyclic, alicyclic, aromatic ring, or a combination thereof. Further, the formed ring may include at least one heteroatom selected from the group consisting of B, N, O, S, Si, and P, preferably, N, O, and S. According to one embodiment of the present disclosure, the number of atoms of the ring skeleton is 5 to 20. According to another embodiment of the present disclosure, the number of atoms of the ring skeleton is 5 to 15.

In addition, "substituted" in the expression "substituted or unsubstituted" means that a hydrogen atom in a certain functional group is replaced with another atom or functional group, i.e., a substituent. The substituents of the substituted (C1-C30)alkyl, the substituted (C3-C30)cycloalkyl, the substituted (C3-C30)cycloalkenyl, the substituted (3- to 7-membered)heterocycloalkyl, the substituted (C6-C30)aryl(ene), the substituted (3- to 30-membered)heteroaryl(ene), the substituted tri(C1-C30)alkylsilyl, the substituted di(C1-C30)alkyl(C6-C30)arylsilyl, the substituted (C1-C30)alkyldi(C6-C30)arylsilyl, the substituted tri(C6-C30)arylsilyl, the substituted fused ring of (C3-C30)aliphatic ring and (C6-C30)aromatic ring, the substituted mono- or di-(C1-C30)alkylamino, the substituted (C1-C30)alkyl(C6-C30)arylamino, the substituted mono- or di-(C6-C30)arylamino, the substituted mono- or di-(3- to 30-membered)heteroarylamino, the substituted (C6-C30)aryl(3- to 30-membered)heteroarylamino, and the substituted ring, in $R_1$ to $R_4$, $R_{11}$ to $R_{13}$, $R_{21}$ to $R_{26}$, $L_1$, $Ar_1$, $L_{21}$, and $Ar_{21}$, each independently are at least one selected from the group consisting of deuterium, halogen, cyano, carboxyl, nitro, hydroxy, (C1-C30)alkyl, halo(C1-C30)alkyl, (C2-C30)alkenyl, (C2-C30)alkynyl, (C1-C30)alkoxy, (C1-C30)alkylthio, (C3-C30)cycloalkyl, (C3-C30)cycloalkenyl, (3- to 7-membered) heterocycloalkyl, (C6-C30)aryloxy, (C6-C30)arylthio, (C6-C30)aryl-substituted or unsubstituted (5- to 30-membered) heteroaryl, (5- to 30-membered)heteroaryl-substituted or unsubstituted (C6-C30)aryl, tri(C1-C30)alkylsilyl, tri(C6-C30)arylsilyl, di(C1-C30)alkyl(C6-C30)arylsilyl, (C1-C30)alkyldi(C6-C30)arylsilyl, amino, mono- or di-(C1-C30)alkylamino, (C1-C30)alkyl-substituted or unsubstituted mono- or di-(C6-C30)arylamino, (C1-C30)alkyl(C6-C30)arylamino, (C1-C30)alkylcarbonyl, (C1-C30)alkoxycarbonyl, (C6-C30)arylcarbonyl, di(C6-C30)arylboronyl, di(C1-C30)alkylboronyl, (C1-C30)alkyl(C6-C30)arylboronyl, (C6-C30)ar(C1-C30)alkyl, and (C1-C30)alkyl(C6-C30)aryl. For example, The substituents may be a substituted or unsubstituted methyl, a substituted or unsubstituted phenyl, a substituted or unsubstituted naphthyl, a substituted or unsubstituted o-biphenyl, a substituted or unsubstituted m-biphenyl, a substituted or unsubstituted p-biphenyl, a substituted or unsubstituted o-terphenyl, a substituted or unsubstituted m-terphenyl, a substituted or unsubstituted p-terphenyl, a substituted or unsubstituted phenanthrenyl, a substituted or unsubstituted chrysenyl, a substituted or unsubstituted fluoranthenyl, a substituted or unsubstituted benzofluorenyl, a substituted or unsubstituted triphenylenyl, a substituted or unsubstituted fluorenyl, a substituted or unsubstituted spirobifluorenyl, a substituted or unsubstituted spiro[benzofluorene-fluorene]yl, a substituted or unsubstituted di benzothiophenyl, a substituted or unsubstituted dibenzofuranyl, a substituted or unsubstituted benzonaphthothiophenyl, a substituted or unsubstituted benzonaphthofuranyl, a substituted or unsubstituted diphenylamino, a substituted or unsubstituted phenylbiphenylamino, a substituted or unsubstituted phenylterphenylamino, a substituted or unsubstituted naphthylphenylamino, a substituted or unsubstituted naphthylbiphenylamino, a substituted or unsubstituted naphthylterphenylamino, a substituted or unsubstituted naphthylphenanthrenylamino, a substituted or unsubstituted dibiphenylamino, a substituted or unsubstituted difluorenylamino, a substituted or unsubstituted biphenylfluorenylamino, or a substituted or unsubstituted biphenyldibenzofuranylamino, etc.

Hereinafter, the host material according to one embodiment will be described.

A plurality of host materials according to one embodiment comprise a first host material comprising compound represented by the above formula 1 and a second host material comprising compound represented by the above formula 2; and the host material may be contained in the light-emitting layer of an organic electroluminescent device according to one embodiment.

The first host materials as the host material according to one embodiment may comprise a compound represented by the following formula 1.

(1)

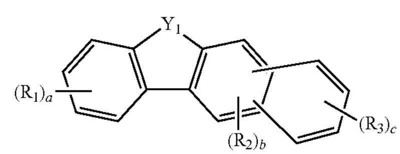

In formula 1, $Y_1$ represents O, S, $CR_{11}R_{12}$, or $NR_{13}$;

$R_{11}$ to $R_{13}$ each independently represent hydrogen, deuterium, halogen, cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or $R_{11}$ and $R_{12}$ may be linked to each other to form a ring;

$R_1$ to $R_3$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted (C1-C30)alkyl(C6-C30)arylamino, a substituted or unsubstituted mono- or di-(C6-C30)arylamino, a substituted or unsubstituted mono- or di-(3- to 30-membered)heteroarylamino, or a substituted or unsubstituted (C6-C30)aryl(3- to 30-membered)heteroarylamino; or may be linked to an adjacent substituent to form a ring;

provided that at least one of $R_{13}$, $R_2$, and $R_3$ represent(s) $-L_1-(Ar_1)_d$;

$L_1$ represents a single bond, a substituted or unsubstituted (C6-C30)arylene, or a substituted or unsubstituted (3- to 30-membered)heteroarylene;

$Ar_1$ each independently represent(s) a substituted or unsubstituted (3- to 30-membered)heteroaryl containing at least one nitrogen (N);

a and c each independently represent an integer of 1 to 4, b and d represent an integer of 1 or 2; and when a to d are equal to 2 or more, each $R_1$, each $R_2$, each $R_3$, and each $Ar_1$ may be the same or different.

In one embodiment, $Y_1$ may be O, S, $CR_{11}R_{12}$, or $NR_{13}$; $R_{11}$ and $R_{12}$ each independently may be a substituted or unsubstituted (C1-C30)alkyl or a substituted or unsubstituted (C6-C30)aryl; or may be linked to each other to form a substituted or unsubstituted (3- to 30-membered) mono- or polycyclic, alicyclic, or aromatic ring; $R_{13}$ may be a substituted or unsubstituted (C6-C30)aryl or a substituted or unsubstituted (3- to 30-membered)heteroaryl, preferably, $R_{11}$ and $R_{12}$ each independently may be a substituted or unsubstituted (C1-C10)alkyl or a substituted or unsubstituted (C6-C18)aryl; or may be linked to each other to form a substituted or unsubstituted (5- to 30-membered) polycyclic aromatic ring; $R_{13}$ may be a substituted or unsubstituted (C6-C25)aryl or a substituted or unsubstituted (5- to 30-membered)heteroaryl. More preferably, $R_{11}$ and $R_{12}$ each independently may be a substituted or unsubstituted (C1-C4)alkyl or a substituted or unsubstituted (C6-C12)aryl; or may be linked to each other to form a substituted or unsubstituted (5- to 25-membered) polycyclic aromatic ring; $R_{13}$ may be a substituted or unsubstituted (C6-C18)aryl or a substituted or unsubstituted (5- to 25-membered)heteroaryl. For example, $R_{11}$ and $R_{12}$ each independently may be a substituted or unsubstituted methyl, a substituted or unsubstituted phenyl; or may be linked to each other to form fluorene ring; and $R_{13}$ may be a substituted or unsubstituted phenyl, a substituted or unsubstituted naphthyl, a substituted or unsubstituted m-biphenyl, a substituted or unsubstituted p-biphenyl, a substituted or unsubstituted fluorenyl, a substituted or unsubstituted phenanthrenyl, or a substituted or unsubstituted dibenzothiophenyl.

In one embodiment, $R_1$ and $R_2$ each independently may be hydrogen, deuterium, a substituted or unsubstituted (C6-C30)aryl, or a substituted or unsubstituted (3- to 30-membered)heteroaryl, preferably, hydrogen, a substituted or unsubstituted (C6-C25)aryl, or a substituted or unsubstituted (5- to 25-membered)heteroaryl, more preferably, hydrogen, a substituted or unsubstituted (C6-C18)aryl, or a substituted or unsubstituted (5- to 18-membered)heteroaryl. For example, $R_1$ and $R_2$ each independently may be a substituted or unsubstituted phenyl, a substituted or unsubstituted naphthyl, a substituted or unsubstituted o-biphenyl, a substituted or unsubstituted m-biphenyl, a substituted or unsubstituted p-biphenyl, a substituted or unsubstituted carbazole, a substituted or unsubstituted dibenzofuranyl, a substituted or unsubstituted dibenzothiophenyl, or a substituted or unsubstituted phenanthrenyl.

In one embodiment, $R_3$ each independently may be hydrogen, deuterium, a substituted or unsubstituted (C6-C30)aryl, or a substituted or unsubstituted (3- to 30-membered)heteroaryl, preferably, hydrogen, a substituted or unsubstituted (C6-C25)aryl, or a substituted or unsubstituted (5- to 25-membered)heteroaryl containing at least one nitrogen(s), more preferably, hydrogen, a substituted or unsubstituted (C6-C18)aryl, or a substituted or unsubstituted (5- to 18-membered)heteroaryl containing at least two nitrogens. For example, $R_3$ each independently may be hydrogen, a substituted or unsubstituted phenyl, a substituted or unsubstituted m-biphenyl, a substituted or unsubstituted naphthyl, a substituted or unsubstituted triazinyl, a substituted or unsubstituted quinoxalinyl, a substituted or unsubstituted benzoquinoxalinyl, a substituted or unsubstituted quinazolinyl, or a substituted or unsubstituted benzoquinazolinyl.

In formula 1, at least one of $R_{13}$, $R_2$, and $R_3$ represent(s) $-L_1-(Ar_1)_d$; wherein $L_1$ may be a single bond, a substituted or unsubstituted (C6-C30)arylene, or a substituted or unsubstituted (3- to 30-membered)heteroarylene; and $Ar_1$ may be each independently represent a substituted or unsubstituted nitrogen-containing (3- to 30-membered)heteroaryl containing at least one nitrogen(s).

In one embodiment, at least one of $R_{13}$ and $R_3$ may be $-L_1-(Ar_1)_d$, preferably, $R_3$ may be $-L_1-(Ar_1)_d$.

In one embodiment, $L_1$ may be a single bond or a substituted or unsubstituted (C6-C30)arylene, preferably, a single bond or a substituted or unsubstituted (C6-C25) arylene, more preferably, a single bond or a substituted or unsubstituted (C6-C18)arylene. For example, $L_1$ may be a single bond, a substituted or unsubstituted phenylene, a substituted or unsubstituted o-biphenylene, a substituted or unsubstituted m-biphenylene, a substituted or unsubstituted naphthylene, a substituted or unsubstituted phenylnaphthylene, or a substituted or unsubstituted phenanthrenylene.

In one embodiment, $Ar_1$ each independently may be a substituted or unsubstituted nitrogen-containing (5- to 25-membered)heteroaryl containing at least one nitrogen(s), preferably, a substituted or unsubstituted nitrogen-containing (5- to 18-membered)heteroaryl containing at least two nitrogens.

$Ar_1$ according to one embodiment each independently may be a substituted or unsubstituted pyridyl, a substituted or unsubstituted pyrimidinyl, a substituted or unsubstituted triazinyl, a substituted or unsubstituted pyrazinyl, a substituted or unsubstituted pyridazinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, or a substituted or unsubstituted benzothienopyrimidinyl, preferably, a substituted or unsubstituted triazinyl, a substituted or unsubstituted quinoxalinyl, a substituted or unsubstituted benzoquinoxalinyl, a substituted or unsubstituted quinazolinyl, or a substituted or unsubstituted benzoquinazolinyl. For example, $Ar_1$ may be at least one of a substituted or unsubstituted (C6-C30)aryl- and a substituted or unsubstituted (5- to 30-membered)heteroaryl-substituted or unsubstituted, triazinyl, quinazolinyl, quinoxalinyl, benzoquinazolinyl, or benzoquinoxalinyl.

The compound represented by formula 1 may be represented by any one of the following formulas 1-1 to 1-9.

(1-1)

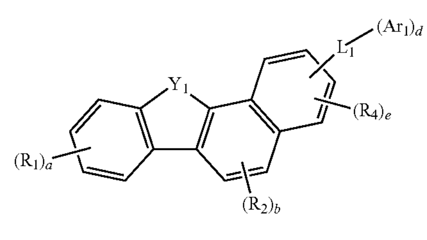

-continued (1-2)

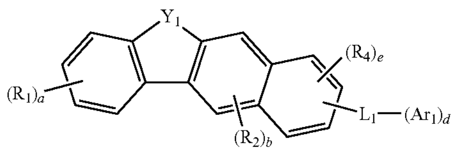

(1-3)

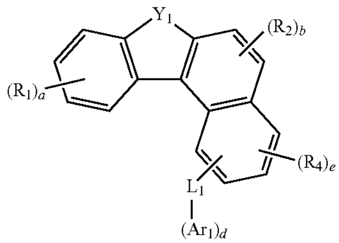

(1-4)

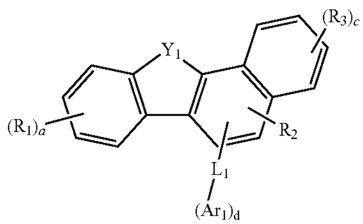

(1-5)

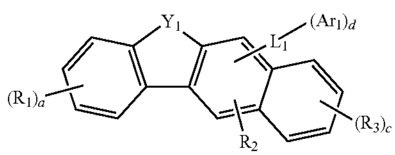

(1-6)

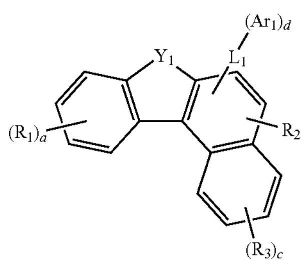

(1-7)

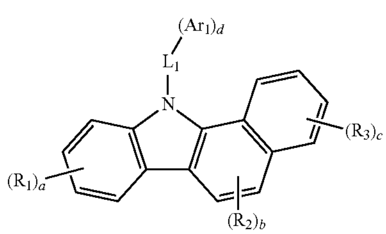

(1-8)

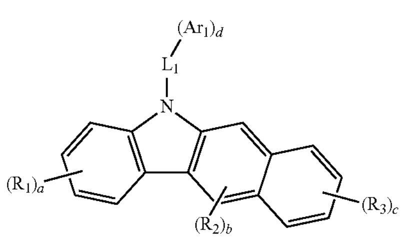

-continued (1-9)

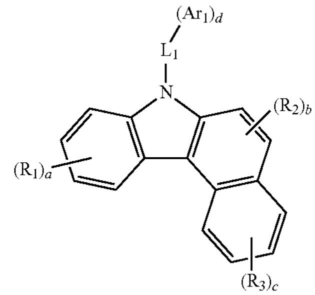

In formulas 1-1 to 1-9, $Y_1$, $L_1$, $Ar_1$, $R_1$ to $R_3$, and a to d are as defined in formula 1;

$R_4$ each independently is as defined as $R_3$; and e represents an integer of 1 to 3, and when e is equal to 2 or more, each $R_4$ may be the same or different.

In one embodiment, in formula 1-1, $Y_1$ may be O, S, $CR_{11}R_{12}$, or $NR_{13}$; $R_1$ and $R_2$ each independently may be hydrogen, a substituted or unsubstituted (C6-C30)aryl, or a substituted or unsubstituted (3- to 30-membered)heteroaryl; $L_1$ may be a single bond or a substituted or unsubstituted (C6-C30)arylene; $Ar_1$ may be a substituted or unsubstituted (3- to 30-membered)heteroaryl containing at least two nitrogens; and d may be 1.

In one embodiment, in formulas 1-2 and 1-3, $Y_1$ may be O, S, $CR_{11}R_{12}$, or $NR_{13}$; $R_1$ and $R_2$ may be all hydrogen; $L_1$ may be a single bond or a substituted or unsubstituted (C6-C30)arylene; $Ar_1$ may be a substituted or unsubstituted (3- to 30-membered)heteroaryl containing at least two nitrogens; and d may be 1.

According to one embodiment, the first host material may be illustrated by the following compounds, but is not limited thereto.

C-1

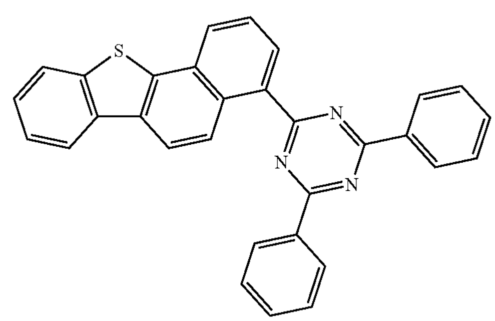

C-2

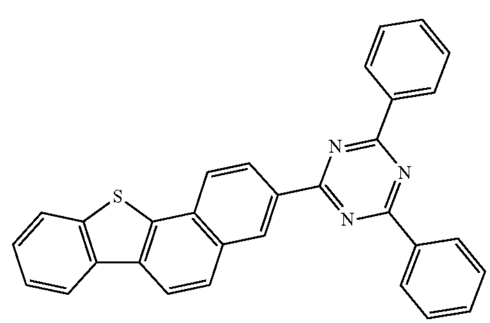

-continued
C-3
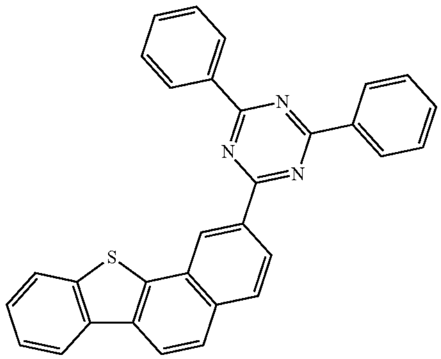
C-4
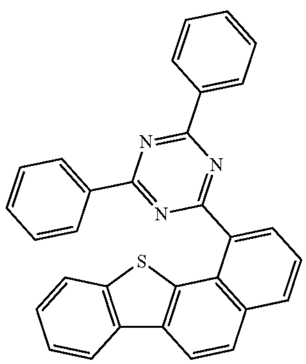
C-5
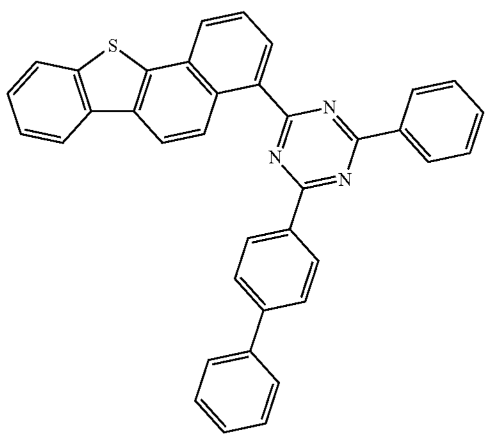
C-6
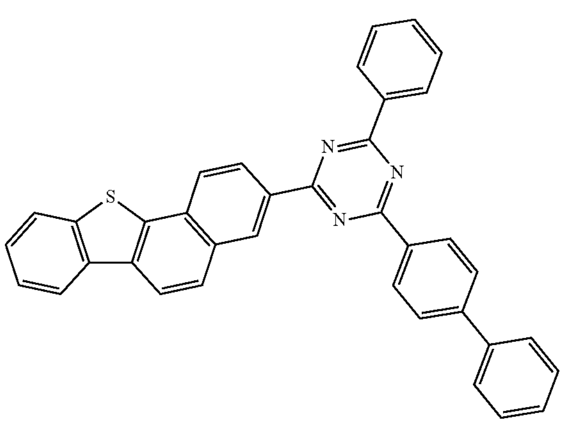
-continued
C-7
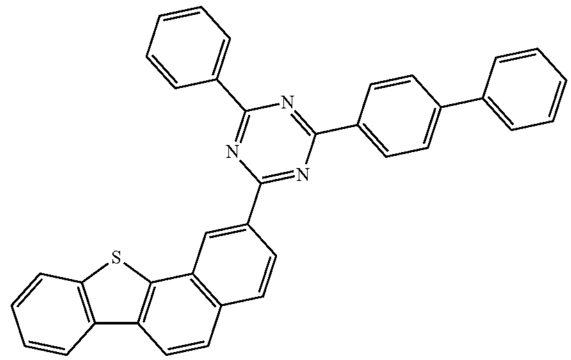
C-8
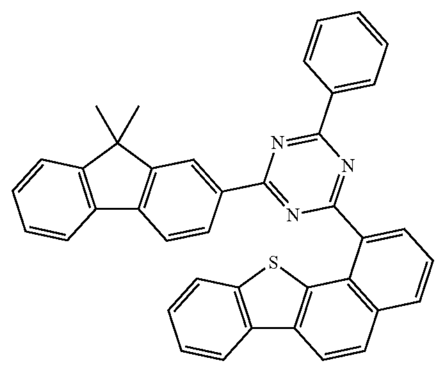
C-9
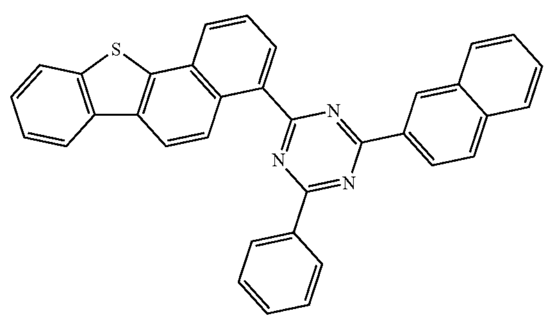
C-10
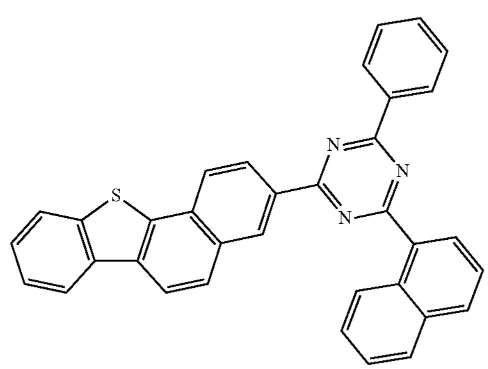

-continued
C-11
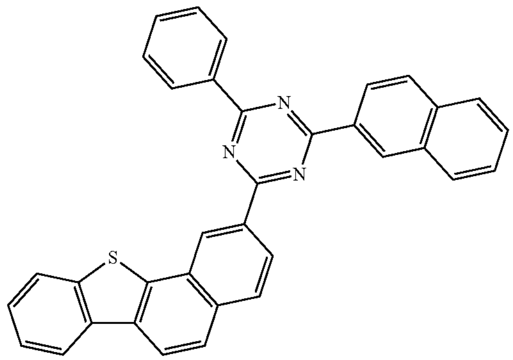
C-12
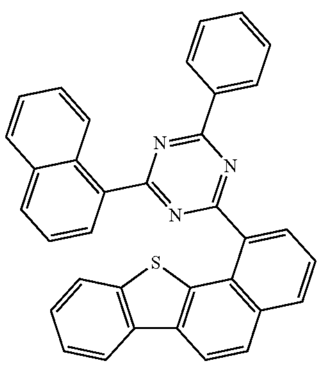
C-13
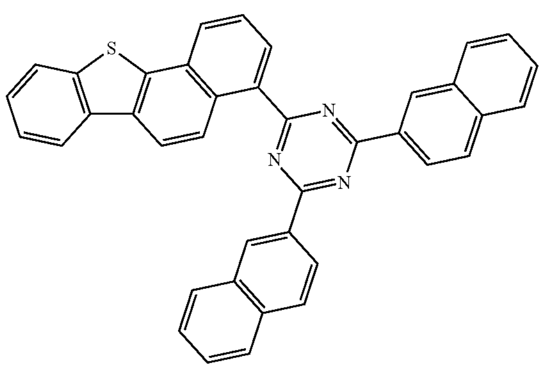
C-14
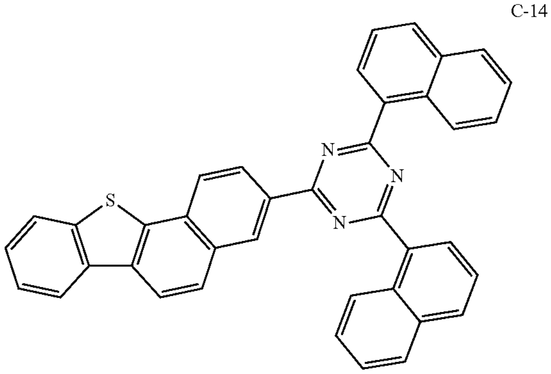
-continued
C-15
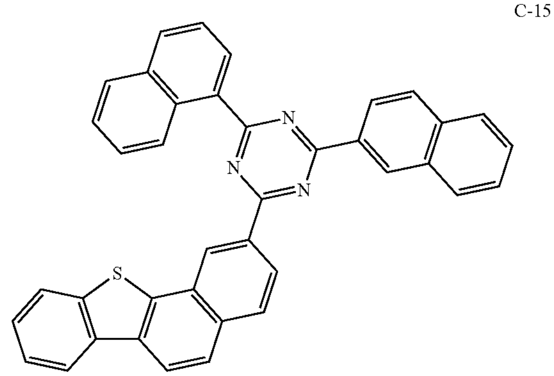
C-16
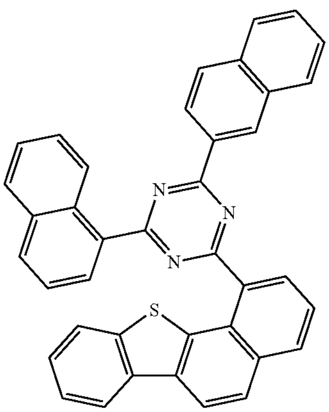
C-17
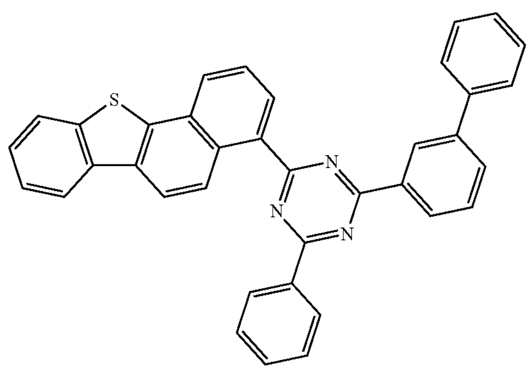
C-18
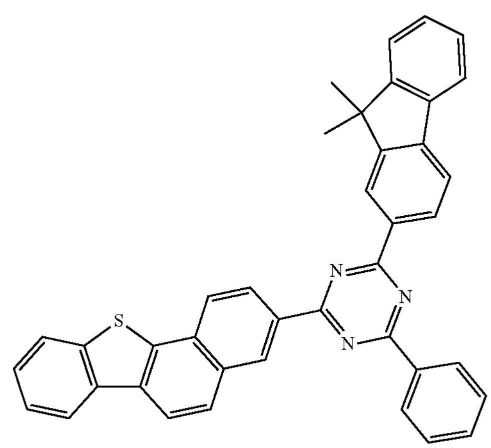

-continued
C-19
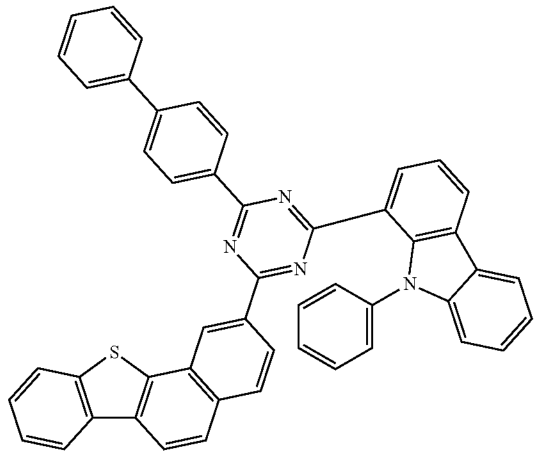
C-20
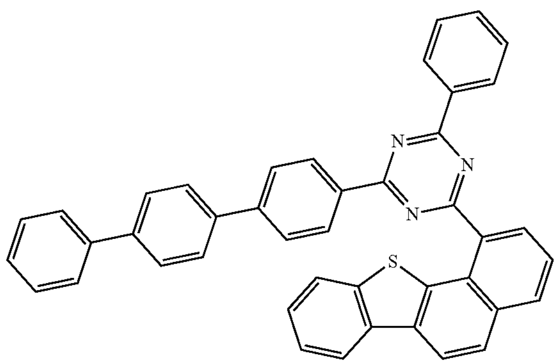
C-21
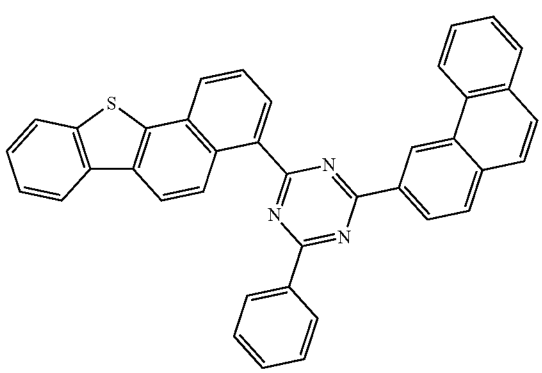
C-22
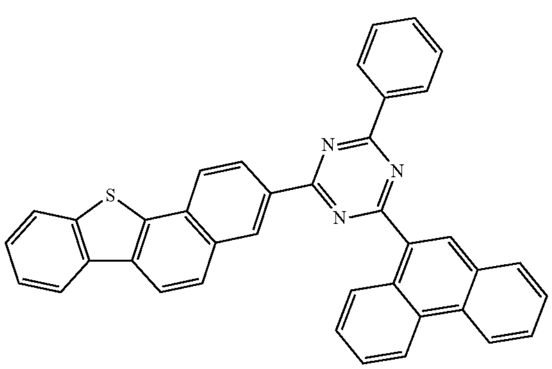
-continued
C-23
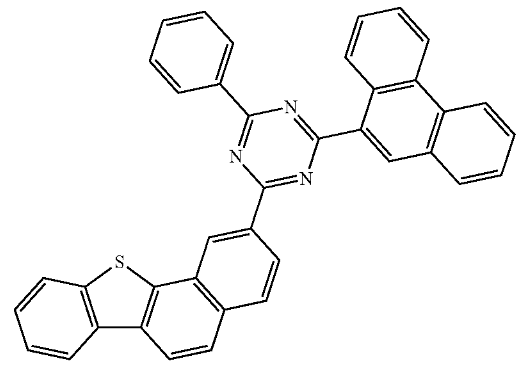
C-24
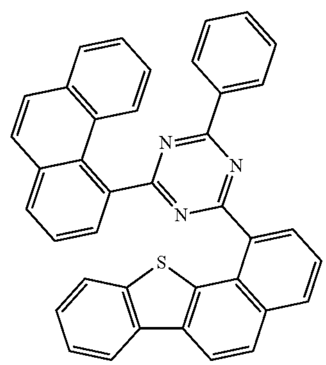
C-25
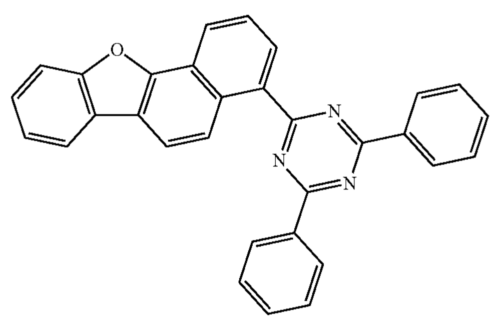
C-26
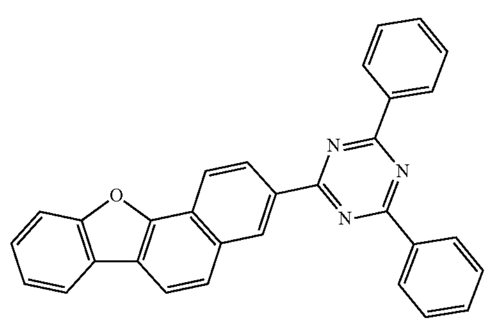

C-27
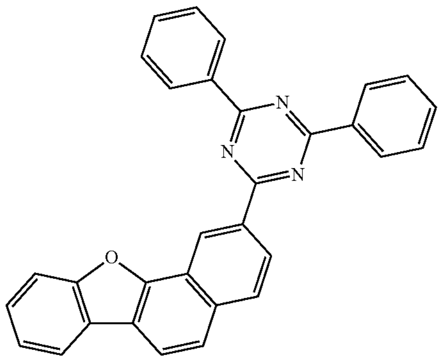
C-28
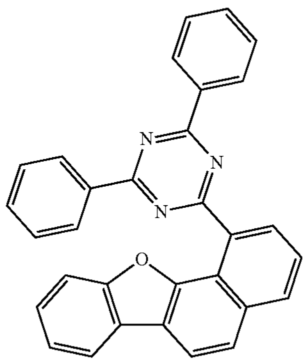
C-29
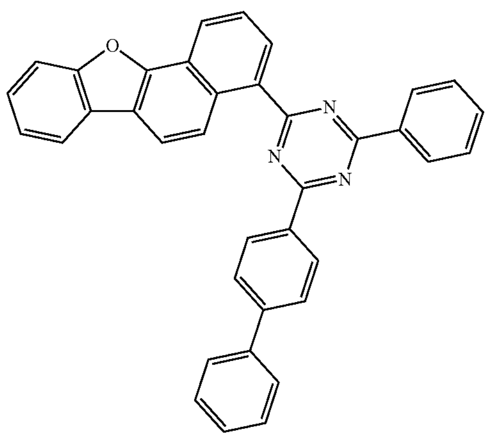
C-30
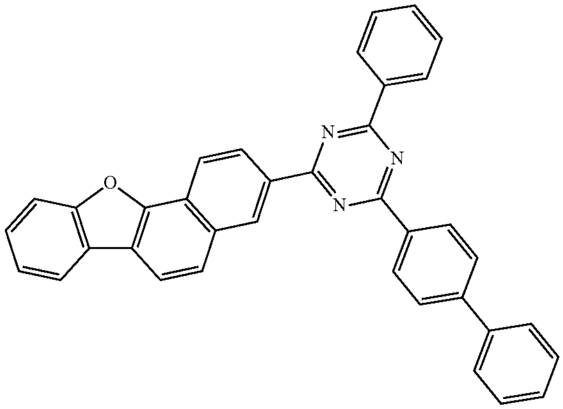
C-31
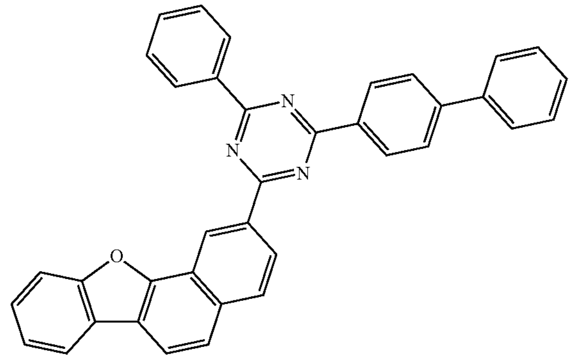
C-32
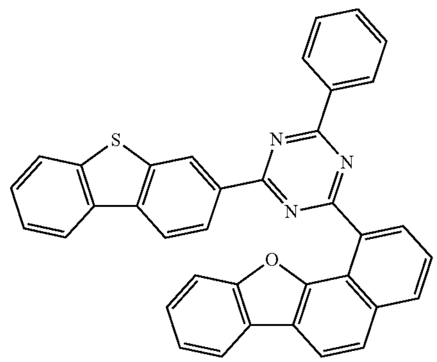
C-33
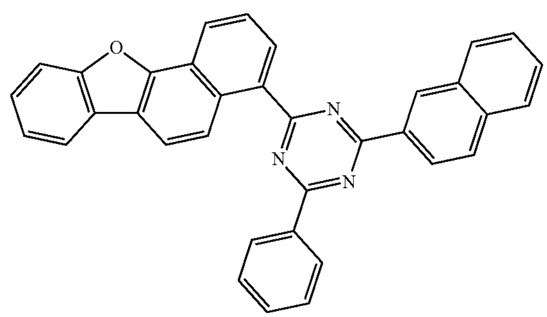
C-34
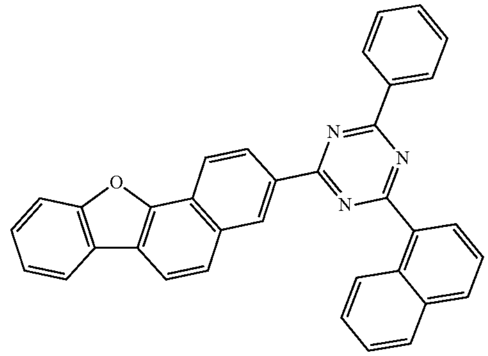

-continued
C-35
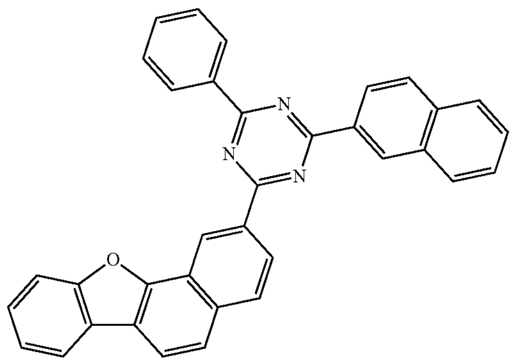
C-36
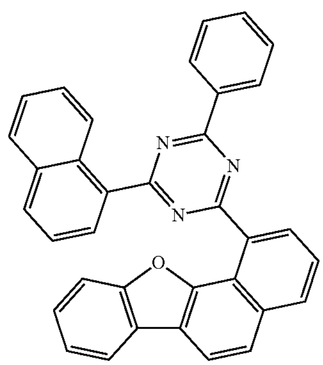
C-37
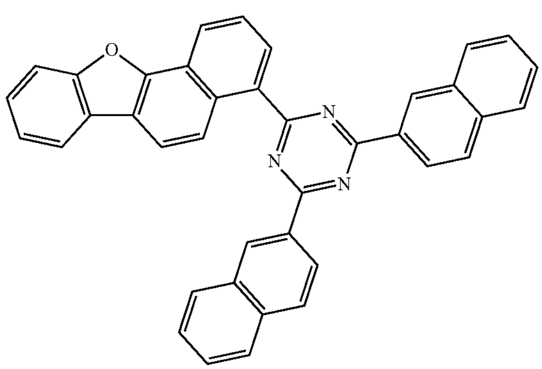
C-38
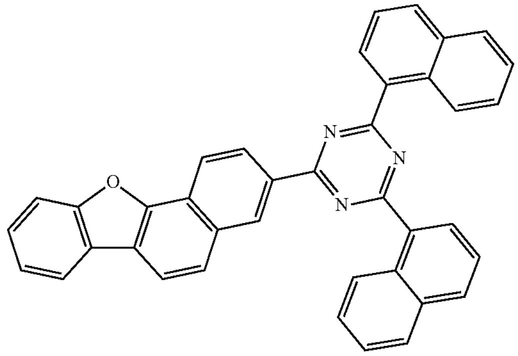
-continued
C-39
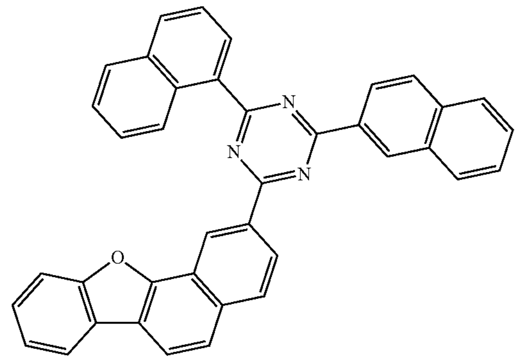
C-40
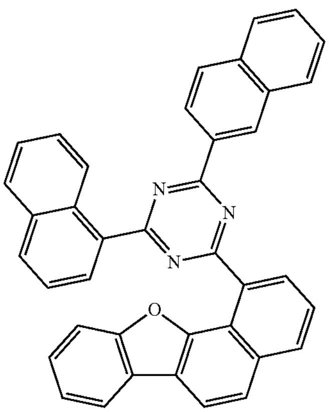
C-41
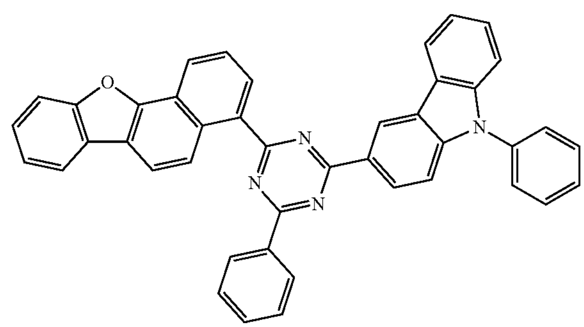
C-42
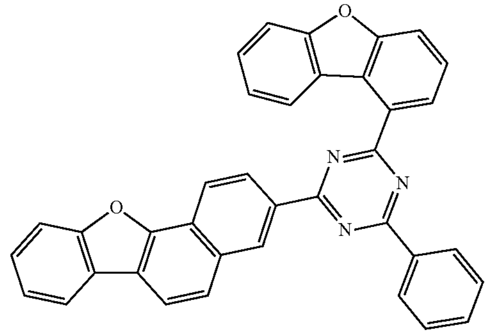

-continued
C-43
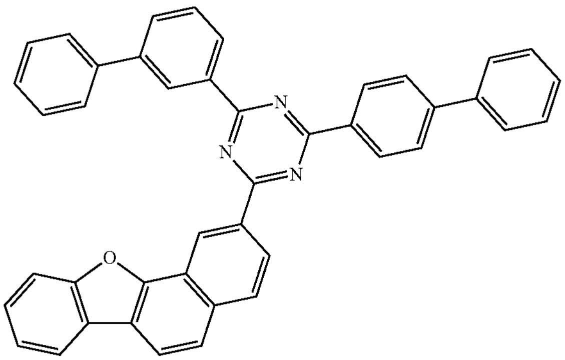
C-44
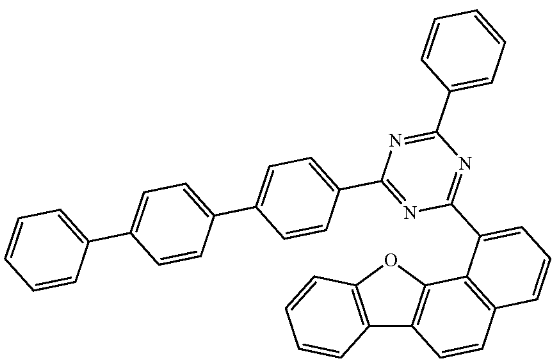
C-45
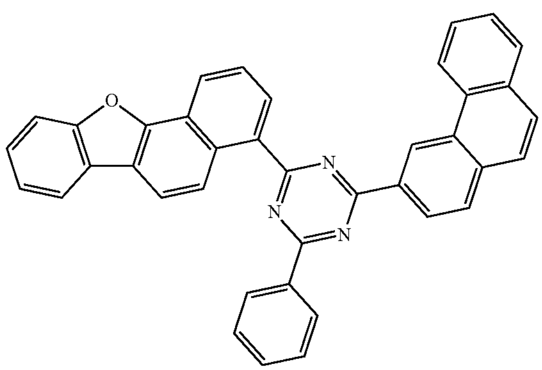
C-46
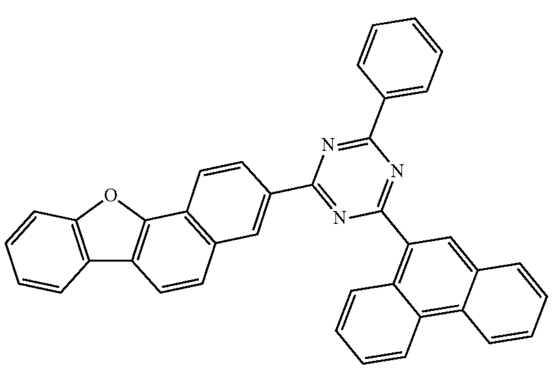
-continued
C-47
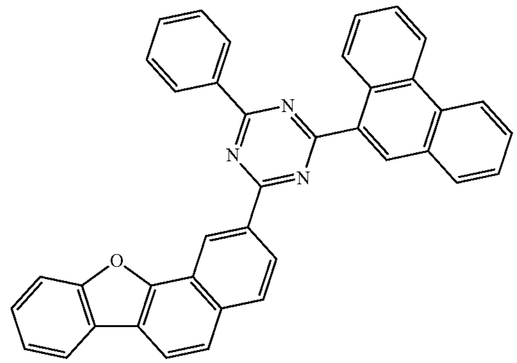
C-48
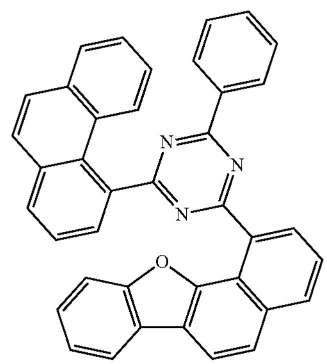
C-49
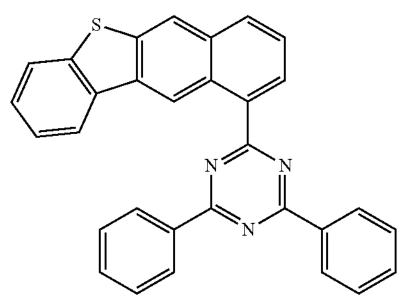
C-50
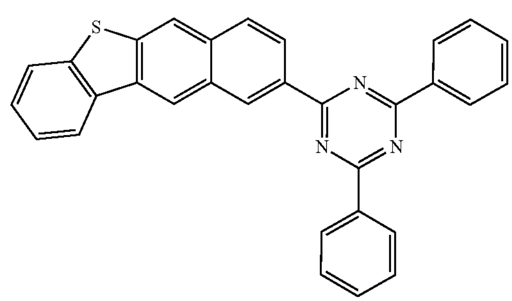

-continued
C-51
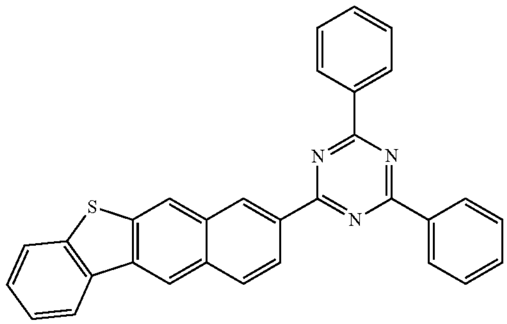
C-52
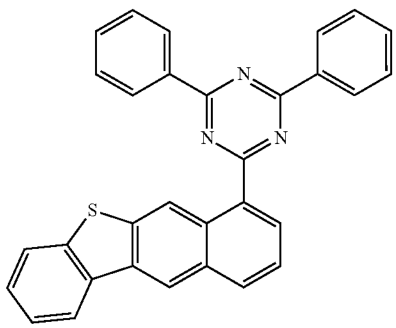
C-53
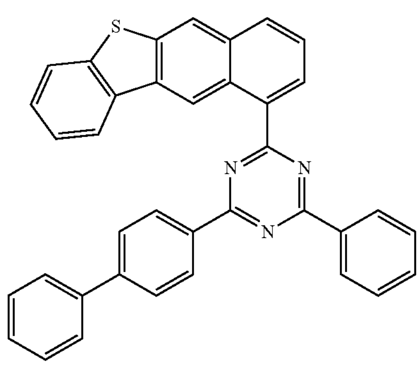
C-54
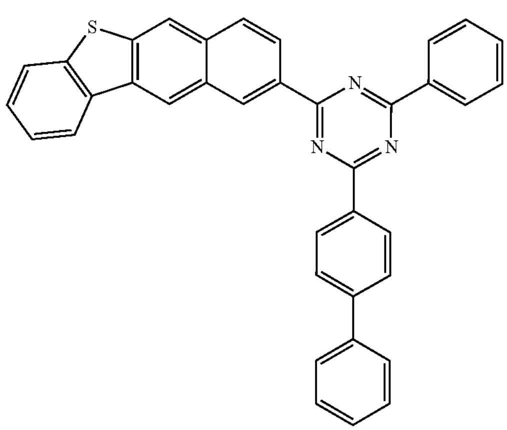
-continued
C-55
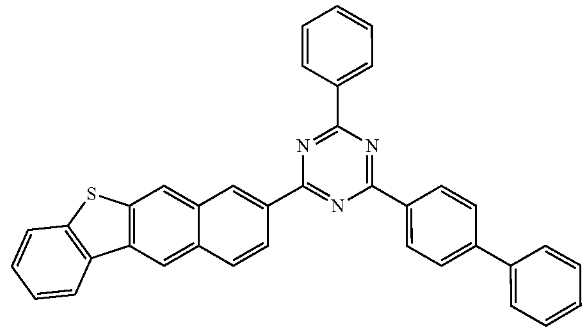
C-56
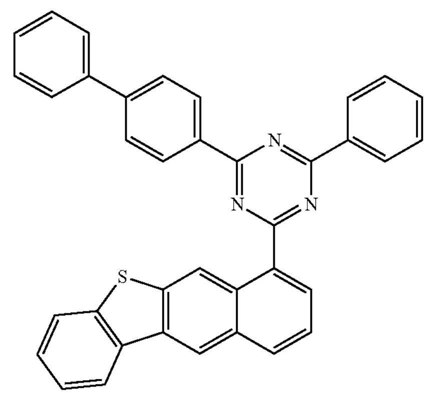
C-57
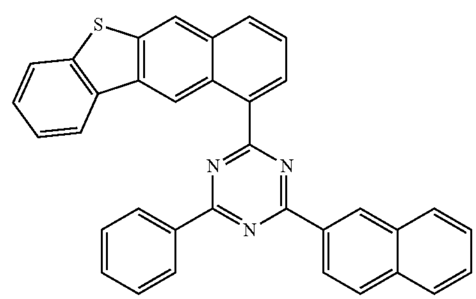
C-58
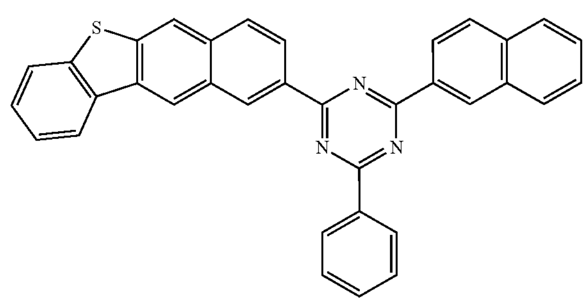

-continued
C-59
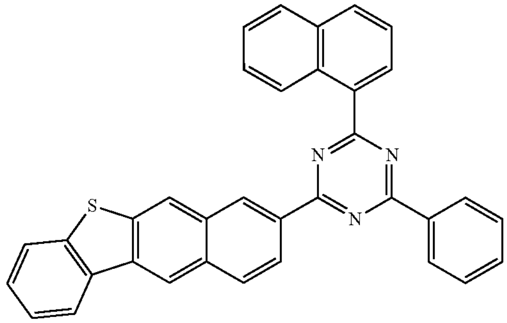
C-60
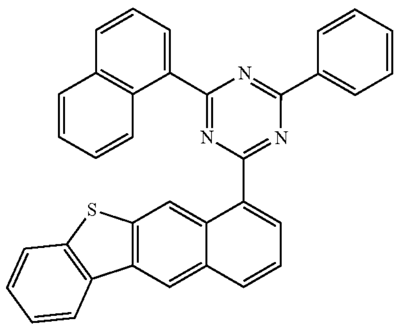
C-61
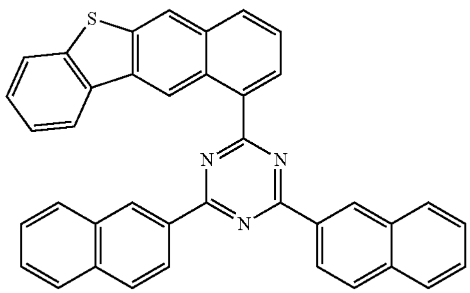
C-62
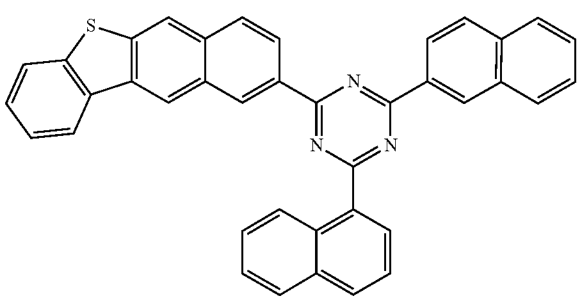
C-63
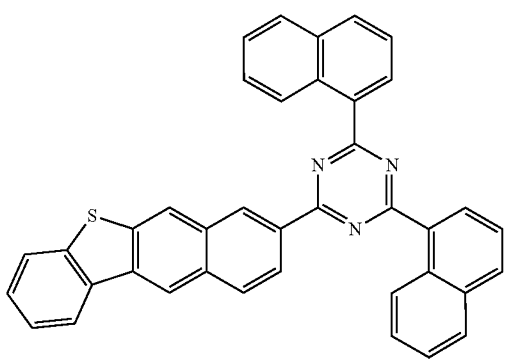
-continued
C-64
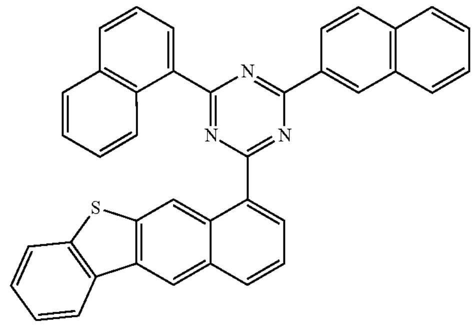
C-65
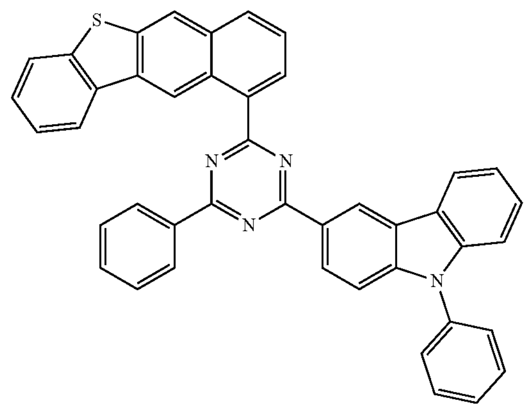
C-66
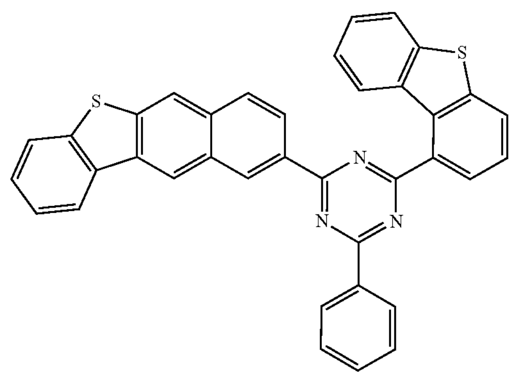
C-67
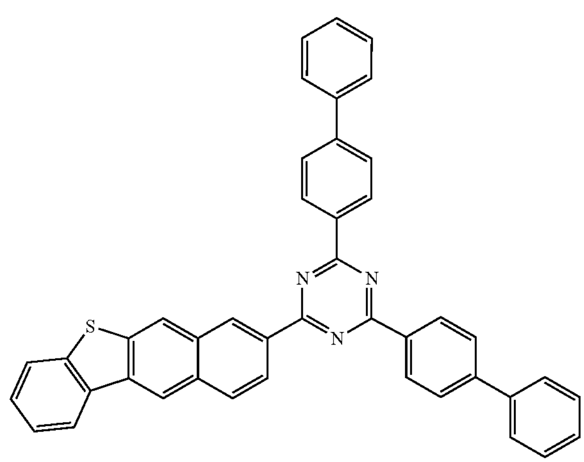

-continued
C-68
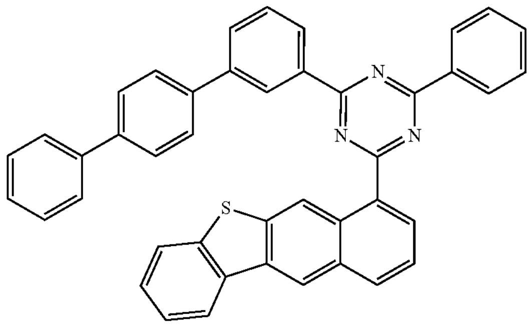
C-69
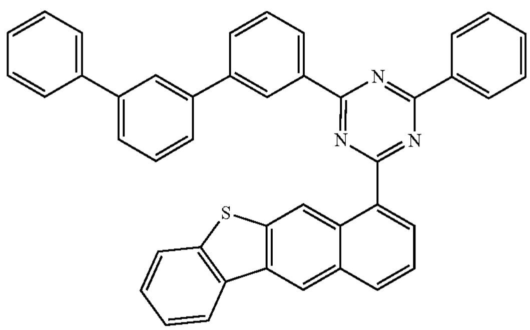
C-70
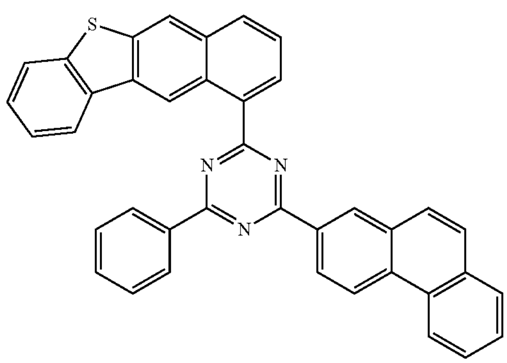
C-71
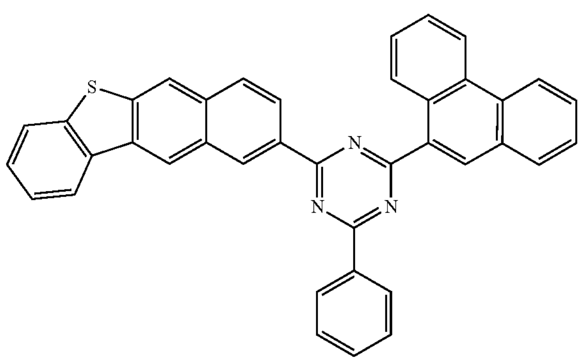
-continued
C-72
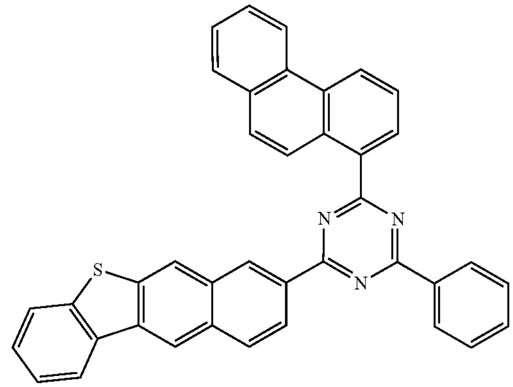
C-73
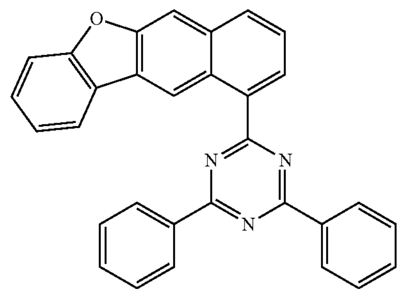
C-74
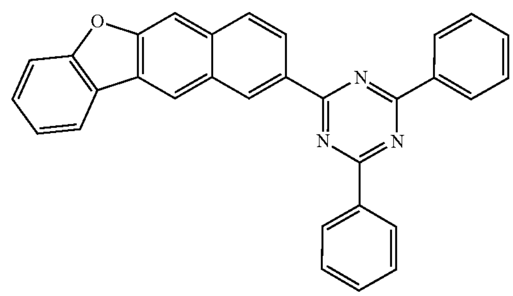
C-75
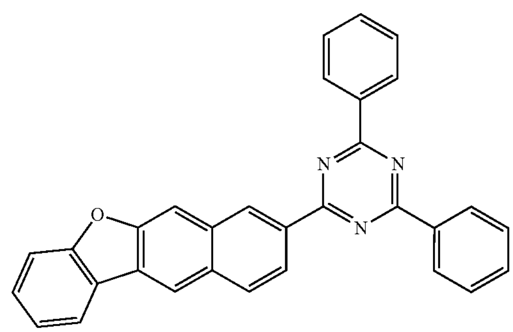
C-76
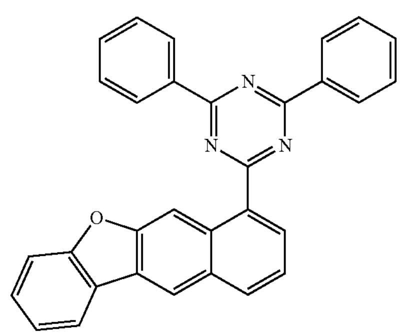

-continued
C-77
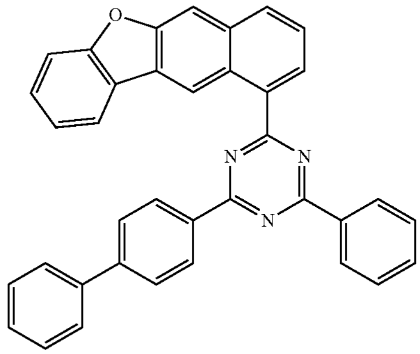
C-78
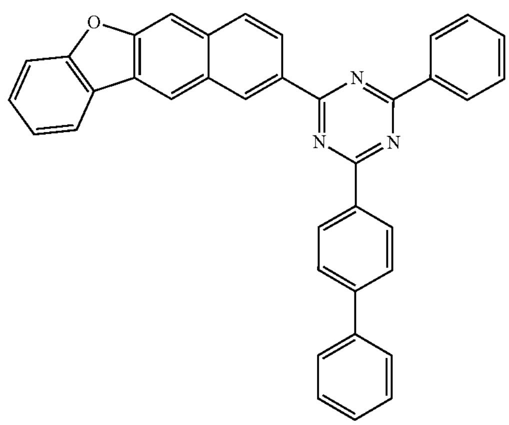
C-79
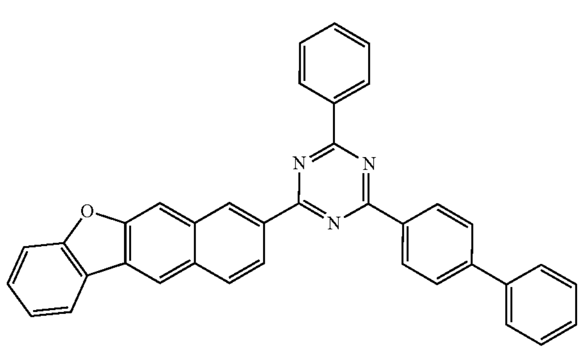
C-80
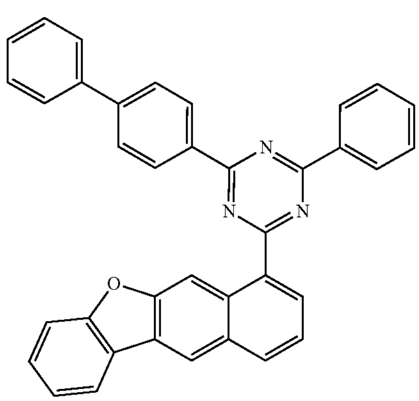
-continued
C-81
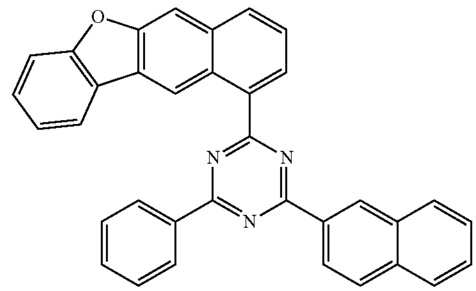
C-82
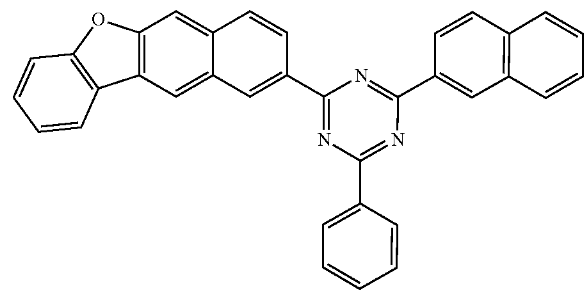
C-83
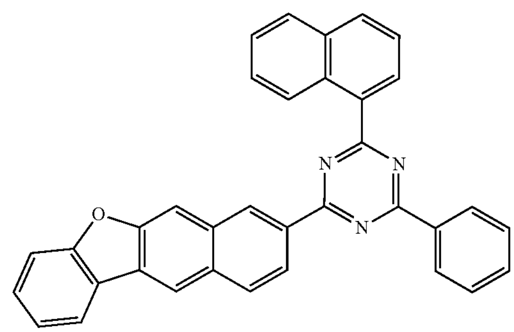
C-84
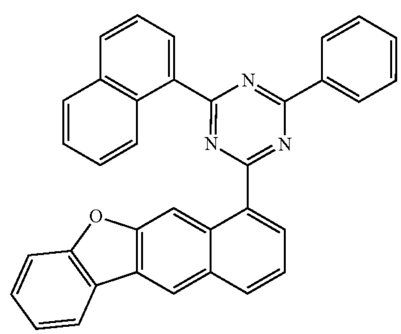
C-85
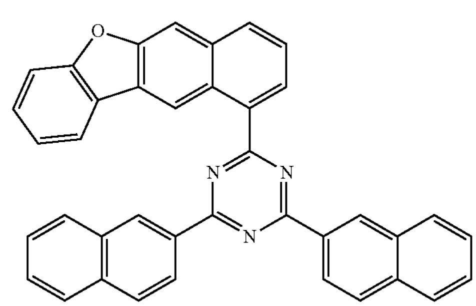

C-86
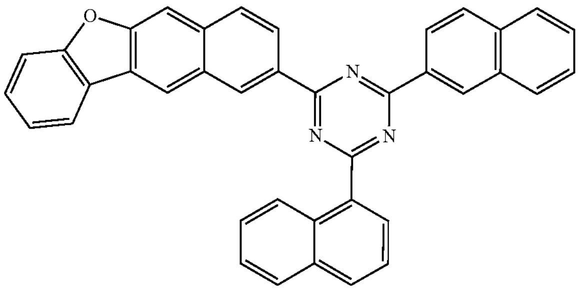
C-87
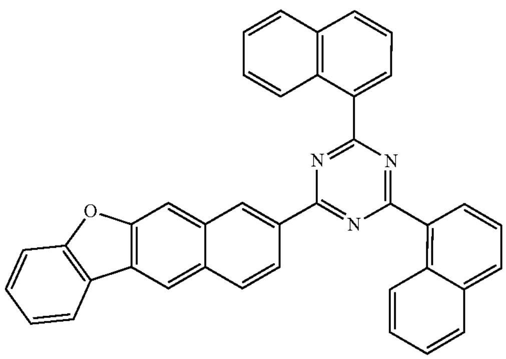
C-88
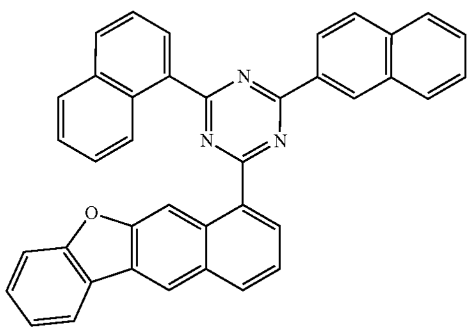
C-89
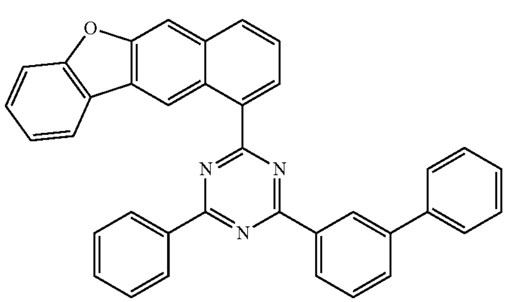
C-90
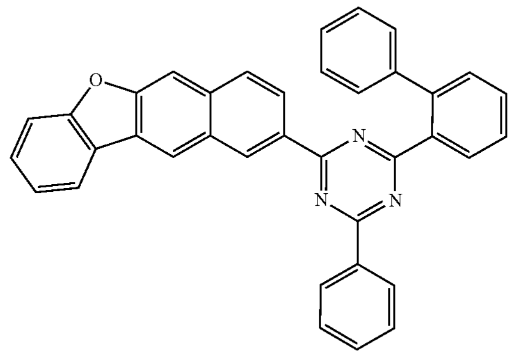
C-91
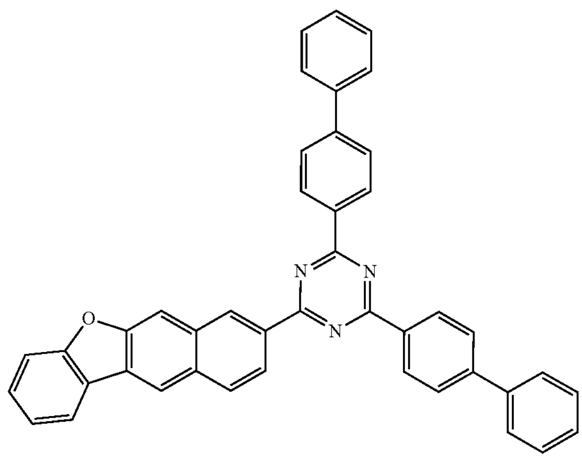
C-92
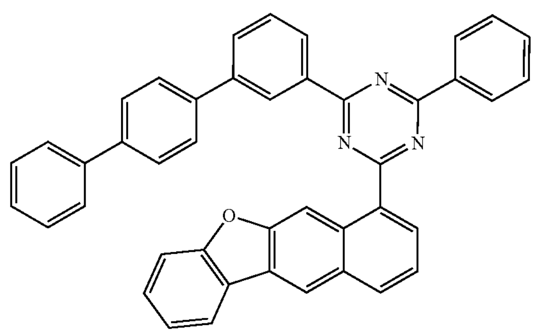
C-93
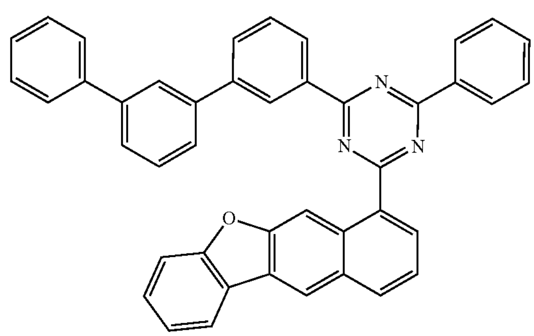

-continued
C-94
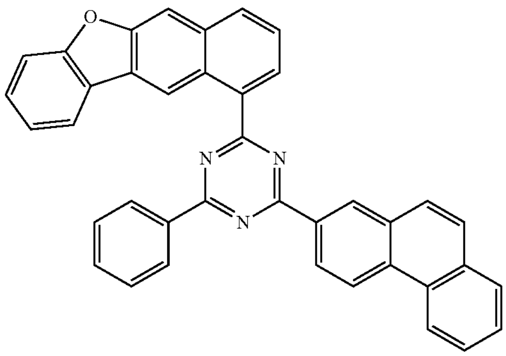
C-95
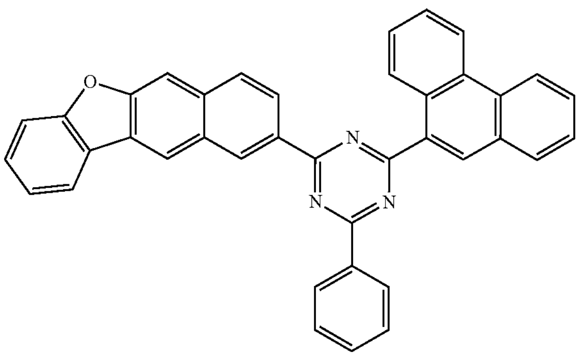
C-96
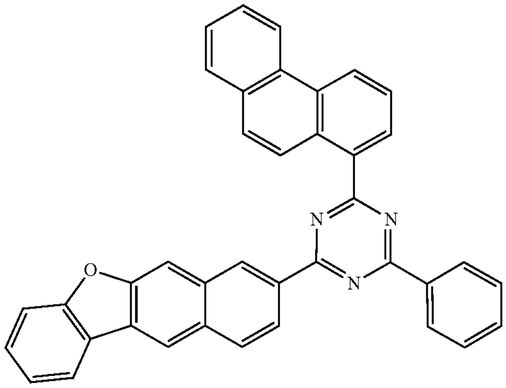
C-97
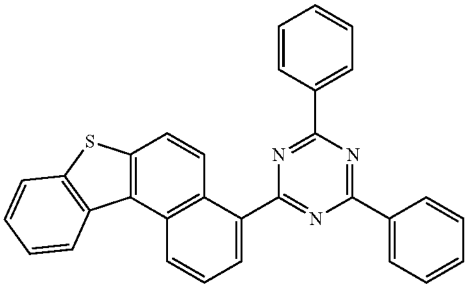
-continued
C-98
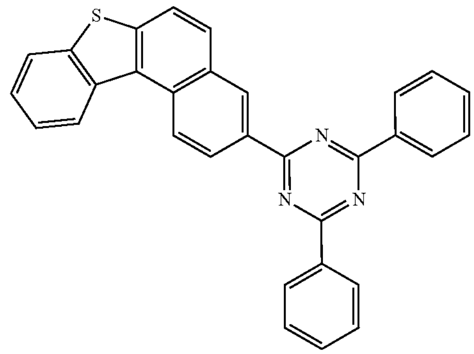
C-99
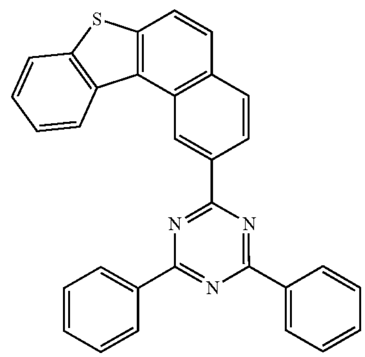
C-100
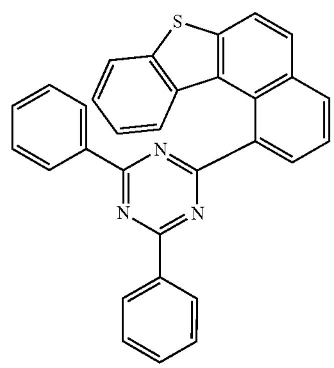
C-101
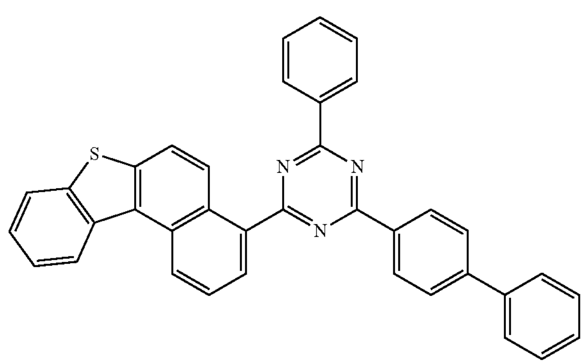

C-102
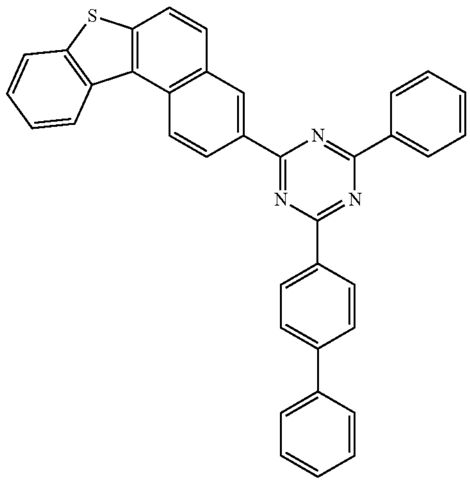
C-103
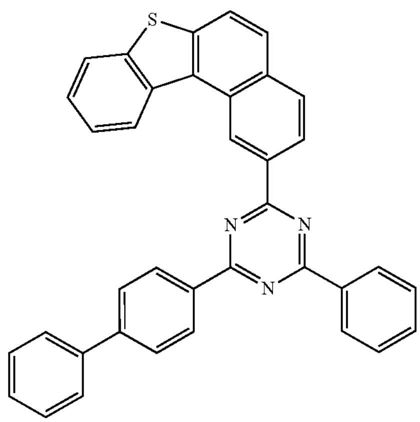
C-104
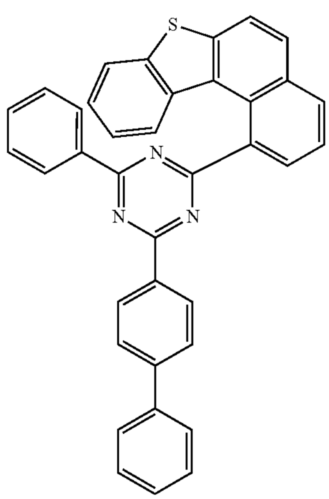
C-105
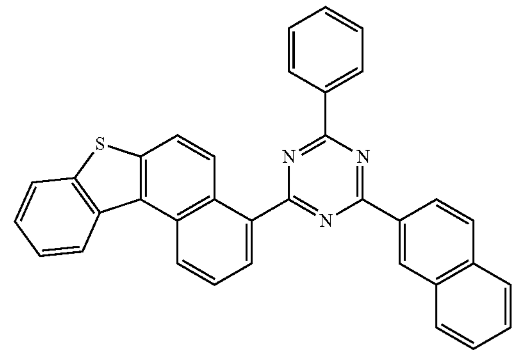
C-106
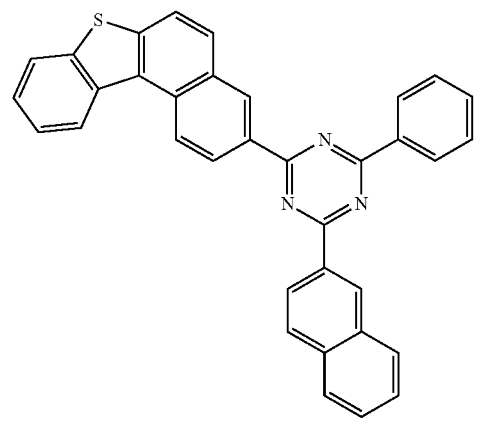
C-107
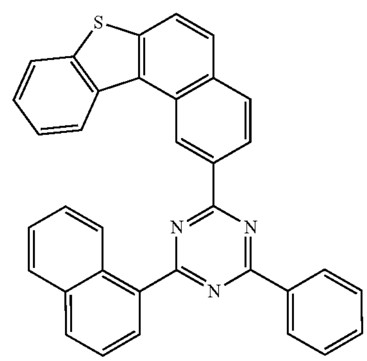
C-108
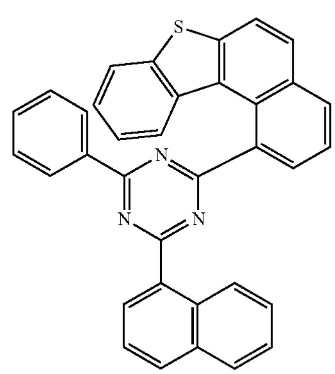

-continued
C-109
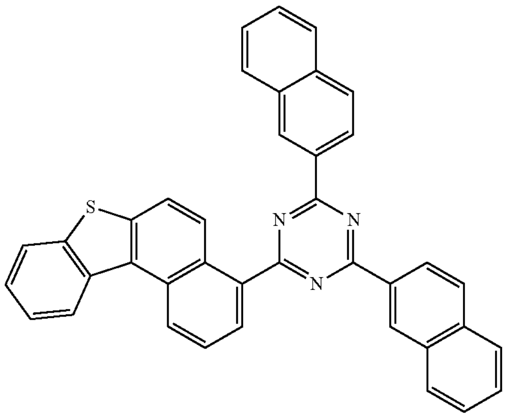
C-110
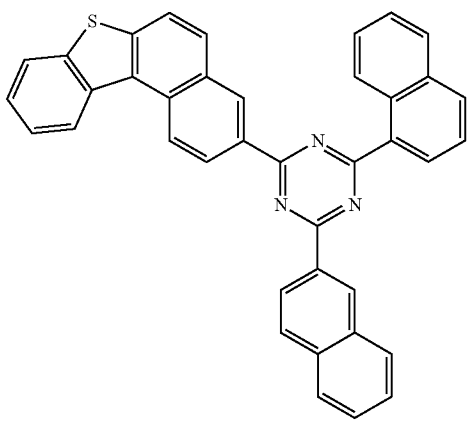
C-111
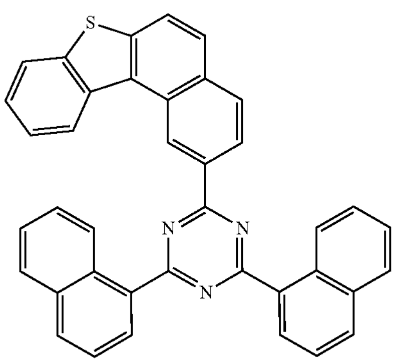
C-112
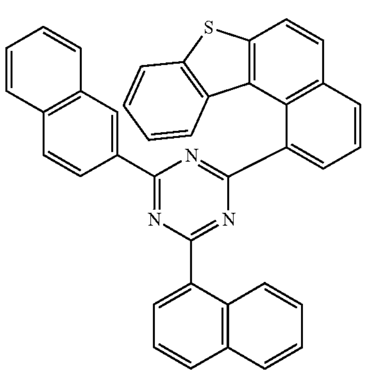
-continued
C-113
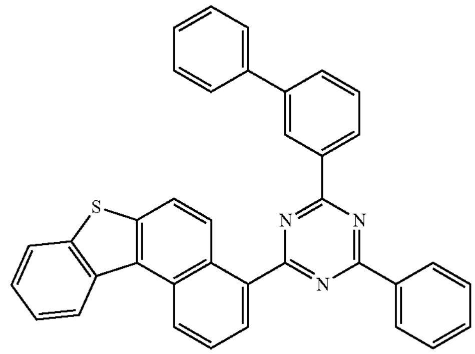
C-114
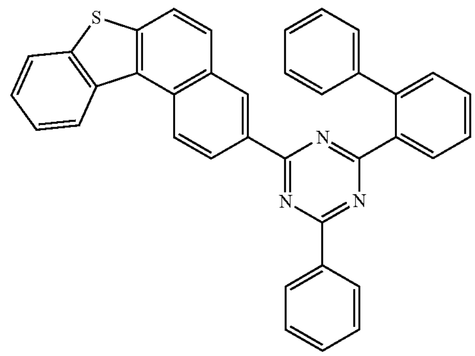
C-115
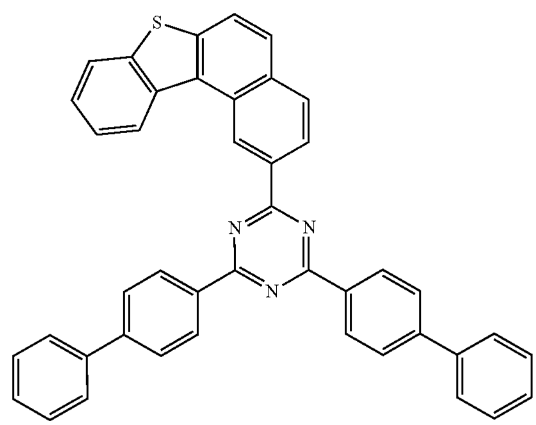
C-116
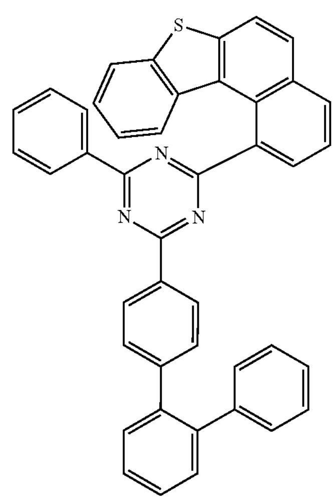

-continued
C-117
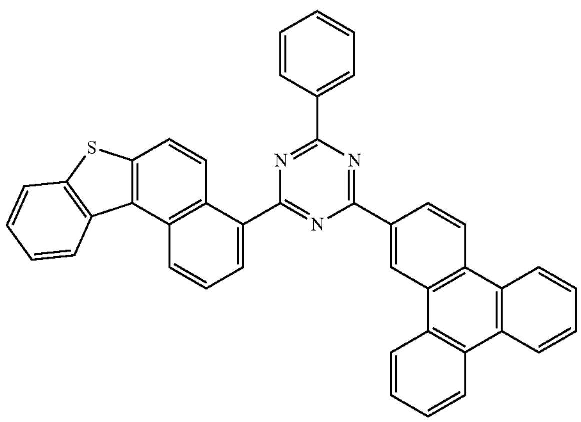
C-118
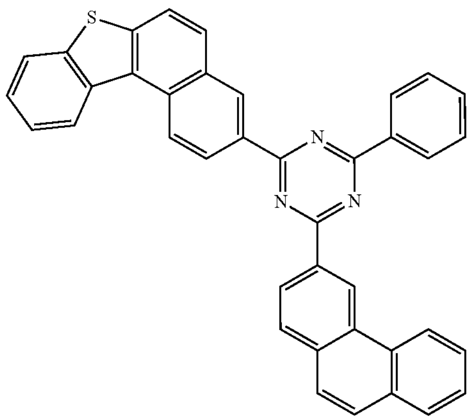
C-119
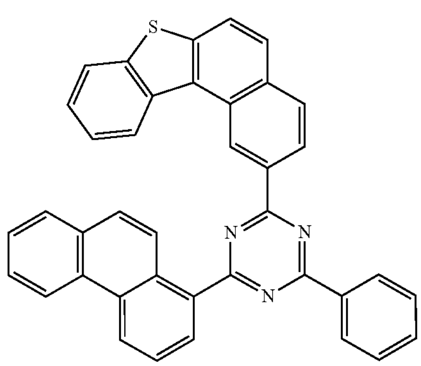
C-120
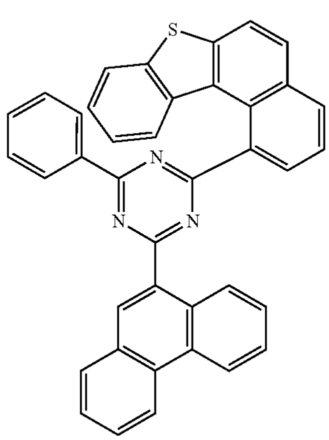
-continued
C-121
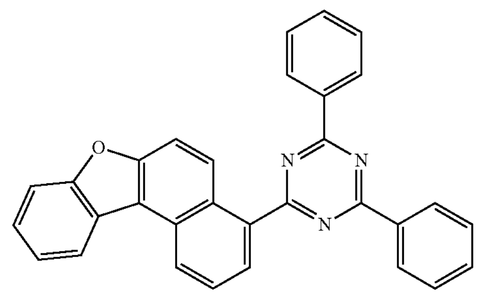
C-122
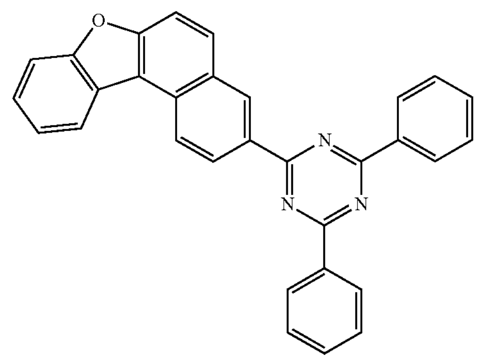
C-123
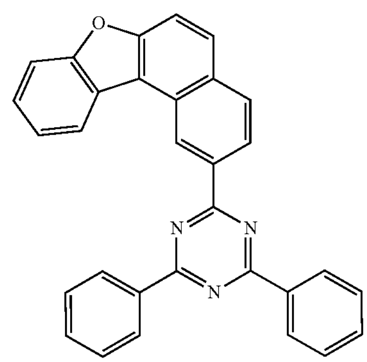
C-124
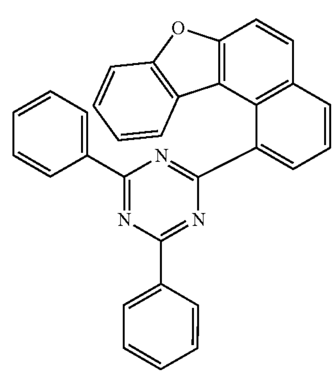

-continued
C-125
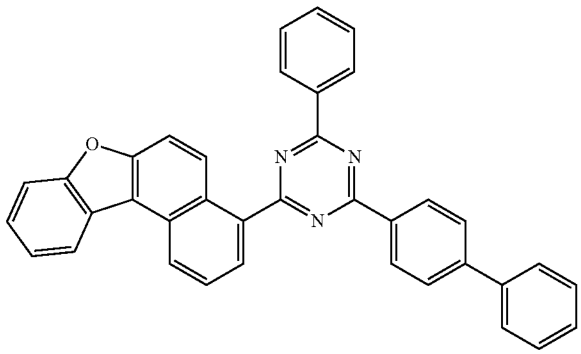
C-126
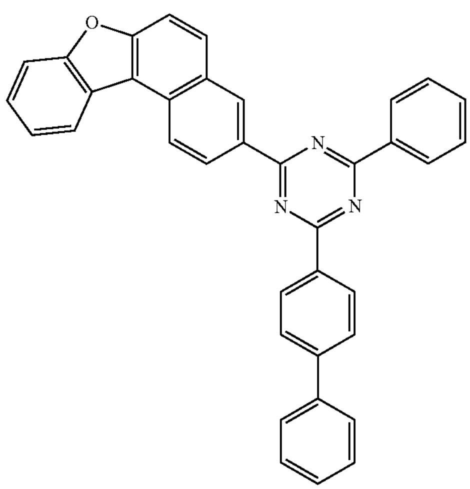
C-127
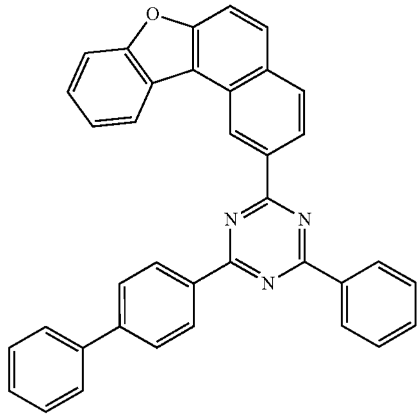
-continued
C-128
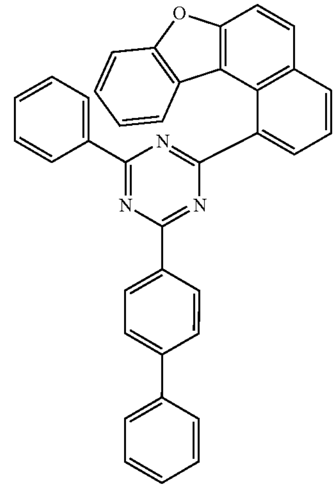
C-129
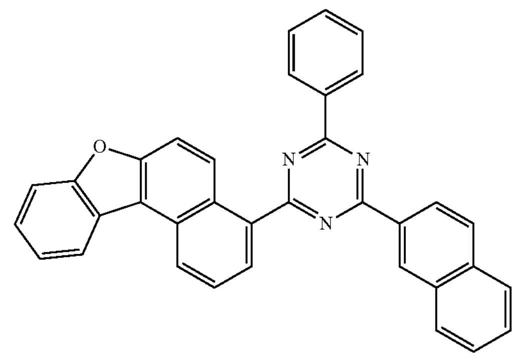
C-130
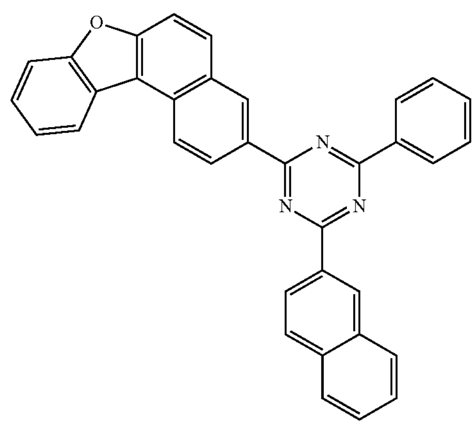
C-131
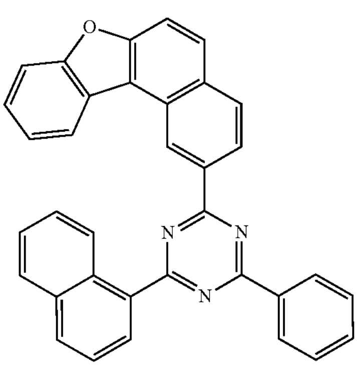

C-132
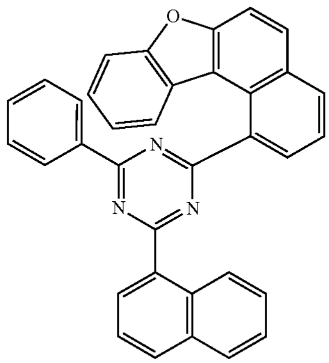
C-133
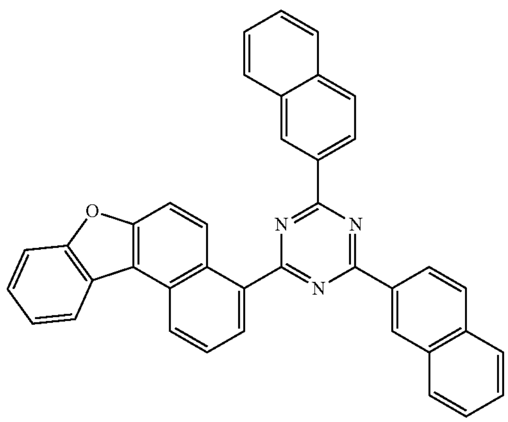
C-134
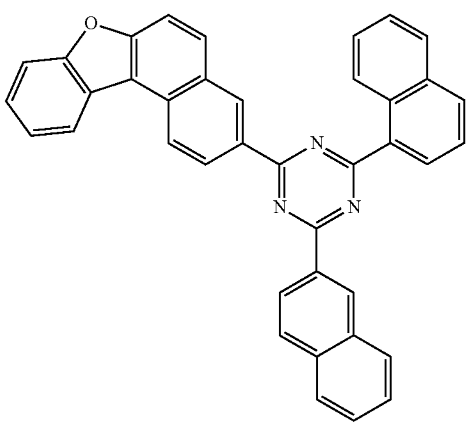
C-135
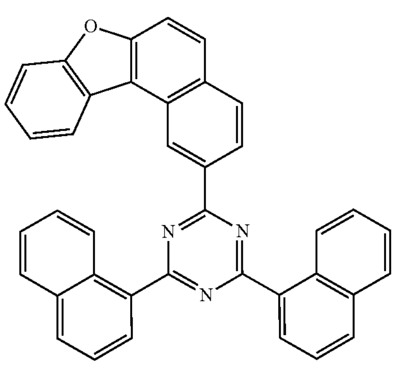
C-136
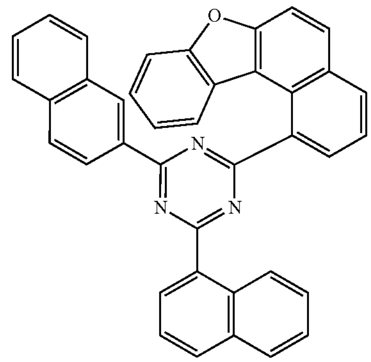
C-137
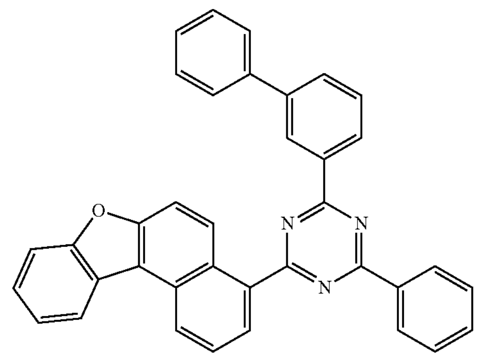
C-138
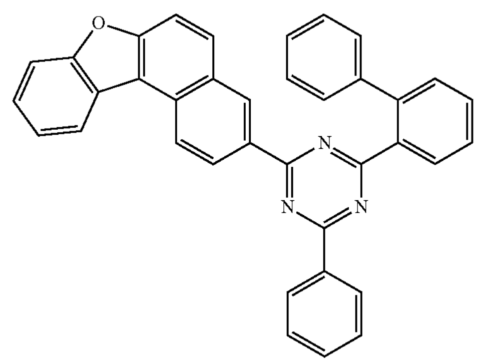
C-139
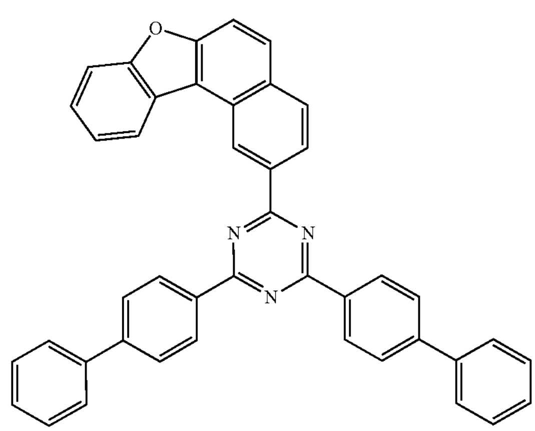

-continued
C-140
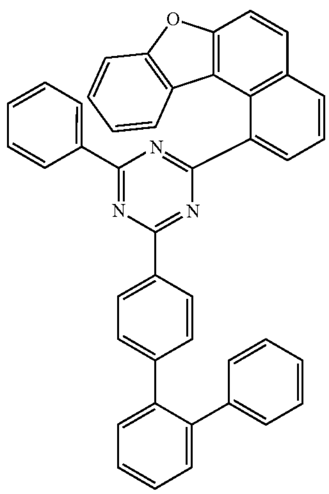
C-141
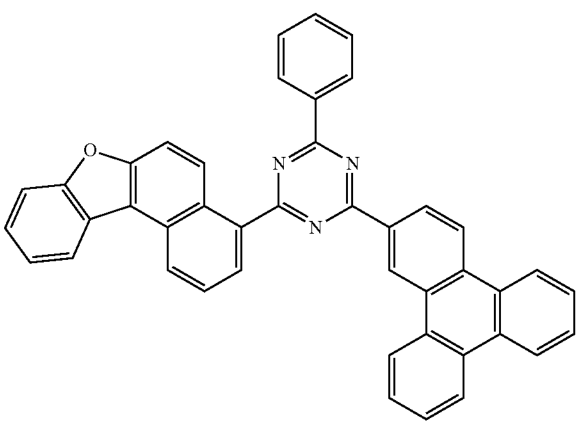
C-142
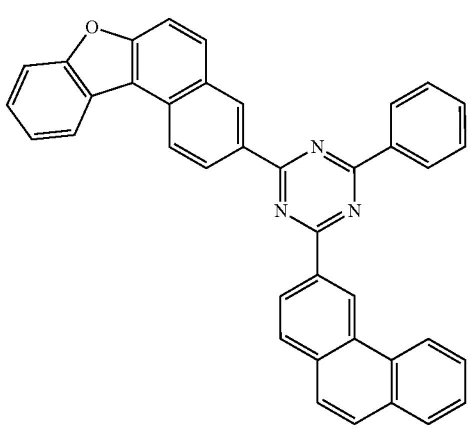
-continued
C-143
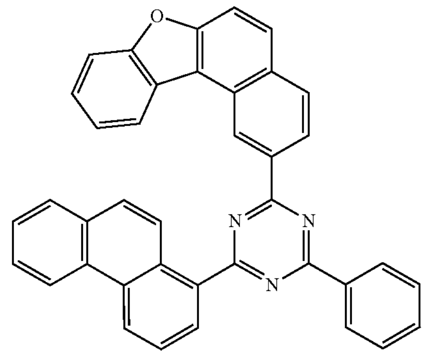
C-144
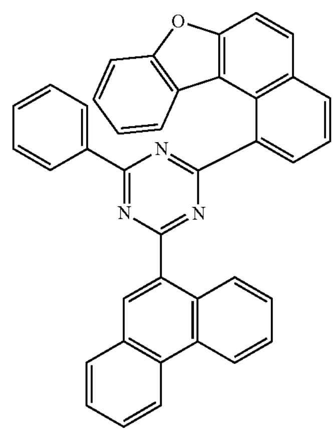
C-145
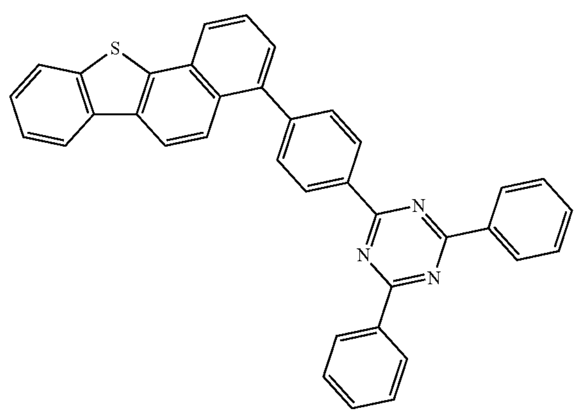
C-146
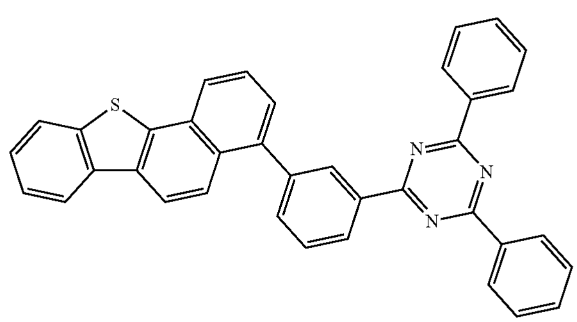

-continued
C-147
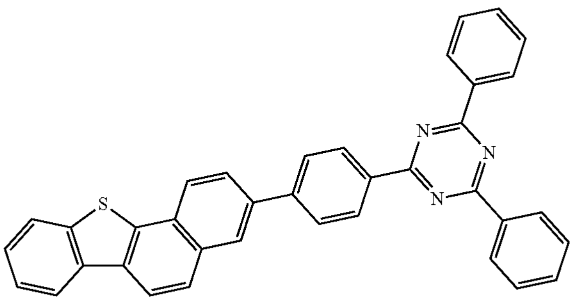
C-148
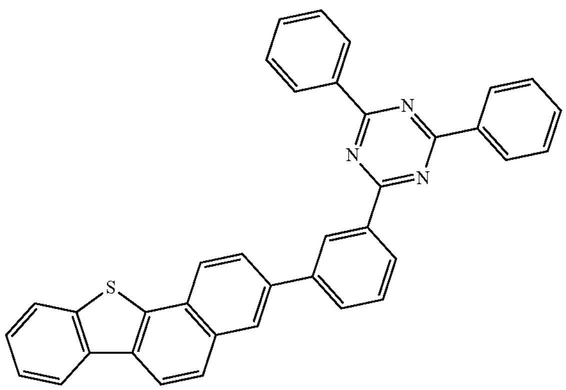
C-149
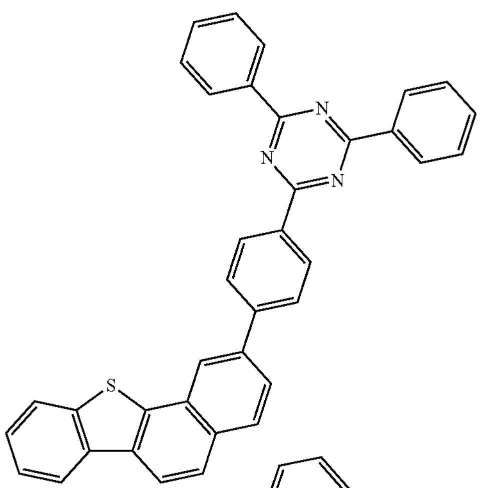
C-150
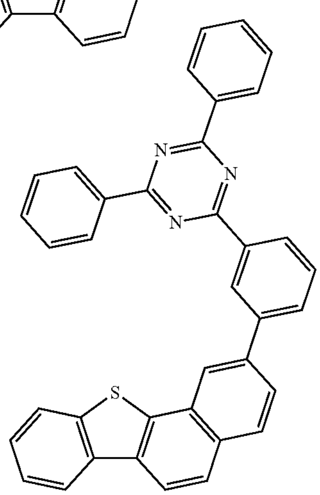
-continued
C-151
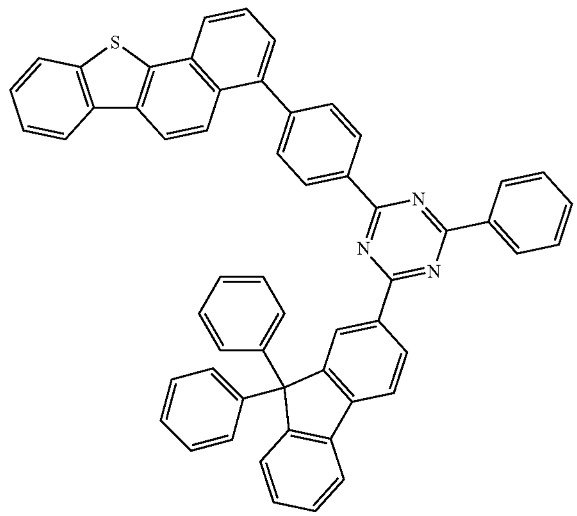
C-152
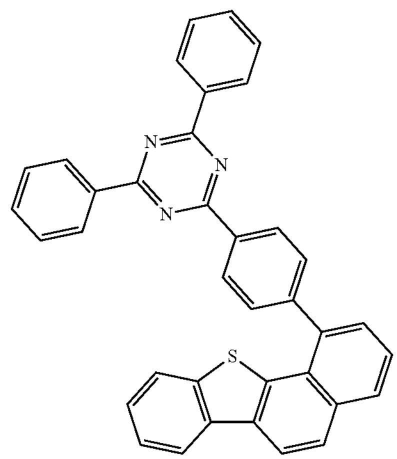
C-153
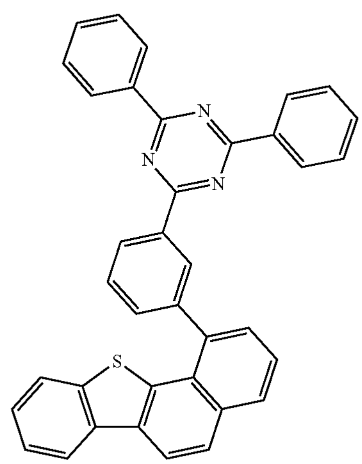

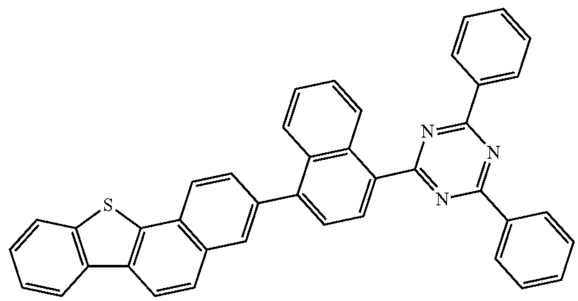
C-155
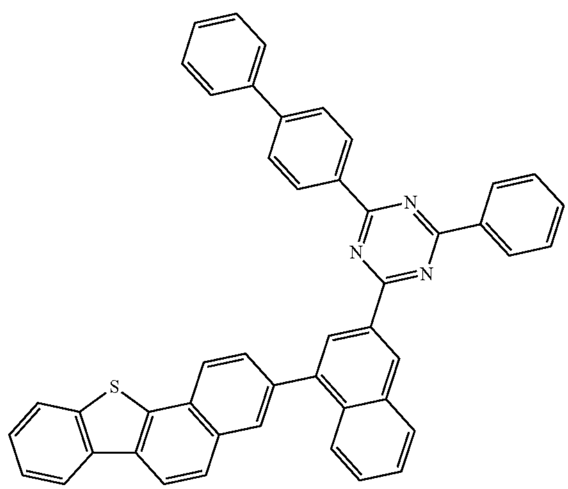
C-156
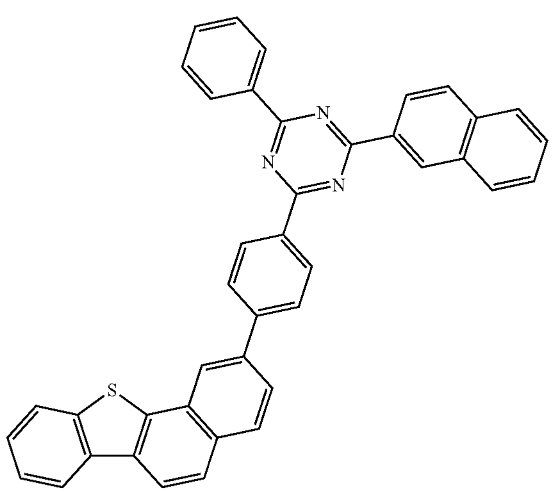
C-157
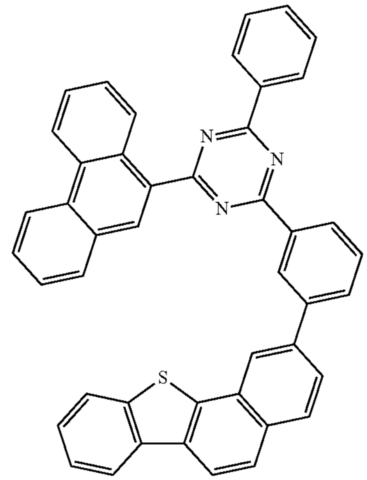
C-158
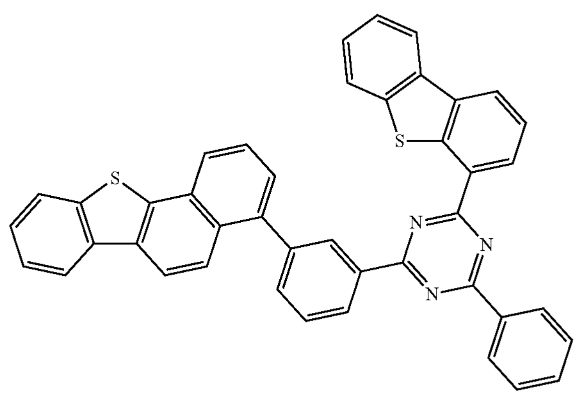
C-159
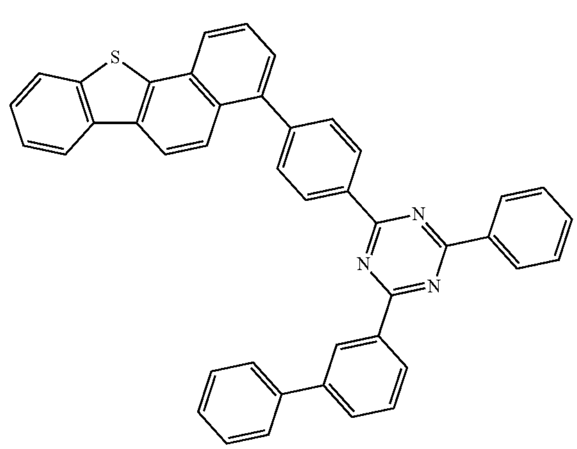

-continued
C-160
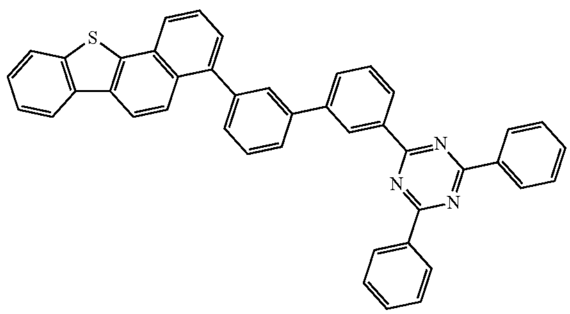
C-161
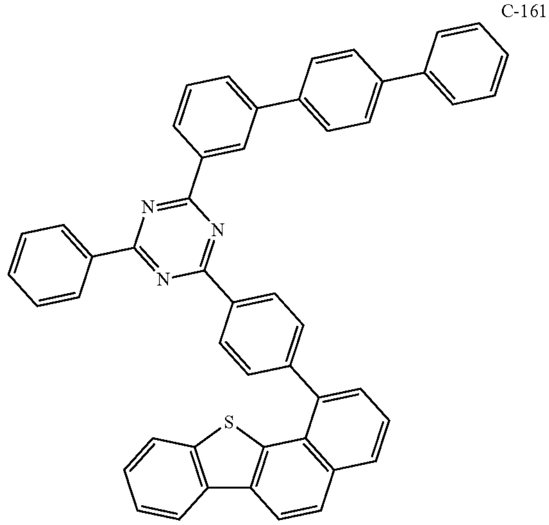
C-162
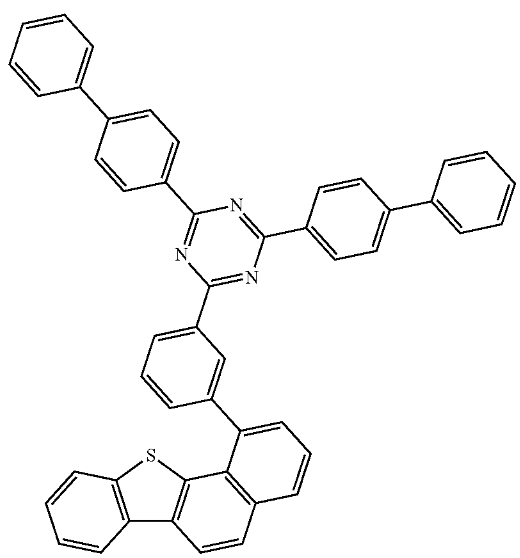
-continued
C-163
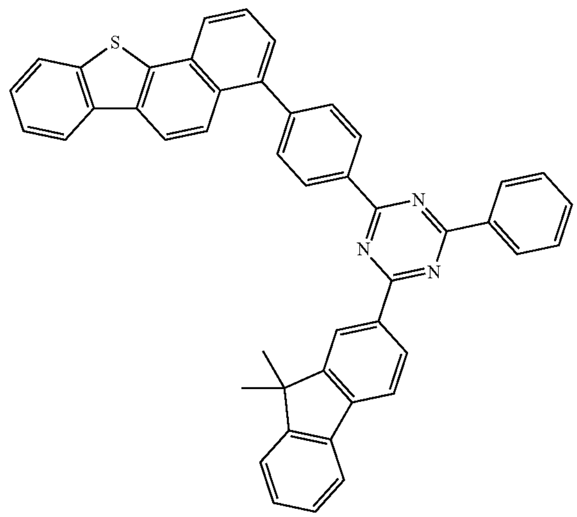
C-164
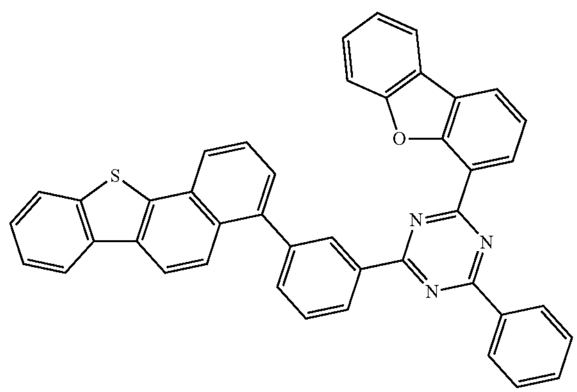
C-165
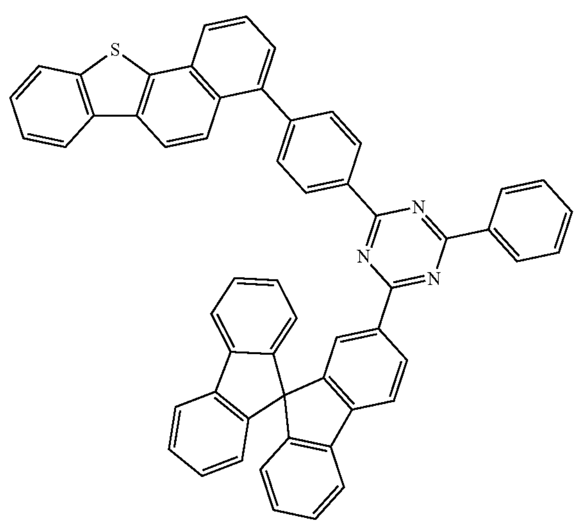

C-166
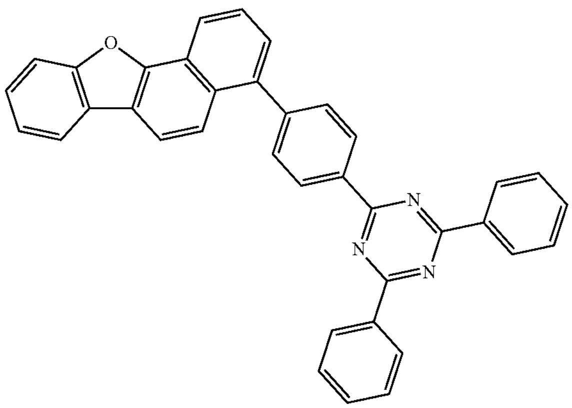
C-167
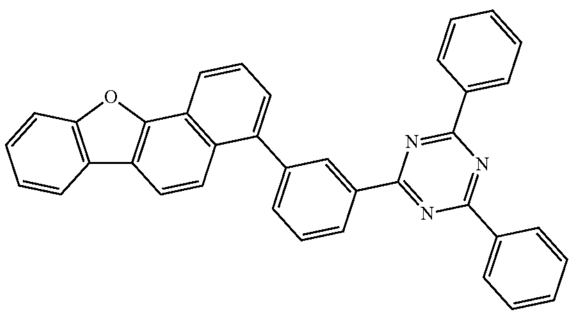
C-168
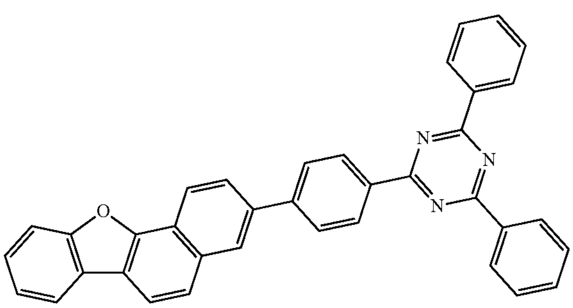
C-169
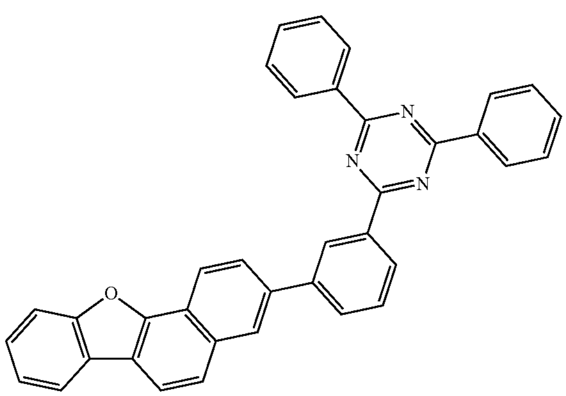
C-170
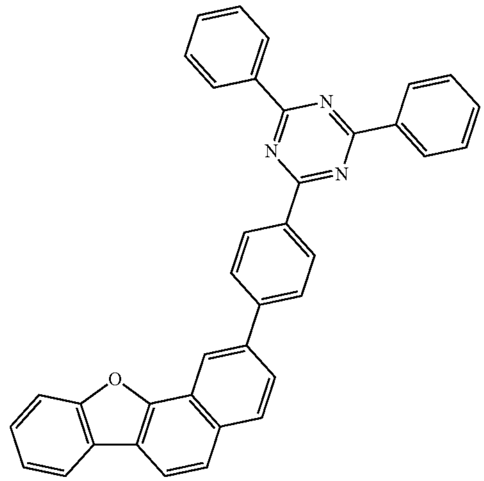
C-171
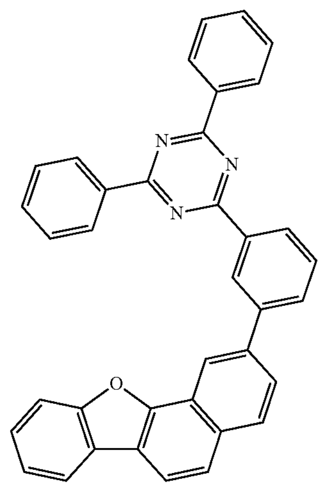
C-172
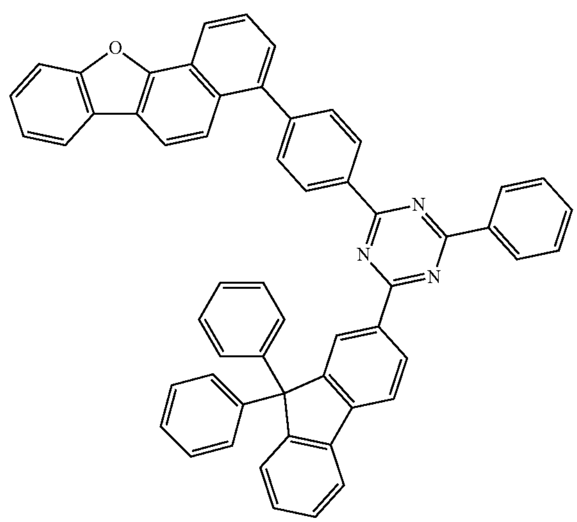

-continued
C-173
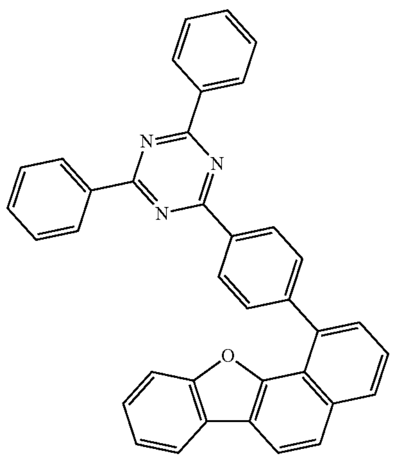
C-174
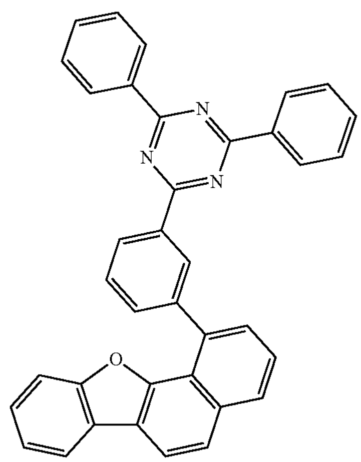
C-175
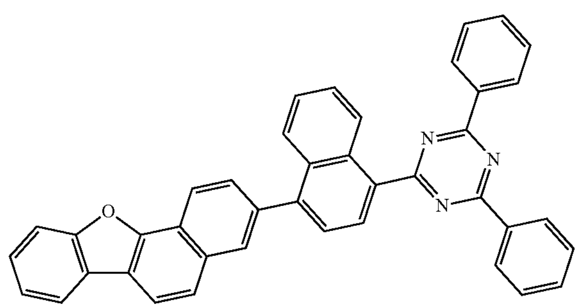
-continued
C-176
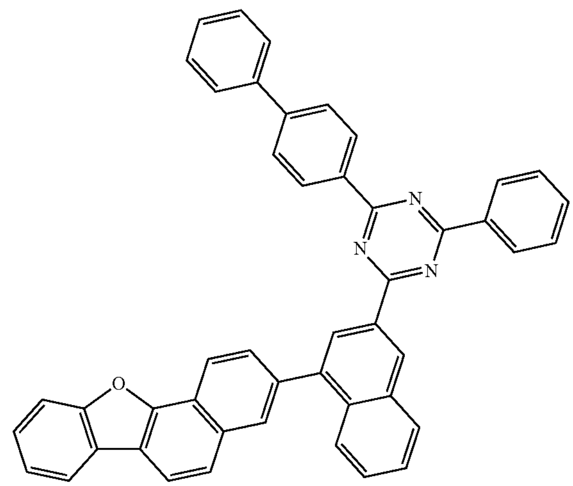
C-177
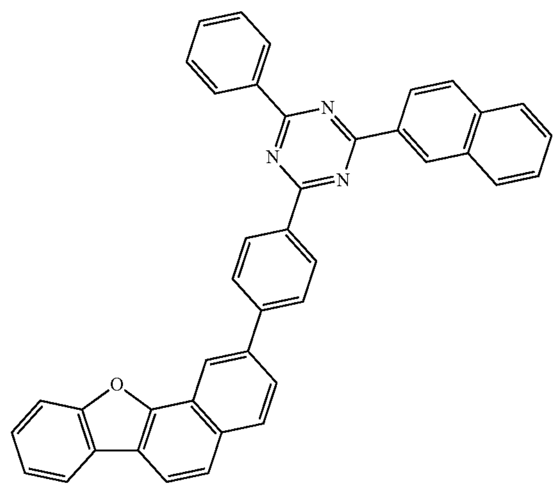
C-178
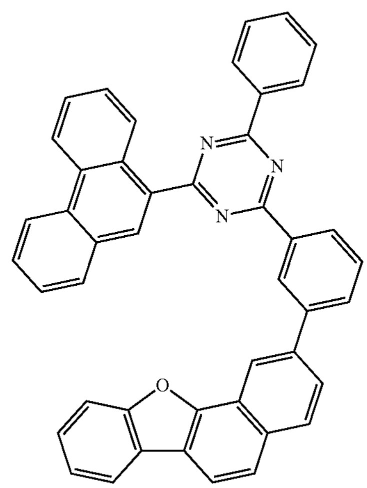

-continued
C-179
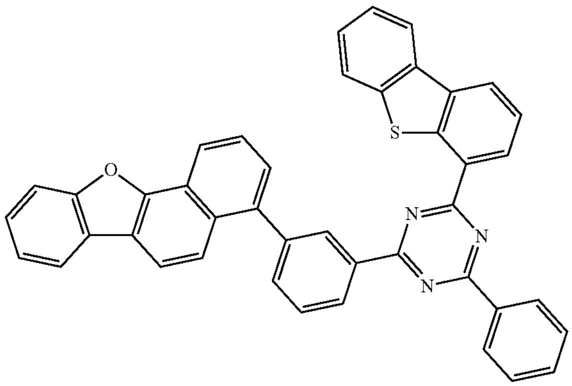
C-180
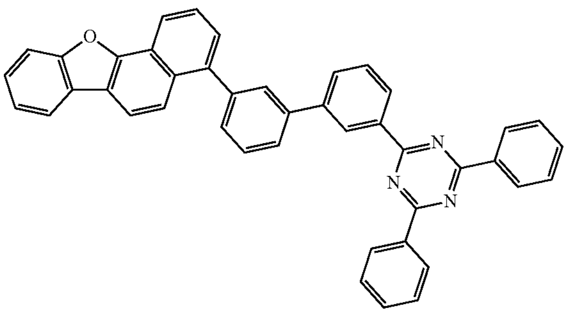
C-181
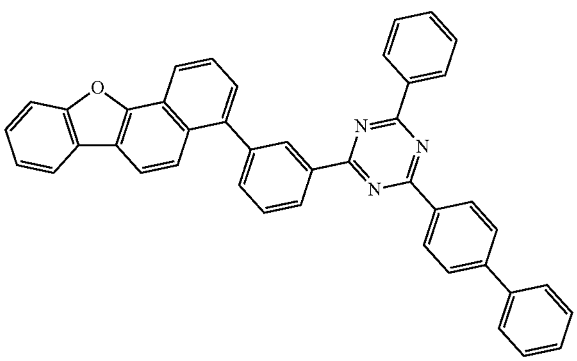
C-182
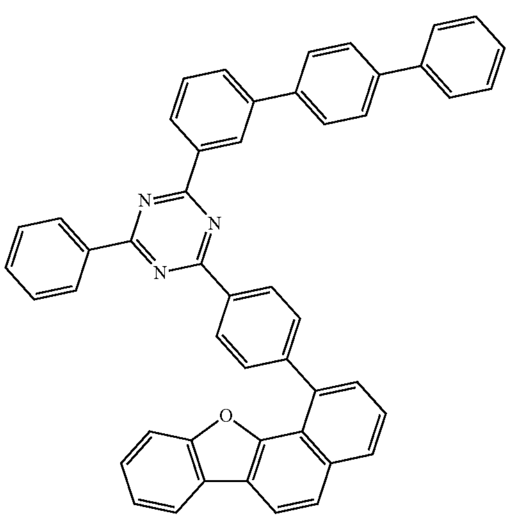
-continued
C-183
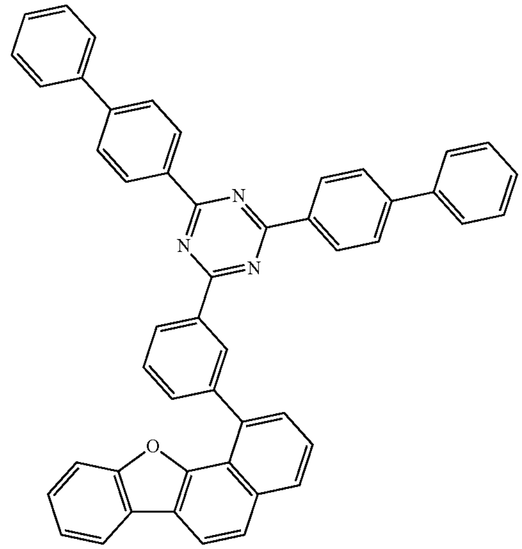
C-184
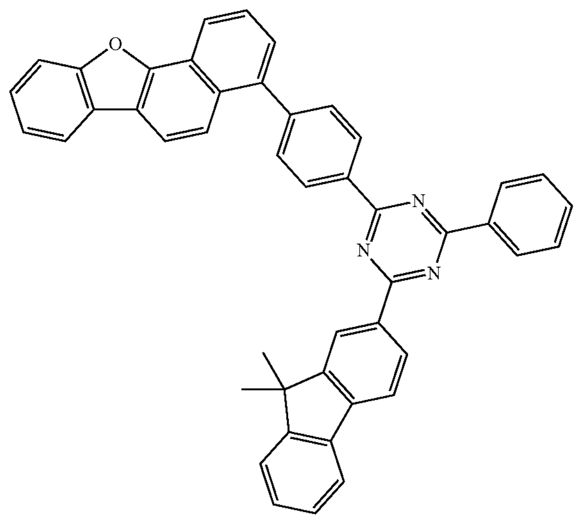
C-185
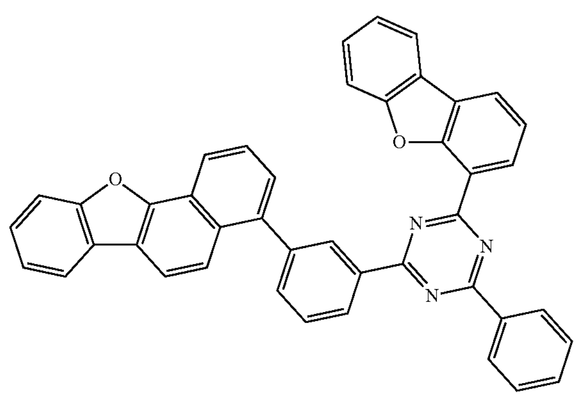

-continued
C-186
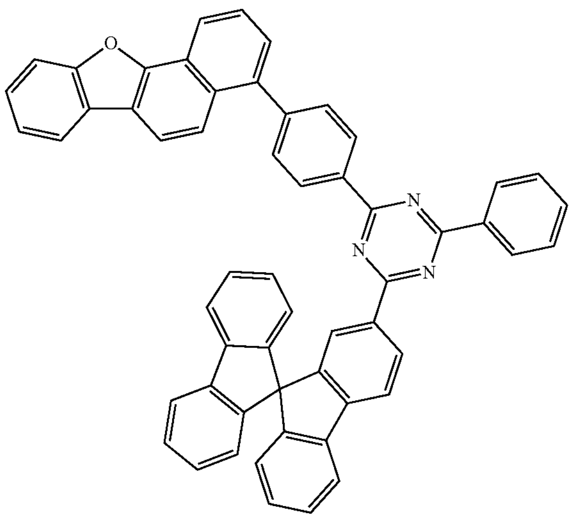
C-187
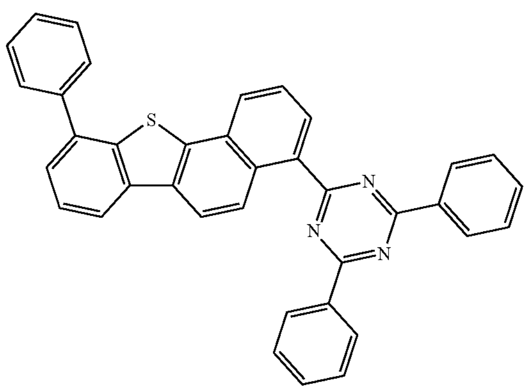
C-188
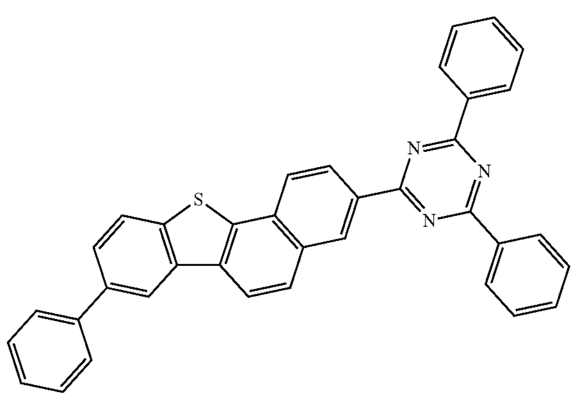
-continued
C-189
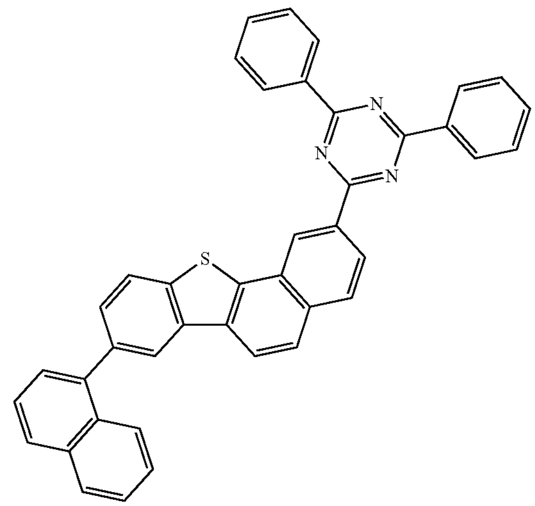
C-190
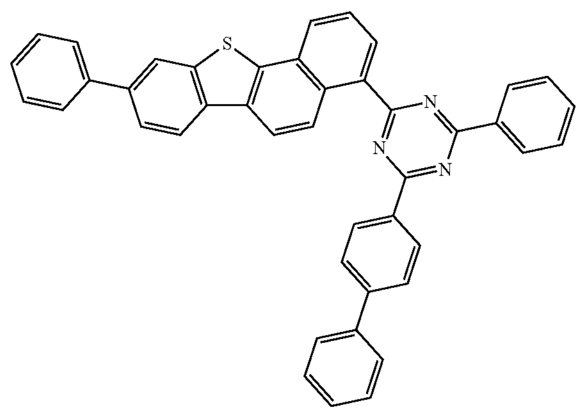
C-191
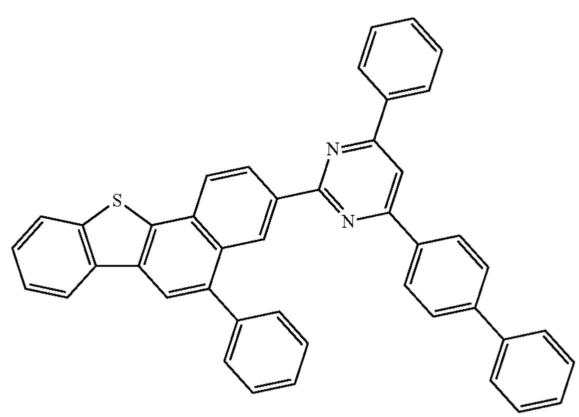

-continued
C-192
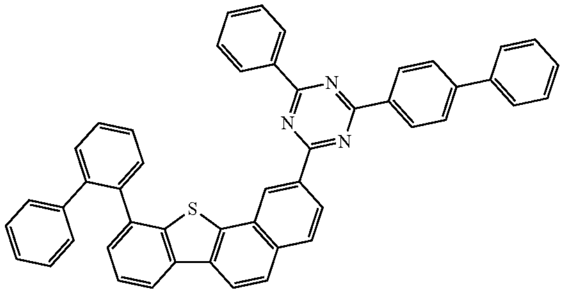
C-193
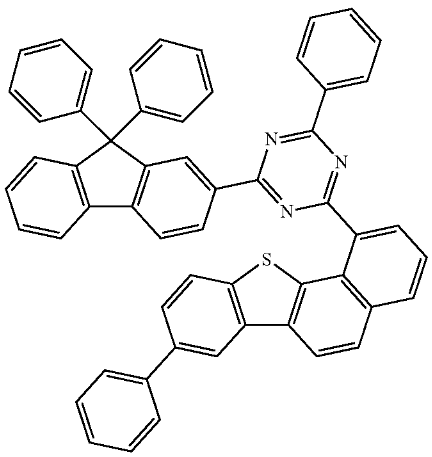
C-194
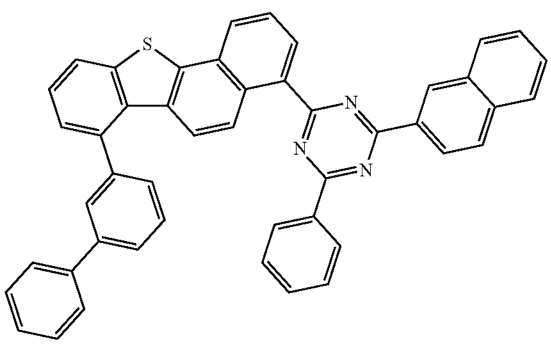
C-195
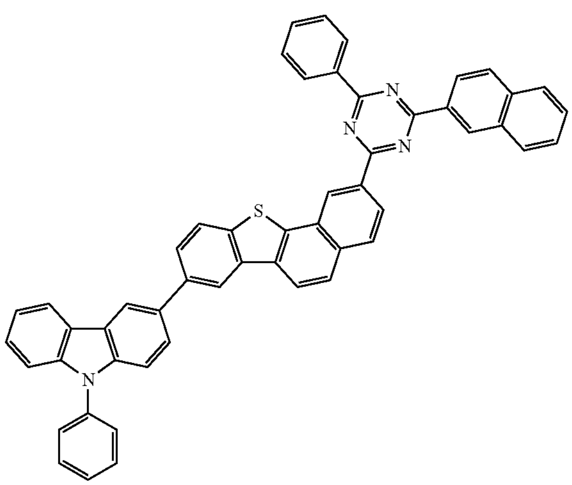
-continued
C-196
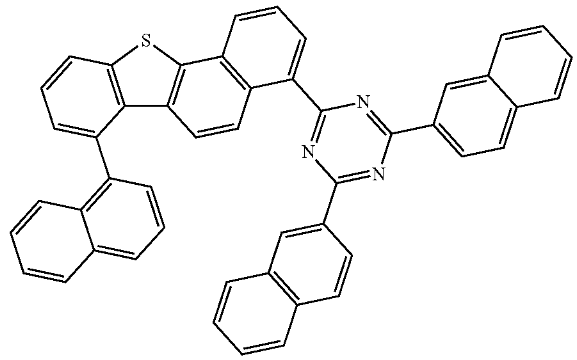
C-197
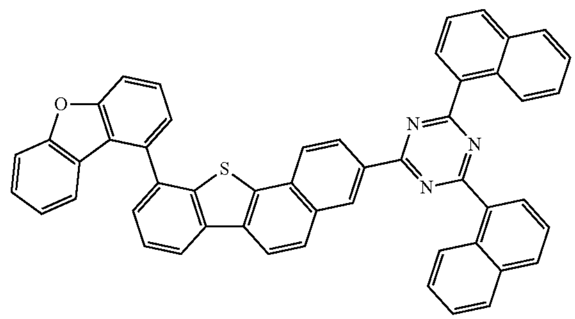
C-198
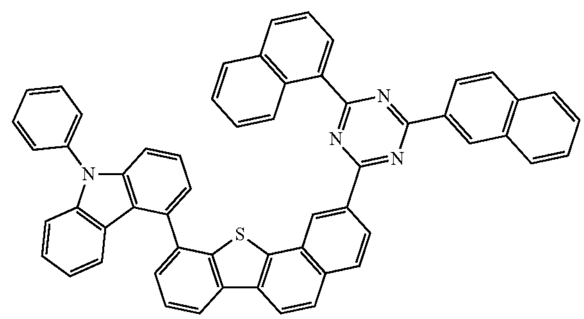
C-199
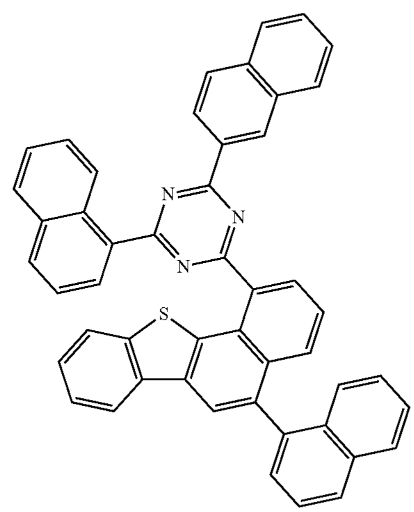

-continued
C-200
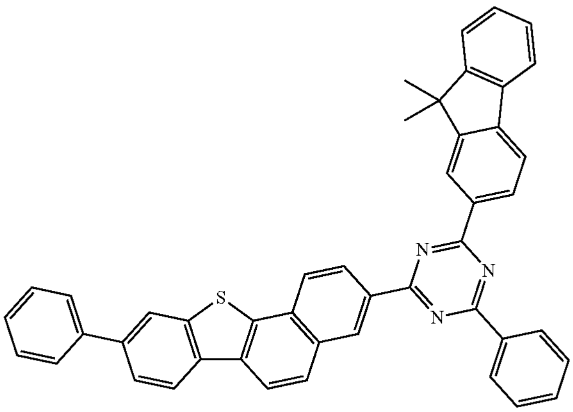
C-201
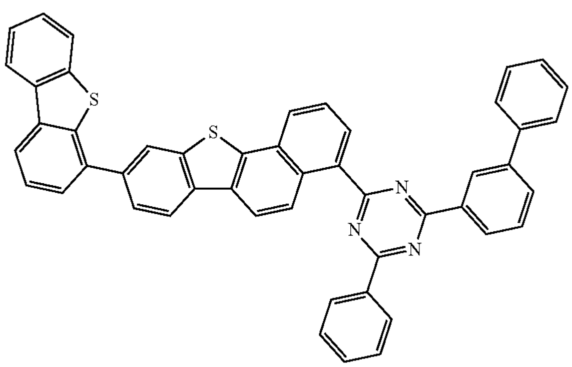
C-202
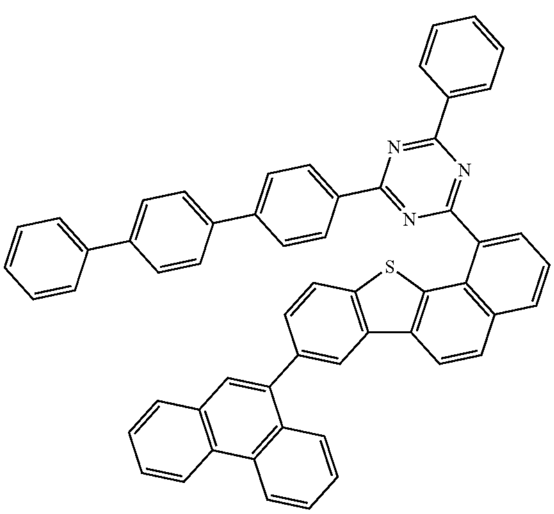
-continued
C-203
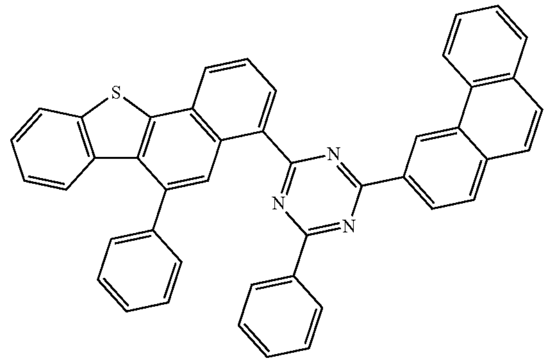
C-204
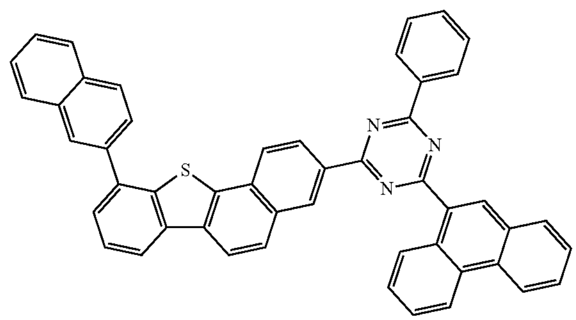
C-205
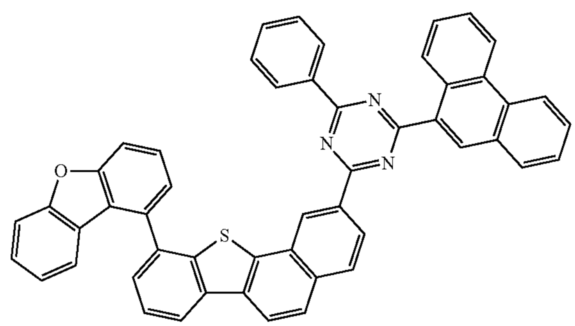
C-206
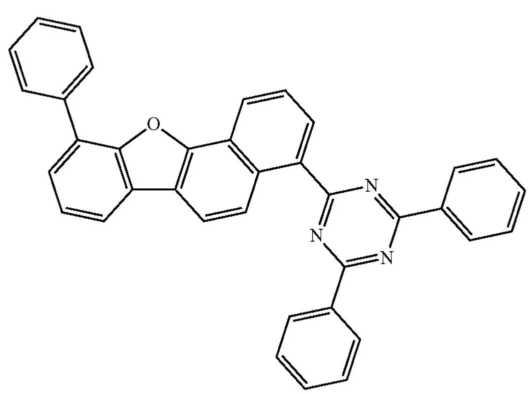

C-207
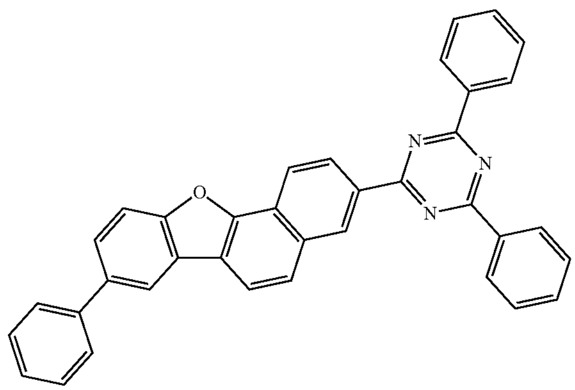
C-208
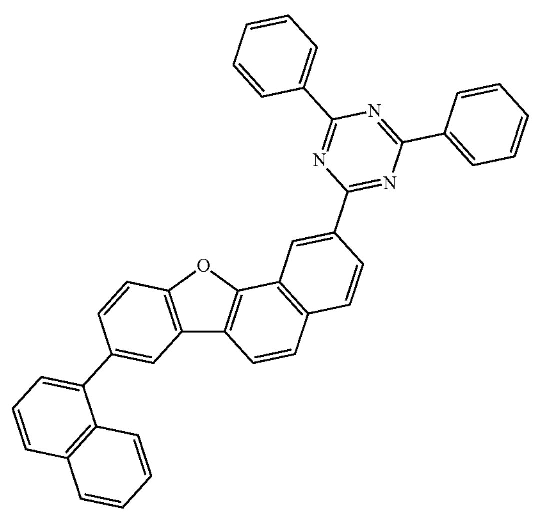
C-209
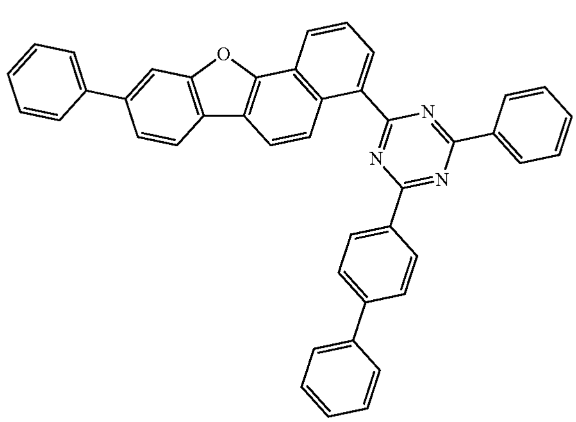
C-210
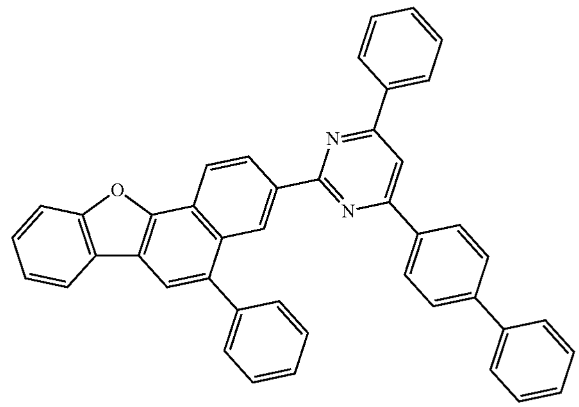
C-211
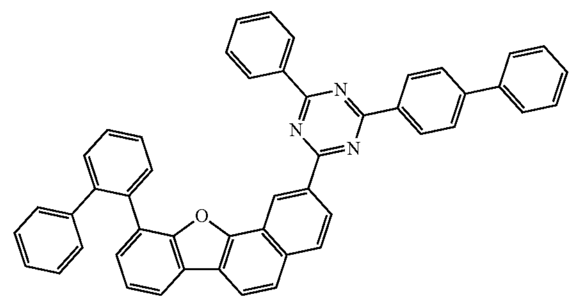
C-212
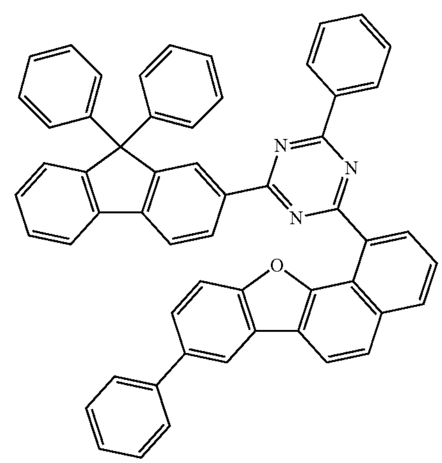
C-213
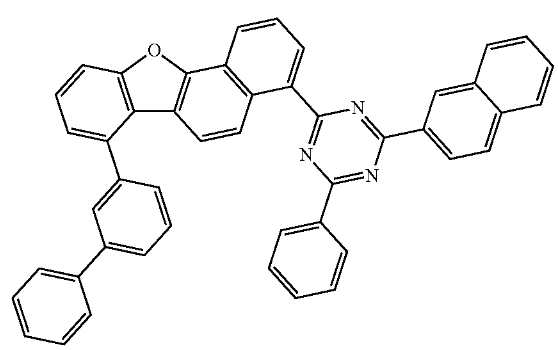

C-214
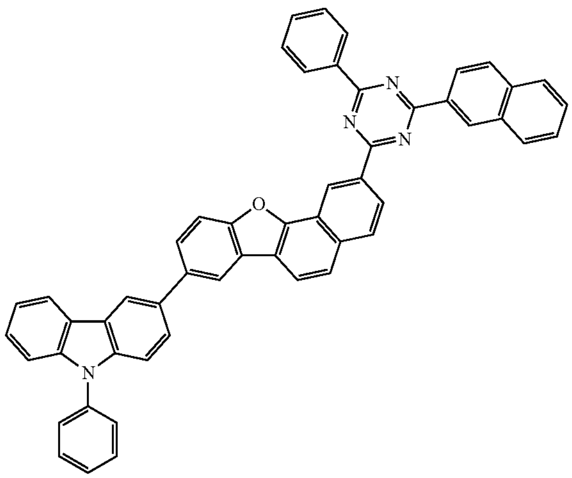
C-215
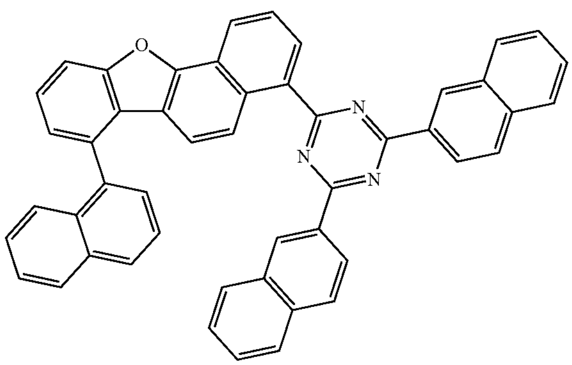
C-216
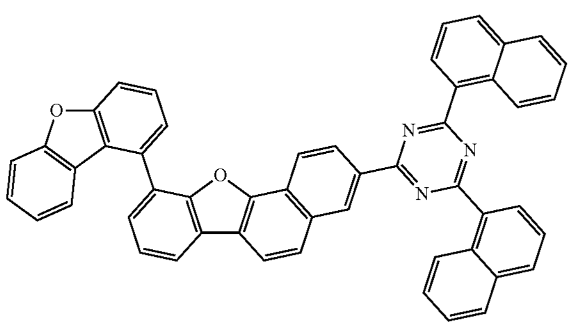
C-217
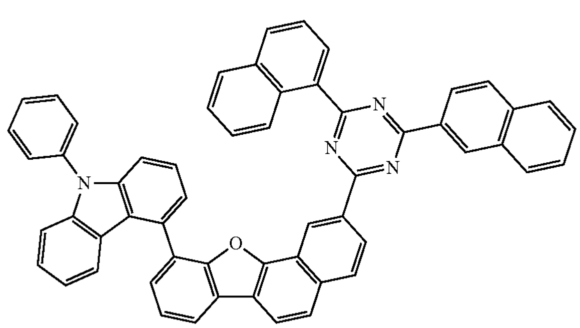
C-218
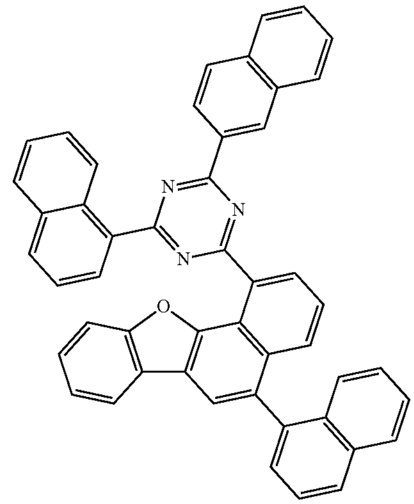
C-219
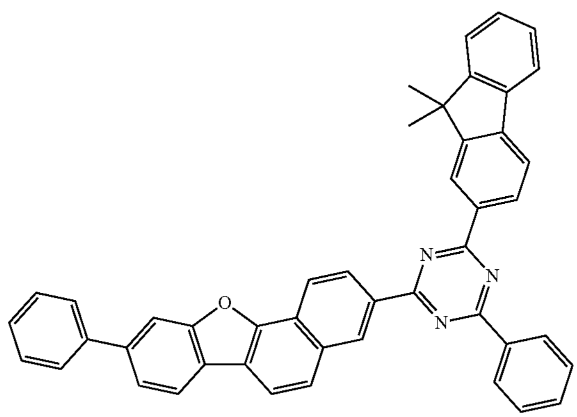
C-220
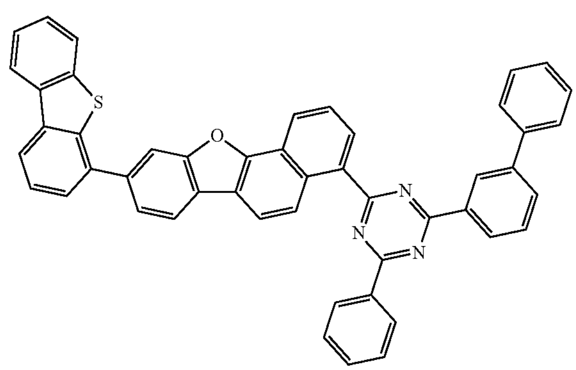

-continued
C-221
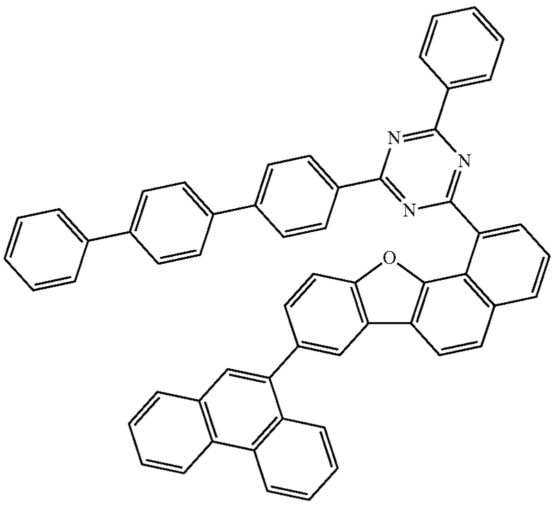
C-222
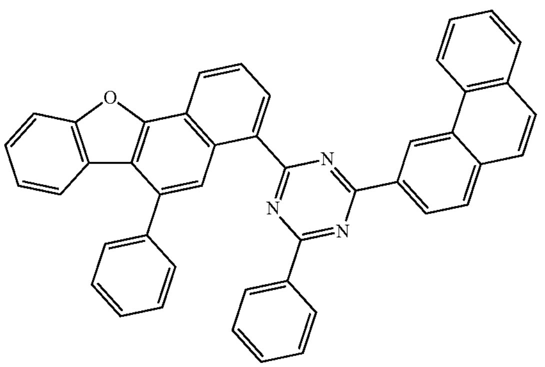
C-223
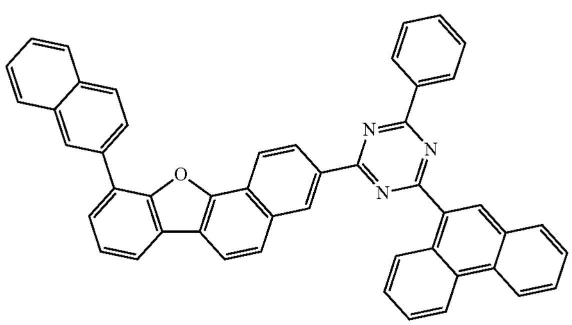
C-224
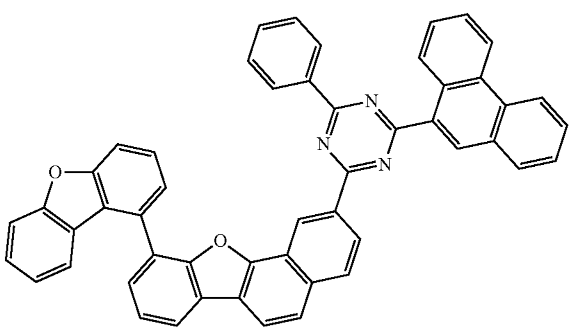
-continued
C-225
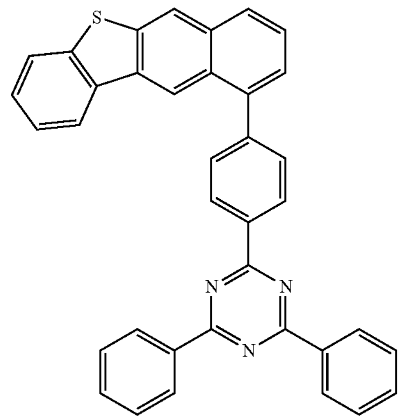
C-226
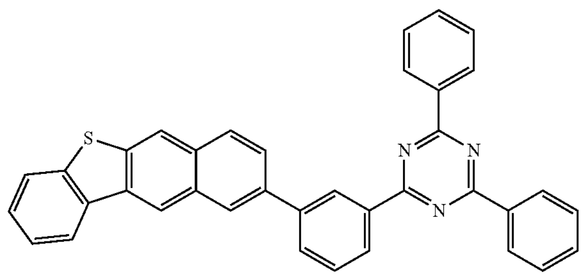
C-227
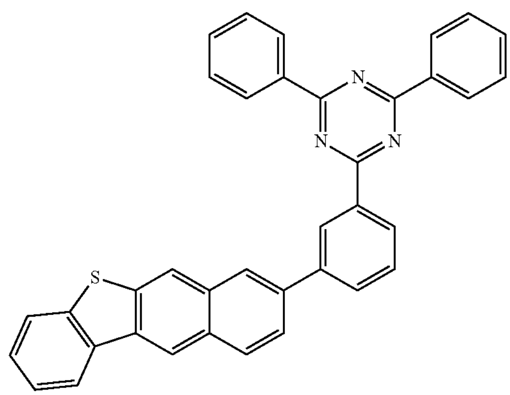
C-228
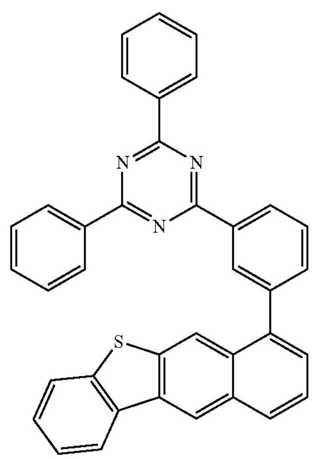

-continued
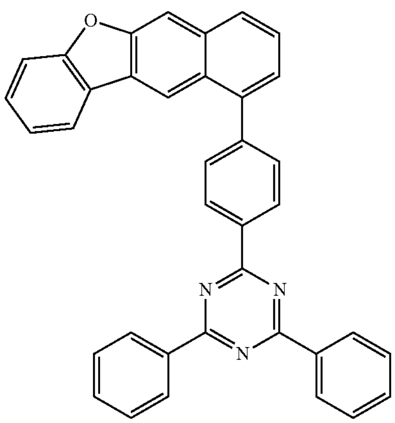
C-229
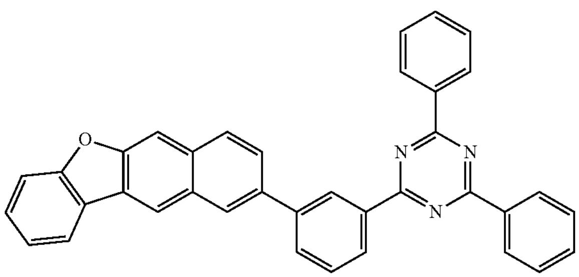
C-230
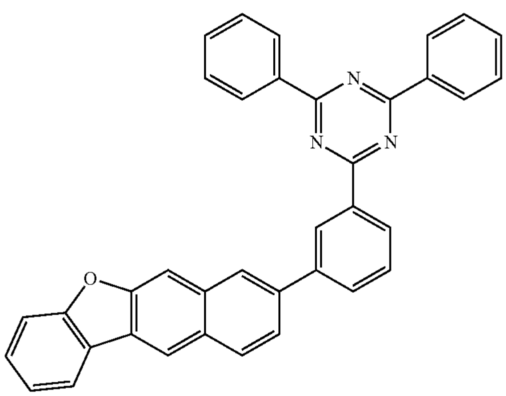
C-231
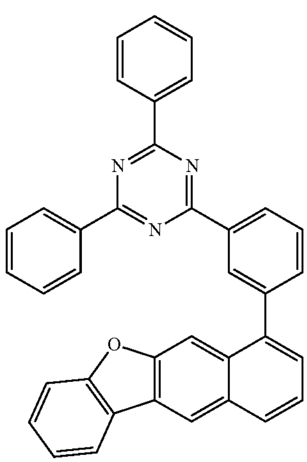
C-232
-continued
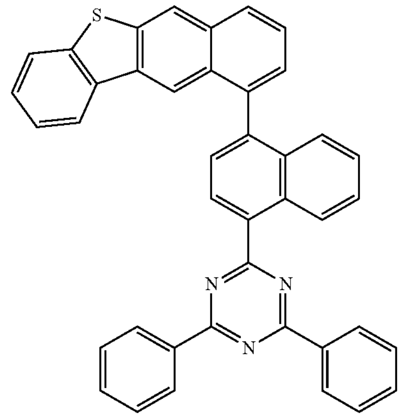
C-233
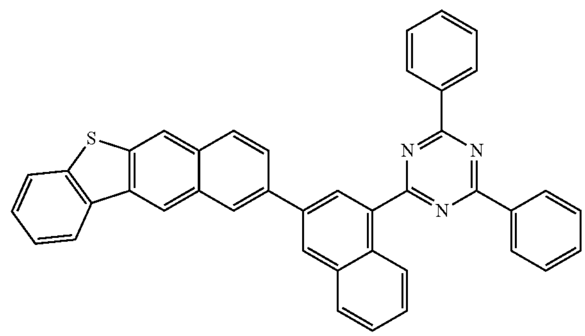
C-234
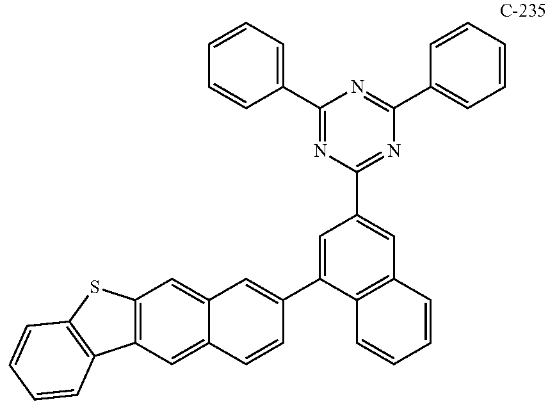
C-235
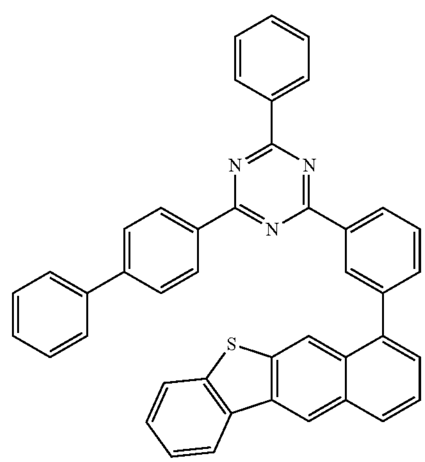
C-236

-continued
C-237
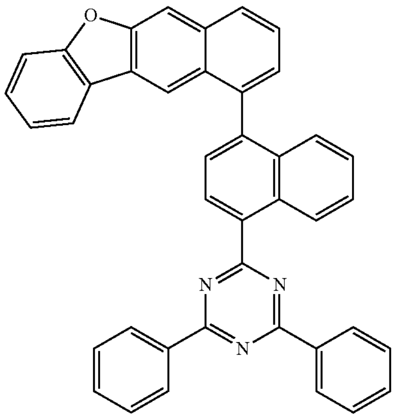
C-238
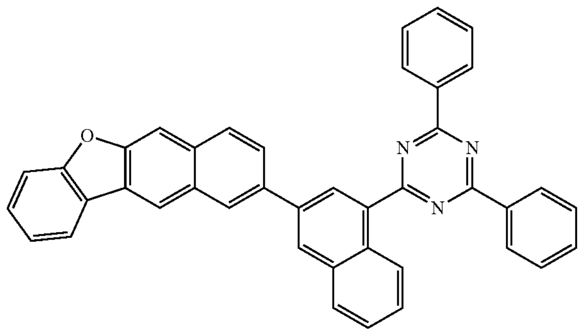
C-239
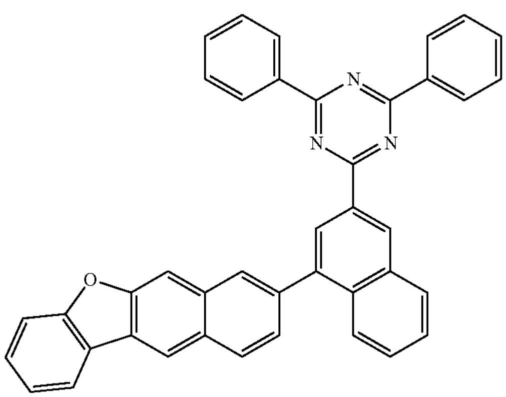
C-240
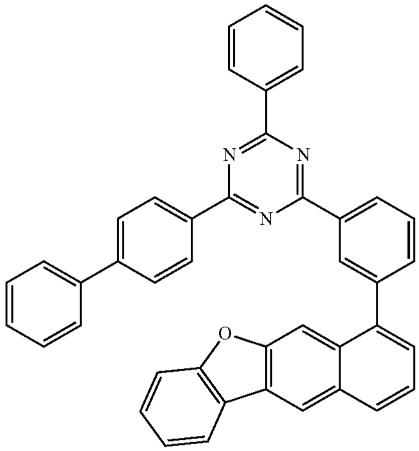
-continued
C-241
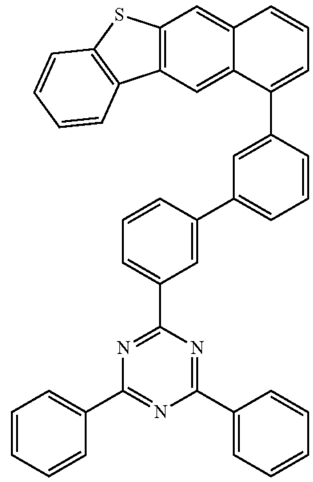
C-242
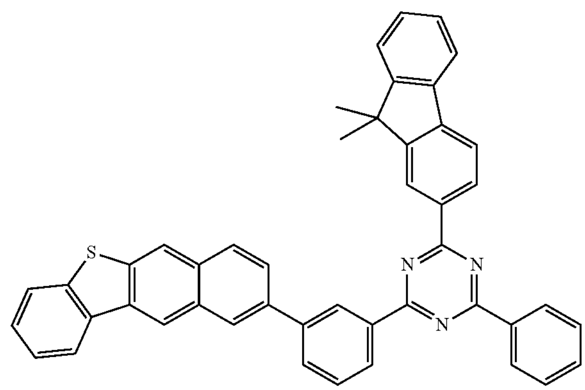
C-243
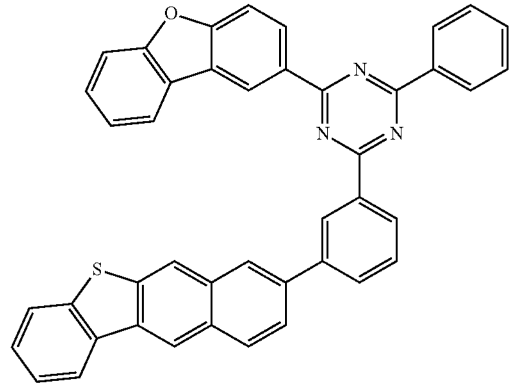

-continued
C-244
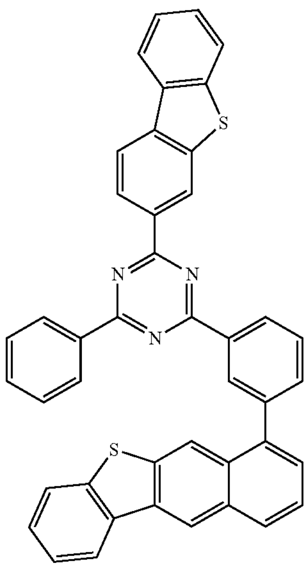
C-245
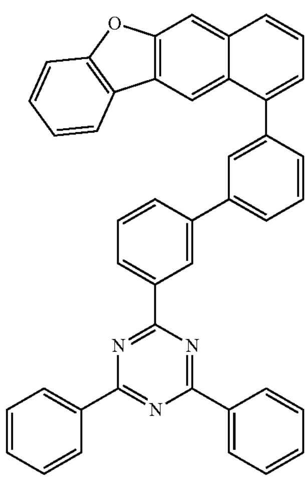
C-246
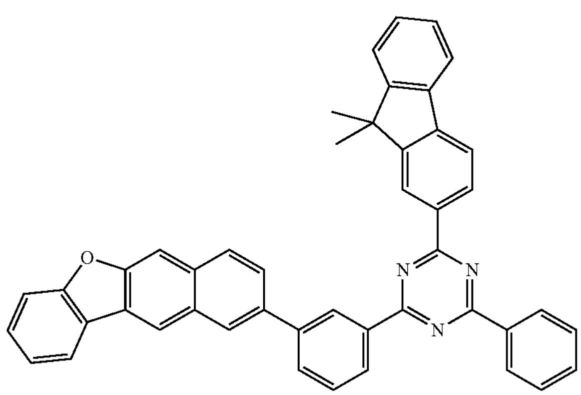
-continued
C-247
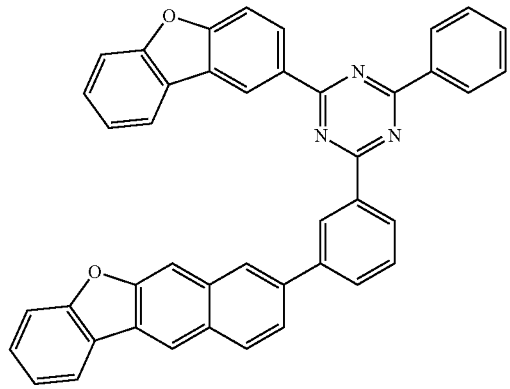
C-248
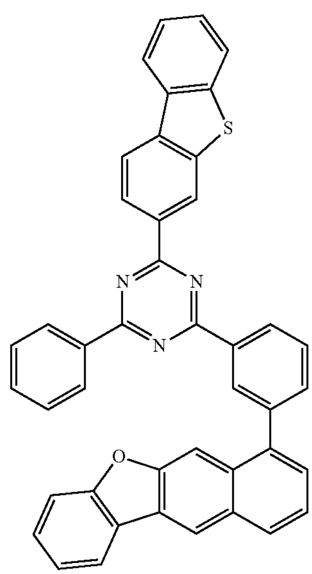
C-249
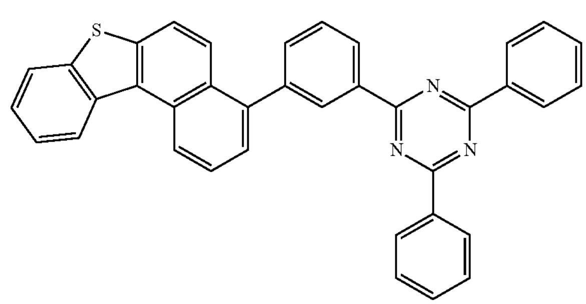

-continued
C-250
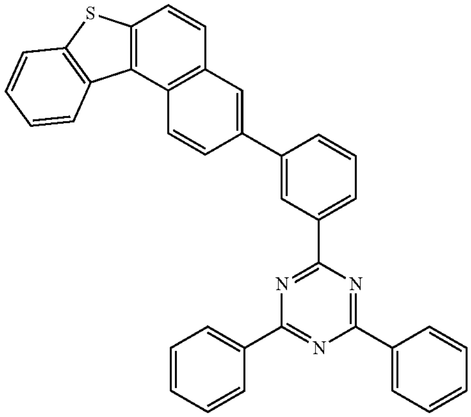
C-251
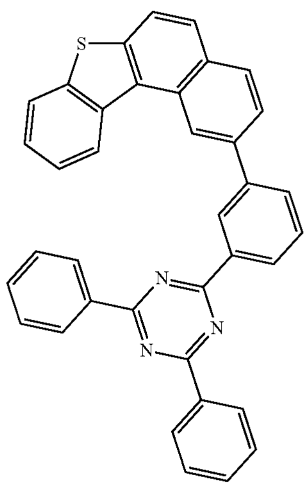
C-252
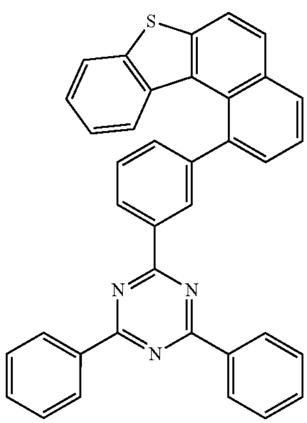
C-253
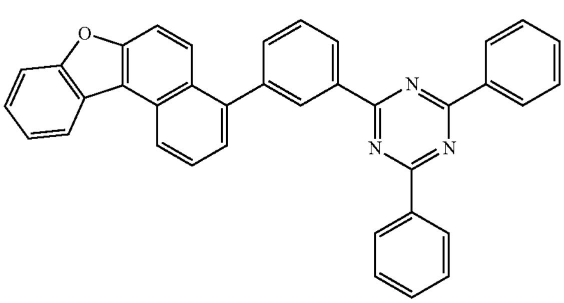
-continued
C-254
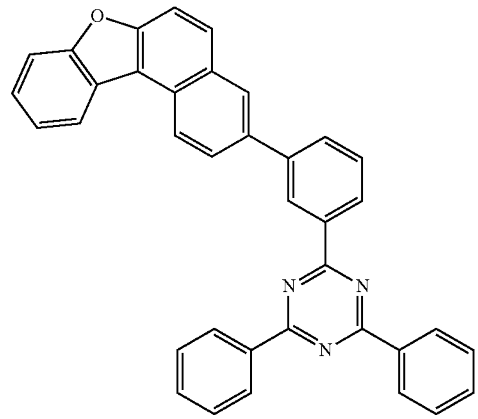
C-255
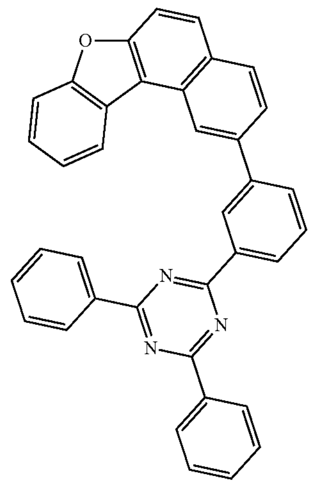
C-256
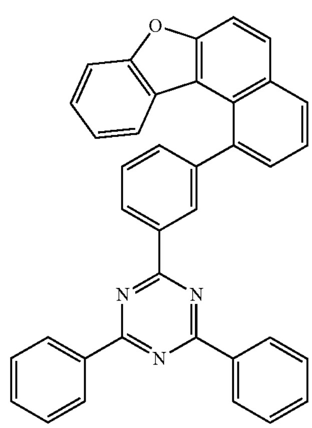

-continued
C-257
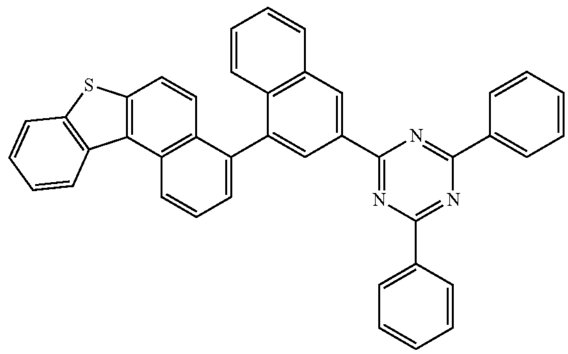
C-258
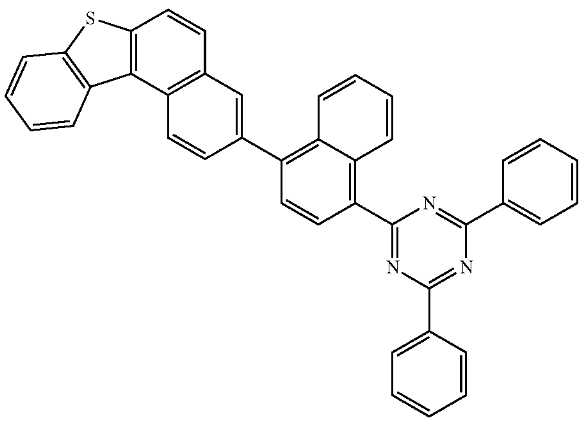
C-259
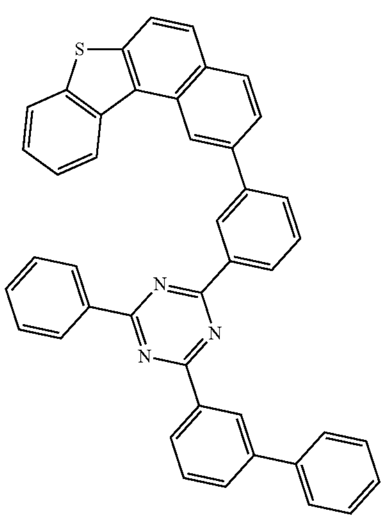
-continued
C-260
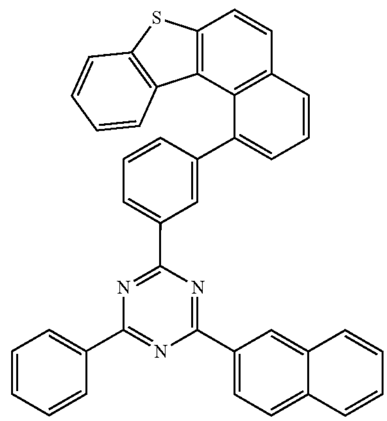
C-261
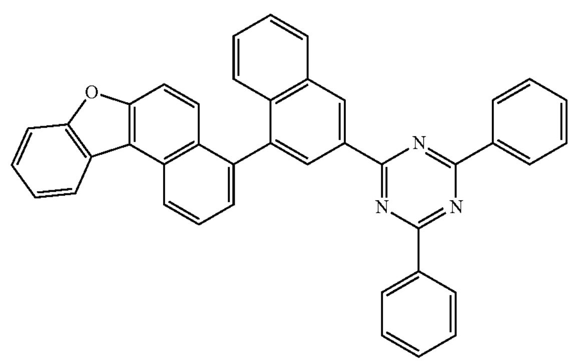
C-262
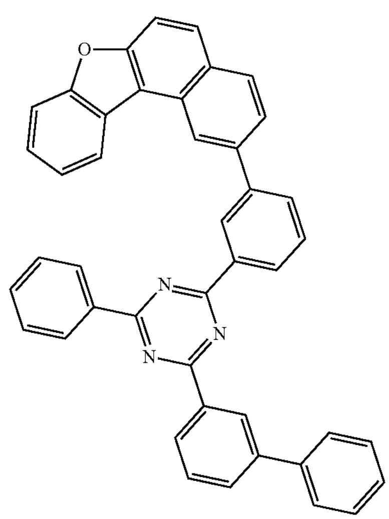

-continued
C-263
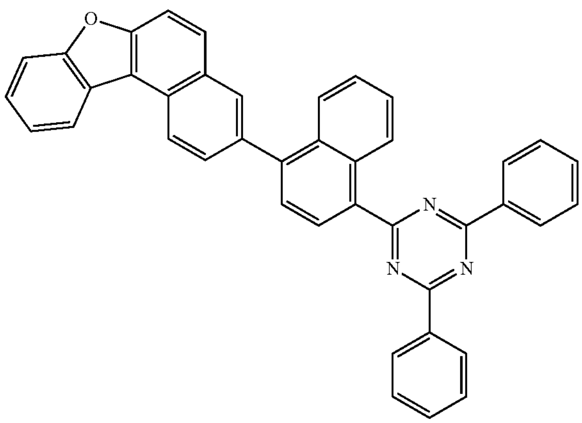
C-264
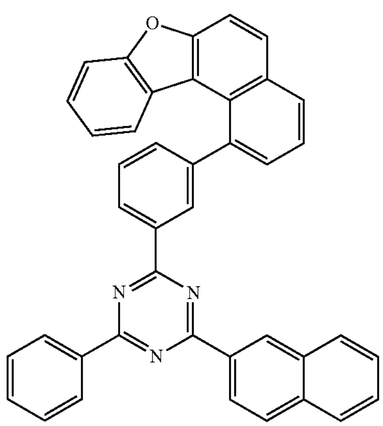
C-265
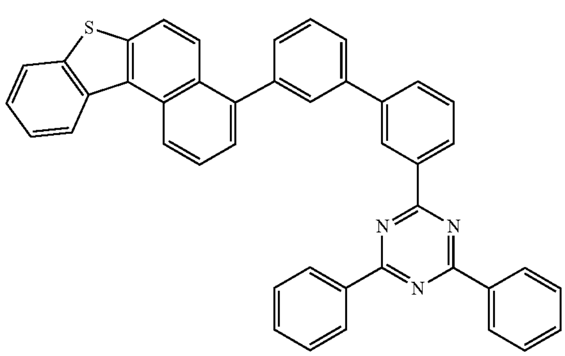
-continued
C-266
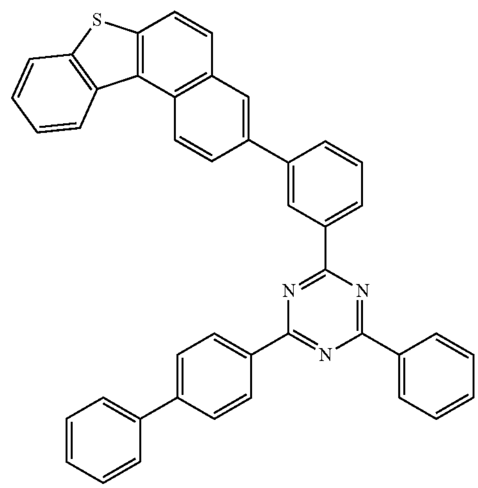
C-267
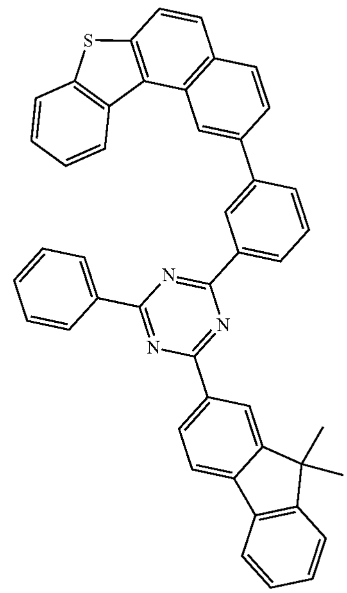
C-268
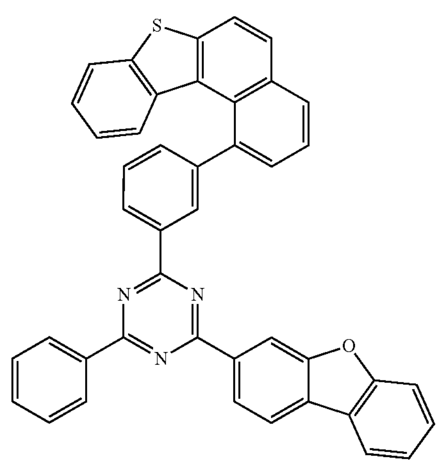

-continued
C-269
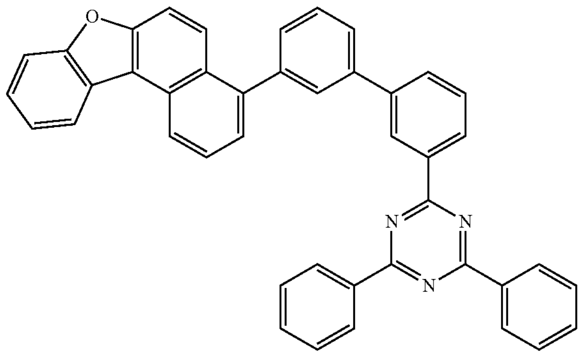
C-270
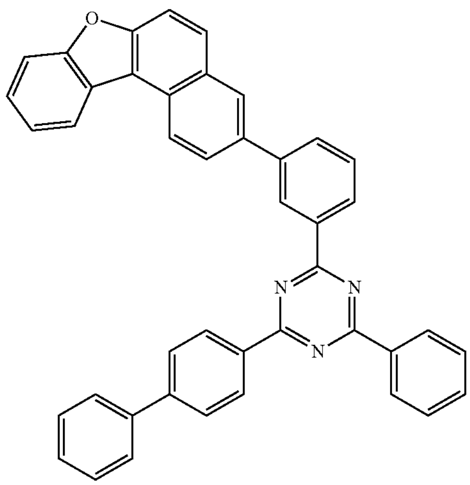
C-271
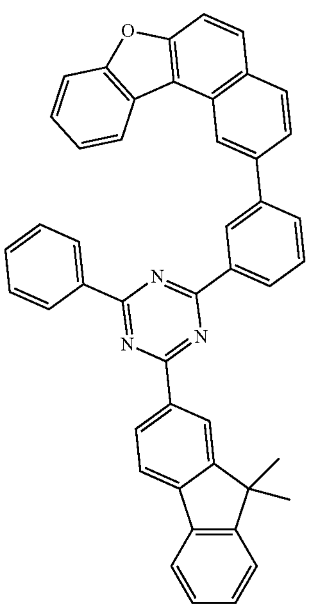
C-272
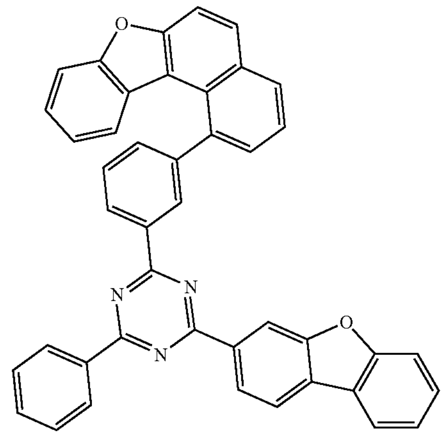
C-273
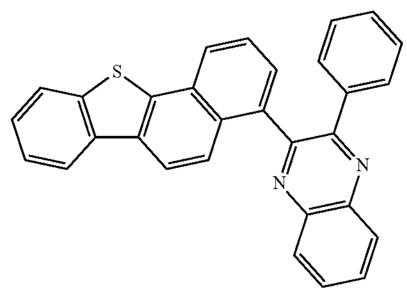
C-274
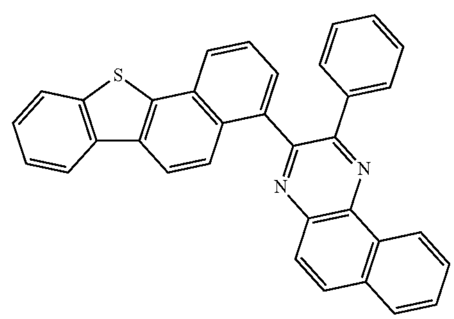
C-275
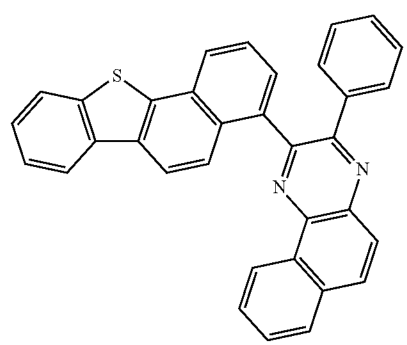

-continued
C-276
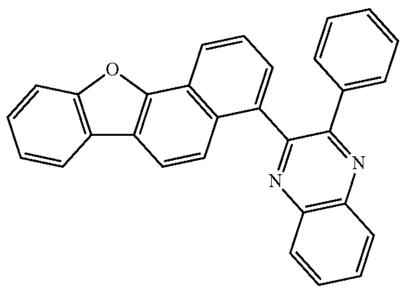
C-277
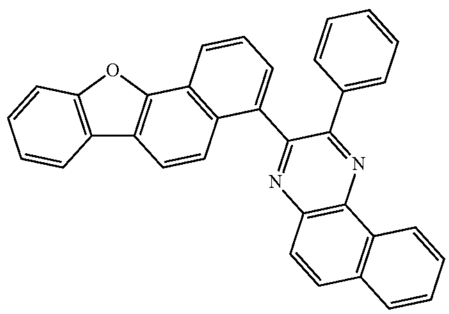
C-278
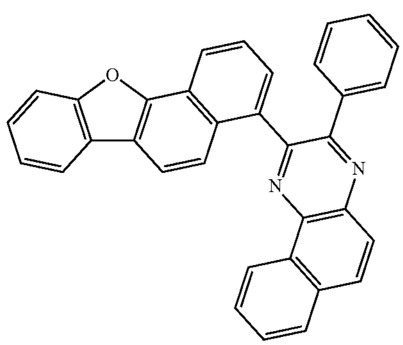
C-279
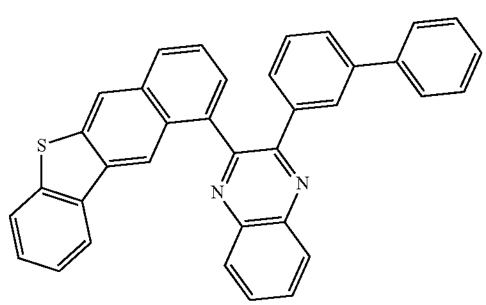
C-280
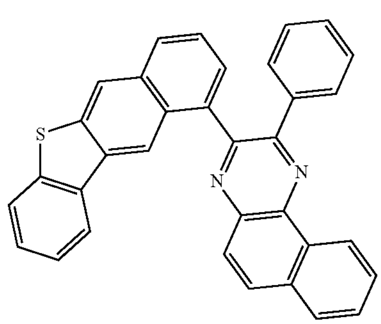
-continued
C-281
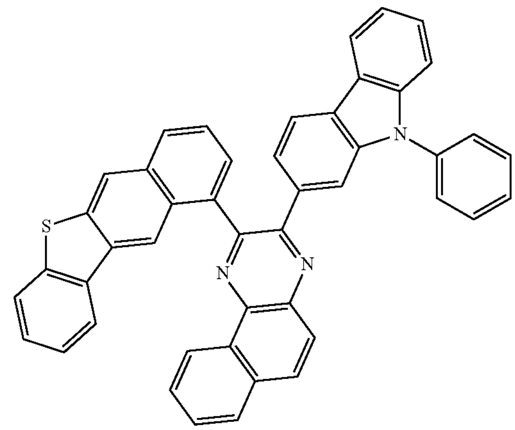
C-282
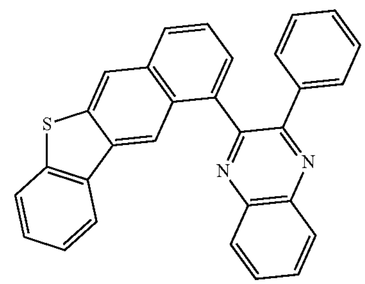
C-283
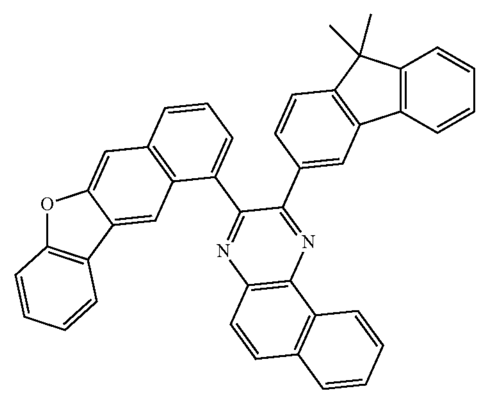
C-284
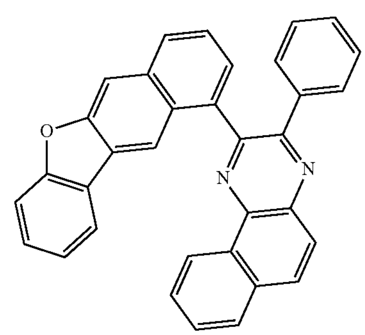

-continued
C-285
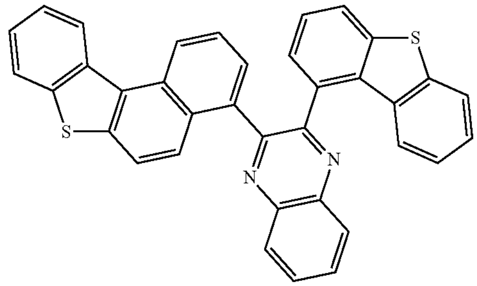
C-286
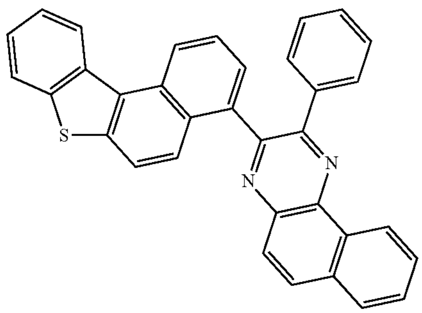
C-287
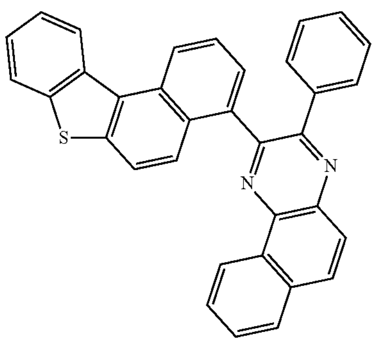
C-288
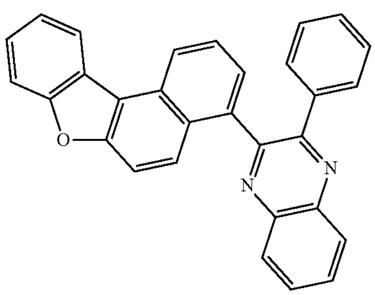
C-289
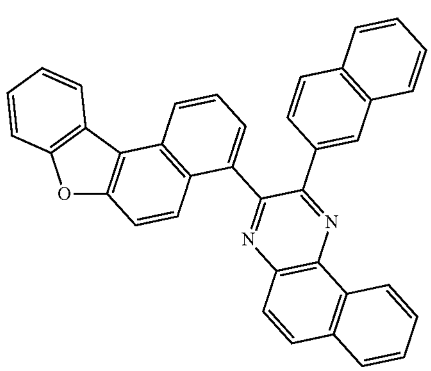
-continued
C-290
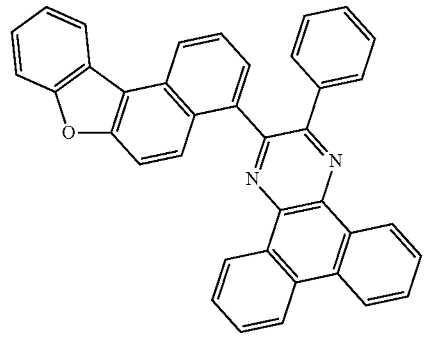
C-291
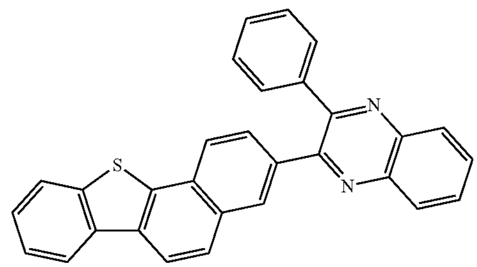
C-292
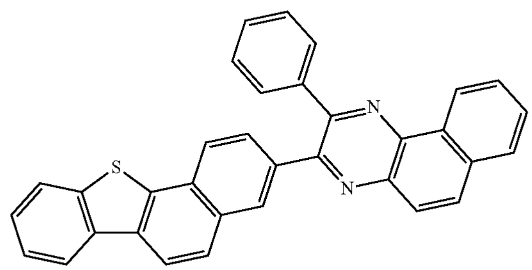
C-293
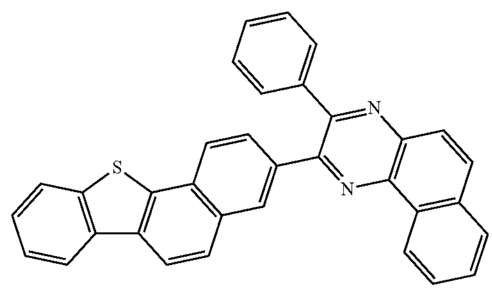
C-294
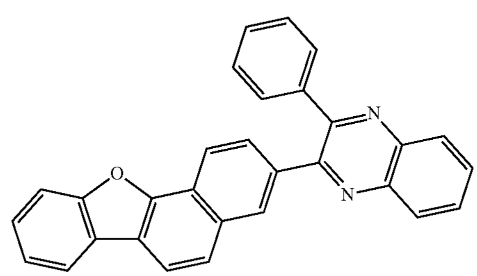

C-295
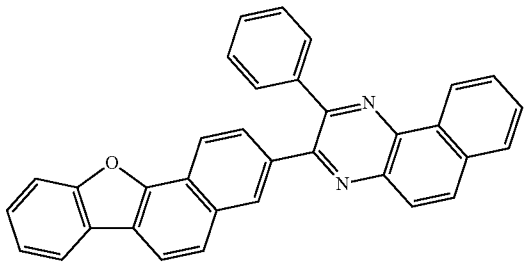
C-296
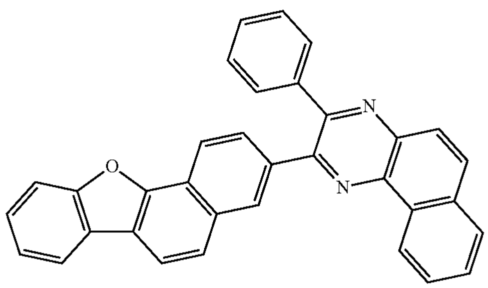
C-297
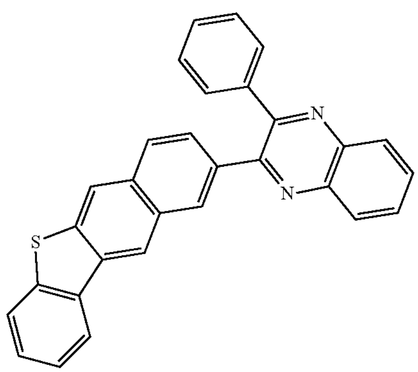
C-298
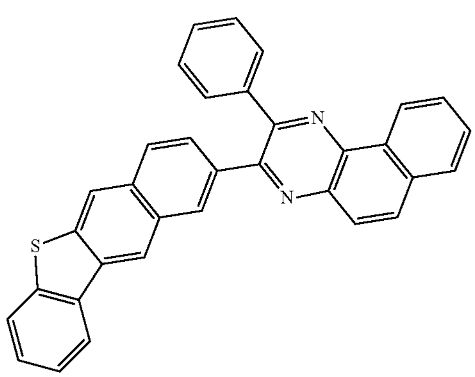
C-299
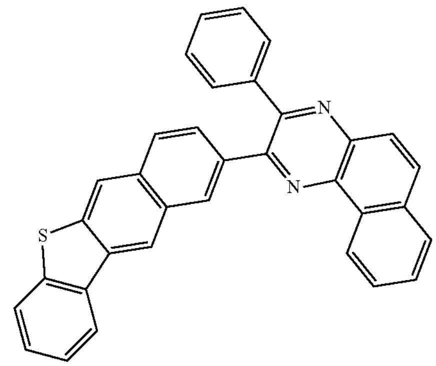
C-300
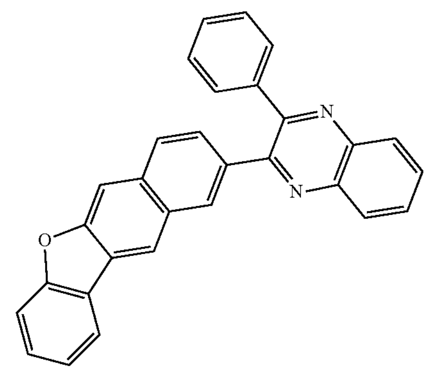
C-301
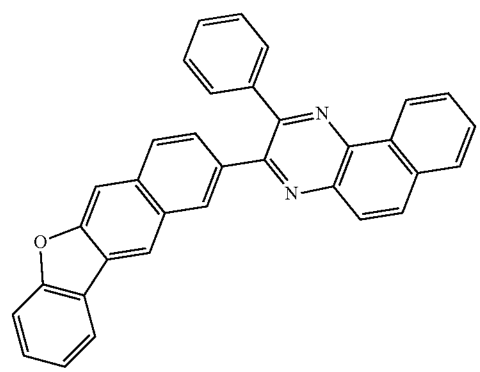
C-302
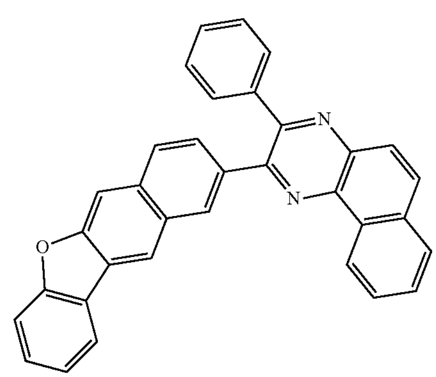

C-303
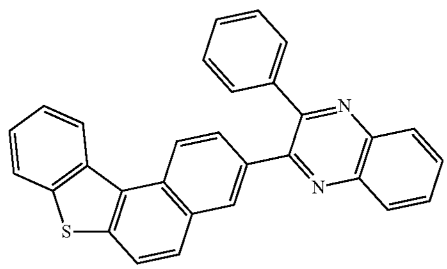
C-304
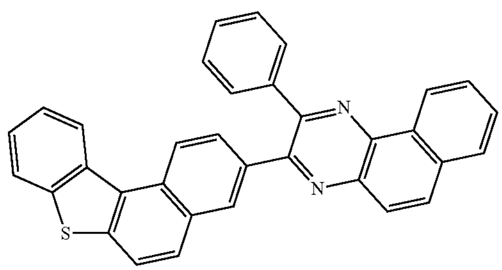
C-305
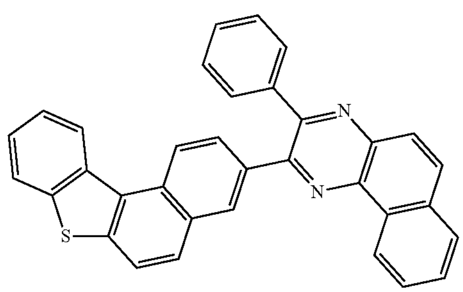
C-306
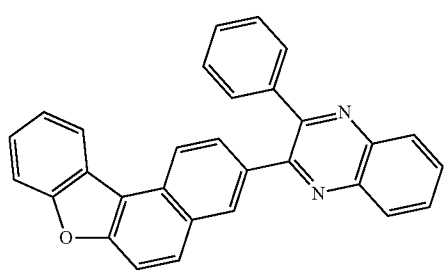
C-307
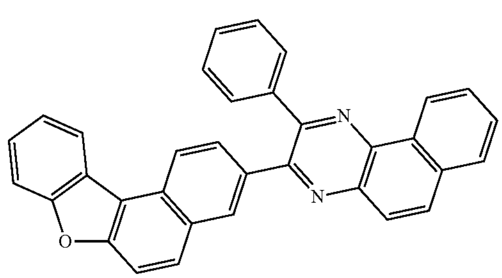
C-308
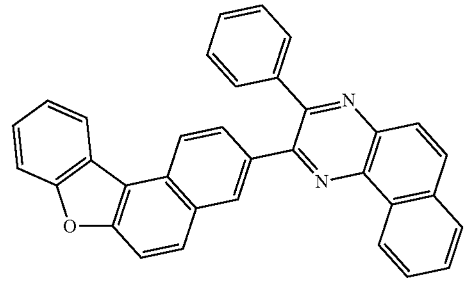
C-309
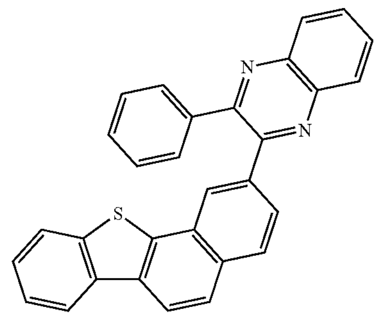
C-310
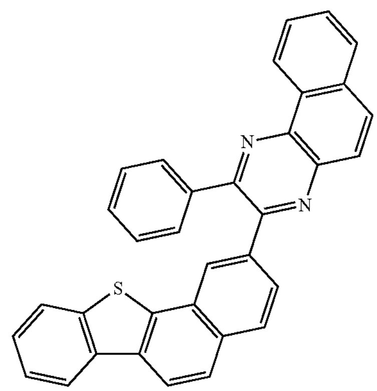
C-311
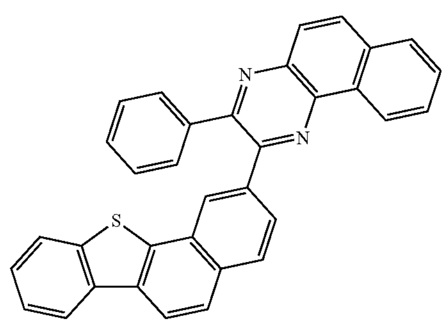
C-312
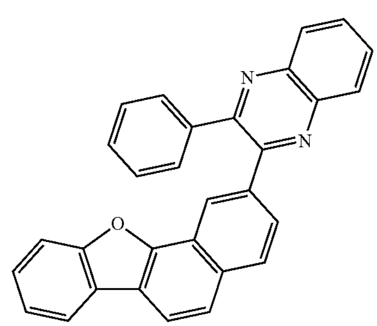

-continued
C-313
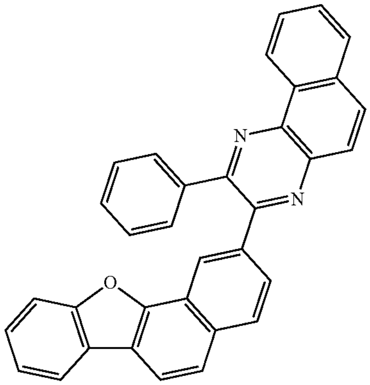
C-314
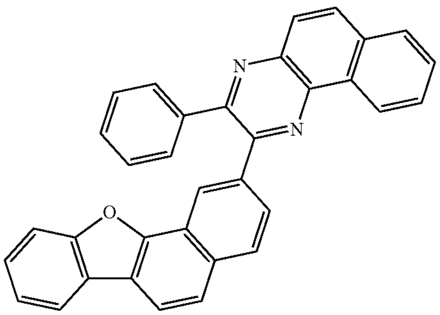
C-315
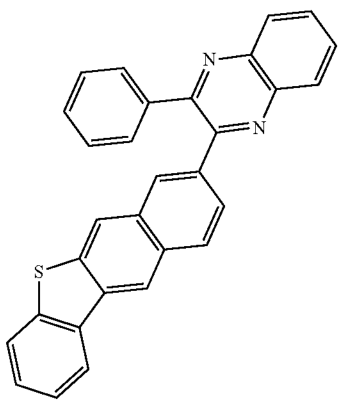
C-316
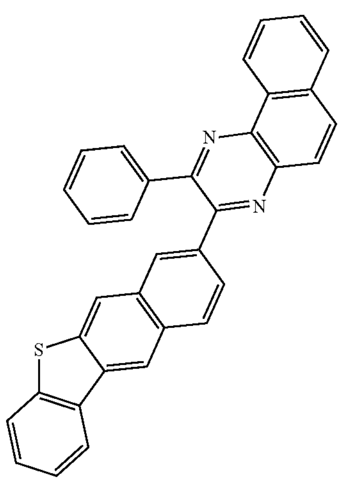
-continued
C-317
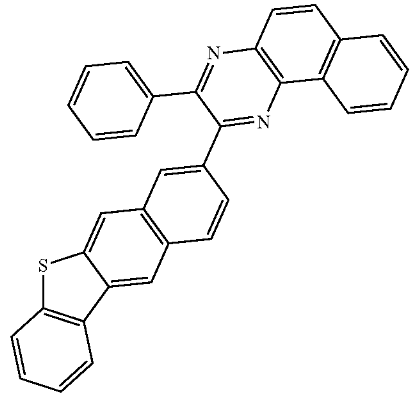
C-318
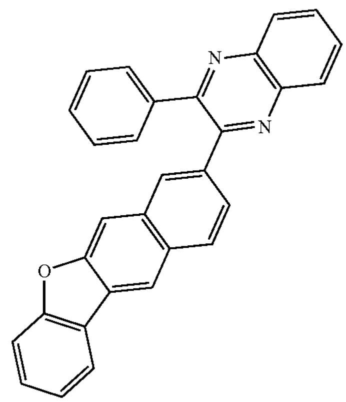
C-319
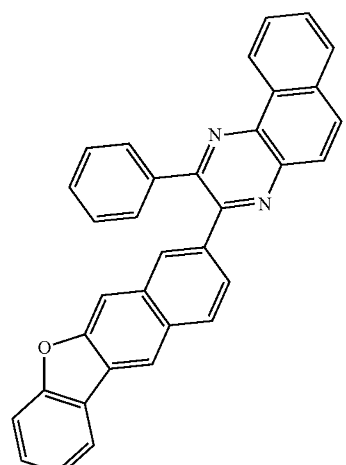
C-320
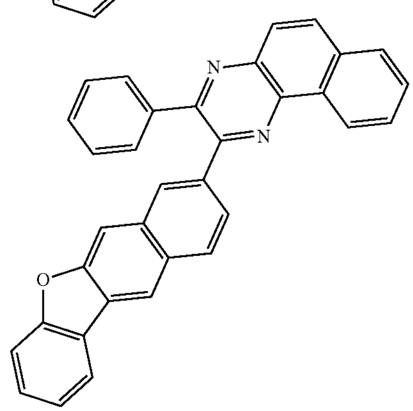

C-321
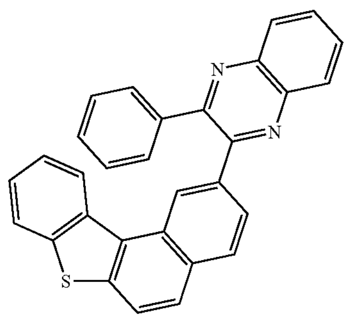
C-322
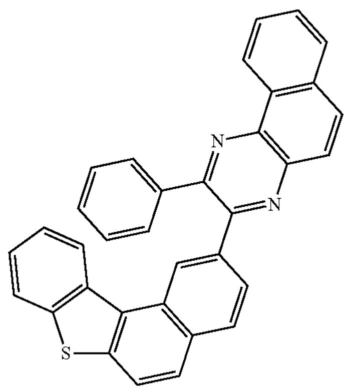
C-323
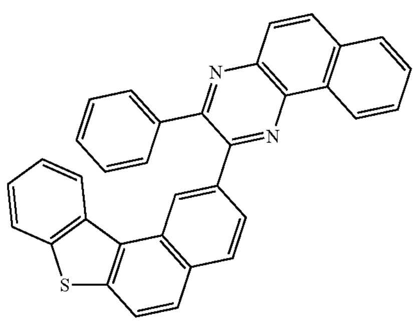
C-324
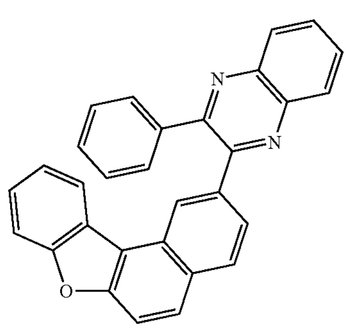
C-325
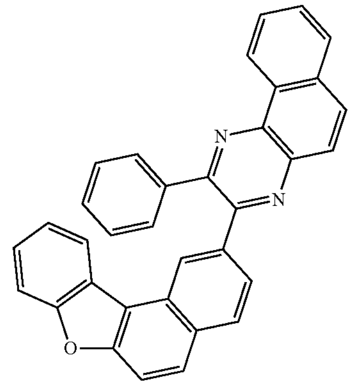
C-326
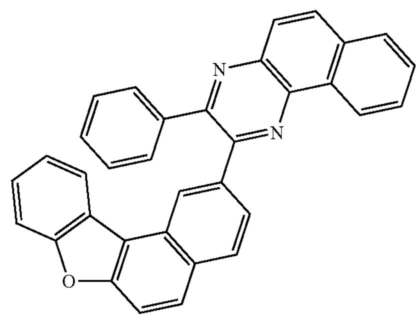
C-327
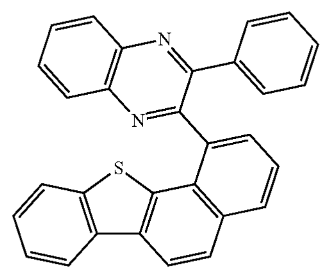
C-328
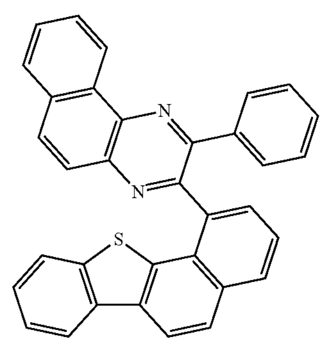
C-329
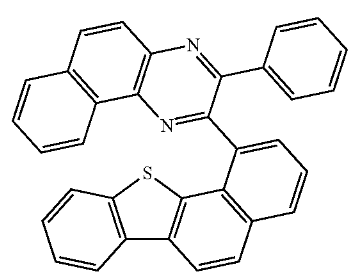

-continued
C-330
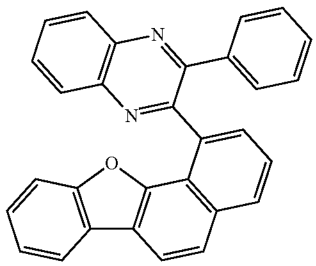
C-331
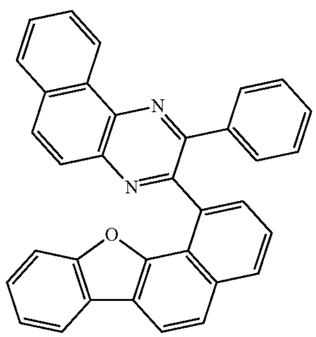
C-332
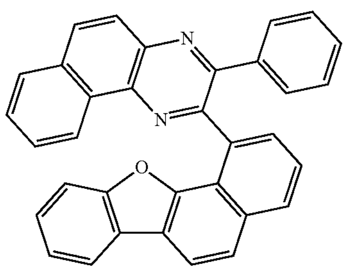
C-333
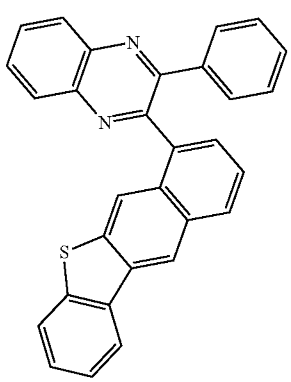
-continued
C-334
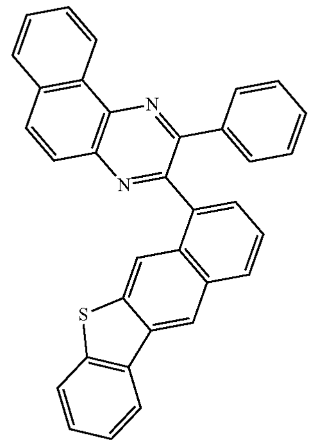
C-335
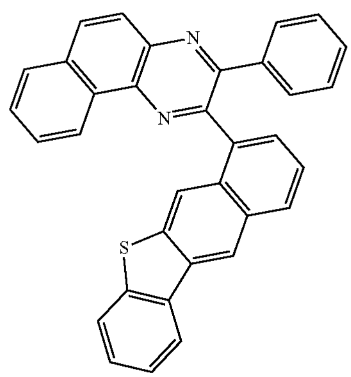
C-336
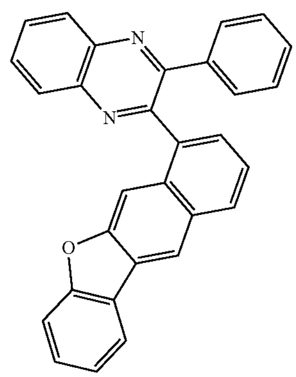
C-337
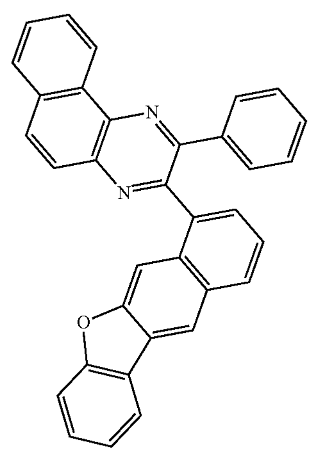

-continued
C-338
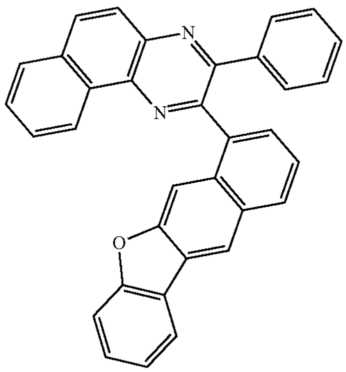
C-339
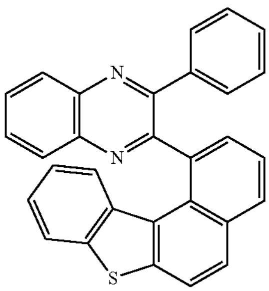
C-340
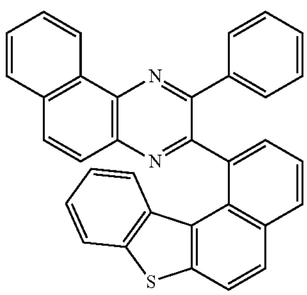
C-341
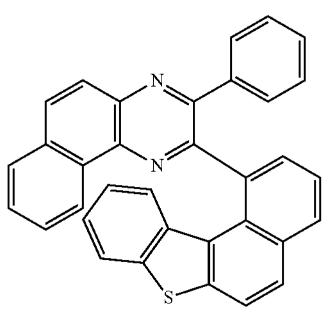
C-342
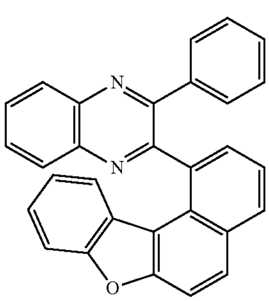
-continued
C-343
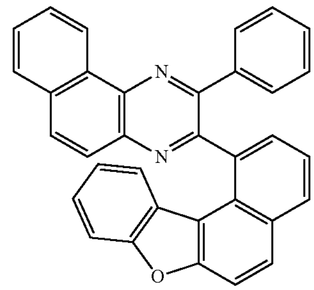
C-344
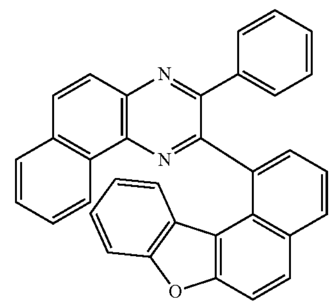
C-345
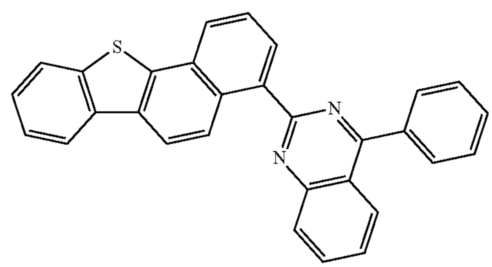
C-346
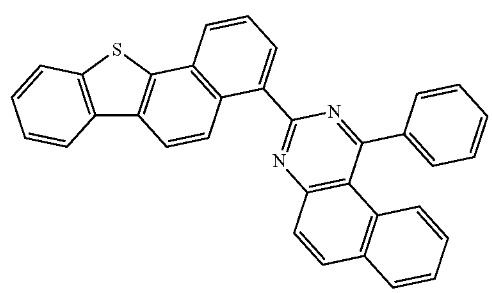
C-347
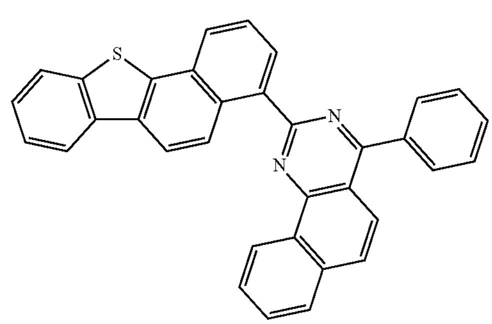

-continued
C-348
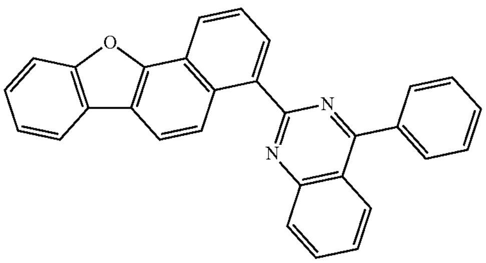
C-349
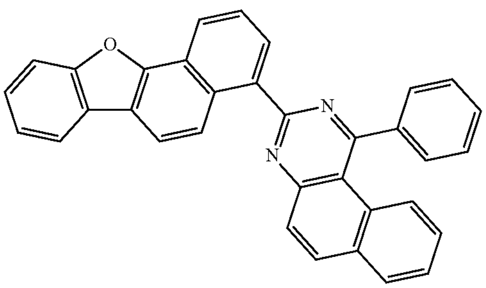
C-350
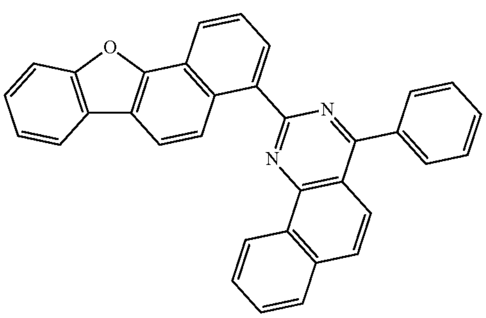
C-351
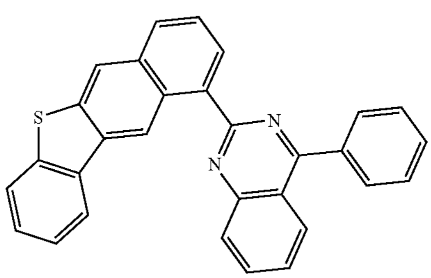
C-352
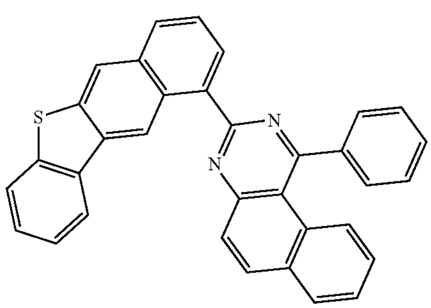
-continued
C-353
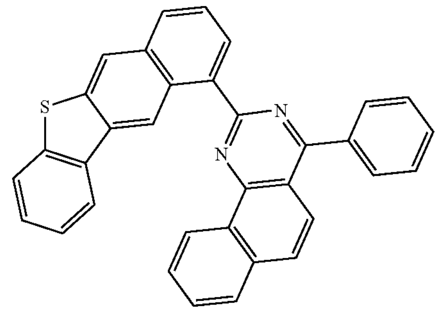
C-354
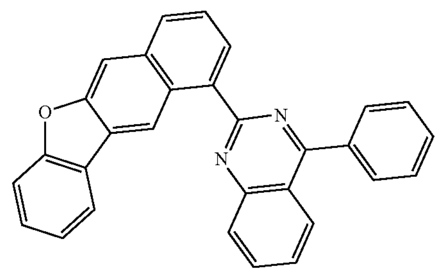
C-355
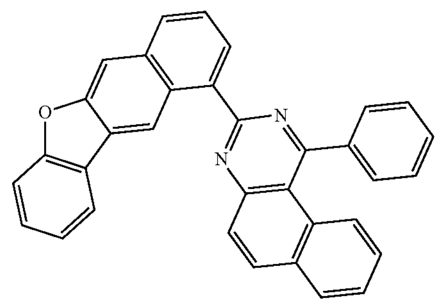
C-356
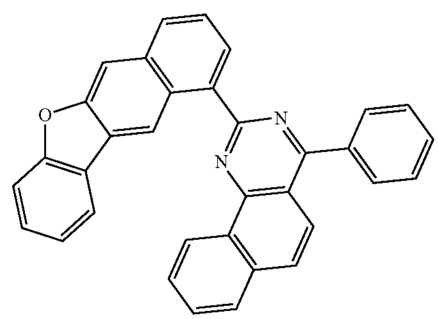
C-357
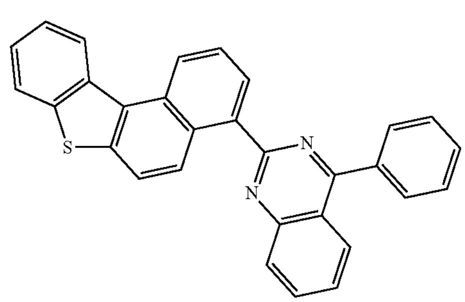

C-358
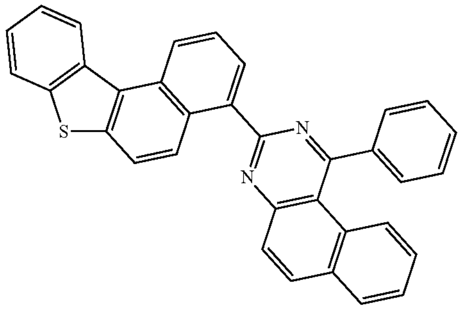
C-359
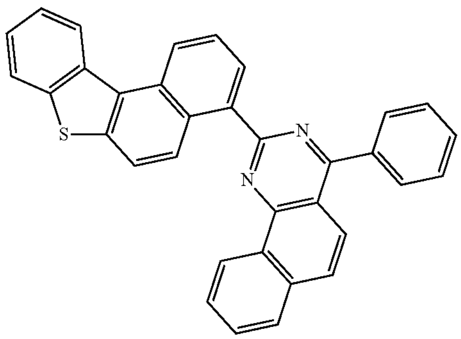
C-360
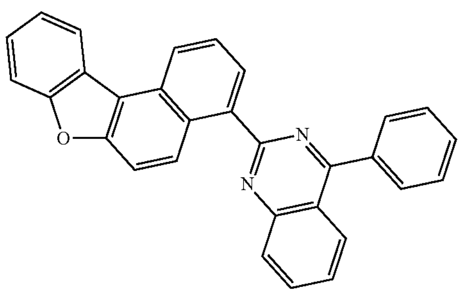
C-361
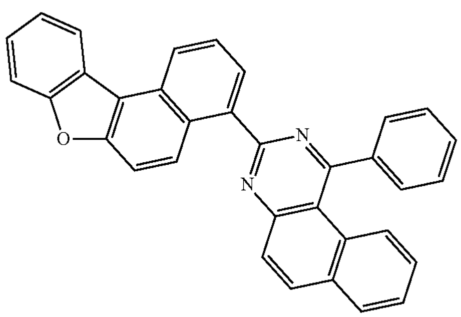
C-362
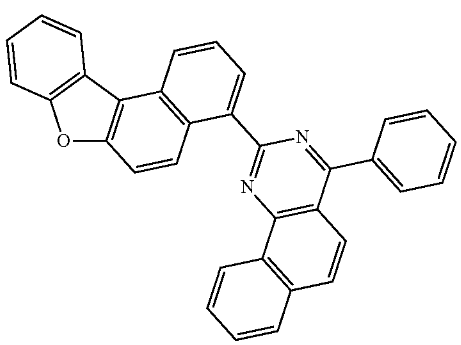
C-363
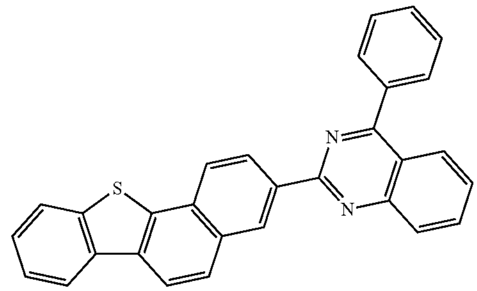
C-364
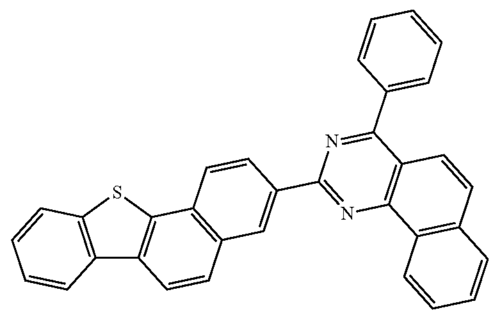
C-365
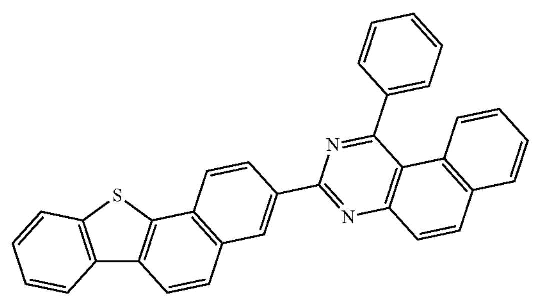
C-366
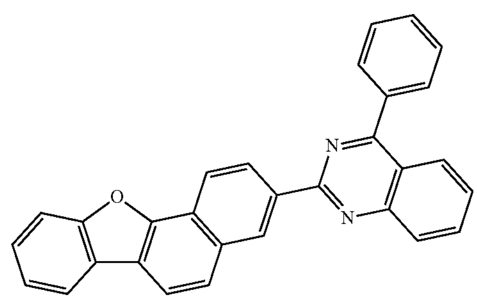
C-367
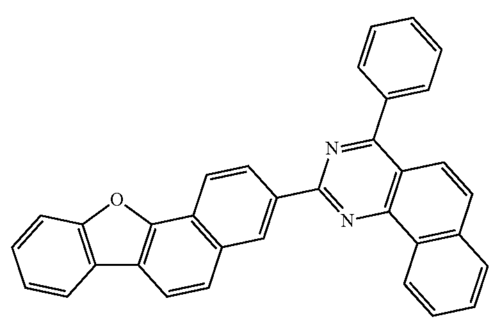

C-368
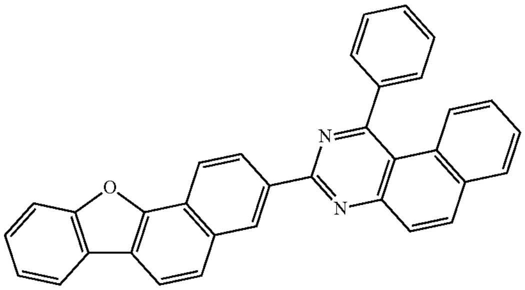
C-369
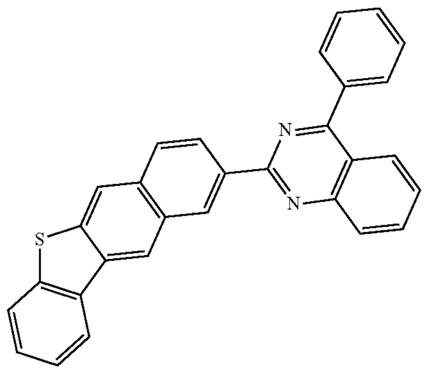
C-370
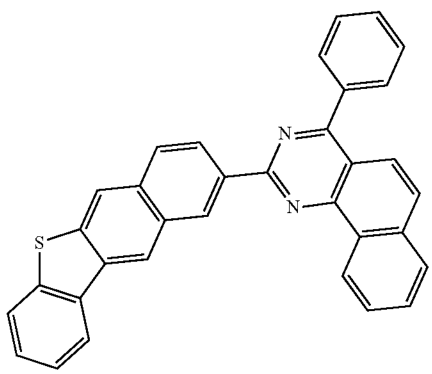
C-371
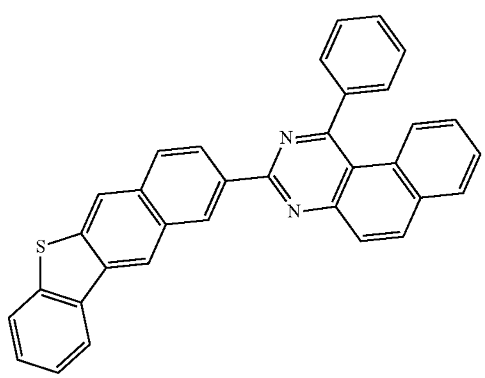
C-372
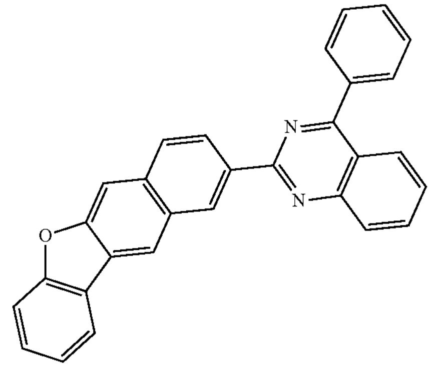
C-373
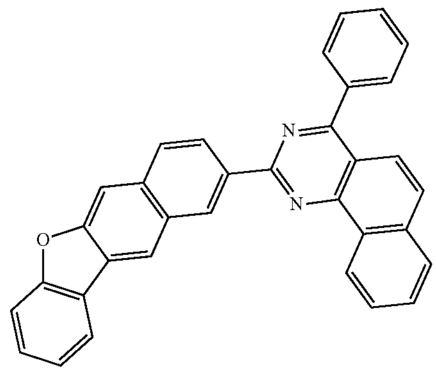
C-374
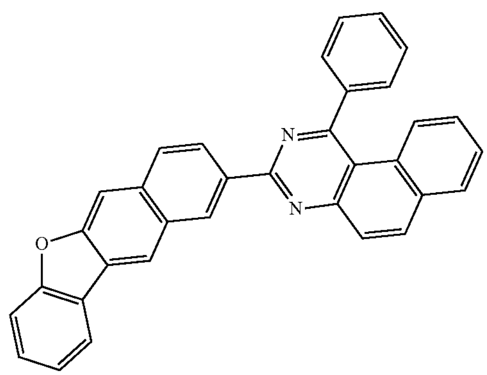
C-375
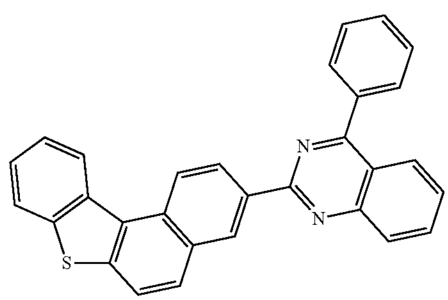

-continued
C-376
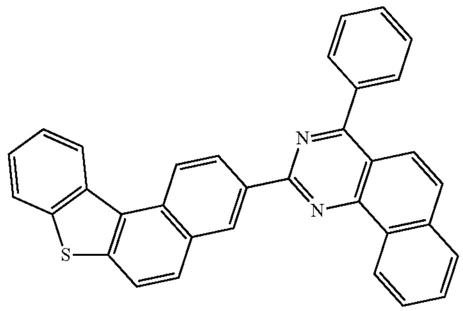
C-377
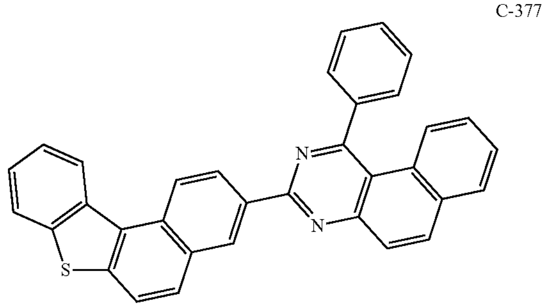
C-378
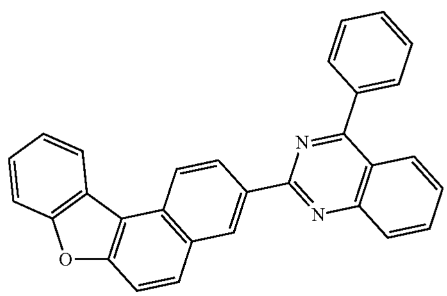
C-379
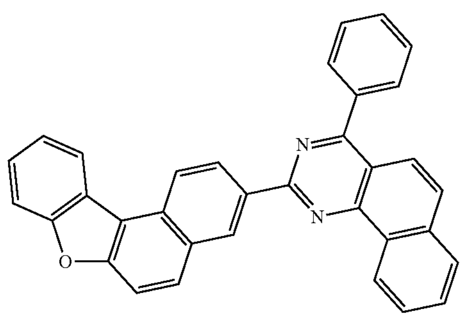
C-380
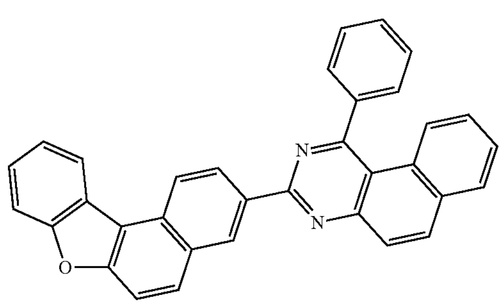
-continued
C-381
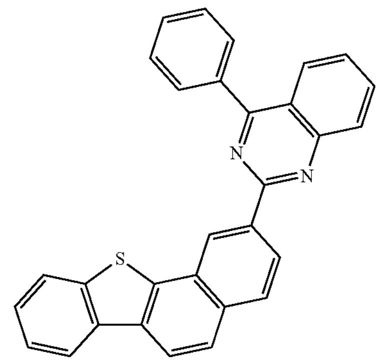
C-382
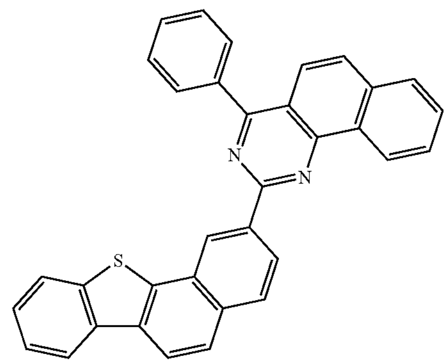
C-383
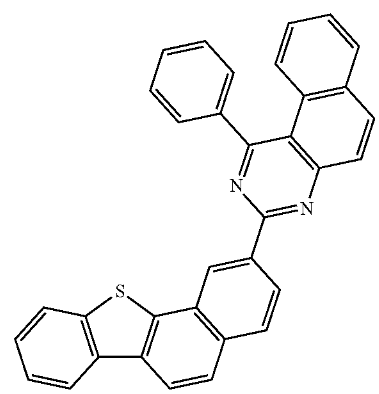
C-384
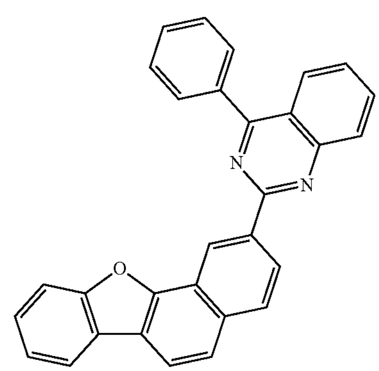

-continued
C-385
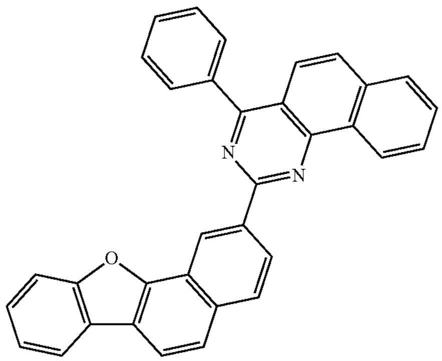
C-386
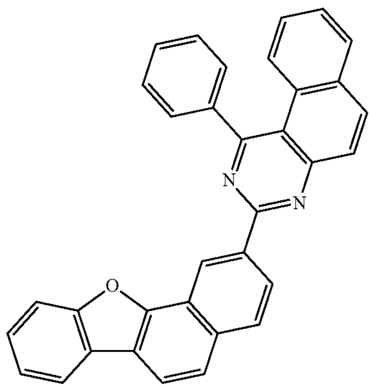
C-387
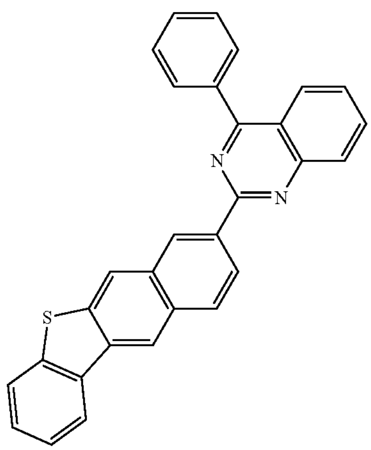
C-388
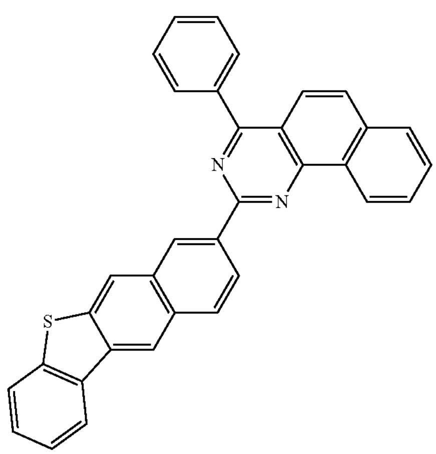
-continued
C-389
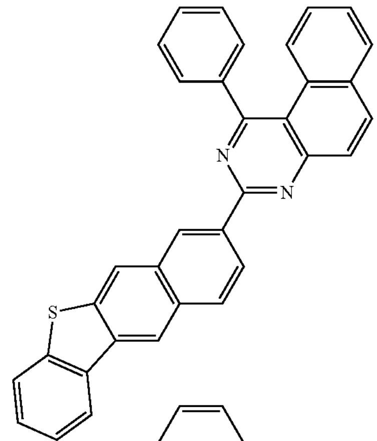
C-390
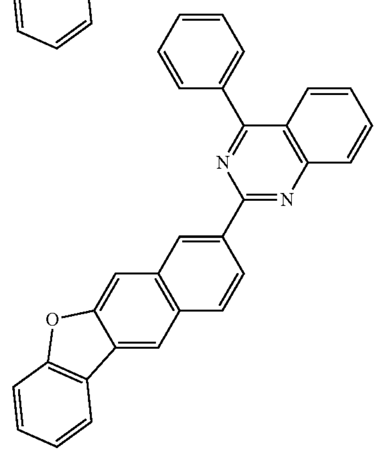
C-391
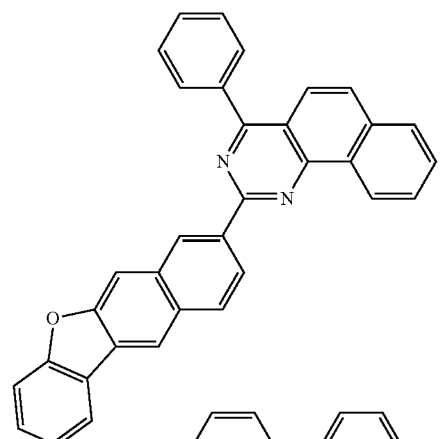
C-392
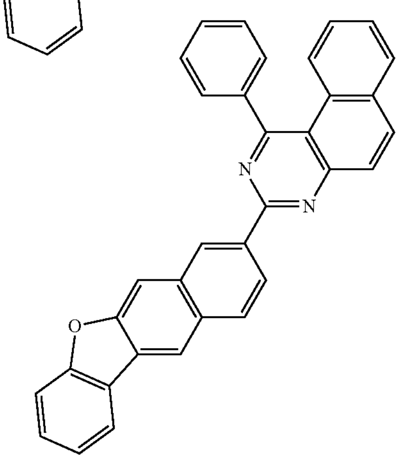

-continued
C-393
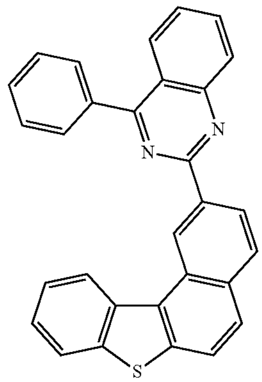
C-394
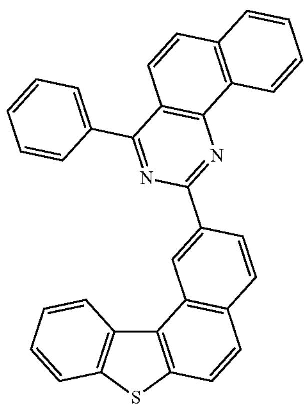
C-395
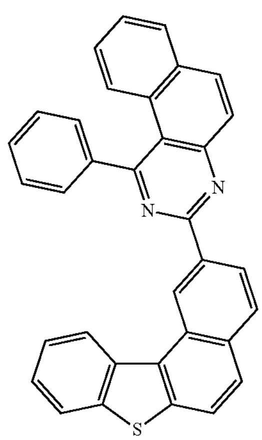
C-396
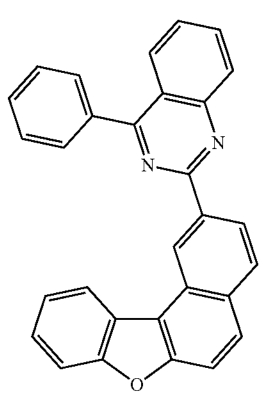
-continued
C-397
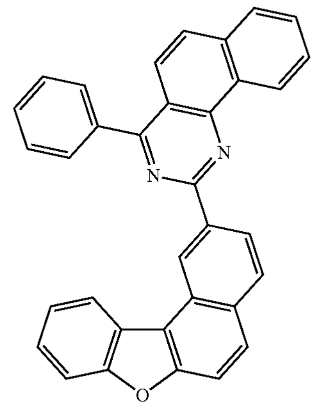
C-398
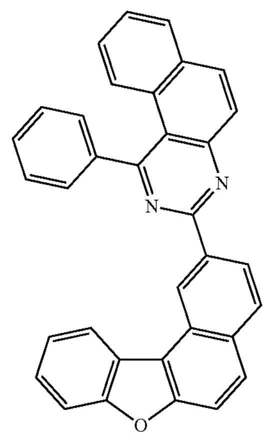
C-399
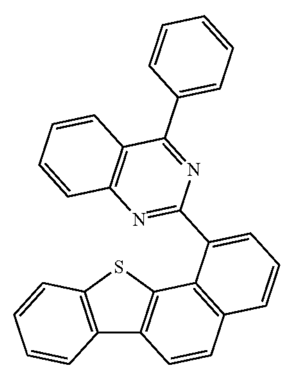
C-400
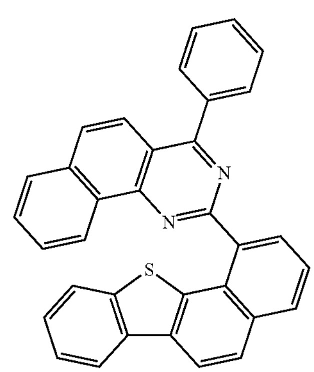

-continued
C-401
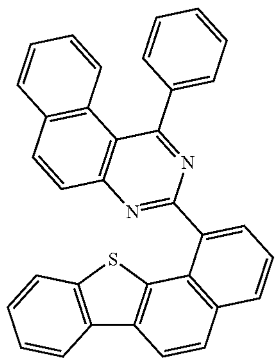
C-402
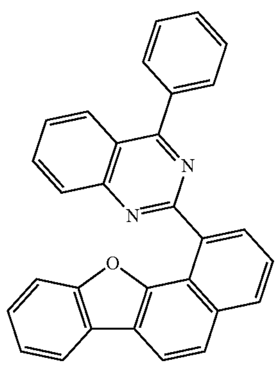
C-403
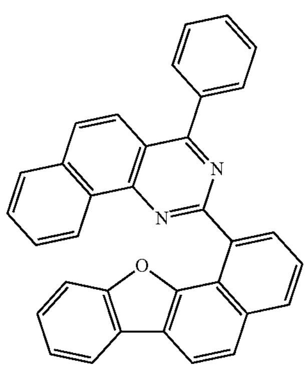
C-404
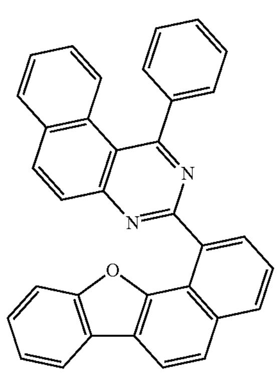
-continued
C-405
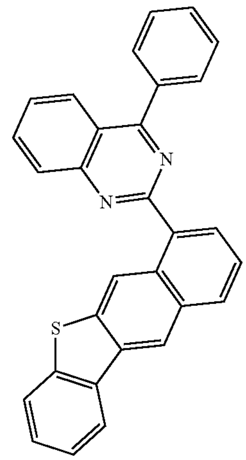
C-406
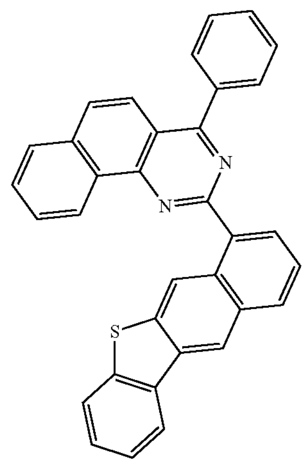
C-407
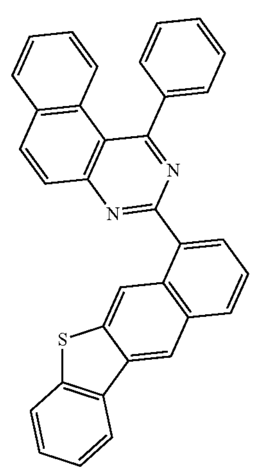

C-408
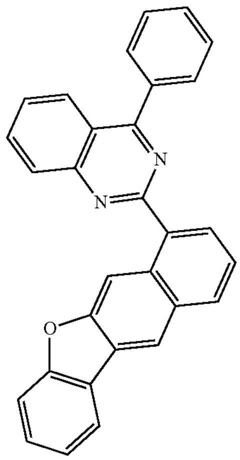
C-409
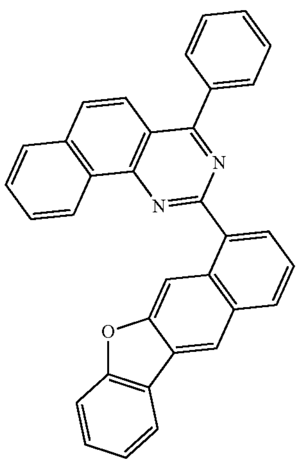
C-410
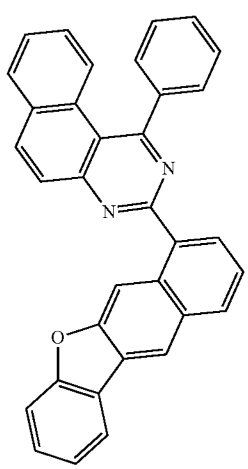
C-411
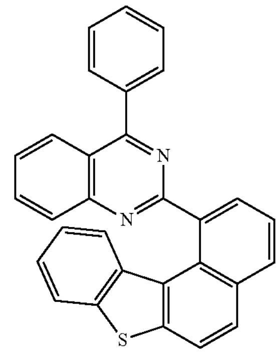
C-412
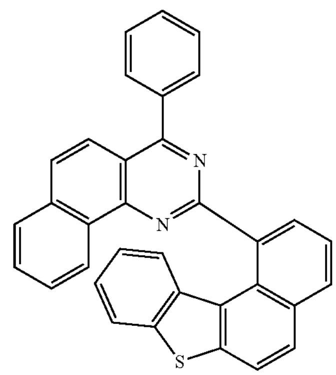
C-413
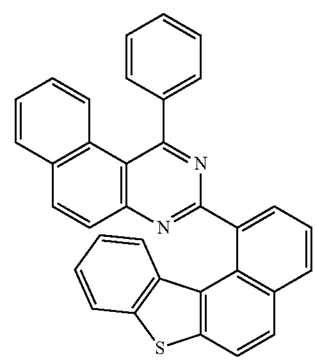
C-414
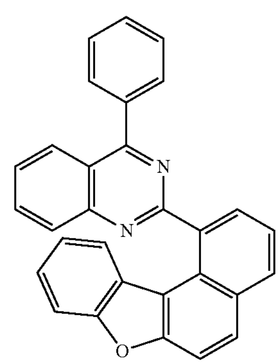

-continued
C-415
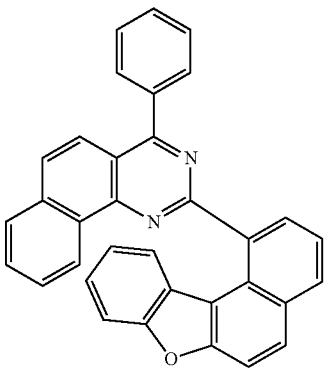
C-416
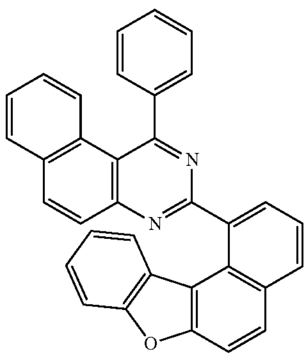
C-417
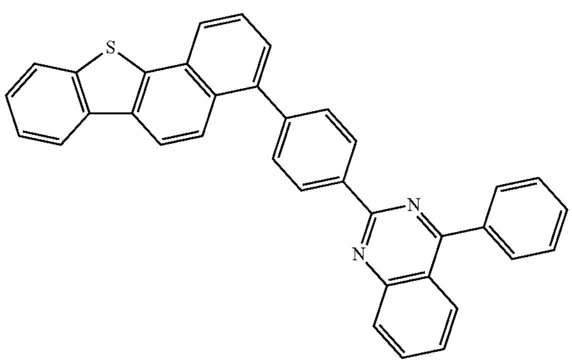
C-418
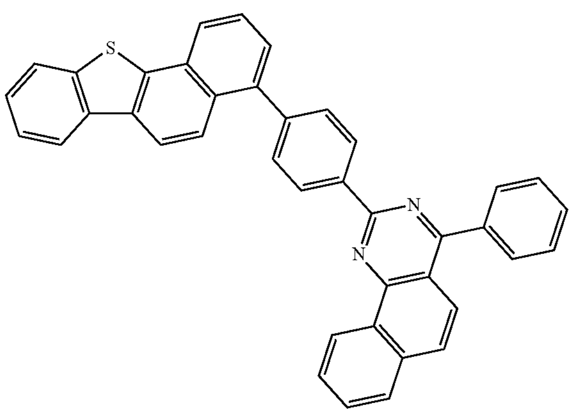
-continued
C-419
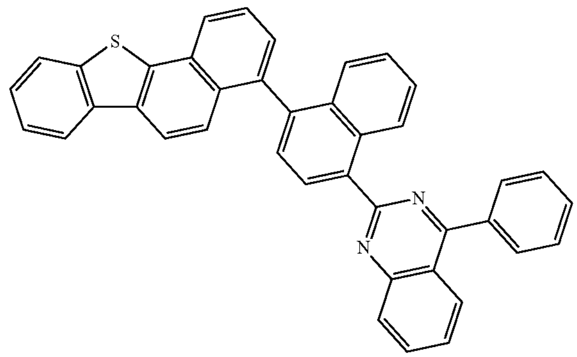
C-420
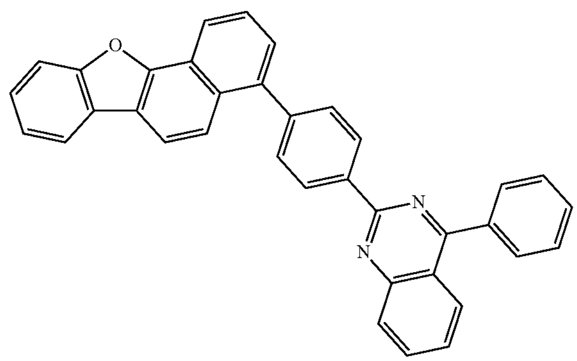
C-421
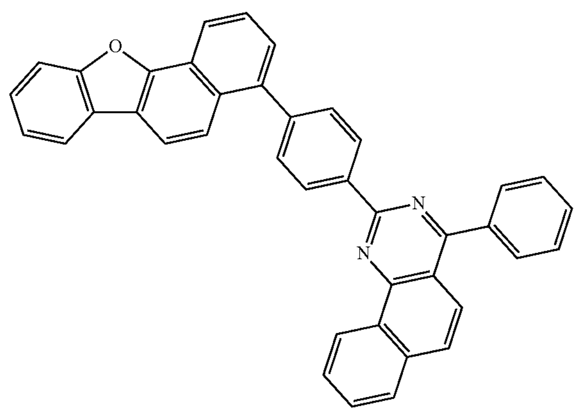
C-422
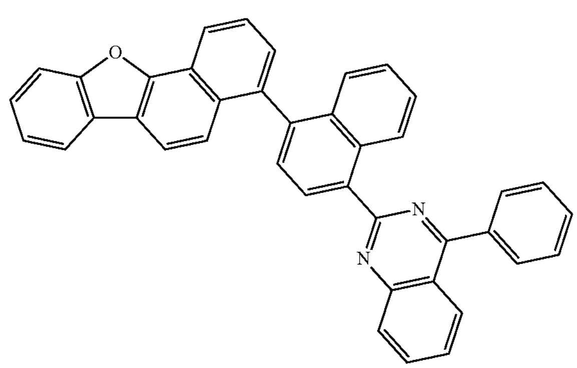

-continued
C-423
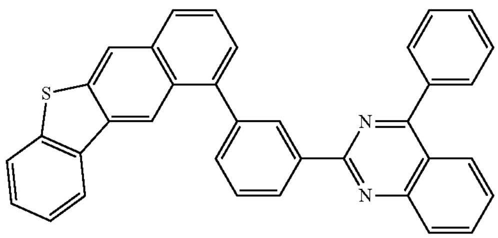
C-424
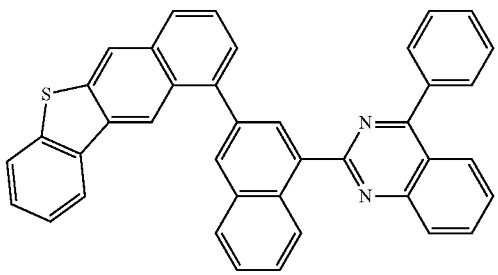
C-425
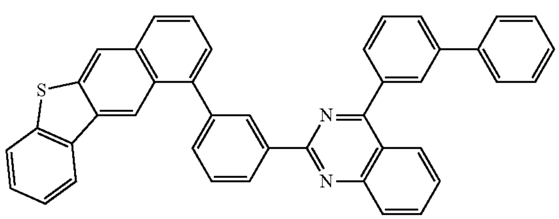
C-426
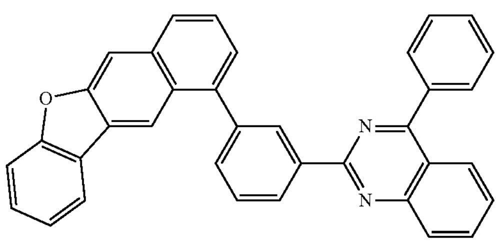
C-427
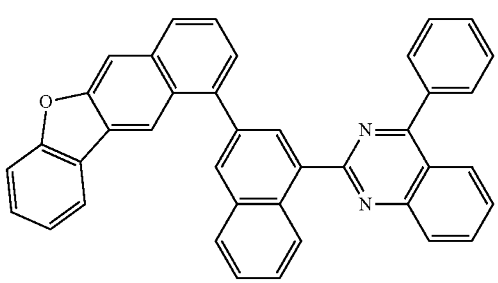
C-428
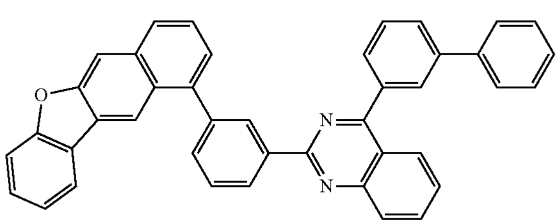
-continued
C-429
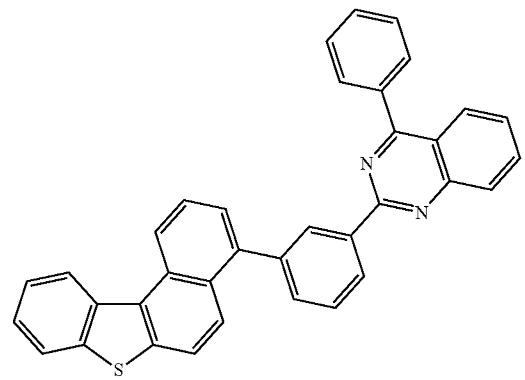
C-430
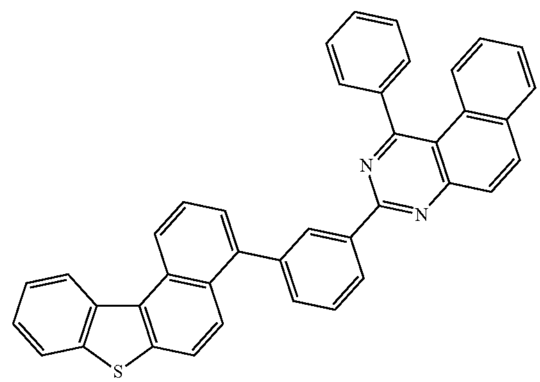
C-431
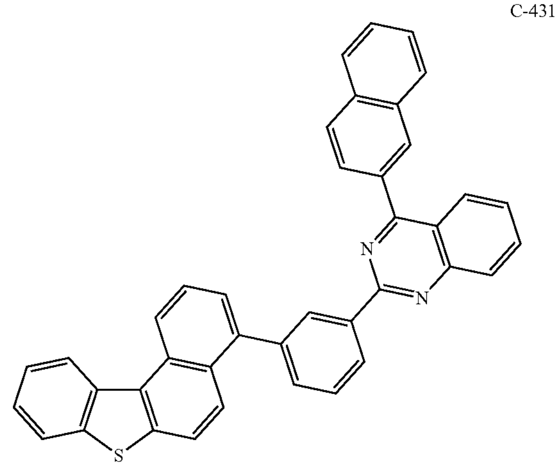
C-432
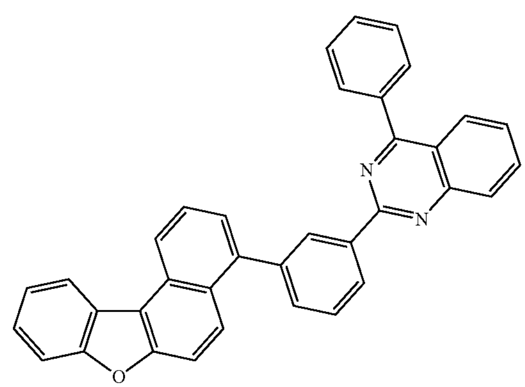

-continued
C-433
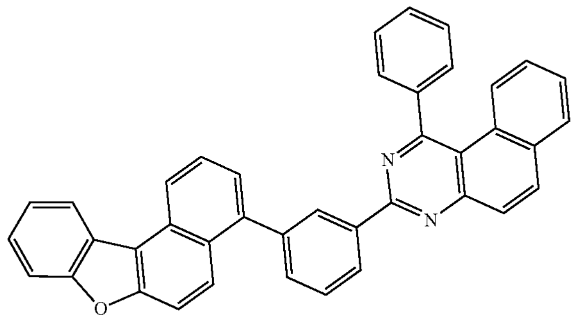
C-434
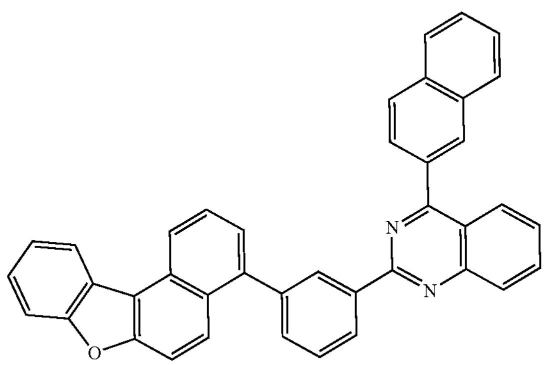
C-435
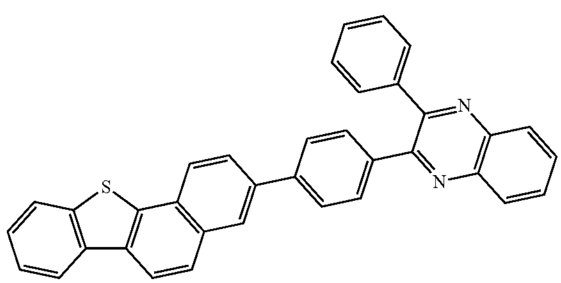
C-436
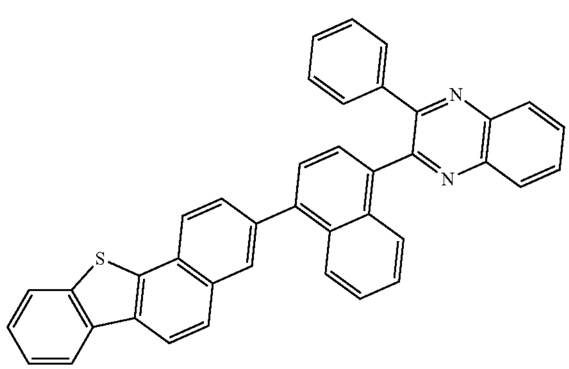
-continued
C-437
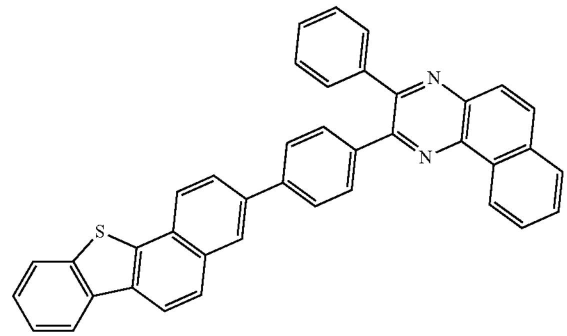
C-438
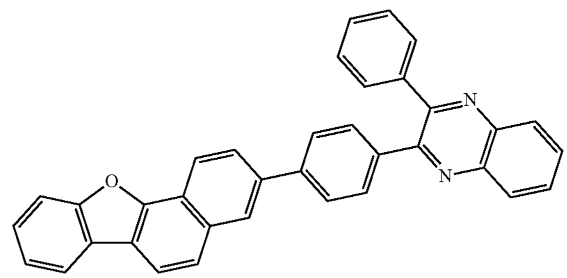
C-439
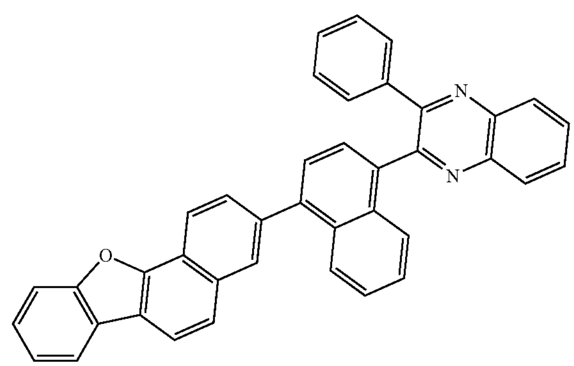
C-440
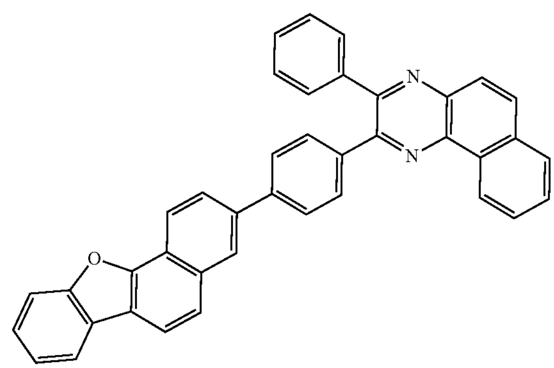

-continued
C-441
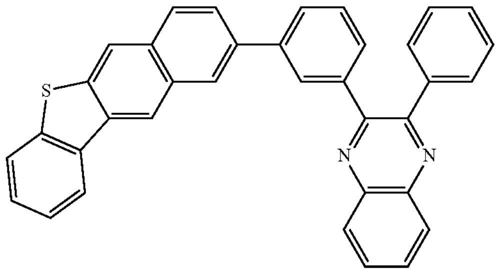
C-442
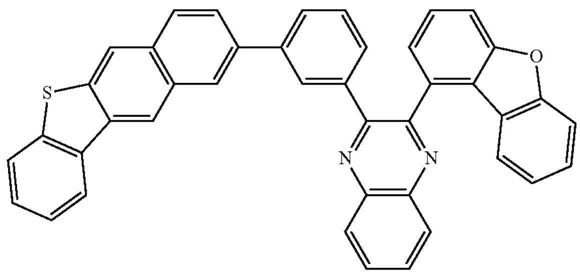
C-443
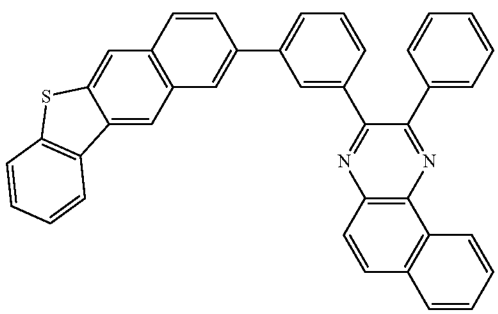
C-444
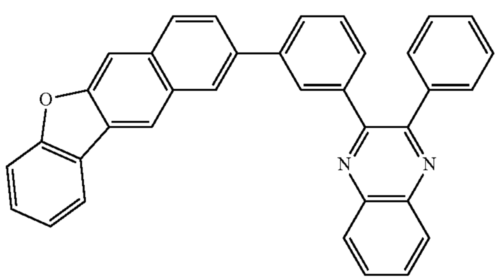
C-445
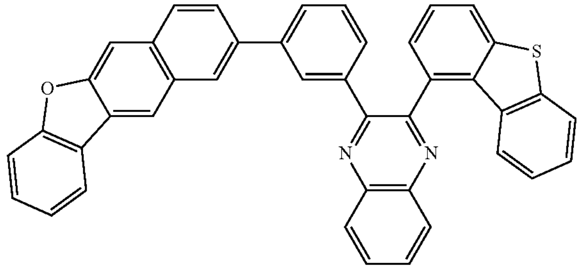
-continued
C-446
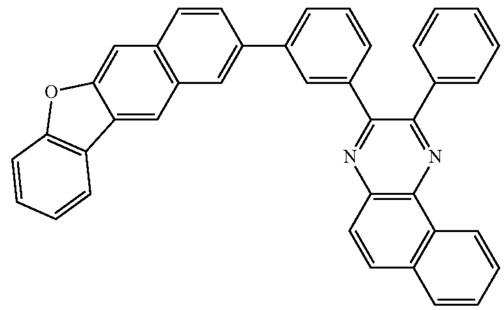
C-447
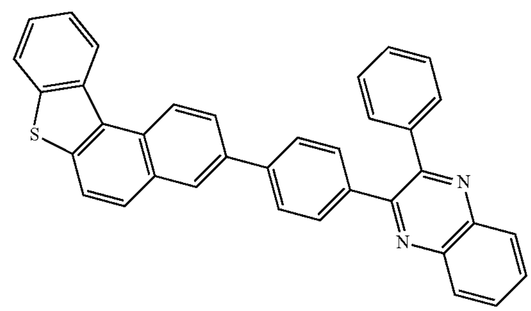
C-448
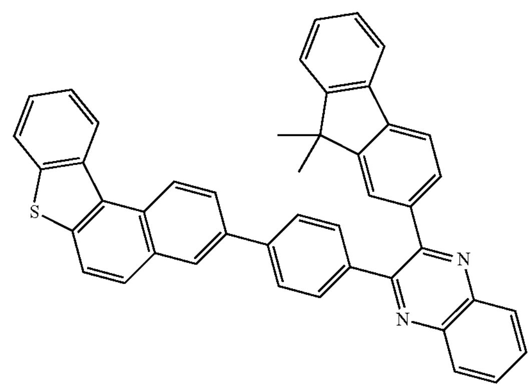
C-449
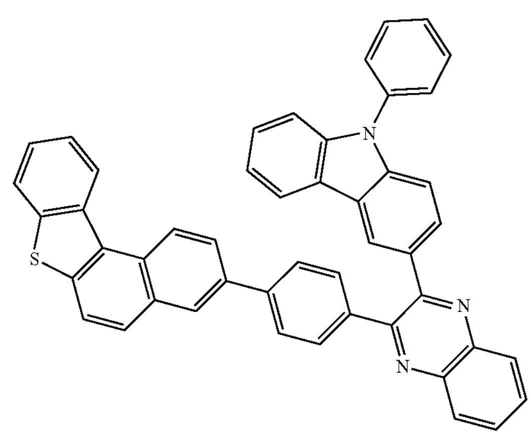

-continued
C-450
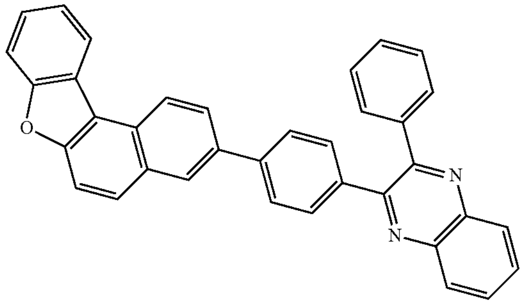
C-451
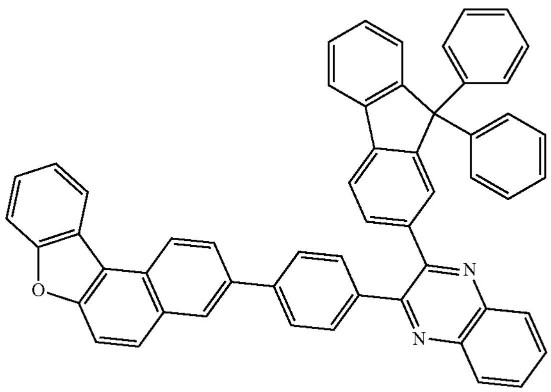
C-452
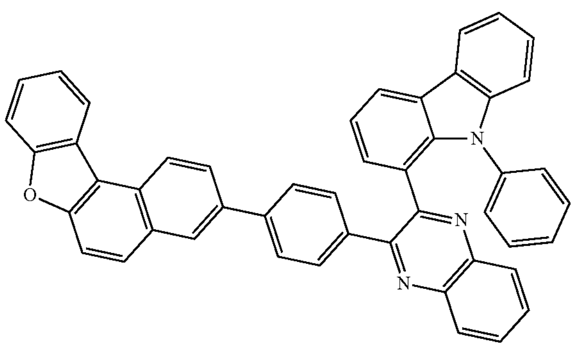
C-453
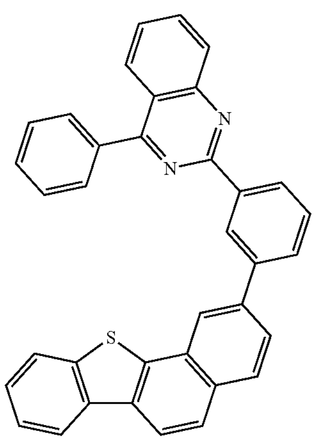
-continued
C-454
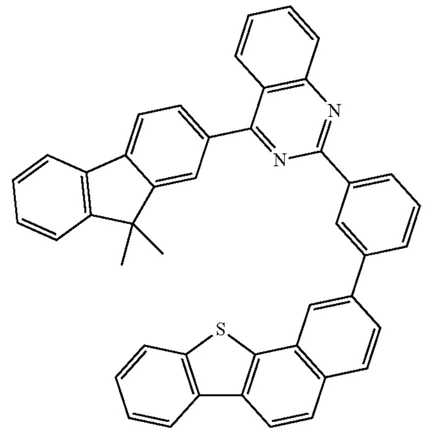
C-455
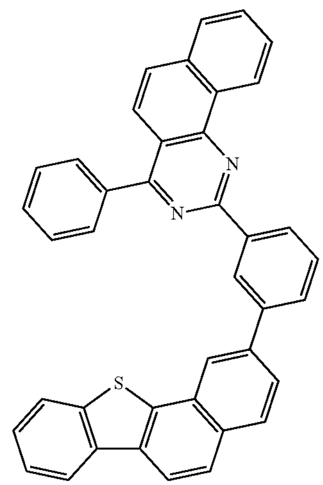
C-456
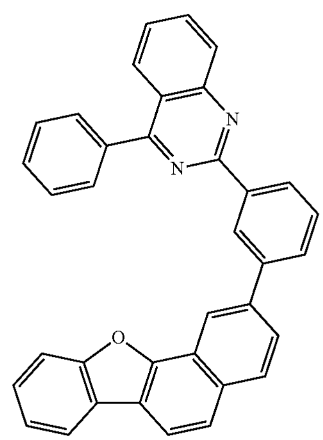

-continued
C-457
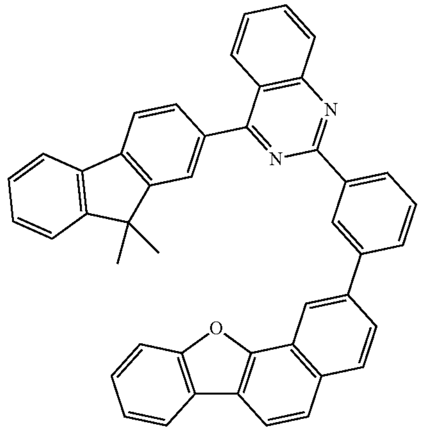
C-458
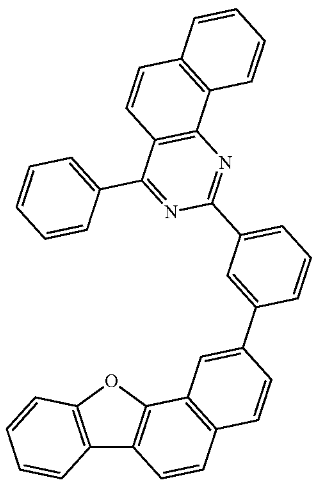
C-459
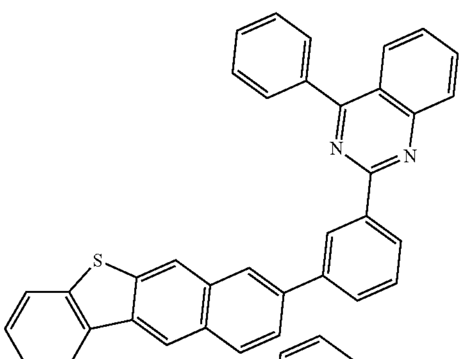
C-460
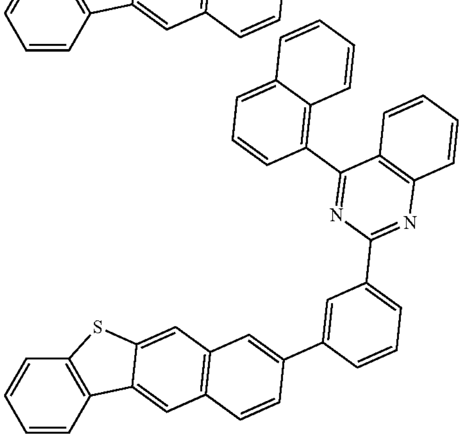
-continued
C-461
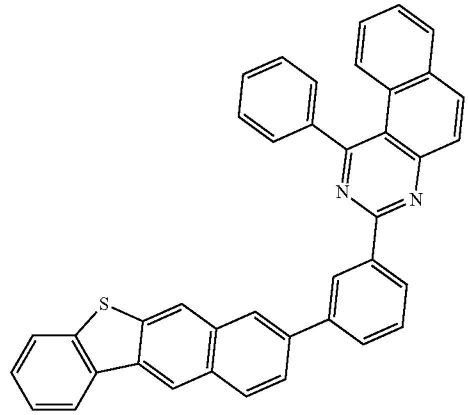
C-462
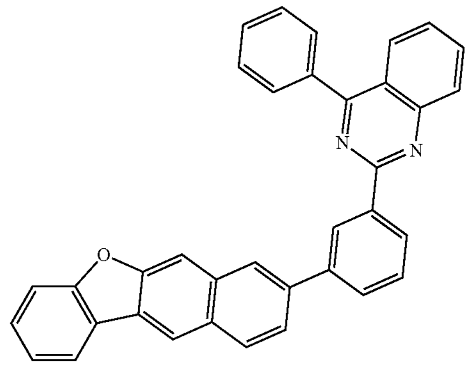
C-463
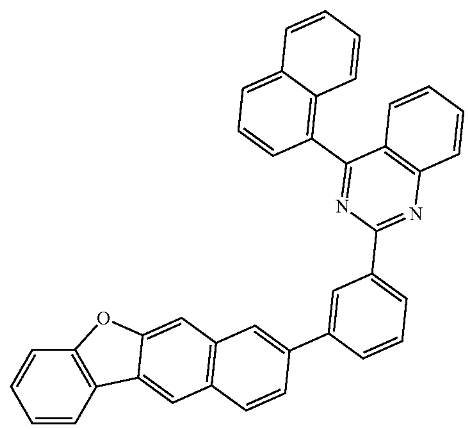
C-464
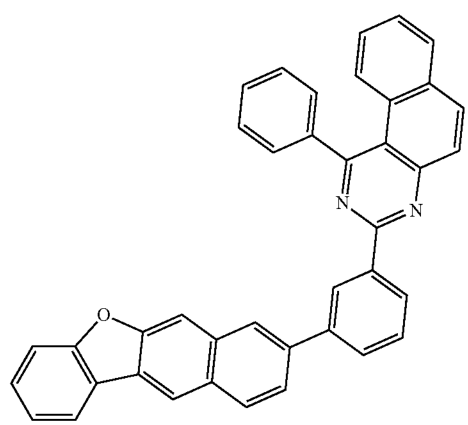

C-465
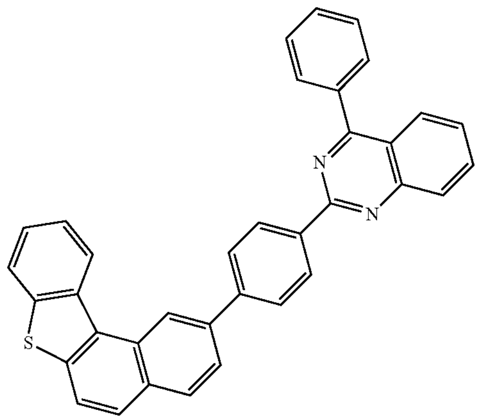
C-466
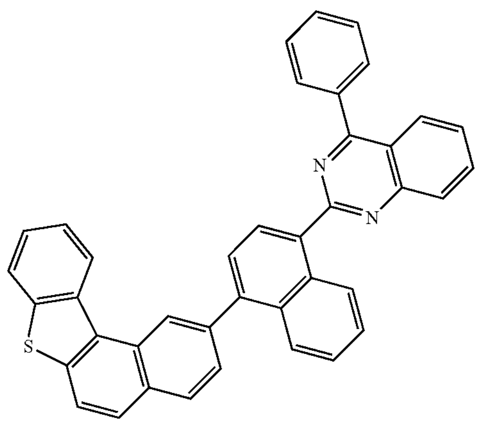
C-467
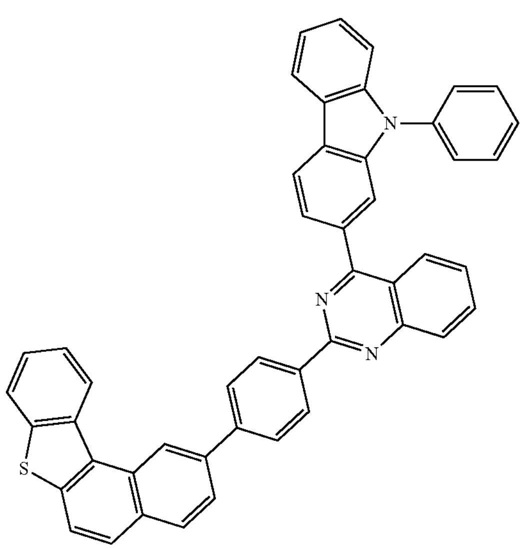
C-468
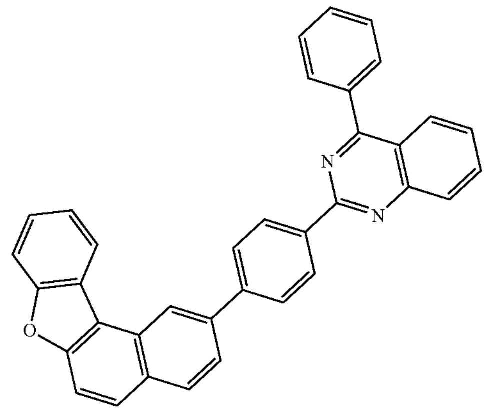
C-469
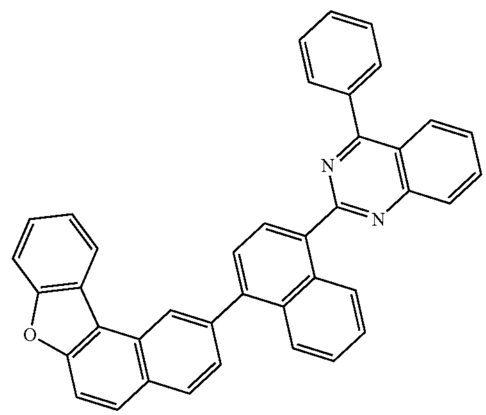
C-470
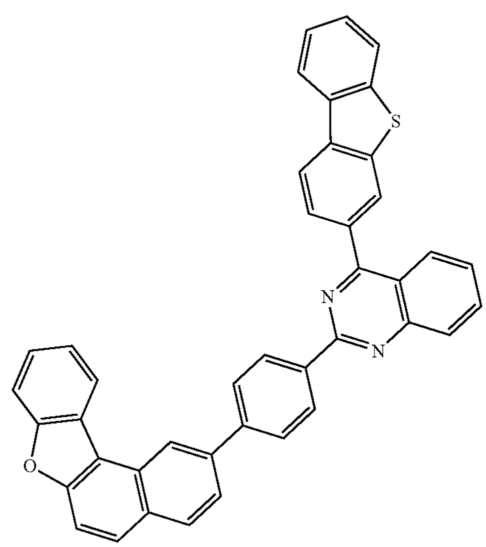

-continued
C-471
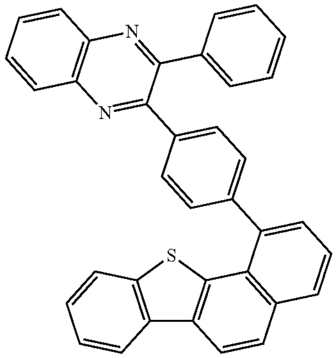
C-472
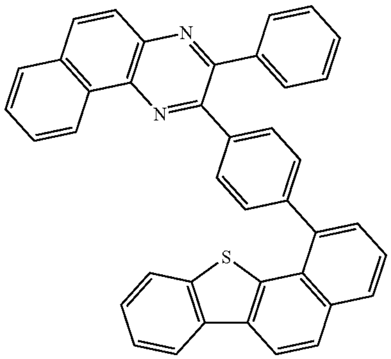
C-473
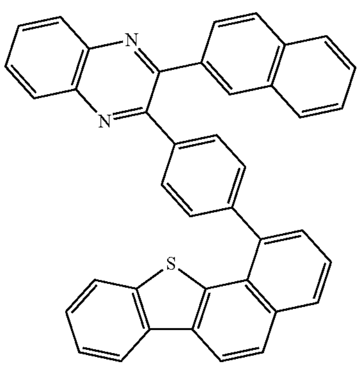
C-474
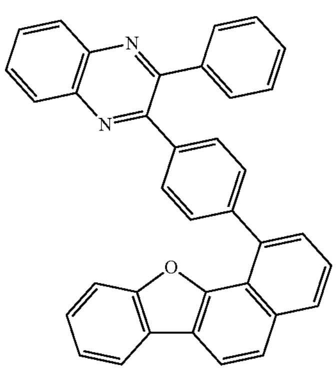
-continued
C-475
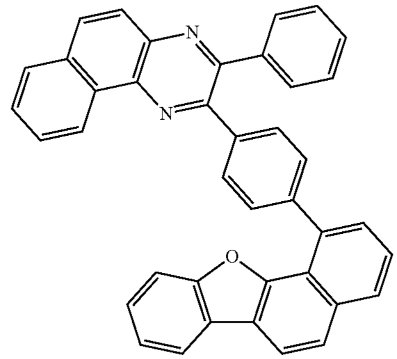
C-476
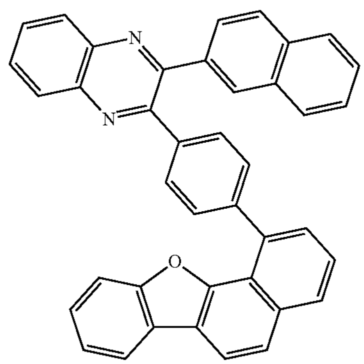
C-477
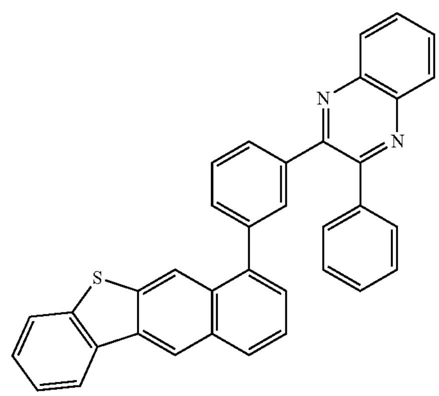
C-478
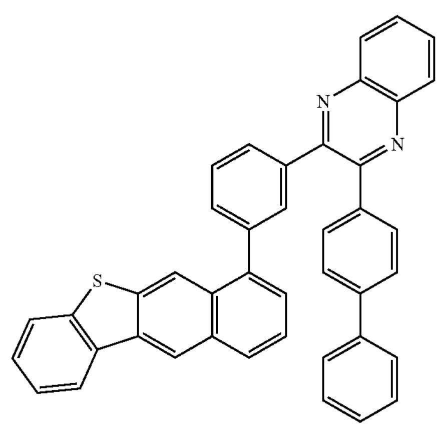

-continued
C-479
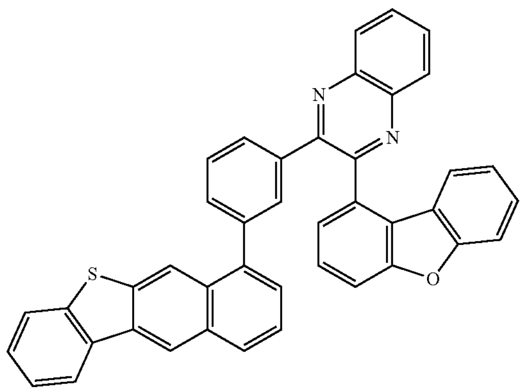
C-480
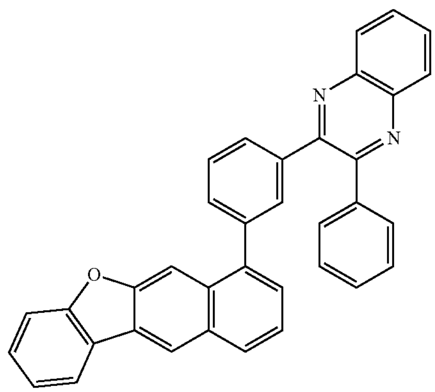
C-481
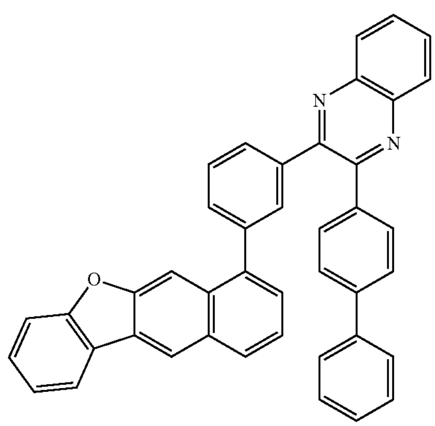
C-482
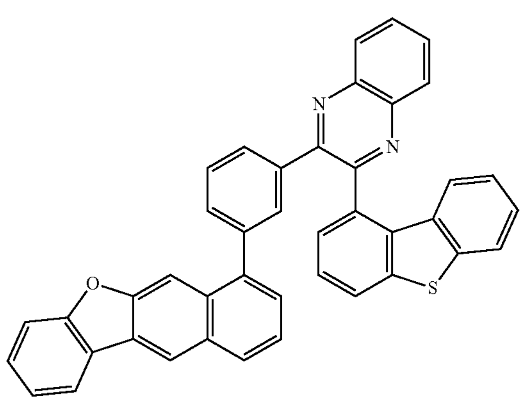
-continued
C-483
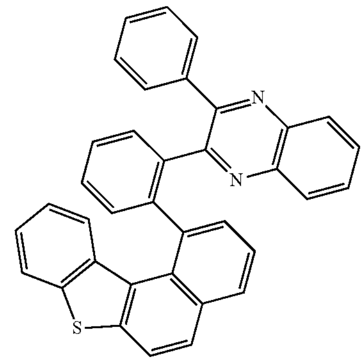
C-484
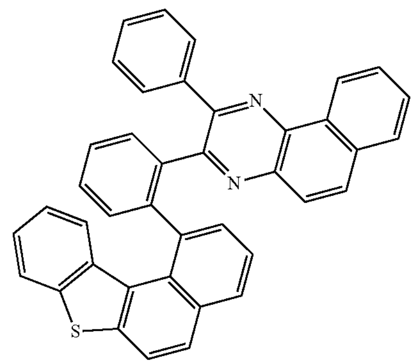
C-485
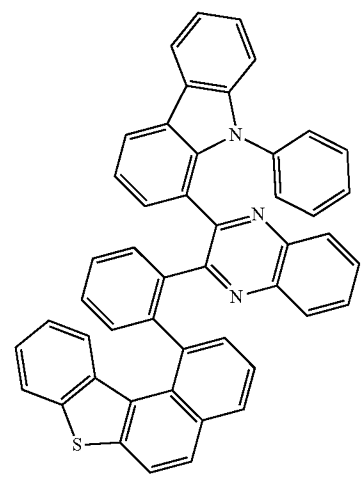
C-486
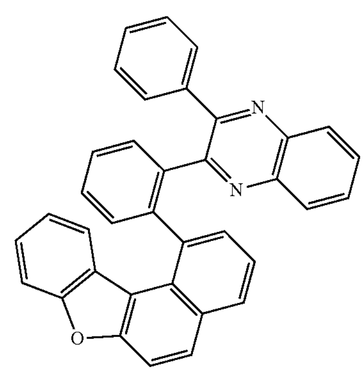

-continued
C-487
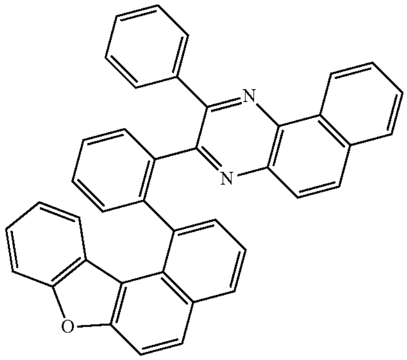
C-488
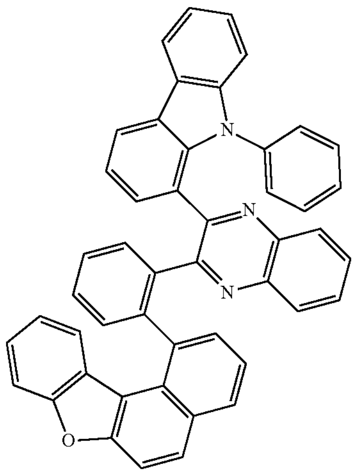
C-489
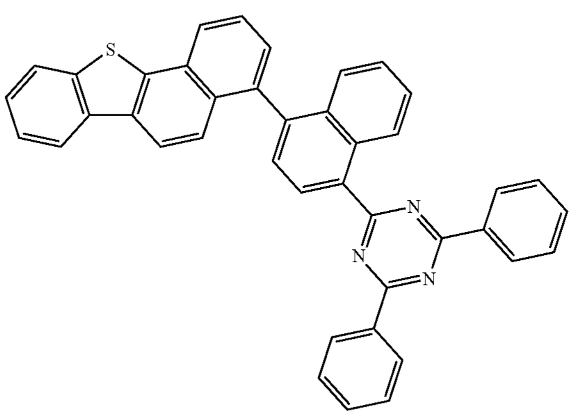
C-490
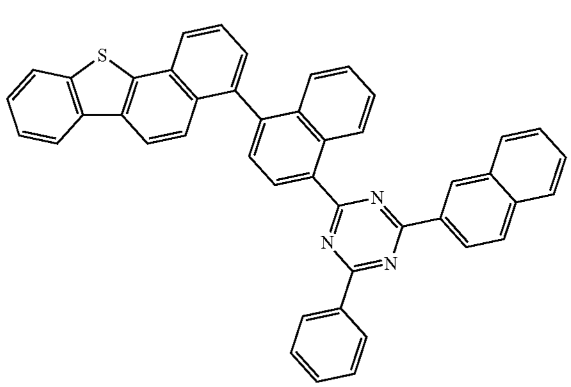
-continued
C-491
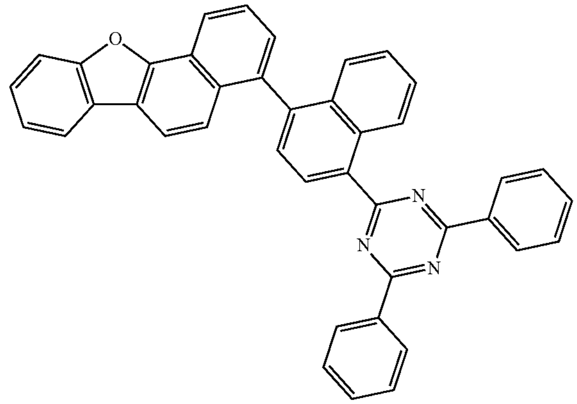
C-492
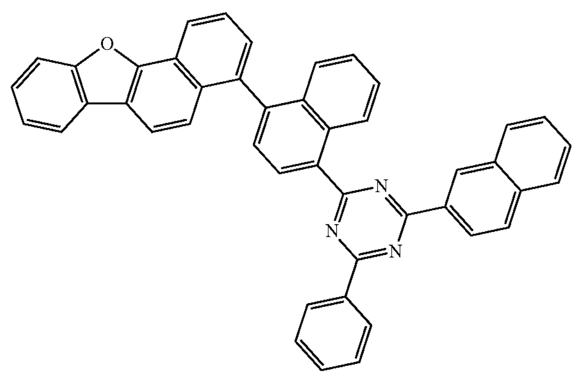
C-493
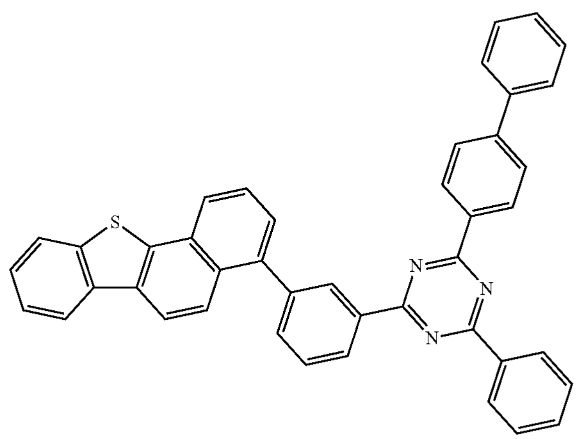
C-494
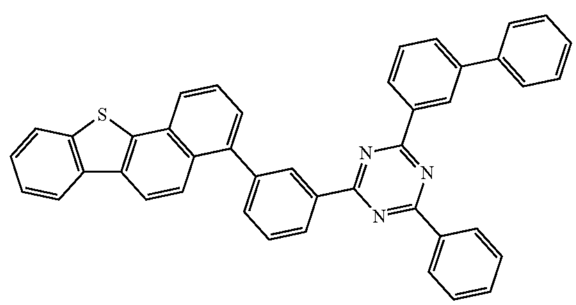

-continued
C-495
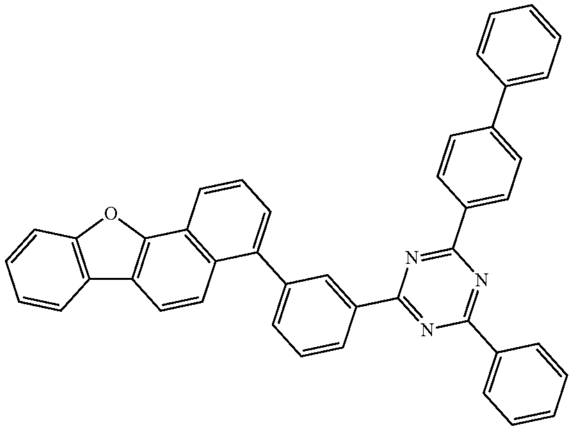
C-496
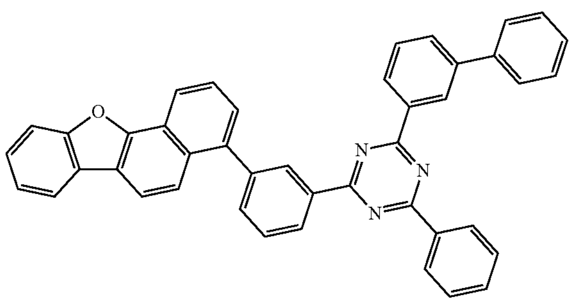
C-497
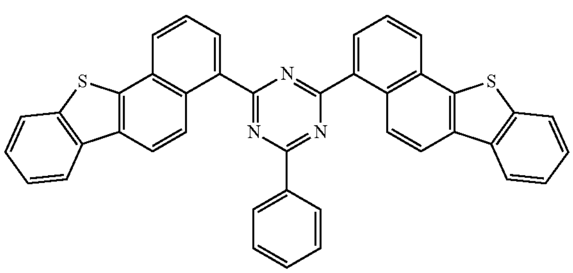
C-498
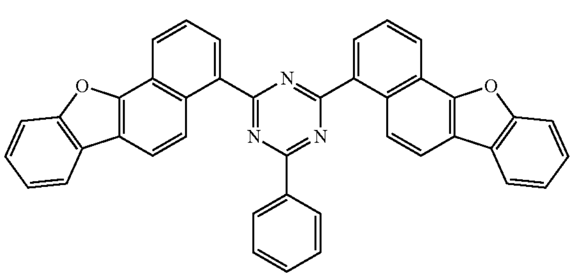
-continued
C-499
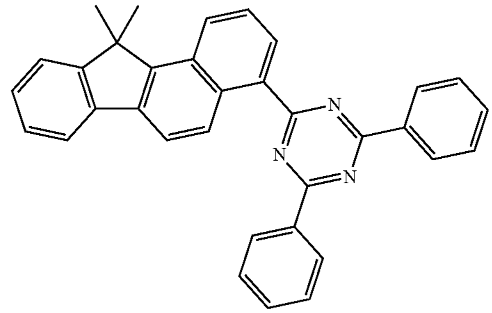
C-500
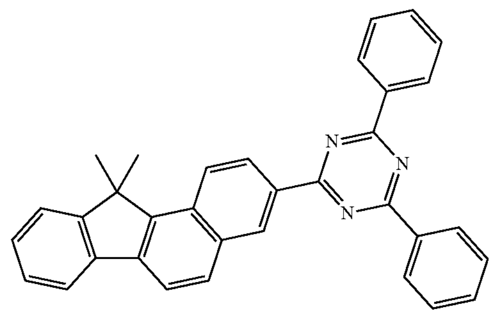
C-501
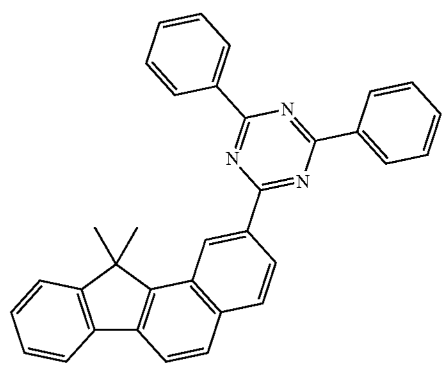
C-502
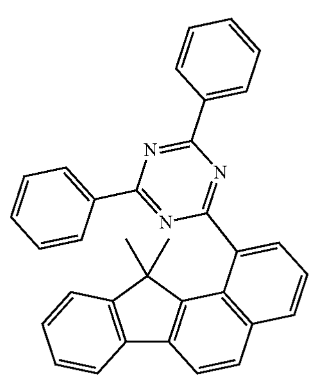

C-503
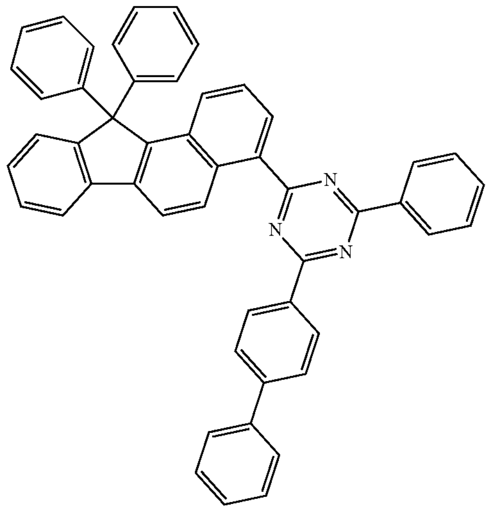
C-504
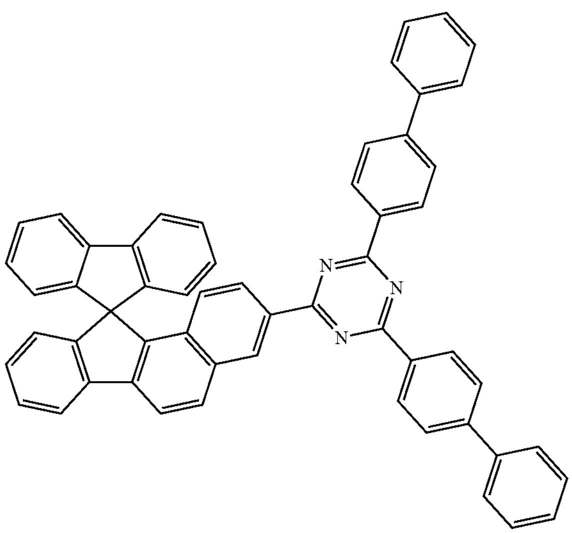
C-505
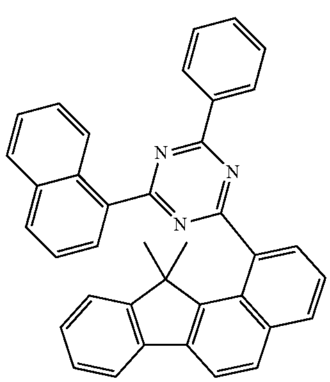
C-506
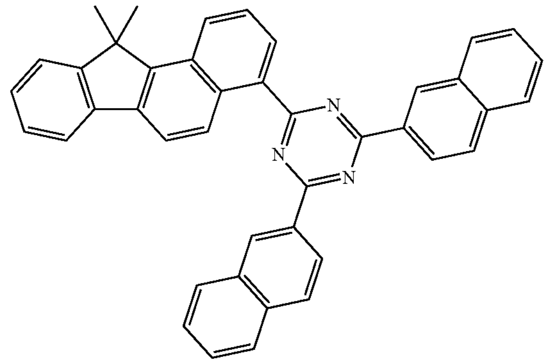
C-507
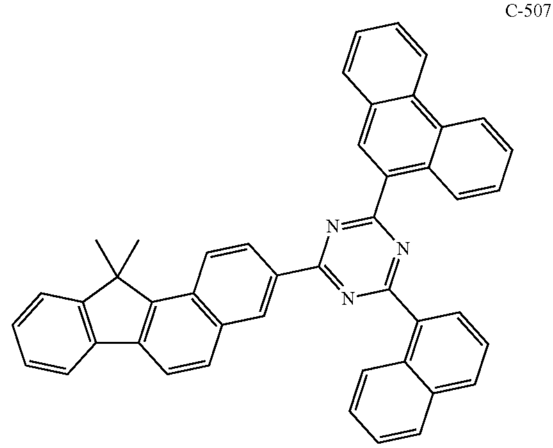
C-508
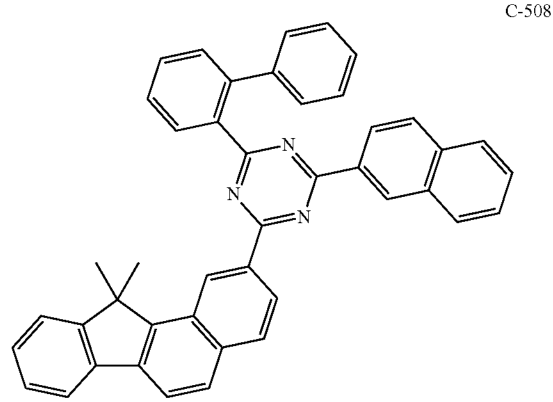
C-509
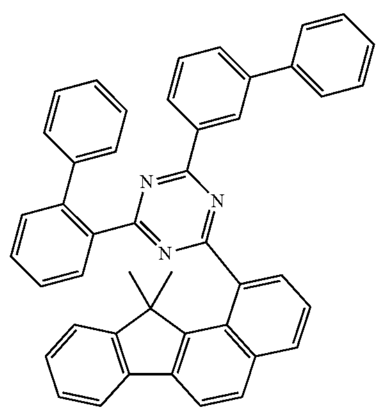

-continued
C-510
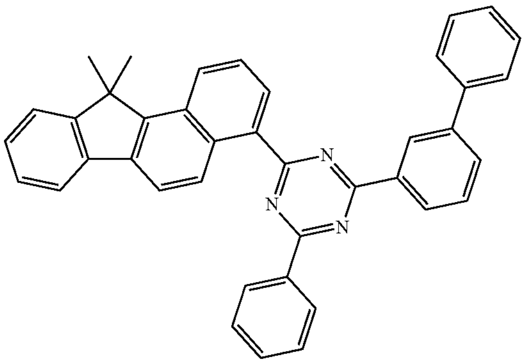
C-511
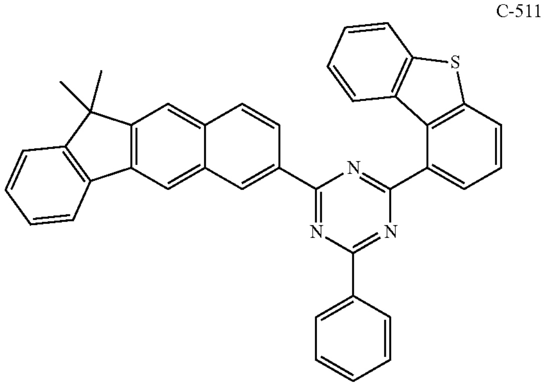
C-512
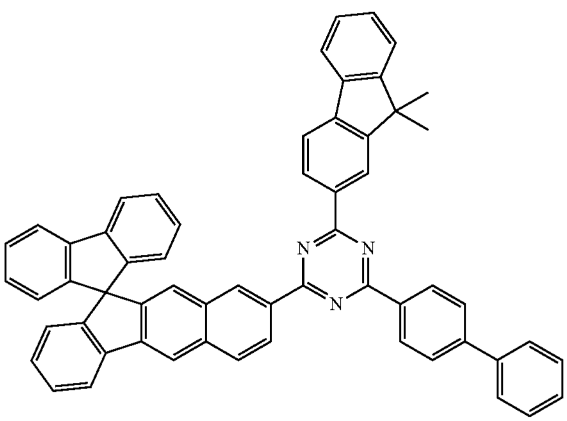
C-513
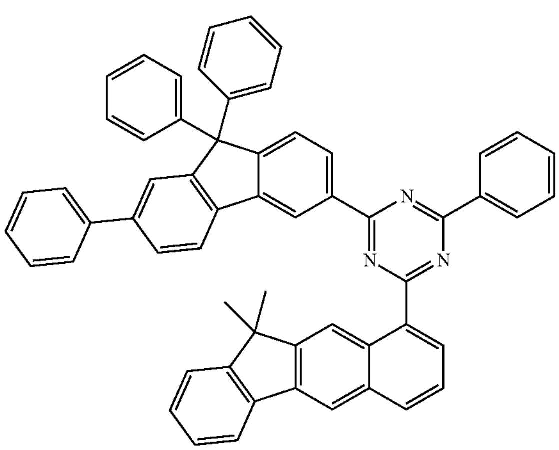
-continued
C-514
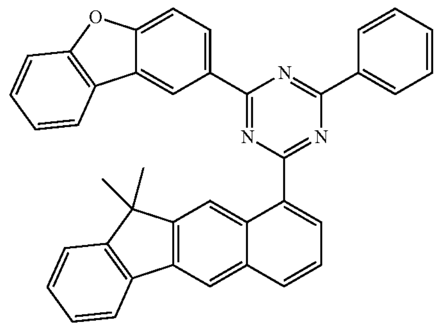
C-515
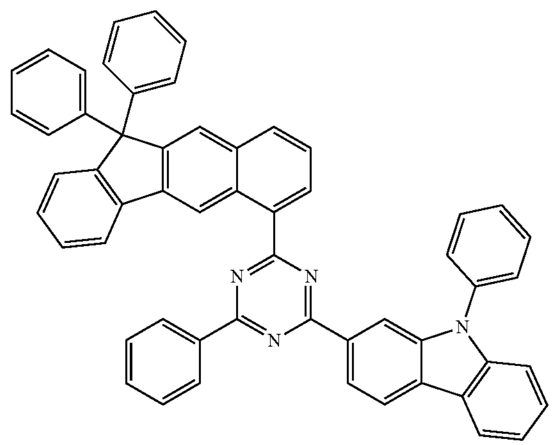
C-516
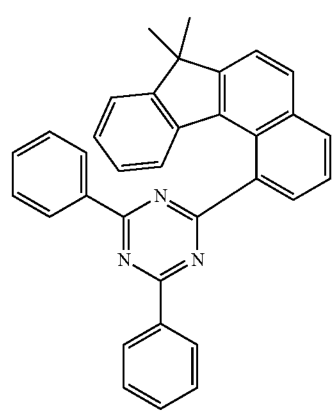

-continued
C-517
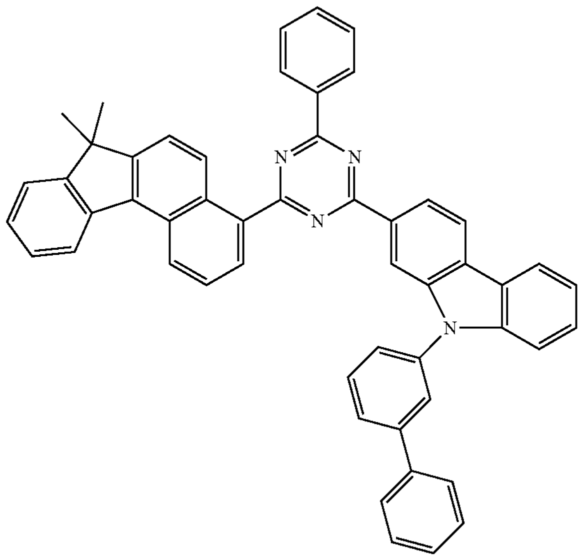
C-518
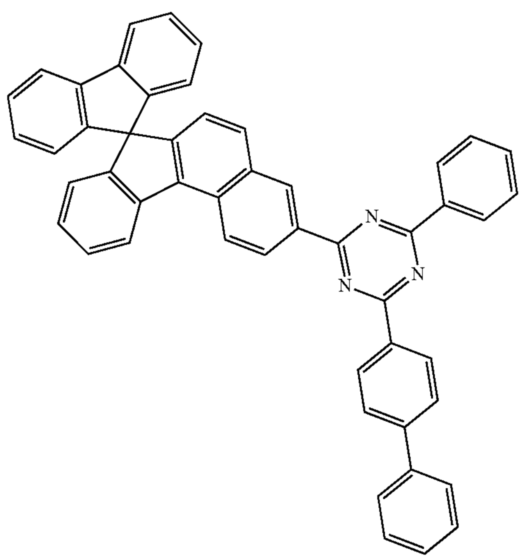
C-519
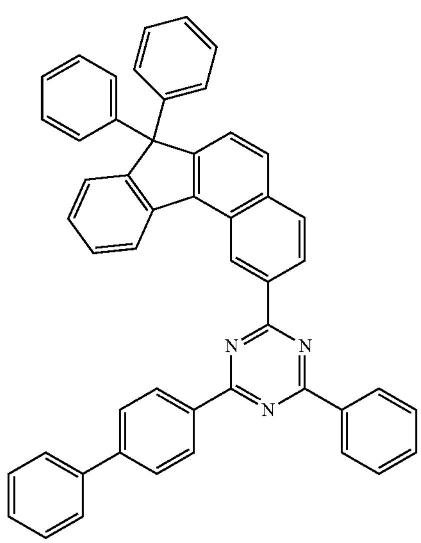
-continued
C-520
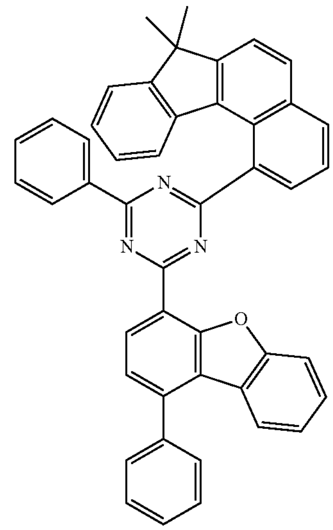
C-521
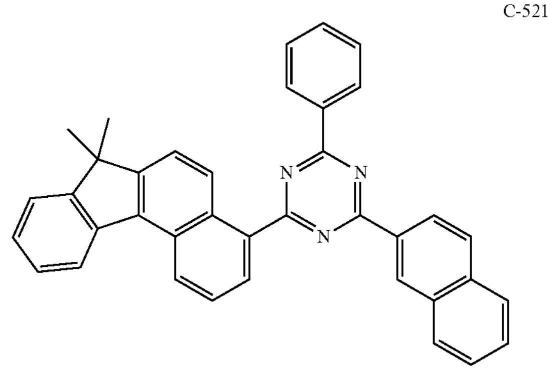
C-522
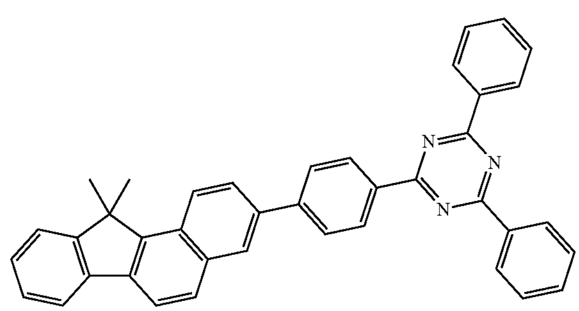

-continued
C-523
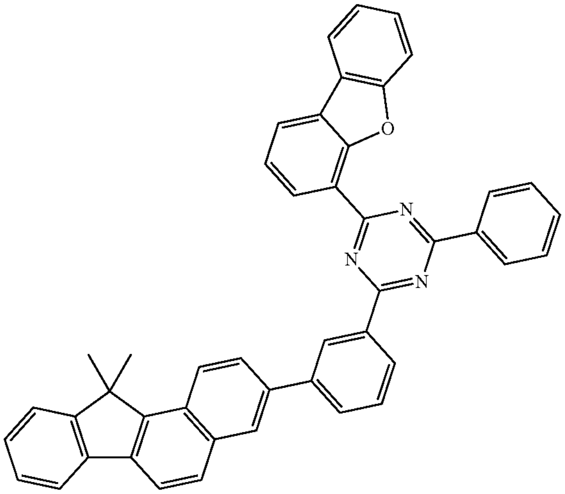
C-524
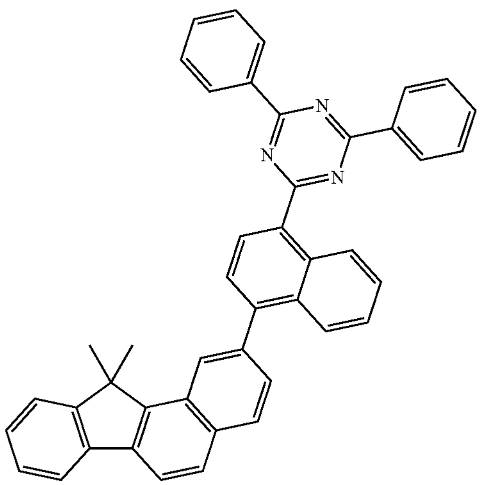
C-525
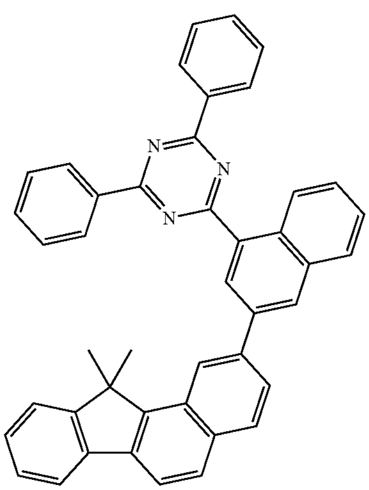
-continued
C-526
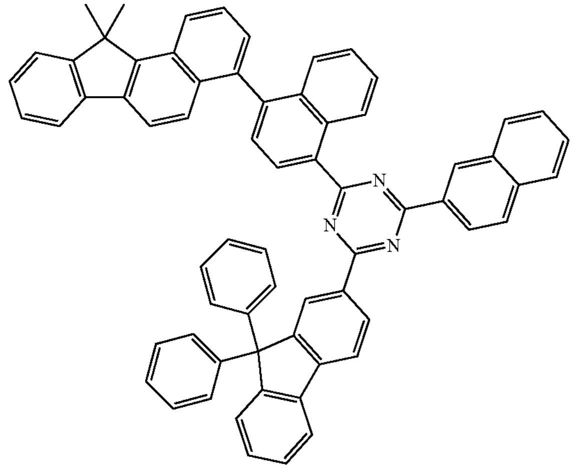
C-527
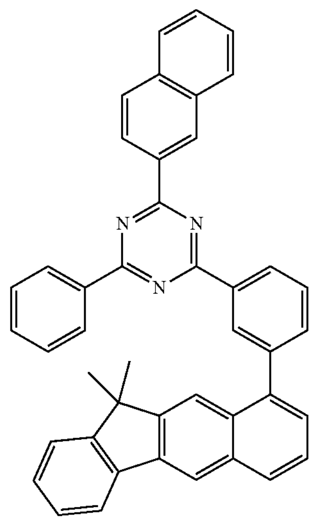
C-528
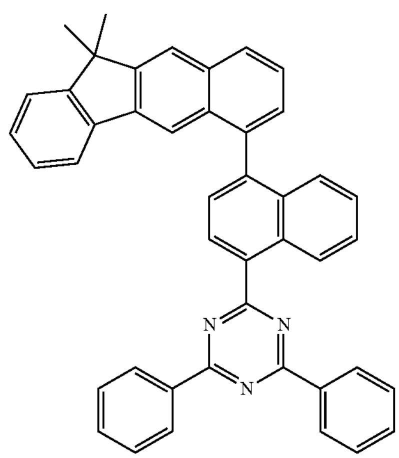

C-529
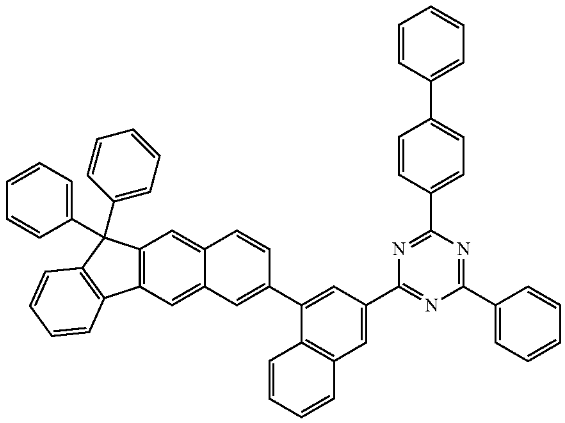
C-530
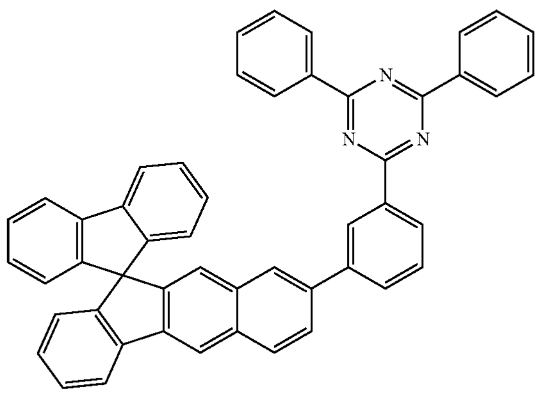
C-531
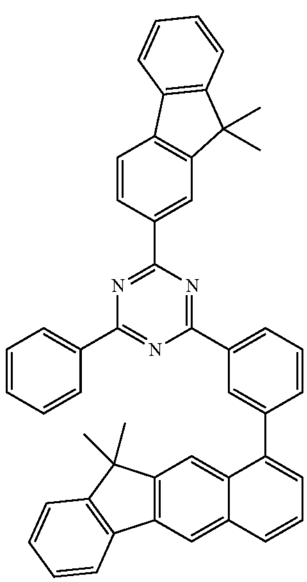
C-532
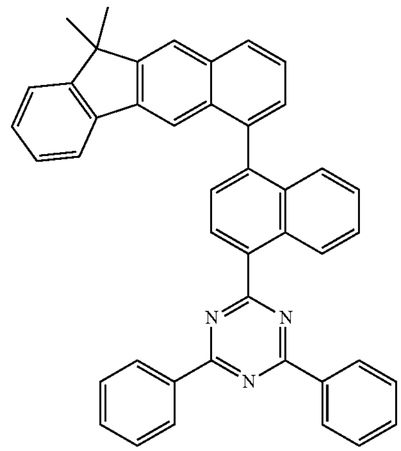
C-533
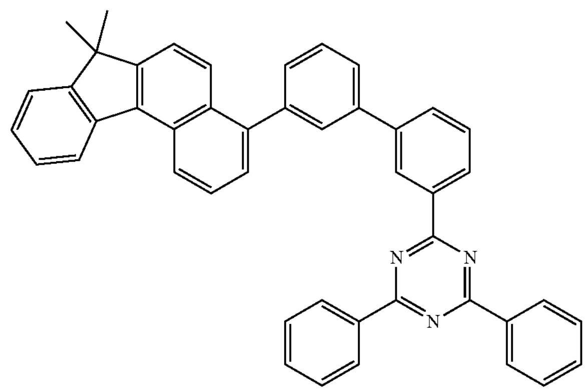
C-534
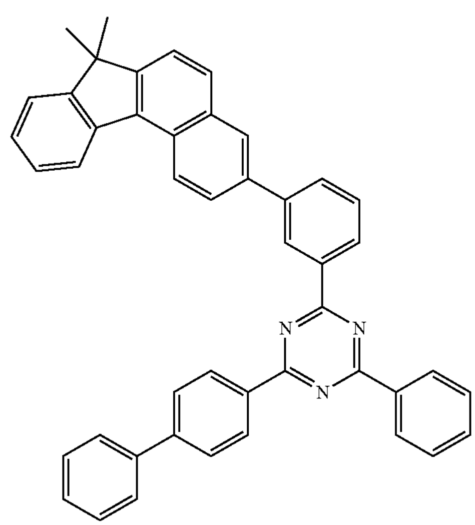

C-535
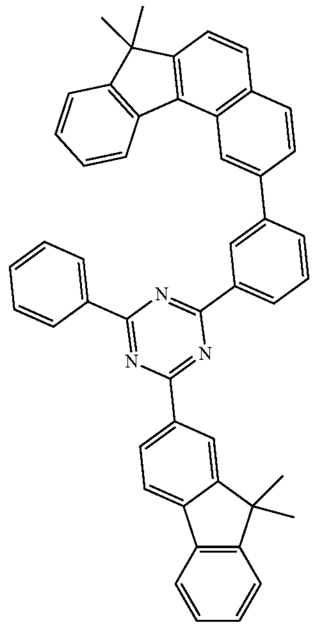
C-536
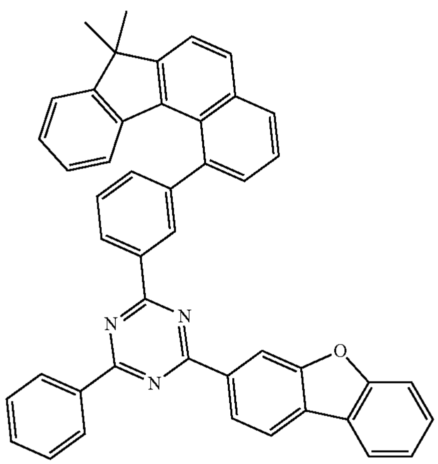
C-537
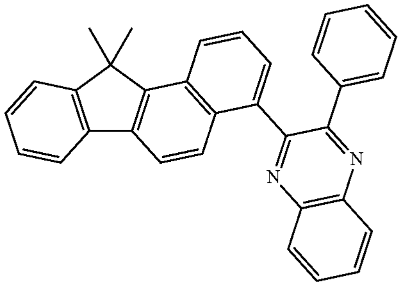
C-538
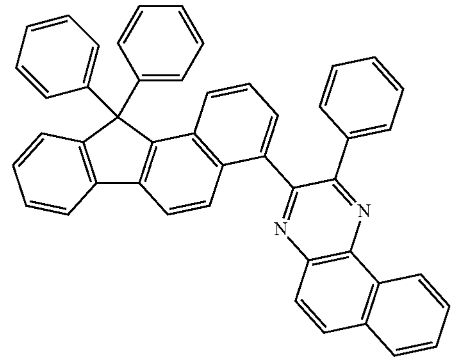
C-539
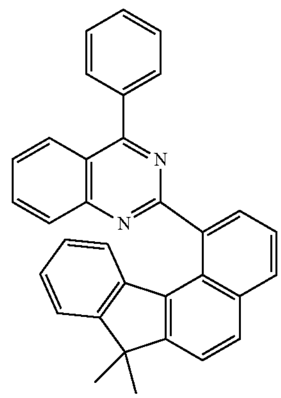
C-540
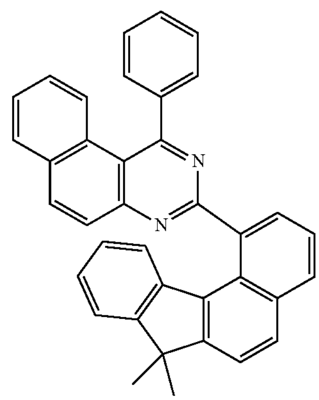
C-541
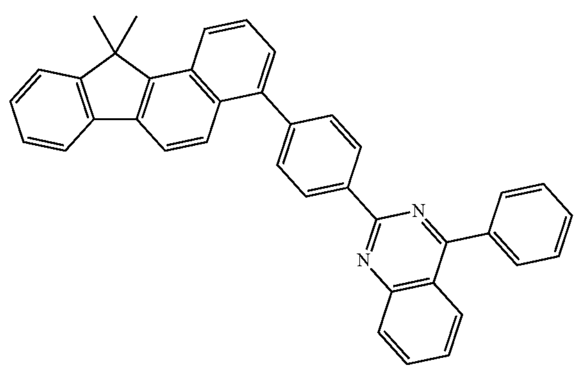

-continued
C-542
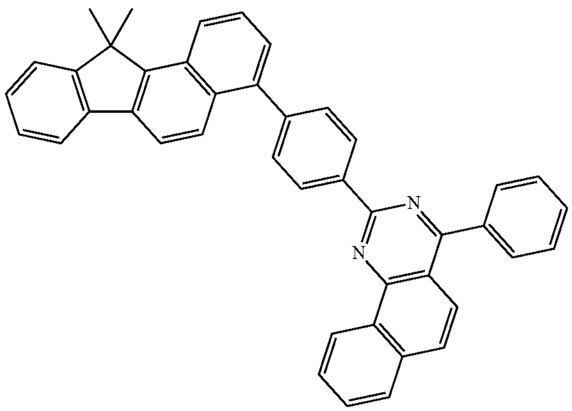
C-543
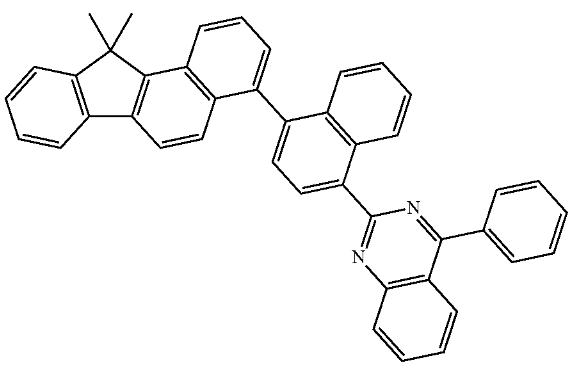
C-544
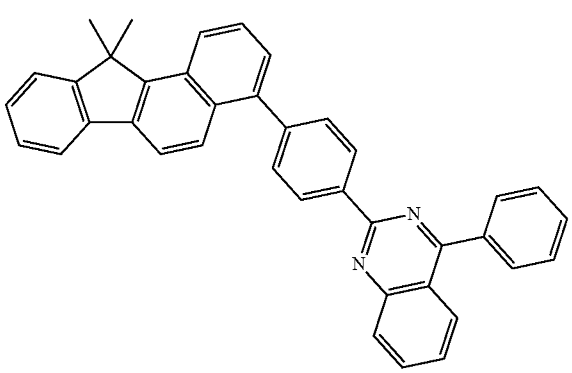
-continued
C-545
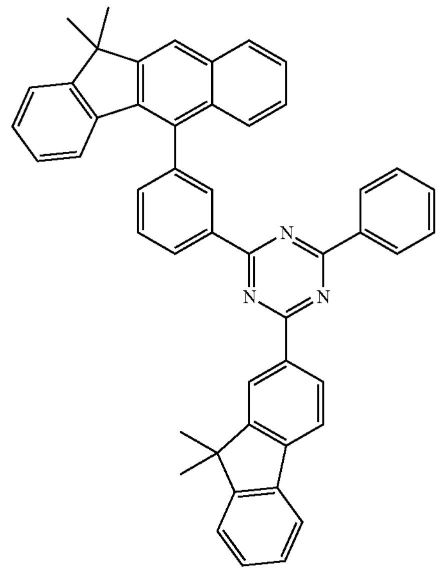
C-546
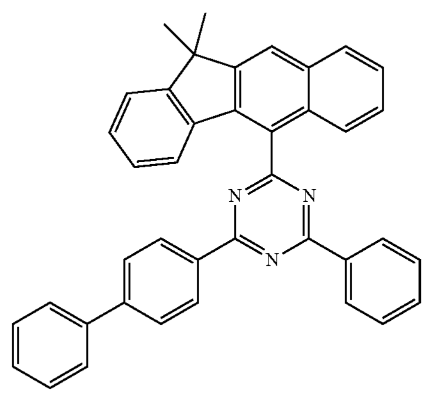
C-547
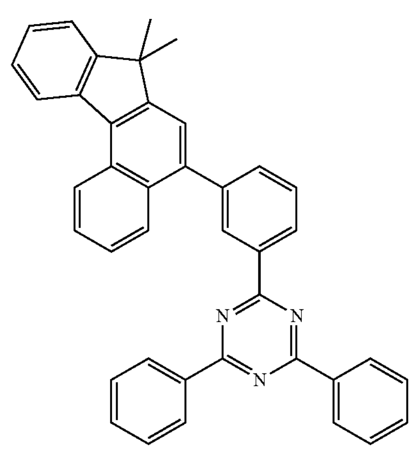

-continued
C-548
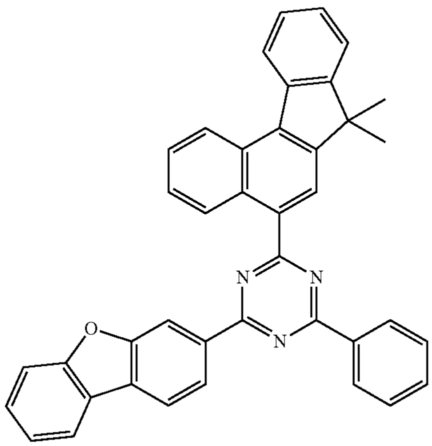
C-549
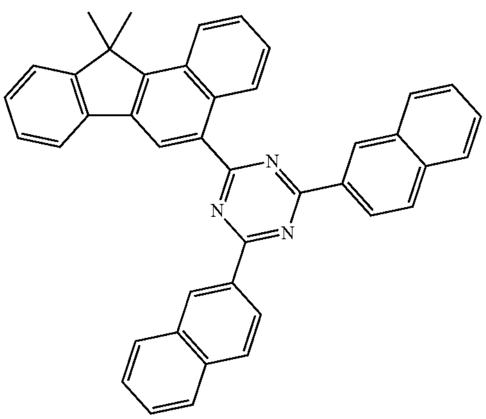
C-550
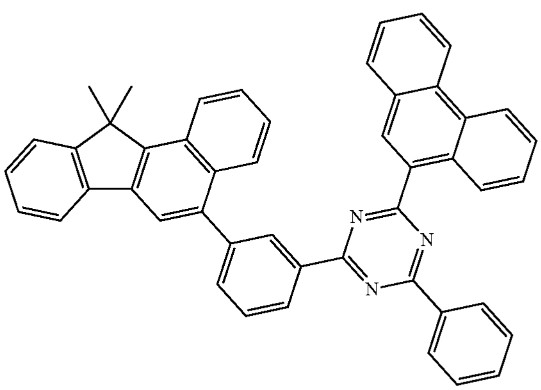
-continued
C-551
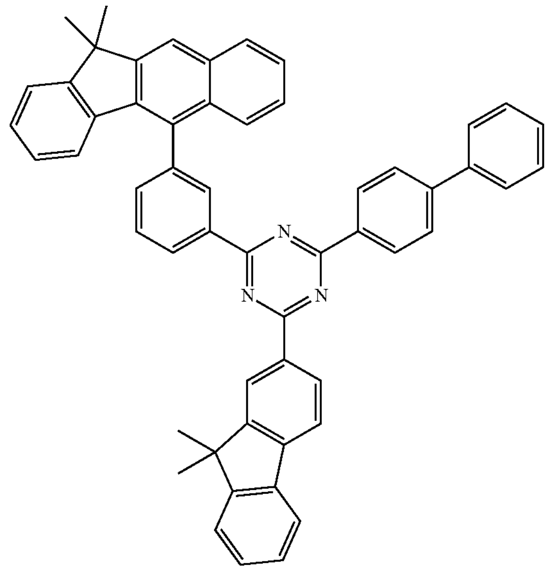
C-552
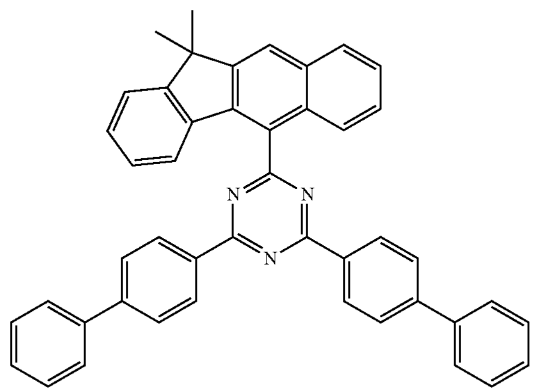
C-553
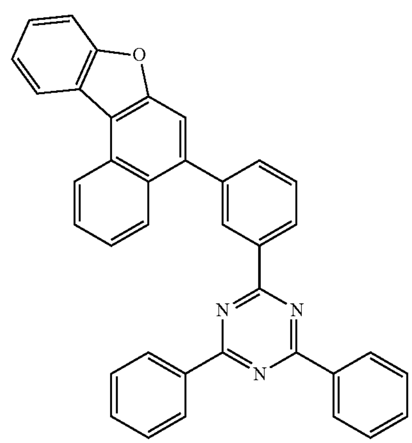

-continued
C-554
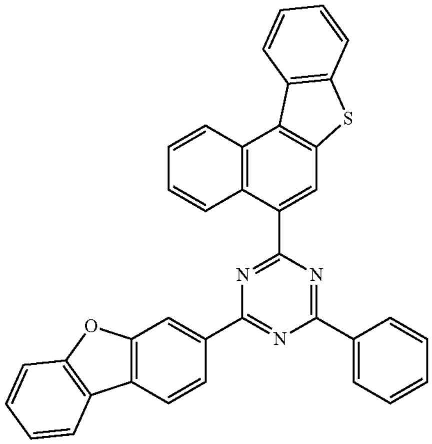
C-555
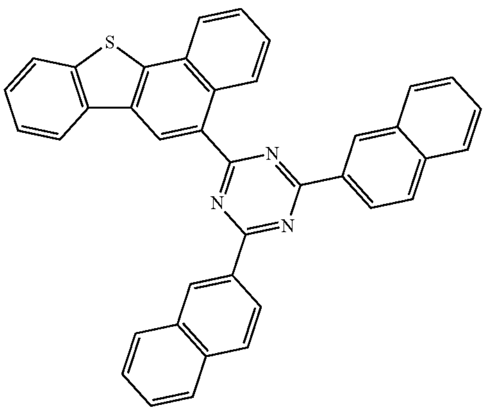
C-556
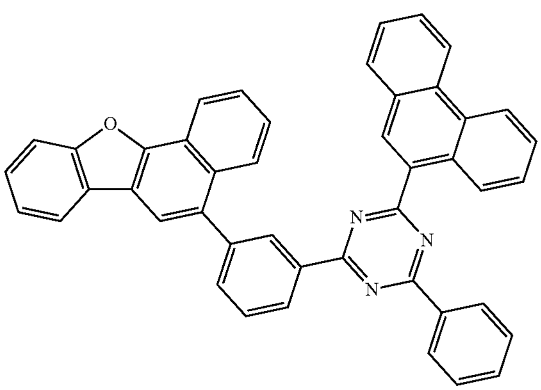
C-557
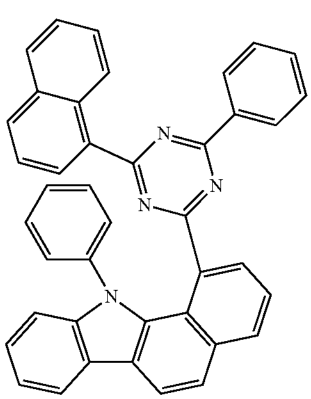
-continued
C-558
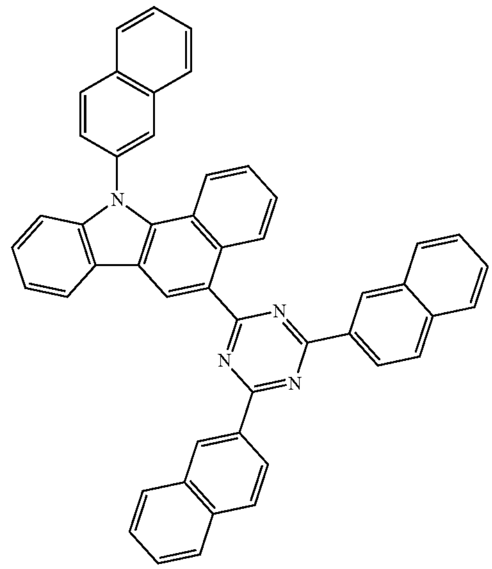
C-559
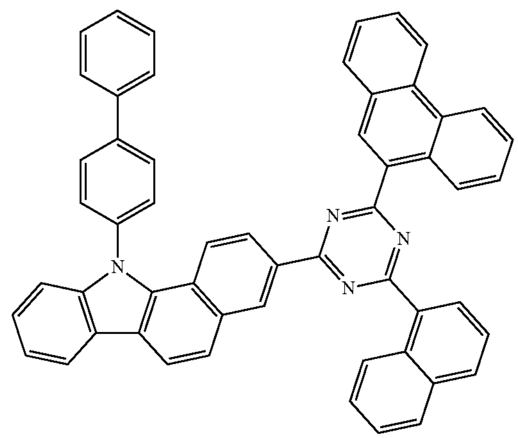
C-560
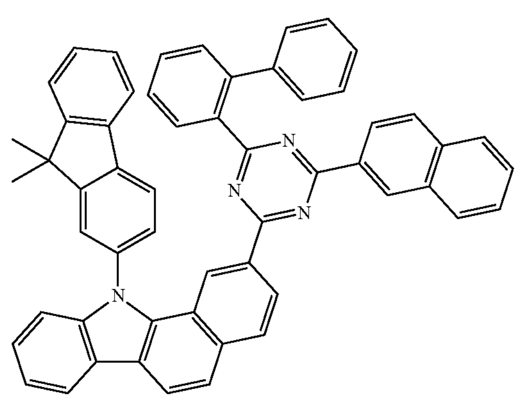

C-561
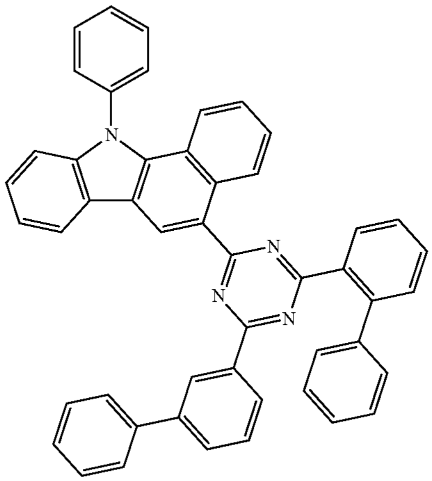
C-562
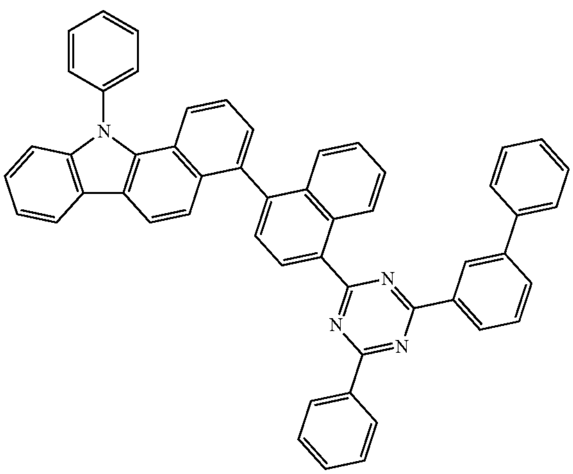
C-563
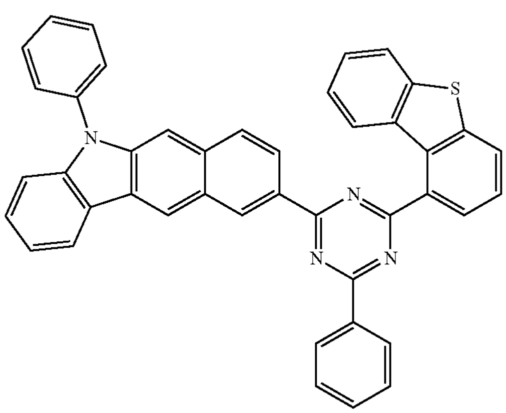
C-564
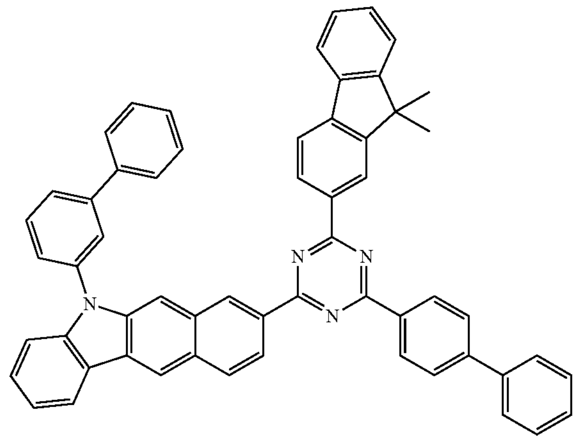
C-565
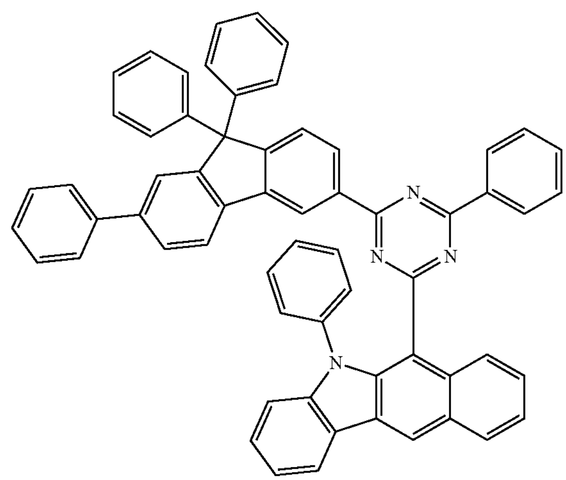
C-566
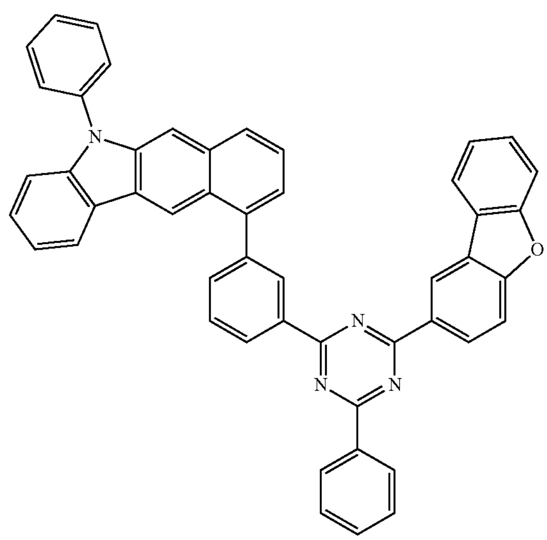

-continued
C-567
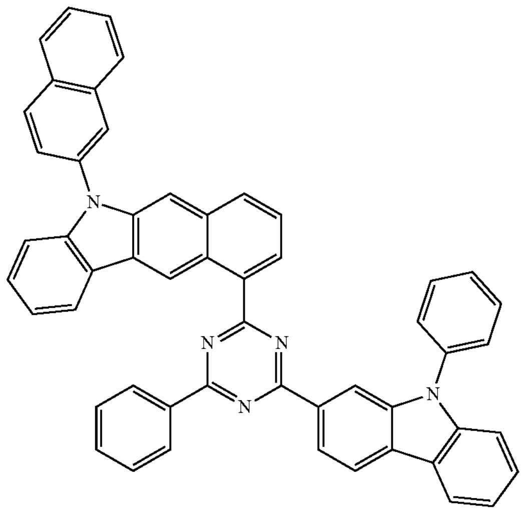
C-568
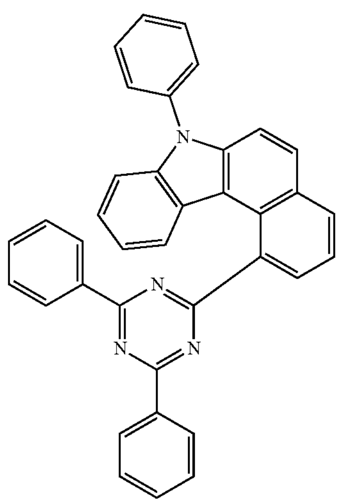
C-569
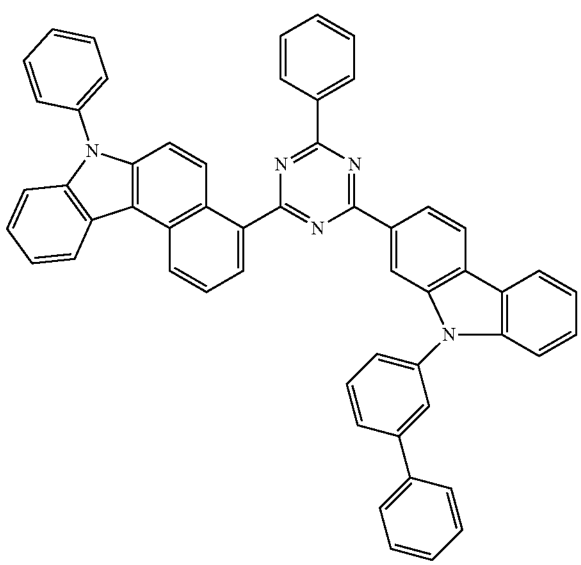
-continued
C-570
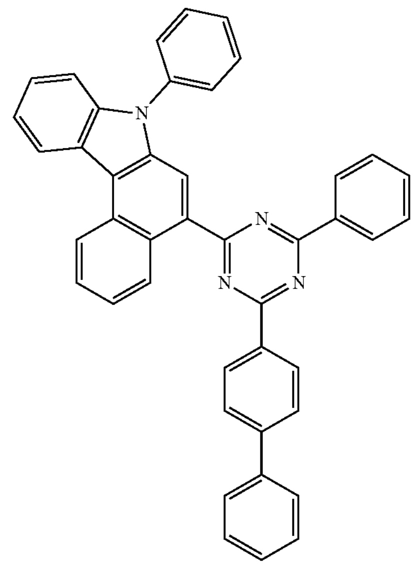
C-571
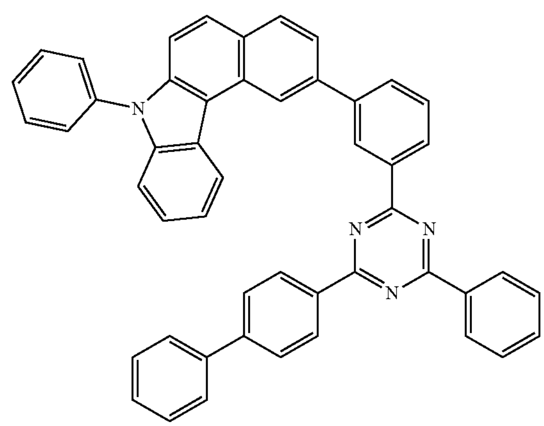
C-572
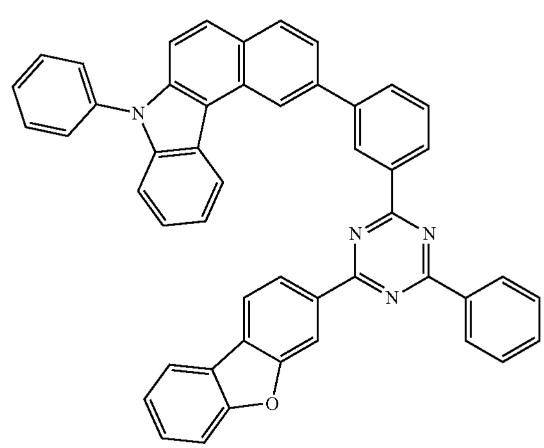

-continued
C-573
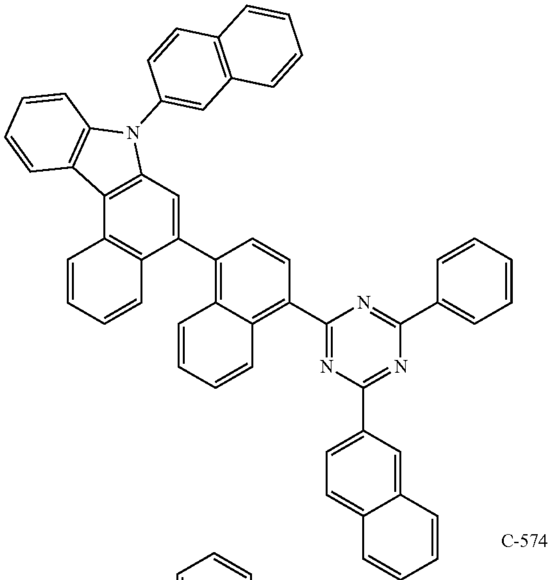
C-574
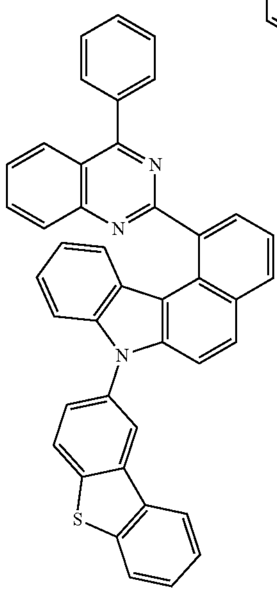
C-575
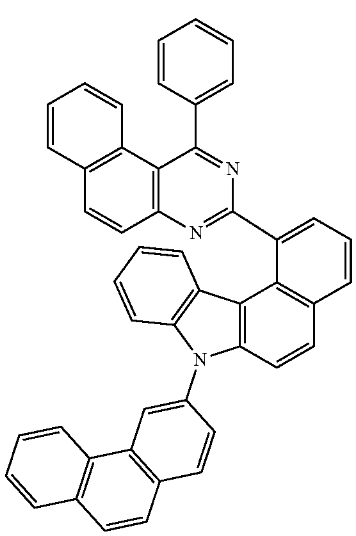
-continued
C-576
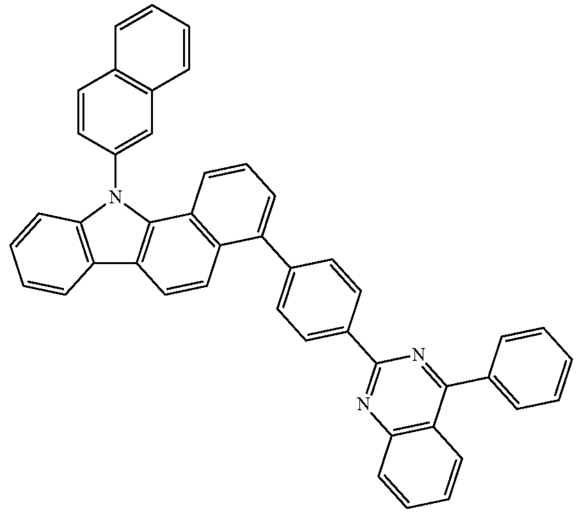
C-577
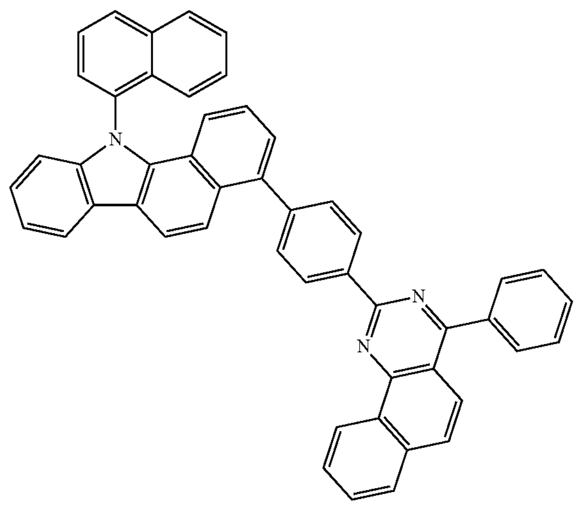
C-578
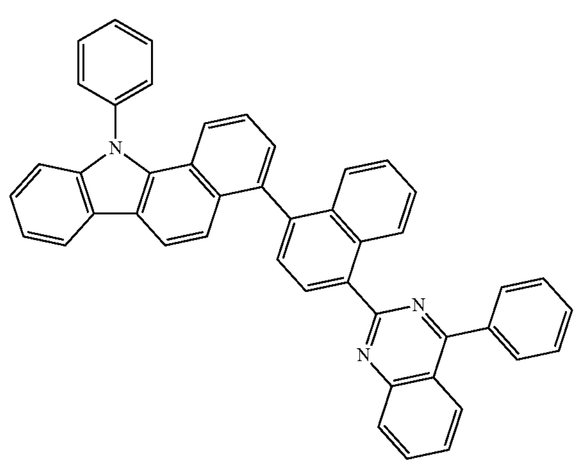

-continued
C-579
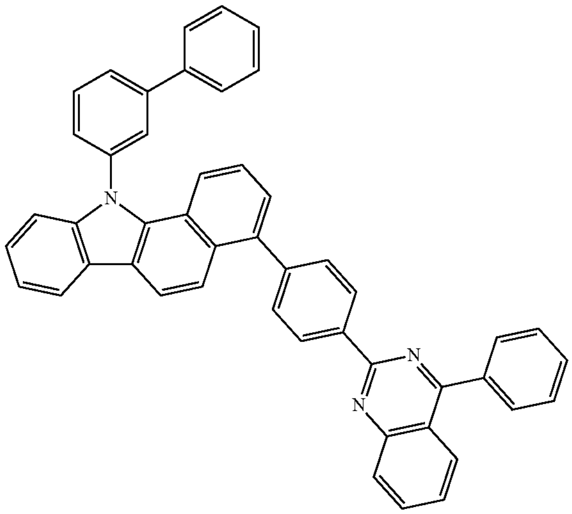
C-580
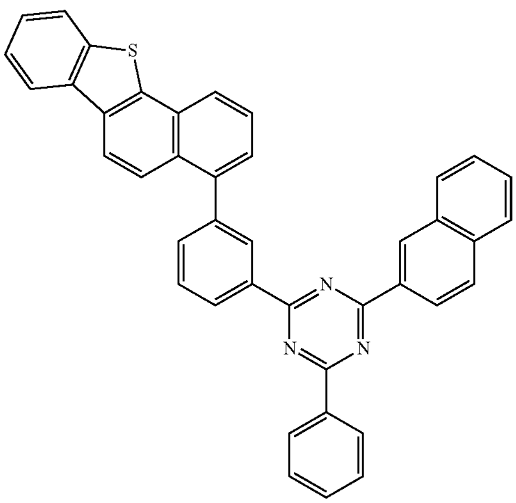
C-581
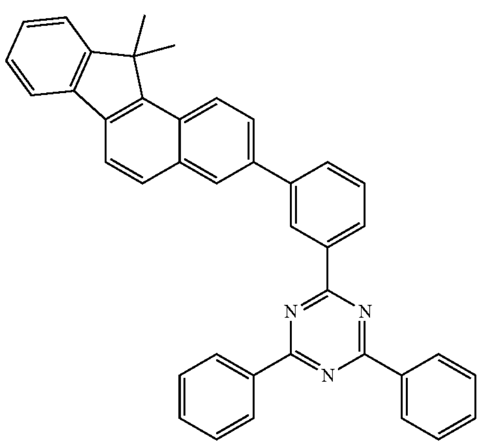
-continued
C-582
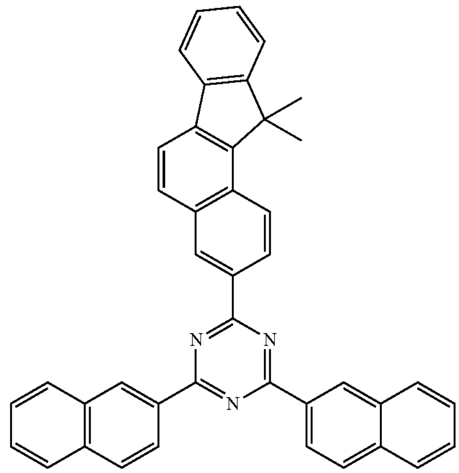
C-583
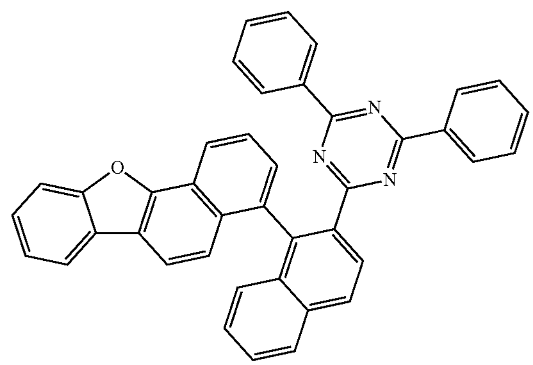
C-584
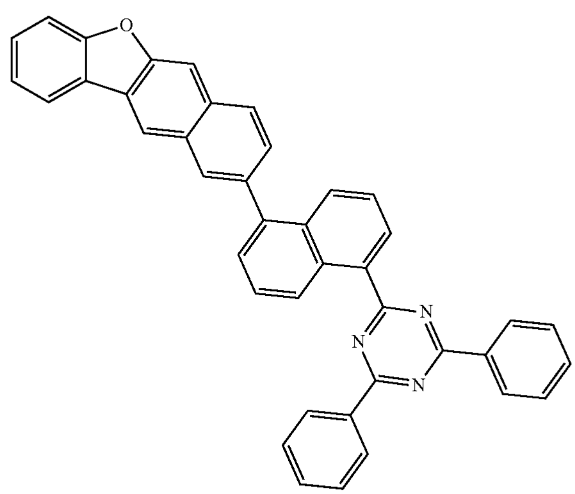

-continued
C-585
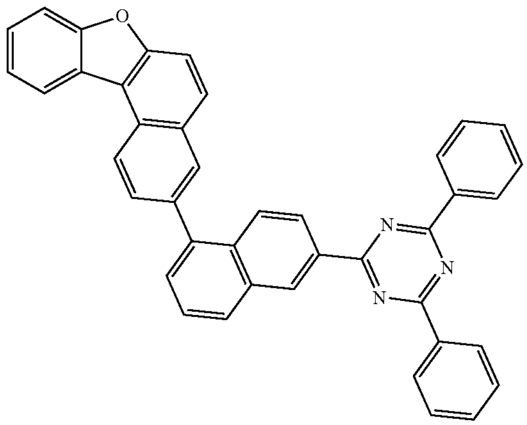
C-586
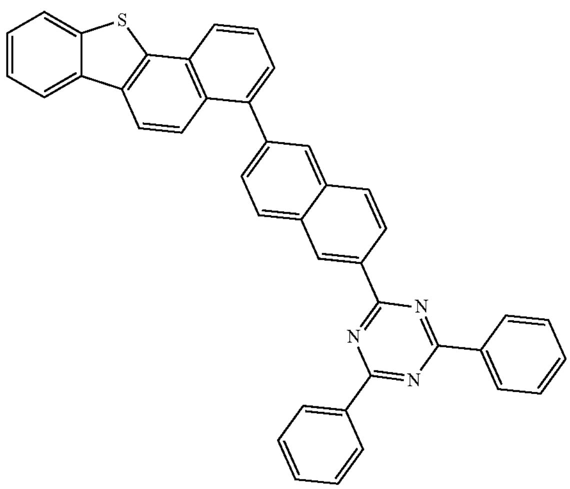
C-587
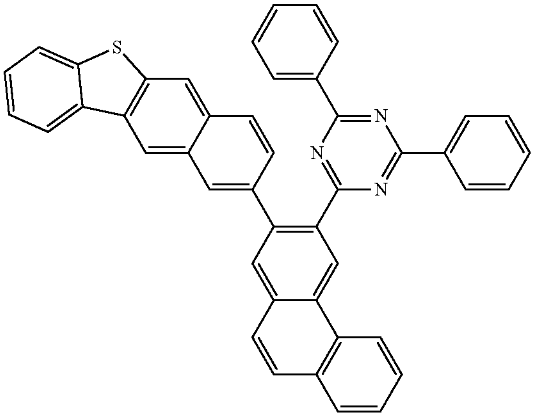
-continued
C-588
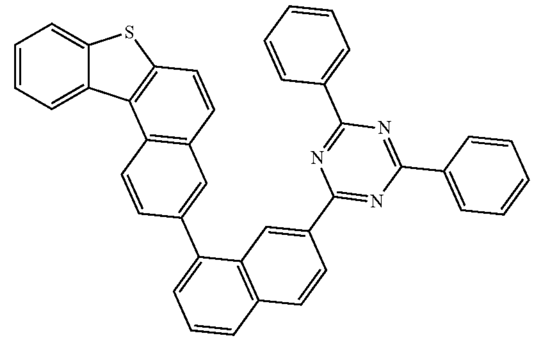
C-589
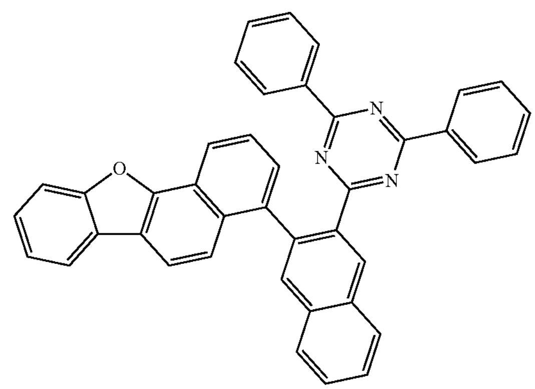
C-590
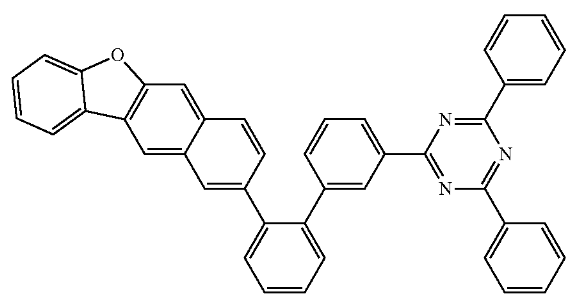

-continued
C-591
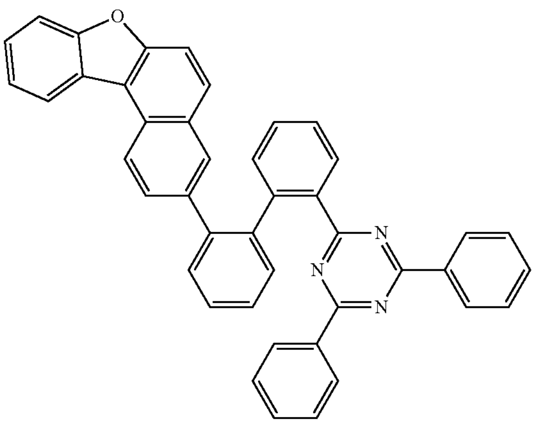
C-592
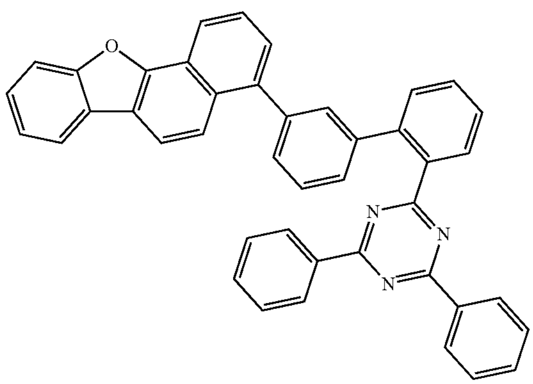
C-593
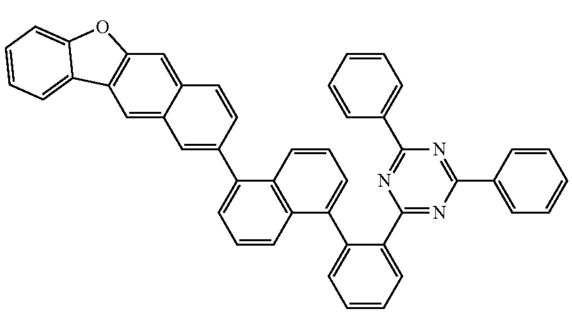
C-594
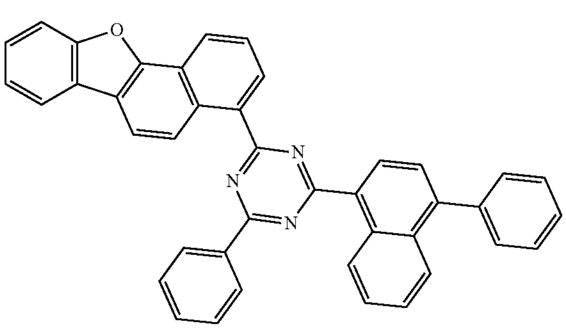
-continued
C-595
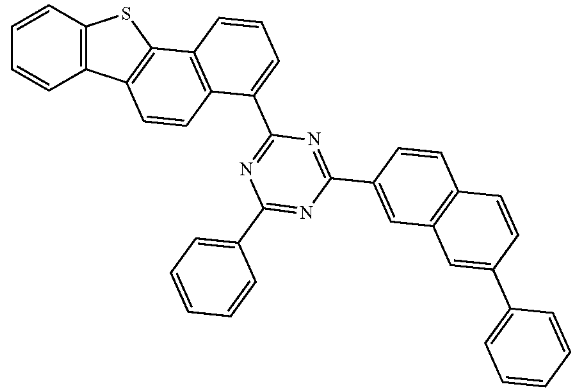
C-596
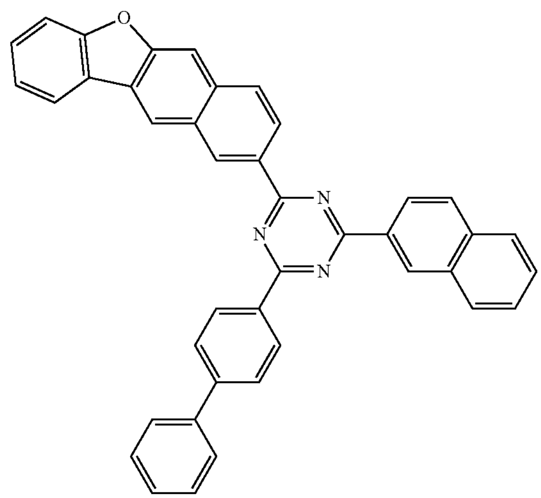
C-597
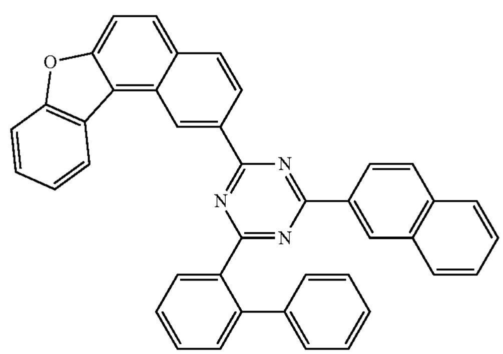
The compound represented by formula 1 according to the present disclosure may be synthesized as represented by the following reaction schemes 1 to 4, but is not limited thereto; and may be produced by a synthetic method known to a person skilled in the art.

[Reaction Scheme 1]
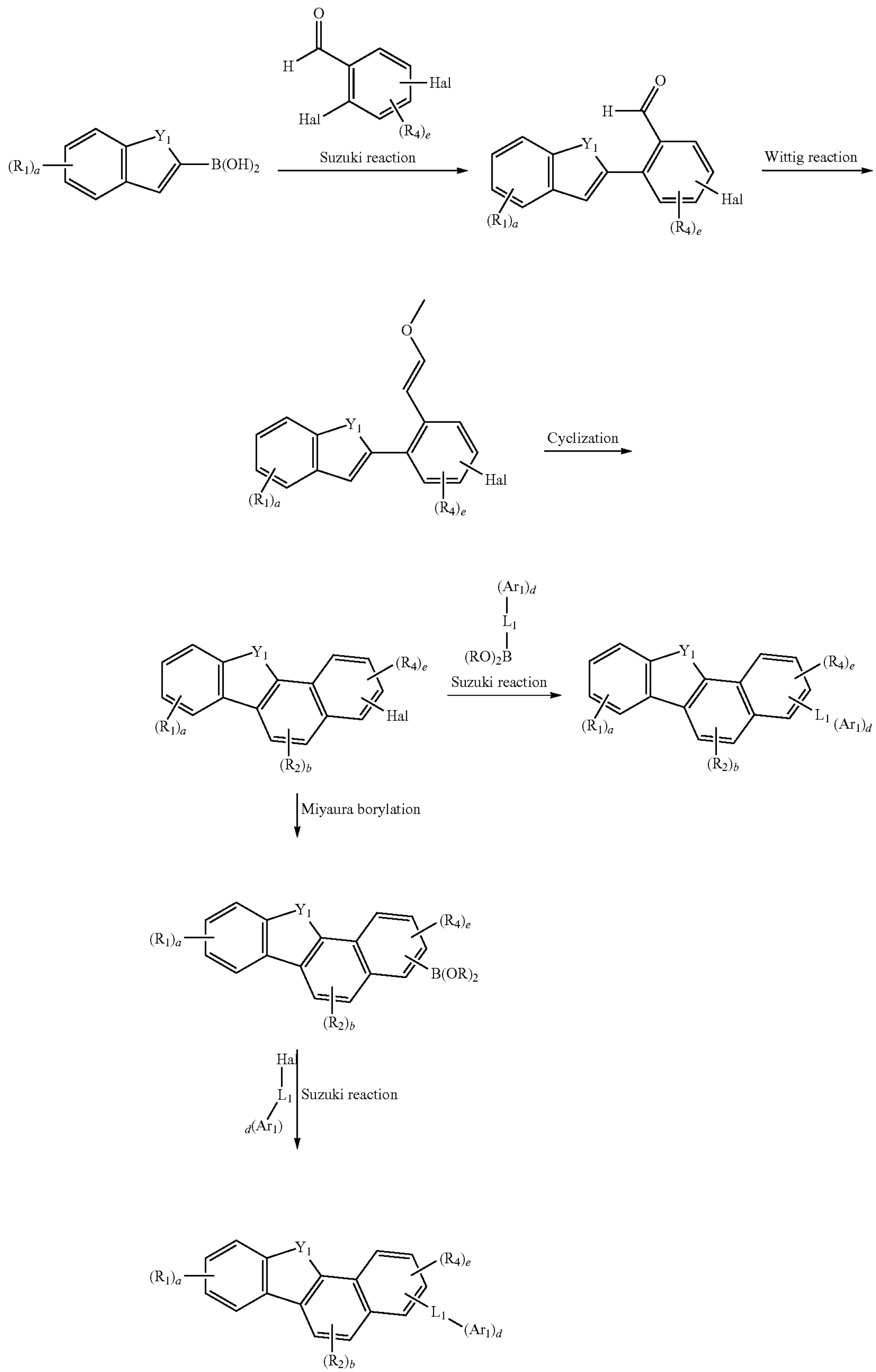

[Reaction Scheme 2]
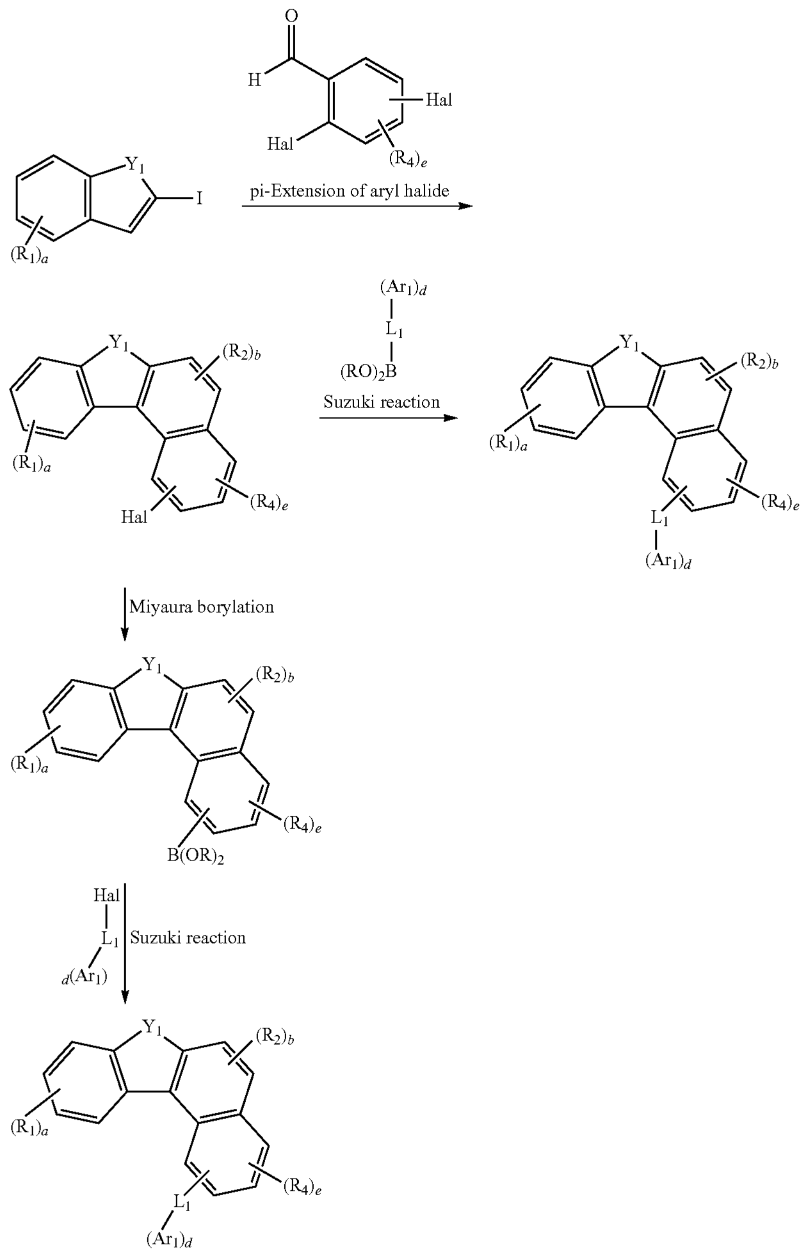
[Reaction Scheme 3]
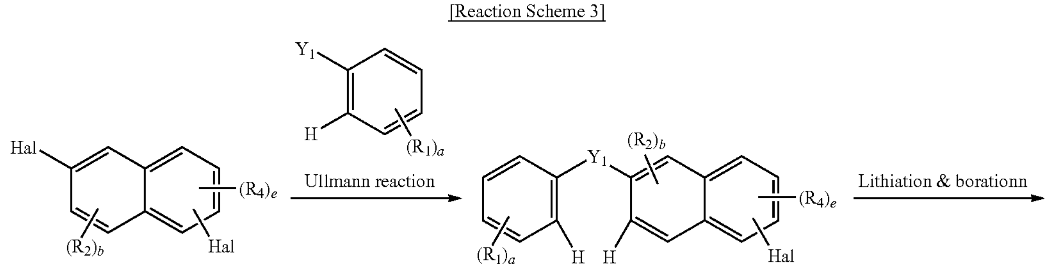

-continued
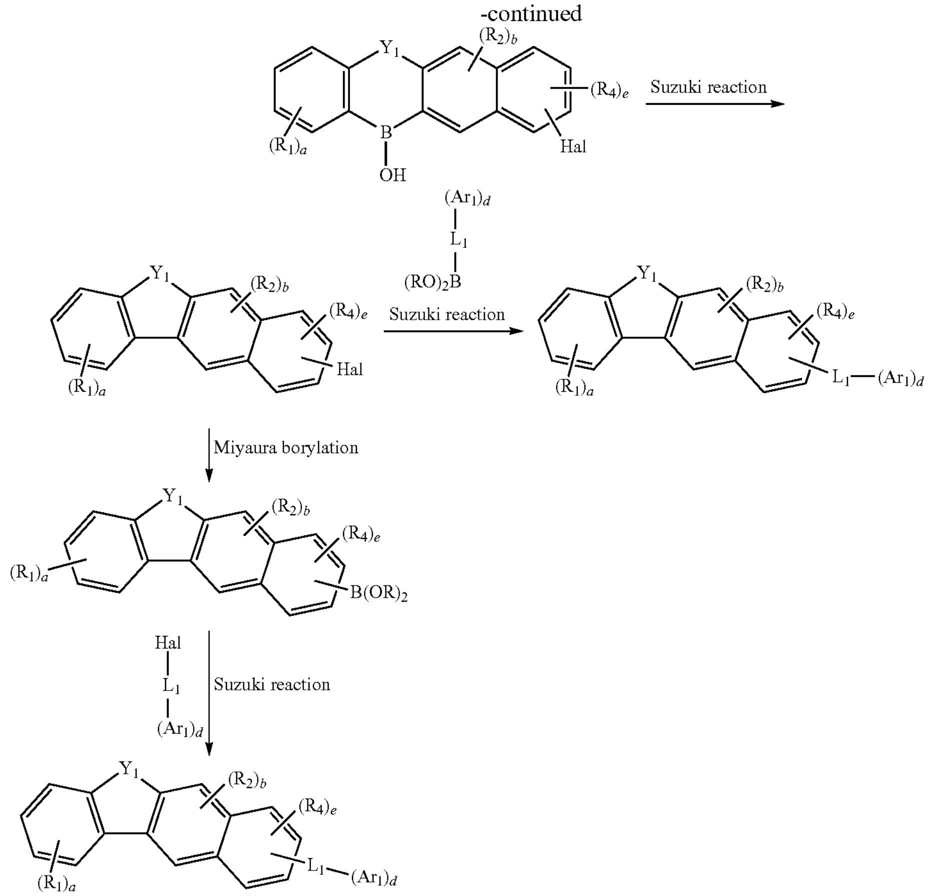
[Reaction Scheme 4]
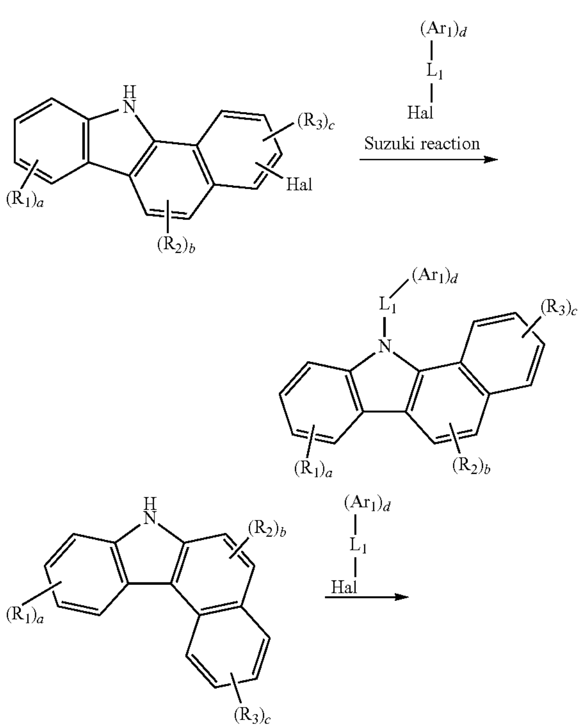
-continued
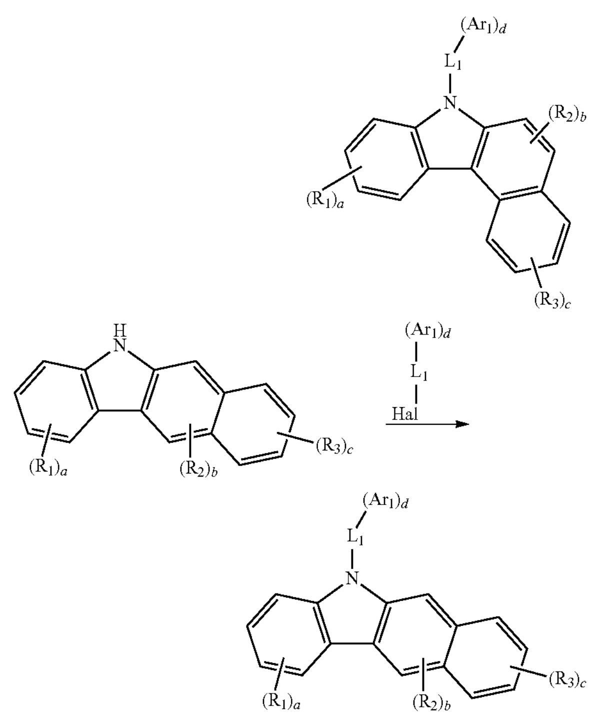

In reaction schemes 1 to 4, the definition of each substituent is as defined in formulas 1-1 to 1-9. Hal means halogen atom.

As described above, exemplary synthesis examples of the compounds represented by formula 1, specifically formulas 1-1 to 1-9 are described, but they are based on Suzuki cross-coupling reaction, Wittig reaction, Miyaura borylation reaction, Ullmann reaction, Buchwald-Hartwig cross coupling reaction, N-arylation reaction, H-mont-mediated etherification reaction, Intramolecular acid-induced cyclization reaction, Pd(II)-catalyzed oxidative cyclization reaction, Grignard reaction, Heck reaction, Cyclic Dehydration reaction, $SN_1$ substitution reaction, $SN_2$ substitution reaction, and Phosphine-mediated reductive cyclization reaction, etc. It will be understood by one skilled in the art that the above reaction proceeds even if other substituents defined in the formulas 1-1 to 1-9 other than the substituents described in the specific synthesis examples, are bonded.

The second host materials as another host material according to one embodiment may comprise a compound represented by the following formula 2.

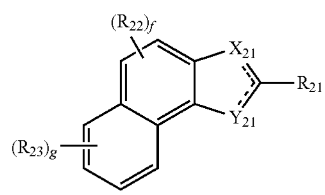

(2)

In formula 2, $X_{21}$ and $Y_{21}$ each independently represent —N═, —$NR_{24}$—, —O—, or, —S—, provided that one of $X_{21}$ and $Y_{21}$ represents —N═, and the other represents —$NR_{24}$—, —O—, or, —S—;

$R_{21}$ represents a substituted or unsubstituted (C6-C30)aryl or a substituted or unsubstituted (3- to 30-membered)heteroaryl;

$R_{22}$ to $R_{24}$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30)aliphatic ring and (C6-C30)aromatic ring, a substituted or unsubstituted mono- or di-(C1-C30)alkylamino, a substituted or unsubstituted mono- or di-(C6-C30)arylamino, a substituted or unsubstituted (C1-C30)alkyl(C6-C30)arylamino, a substituted or unsubstituted mono- or di-(3- to 30-membered)heteroarylamino, or a substituted or unsubstituted (C6-C30)aryl(3- to 30-membered)heteroarylamino; or may be linked to an adjacent substituent to form a ring;

provided that at least one of $R_{22}$ and $R_{23}$ represent(s) -$L_{21}$-$Ar_{21}$;

$L_{21}$ represents a single bond or a substituted or unsubstituted (C6-C30)arylene;

$Ar_{21}$ represents a substituted or unsubstituted (C6-C30) aryl, a substituted or unsubstituted (3- to 30-membered) heteroaryl, a substituted or unsubstituted fused ring of (C3-C30)aliphatic ring and (C6-C30)aromatic ring, a substituted or unsubstituted mono- or di-(C1-C30)alkylamino, a substituted or unsubstituted mono- or di-(C6-C30)arylamino, a substituted or unsubstituted (C1-C30)alkyl(C6-C30)arylamino, a substituted or unsubstituted mono- or di-(3- to 30-membered)heteroarylamino, or a substituted or unsubstituted (C6-C30)aryl(3- to 30-membered)heteroarylamino;

f represents an integer of 1 or 2, g represents an integer of 1 to 4; and when f and g are equal to 2 or more, each $R_{22}$ and each $R_{23}$ may be the same or different.

In one embodiment, when $X_{21}$ is —N═, $Y_{21}$ may be —O— or —S—; when $Y_{21}$ is —N═, $X_{21}$ may be —O— or —S—.

In one embodiment, $L_{21}$ may be a single bond or a substituted or unsubstituted (C6-C25)arylene, preferably, a single bond or a substituted or unsubstituted (C6-C18) arylene. For example, $L_{21}$ may be a single bond or a substituted or unsubstituted phenylene, or a substituted or unsubstituted naphthylene.

In one embodiment, $Ar_{21}$ may be a substituted or unsubstituted (C6-C30)aryl, a substituted or unsubstituted (3- to 30-membered)heteroaryl, a substituted or unsubstituted fused ring of (C3-C30) aliphatic ring and (C6-C30)aromatic ring, a substituted or unsubstituted mono- or di-(C6-C30) arylamino, a substituted or unsubstituted mono- or di-(3- to 30-membered)heteroarylamino, or a substituted or unsubstituted (C6-C30)aryl(3- to 30-membered)heteroarylamino, preferably, a substituted or unsubstituted (C6-C30)aryl, a substituted or unsubstituted (C5-C25)aliphatic ring and (C6-C25)aromatic ring, a substituted or unsubstituted mono- or di-(C6-C25)arylamino, or a substituted or unsubstituted (C6-C25)aryl(5- to 25-membered)heteroarylamino, more preferably, a substituted or unsubstituted (C6-C30)aryl, a substituted or unsubstituted (C5-C18)aliphatic ring and (C6-C18)aromatic ring, a substituted or unsubstituted di(C6-C18)arylamino, or a substituted or unsubstituted (C6-C18) aryl(5- to 18-membered)heteroarylamino, wherein, at least one carbon atom(s) of di(C6-C30)arylamino may include at least one heteroatom(s) selected from the group consisting of N, O, and S. For example, $Ar_{21}$ may be a substituted or unsubstituted phenyl, a substituted or unsubstituted naphthyl, a substituted or unsubstituted o-biphenyl, a substituted or unsubstituted m-biphenyl, a substituted or unsubstituted p-biphenyl, a substituted or unsubstituted o-terphenyl, a substituted or unsubstituted m-terphenyl, a substituted or unsubstituted p-terphenyl, a substituted or unsubstituted triphenylenyl, a substituted or unsubstituted phenanthrenyl, a substituted or unsubstituted chrysenyl, a substituted or unsubstituted fluoranthenyl, a substituted or unsubstituted fluorenyl, a substituted or unsubstituted benzofluorenyl, a substituted or unsubstituted spirobifluorenyl, a substituted or unsubstituted spiro[cyclopentane-fluorene]yl, a substituted or unsubstituted spiro[dihydroindene-fluorene]yl, a substituted or unsubstituted spiro[benzofluorene-fluorene]yl, a substituted or unsubstituted carbazolyl, a substituted or unsubstituted benzocarbazolyl, a substituted or unsubstituted dibenzocarbazolyl, a substituted or unsubstituted dibenzothiophenyl, a substituted or unsubstituted benzothiophenyl, a substituted or unsubstituted benzonaphthothiophenyl, a substituted or unsubstituted dibenzofuranyl, a substituted or unsubstituted benzofuranyl, a substituted or unsubstituted benzonaphthofuranyl, or an amino substituted with at least one of phenyl, naphthyl, naphthylphenyl, phenylnaphthyl, o-biphenyl, m-biphenyl p-biphenyl, o-terphenyl, m-terphenyl, p-terphenyl, fluorenyl, benzofluorenyl, phenanthrenyl, benzonaphthofuranyl, dibenzothiophenyl, and dibenzofuranyl, preferably, a substituted or unsubstituted phenyl, a substituted or unsubstituted naphthyl, a substituted or unsubstituted o-biphenyl, a substituted or unsubstituted m-biphenyl, a substituted or unsubstituted p-biphenyl, a substituted or unsubstituted o-terphenyl, a substituted or unsubstituted m-terphenyl, a substituted or unsubstituted p-terphenyl, a substituted or unsubstituted fluorenyl, a substituted or unsubstituted benzofluorenyl, a substituted or unsubstituted spirobifluorenyl, a substituted or unsubstituted spiro[cyclopentane-fluorene]yl, a substituted or unsubstituted spiro[dihydroindene-fluorene]yl, a substituted or unsubstituted spiro[benzofluorene-fluorene]yl, a substituted or unsubstituted phenanthrenyl, a substituted or unsubstituted chrysenyl, a substituted or unsubstituted fluoranthenyl, a substituted or unsubstituted triphenylenyl, a substituted or unsubstituted diphenylamino, a substituted or unsubstituted phenylbiphenylamino, a substituted or unsubstituted phenylterphenylamino, a substituted or unsubstituted naphthylphenylamino, a substituted or unsubstituted naphthylbiphenylamino, a substituted or unsubstituted naphthylterphenylamino, a substituted or unsubstituted naphthylphenanthrenylamino, a substituted or unsubstituted dibiphenylamino, a substituted or unsubstituted difluorenylamino, a substituted or unsubstituted biphenylfluorenylamino, or a substituted or unsubstituted biphenylbenzofluorenylamino; or amino substituted with two substituents of selected from naphthyl, p-biphenyl, m-biphenyl, o-biphenyl, terphenyl, phenanthrenyl, phenylnaphthyl, dimethylfluorenyl, dibenzofuranyl, dibenzothiophenyl, and benzonaphthofuranyl, wherein at least one of the substituent(s) of the amino may be dibenzofuranyl or dibenzothiophenyl.

In one embodiment, $R_{21}$ may be a substituted or unsubstituted (C6-C30)aryl, preferably, a substituted or unsubstituted (C6-C25)aryl, more preferably, a substituted or unsubstituted (C6-C18)aryl. For example, $R_{21}$ may be a substituted or unsubstituted phenyl or a substituted or unsubstituted p-biphenyl.

In one embodiment, $R_{22}$ to $R_{24}$ each independently may be hydrogen, deuterium, halogen, or cyano, preferably, hydrogen or deuterium. For example, $R_{22}$ to $R_{24}$ may be all hydrogen.

The compound represented by formula 2 may be represented by any one of the following formulas 2-1 to 2-5.

(2-1)

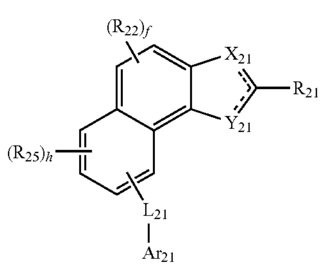

(2-2)

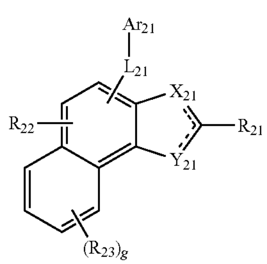

-continued (2-3)

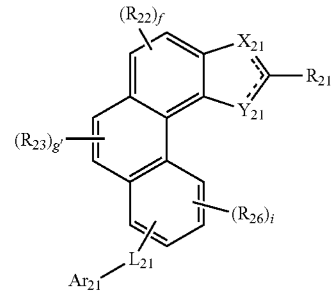

(2-4)

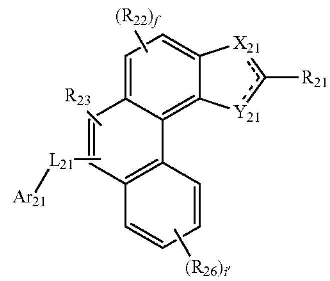

(2-5)

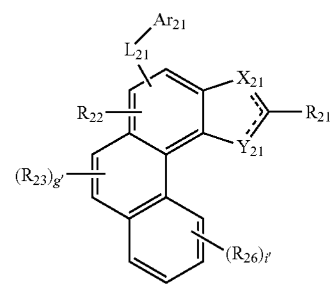

In formulas 2-1 to 2-5, $X_{21}$, $Y_{21}$, $L_{21}$, $Ar_{21}$, $R_{21}$ to $R_{23}$, f, and g are as defined in formula 2;

$R_{25}$ and $R_{26}$ each independently represent hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, a substituted or unsubstituted (C1-C30)alkyl(C6-C30)arylamino, a substituted or unsubstituted mono- or di-(3- to 30-membered)heteroarylamino, or a substituted or unsubstituted (C6-C30)aryl(3- to 30-membered)heteroarylamino; or may be linked to an adjacent substituent to form a ring;

g' represents an integer of 1 or 2, h and i each independently represent an integer of 1 to 3, and i' represents an integer of 1 to 4; and when g', h, and i are equal to 2 or more, each $R_{23}$, each $R_{25}$, and each $R_{26}$ may be the same or different.

In one embodiment, in formulas 2-1 to 2-5, one of $X_{21}$ and $Y_{21}$ may be —N═, the other of $X_{21}$ and $Y_{21}$ may be —O— or —S—; $L_{21}$ may be a single bond or a substituted or unsubstituted (C6-C30)arylene; $Ar_{21}$ may be a substituted or unsubstituted (C6-C30)aryl or a substituted or unsubstituted di(C6-C30)arylamino; $R_{21}$ may be a substituted or unsubstituted (C6-C30)aryl; and $R_{22}$ to $R_{24}$ may be all hydrogen.
According to one embodiment, the second host material may be illustrated by the following compounds, but is not limited thereto.
H-1
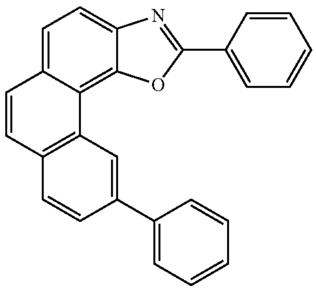
H-2
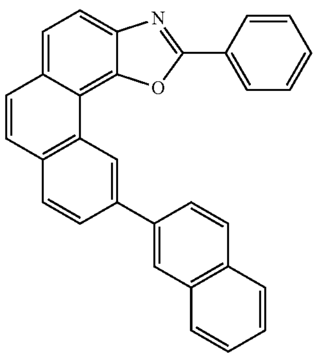
H-3
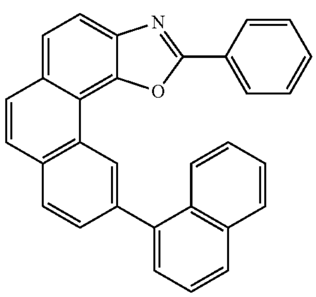
H-4
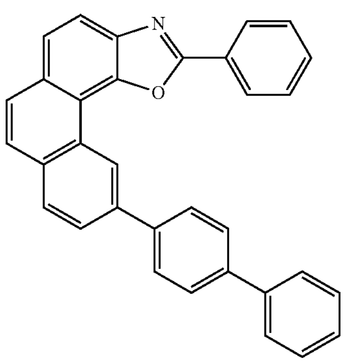
-continued
H-5
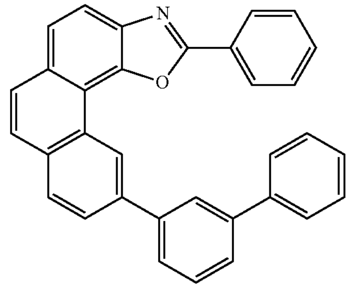
H-6
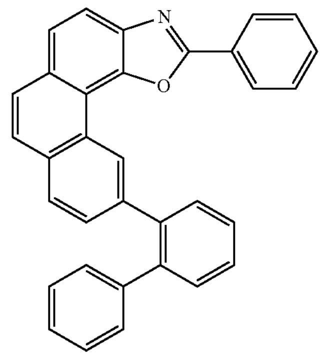
H-7
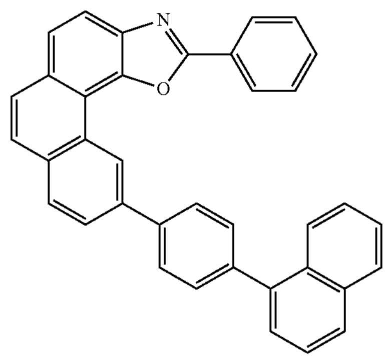
H-8
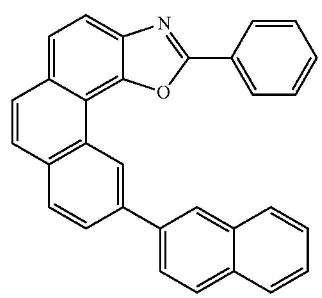
H-9
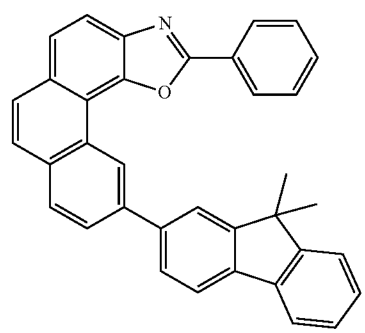

-continued
H-10
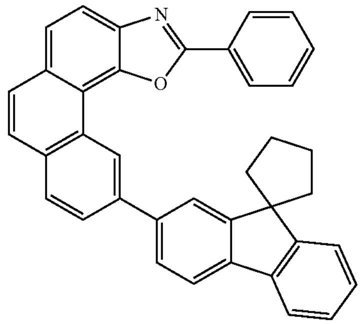
H-11
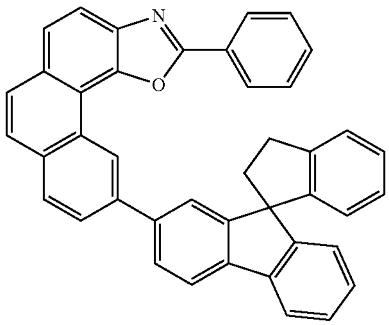
H-12
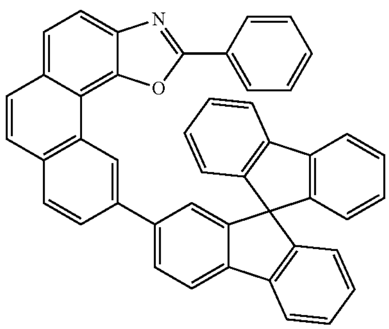
H-13
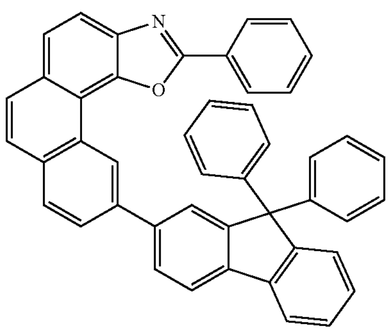
H-14
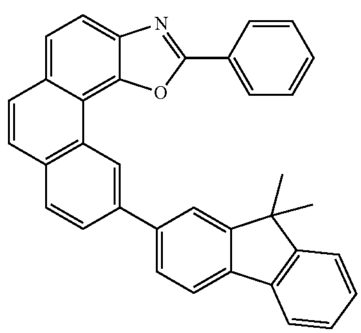
-continued
H-15
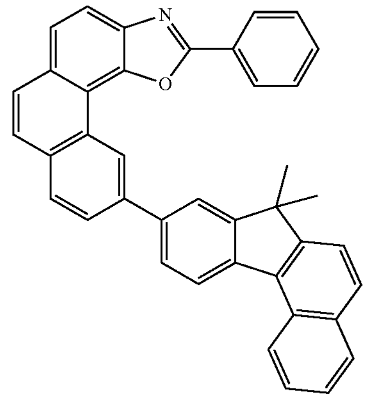
H-16
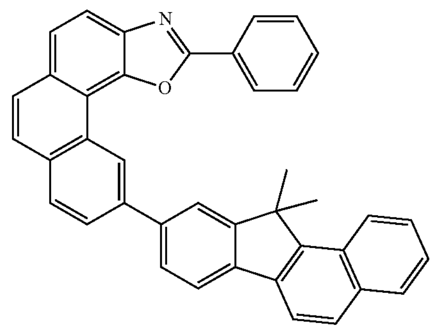
H-17
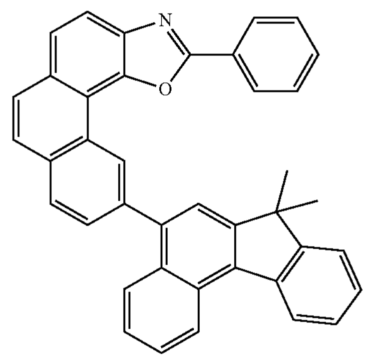
H-18
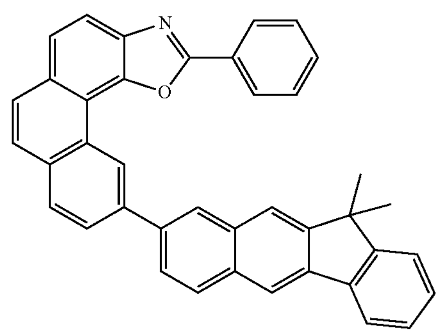

-continued
H-19
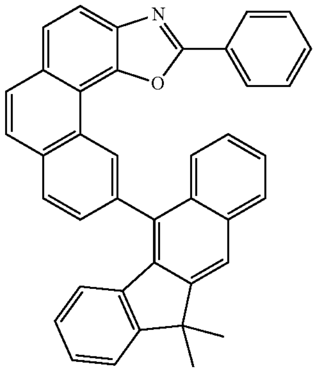
H-20
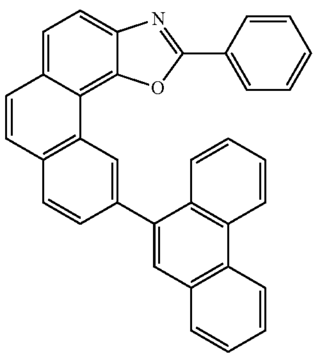
H-21
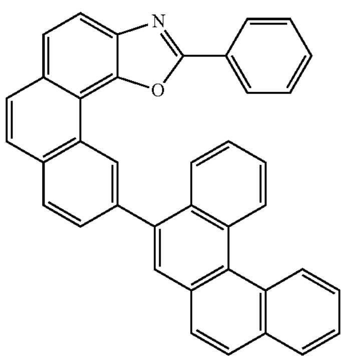
H-22
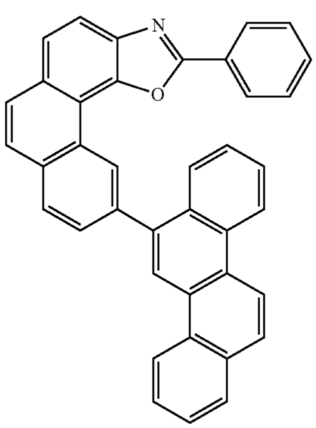
-continued
H-23
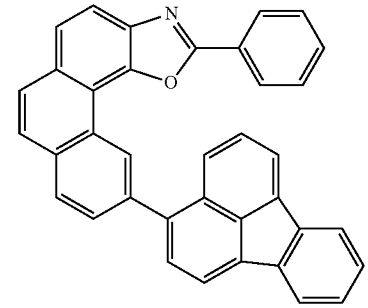
H-24
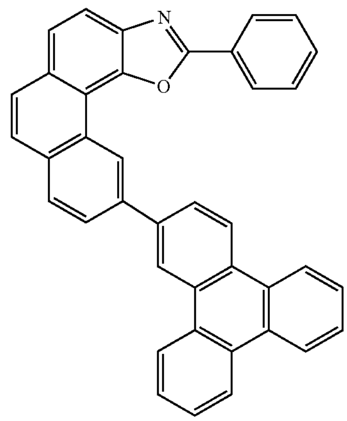
H-25
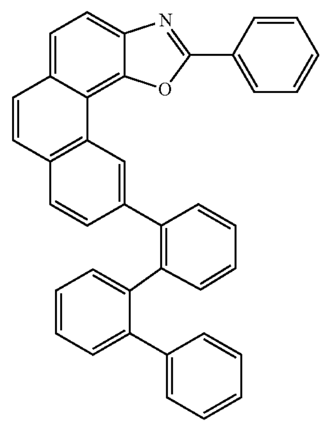
H-26
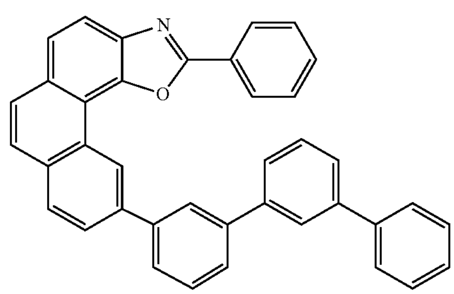

-continued
H-27
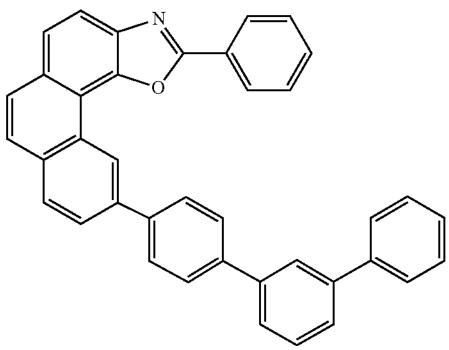
H-28
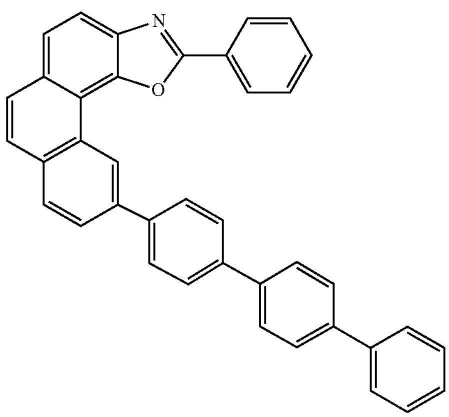
H-29
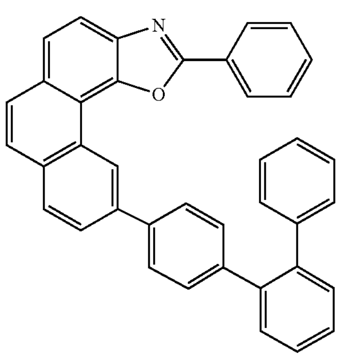
H-30
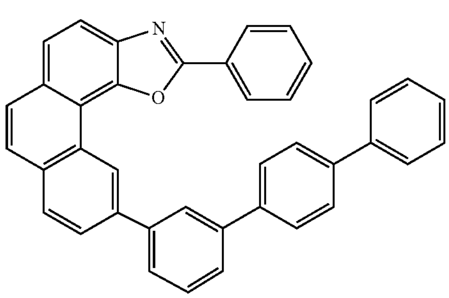
-continued
H-31
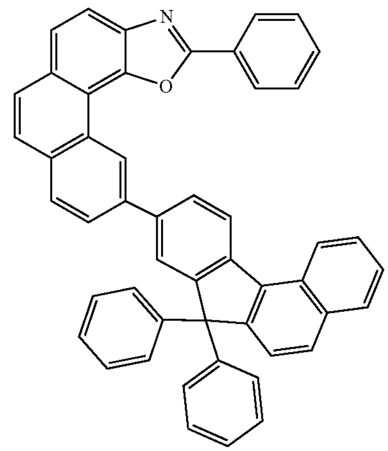
H-32
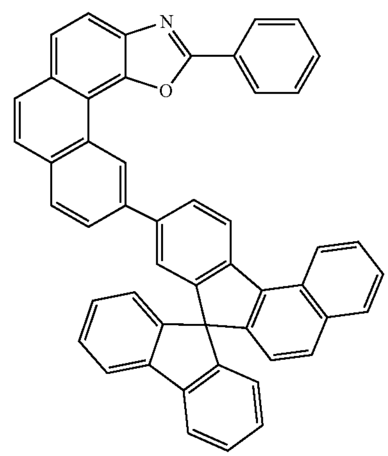
H-33
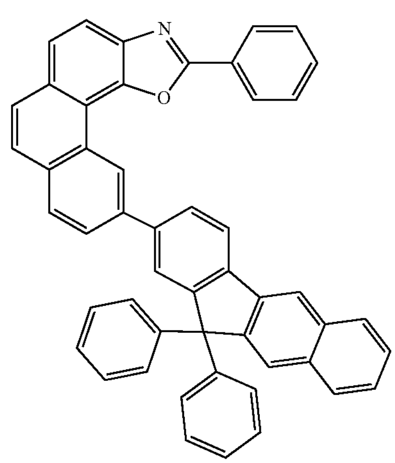

-continued
H-34
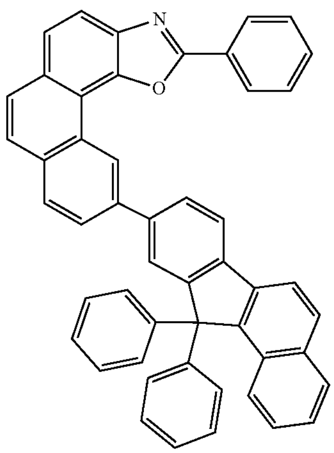
H-35
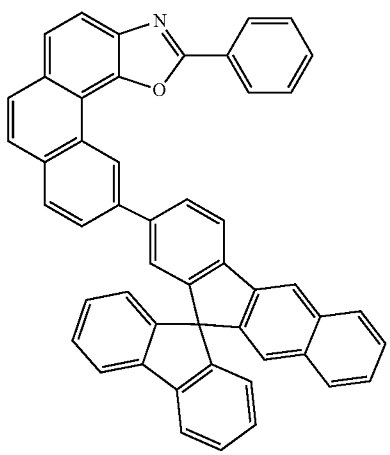
H-36
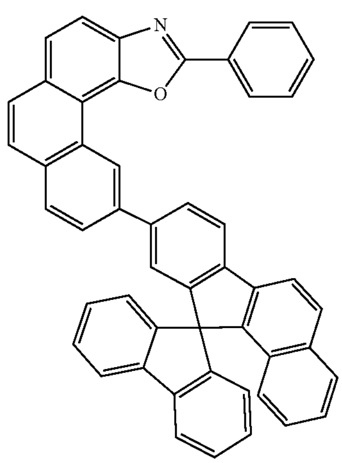
-continued
H-37
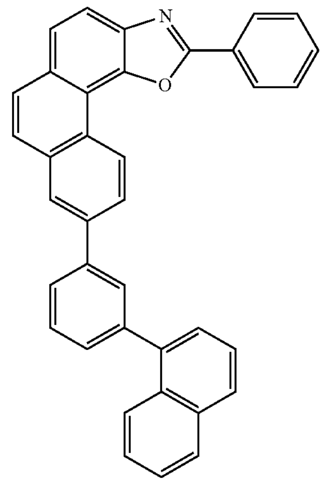
H-38
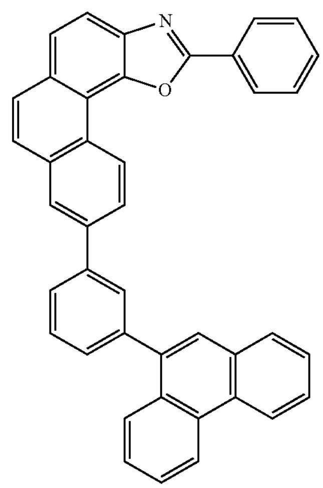
H-39
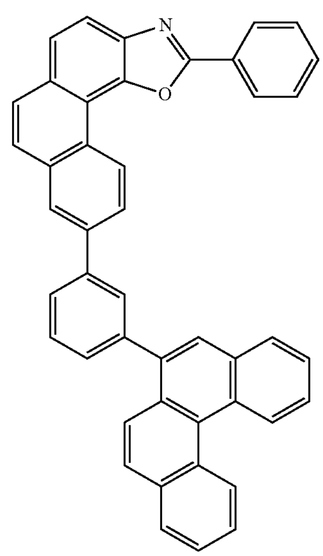

-continued
H-40
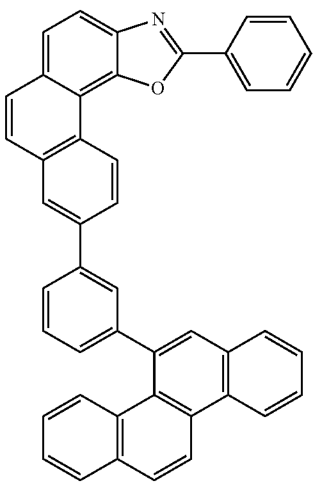
H-41
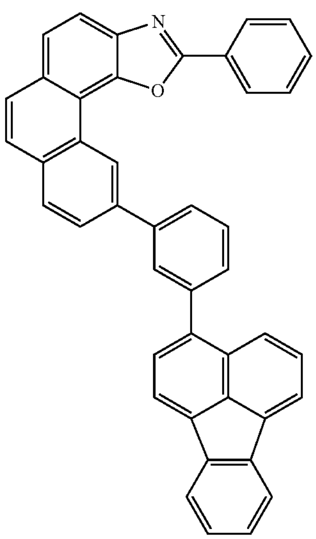
H-42
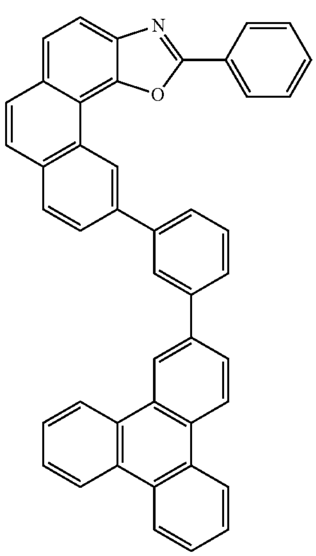
-continued
H-43
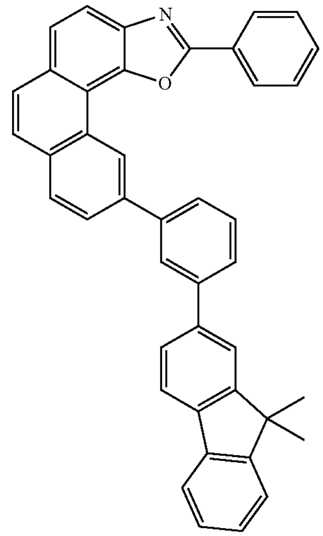
H-44
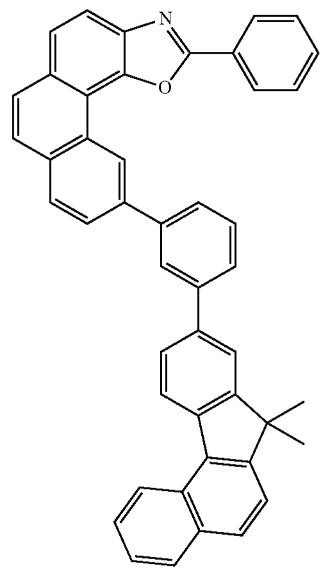
H-45
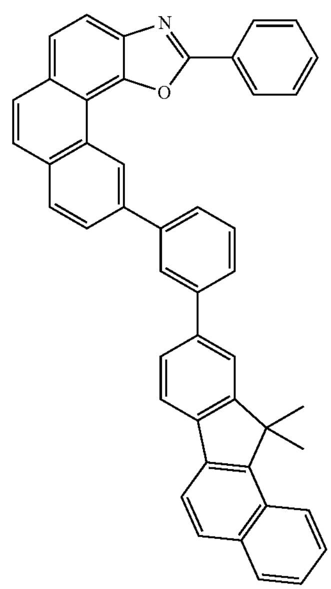

-continued
H-46
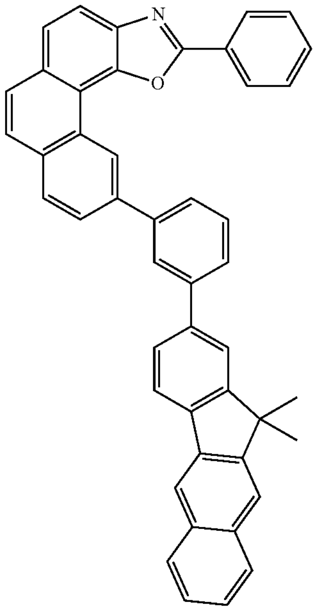
H-47
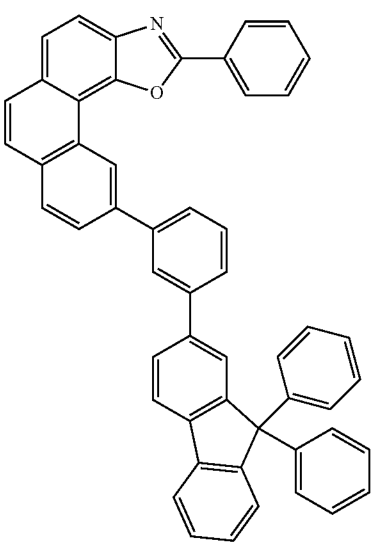
-continued
H-48
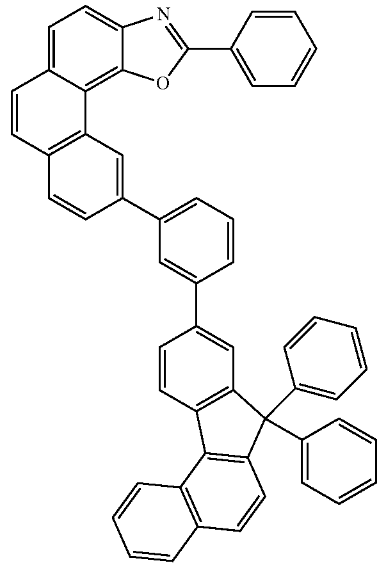
H-49
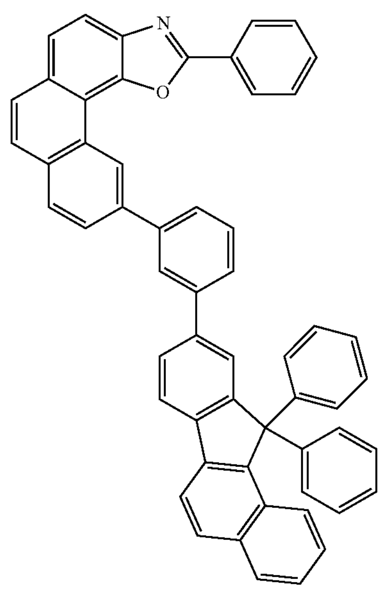

-continued
H-50
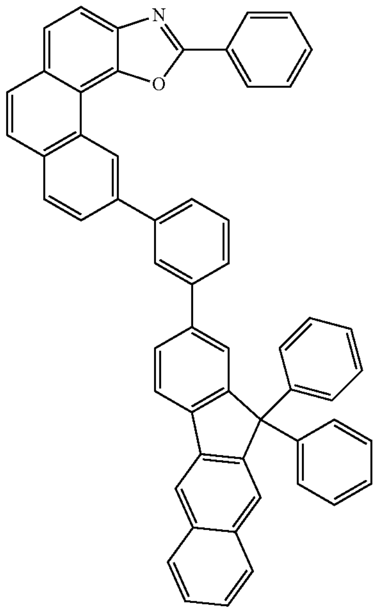
H-51
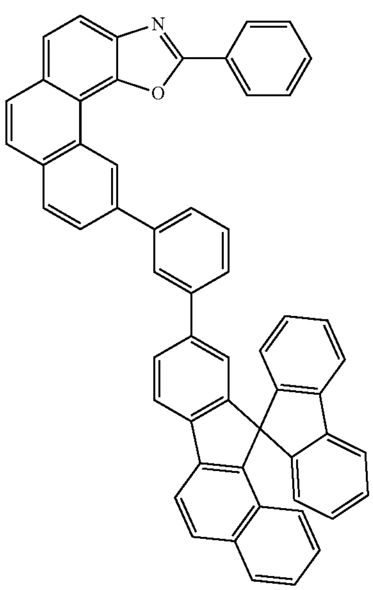
-continued
H-52
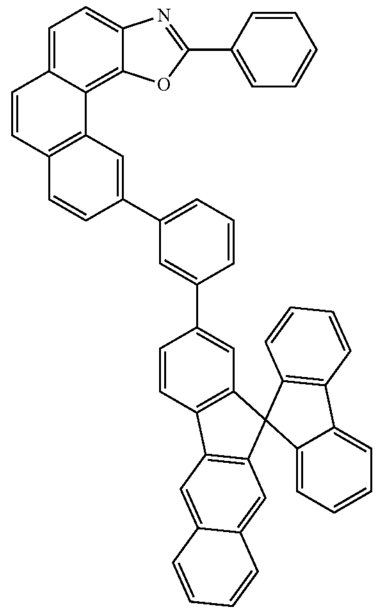
H-53
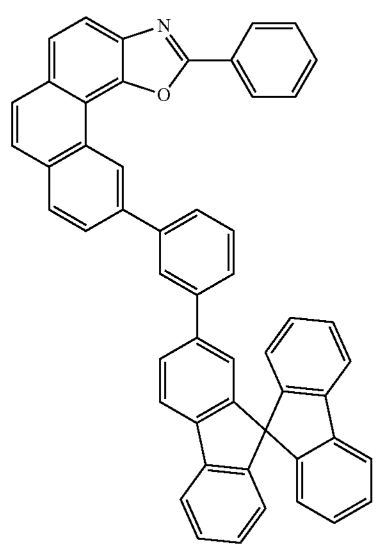

H-54
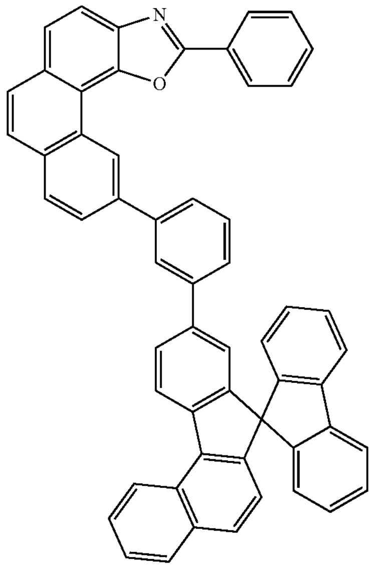
H-55
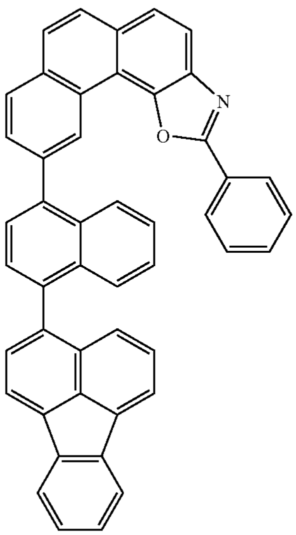
H-56
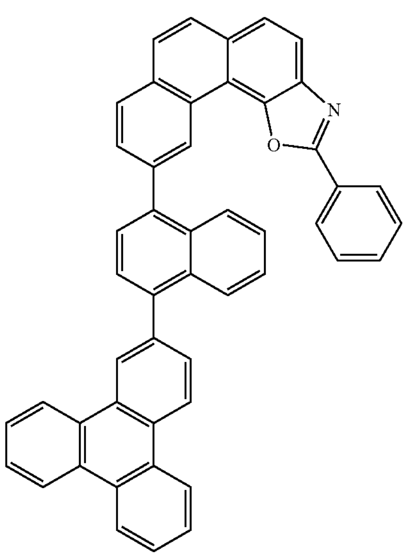
H-57
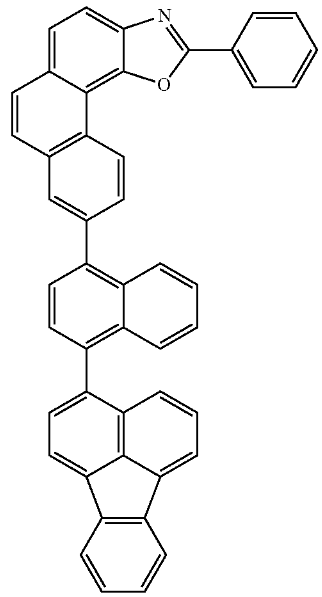
H-58
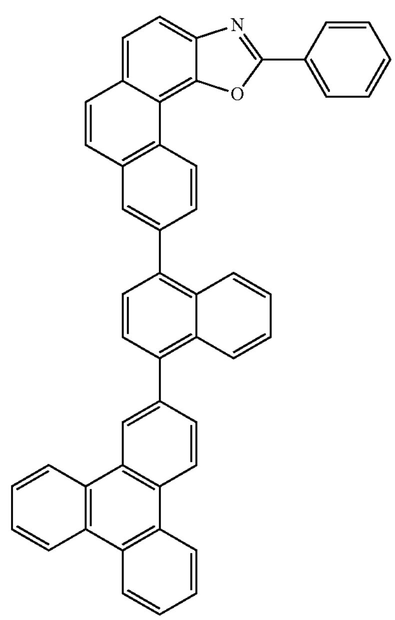

H-59
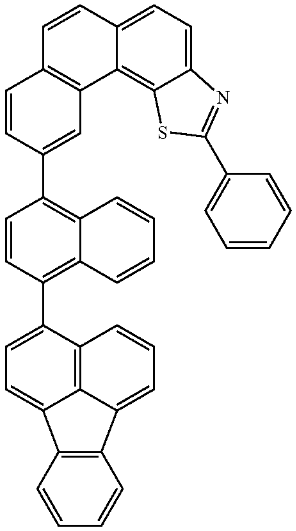
H-60
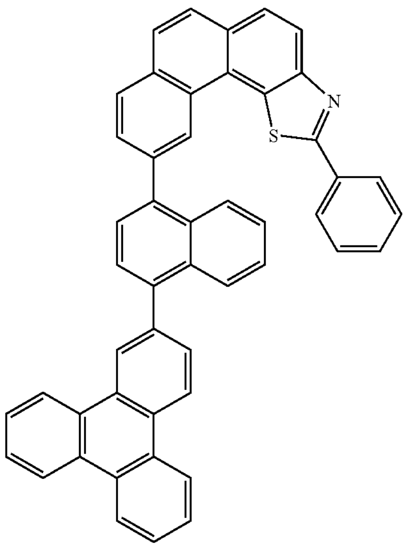
H-61
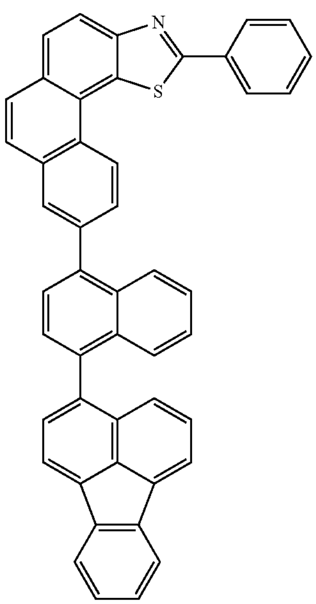
H-62
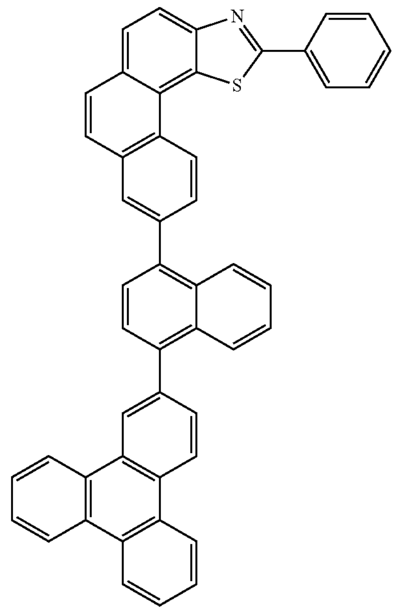
H-63
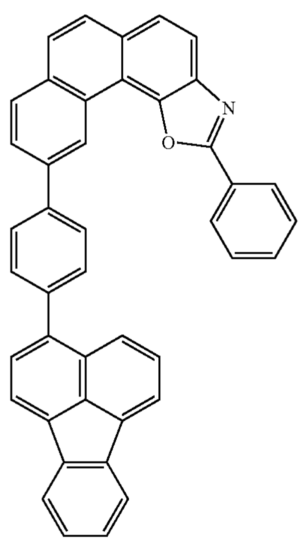

-continued
H-64
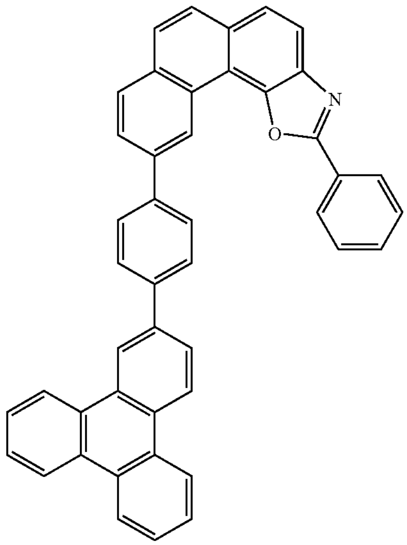
H-65
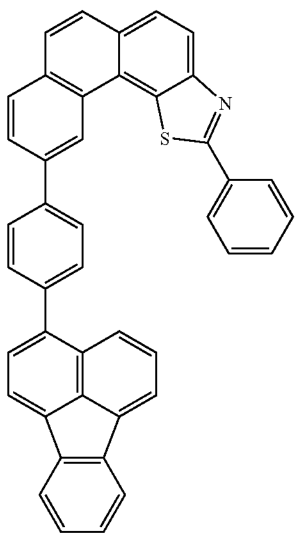
H-66
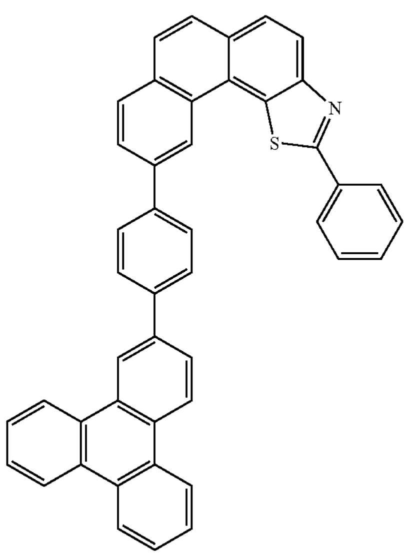
-continued
H-67
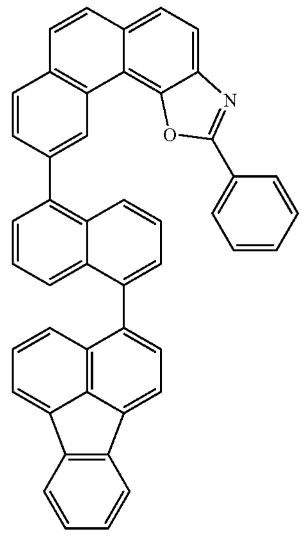
H-68
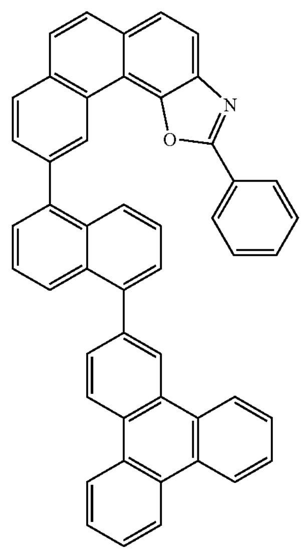
H-69
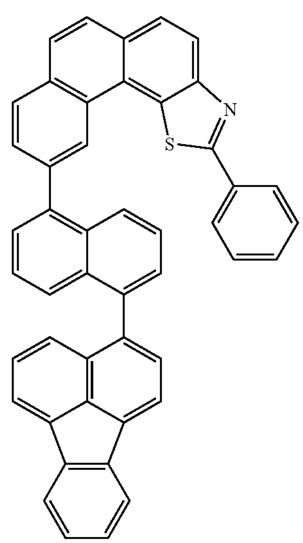

-continued
H-70
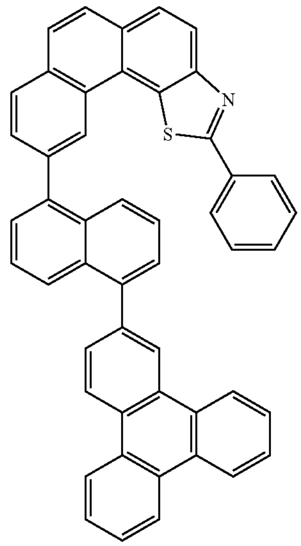
H-71
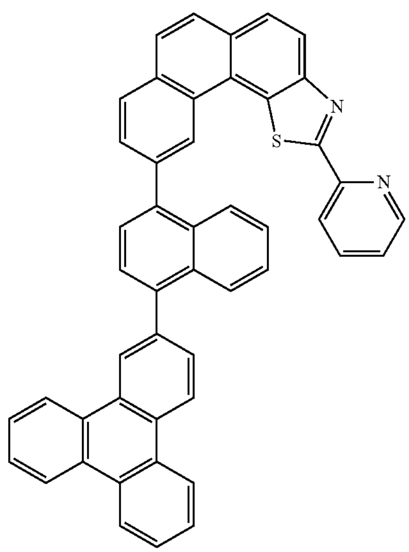
H-72
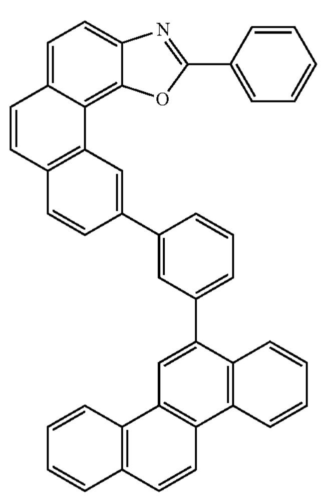
-continued
H-73
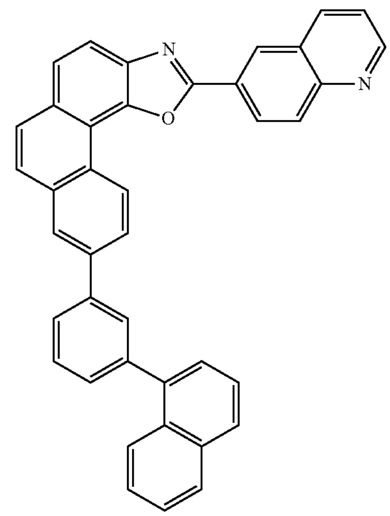
H-74
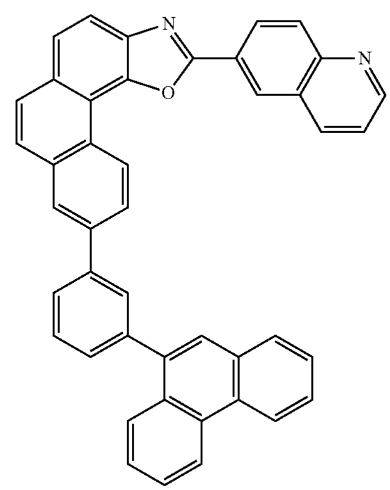
H-75
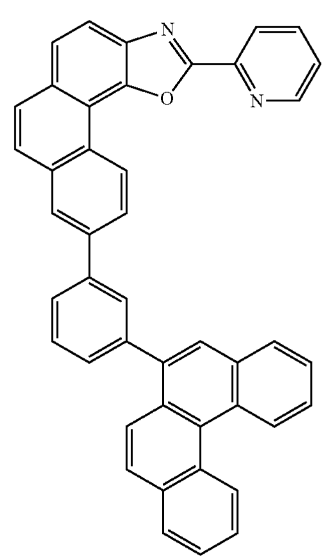

-continued
H-76
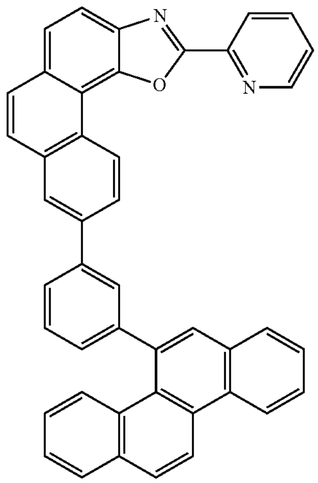
H-77
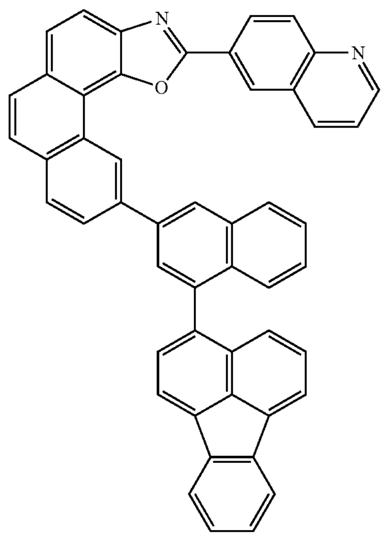
H-78
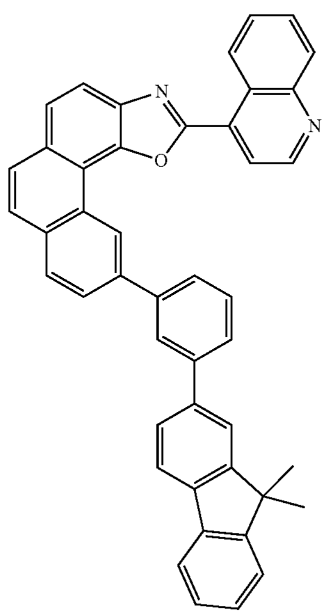
-continued
H-79
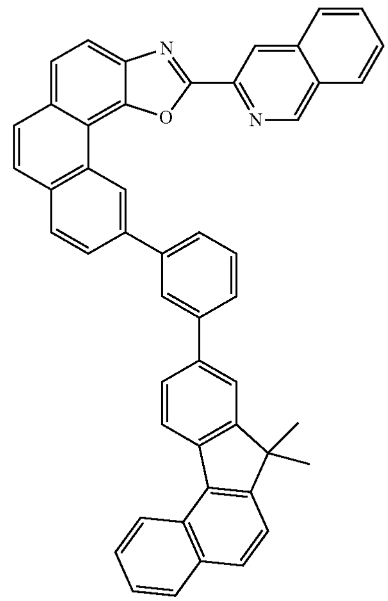
H-80
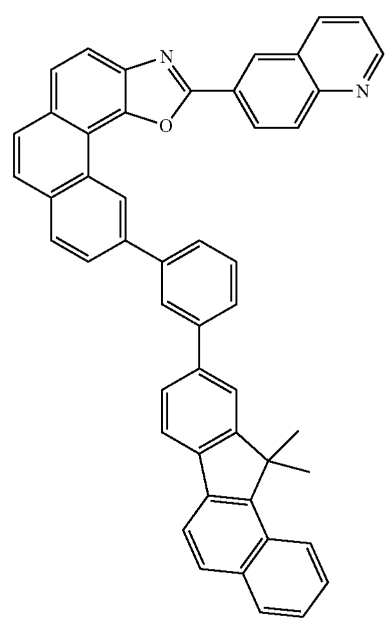

-continued
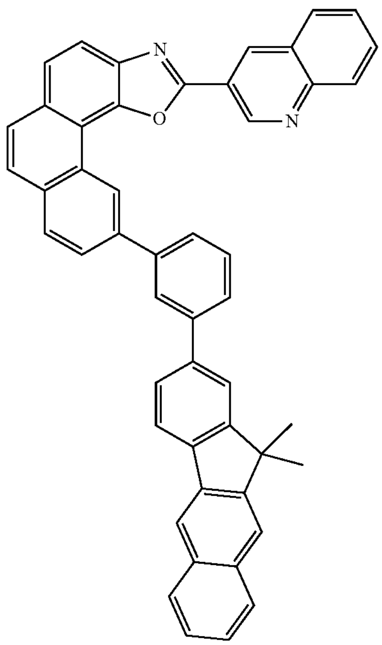
H-81
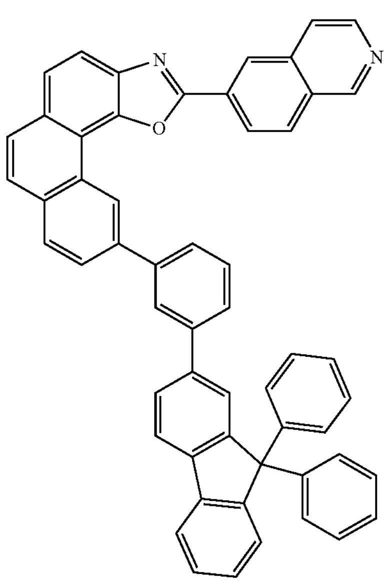
H-82
-continued
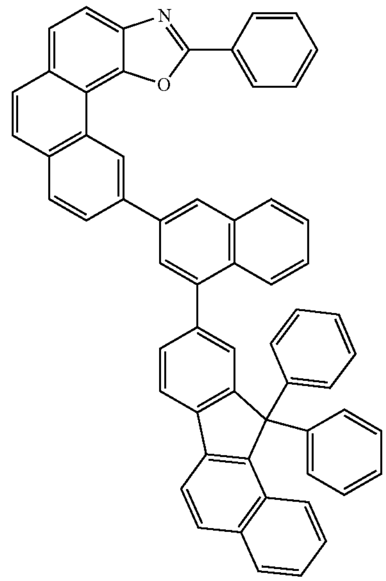
H-83
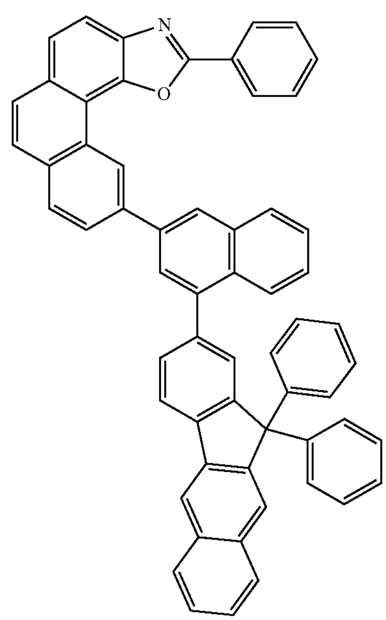
H-84

H-85
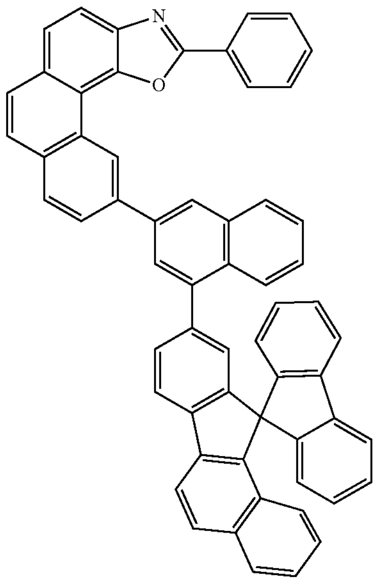
H-86
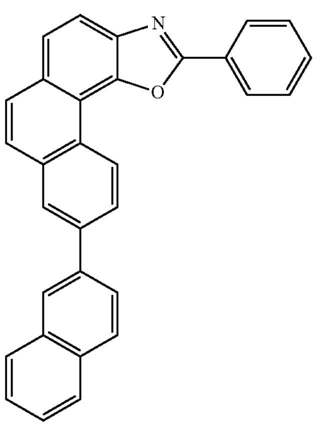
H-87
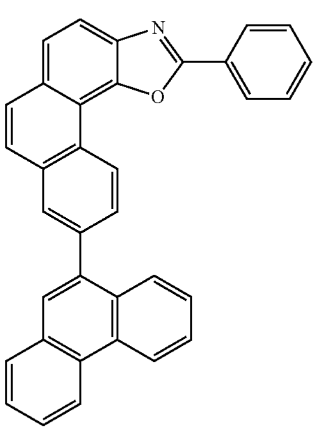
H-88
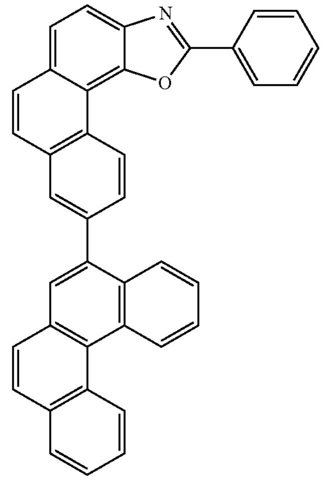
H-89
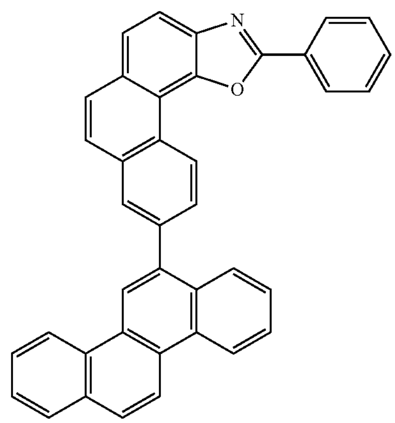
H-90
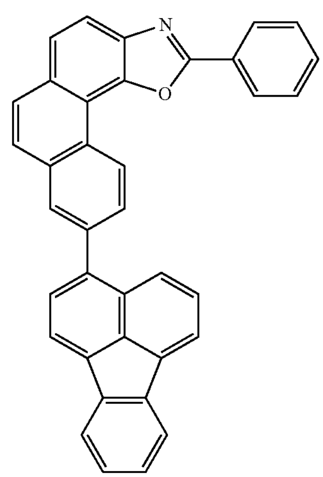

-continued
H-91
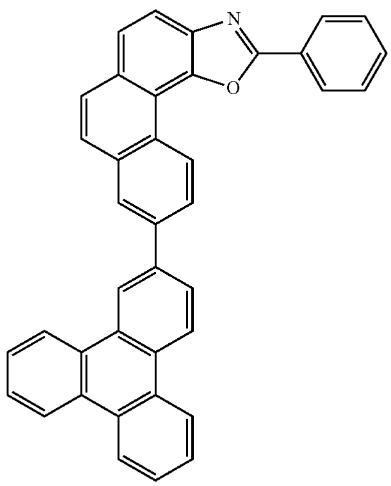
H-92
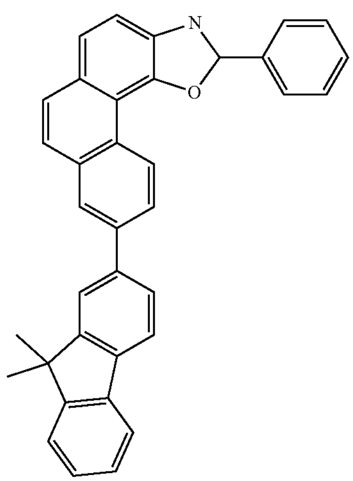
H-93
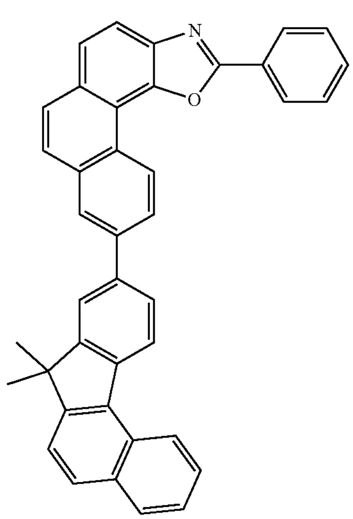
-continued
H-94
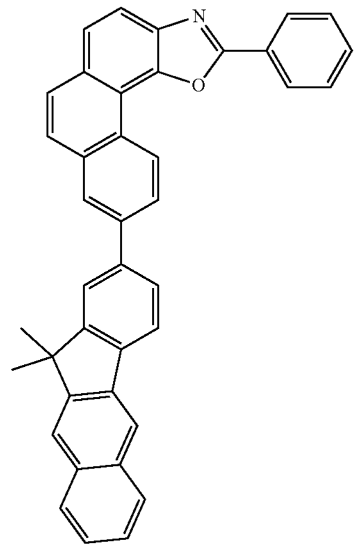
H-95
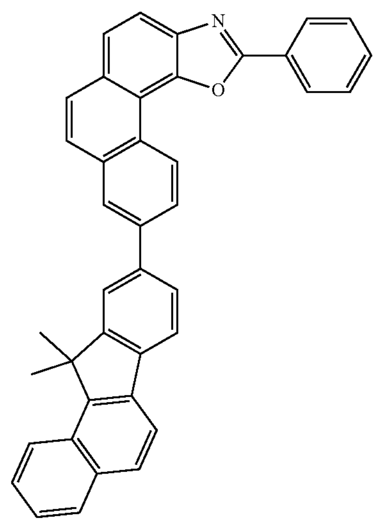
H-96
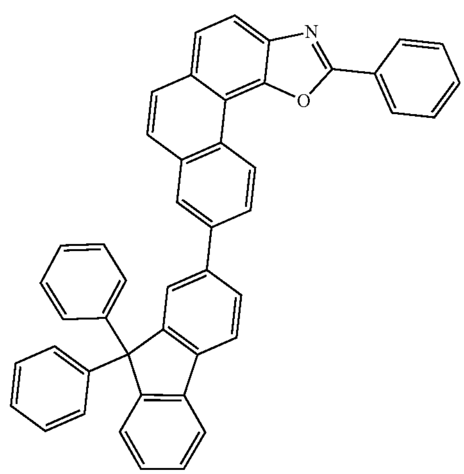

-continued
H-97
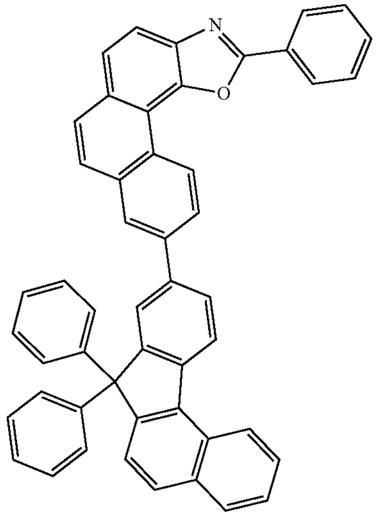
H-98
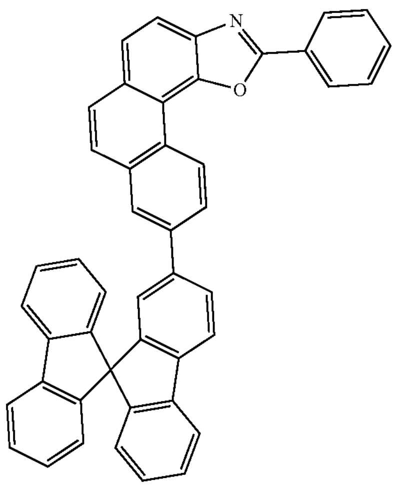
H-99
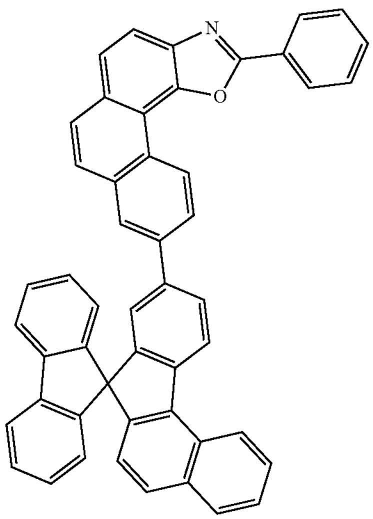
-continued
H-100
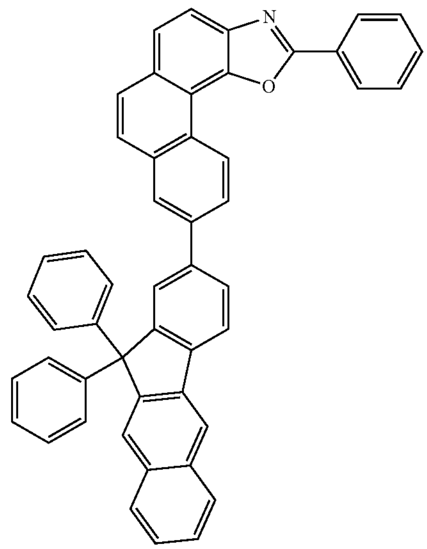
H-101
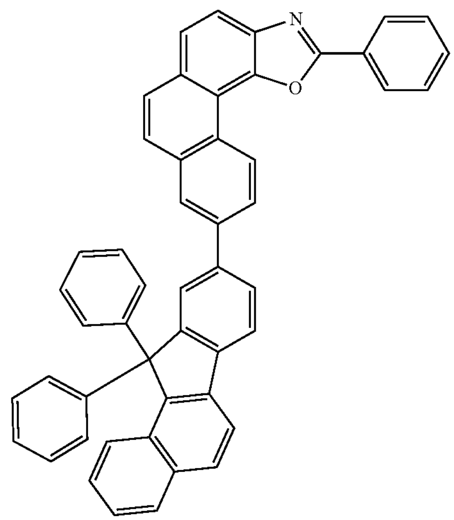
H-102
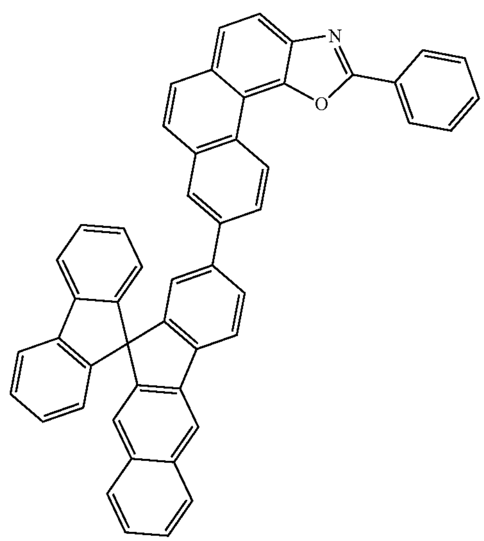

H-103
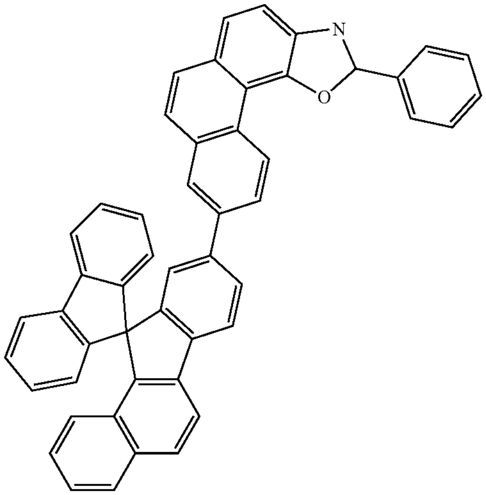
H-104
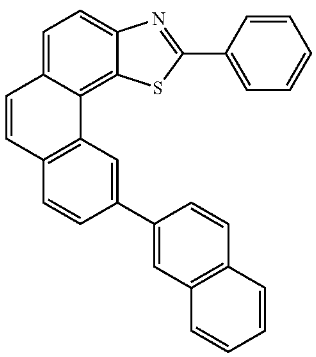
H-105
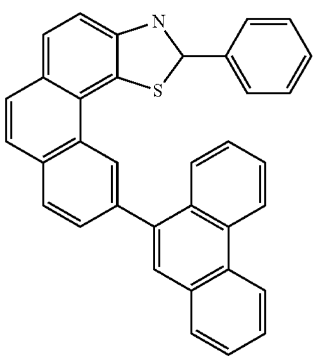
H-106
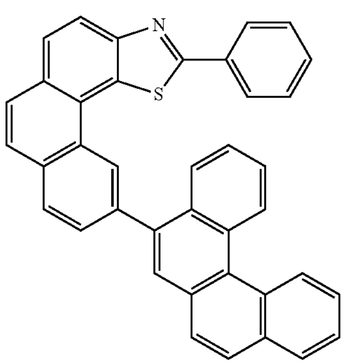
H-107
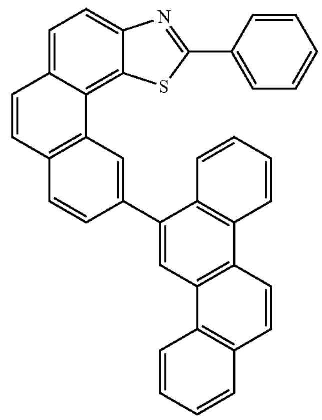
H-108
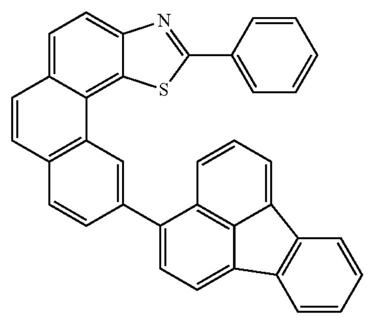
H-109
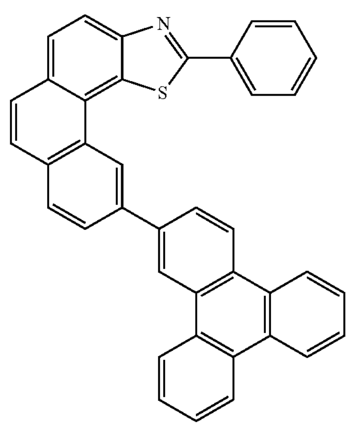
H-110
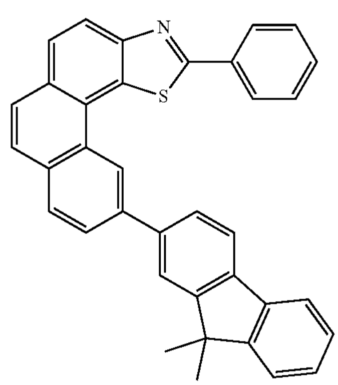

-continued
H-111
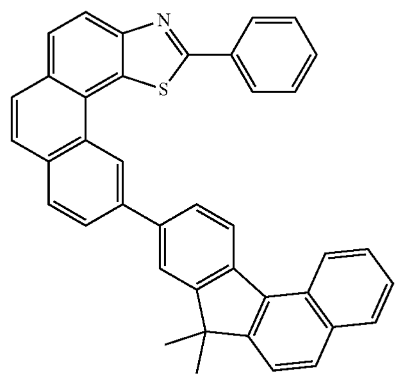
H-112
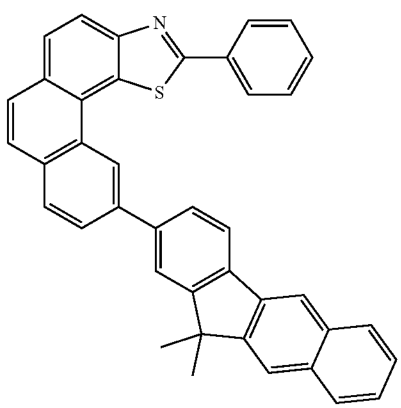
H-113
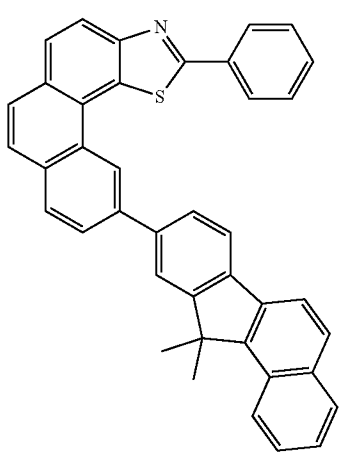
-continued
H-114
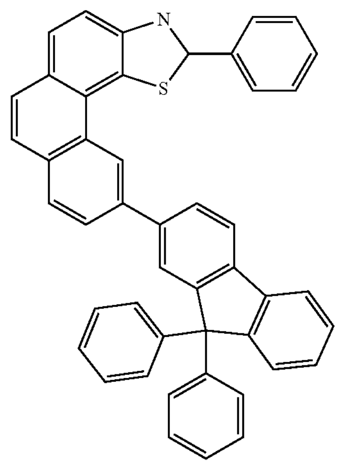
H-115
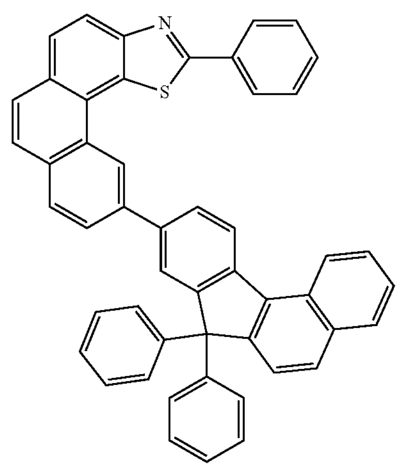
H-116
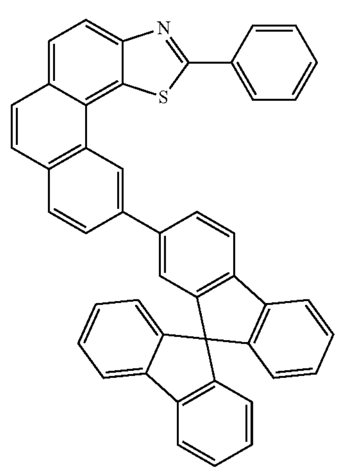

H-117
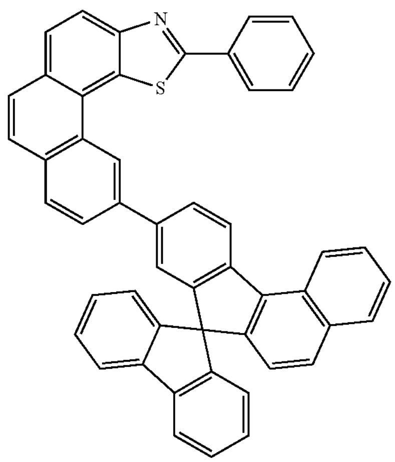
H-118
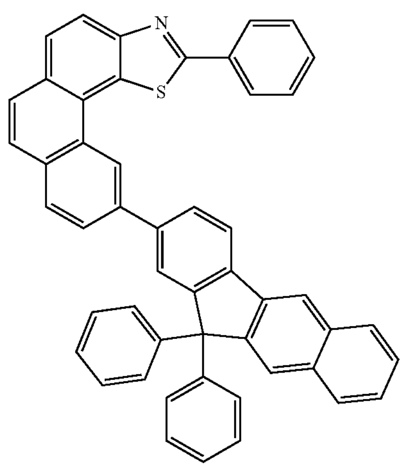
H-119
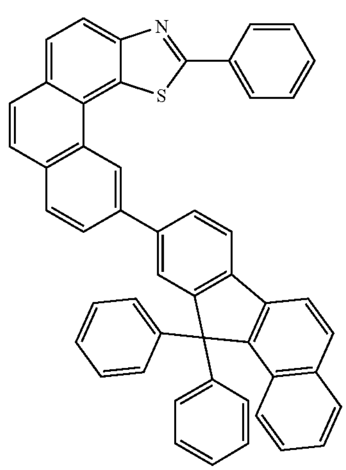
H-120
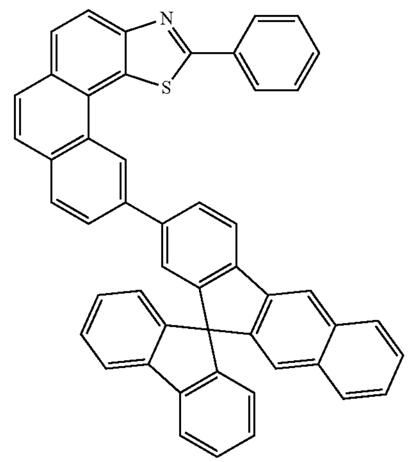
H-121
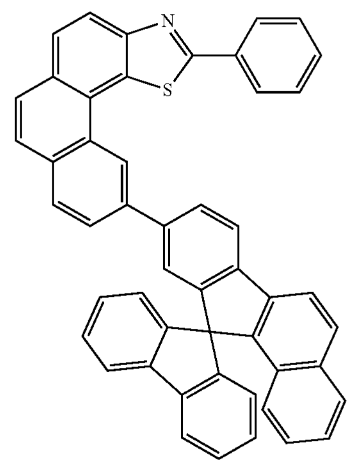
H-122
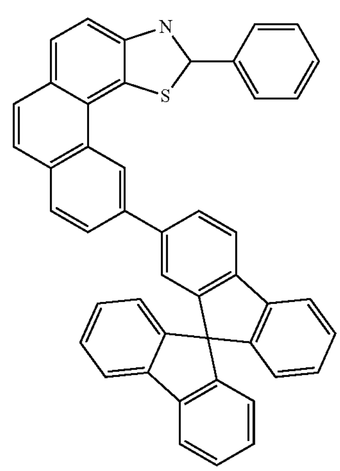

-continued
H-123
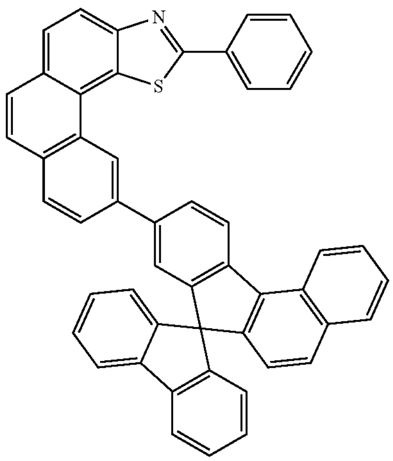
H-124
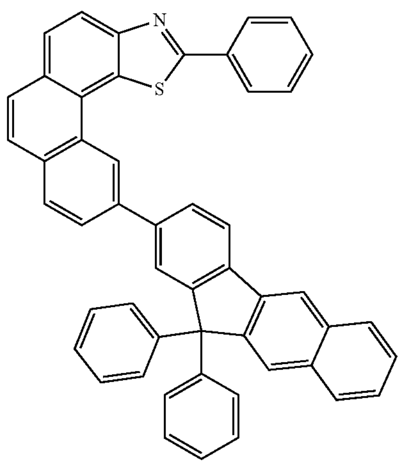
H-125
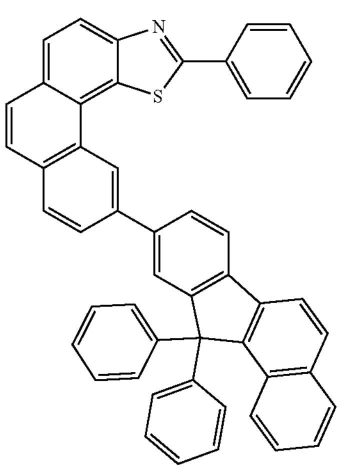
-continued
H-126
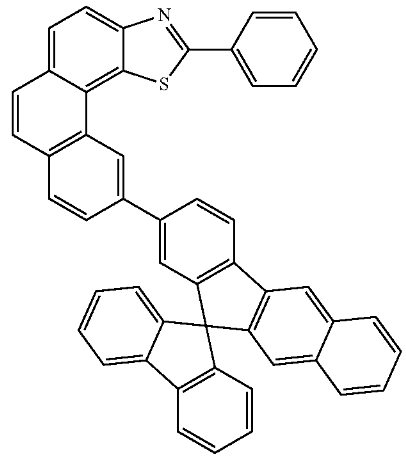
H-127
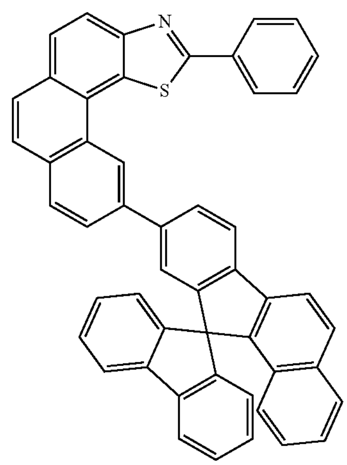
H-128
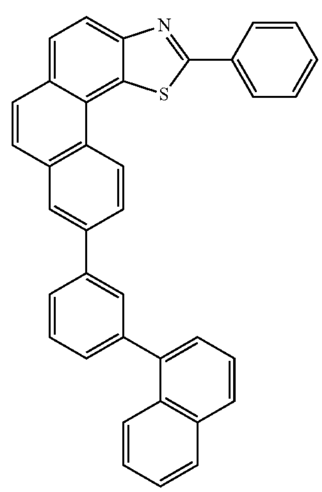

H-129
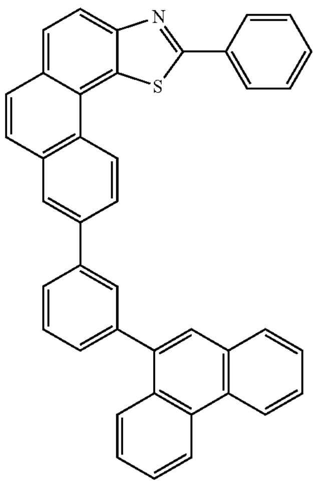
H-130
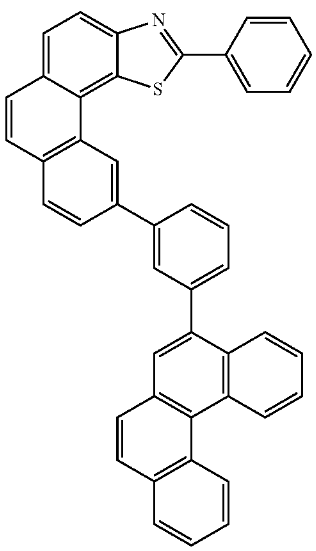
H-131
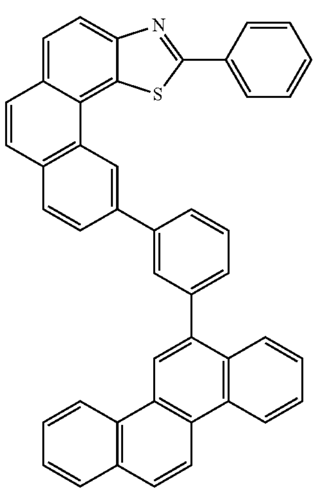
H-132
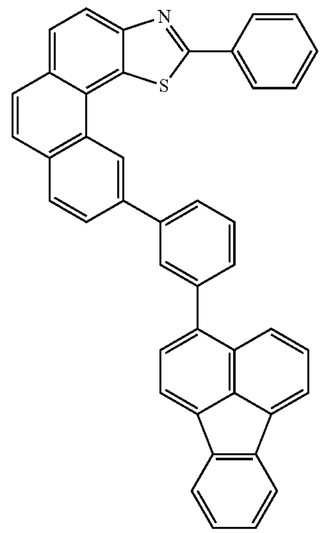
H-133
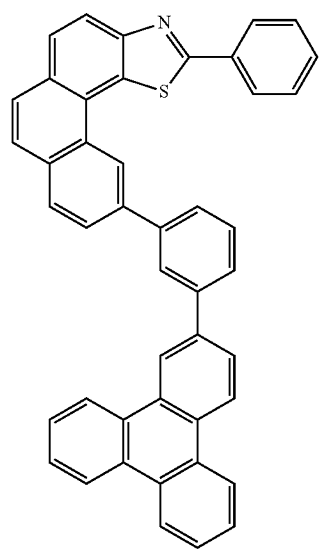
H-134
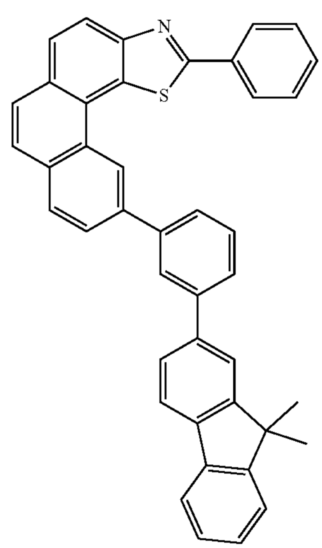

H-135
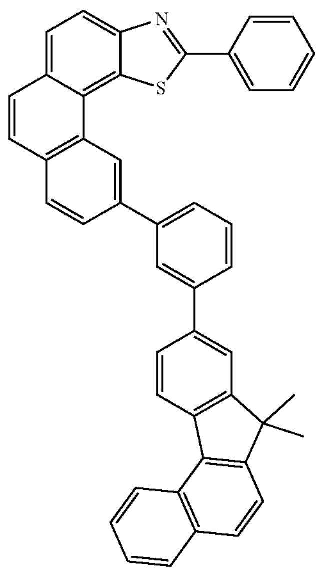
H-136
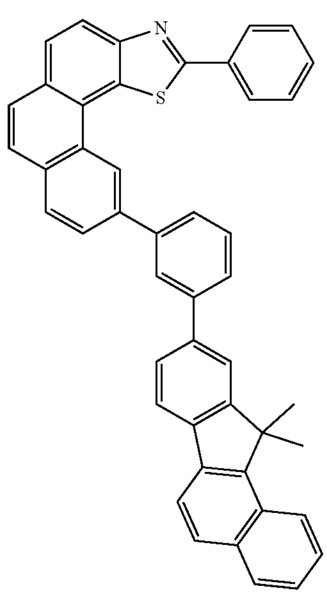
H-137
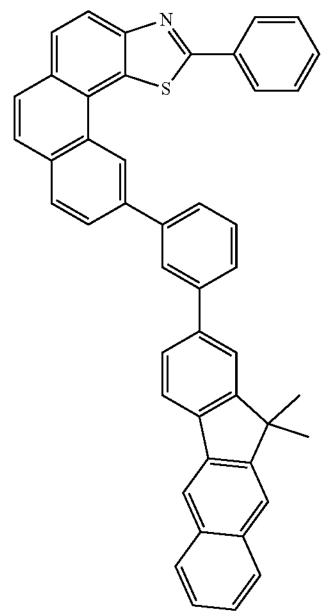
H-138
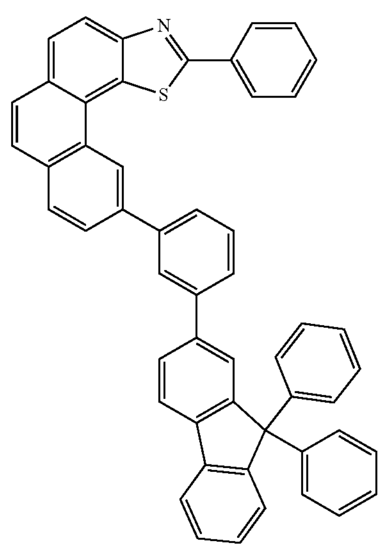

-continued
H-139
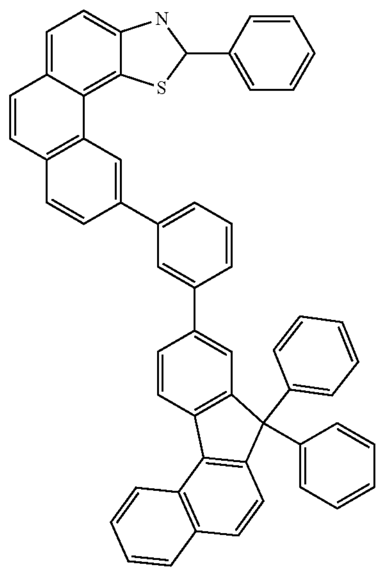
H-140
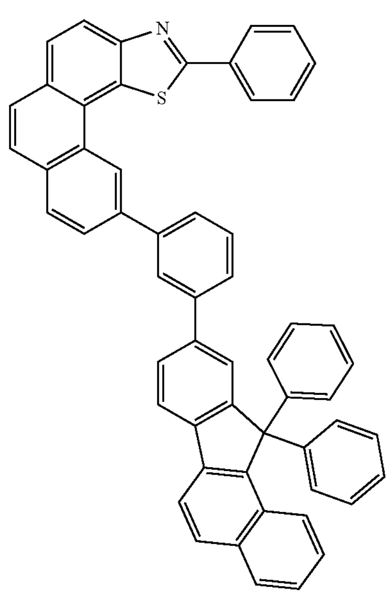
-continued
H-141
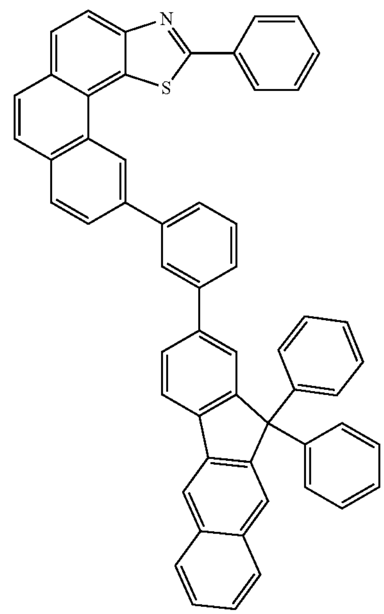
H-142
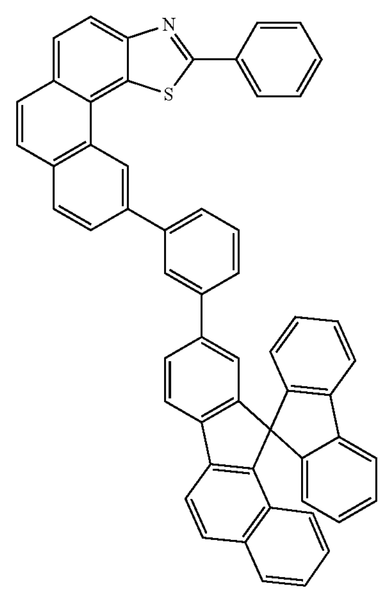

-continued
H-143
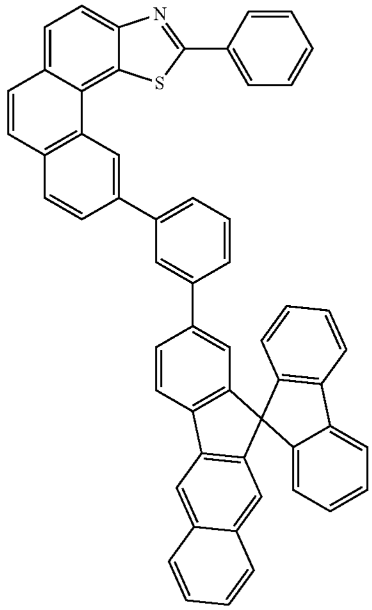
H-144
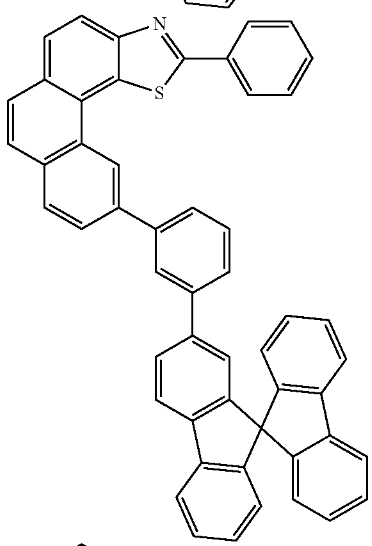
H-145
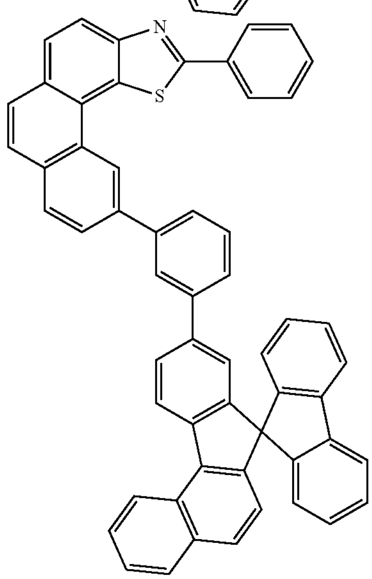
-continued
H-146
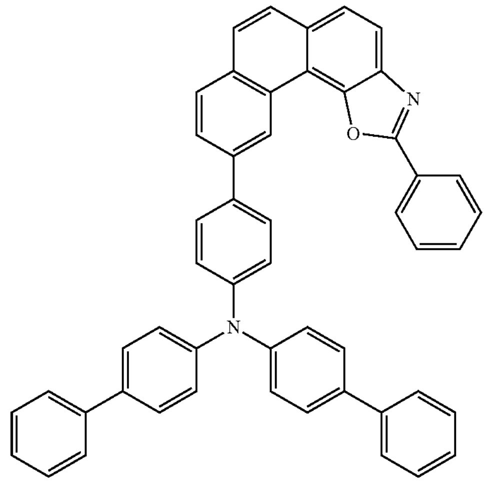
H-147
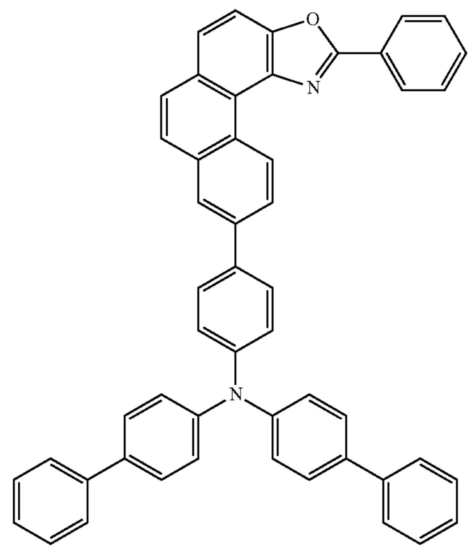
H-148
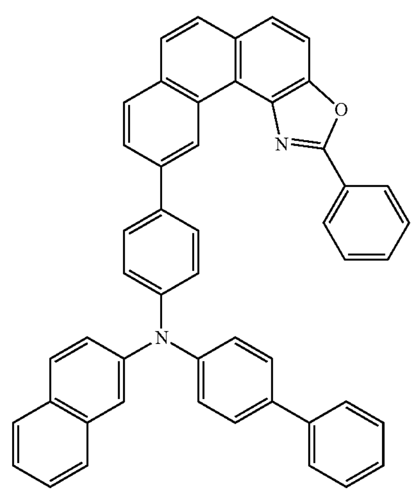

H-149
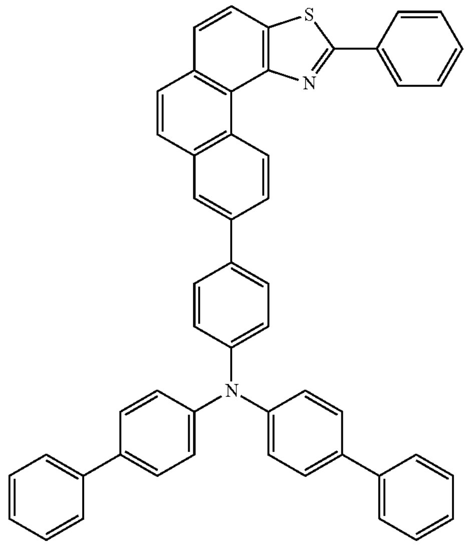
H-150
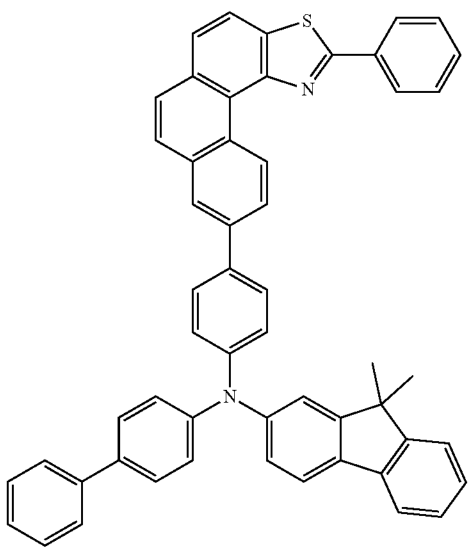
H-151
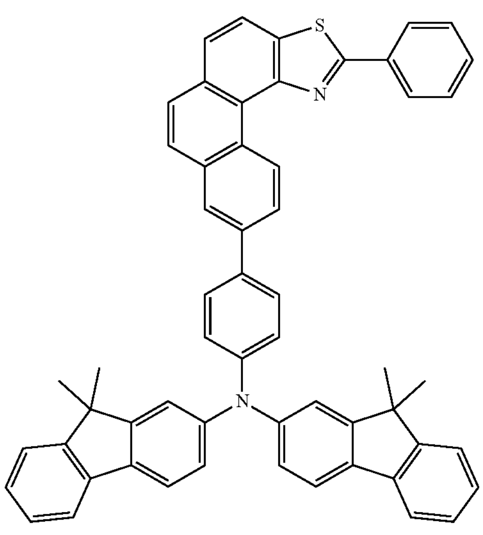
H-152
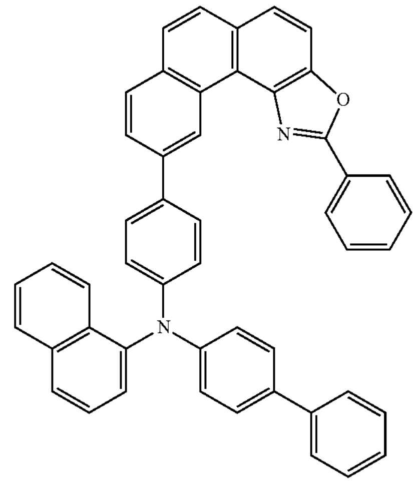
H-153
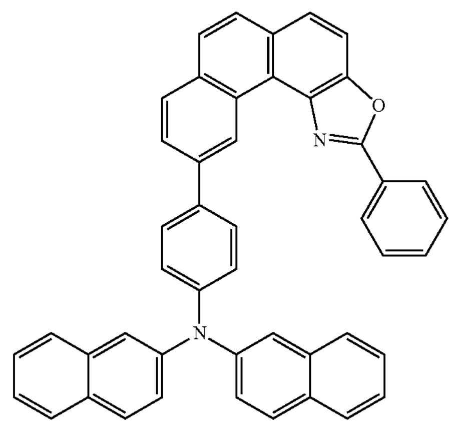
H-154
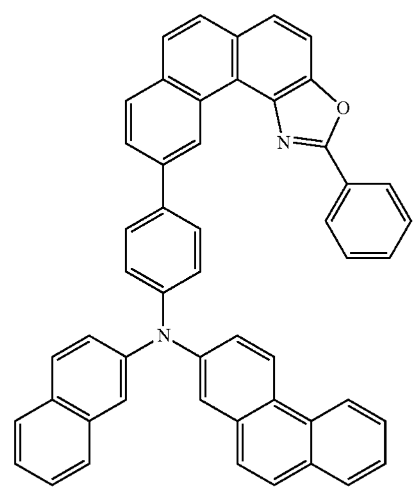

-continued
H-155
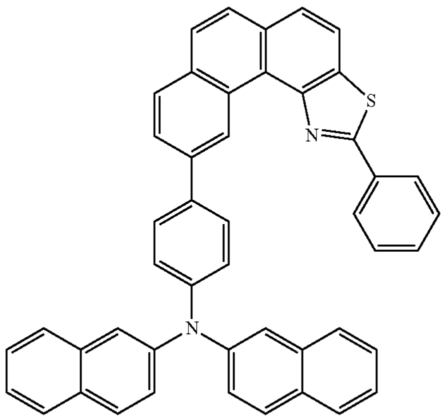
H-156
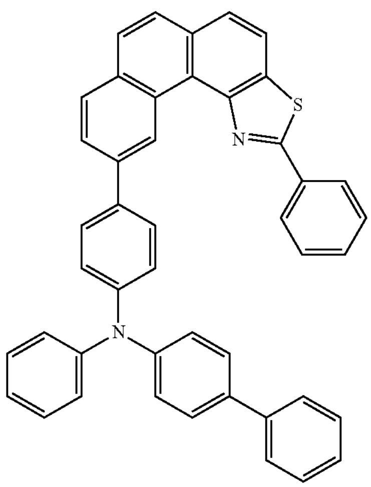
H-157
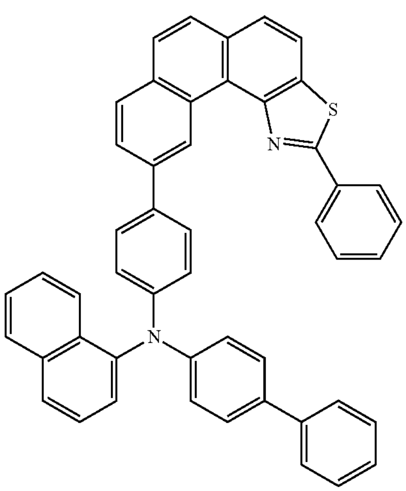
-continued
H-158
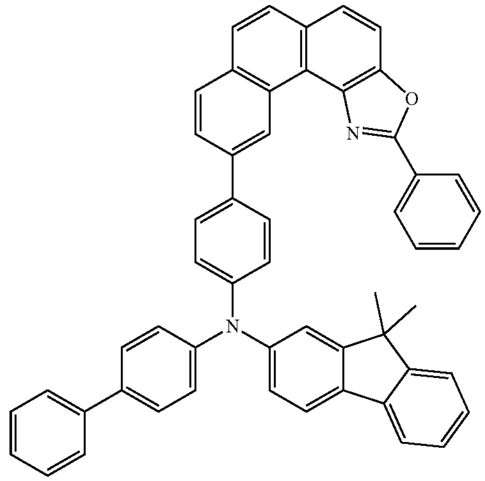
H-159
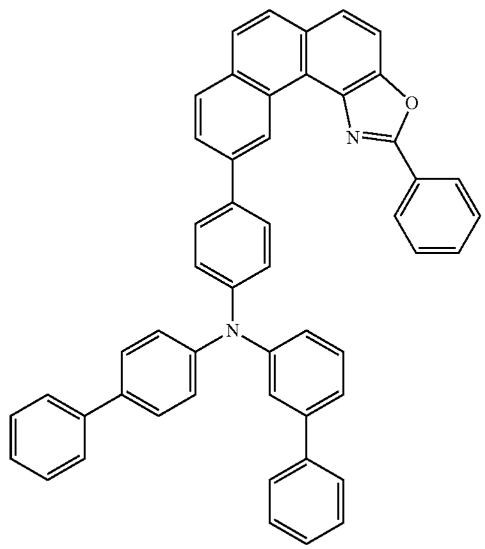
H-160
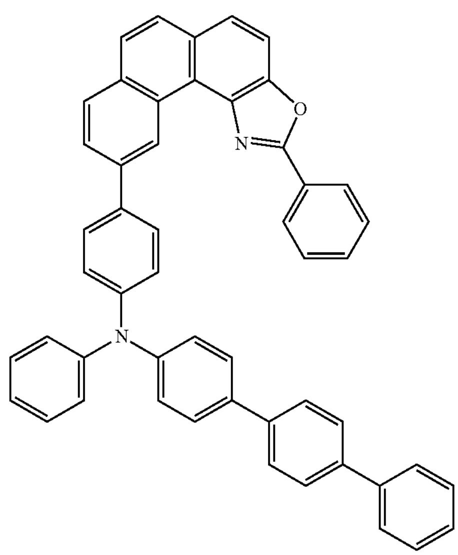

-continued
H-161
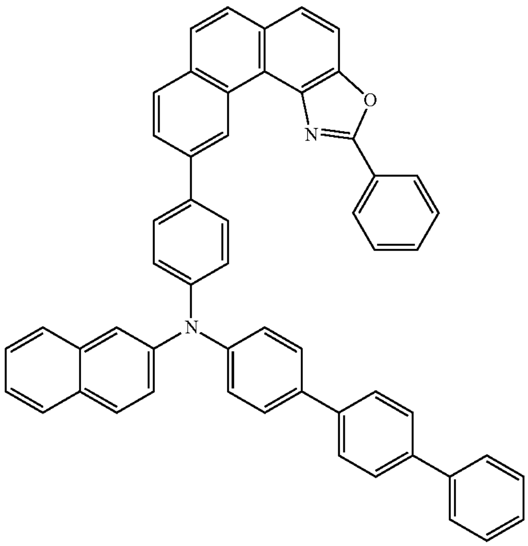
H-162
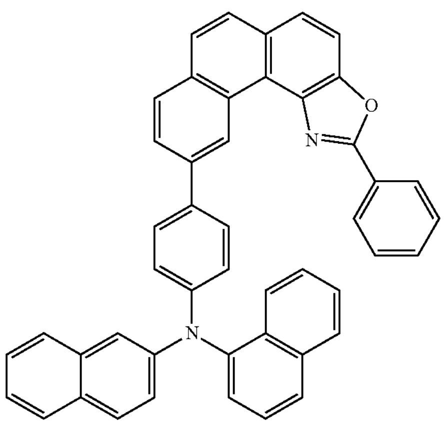
H-163
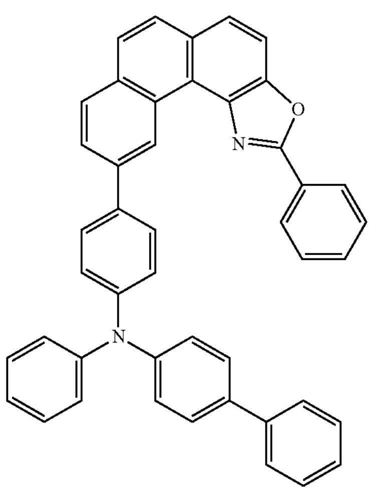
-continued
H-164
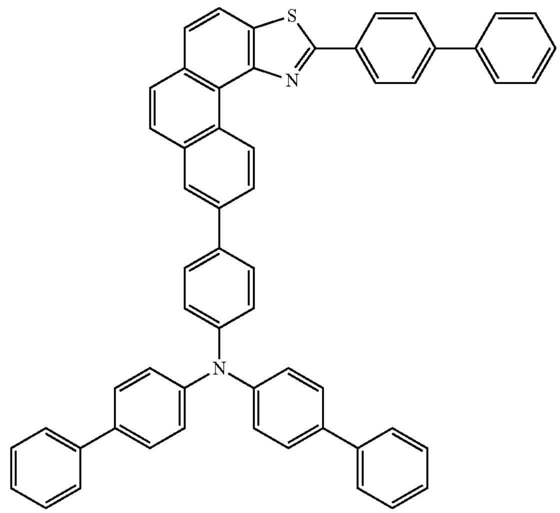
H-165
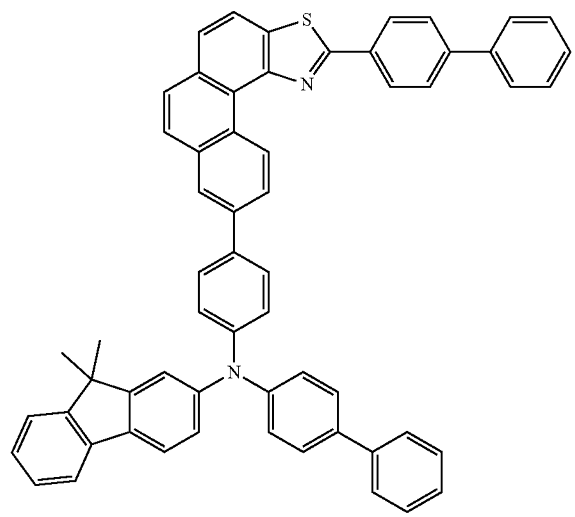
H-166
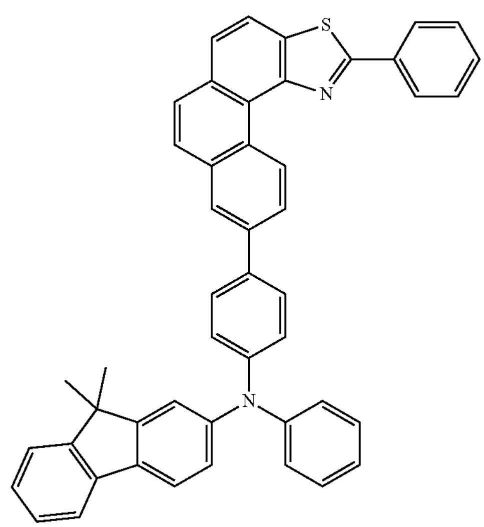

-continued
H-167
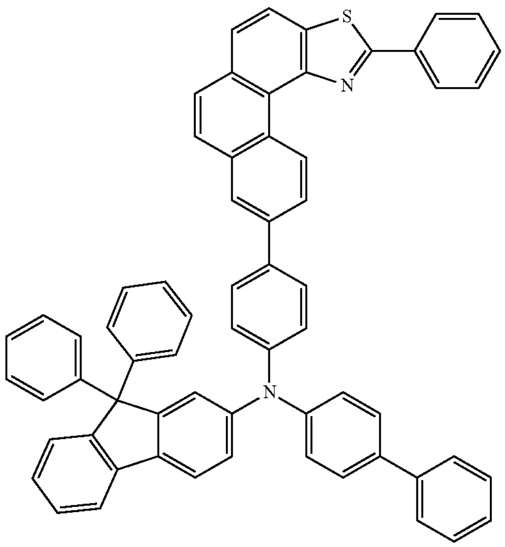
H-168
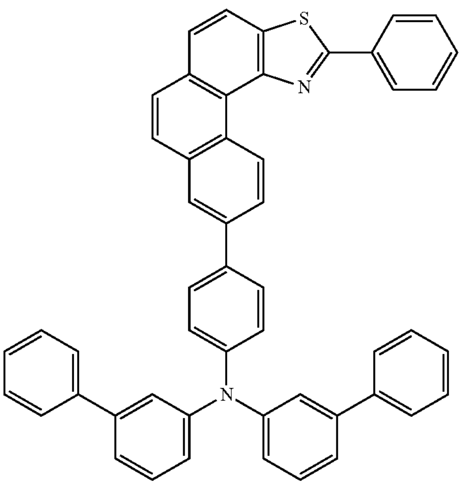
H-169
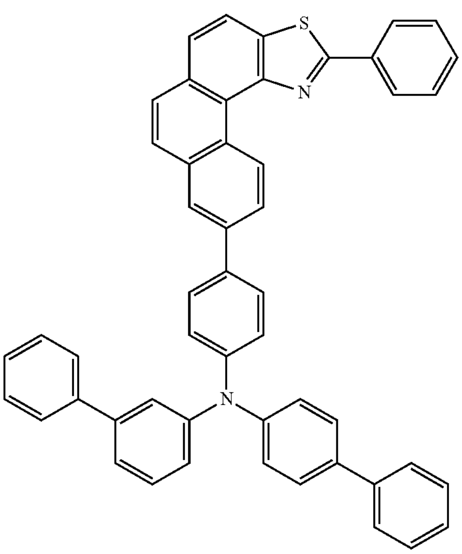
H-170
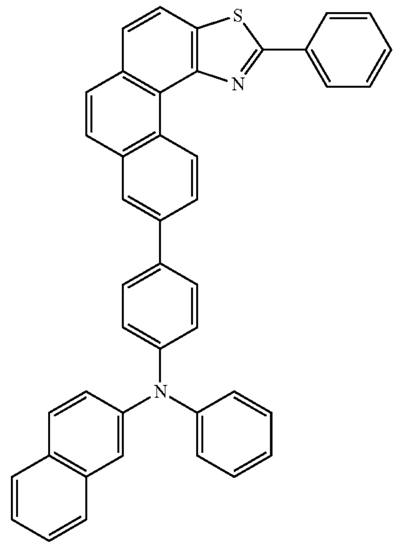
H-171
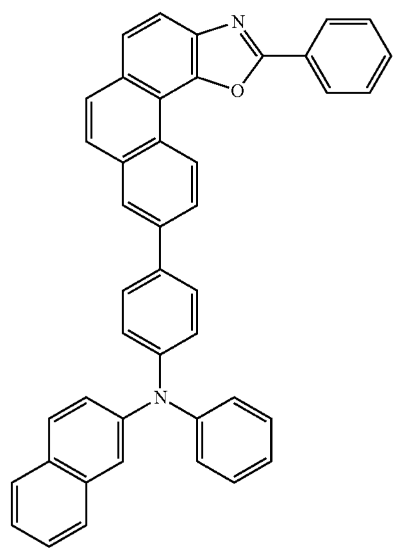
H-172
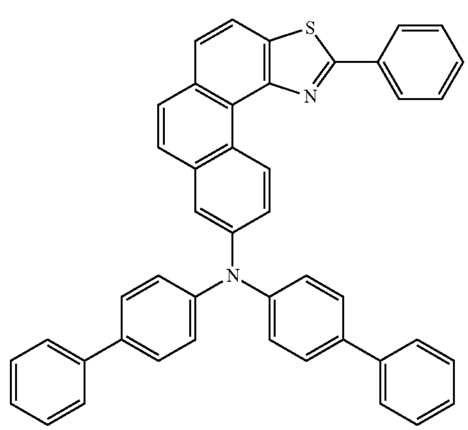

-continued
H-173
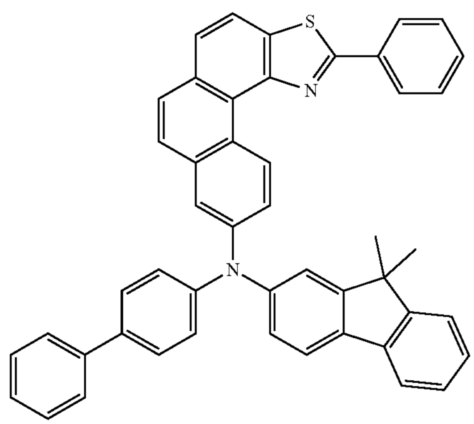
H-174
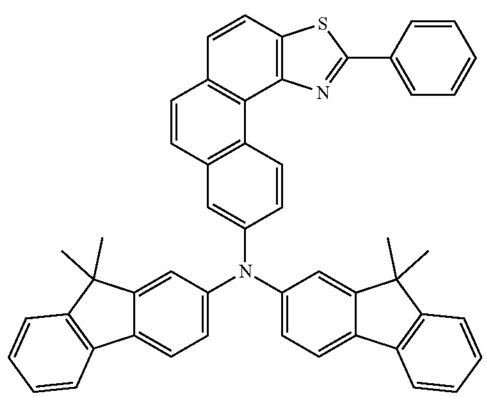
H-175
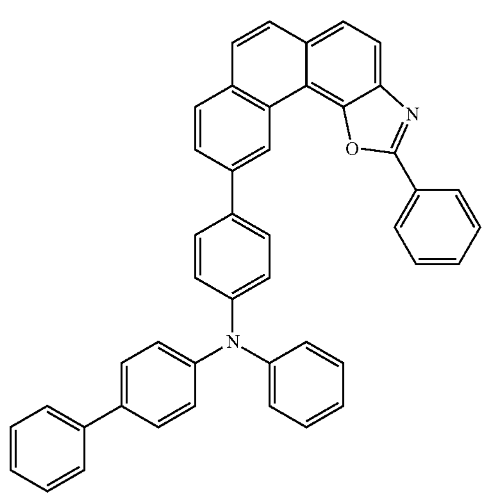
-continued
H-176
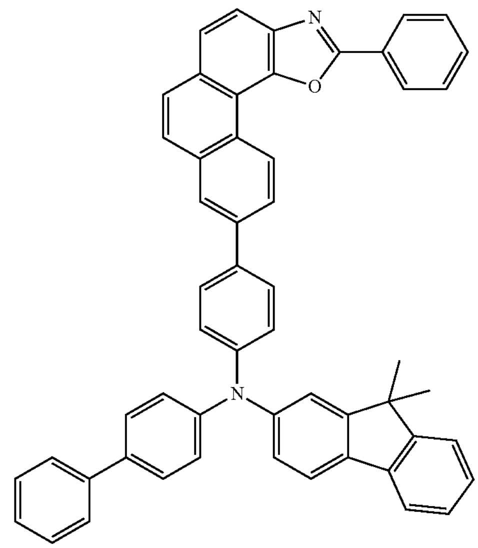
H-177
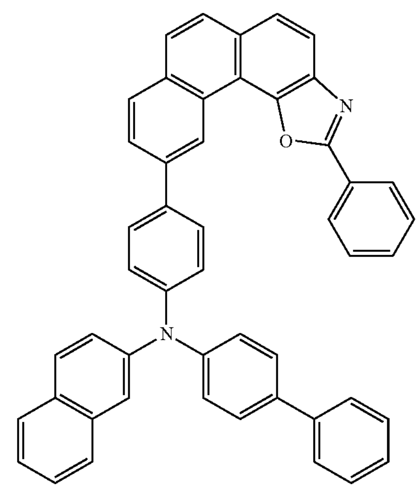
H-178
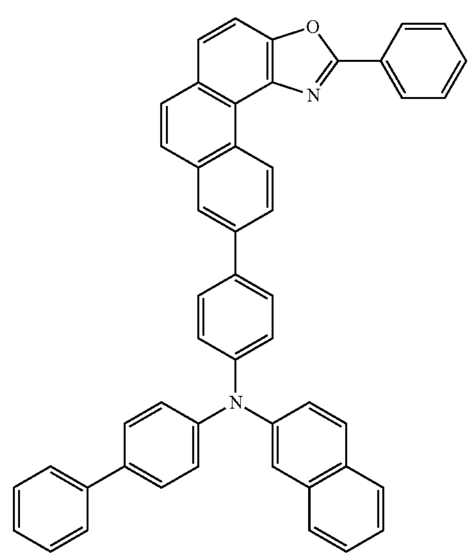

H-179
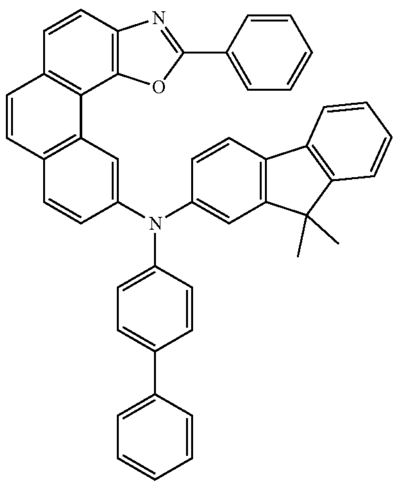
H-180
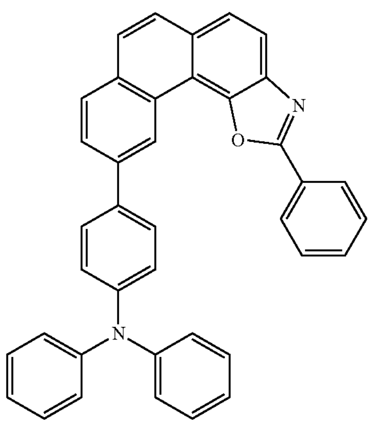
H-181
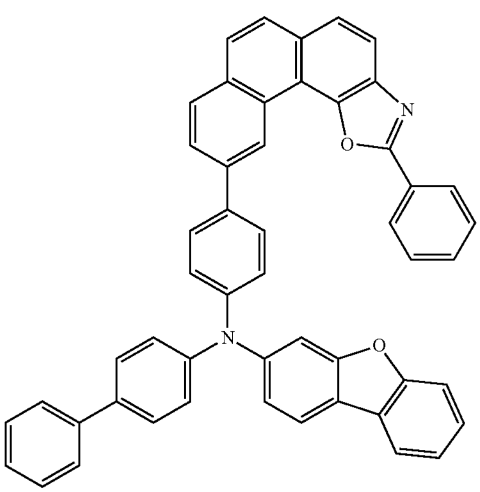
H-182
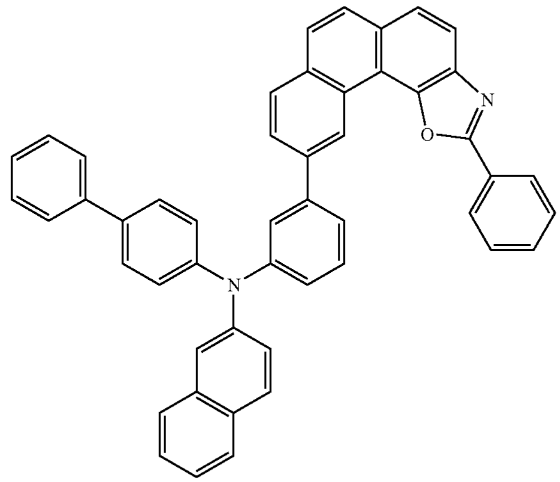
H-183
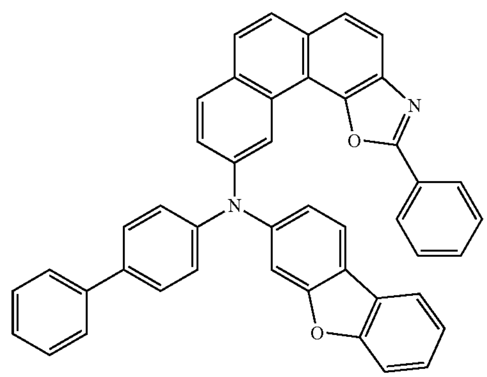
H-184
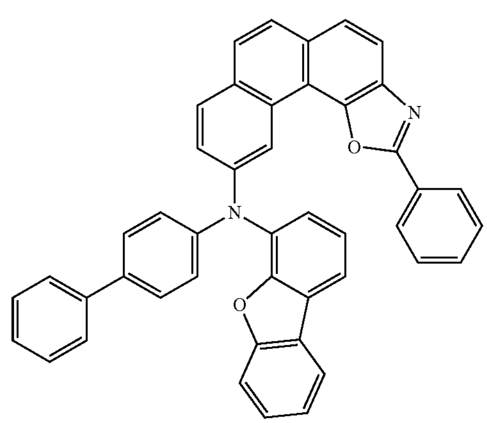

-continued
H-185
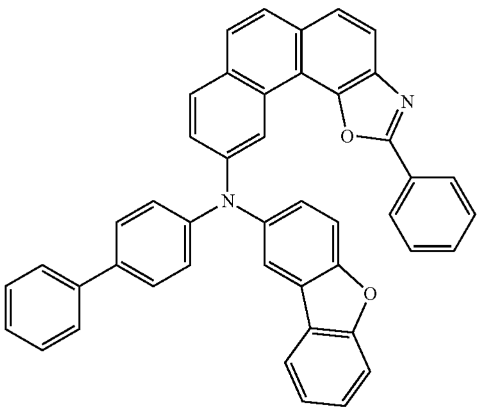
H-186
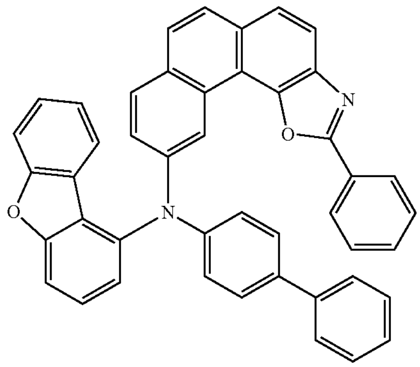
H-187
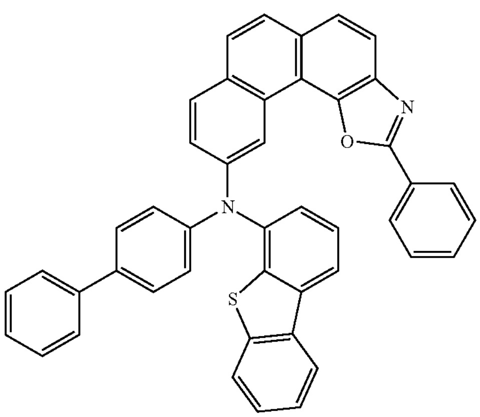
H-188
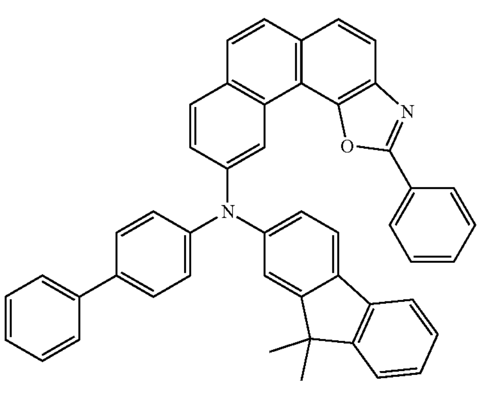
-continued
H-189
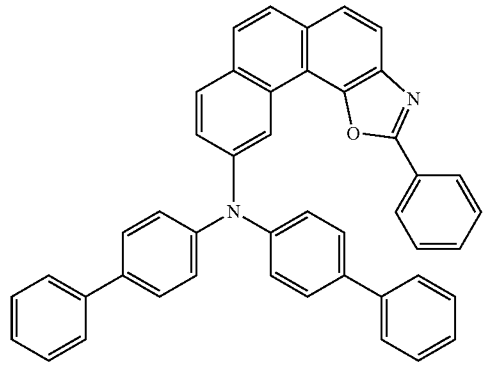
H-190
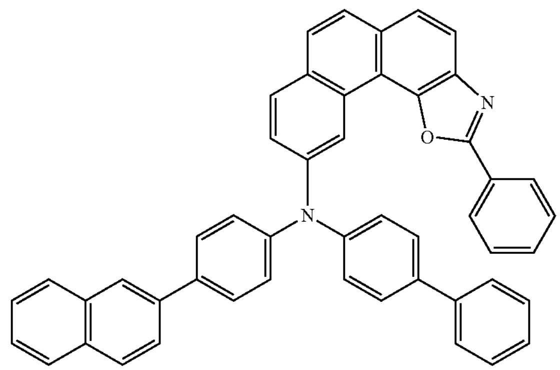
H-191
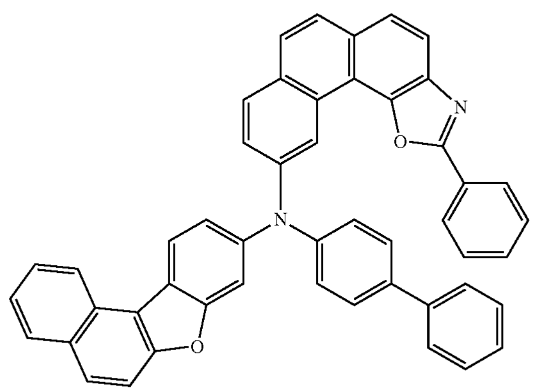
H-192
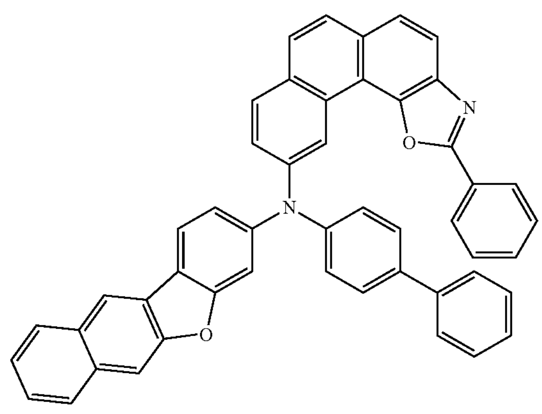

-continued
H-193
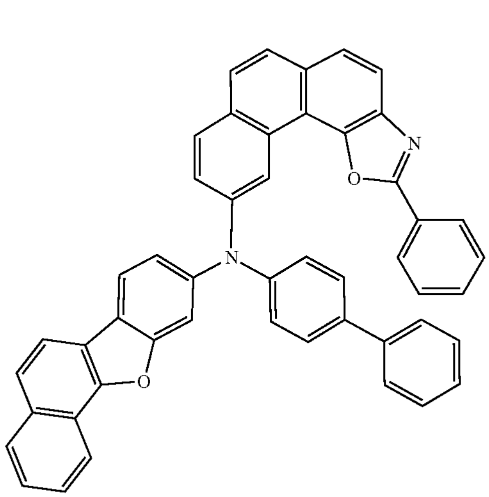
H-194
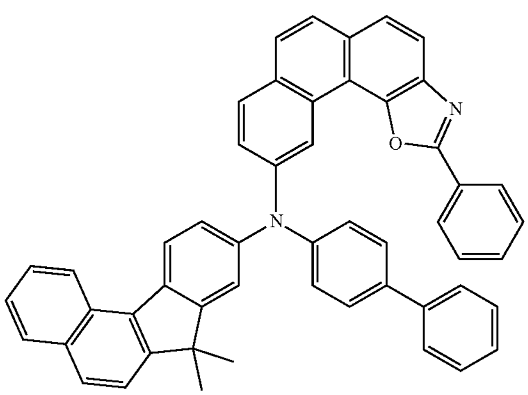
H-195
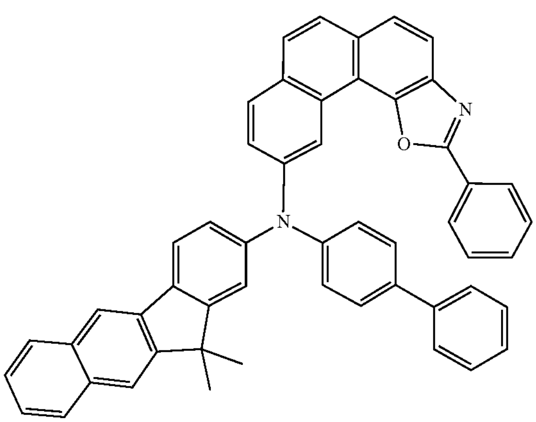
-continued
H-196
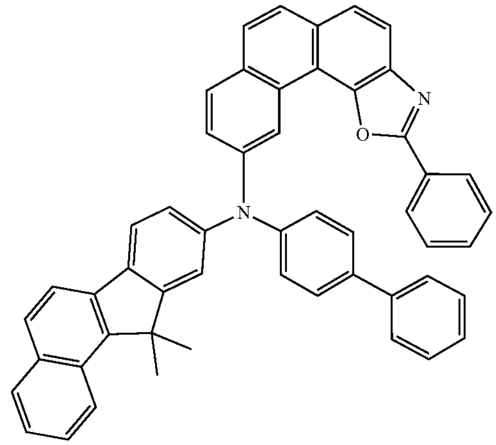
H-197
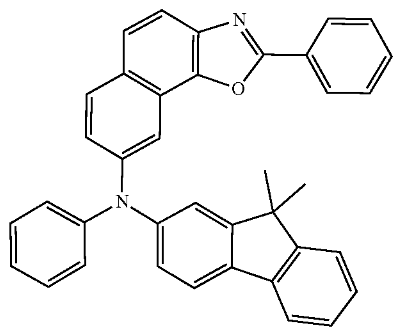
H-198
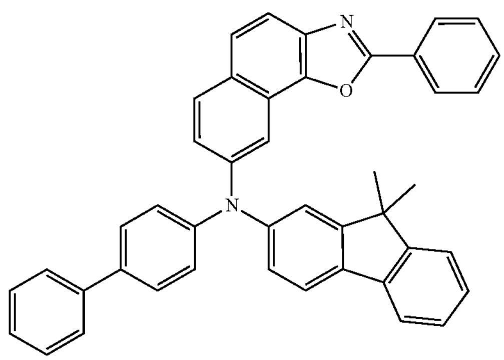
H-199
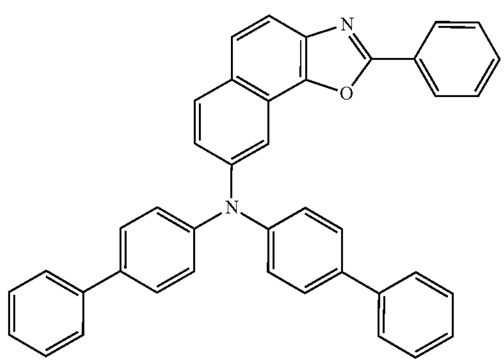

H-200
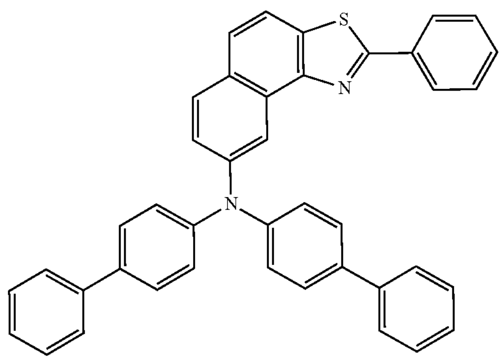
H-201
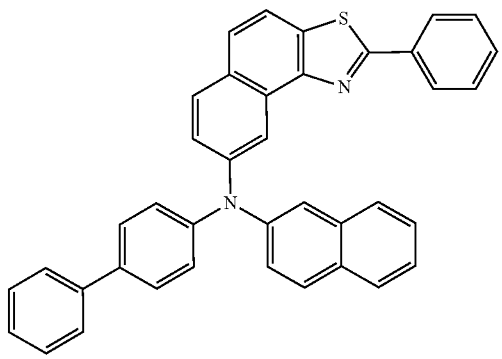
H-202
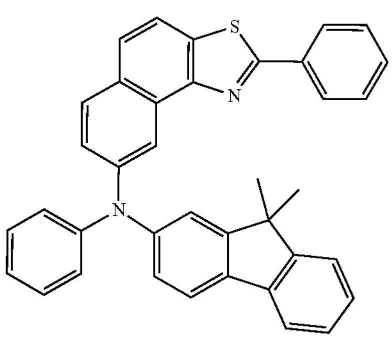
H-203
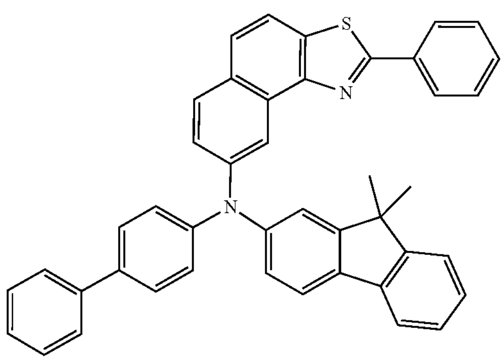
H-204
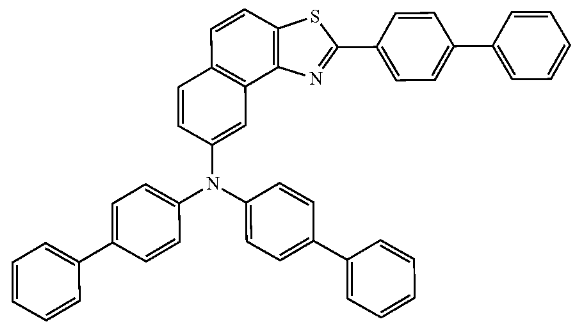
H-205
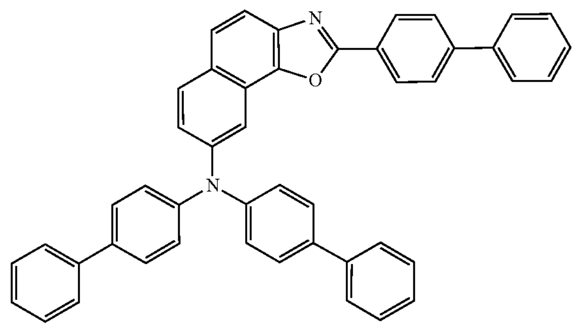
H-206
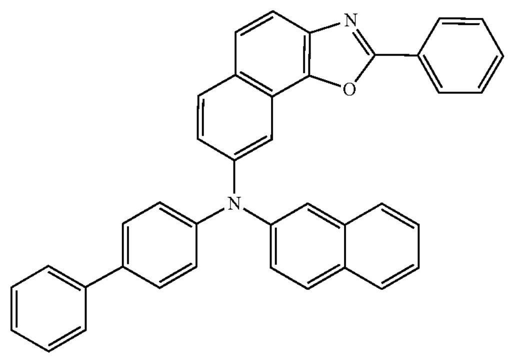
H-207
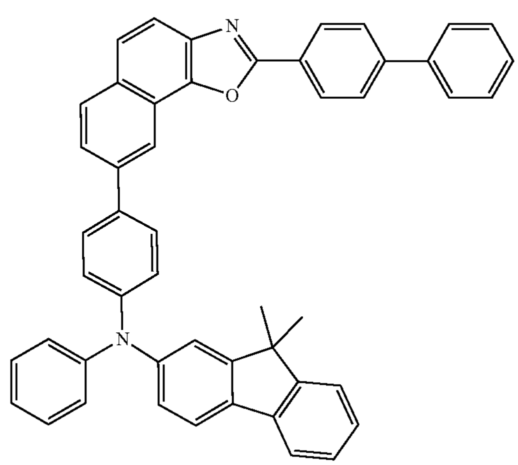

H-208
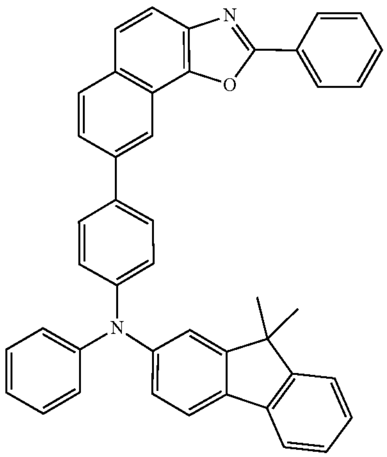
H-209
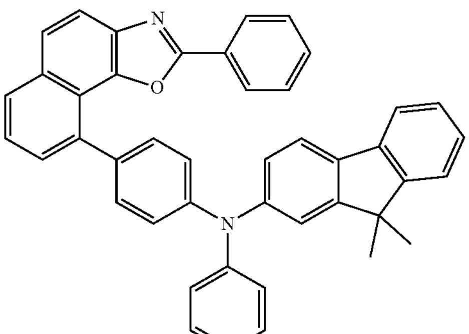
H-210
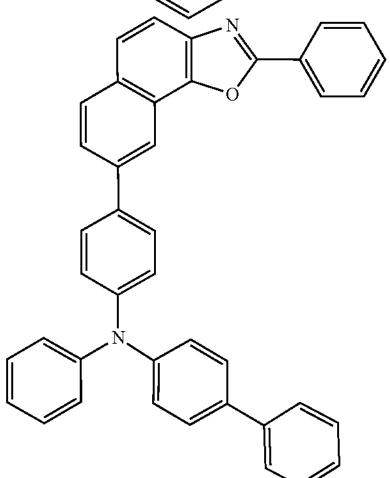
H-211
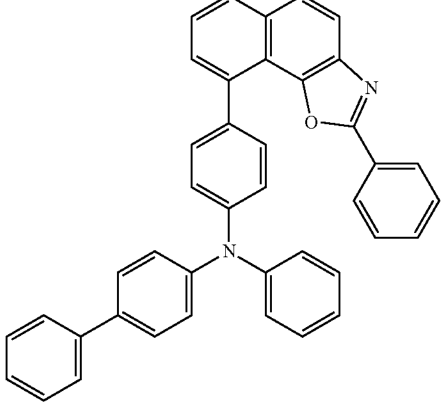
H-212
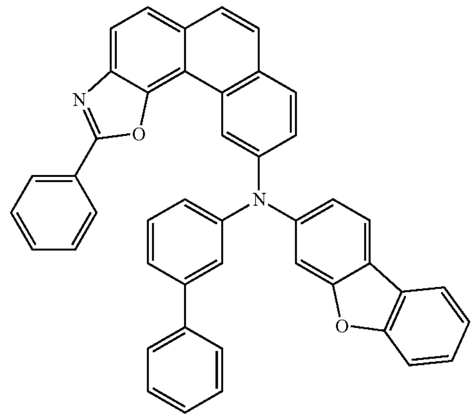
H-213
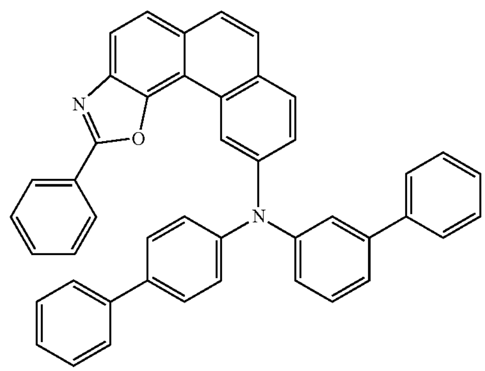
H-214
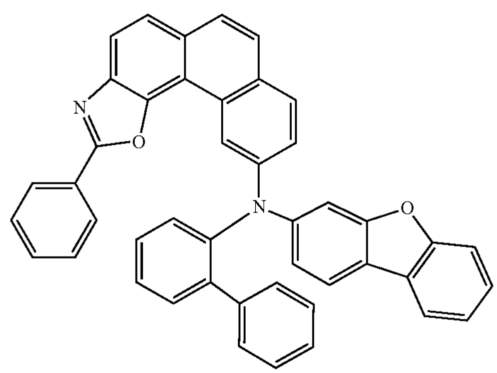
H-215
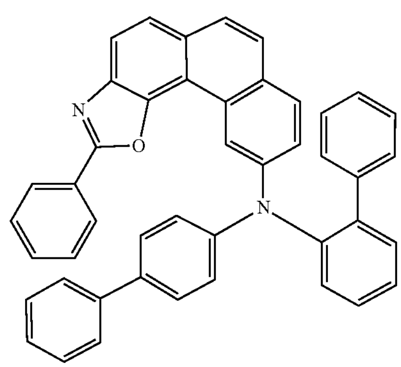

-continued
H-216
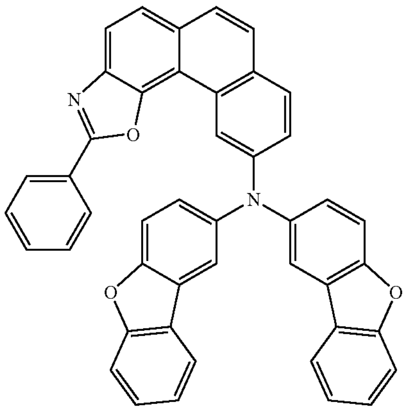
H-217
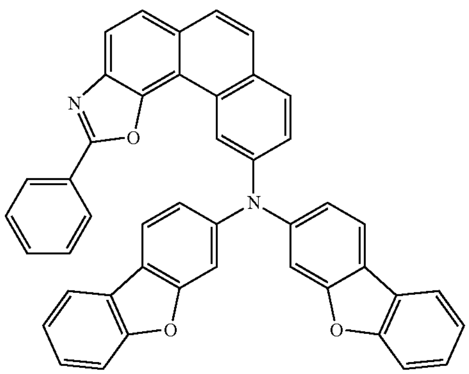
H-218
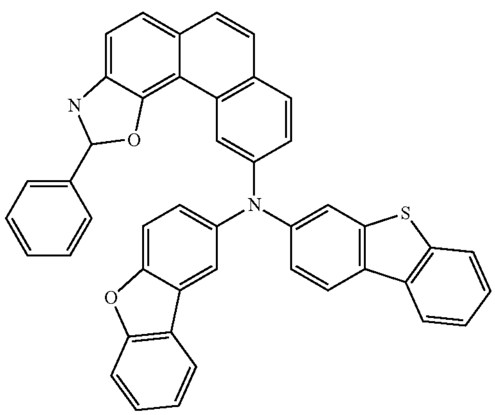
H-219
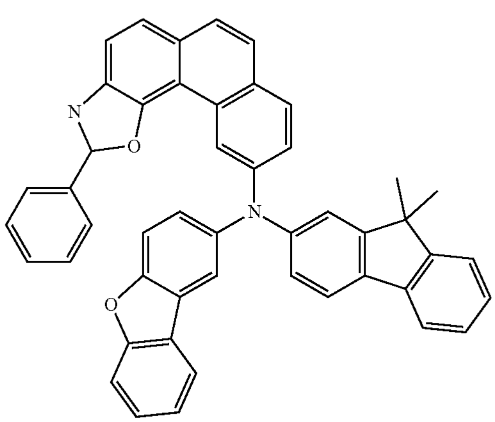
-continued
H-220
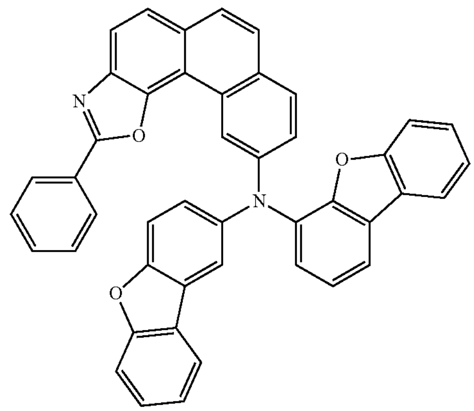
H-221
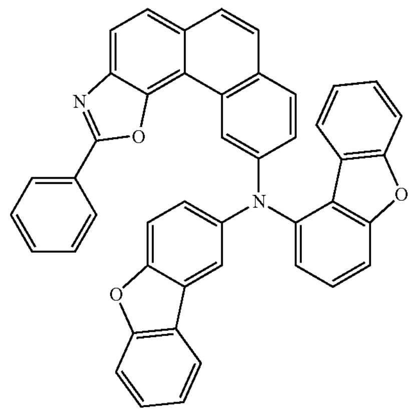
H-222
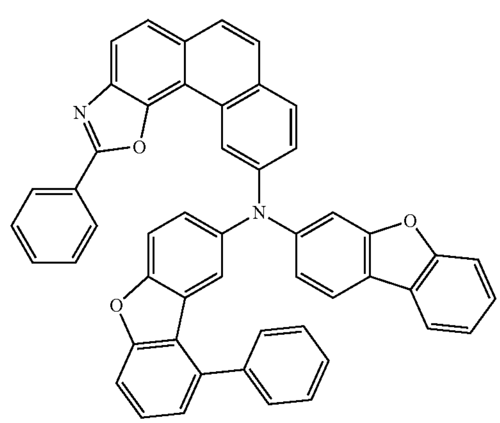

-continued
H-223
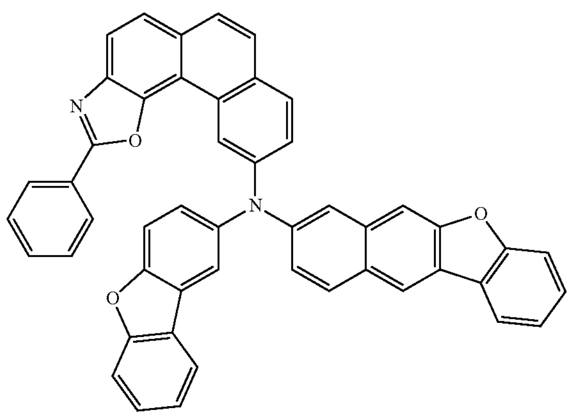
H-224
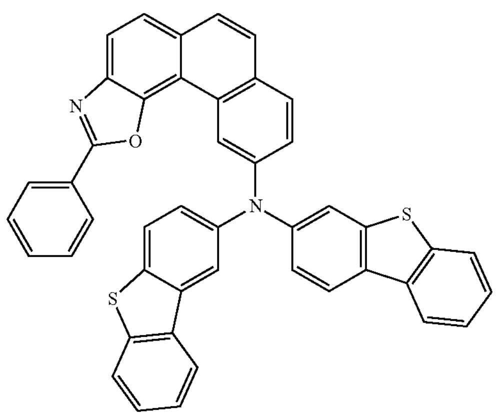
H-225
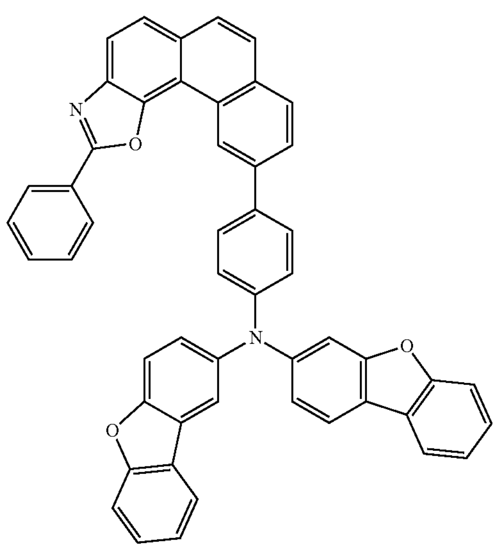
-continued
H-226
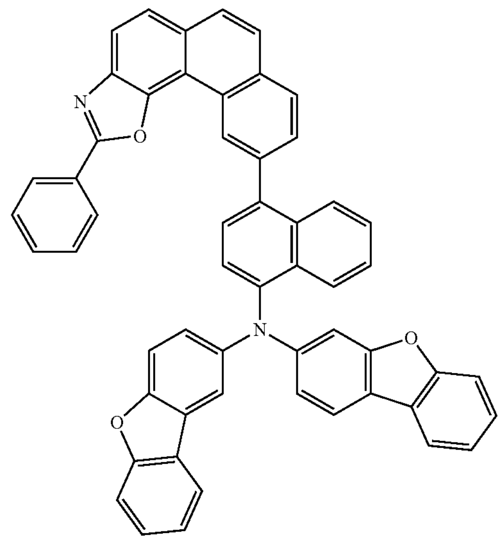
H-227
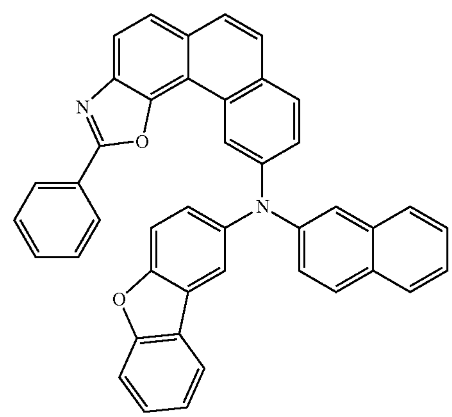
H-228
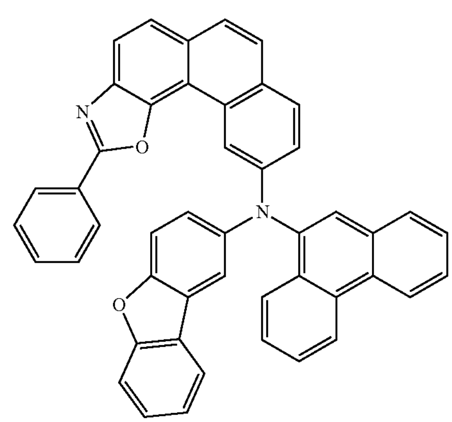

H-229
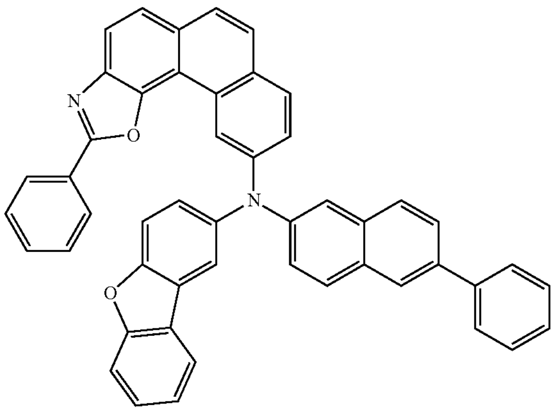
H-230
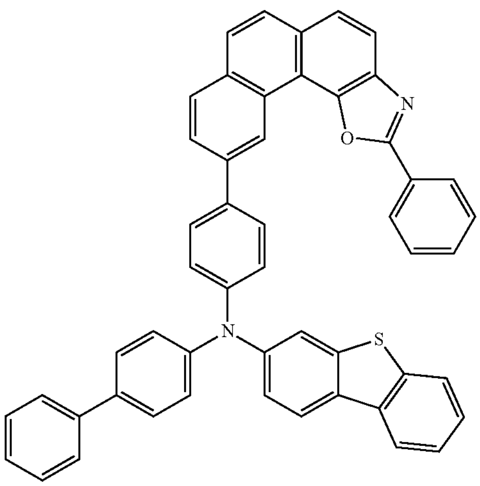
H-231
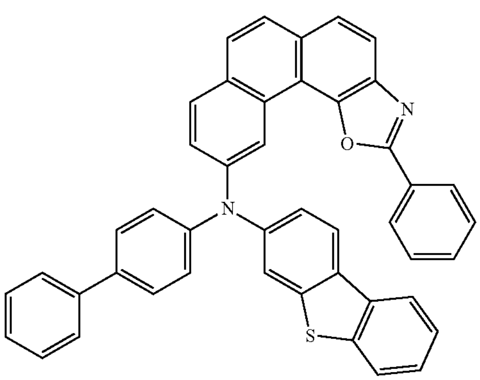
H-232
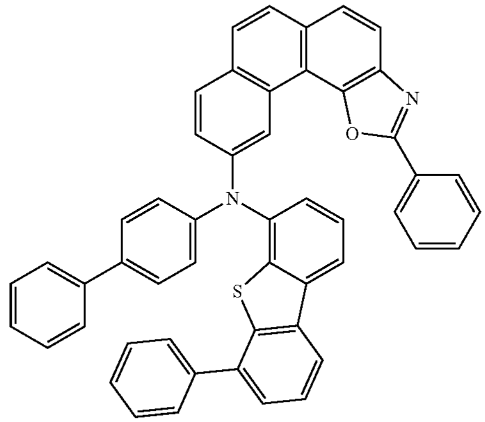
H-233
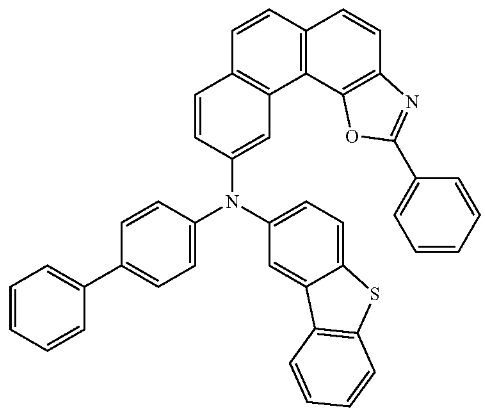
H-234
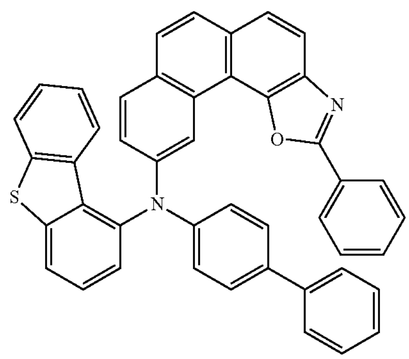
H-235
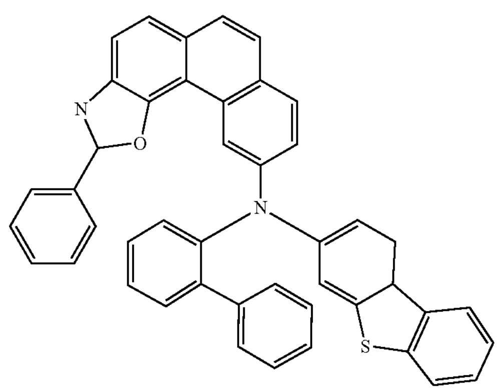

-continued

H-236

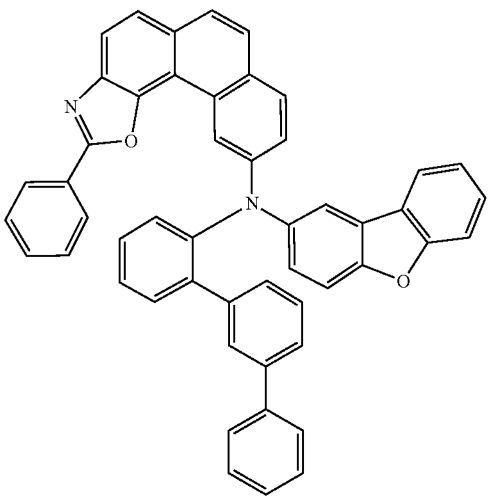

H-237

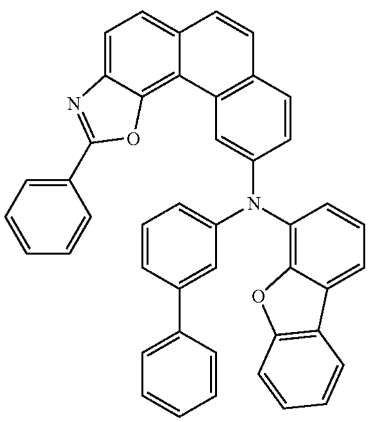

H-238

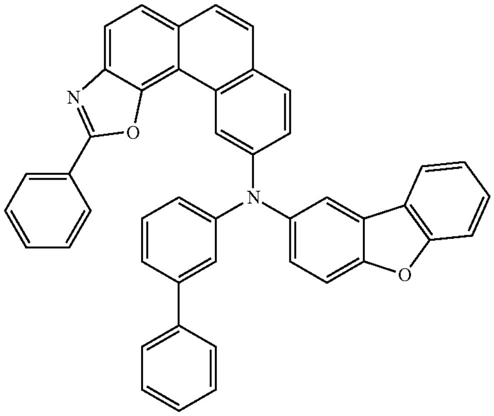

-continued

H-239

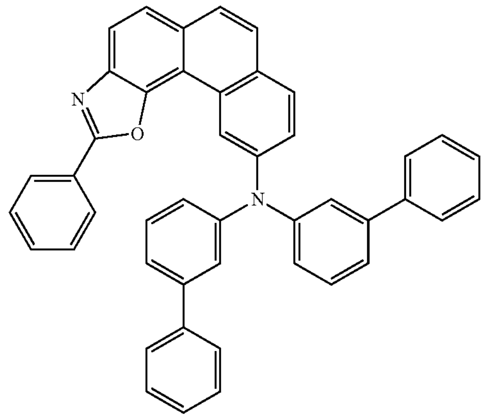

H-240

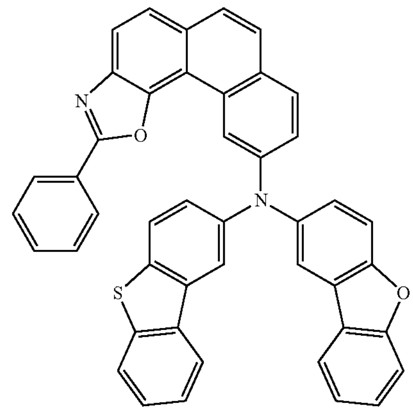

The compound of formula 2 according to the present disclosure may be produced by synthetic method known to a person skilled in the art, in specific, may be used synthetic methods disclosed in a number of patent documents. For example, the compound of formula 2 may be synthesized by referring to the disclosed method in KR 2017-0022865 A (Mar. 2, 2017), but is not limited thereto.

According to another one embodiment, the present disclosure provides the organic electroluminescent compound represented by the following formula 3-1.

(3-1)

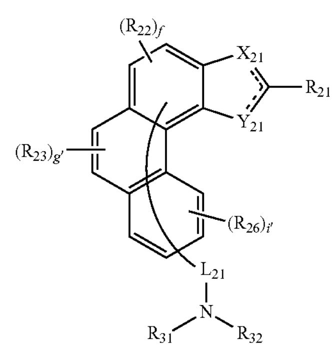

In formula 3-1, $X_{21}$, $Y_{21}$, $R_{21}$ to $R_{23}$, $R_{26}$, f, g', and i' are as defined in formulas 2-1 to 2-5;

$L_{21}$ represents a single bond or a substituted or unsubstituted (C6-C30)arylene; and $R_{31}$ and $R_{32}$ each independently represent a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; provided that, at least one of $R_{31}$ and $R_{32}$ represent(s) a substituted or unsubstituted (3- to 30-membered)heteroaryl.

In one embodiment, in formula 3-1, when $X_{21}$ is —N═, $Y_{21}$ may be —O— or —S—, preferably, $X_{21}$ may be —N═, and $Y_{21}$ may be —O—.

In one embodiment, $L_{21}$ may be a single bond or a substituted or unsubstituted (C6-C25)arylene, preferably, a single bond or a substituted or unsubstituted (C6-C18) arylene. For example, $L_{21}$ may be a single bond or a substituted or unsubstituted phenylene, or a substituted or unsubstituted naphthylene.

In one embodiment, $R_{31}$ and $R_{32}$ each independently may be a substituted or unsubstituted (C6-C30)aryl or a substituted or unsubstituted (5- to 30-membered)heteroaryl, preferably, a substituted or unsubstituted (C6-C25)aryl or a substituted or unsubstituted (5- to 25-membered)heteroaryl, more preferably, a substituted or unsubstituted (C6-C18)aryl or a substituted or unsubstituted (5- to 18-membered)heteroaryl. Provided that at least one of $R_{31}$ and $R_{32}$ represent(s) a substituted or unsubstituted (3- to 30-membered)heteroaryl, e.g., $R_{31}$ and $R_{32}$ may be all a substituted or unsubstituted (3- to 30-membered)heteroaryl. For example, $R_{31}$ and $R_{32}$ each independently may be a substituted or unsubstituted p-biphenyl, a substituted or unsubstituted m-biphenyl, a substituted or unsubstituted o-biphenyl, a substituted or unsubstituted terphenyl, a substituted or unsubstituted naphthyl, a substituted or unsubstituted phenanthrenyl, a substituted or unsubstituted fluorenyl, a substituted or unsubstituted dibenzofuranyl, a substituted or unsubstituted dibenzothiophenyl, or a substituted or unsubstituted benzonaphthofuranyl.

According to one embodiment, the organic electroluminescent compound represented by formula 3-1 may be more specifically illustrated by the following compounds, but is not limited thereto.

H-181

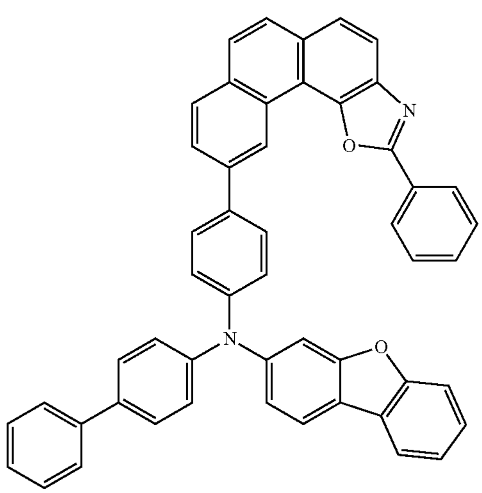

-continued

H-183

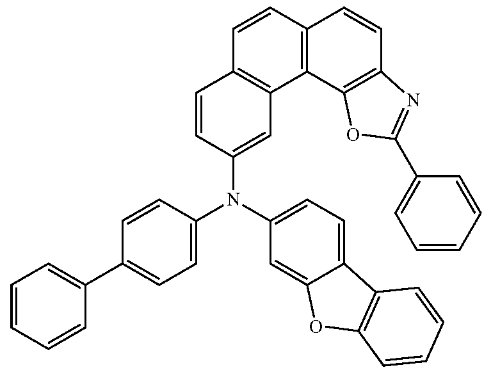

H-184

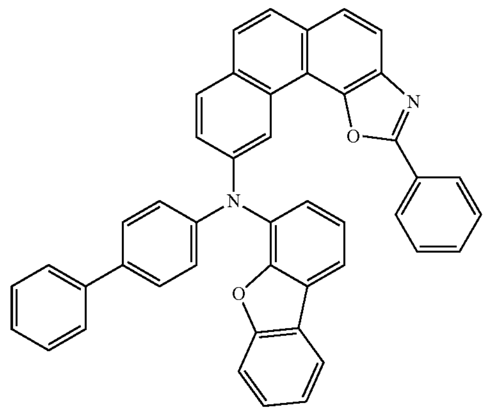

H-185

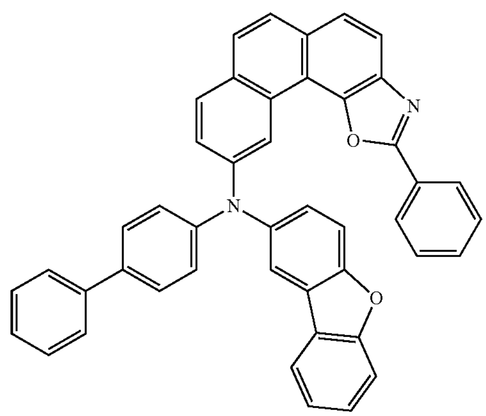

H-186

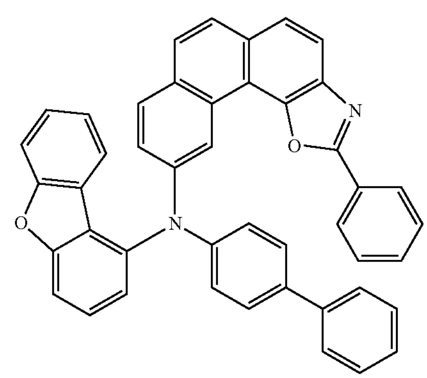

-continued
H-187
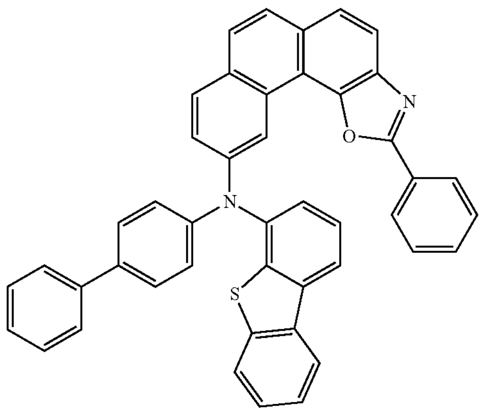
H-191
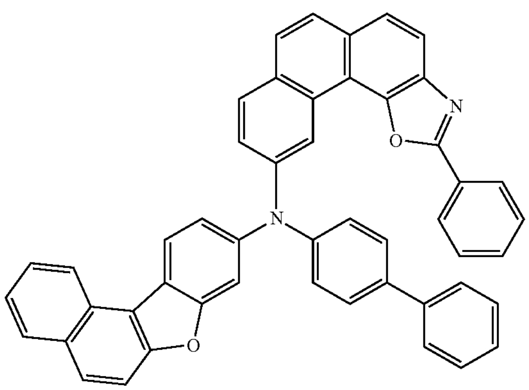
H-192
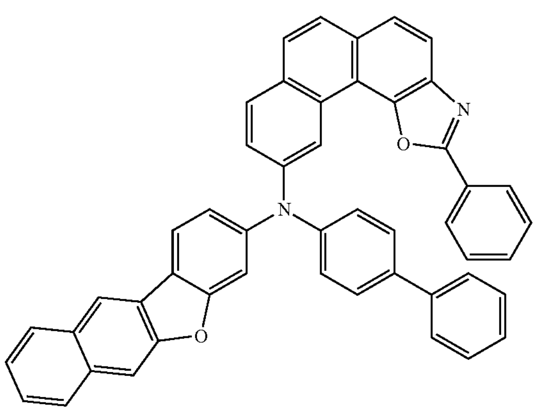
-continued
H-193
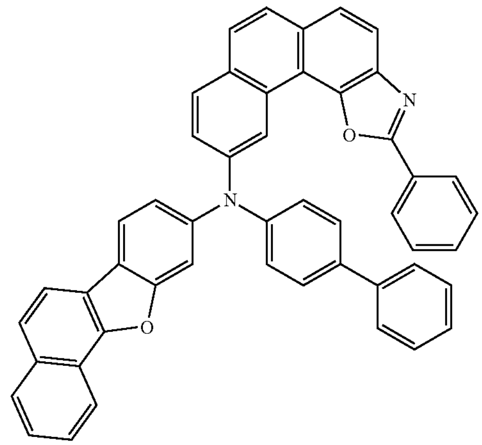
H-212
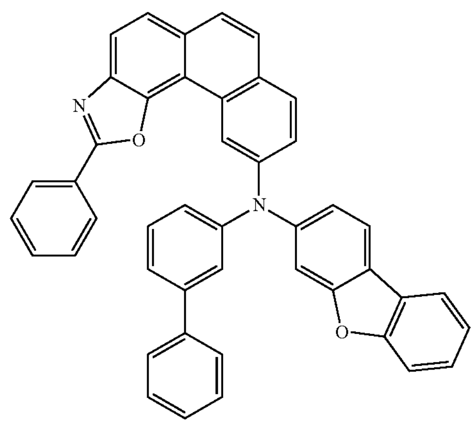
H-214
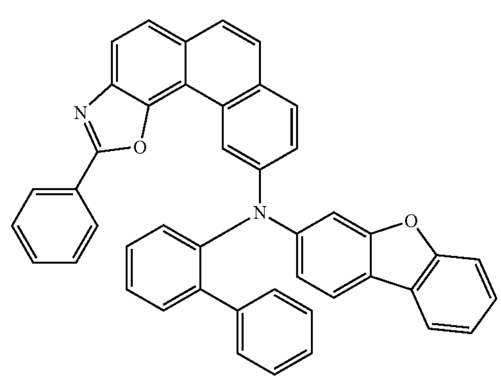

-continued
H-216
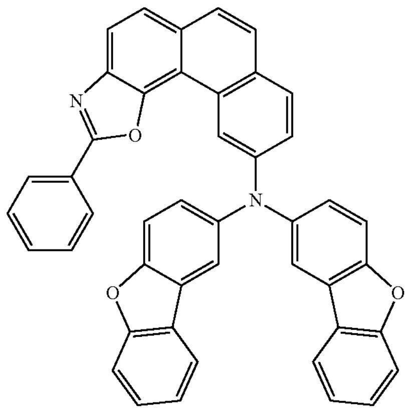
H-217
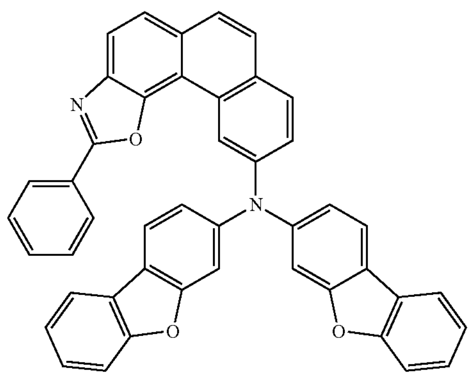
H-218
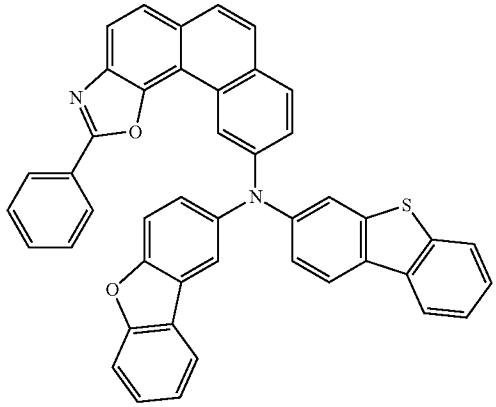
-continued
H-219
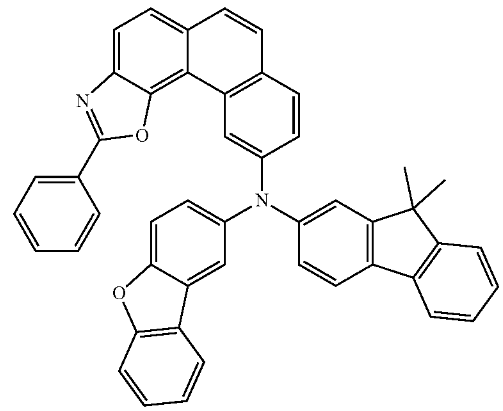
H-220
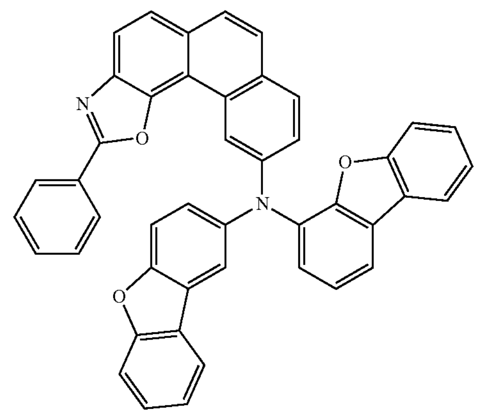
H-221
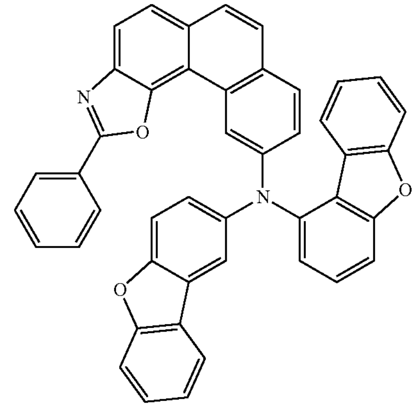

-continued
H-222
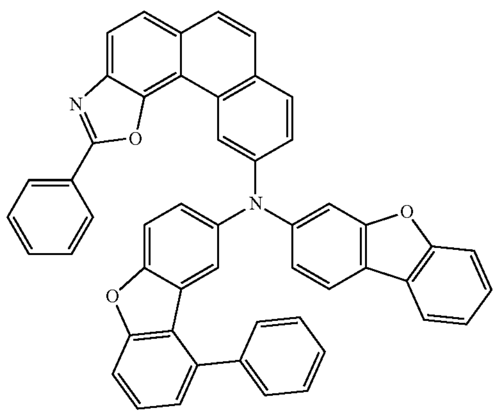
H-223
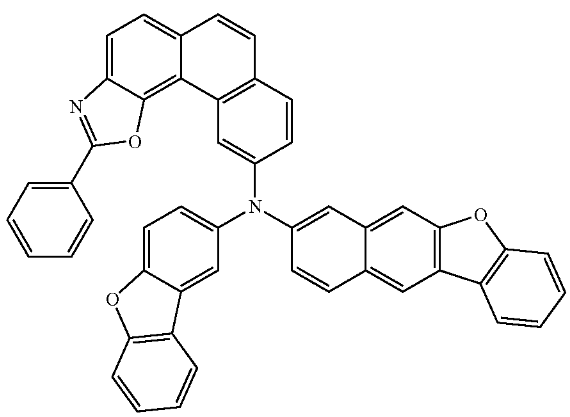
H-224
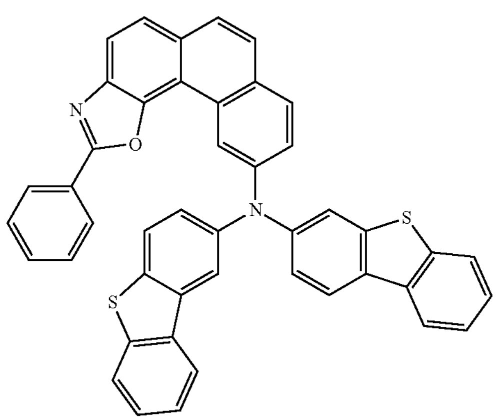
-continued
H-225
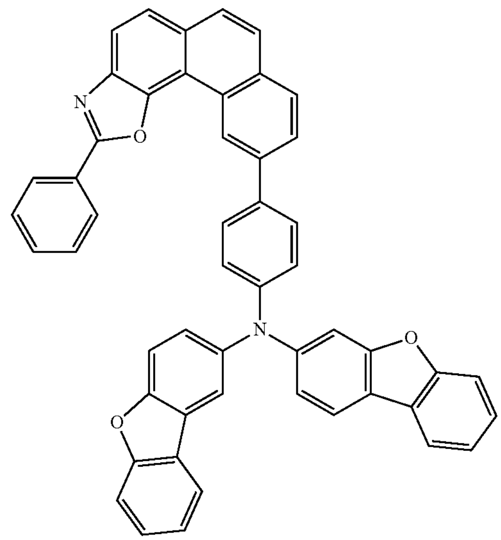
H-226
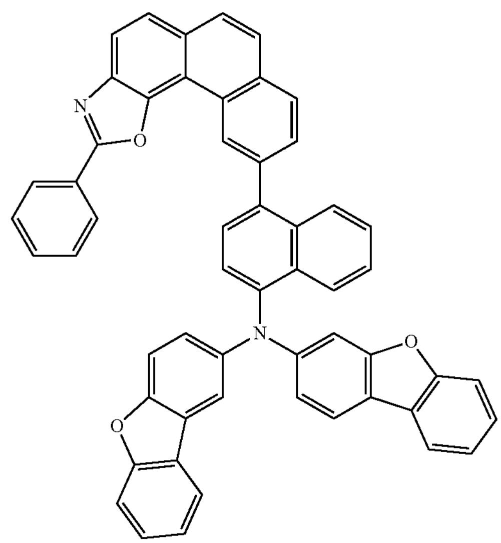
H-227
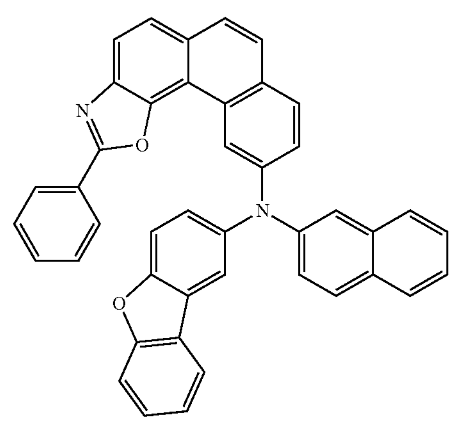

-continued
H-228
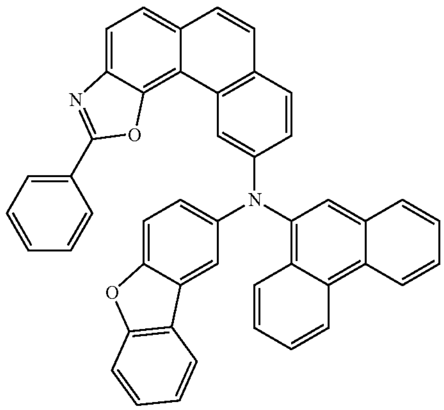
H-229
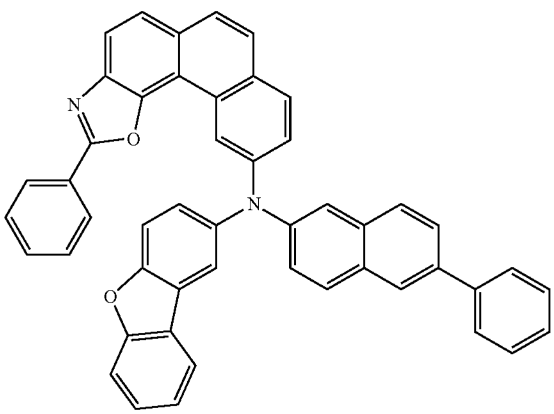
H-230
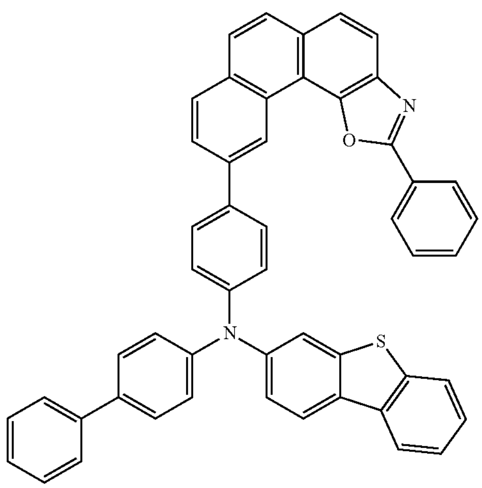
-continued
H-231
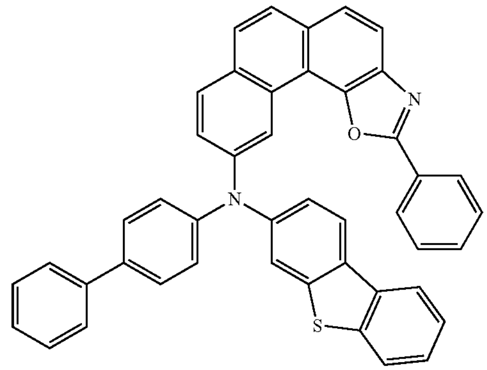
H-232
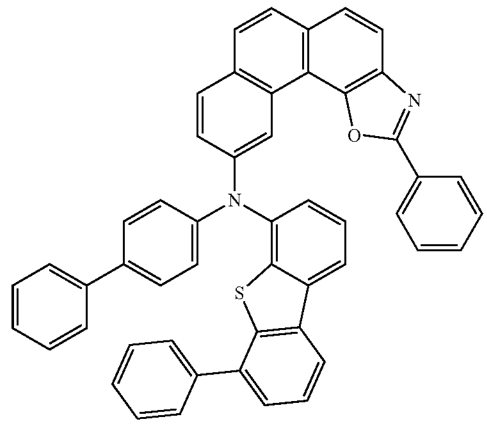
H-233
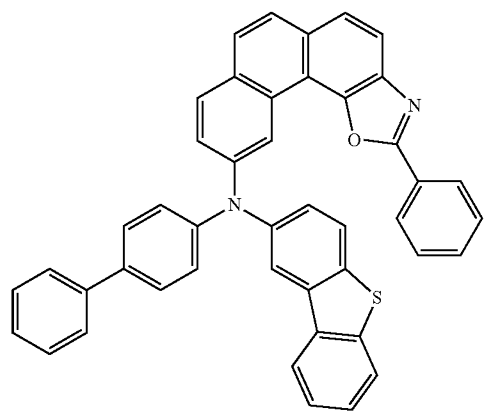
H-234
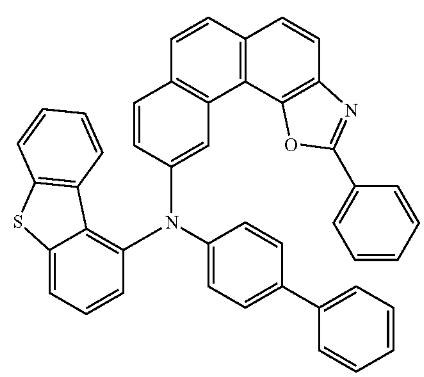

-continued

H-235

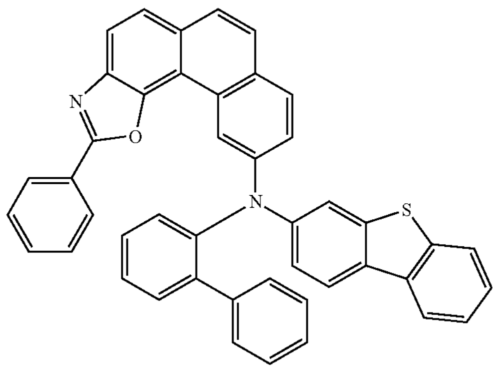

H-236

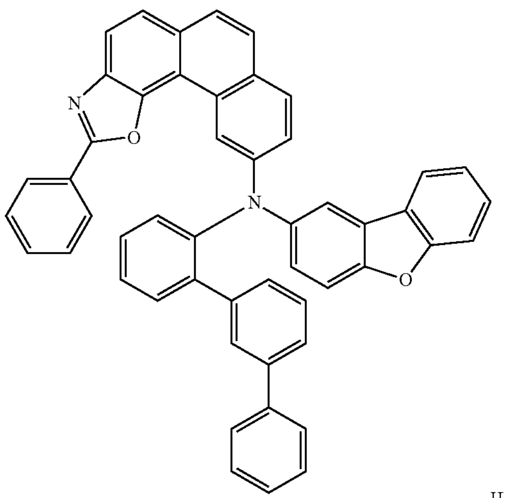

H-237

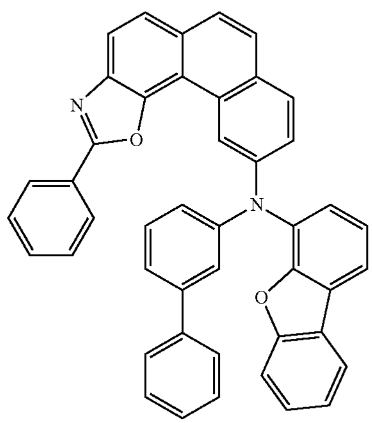

H-238

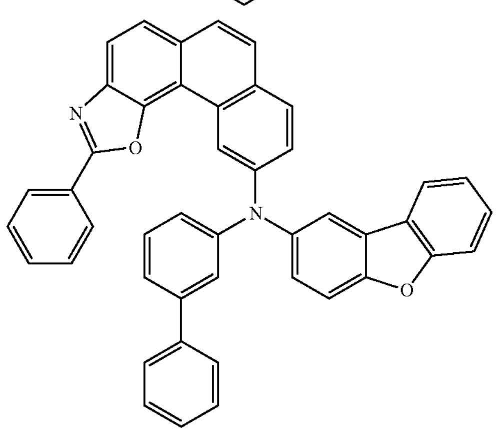

-continued

H-240

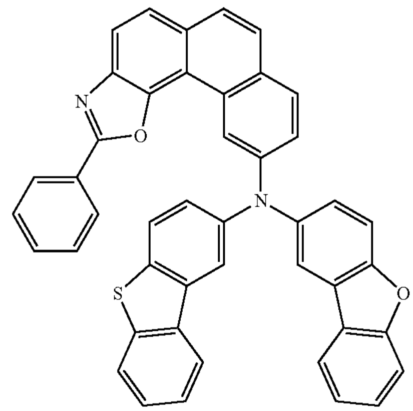

Hereinafter, an organic electroluminescent device being applied to the aforementioned plurality of host materials and the organic electroluminescent compound will be described.

The organic electroluminescent device according to one embodiment may comprise a first electrode; a second electrode; and at least one organic layer(s) between the first and second electrodes. According to one embodiment, a first host material comprising a compound represented by formula 1 and a second host material comprising a compound represented by formula 2 may be included in the same organic layer or may be included in the different organic layers, respectively.

The organic layer may comprise at least one light-emitting layer, and the light-emitting layer may comprise at least one first host material comprising a compound represented by formula 1 and at least one second host material comprising a compound represented by formula 2, or may comprise the organic electroluminescent compound represented by formula 3-1 as a sole. According to one embodiment, the light-emitting layer may comprise at least one compound(s) of compound C-1 to C-597 as a first host material represented by formula 1 and at least one compound(s) of compound H-1 to H-215 as a second host material represented by formula 2. According to another embodiment, the organic layer may comprise the organic electroluminescent compound represented by formula 3-1. For example, the compound of formula 3-1 may be included as a light-emitting layer material, or a hole transport layer material among the hole transport zone, of the organic electroluminescent device.

One of the first electrode and the second electrode may be an anode and the other may be a cathode. Wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode. The organic layer may comprise a light-emitting layer, and may further comprise at least one layer selected from a hole injection layer, a hole transport layer, a hole auxiliary layer, a light-emitting auxiliary layer, an electron transport layer, an electron injection layer, an interlayer, a hole blocking layer, an electron blocking layer, and an electron buffer layer.

The organic layer may further comprise an amine-based compound and/or an azine-based compound other than the light-emitting material according to the present disclosure.

Specifically, the hole injection layer, the hole transport layer, the hole auxiliary layer, the light-emitting layer, the light-emitting auxiliary layer, or the electron blocking layer may contain the amine-based compound, e.g., an arylamine-based compound and a styrylarylamine-based compound, etc., as a hole injection material, a hole transport material, a hole auxiliary material, a light-emitting material, a light-emitting auxiliary material, or an electron blocking material. Also, the electron transport layer, the electron injection layer, the electron buffer layer, or the hole blocking layer may contain the azine-based compound as an electron transport material, an electron injection material, an electron buffer material, or a hole blocking material. Also, the organic layer may further comprise at least one metal selected from the group consisting of metals of Group 1, metals of Group 2, transition metals of the $4^{th}$ period, transition metals of the $5^{th}$ period, lanthanides, and organic metals of the d-transition elements of the Periodic Table, or at least one complex compound comprising such a metal.

A plurality of host materials according to one embodiment may be used as light-emitting materials for a white organic light-emitting device. The white organic light-emitting device has suggested various structures such as a parallel side-by-side arrangement method, a stacking arrangement method, or CCM (color conversion material) method, etc., according to the arrangement of R (Red), G (Green), B (blue), or YG (yellowish green) light-emitting units. In addition, a plurality of host materials according to one embodiment may also be applied to the organic electroluminescent device comprising a QD (quantum dot).

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. Also, the hole injection layer may be doped as a p-dopant. Also, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole transport layer or the electron blocking layer may be multi-layers, and wherein each layer may use a plurality of compounds.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both electrode(s). Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_X(1 \le X \le 2)$, $AlO_X(1 \le X \le 1.5)$, SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

In addition, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. Also, a reductive dopant layer may be employed as a charge generating layer to prepare an organic electroluminescent device having two or more light-emitting layers and emitting white light.

The light-emitting layer according to one embodiment is a layer from which light is emitted, and can be a single layer or a multi-layer of which two or more layers are stacked. The light-emitting layer may further comprise one more dopant, and the doping concentration of the dopant compound with respect to the host compound of the light-emitting layer may be less than 20 wt %, preferably may be less than 10 wt %.

The dopant comprised in the organic electroluminescent material of the present disclosure may be at least one phosphorescent or fluorescent dopant, preferably a phosphorescent dopant. The phosphorescent dopant material applied to the organic electroluminescent device of the present disclosure is not particularly limited, but may be preferably a metallated complex compound(s) of a metal atom(s) selected from iridium (Ir), osmium (Os), copper (Cu), and platinum (Pt), more preferably an ortho-metallated complex compound(s) of a metal atom(s) selected from iridium (Ir), osmium (Os), copper (Cu), and platinum (Pt), and even more preferably ortho-metallated iridium complex compound(s).

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used. When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

When forming a layer, the first and second host materials according to one embodiment may be used by the methods listed above, preferably, co-evaporation or mixture-evaporation. The co-deposition is a mixed deposition method in which two or more isomer materials are put into respective individual crucible sources and a current is applied to both cells simultaneously to evaporate the materials and to perform mixed deposition; and the mixed deposition is a mixed deposition method in which two or more isomer materials are mixed in one crucible source before deposition, and then a current is applied to one cell to evaporate the materials.

According to one embodiment, when the first host material and the second host material are present in the same layer or different layers in the organic electroluminescent device, each of the two host materials may be deposited individually. For example, the second host material may be deposited after the first host material is deposited.

According to one embodiment, the present disclosure can provide display devices such as smartphones, tablets, notebooks, PCs, TVs, or display devices for vehicles, or lighting devices such as outdoor or indoor lighting, by using a plurality of host materials comprising the compound represented by formula 1 and the compound represented by formula 2.

Hereinafter, the preparation method of compound according to the present disclosure and the properties thereof will be explained with reference to the synthesis method of a representative compound or an intermediate compound in order to understand the present disclosure in detail.

Example 1

Synthesis of Compound H-216

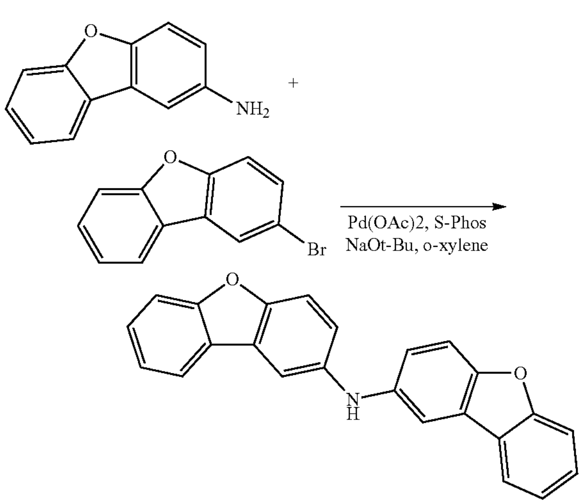

1

-continued

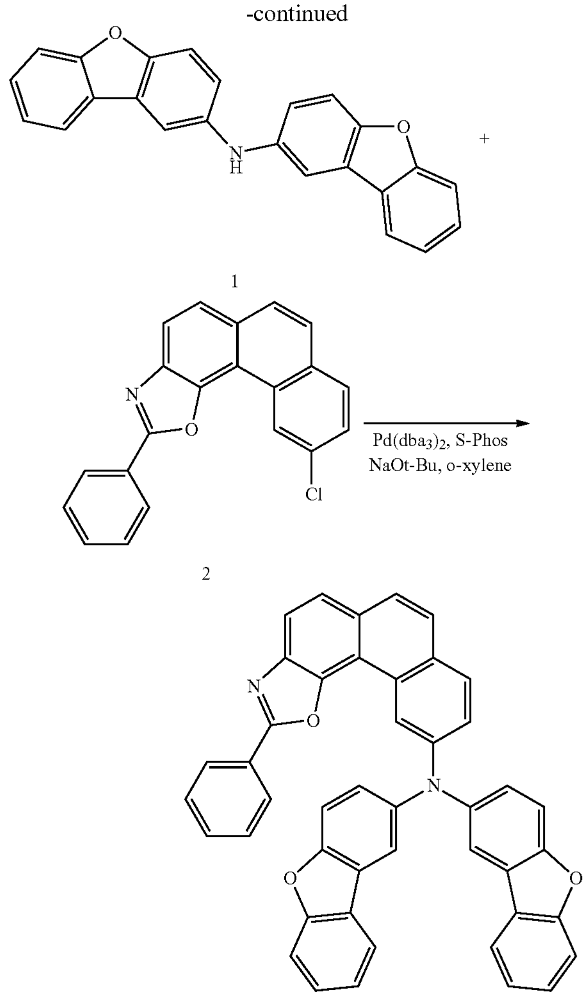

H-216

1) Synthesis of Compound 1

Dibenzofuran-2-amine (20 g, 144.7 mmol), 2-bromodibenzofuran (23.8 g, 96.47 mmol), Pd(OAc)2 (1.1 g, 4.82 mmol), S-Phos (3.9 g, 9.65 mmol), NaOt-Bu (13.9 g, 144.7 mmol), and 485 mL of o-xylene were added into a flask followed by stirring for 3 hours at 160° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound 1 (4.9 g, yield: 10%).

2) Synthesis of Compound H-216

Compound 1 (4.9 g, 12.76 mmol), compound 2 (4.2 g, 14.0 mmol), $Pd(dba_3)_2$ (0.584 g, 0.638 mmol), S-Phos (0.523 g, 1.276 mmol), NaOt-Bu (1.8 g, 19.14 mmol), and 65 mL of o-xylene were added into a flask followed by stirring for 2 hours at 160° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound H-216 (5.6 g, yield: 68.3%).

| | MW | M.P |
|---|---|---|
| H-216 | 642.19 | 237° C. |

Example 2

Synthesis of Compound H-183

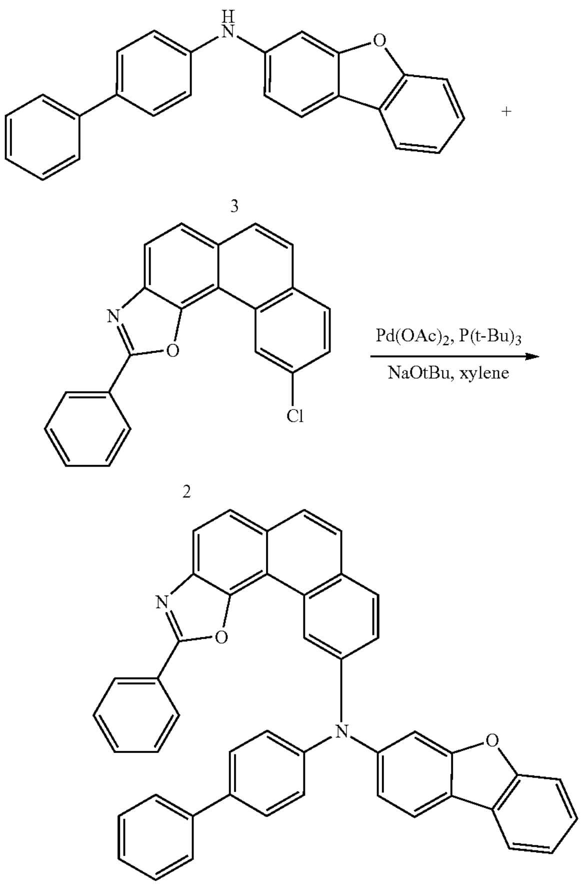

3

2

H-138

Compound 3 (25 g, 74.48 mmol), compound 2 (42.58 g, 81.93 mmol), $Pd(OAc)_2$ (0.16 g, 7.5 mmol), $P(t-Bu)_3$ (0.28 g, 7.5 mmol), NaOt-Bu (14.31 g, 150 mmol), and 284.09 mL of o-xylene were added into a flask followed by stirring for 2 hours at 160° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound H-183 (23.4 g, yield: 50%).

| | MW | M.P |
|---|---|---|
| H-183 | 628.22 | 256.5° C. |

Example 3

Synthesis of Compound H-231

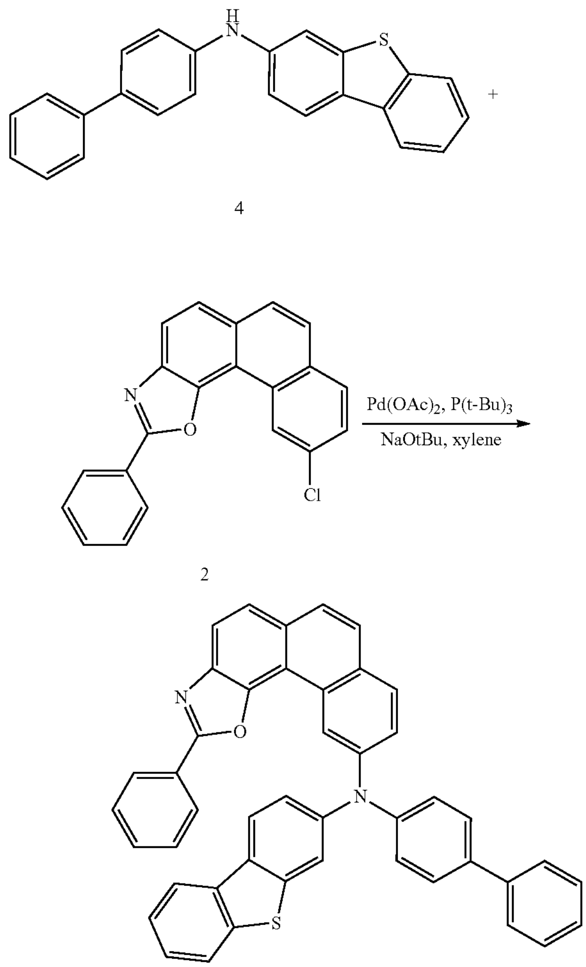

4

2

H-231

Compound 4 (20 g, 56.96 mmol), compound 2 (18.8 g, 57.13 mmol), $Pd(OAc)_2$ (0.13 g, 5.7 mmol), $P(t-Bu)_3$ (0.22 g, 5.7 mmol), NaOt-Bu (11 g, 113.92 mmol), and 227.27 mL of o-xylene were added into a flask followed by stirring for 2 hours at 160° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound H-231 (12.5 g, yield: 34%).

| | MW | M.P |
|---|---|---|
| H-231 | 644.19 | 249° C. |

Example 4

Synthesis of Compound C-5

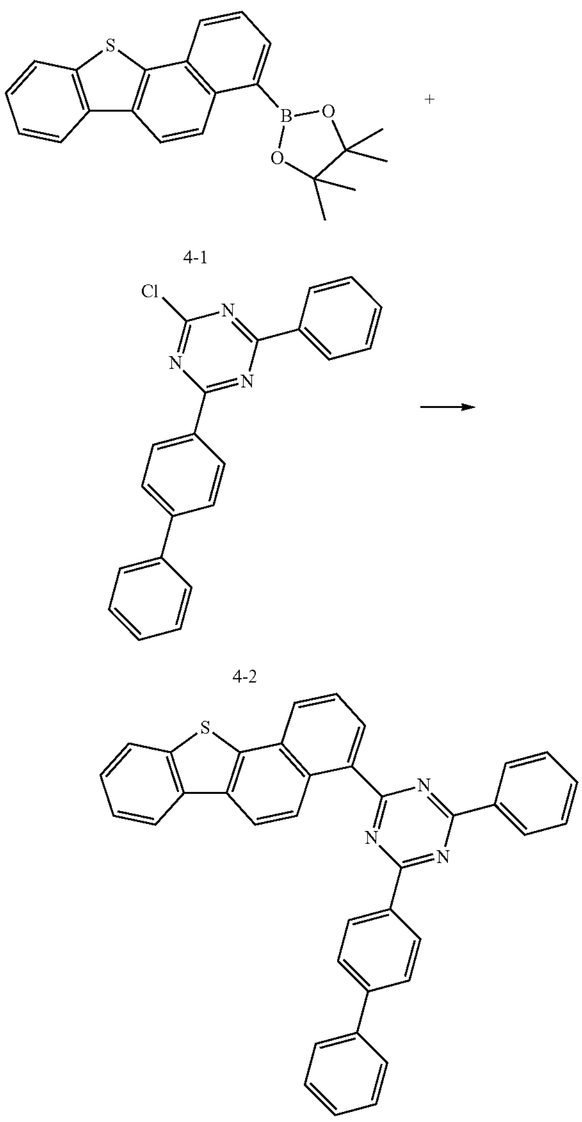

4-1

4-2

C-5

Compound 4-1 (4.0 g, 11.1 mmol), compound 4-2 (4.6 g, 13.3 mmol), $Pd(PPh_3)_4$ (0.6 g, 0.56 mmol), $K_2CO_3$ (3.1 g, 22.2 mmol), 5.0 mL of EtOH, 40 mL of toluene, and 11 mL of distilled water were added into a flask followed by refluxing for 6 hours. After completion of the reaction, the mixture was cooled to room temperature and stirred, and then the solid obtained by adding to methanol (MeOH) was filtered under reduced pressure. Thereafter the reaction mixture was purified by column chromatography with MC/Hex to obtain compound C-5 (4.9 g, yield: 81%).

| | MW | M.P |
|---|---|---|
| C-5 | 541.7 | 280° C. |

Example 5

Synthesis of Compound C-146

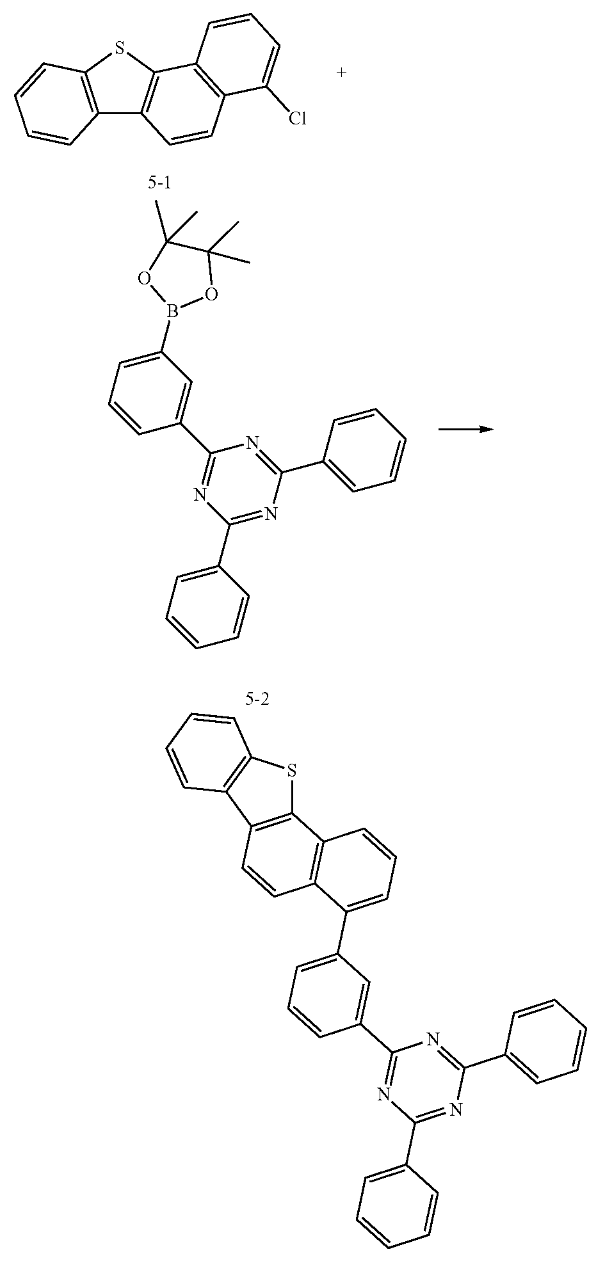

5-1

5-2

C-146

Compound 5-1 (4.0 g, 14.9 mmol), compound 5-2 (7.1 g, 16.4 mmol), $Pd_2(dba)_3$ (0.7 g, 0.8 mmol), s-phos (0.6 g, 1.5 mmol), NaOt-Bu (3.5 g, 37.3 mmol) and 80 mL of o-xylene were added into a flask followed by refluxing for 6 hours. After completion of the reaction, the mixture was cooled to room temperature and stirred, and then the solid obtained by adding to MeOH was filtered under reduced pressure. Thereafter the reaction mixture was purified by column chromatography with MC/Hex to obtain compound C-146 (3.6 g, yield: 45%).

| | MW | M.P |
|---|---|---|
| C-146 | 541.7 | 261° C. |

Example 6

Synthesis of Compound C-160

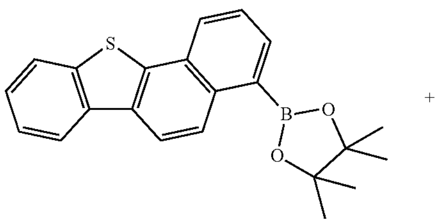

4-1

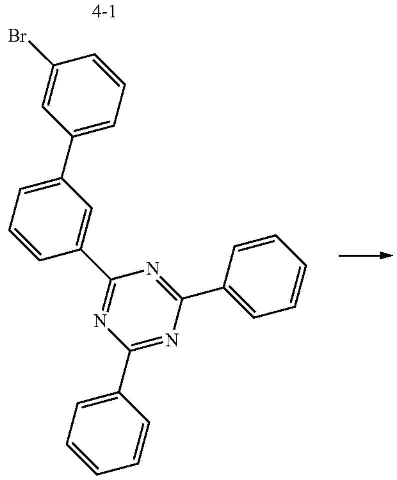

6-2

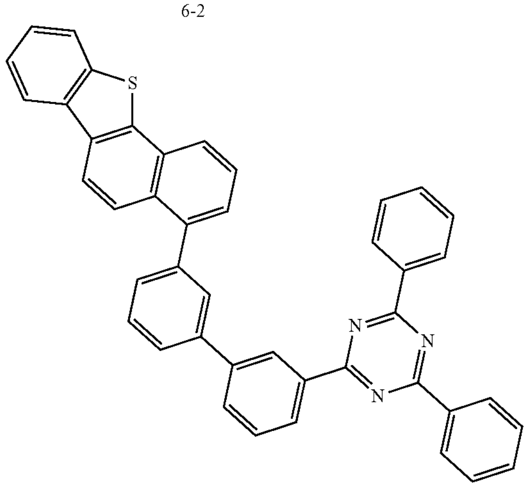

C-160

Compound 4-1 (4.5 g, 12.49 mmol), compound 6-2 (6.6 g, 14.20 mmol), tetrakis(triphenylphosphine)palladium(0) ($Pd(PPh_3)_4$) (0.4 g, 0.34 mmol), sodium carbonate (3.0 g, 28.38 mmol), 55 mL of toluene, 14 mL of ethanol, and 14 mL of distilled water were added into a flask followed by stirring for 4 hours at 130° C. After completion of the reaction, the deposited solid was washed with distilled water and methanol. Thereafter the reaction mixture was purified by column chromatography to obtain compound C-160 (3.9 g, yield: 51%).

| | MW | M.P |
|---|---|---|
| C-160 | 617.7 | 268° C. |

Example 7

Synthesis of Compound C-230

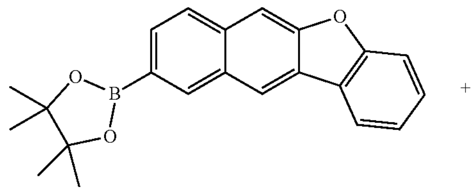

7-1

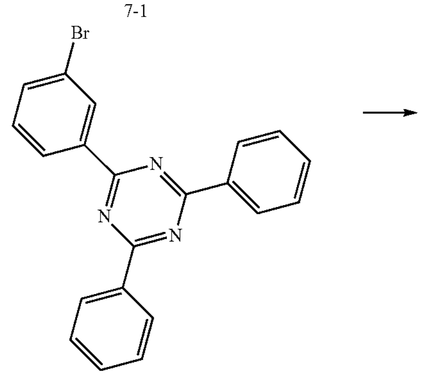

7-2

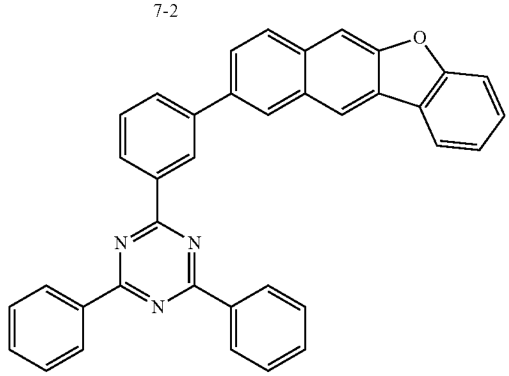

C-230

Compound 7-1 (4.5 g, 13.07 mmol), compound 7-2 (5 g, 13.07 mmol), $Pd(PPh_3)_4$ (0.75 g, 0.653 mmol), potassium carbonate (5.4 g, 39.22 mmol), 80 mL of toluene, 20 mL of ethanol, and 20 mL of water were added into a flask followed by refluxing for 2 hours. After completion of the reaction, the mixture was cooled to room temperature and MeOH added to dropwise thereto, and then the resulting solid was filtered under reduced pressure. Thereafter the reaction mixture was dissolved in dimethyl chloride and purified by column chromatography to obtain compound C-230 (3.7 g, yield: 53%).

| | MW | M.P |
|---|---|---|
| C-230 | 525.6 | 272° C. |

Example 8

Synthesis of Compound C-167

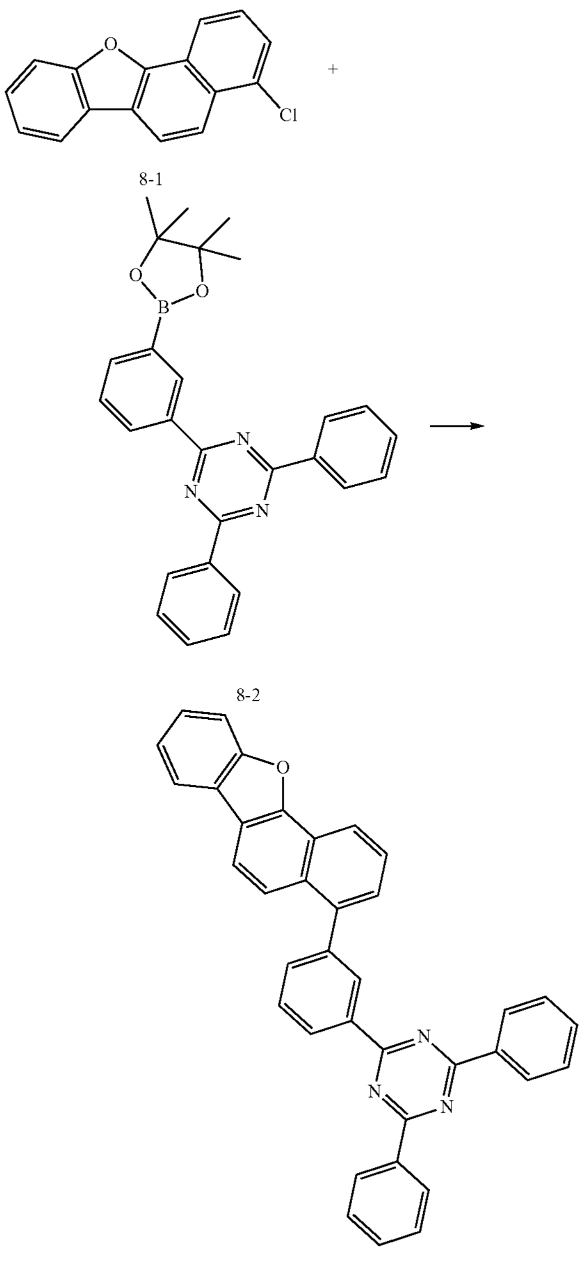

Compound 8-1 (5 g, 19.03 mmol), compound 8-2 (9.1 g, 20.94 mmol), $Pd_2(dba)_3$ (0.88 g, 0.97 mmol), s-phos (0.79 g, 1.93 mmol), NaOt-Bu (4.63 g, 48.3 mmol), and 100 mL of o-xylene were added into a flask and dissolved followed by refluxing for 4 hours. After completion of the reaction, the organic layer was extracted with ethyl acetate, and then was purified by column chromatography to obtain compound C-167 (5 g, yield: 50%).

| | MW | M.P |
|---|---|---|
| C-167 | 525.6 | 252.6° C. |

Example 9

Synthesis of Compound C-489

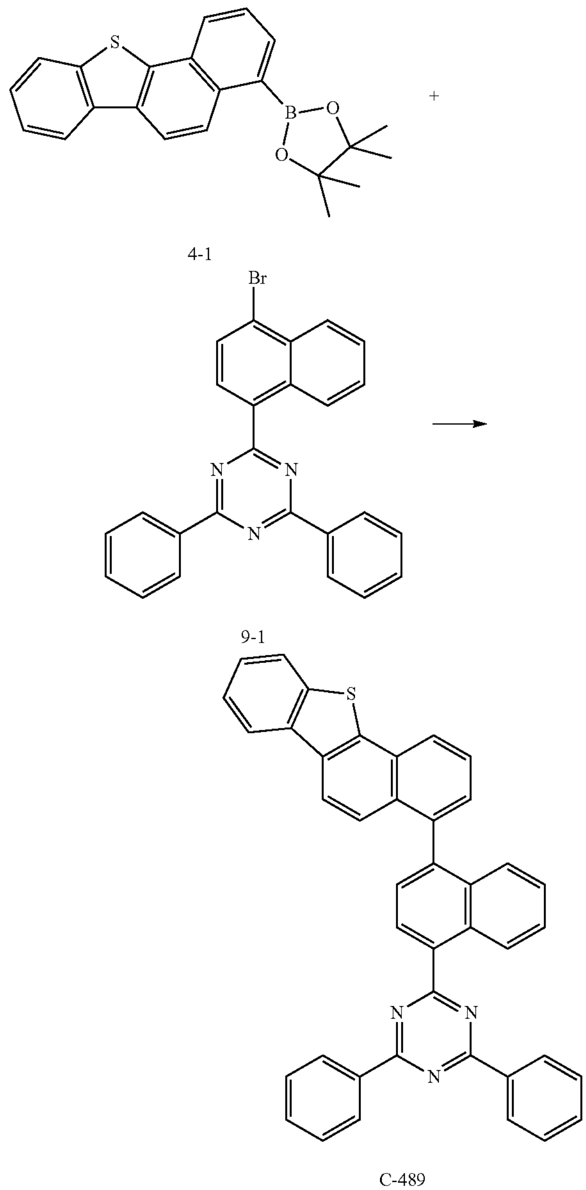

Compound 4-1 (5.0 g, 13.9 mmol), compound 9-1 (6.1 g, 13.9 mmol), $Pd(PPh_3)_4$ (0.8 g, 0.7 mmol), potassium carbonate (3.9 g, 27.8 mmol), 30 mL of toluene, 10 mL of ethanol, and 14 mL of distilled water were added into a flask followed by stirring for 5 hours at 130° C. After completion of the reaction, the deposited solid was washed with distilled water and methanol. Thereafter the reaction mixture was purified by column chromatography to obtain compound C-489 (3.6 g, yield: 44%).

| | MW | M.P |
|---|---|---|
| C-489 | 591.7 | 282.5° C. |

Example 10

Synthesis of Compound C-249

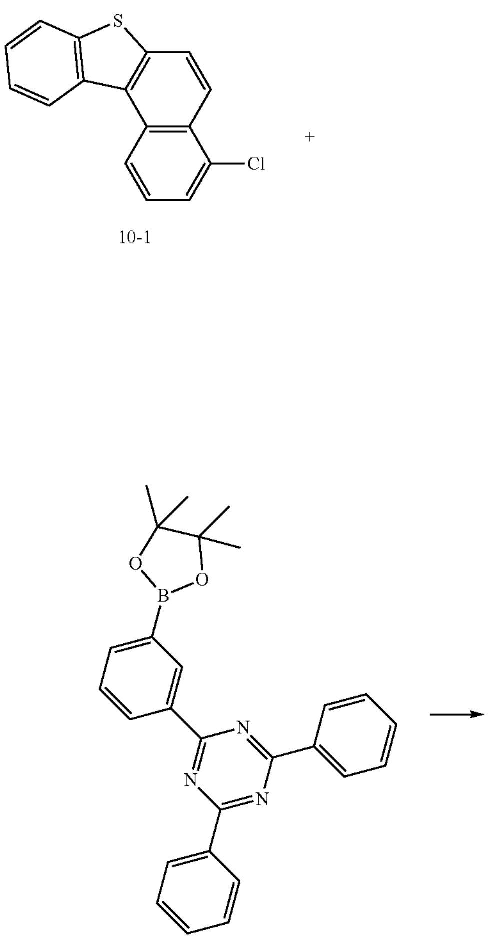

10-1

8-2

-continued

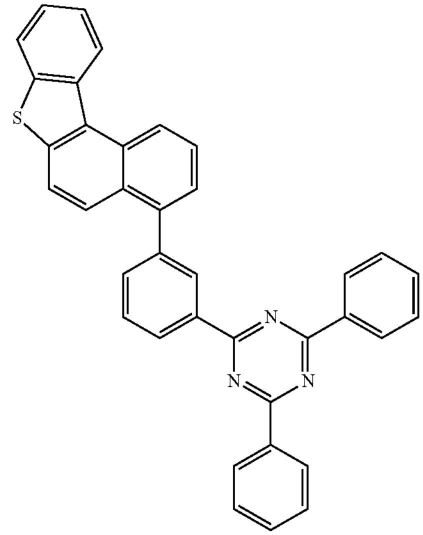

C-249

Compound 10-1 (4.0 g, 14.9 mmol), compound 8-2 (7.1 g, 16.4 mmol), $Pd_2(dba)_3$ (0.7 g, 0.74 mmol), s-phos (0.6 g, 1.49 mmol), NaOt-Bu (3.5 g, 37.3 mmol), and 80 mL of o-xylene were added into a flask followed by stirring for 5 hours at 165° C. After completion of the reaction, the mixture was cooled to room temperature, and the organic layer was extracted with ethyl acetate. The remaining water of the extracted organic layer was removed with magnesium sulfate and dried, and then the remaining solvent was removed with a rotary evaporator. Thereafter the reaction mixture was purified by column chromatography to obtain compound C-249 (4.2 g, yield: 81%).

| | MW | M.P |
|---|---|---|
| C-249 | 541.7 | 283° C. |

Example 11

Synthesis of Compound C-174

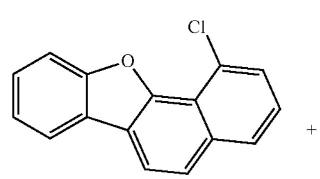

11-1

-continued

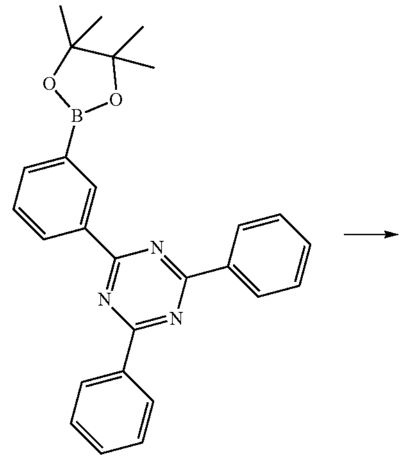

8-2

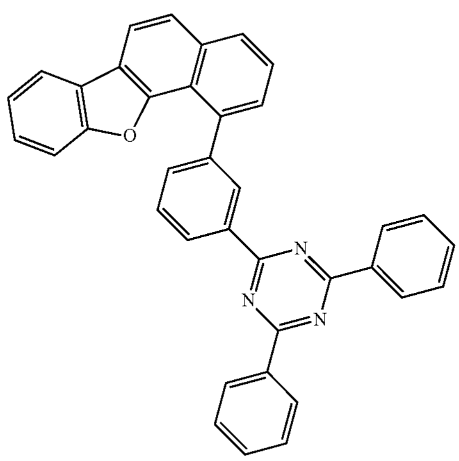

C-174

Compound 11-1 (6.0 g, 23.7 mmol), compound 8-2 (11.4 g, 26.1 mmol), $Pd_2(dba)_3$ (1.1 g, 1.2 mmol), s-phos (0.98 g, 2.4 mmol), potassium phosphate (12.6 g, 59.3 mmol), and 120 mL of o-xylene were added into a flask followed by stirring for 5 hours at 165° C. After completion of the reaction, the mixture was cooled to room temperature, and the organic layer was extracted with ethyl acetate. The remaining water of the extracted organic layer was removed with magnesium sulfate and dried, and then the remaining solvent was removed with a rotary evaporator. Thereafter the reaction mixture was purified by column chromatography to obtain compound C-174 (4.0 g, yield: 32%).

| | MW | M.P |
|---|---|---|
| C-174 | 525.6 | 244° C. |

Example 12

Synthesis of Compound C-582

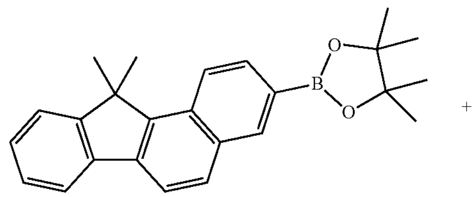

12-1

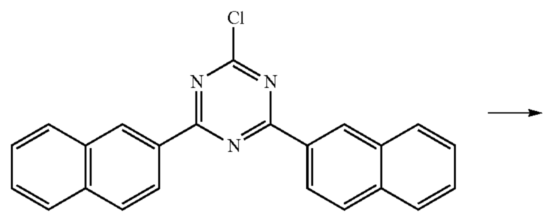

12-2

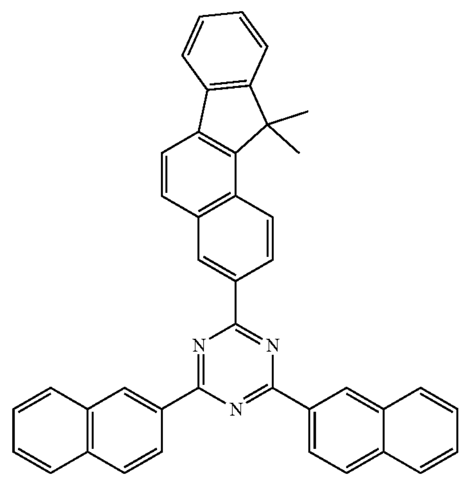

C-582

Compound 12-1 (4.23 g, 11.4 mmol), compound 12-2 (5.04 g, 13.7 mmol), $Pd(PPh_3)_4$ (0.66 g, 0.57 mmol), potassium carbonate (3.15 g, 22.8 mmol), 35 mL of toluene, 7 mL of ethanol, and 11 mL of distilled water were added into a flask followed by stirring for 15 hours at 130° C. After completion of the reaction, the deposited solid was washed with distilled water and methanol. Thereafter the reaction mixture was purified by column chromatography to obtain compound C-582 (4.5 g, yield: 69%).

| | MW | M.P |
|---|---|---|
| C-582 | 575.7 | 293° C. |

Example 13

Synthesis of Compound H-239

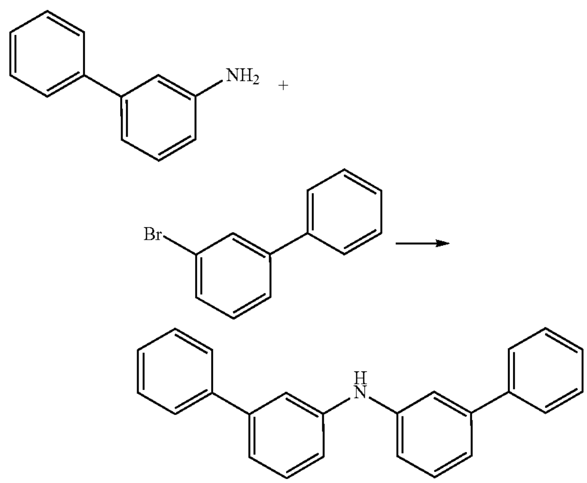

13-1

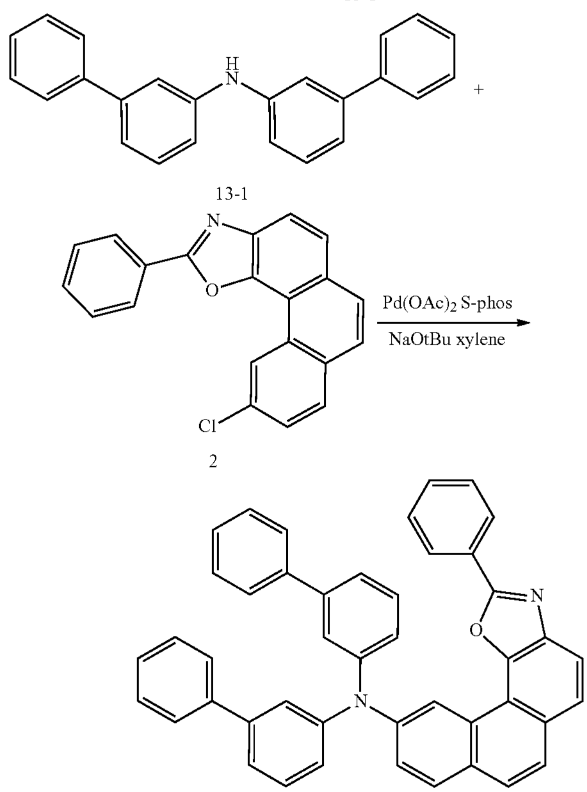

H-239

1) Synthesis of Compound 13-1

3-aminobiphenyl (54 g, 319 mmol), 3-bromobiphenyl (70 g, 301 mmol), $Pd(OAc)_2$ (0.33 g, 1.47 mmol), tricyclohexylphophine (0.84 g, 2.8 mmol), NaOt-Bu (57 g, 593 mmol), and 280 mL of toluene were added into a flask followed by stirring for 8 hours at 95° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound 13-1 (60.23 g, yield: 85%).

2) Synthesis of Compound H-239

Compound 13-1 (60.23 g, 187.5 mmol), compound 2 (60 g, 182.33 mmol), $Pd(OAc)_2$ (0.41 g, 1.83 mmol), S-phos (1.74 g, 4.23 mmol), NaOt-Bu (26.23 g, 272 mmol), and 300 mL of xylene were added into a flask followed by stirring for 10 hours at 110° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound H-239 (36.9 g, yield: 33%).

| | MW | M.P |
|---|---|---|
| H-239 | 614.24 | 210° C. |

Example 14

Synthesis of Compound H-240

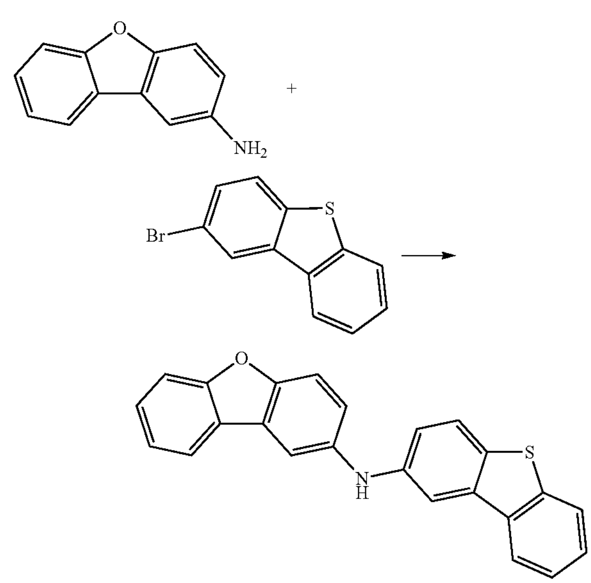

14-1

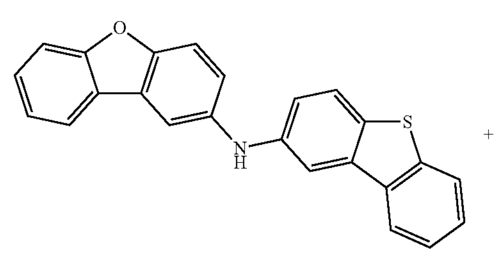

14-1

-continued

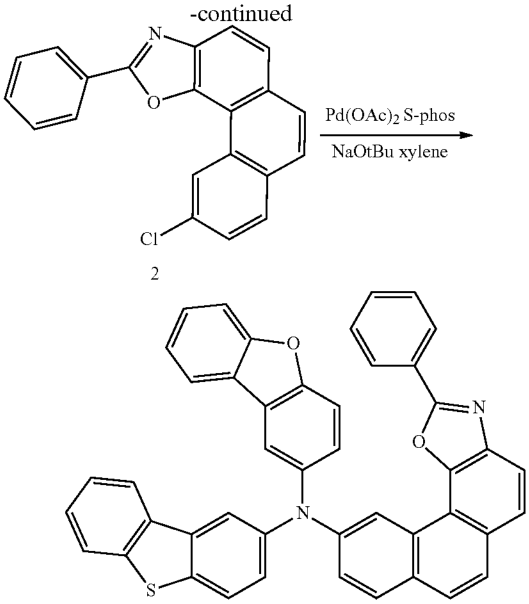

2

H-240

1) Synthesis of Compound 14-1

Dibenzofuran-2-amine (29.24 g, 159.7 mmol), 2-bromodibenzothiophene (40 g, 152.7 mmol), $Pd(OAc)_2$ (0.17 g, 0.75 mmol), tricyclohexylphophine (0.43 g, 1.45 mmol), NaOt-Bu (29.22 g, 304 mmol), and 250 mL of toluene were added into a flask followed by stirring for 8 hours 95° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound 14-1 (17.12 g, yield: 86%).

2) Synthesis of Compound H-240

Compound 14-1 (17.12 g, 46.89 mmol), compound 2 (15 g, 45.58 mmol), $Pd(OAc)_2$ (0.05 g, 0.22 mmol), S-phos (0.22 g, 0.535 mmol), NaOt-Bu (6.56 g, 68.2 mmol), and 75 mL of xylene were added into a flask followed by stirring for 10 hours at 110° C. After completion of the reaction, the mixture was cooled to room temperature, and the organic layer was extracted with ethyl acetate. The remaining water in the extracted organic layer was removed with magnesium sulfate and dried. Thereafter the reaction mixture was purified by column chromatography to obtain compound H-240 (10.2 g, yield: 34%).

| | MW | M.P |
|---|---|---|
| H-240 | 658.17 | 254° C. |

Example 15

Synthesis of Compound H-189

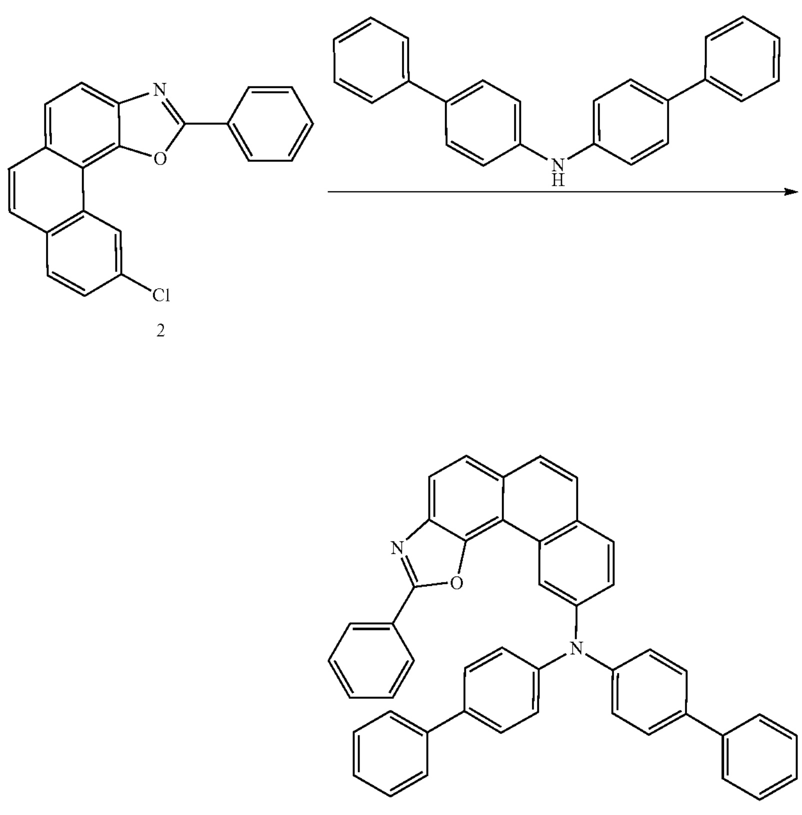

2

H-189

Compound 2 (5.0 g, 15.2 mmol), di([1,1'-biphenyl]-4-yl) amine (4.9 g, 15.2 mmol), $Pd(OAc)_2$ (0.2 g, 0.8 mmol), $P(t\text{-}Bu)_3$ (0.8 mL, 1.5 mmol), NaOt-Bu (2.9 g, 30.4 mmol), 76 mL of xylene were added into a flask followed by stirring for 5 hours at 160° C. After completion of the reaction, the mixture was cooled to room temperature, and the deposited solid was washed with distilled water and methanol. Thereafter the reaction mixture was purified by column chromatography to obtain compound H-189 (5.5 g, yield: 59%).

Example 16

Synthesis of Compound H-146

Compound 2 (4 g, 12 mmol), bis(biphenyl-4-yl)[4-(4,4,5,5-tetramethyl-[1,3,2]-dioxaborolan-2-yl)phenyl]amine (6.8 g, 13 mmol), $Pd(OAc)_2$ (0.3 g, 1 mmol), s-Phos (0.9 g, 2 mmol), $Cs_2CO_3$ (11.5 g, 35 mmol), 60 mL of o-xylene, 15 mL of EtOH, and 15 mL of distilled water were added into a flask followed by refluxing for 3 hours at 150° C. After completion of the reaction, the mixture was cooled to room temperature and washed with distilled water. The organic layer was extracted with ethyl acetate, and then the remaining water in the extracted organic layer was removed with magnesium sulfate and dried. Thereafter the reaction mixture was purified by column chromatography to obtain compound H-146 (2.2 g, yield: 27%).

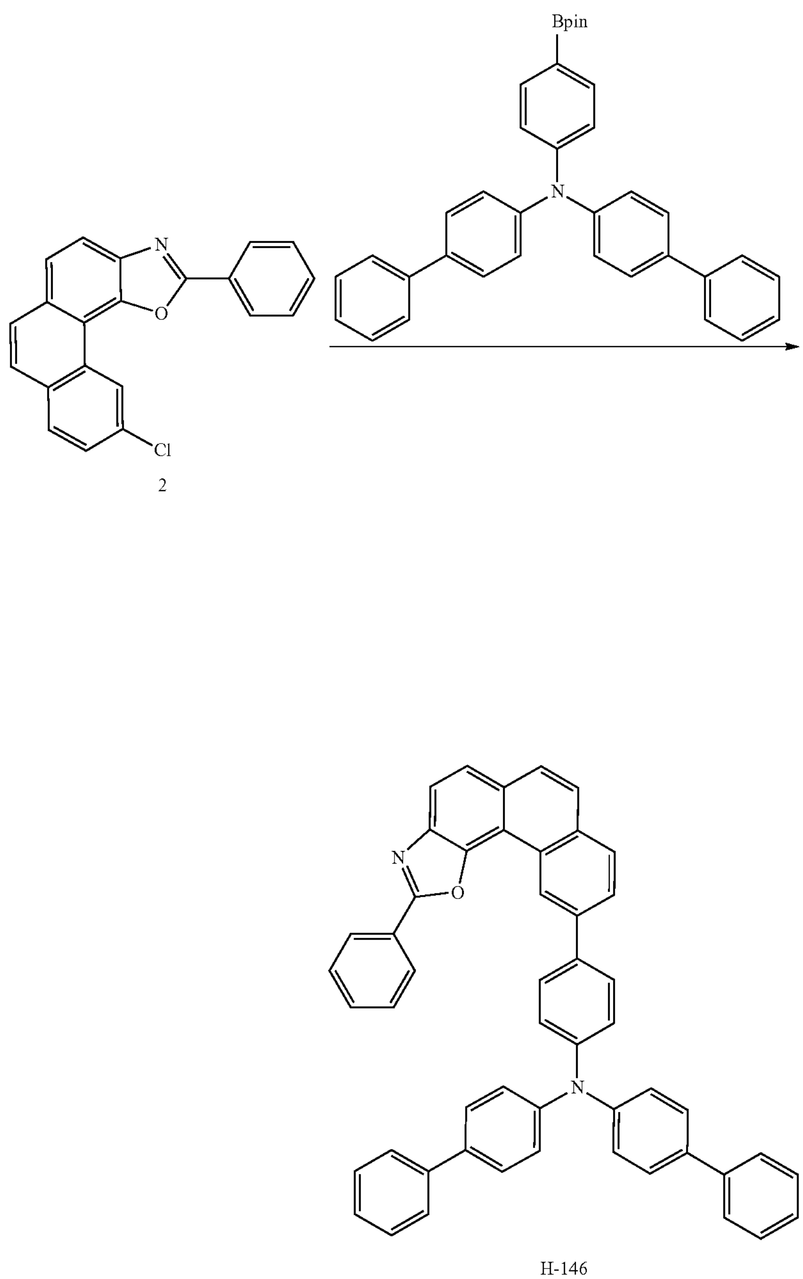

Example 17

Synthesis of Compound H-175

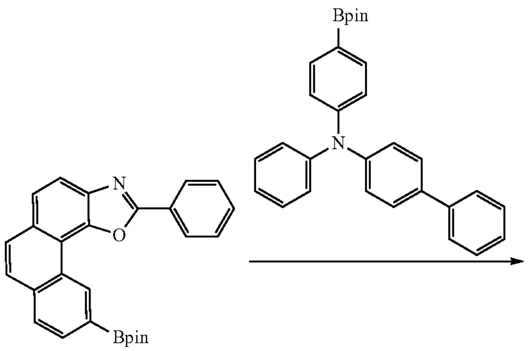

17

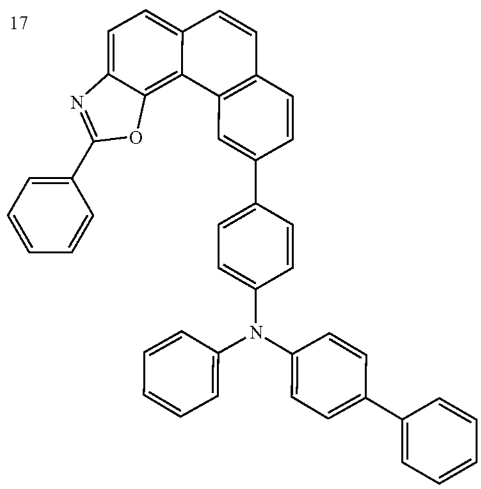

H-175

Compound 17 (4.8 g, 11.34 mmol), N-(4-bromophenyl)-N-phenyl-[1,1'-biphenyl]-4-amine (5 g, 12.47 mmol), $Pd(PPh_3)_4$ (0.4 g, 0.34 mmol), $Na_2CO_3$ (3.0 g, 28.35 mmol), 57 mL of toluene, 14 mL of EtOH, and 14 mL of distilled water were added into a flask followed by stirring for 4 hours at 120° C. After completion of the reaction, the mixture was added dropwise to methanol, and the resulting solid was filtered. Thereafter the resulting solid was purified by column chromatography to obtain H-175 (1.4 g, yield: 20.0%).

Example 18

Synthesis of Compound H-212

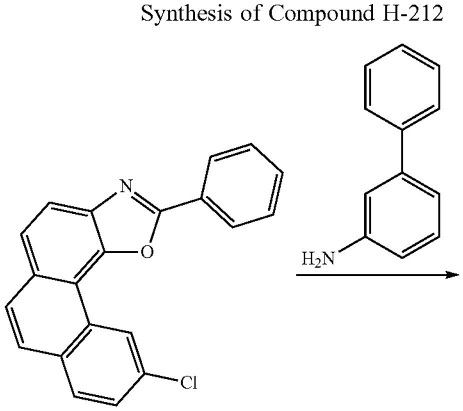

2

-continued

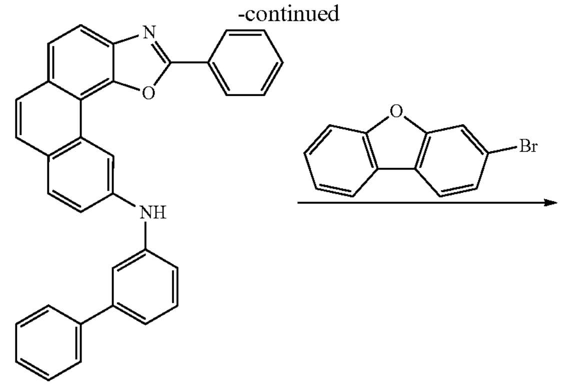

18-1

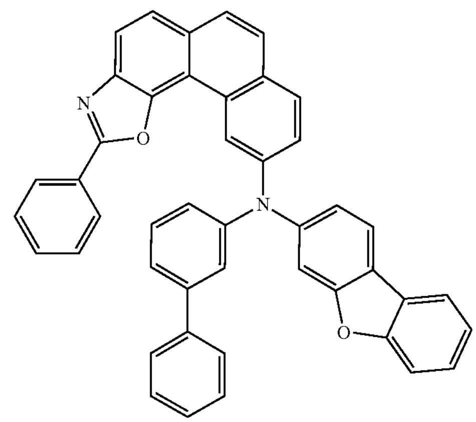

H-212

1) Synthesis of Compound 18-1

Compound 2 (10.0 g, 30.3 mmol), [1,1'-biphenyl]-3-amine (6.7 g, 39.4 mmol), $Pd(OAc)_2$ (0.34 g, 1.5 mmol), $P(t\text{-}Bu)_3$ (1.5 mL, 3.03 mmol), NaOt-Bu (5.8 g, 60.6 mmol), and 150 mL of xylene were added into a flask followed by stirring for 6 hours at 160° C. After completion of the reaction, the mixture was washed with distilled water and then the organic layer was extracted with ethyl acetate. The remaining water of the extracted organic layer was dried with magnesium sulfate, and then the remaining solvent was removed with a rotary evaporator. Thereafter the reaction mixture was purified by column chromatography to obtain compound 18-1 (10.8 g, yield: 36%).

2) Synthesis of Compound H-212

Compound 18-1 (5.0 g, 10.8 mmol), 3-bromo dibenzofuran (3.2 g, 12.9 mmol), $Pd_2(dba)_3$ (0.5 g, 0.54 mmol), S-Phos (0.45 g, 1.08 mmol), NaOt-Bu (2.0 g, 21.6 mmol), and 60 mL of o-xylene were added into a flask followed by stirring for 6 hours at 160° C. After completion of the reaction, the mixture was cooled to room temperature and then the organic layer was extracted with ethyl acetate. The remaining water in the extracted organic layer was removed with magnesium sulfate and dried. Thereafter the reaction mixture was purified by column chromatography to obtain compound H-212 (1.45 g, yield: 21%).

| | MW | M.P |
|---|---|---|
| H-212 | 628.73 | 205° C. |

Hereinafter, the preparation method and the properties of an organic electroluminescent device comprising a plurality of host materials according to the present disclosure will be explained in order to understand the present disclosure in detail.

Device Examples 1 and 2

Producing OLEDs in which a Plurality of Host Materials According to the Present Disclosure are Deposited as a Host OLEDs comprising the compounds according to the present disclosure were produced. First, a transparent electrode indium tin oxide (ITO) thin film (10 Ω/sq) on a glass substrate for an OLED device (GEOMATEC CO., LTD., Japan) was subject to an ultrasonic washing with acetone, trichloroethylene, acetone, ethanol, and distilled water, sequentially, and then was stored in isopropanol. The ITO substrate was then mounted on a substrate holder of a vacuum vapor deposition apparatus. Compound HI-1 was introduced into a cell of the vacuum vapor deposition apparatus, and then the pressure in the chamber of the apparatus was controlled to $10^{-6}$ torr. Thereafter, an electric current was applied to the cell to evaporate the above-introduced material, thereby forming a first hole injection layer having a thickness of 80 nm on the ITO substrate. Next, compound HI-2 was introduced into another cell of the vacuum vapor deposition apparatus, and was evaporated by applying an electric current to the cell, thereby forming a second hole injection layer having a thickness of 5 nm on the first hole injection layer. Compound HT-1 was then introduced into another cell of the vacuum vapor deposition apparatus, and was evaporated by applying an electric current to the cell, thereby forming a first hole transport layer having a thickness of 10 nm on the second hole injection layer. Compound HT-2 was then introduced into another cell of the vacuum vapor deposition apparatus, and was evaporated by applying an electric current to the cell, thereby forming a second hole transport layer having a thickness of 60 nm on the first hole transport layer. After forming the hole injection layers and the hole transport layers, a light-emitting layer was formed thereon as follows: The first and the second host materials of the following Table 1 were introduced into one cell of the vacuum vapor depositing apparatus as a host, and compound D-39 was introduced into another cell as a dopant. The two host materials were evaporated at a rate of 1:1 and simultaneously, the dopant was deposited in a doping amount of 3 wt % to form a light-emitting layer having a thickness of 40 nm on the hole transport layer. Next, compounds ET-1 and EI-1 were evaporated at a rate of 1:1, and were deposited to form an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, an OLED was produced.

Device Example 3

Producing an OLED in which a Plurality of Host Materials According to the Present Disclosure are Deposited as a Host OLED was produced in the same manner as in Device Example 1, except that a second hole transport layer having a thickness of 45 nm is deposited using compound HT-3, and an electron blocking layer having a thickness of 15 nm was deposited using compound EB-1 on the second hole transport layer.

Device Comparative Example 1 to 4

Producing OLEDs Comprising Comparative Compound as a Host

OLEDs were produced in the same manner as in Device Example 1, except that the compounds of the following Table 1 were used as the host of the light-emitting layer.

The results of the power efficiency at a luminance of 1,000 nits, and the time taken to reduce from 100% to 95% at a luminance of 5,000 nit (lifespan; T95), of the organic electroluminescent device of Device Examples 1 to 3 and Comparative Examples 1 to 4 produced as described above, are shown in the following Table 1.

TABLE 1

| | First Host Material | Second Host Material | Power Efficiency (lm/W) | Lifespan (T95, hr) |
|---|---|---|---|---|
| Device Example 1 | C-489 | H-183 | 30.1 | 323 |
| Device Example 2 | C-489 | H-212 | 33.0 | 649 |
| Device Example 3 | C-491 | H-189 | 30.9 | 430 |
| Device Comparative Example 1 | C-146 | — | 28.7 | 11 |
| Device Comparative Example 2 | C-491 | — | 25.9 | 19 |
| Device Comparative Example 3 | C-146 | A-1 | 29.4 | 76 |
| Device Comparative Example 4 | C-146 | A-2 | 29.5 | 14 |

From Table 1 above, it was confirmed that the organic electroluminescent device comprising a specific combination of compounds according to the present disclosure as a host material can show equal or higher efficiency and improved lifespan, compared with the organic electroluminescent device using a single host material (Device Comparative Examples 1 and 2) or using host materials in combination with a conventional host compound (Device Comparative Examples 3 and 4).

The compounds used in the Device Examples and Device Comparative Examples are shown in Table 2 below.

TABLE 2
Hole Injection Layer / Hole Transport Layer
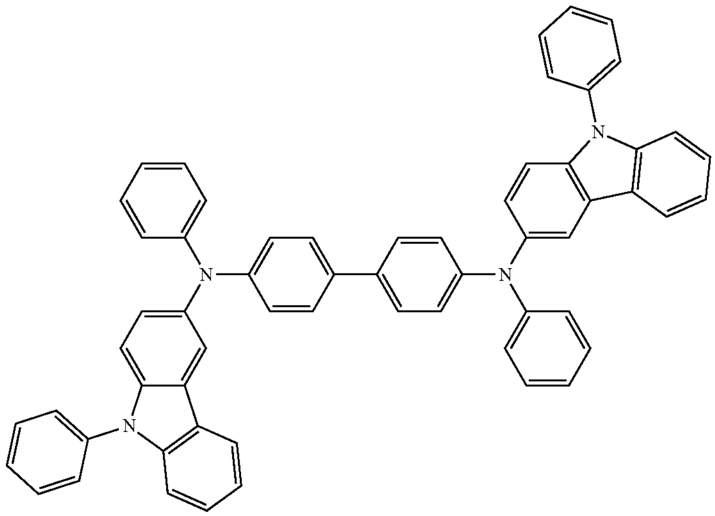
HI-1
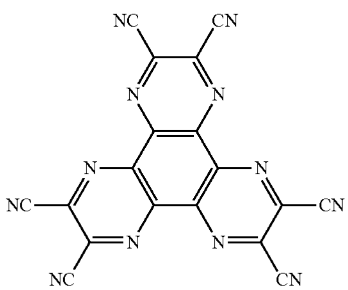
HI-2
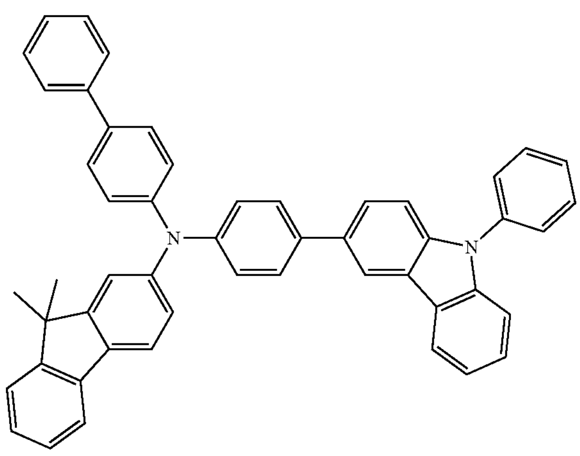
HT-1

TABLE 2-continued
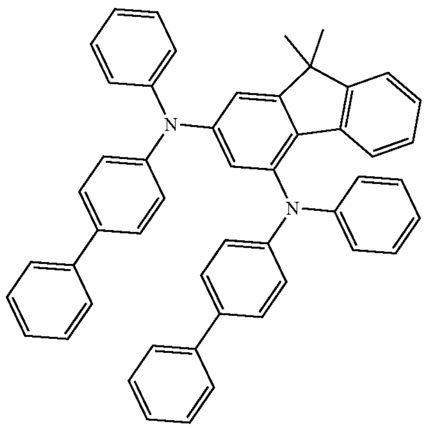
HT-2
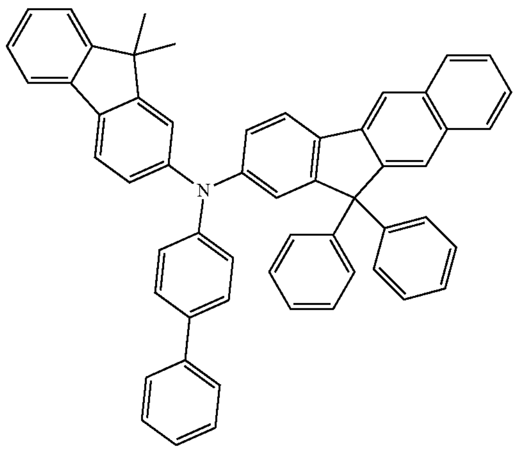
HT-3
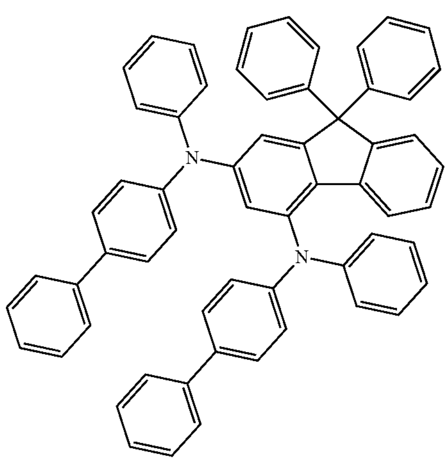
EB-1

TABLE 2-continued
Light-Emitting Layer
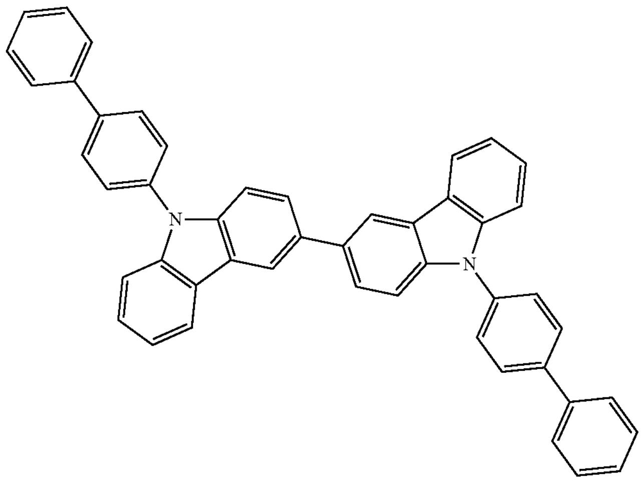
A-1
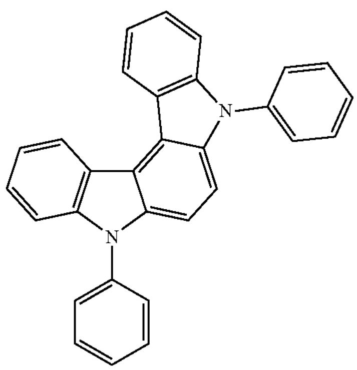
A-2
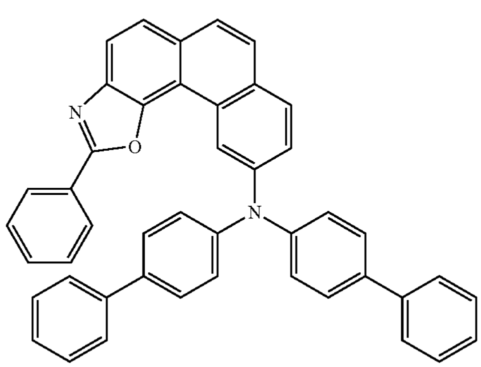
H-189

TABLE 2-continued
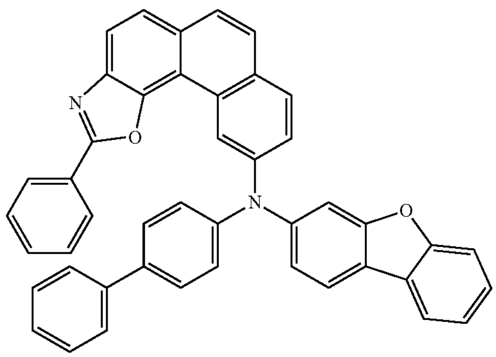
H-183
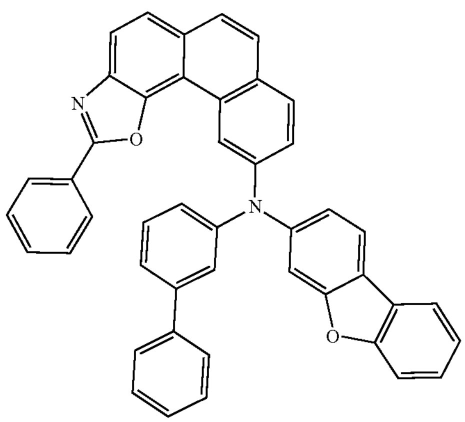
H-212
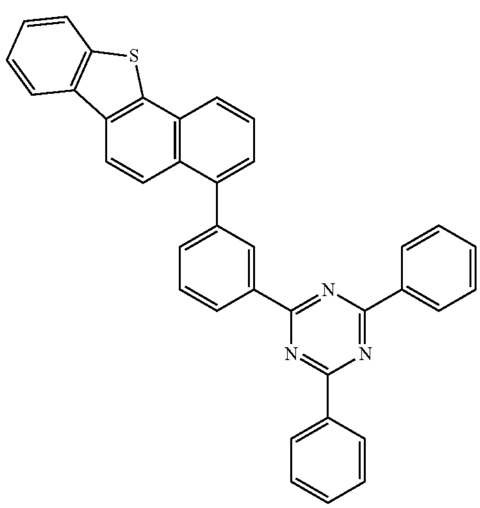
C-146

TABLE 2-continued
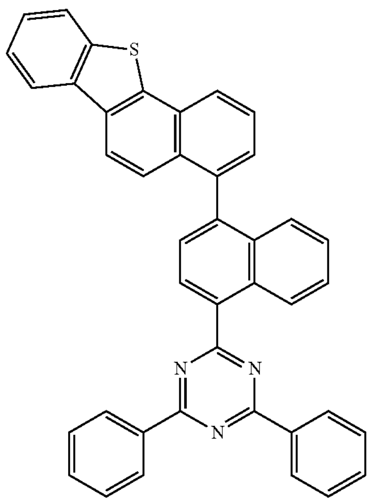
C-489
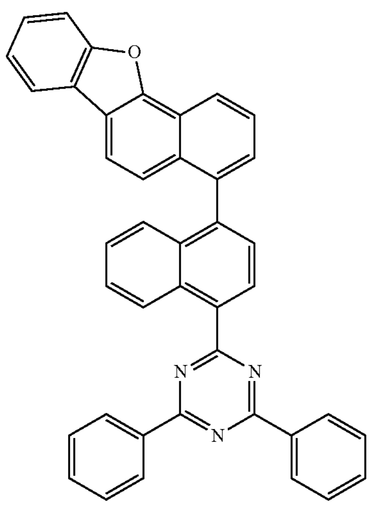
C-491
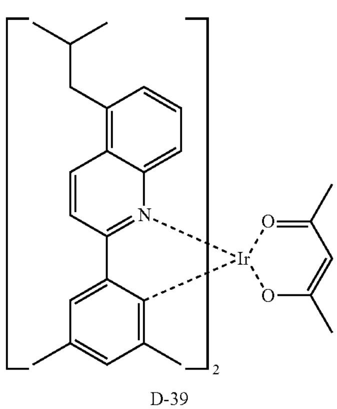
D-39

TABLE 2-continued

| | |
|---|---|
| Electron Transport Layer / Electron Injection Layer | 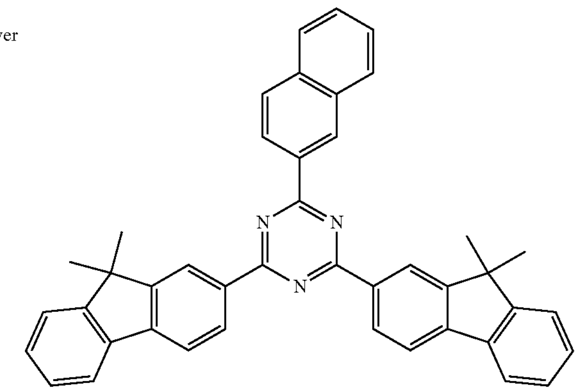 ET-1 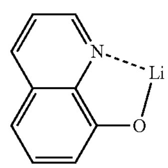 EI-1 |

Device Examples 4 to 10

Producing OLEDs in which a Plurality of Host Materials According to the Present Disclosure are Deposited OLEDs according to the present disclosure were produced. First, a transparent electrode indium tin oxide (ITO) thin film (10 Ω/sq) on a glass substrate for an OLED (GEOMATEC CO., LTD., Japan) was subjected to an ultrasonic washing with acetone and isopropylalcohol, sequentially, and then was stored in isopropylalcohol. Next, the ITO substrate was mounted on a substrate holder of a vacuum vapor deposition apparatus. Next, compound HI-3 was introduced into a cell of the vacuum vapor deposition apparatus, and compound HT-1 was introduced into another cell. Thereafter, the two materials were evaporated at different rate, and compound HI-3 was doped in a doping amount of 3 wt % with respect to the total amount of compounds HI-3 and HT-1 to form a hole injection layer having a thickness of 10 nm. Next, compound HT-1 was deposited to form a first hole transport layer having a thickness of 80 nm on the hole injection layer. Next, compound HT-2 was introduced into another cell of the vacuum vapor deposition apparatus. Thereafter, an electric current was applied to the cell to evaporate the introduced material, thereby forming a second hole transport layer having a thickness of 60 nm on the first hole transport layer. After forming the hole injection layer and the hole transport layers, a light-emitting layer was then deposited thereon as follows: The first the second host materials listed the following Table 3 were introduced into one cell of the vacuum vapor depositing apparatus as a host, and compound D-39 was introduced into another cell as a dopant. The two host materials were evaporated at a rate of 1:1 and simultaneously, the dopant was deposited in a doping amount of 3 wt % to form a light-emitting layer having a thickness of 40 nm on the second hole transport layer. Next, compounds ET-1 and EI-1 as electron transport materials were deposited in a weight ratio of 50:50 to form an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, OLED was produced. Each compound was purified by vacuum sublimation under $10^{-6}$ torr and then used.

Device Comparative Example 5

Producing OLED Comprising Comparative Compound as a Host

OLED was produced in the same manner as in Device Example 4, except that the compound of the following Table 3 was used as the host of the light-emitting layer.

The results of the driving voltage, the luminous efficiency, and the emission color at a luminance of 1,000 nits, and the time taken to reduce from 100% to 95% at a luminance of 5,000 nits (lifespan; T95), of the organic electroluminescent devices of Device Examples 4 to 10 and Device Comparative Example 5 produced as described above, are shown in the following Table 3.

TABLE 3

| | First Host Material | Second Host Material | Driving Voltage (V) | Luminous Efficiency (cd/A) | Emission Color | Lifespan T95(hr) |
|---|---|---|---|---|---|---|
| Device Example 4 | C-254 | H-212 | 3.4 | 34.8 | Red | 394 |
| Device Example 5 | C-254 | H-235 | 3.1 | 35.4 | Red | 428 |
| Device Example 6 | C-254 | H-236 | 3.2 | 35.0 | Red | 219 |
| Device Example 7 | C-263 | H-185 | 3.0 | 34.4 | Red | 412 |
| Device Example 8 | C-230 | H-212 | 3.2 | 35.0 | Red | 532 |
| Device Example 9 | C-230 | H-237 | 3.2 | 33.9 | Red | 259 |
| Device Example 10 | C-230 | H-238 | 3.1 | 34.7 | Red | 418 |
| Device Comparative Example 5 | C-263 | — | 3.5 | 27.9 | Red | 38.2 |

From Table 3 above, it can be confirmed that the organic electroluminescent device comprising a specific combination of compounds according to the present disclosure as host materials has improved with respect to driving voltage, luminous efficiency, and/or lifespan characteristics.

The compounds used in the Device Examples above are shown in Table 4 below.

TABLE 4

Hole Injection Layer / Hole Transport Layer

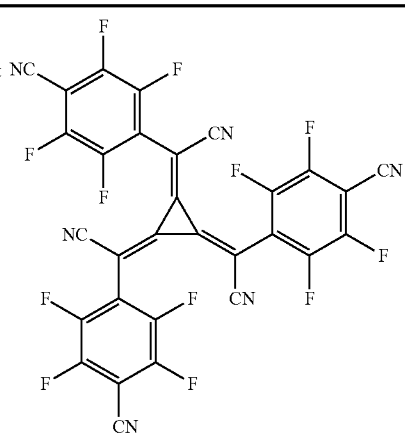

HI-3

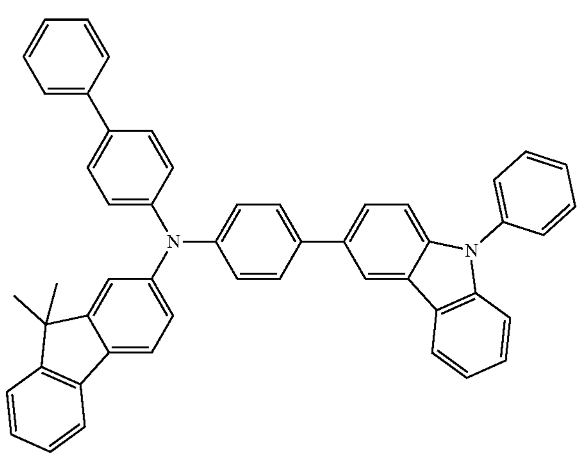

HT-1

TABLE 4-continued
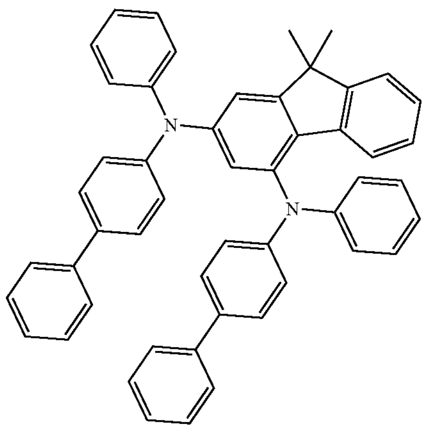
HT-2
Light-Emitting Layer
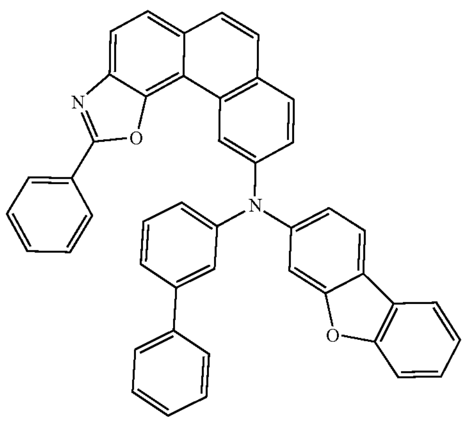
H-212
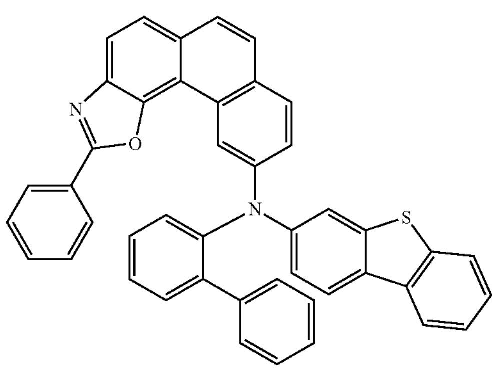
H-235

TABLE 4-continued
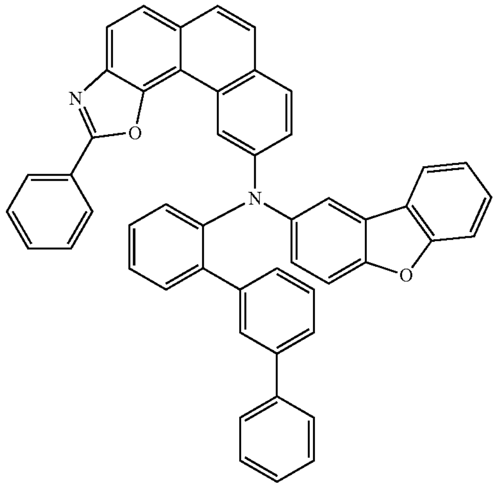
H-236
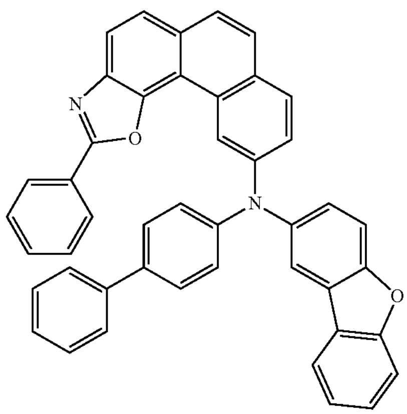
H-185
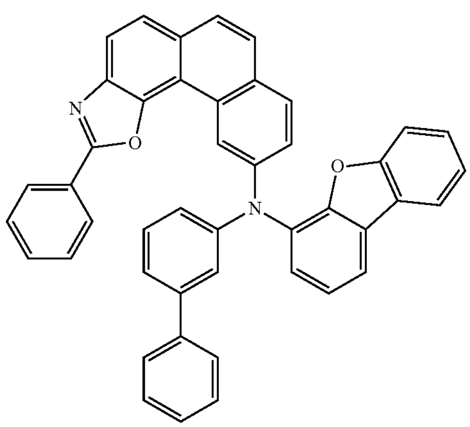
H-237

TABLE 4-continued
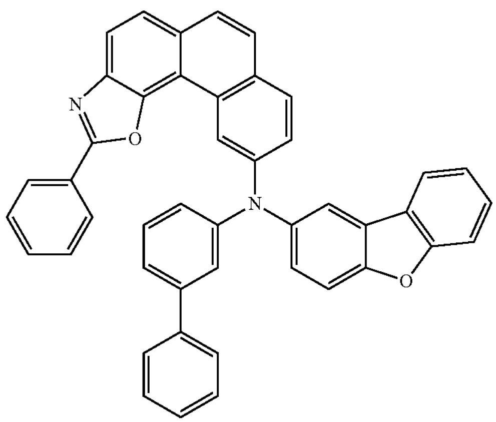
H-238
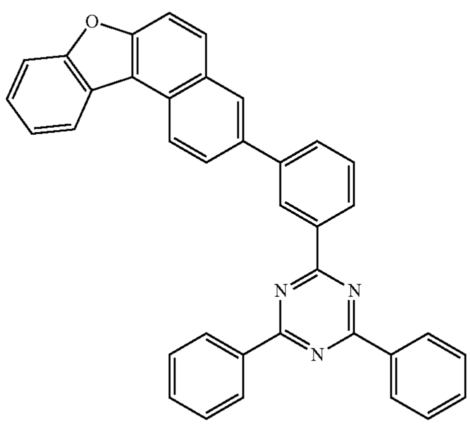
C-254
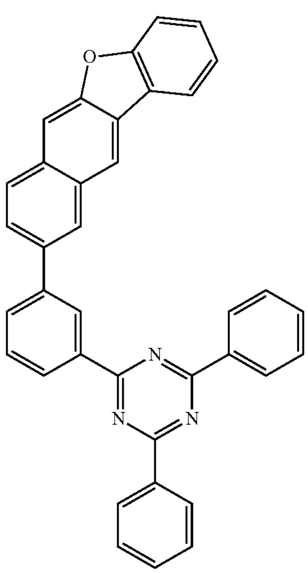
C-230

TABLE 4-continued
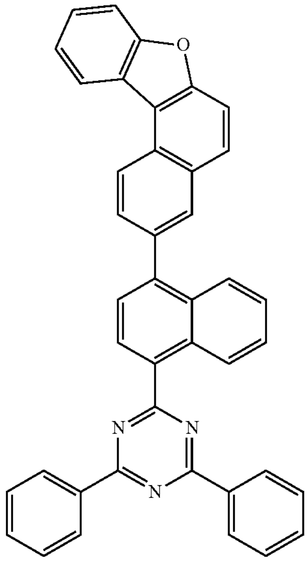
C-263
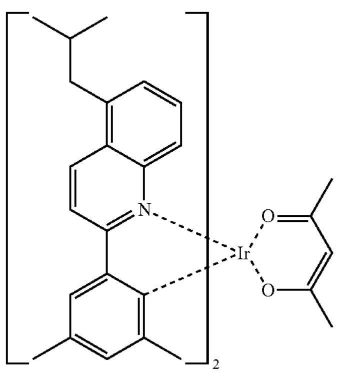
D-39
Electron Transport Layer / Electron Injection Layer
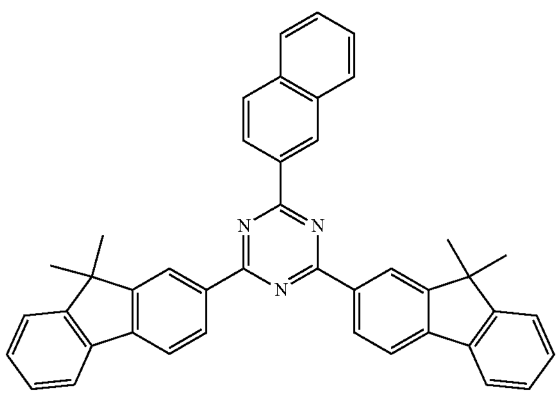
ET-1
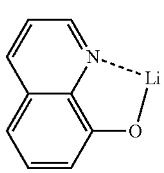
EI-1

Device Example 11

Producing OLED Comprising an Organic Electroluminescent Compound According to the Present Disclosure OLED according to the present disclosure was produced. First, a transparent electrode indium tin oxide (ITO) thin film (10 Ω/sq) on a glass substrate for an OLED device (GEOMATEC CO., LTD., Japan) was subject to an ultrasonic washing with acetone and isopropylalcohol, sequentially, and then was stored in isopropylalcohol. Next, the ITO substrate was mounted on a substrate holder of a vacuum vapor deposition apparatus. Next, fdsf compound HT-1 was introduced into another cell. Thereafter, the two materials were evaporated at different rate, and compound HI-3 was doped in a doping amount of 3 wt % with respect to the total amount of compounds HI-3 and HT-1 to form a hole injection layer having a thickness of 10 nm. Next, compound HT-1 was deposited to form a first hole transport layer having a thickness of 80 nm on the hole injection layer. Next, compound H-221 was introduced into another cell of the vacuum vapor deposition apparatus. Thereafter, an electric current was applied to the cell to evaporate the introduced material, thereby forming a second hole transport layer having a thickness of 60 nm on the first hole transport layer. After forming the hole injection layer and the hole transport layers, a light-emitting layer was then deposited thereon as follows: Compound RH was introduced into one cell of the vacuum vapor depositing apparatus as a host, and compound D-39 was introduced into another cell as a dopant. The two materials were evaporated at a different rate and deposited in a doping amount of 3 wt %, respectively, to form a light-emitting layer having a thickness of 40 nm on the second hole transport layer. Next, compounds ET-1 and EI-1 as electron transport materials were deposited in a weight ratio of 50:50 to form an electron transport layer having a thickness of 35 nm on the light-emitting layer. After depositing compound EI-1 as an electron injection layer having a thickness of 2 nm on the electron transport layer, an Al cathode having a thickness of 80 nm was deposited on the electron injection layer by another vacuum vapor deposition apparatus. Thus, OLED was produced. Each compound was purified by vacuum sublimation under $10^{-6}$ torr and then used.

Device Comparative Example 6

Producing OLED Comprising Comparative Compound as a Second Hole Transport Layer Material OLED was produced in the same manner as in Device Example 11, except that the compound H-179 was used as the second hole transport layer material.

The results of the driving voltage, the luminous efficiency, and the emission color at a luminance of 1,000 nits, and the time taken to reduce from 100% to 95% at a luminance of 5,000 nits (lifespan; T95), of the organic electroluminescent devices of Device Example 11 and Device Comparative Example 6 produced as described above, are shown in the following Table 5.

TABLE 5

| | Second Hole Transport Layer Material | Driving Voltage (V) | Luminous Efficiency (cd/A) | Emission Color | Lifespan T95(hr) |
|---|---|---|---|---|---|
| Device Example 11 | H-221 | 3.5 | 31.8 | Red | 548 |
| Device Comparative Example 6 | H-179 | 3.5 | 22.5 | Red | 2 |

From Table 5 above, it can be confirmed that the organic electroluminescent device comprising an organic electroluminescent compound according to the present disclosure as a hole transport layer material has improved with respect to driving voltage, luminous efficiency, and/or lifespan characteristics.

The compounds used in the Device Example and Device Comparative Example above are shown in Table 6 below.

TABLE 6

Hole Injection Layer / Hole Transport Layer

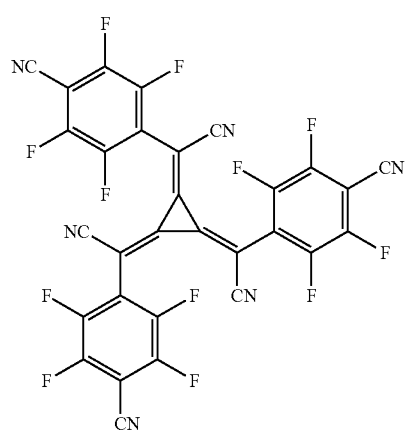

HI-3

TABLE 6-continued
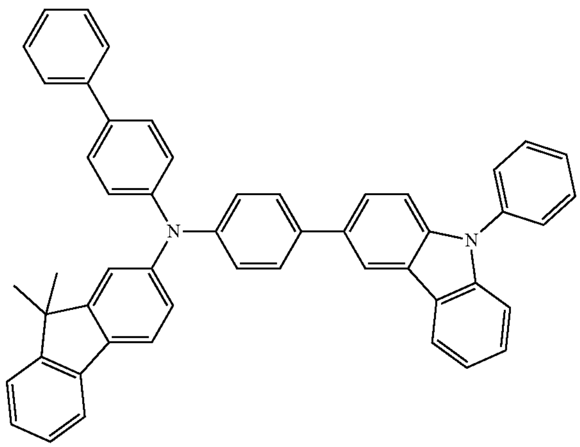
HT-1
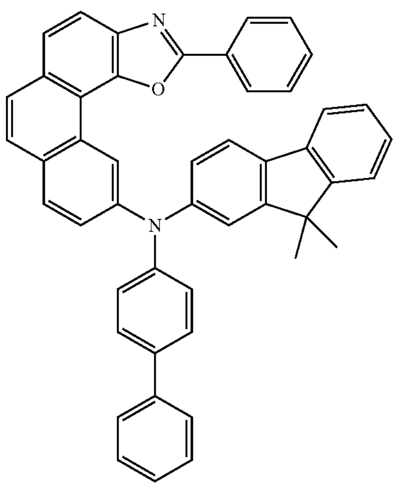
H-179
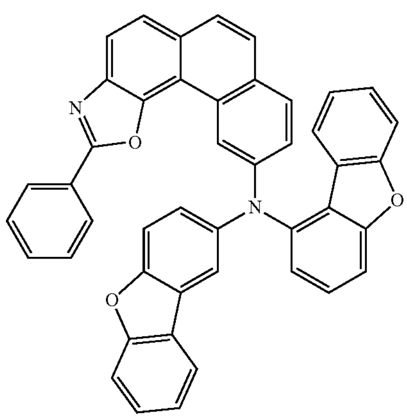
H-221

TABLE 6-continued
Light-Emitting Layer
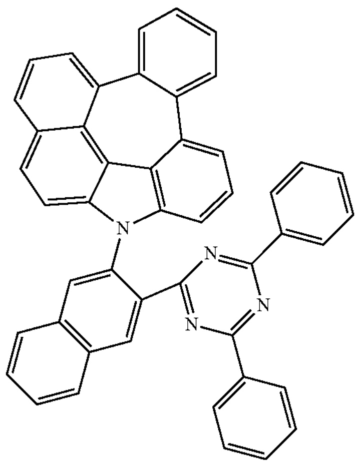
RH
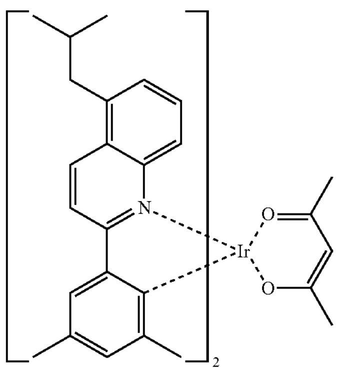
D-39
Electron Transport Layer / Electron Injection Layer
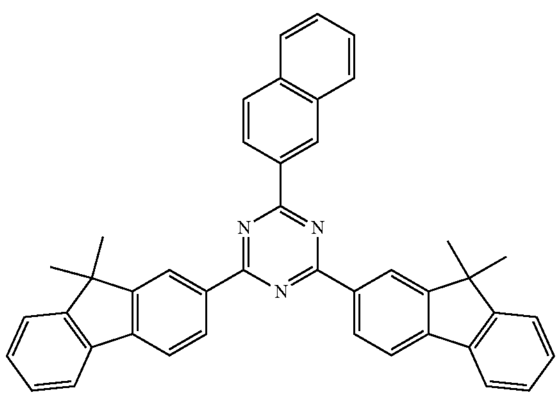
ET-1
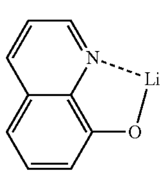
EI-1

The invention claimed is:

1. A plurality of host materials comprising a first host material comprising a compound represented by the following formula 1 and a second host material comprising a compound represented by the following formula 2:

(1)

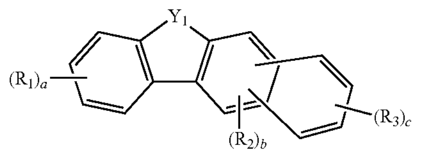

wherein, $Y_1$ represents O, S, $CR_{11}R_{12}$, or $NR_{13}$;

$R_{11}$ to $R_{13}$ each independently represent hydrogen, deuterium, halogen, cyano, a substituted or unsubstituted (C1-C30)alkyl, a substituted or unsubstituted (C3-C30) cycloalkyl, a substituted or unsubstituted (C3-C30) cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or $R_{11}$ and $R_{12}$ may be linked to each other to form a ring;

$R_1$ to $R_3$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di- (C1-C30)alkylamino, a substituted or unsubstituted (C1-C30)alkyl(C6-C30)arylamino, a substituted or unsubstituted mono- or di- (C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

provided that at least one of $R_{13}$, $R_2$, and $R_3$ represent(s) $-L_1-(Ar_1)_d$;

$L_1$ represents a single bond, a substituted or unsubstituted (C6-C30)arylene, or a substituted or unsubstituted (3- to 30-membered)heteroarylene;

$Ar_1$ each independently represent(s) a substituted or unsubstituted (3- to 30-membered)heteroaryl containing at least one nitrogen (N);

a and c each independently represent an integer of 1 to 4, b and d represent an integer of 1 or 2; and when a to d are equal to 2 or more, each $R_1$, each $R_2$, each $R_3$, and each $Ar_1$ may be the same or different, (2)

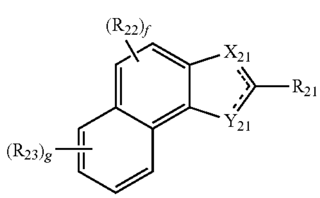

wherein, $X_{21}$ and $Y_{21}$ each independently represent —N═, —$NR_{24}$—, —O—, or —S—, provided that one of $X_{21}$ and $Y_{21}$ represents —N═, and the other represents —$NR_{24}$—, —O—, or —S—;

$R_{21}$ represents a substituted or unsubstituted (C6-C30)aryl or a substituted or unsubstituted (3- to 30-membered) heteroaryl;

$R_{22}$ to $R_{24}$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30)aliphatic ring and (C6-C30)aromatic ring, a substituted or unsubstituted mono- or di- (C1-C30)alkylamino, a substituted or unsubstituted mono- or di- (C6-C30)arylamino, a substituted or unsubstituted (C1-C30)alkyl(C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

provided that at least one of $R_{22}$ and $R_{23}$ represent(s) $-L_{21}-Ar_{21}$;

$L_{21}$ represents a single bond or a substituted or unsubstituted (C6-C30)arylene;

$Ar_{21}$ represents a substituted or unsubstituted phenyl, a substituted or unsubstituted naphthyl, a substituted or unsubstituted o-biphenyl, a substituted or unsubstituted m-biphenyl, a substituted or unsubstituted p-biphenyl, a substituted or unsubstituted o-terphenyl, a substituted or unsubstituted m-terphenyl, a substituted or unsubstituted p-terphenyl, a substituted or unsubstituted triphenylenyl, a substituted or unsubstituted phenanthrenyl, a substituted or unsubstituted chrysenyl, a substituted or unsubstituted fluoranthenyl, a substituted or unsubstituted fluorenyl, a substituted or unsubstituted benzofluorenyl, a substituted or unsubstituted spirobifluorenyl, a substituted or unsubstituted spiro[cyclopentane-fluorene]yl, a substituted or unsubstituted spiro[dihydroindene-fluorene]yl, a substituted or unsubstituted spiro[benzofluorene-fluorene]yl, a substituted or unsubstituted carbazolyl, a substituted or unsubstituted benzocarbazolyl, a substituted or unsubstituted dibenzocarbazolyl, a substituted or unsubstituted dibenzothiophenyl, a substituted or unsubstituted benzothiophenyl, a substituted or unsubstituted benzonaphthothiophenyl, a substituted or unsubstituted dibenzofuranyl, a substituted or unsubstituted benzofuranyl, a substituted or unsubstituted benzonaphthofuranyl, or an amino substituted with at least one of phenyl, naphthyl, naphthylphenyl, phenylnaphthyl, o-biphenyl, m-biphenyl, p-biphenyl, o-terphenyl, m-terphenyl, p-terphenyl, fluorenyl, benzofluorenyl, phenanthrenyl, benzonaphthofuranyl, dibenzothiophenyl, and dibenzofuranyl f represents an integer of 1 or 2, q represents an integer of 1 to 4; and when f and g are equal to 2 or more, each $R_{22}$ and each $R_{23}$ may be the same or different.

2. The host materials according to claim 1, wherein the compound represented by formula 1 is selected from the group consisting of:
C-1
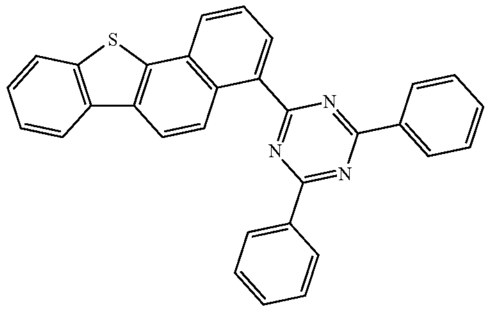
C-2
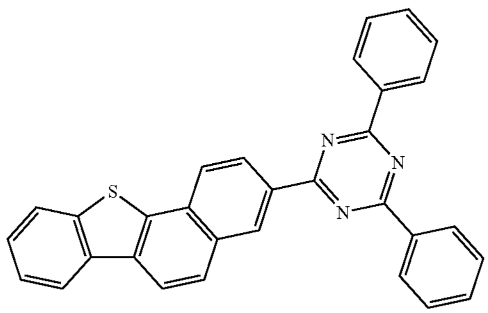
C-3
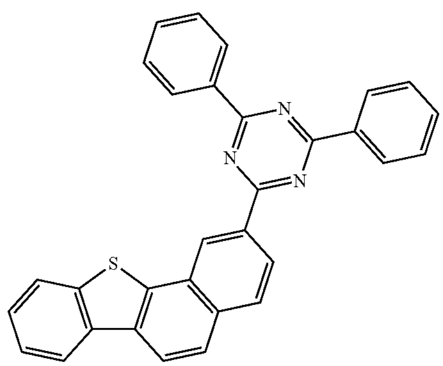
C-4
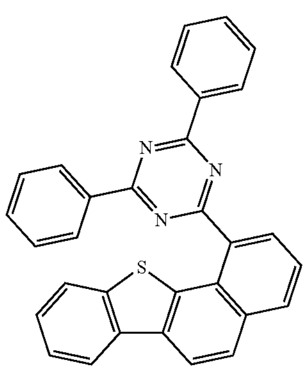
-continued
C-5
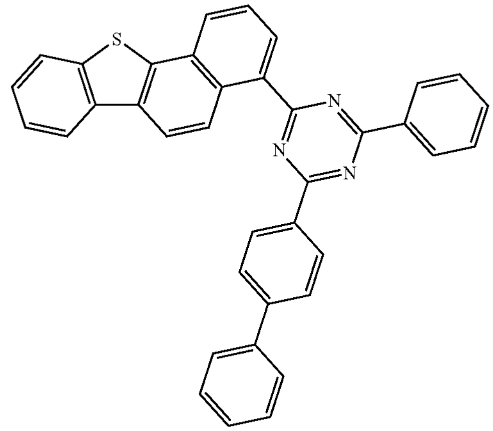
C-6
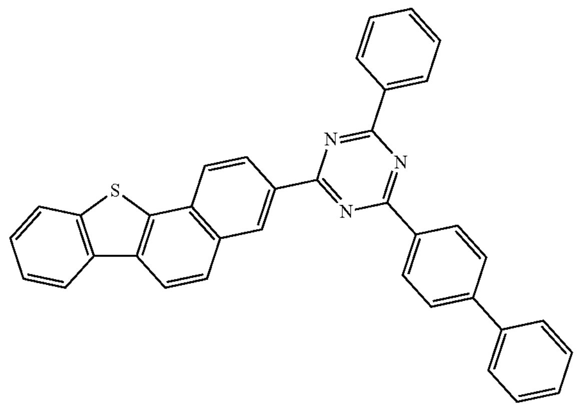
C-7
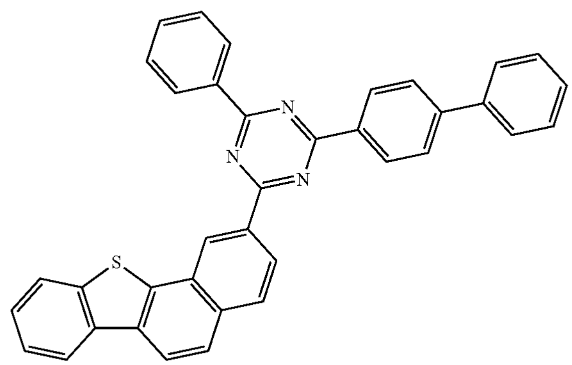
C-8
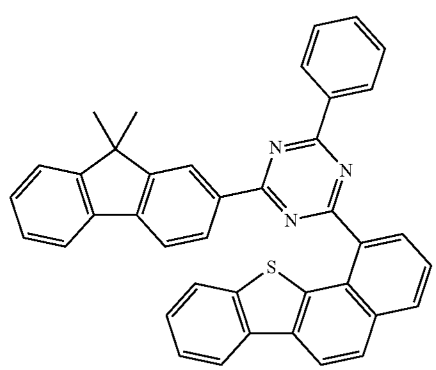

C-9
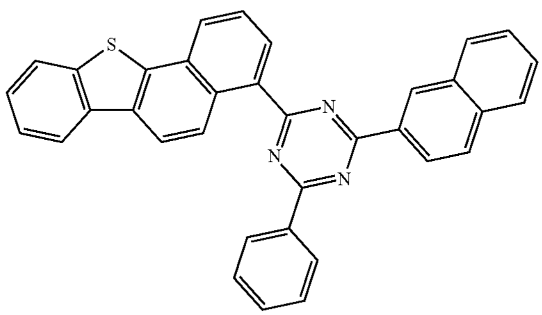
C-10
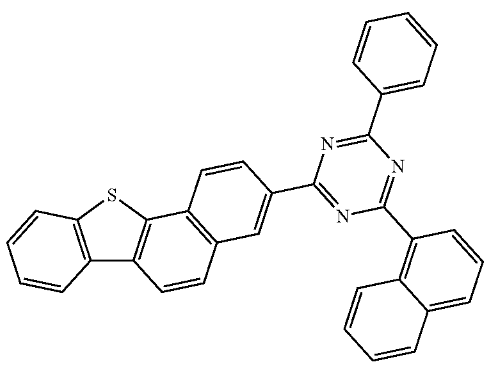
C-11
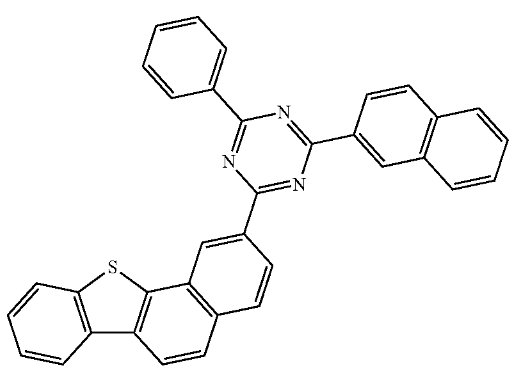
C-12
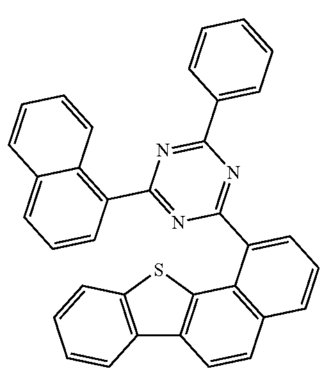
C-13
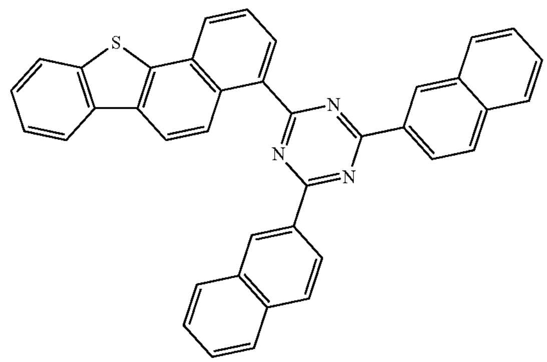
C-14
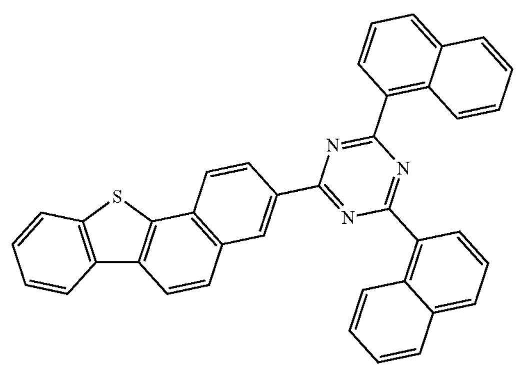
C-15
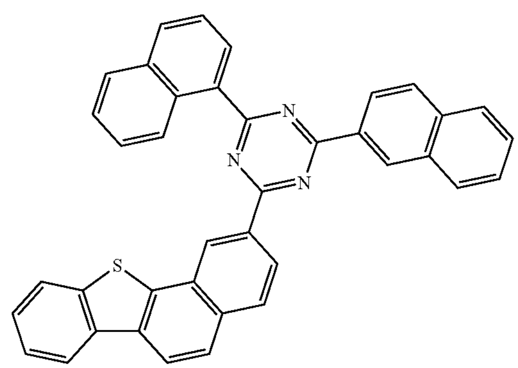
C-16
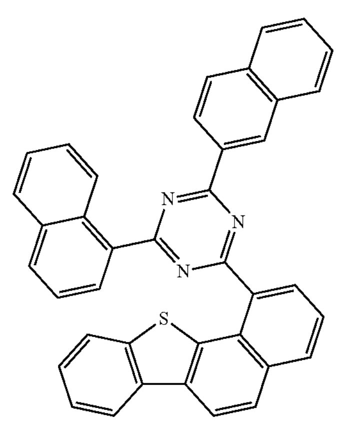

-continued
C-17
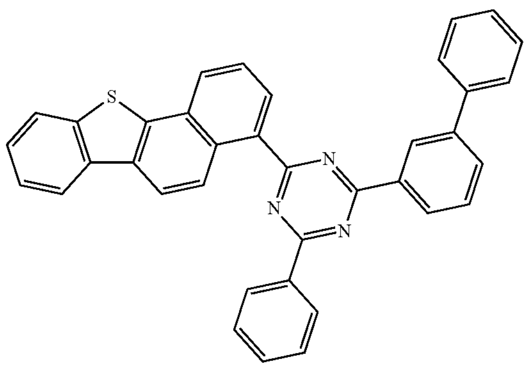
C-18
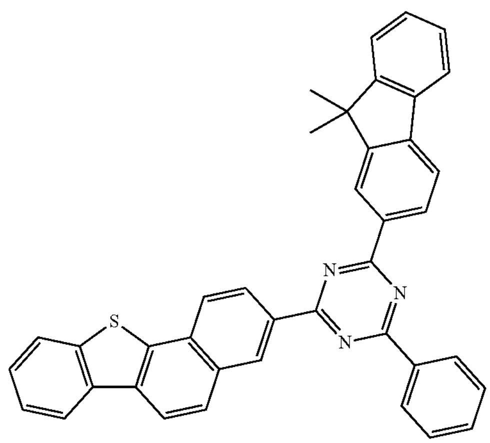
C-19
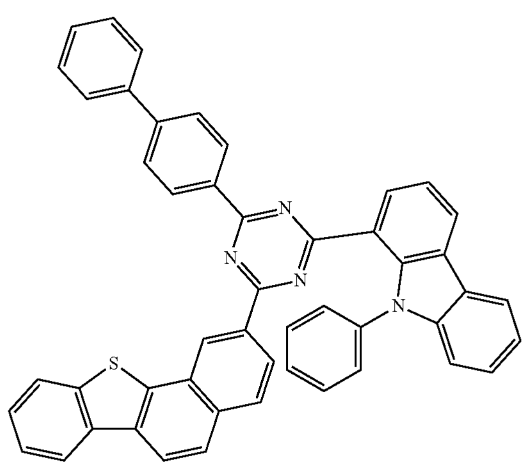
-continued
C-20
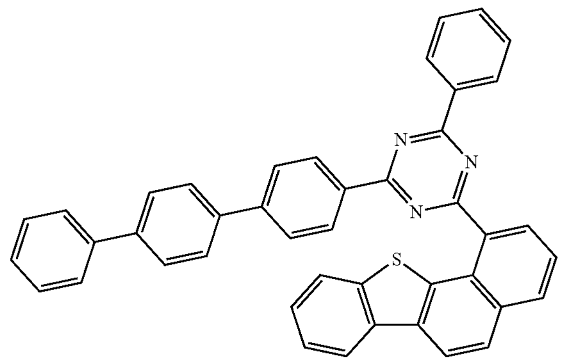
C-21
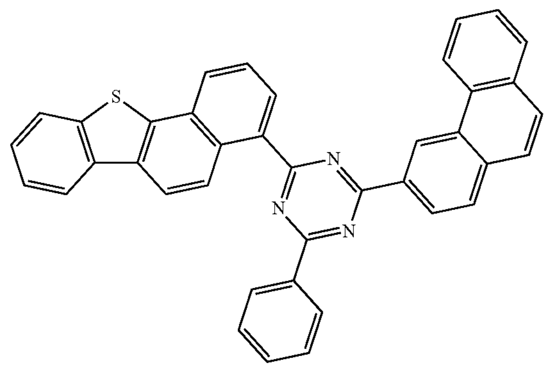
C-22
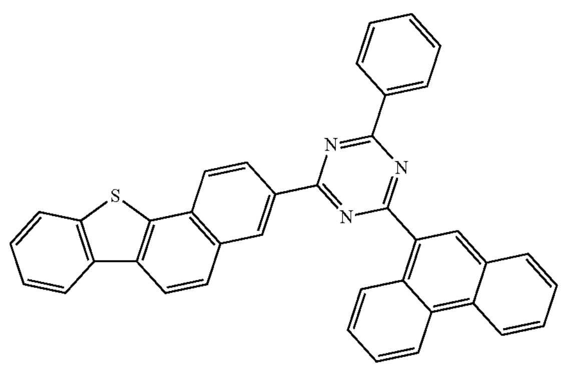
C-23
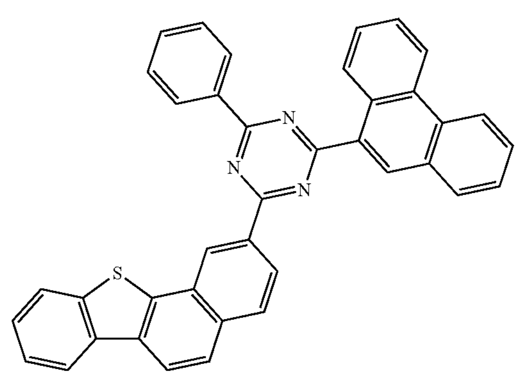

-continued
C-24
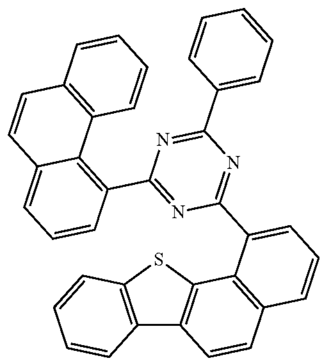
C-25
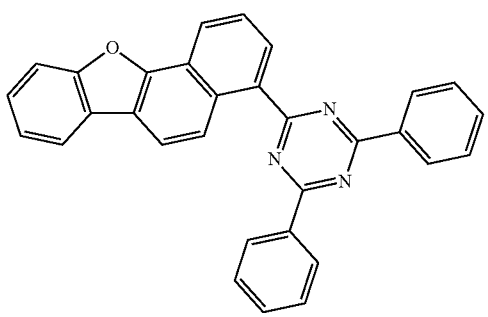
C-26
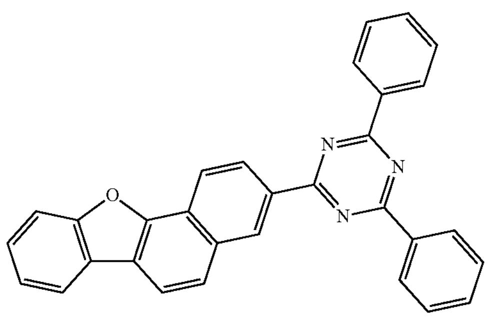
C-27
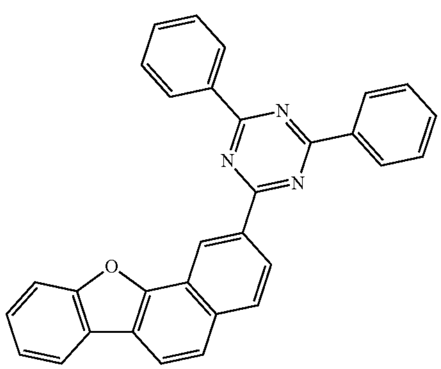
-continued
C-28
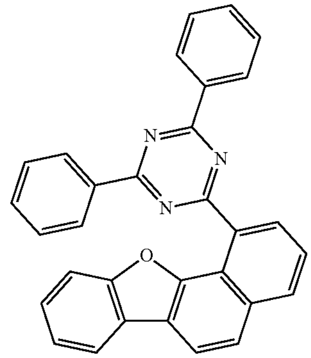
C-29
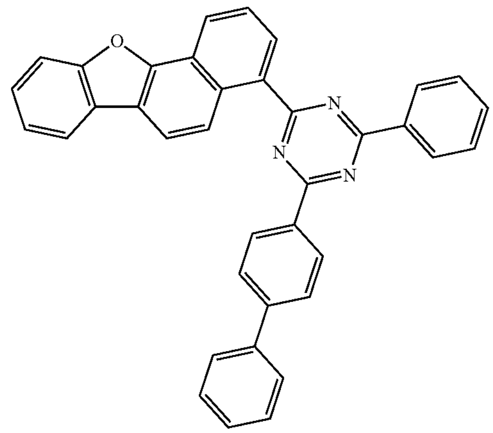
C-30
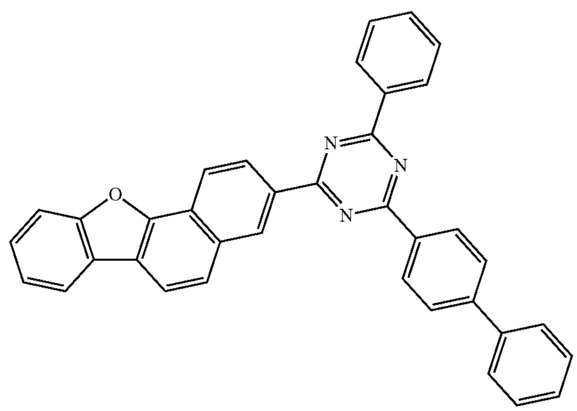
C-31
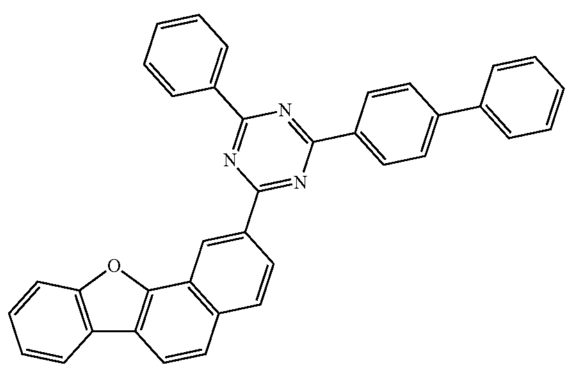

-continued
C-32
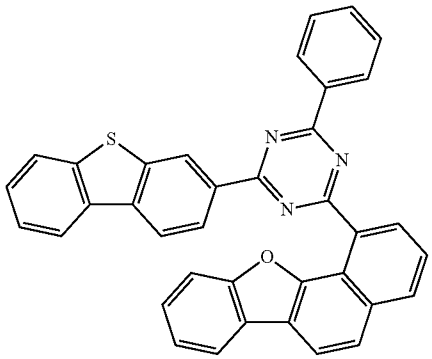
C-33
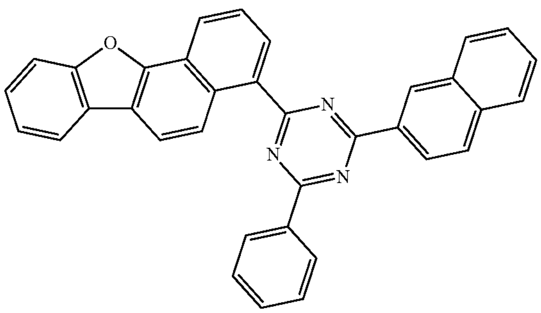
C-34
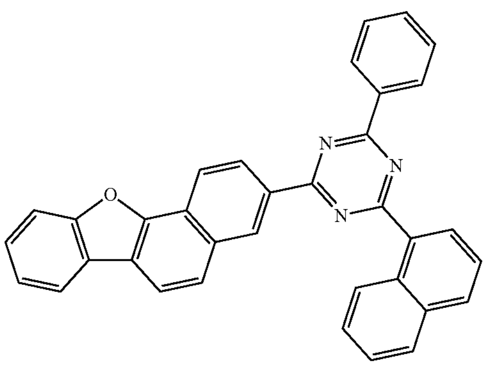
C-35
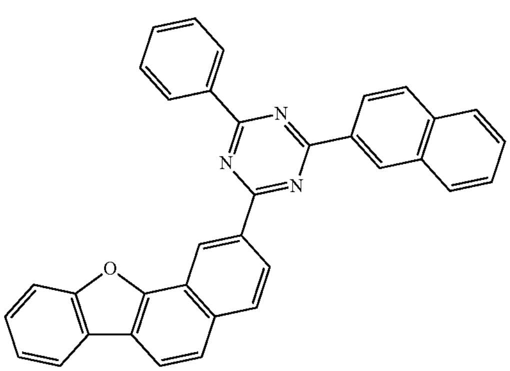
-continued
C-36
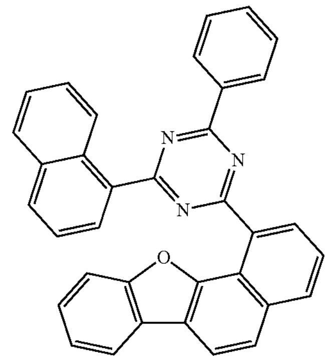
C-37
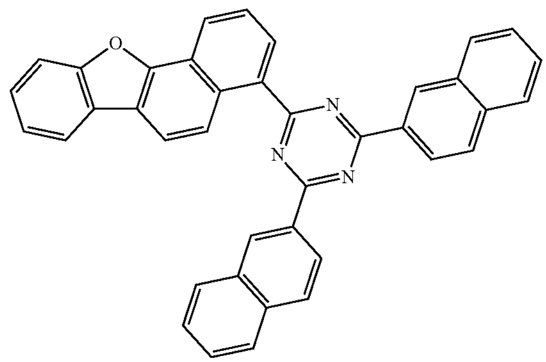
C-38
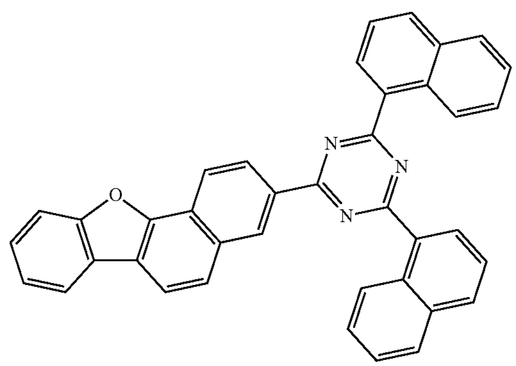
C-39
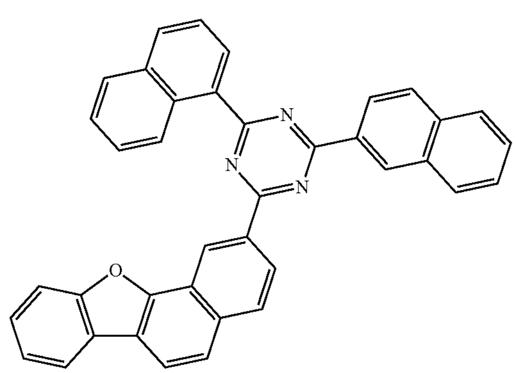

C-40
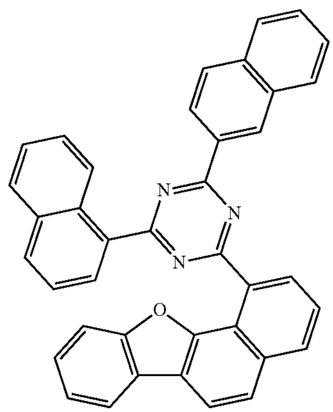
C-41
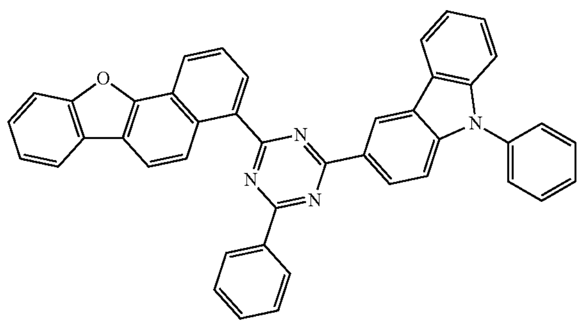
C-42
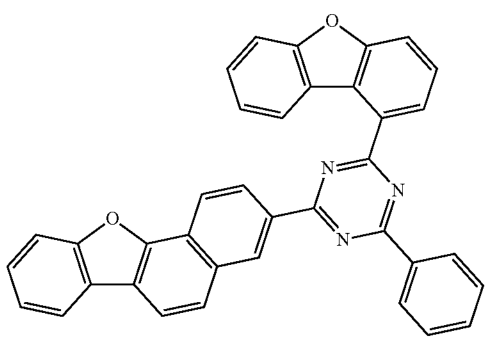
C-43
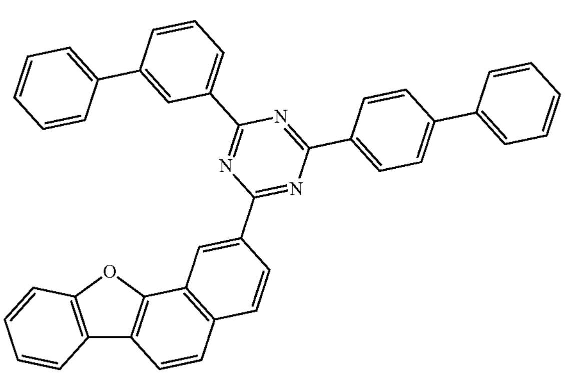
C-44
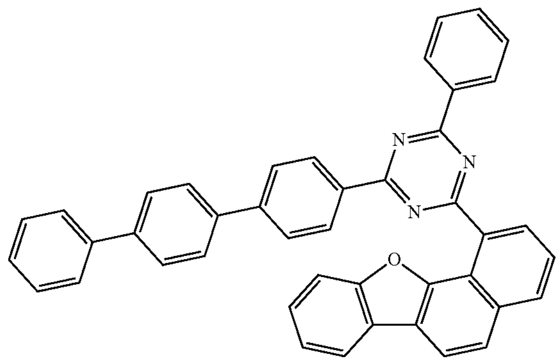
C-45
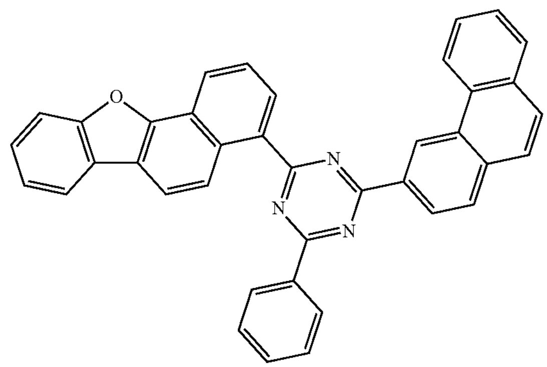
C-46
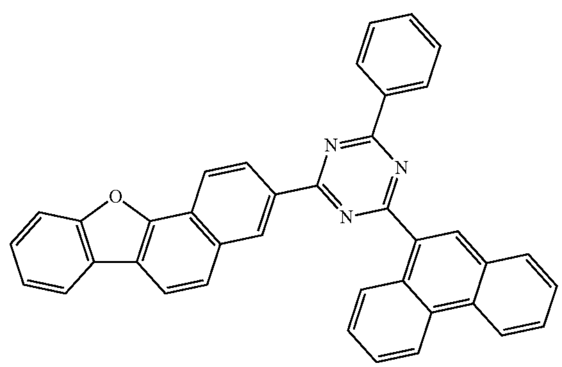
C-47
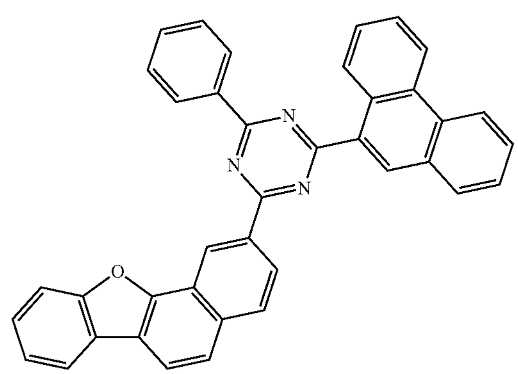

-continued
C-48
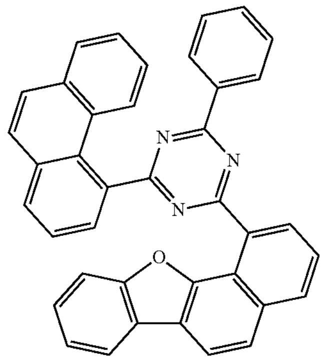
C-49
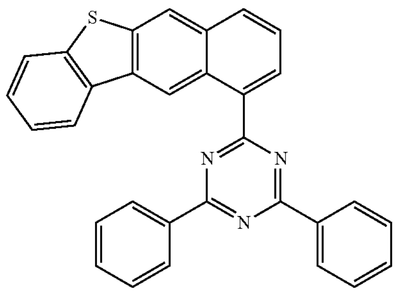
C-50
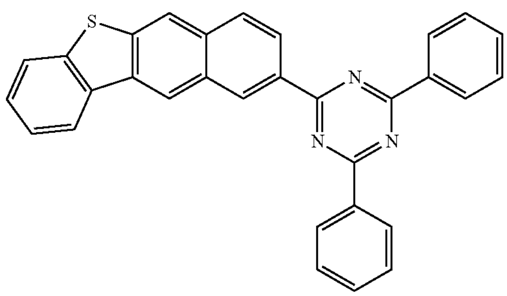
C-51
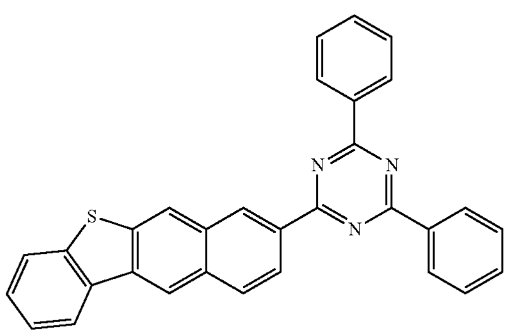
C-52
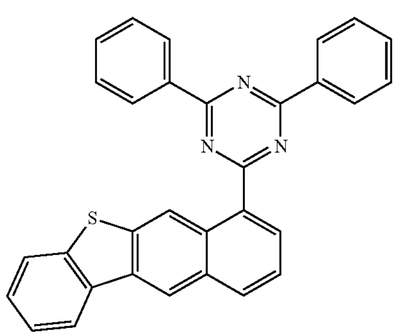
-continued
C-53
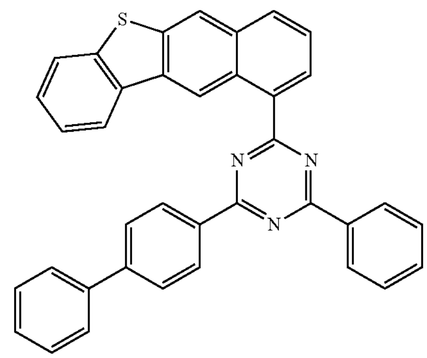
C-54
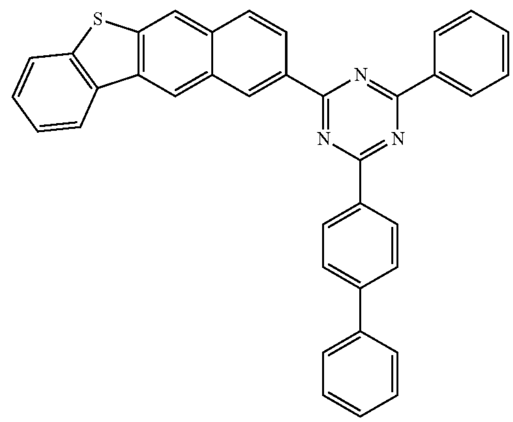
C-55
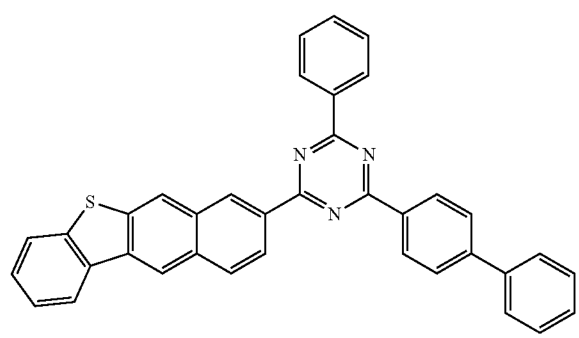
C-56
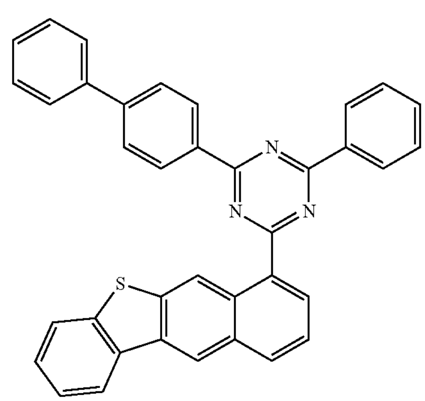

-continued
C-57
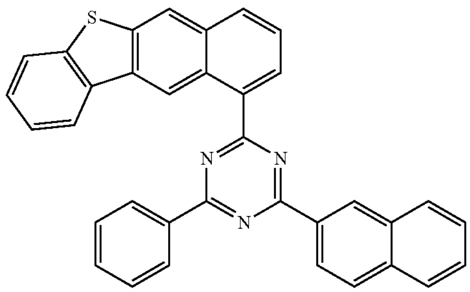
C-58
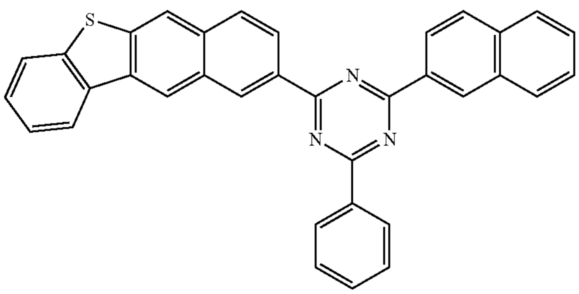
C-59
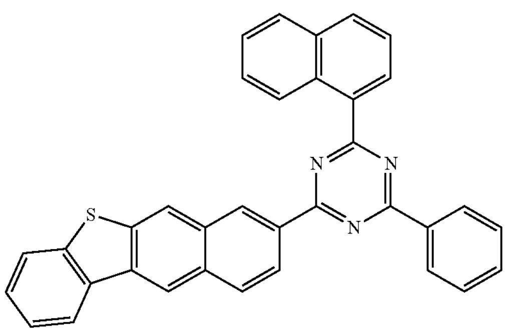
C-60
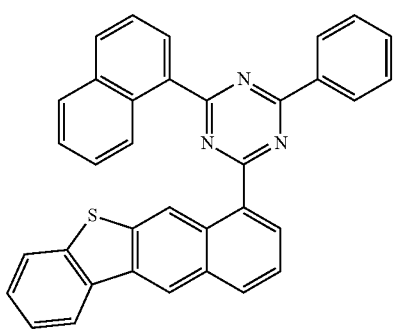
C-61
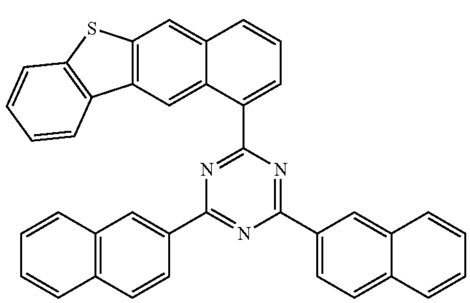
-continued
C-62
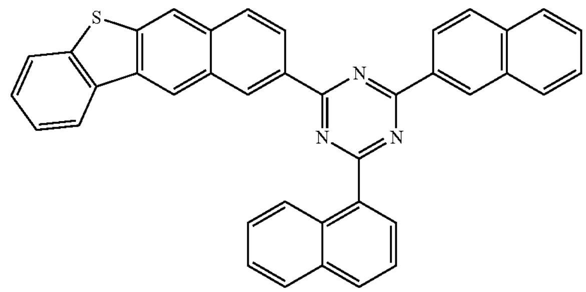
C-63
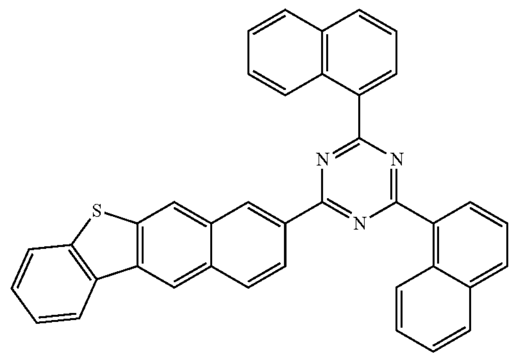
C-64
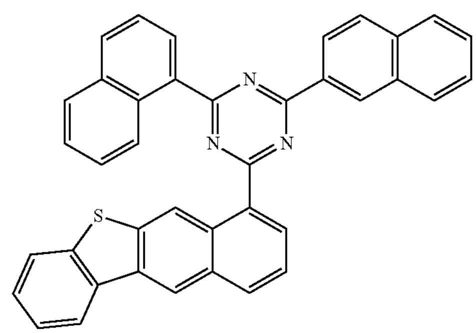
C-65
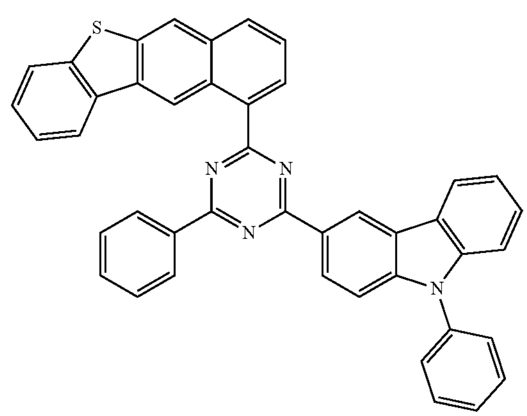

C-66
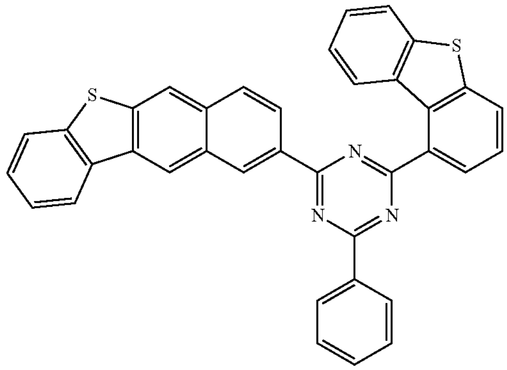
C-67
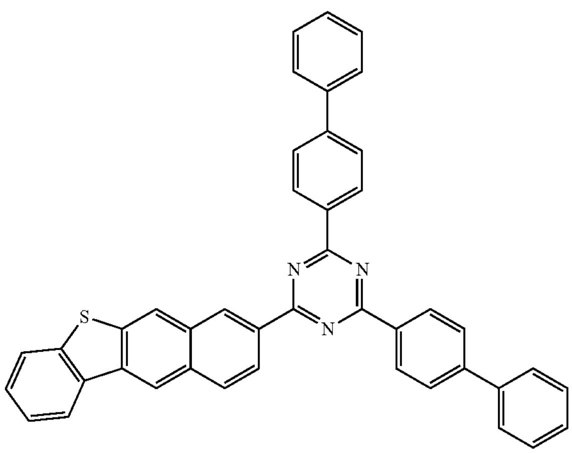
C-68
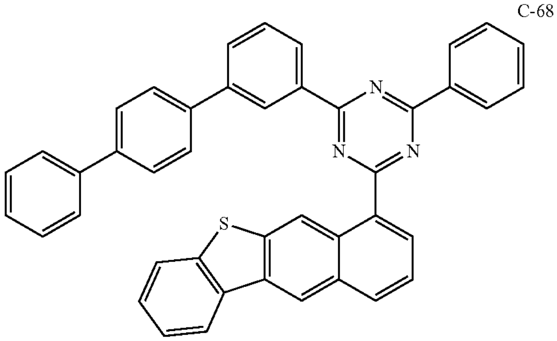
C-69
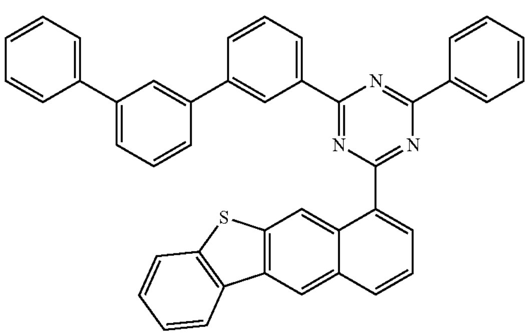
C-70
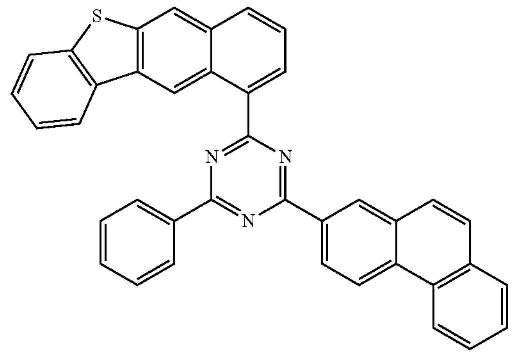
C-71
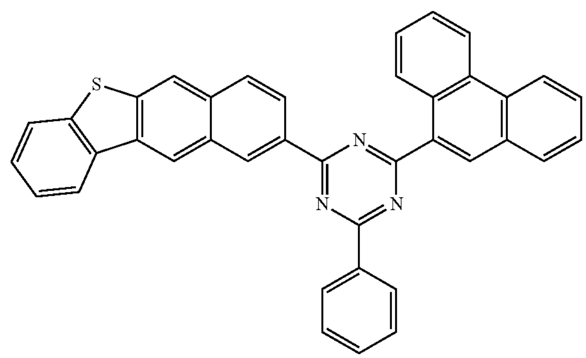
C-72
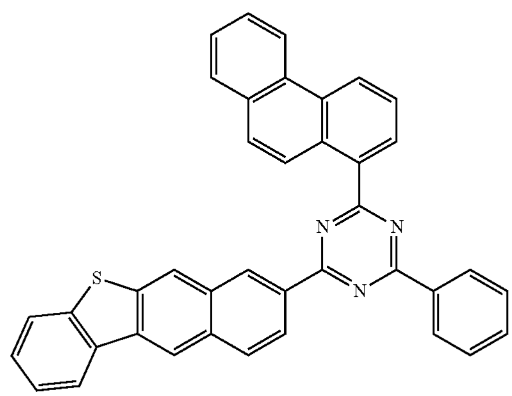
C-73
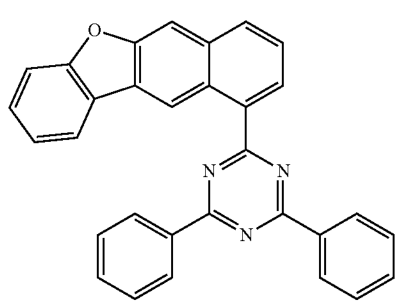

C-74
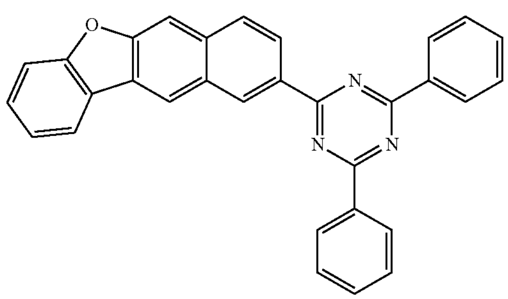
C-75
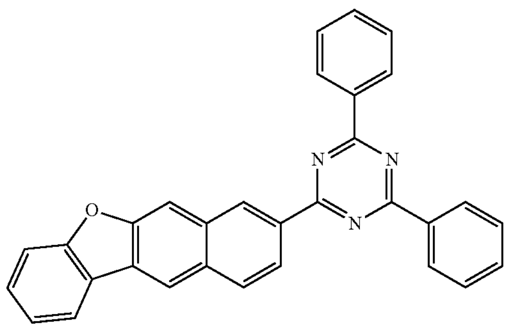
C-76
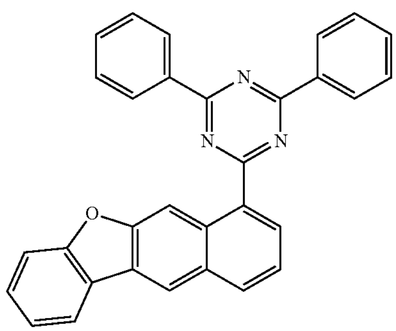
C-77
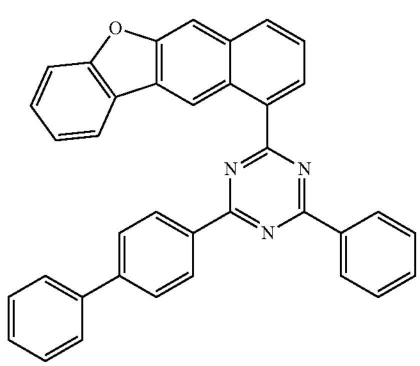
C-78
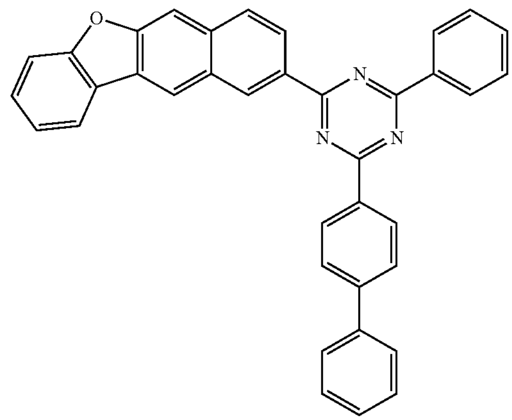
C-79
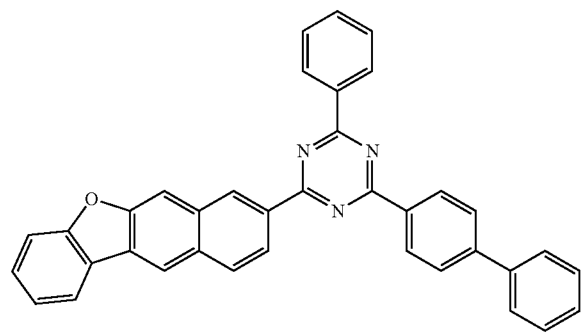
C-80
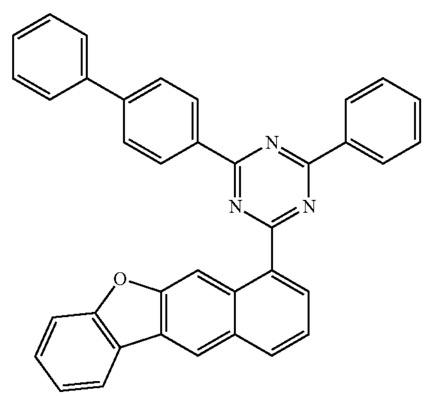
C-81
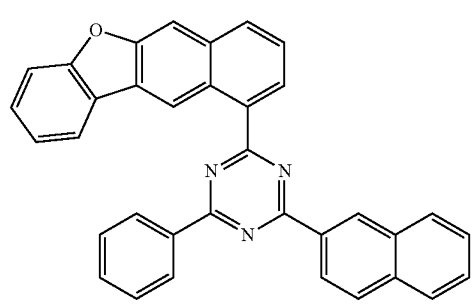

-continued
C-82
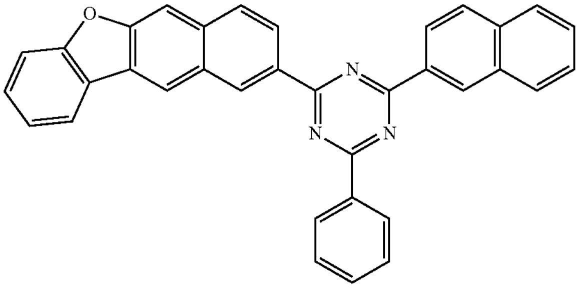
C-83
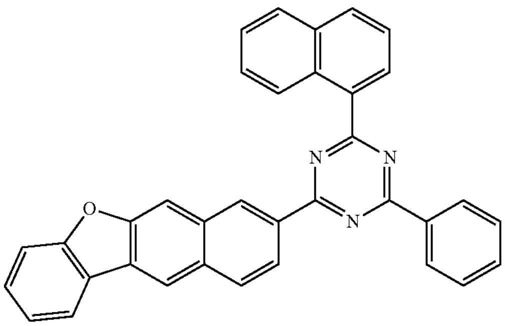
C-84
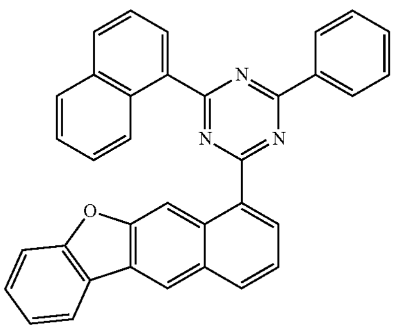
C-85
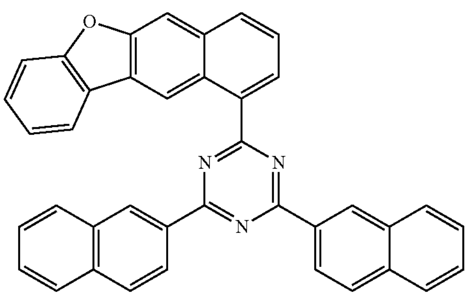
C-86
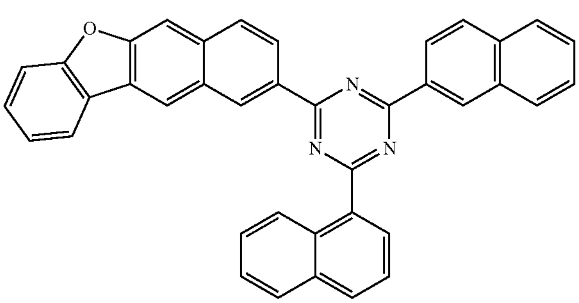
-continued
C-87
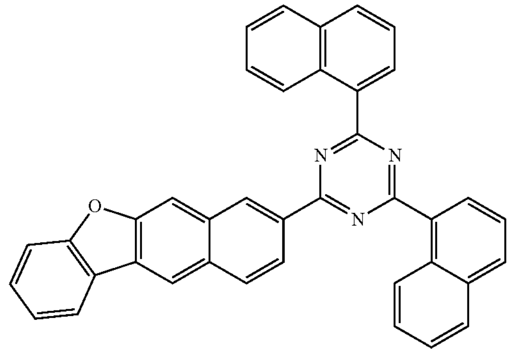
C-88
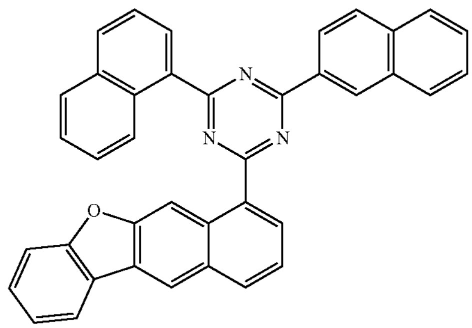
C-89
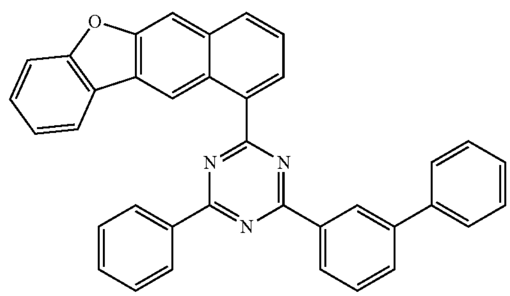
C-90
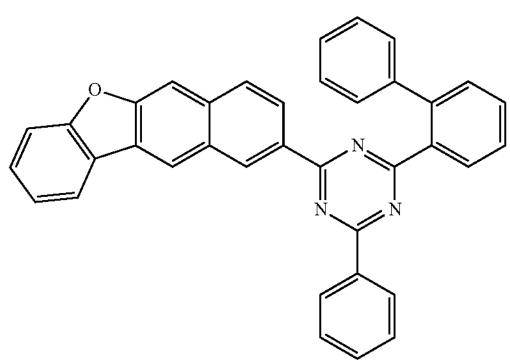

C-91
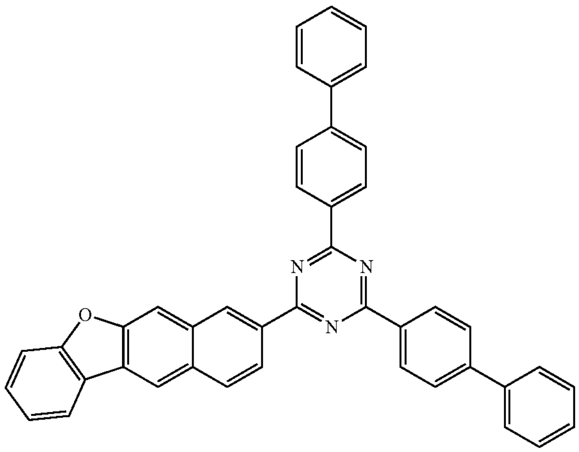
C-92
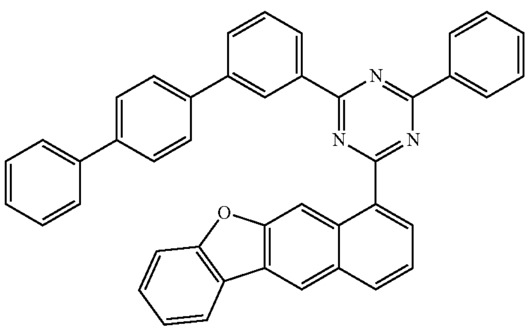
C-93
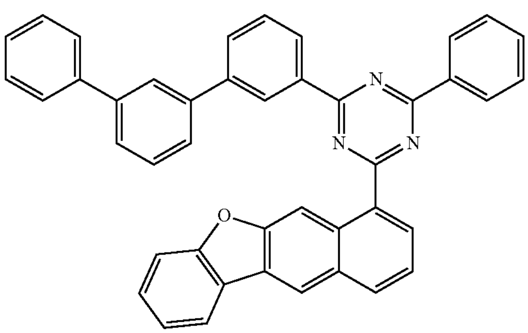
C-94
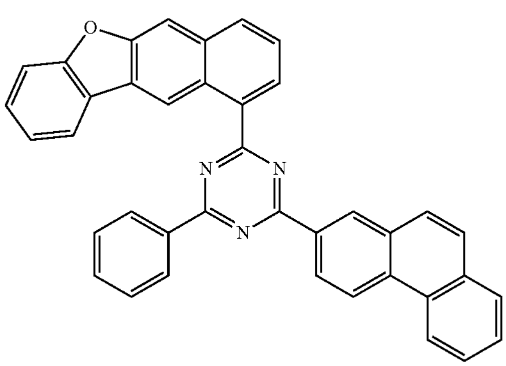
C-95
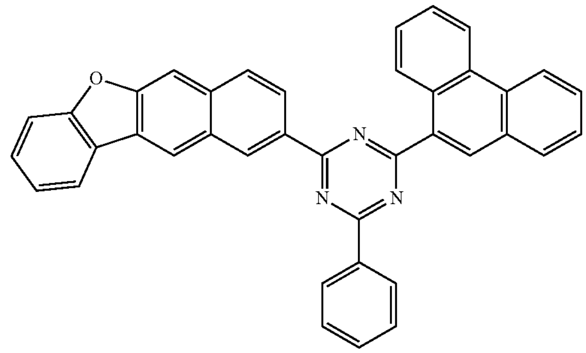
C-96
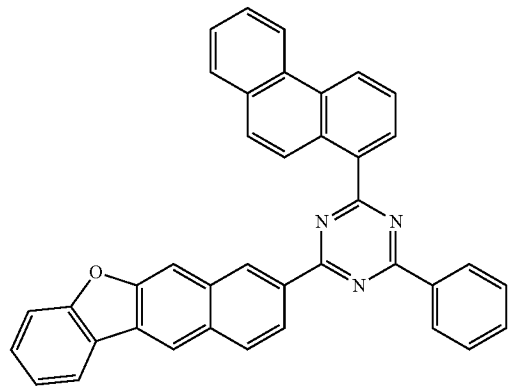
C-97
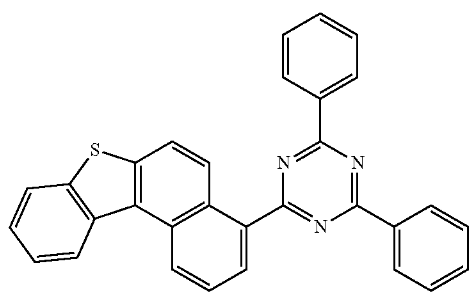
C-98
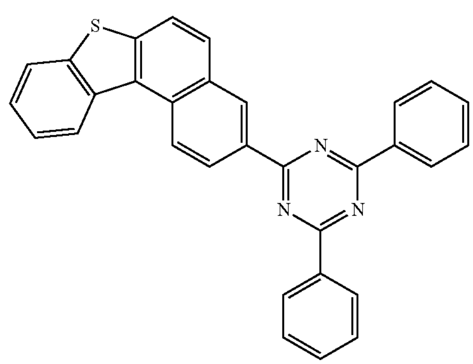

-continued
C-99
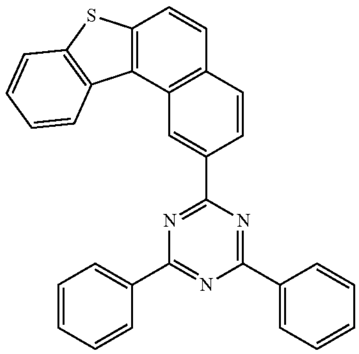
C-100
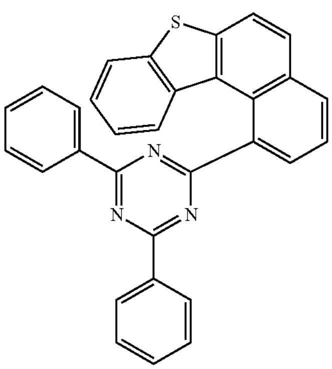
C-101
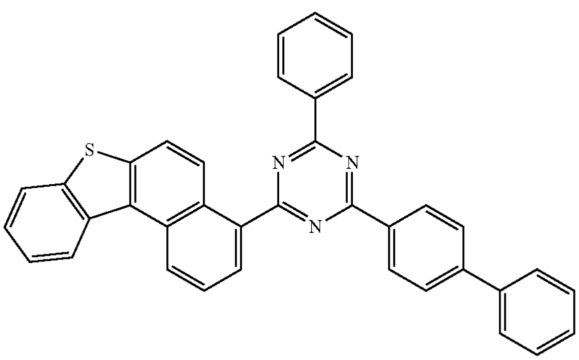
C-102
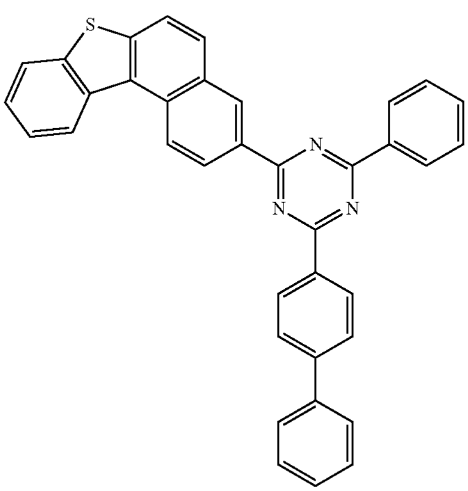
-continued
C-103
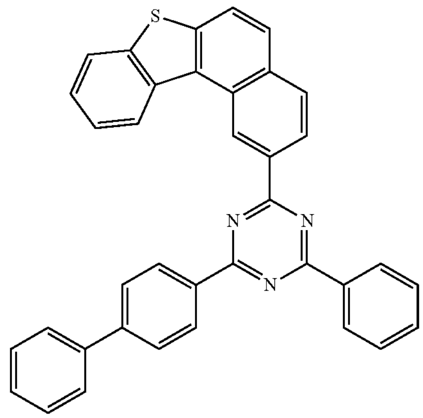
C-104
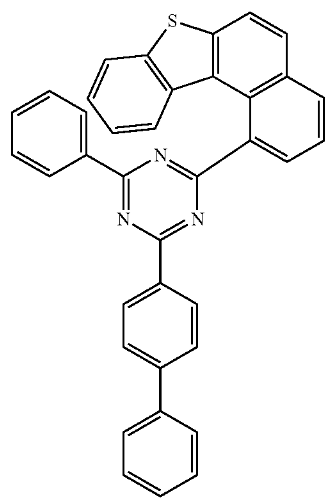
C-105
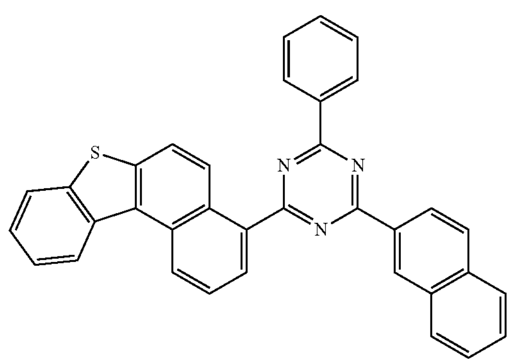

-continued
C-106
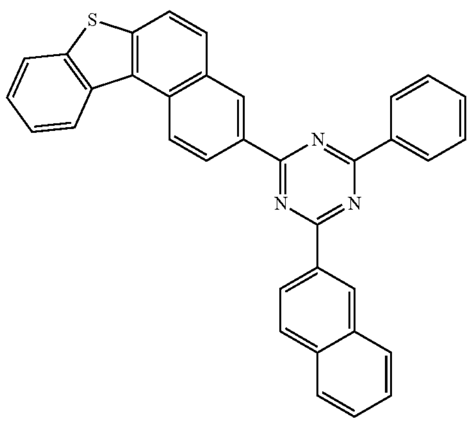
C-107
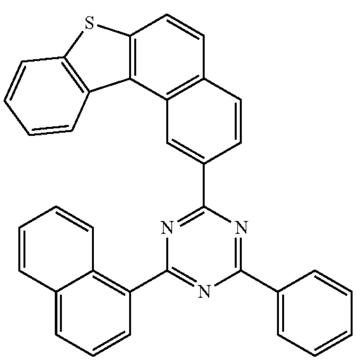
C-108
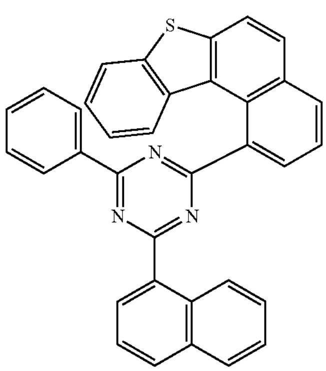
C-109
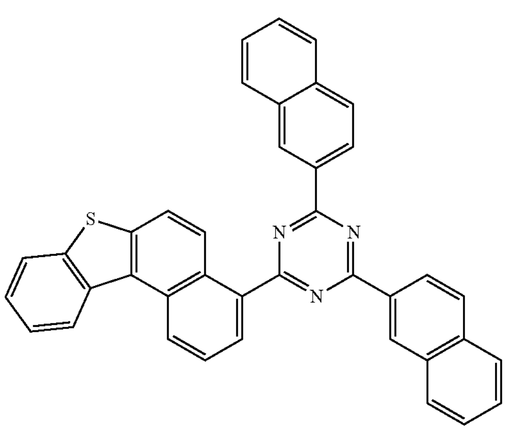
-continued
C-110
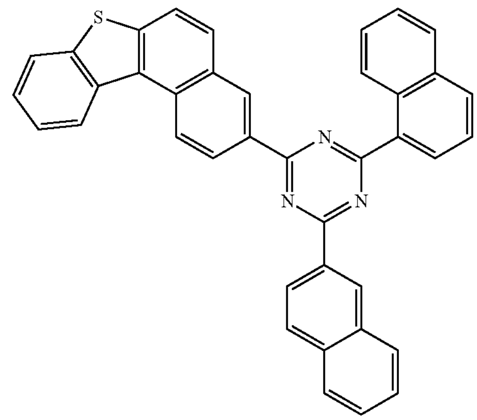
C-111
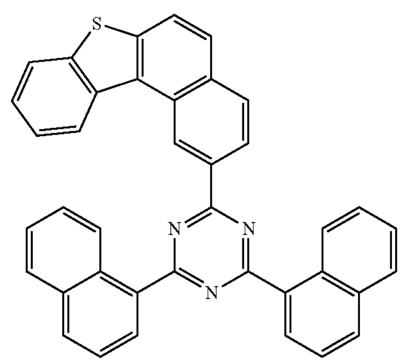
C-112
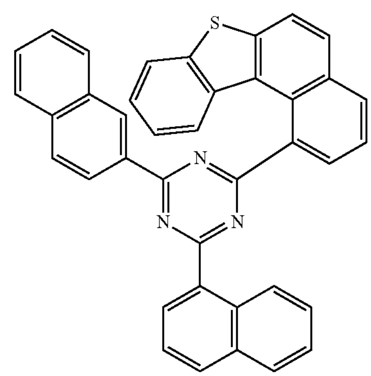
C-113
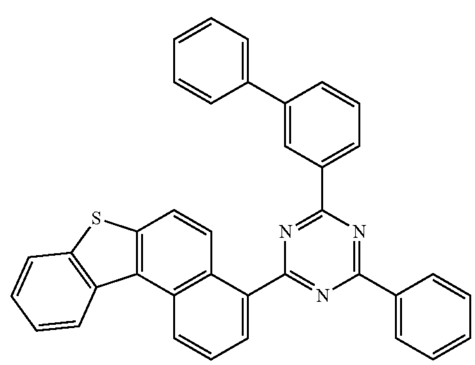

C-114
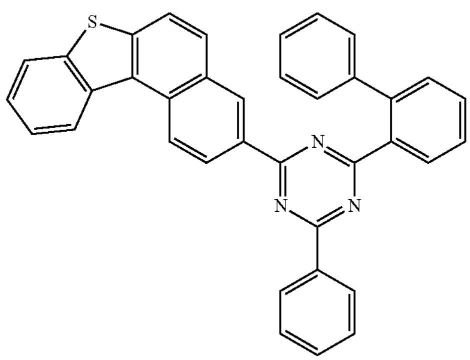
C-115
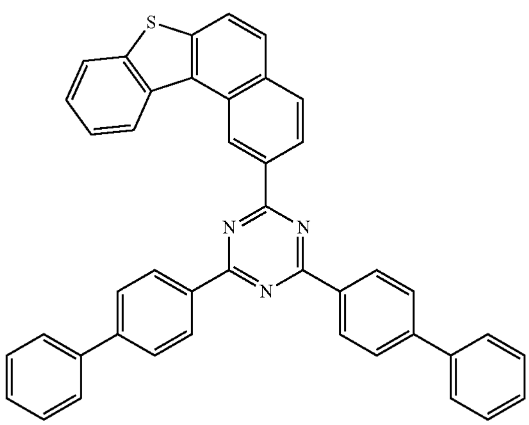
C-116
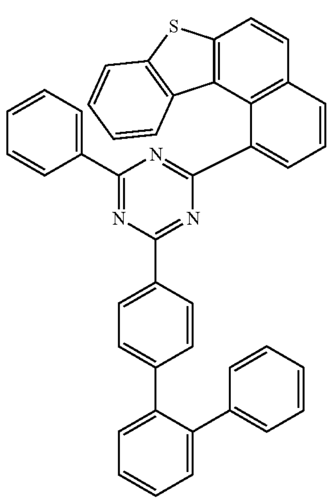
C-117
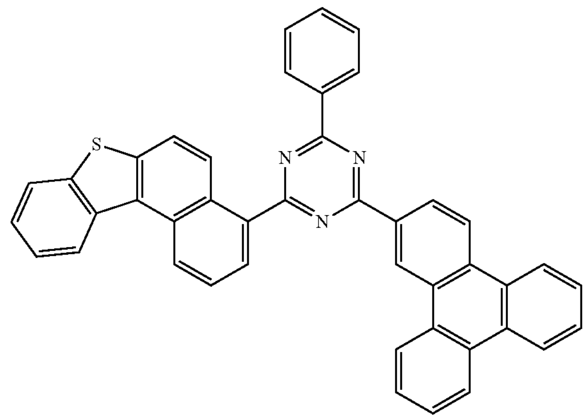
C-118
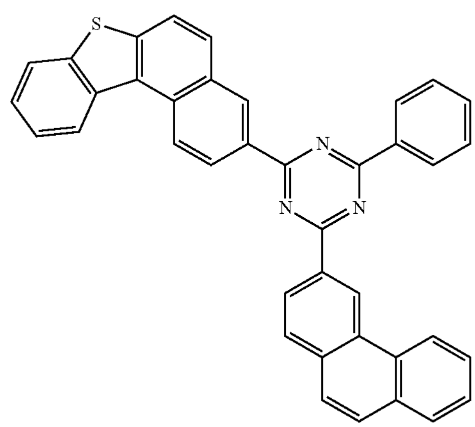
C-119
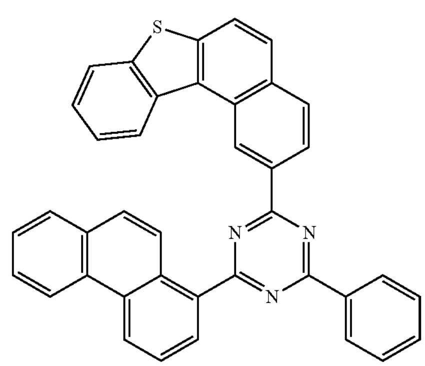

-continued
C-120
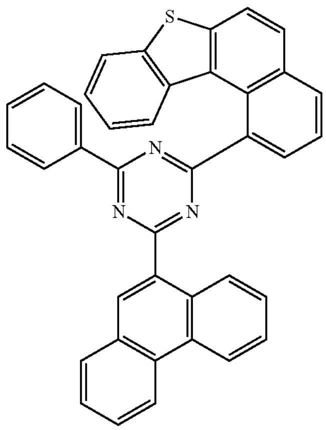
C-121
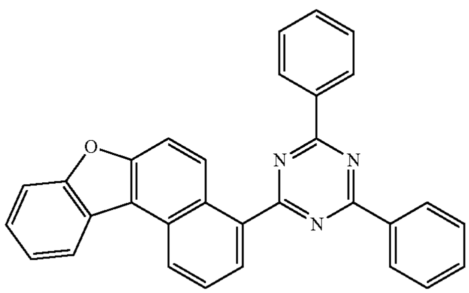
C-122
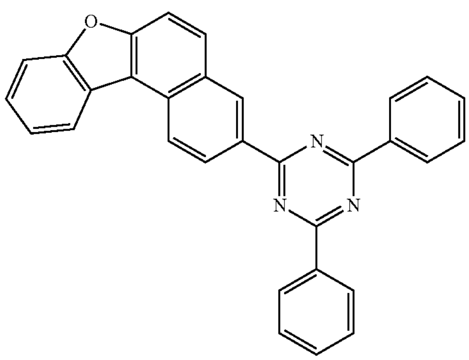
C-123
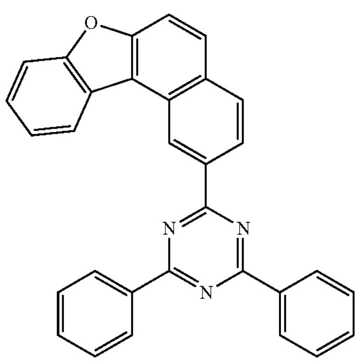
-continued
C-124
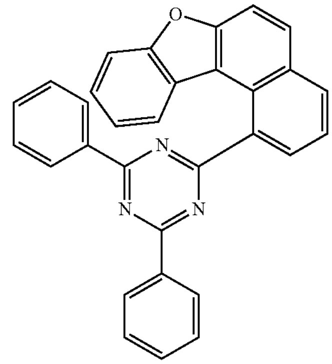
C-125
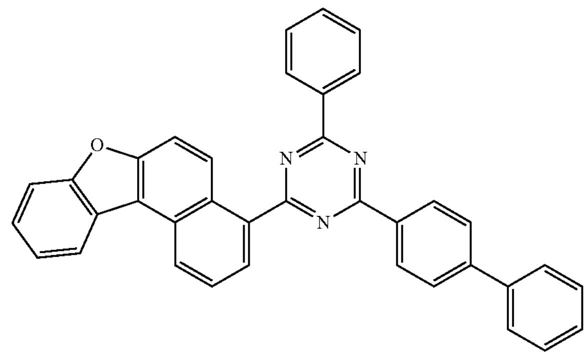
C-126
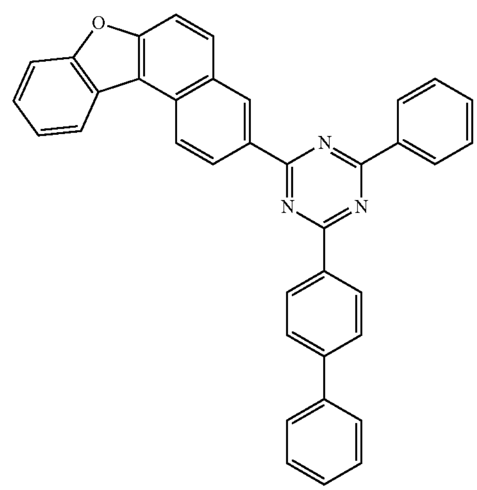
C-127
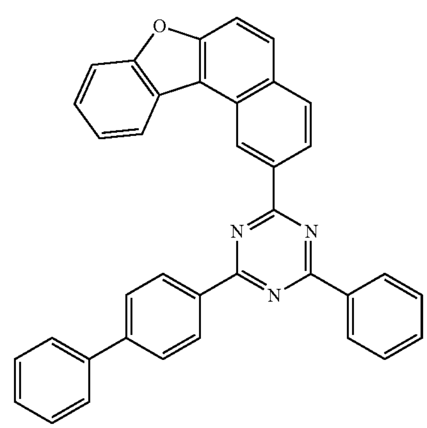

-continued
C-128
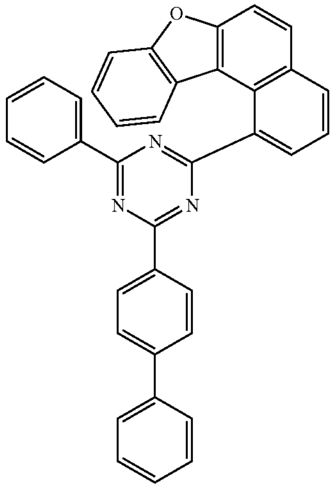
C-129
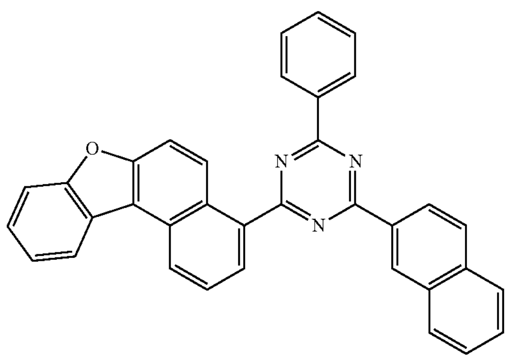
C-130
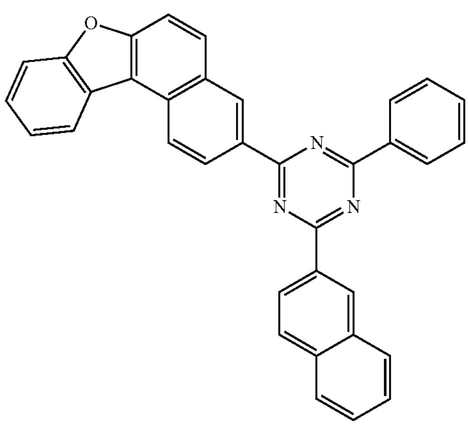
C-131
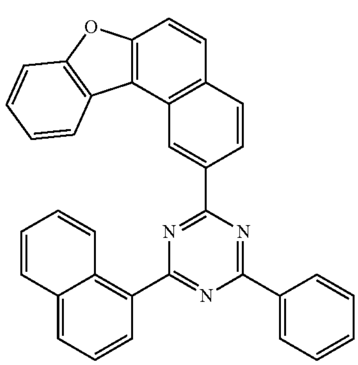
-continued
C-132
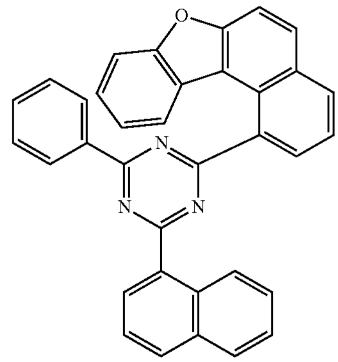
C-133
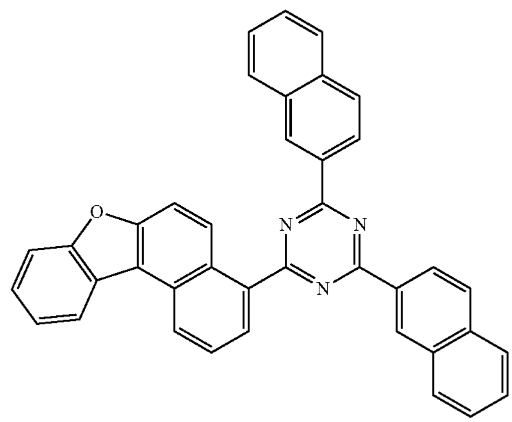
C-134
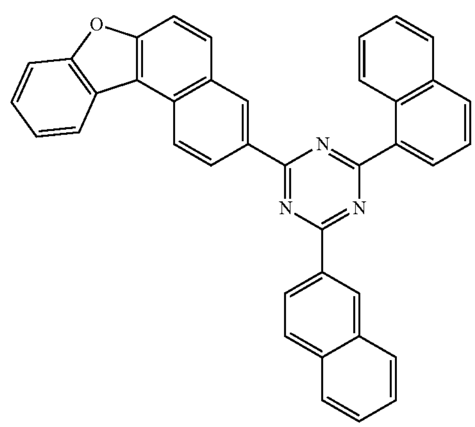
C-135
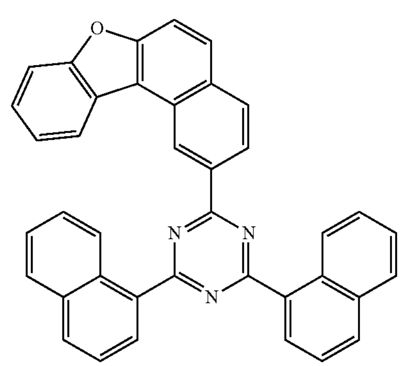

-continued
C-136
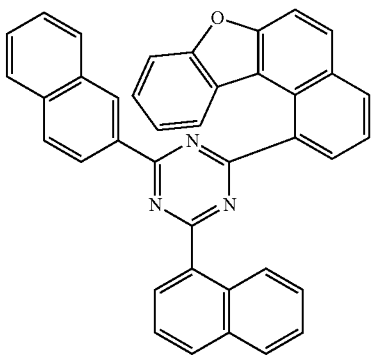
C-137
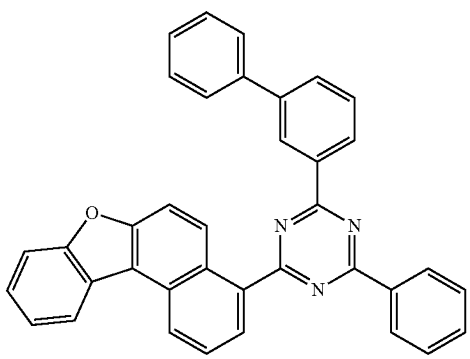
C-138
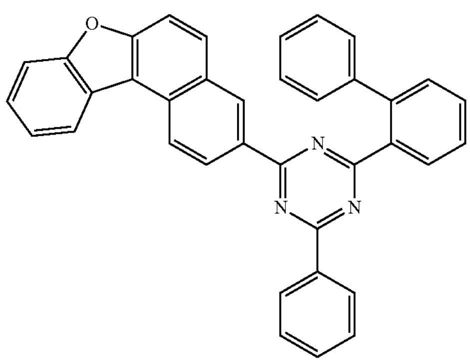
C-139
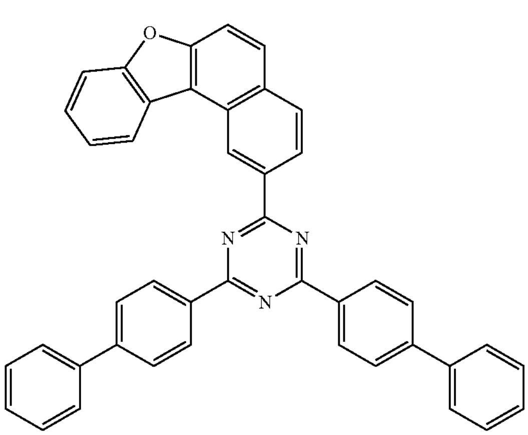
-continued
C-140
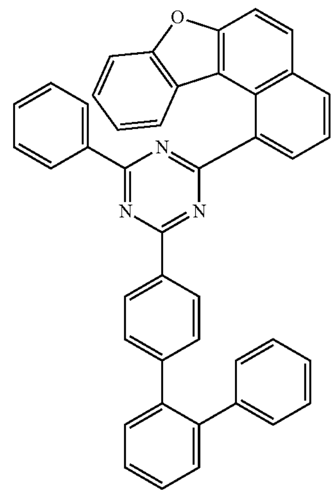
C-141
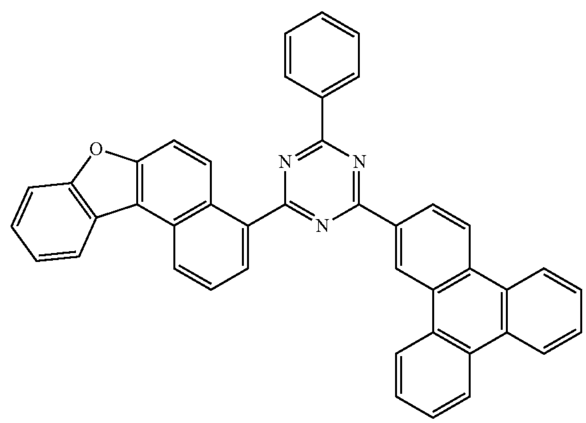
C-142
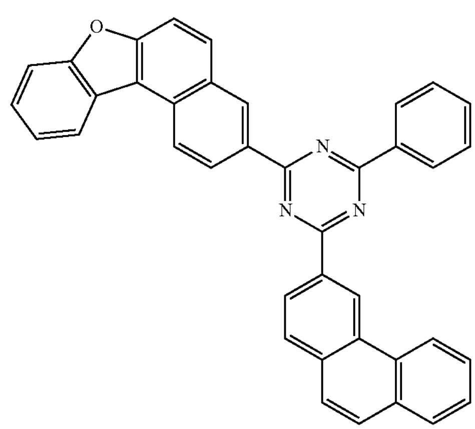

-continued
C-143
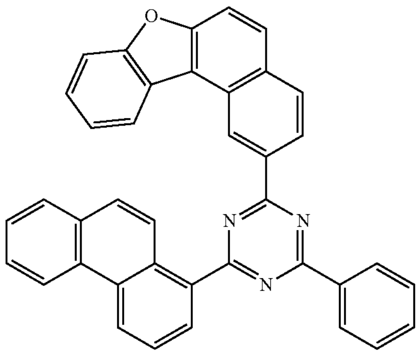
C-144
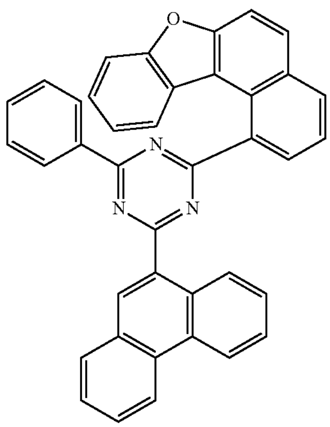
C-145
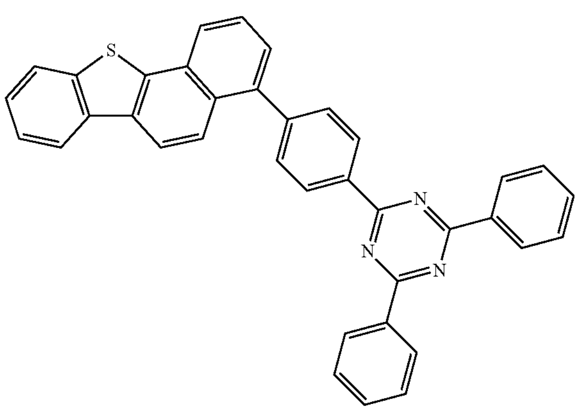
C-146
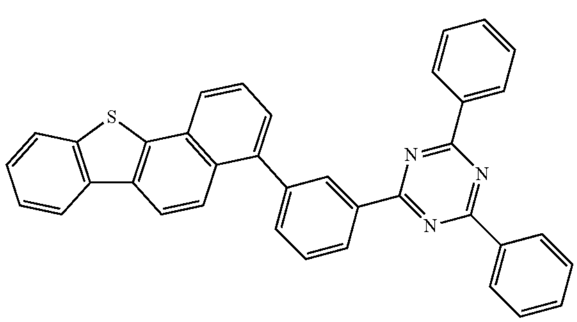
-continued
C-147
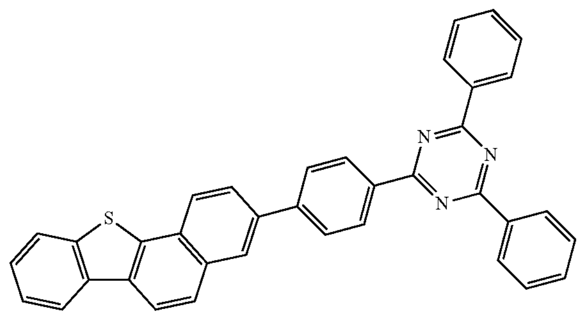
C-148
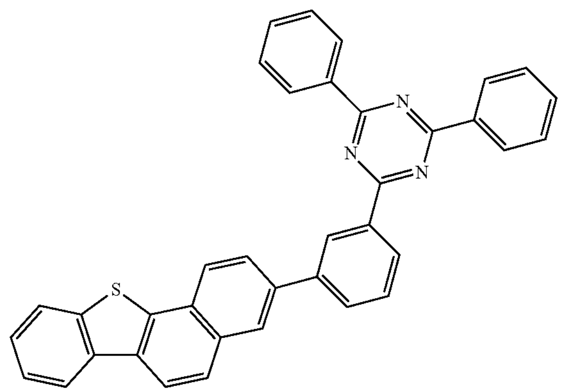
C-149
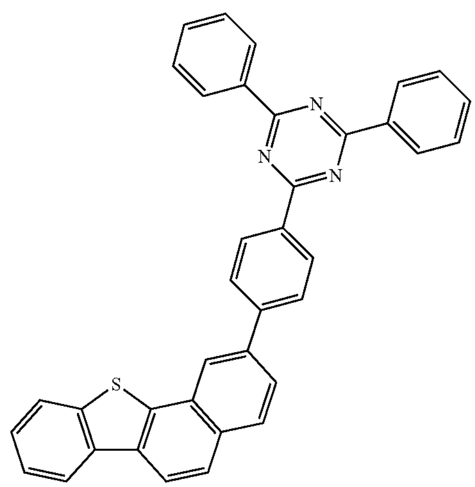

-continued
C-150
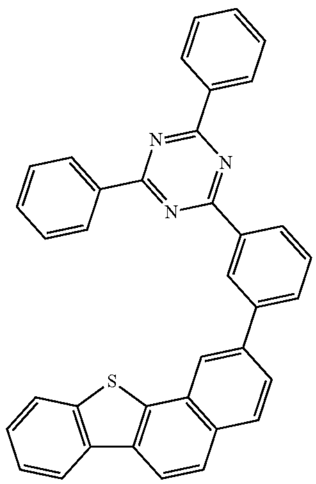
C-151
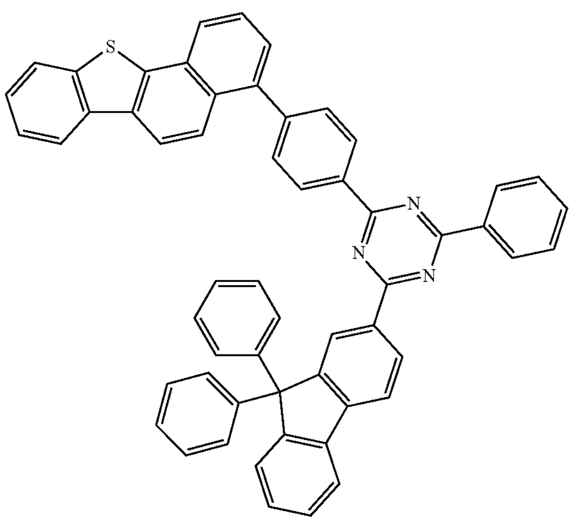
C-152
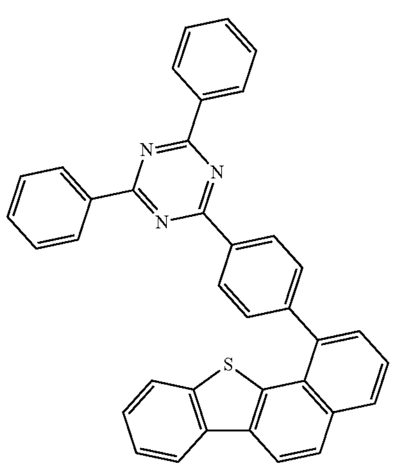
-continued
C-153
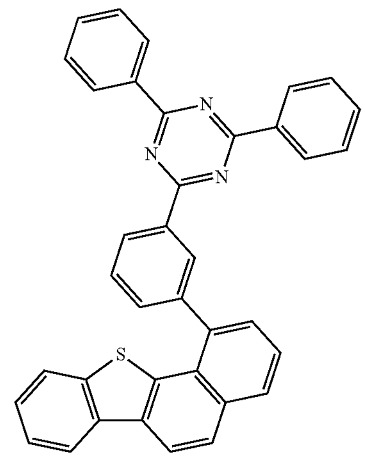
C-154
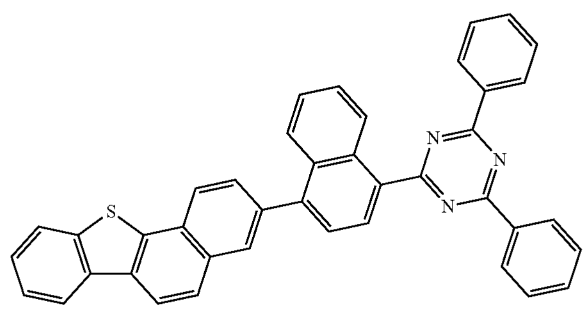
C-155
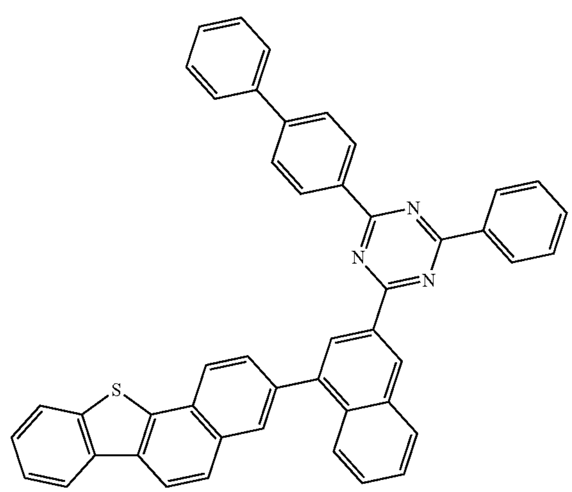

C-156
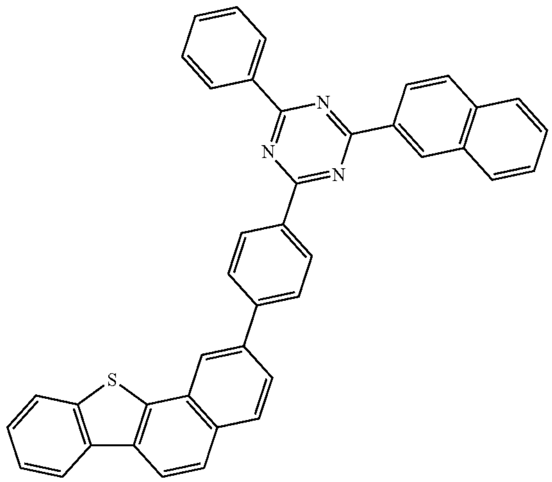
C-157
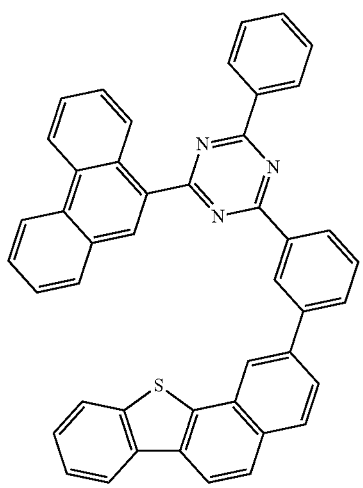
C-158
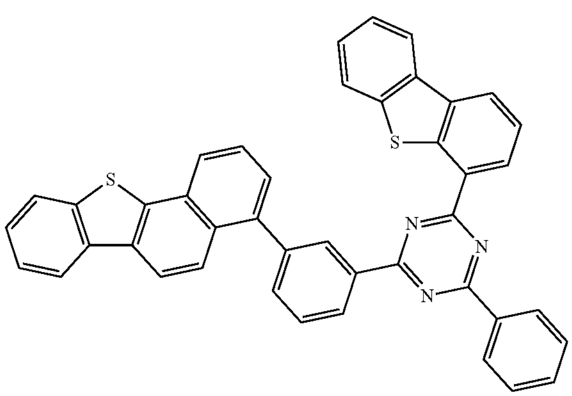
C-159
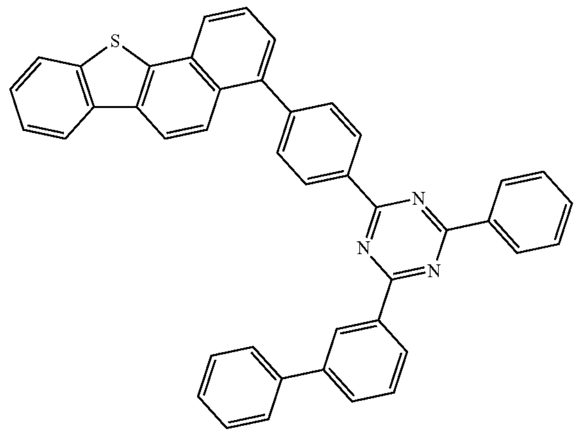
C-160
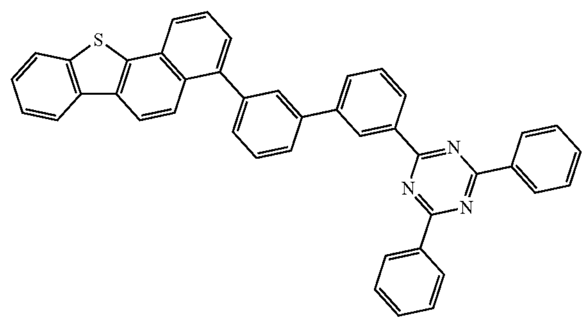
C-161
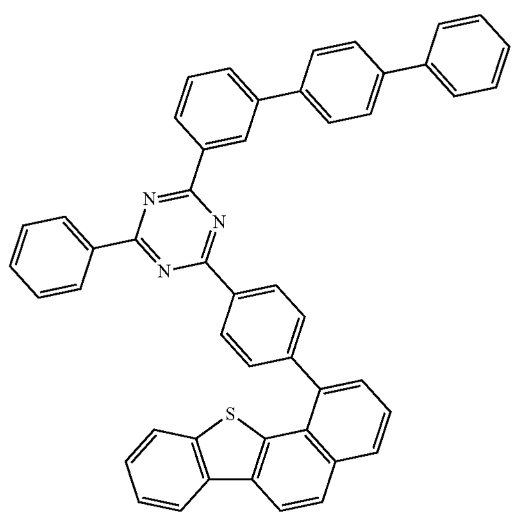

C-162
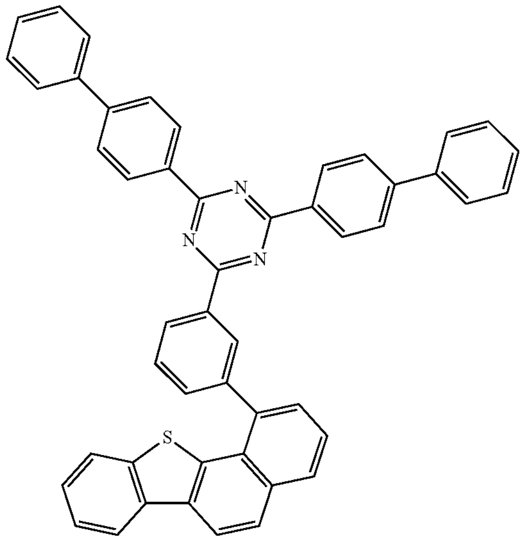
C-163
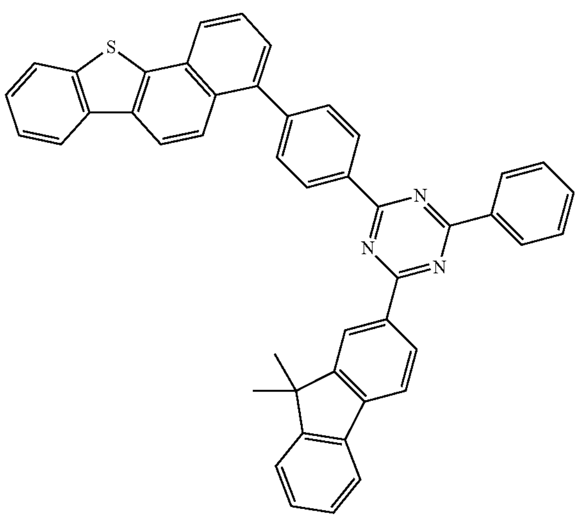
C-164
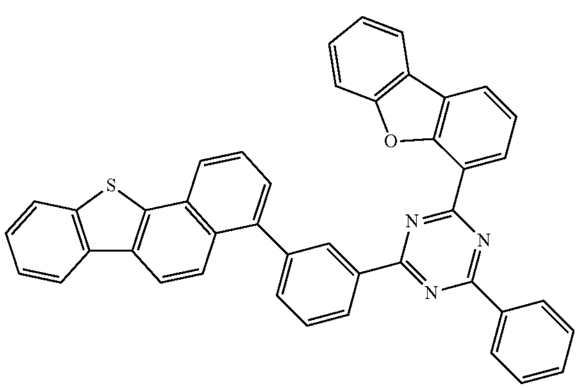
C-165
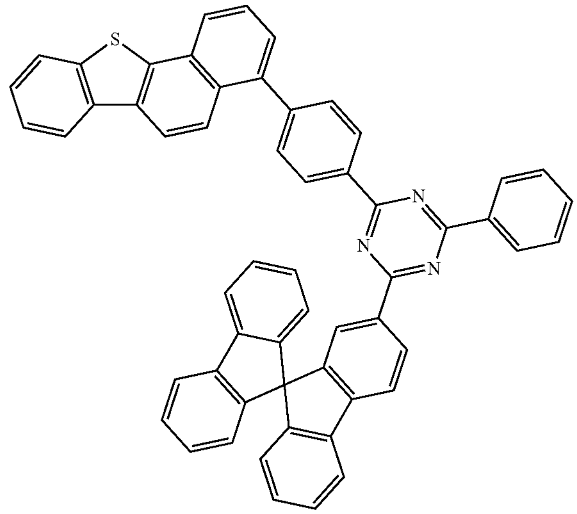
C-166
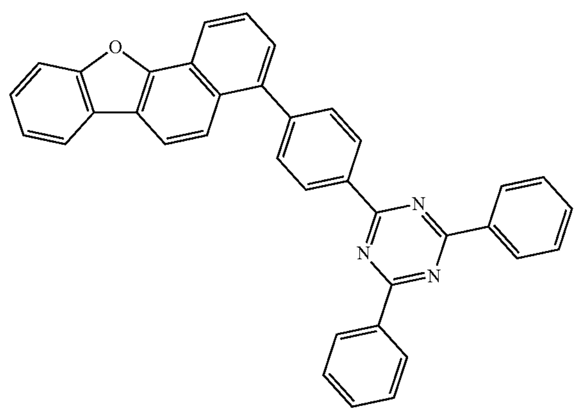
C-167
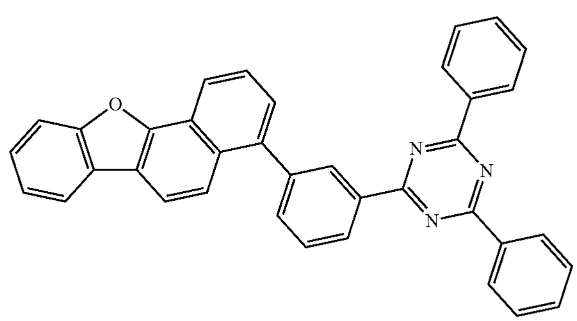
C-168
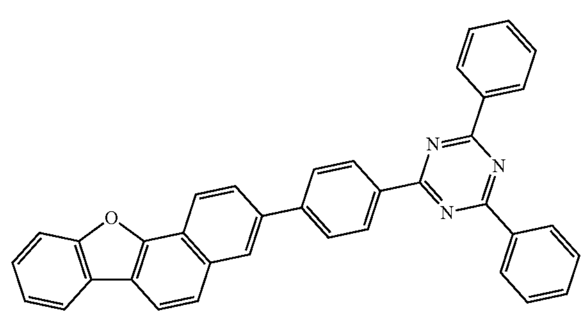

-continued
C-169
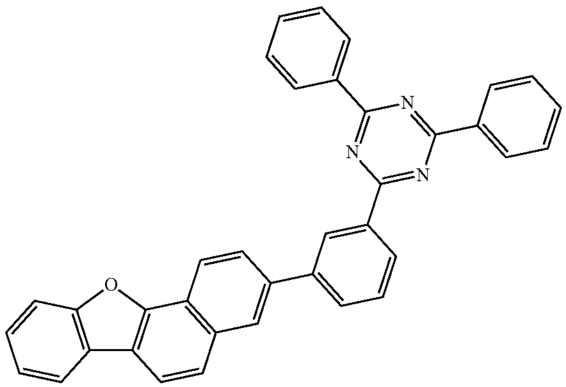
C-170
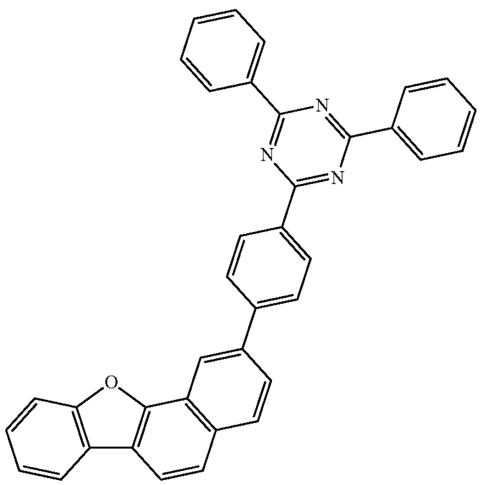
C-171
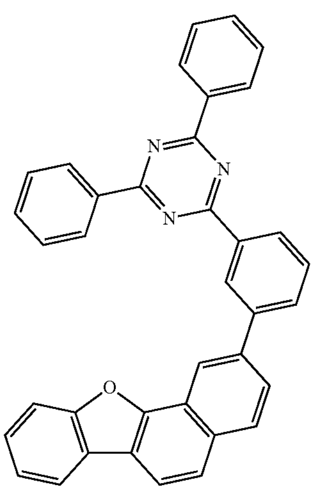
-continued
C-172
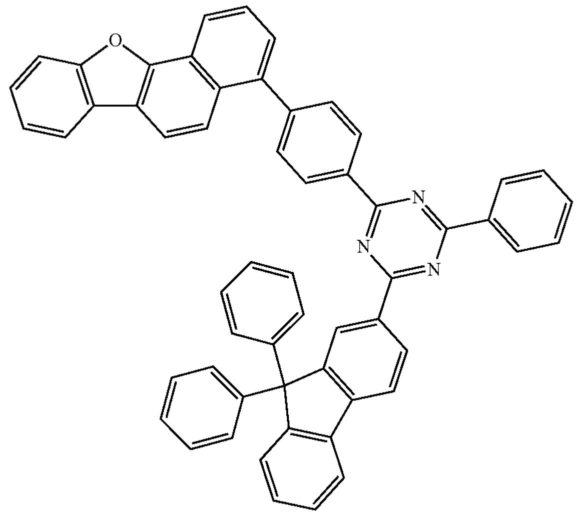
C-173
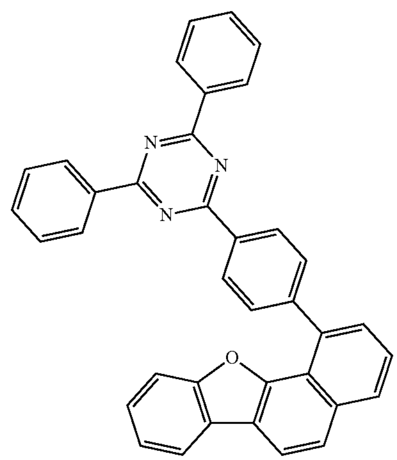
C-174
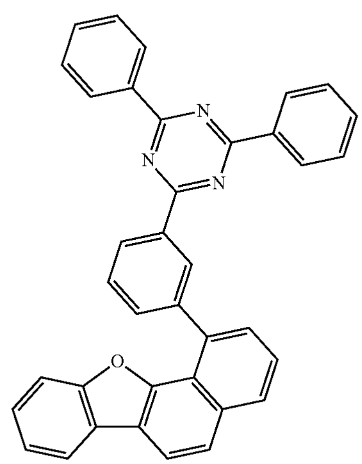

-continued
C-175
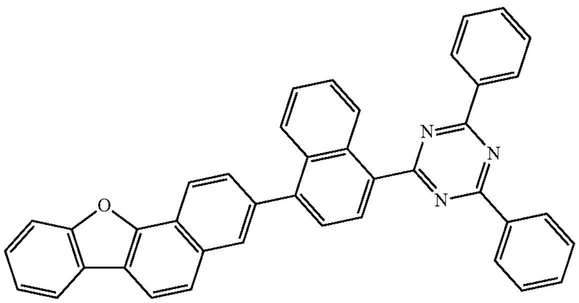
C-176
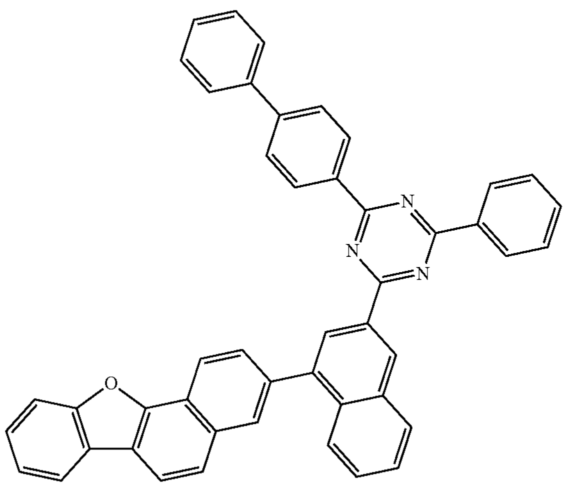
C-177
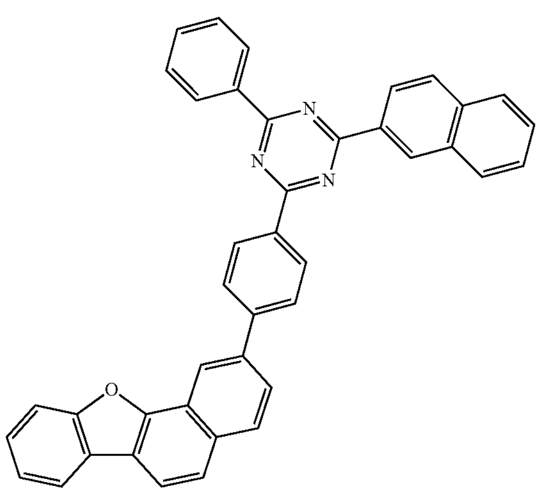
-continued
C-178
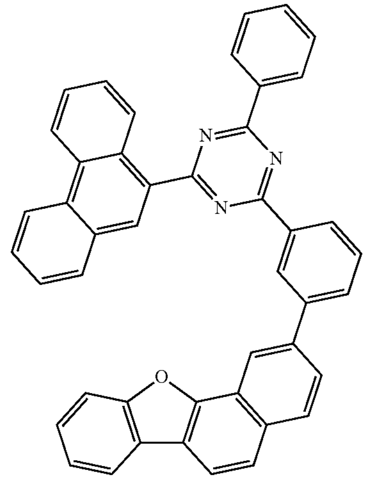
C-179
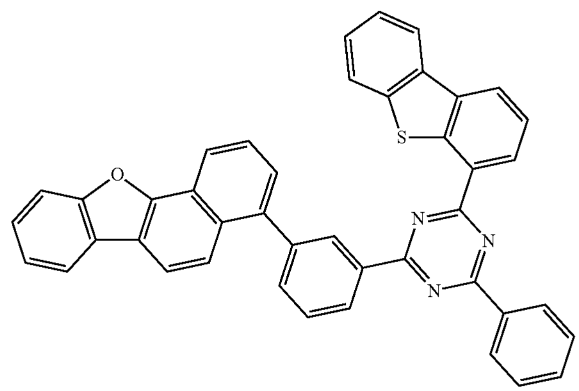
C-180
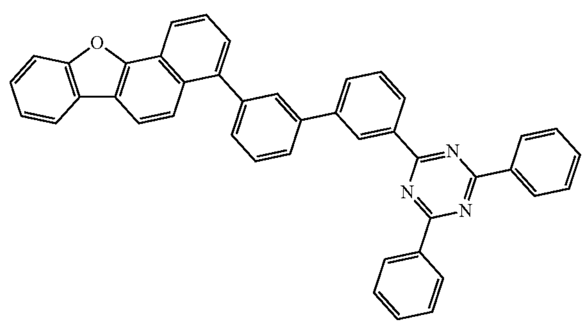
C-181
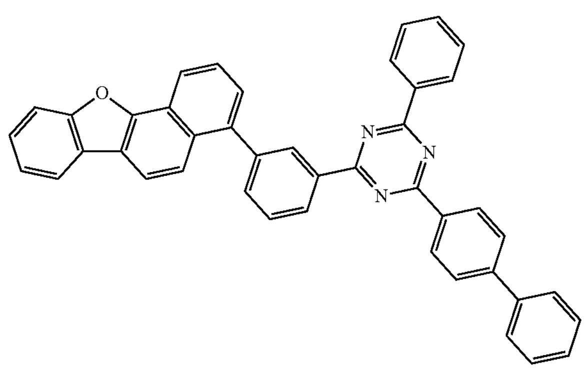

C-182
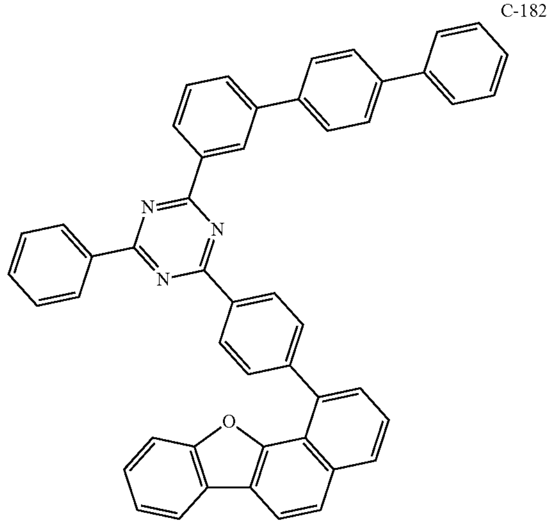
C-183
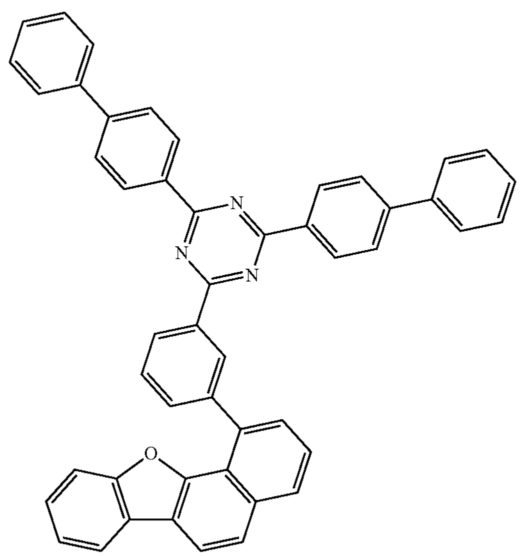
C-184
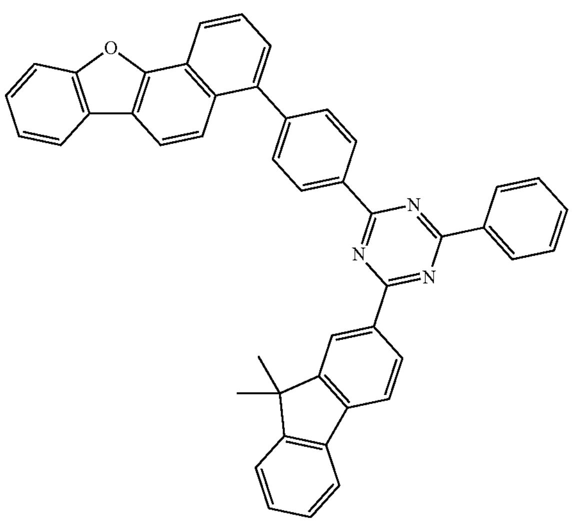
C-185
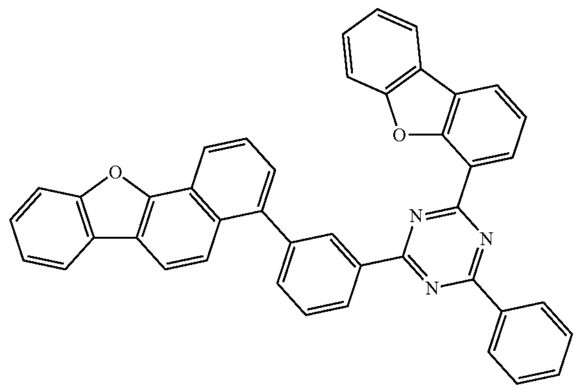
C-186
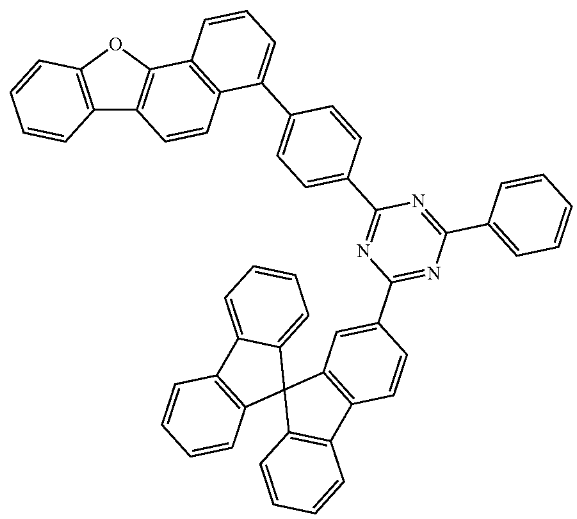
C-187
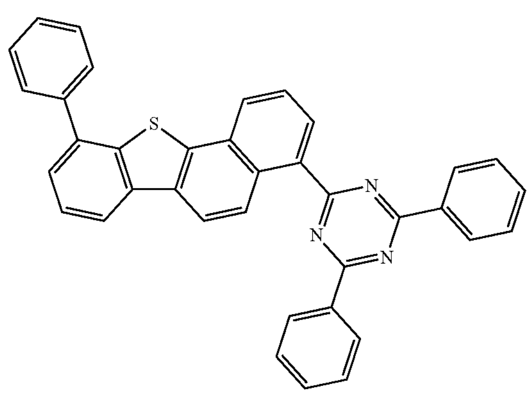

-continued
C-188
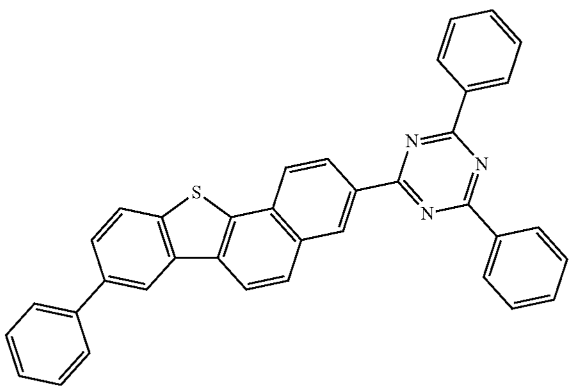
C-189
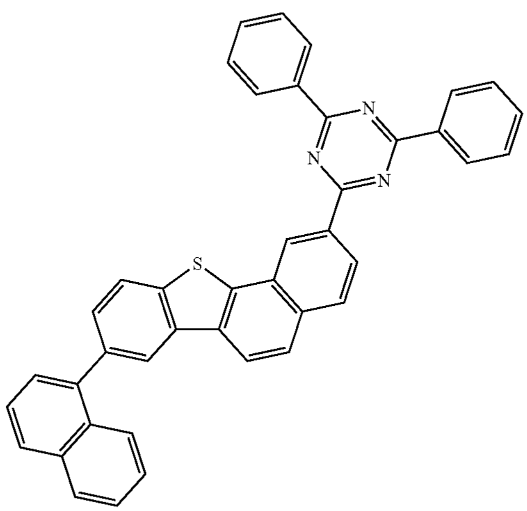
C-190
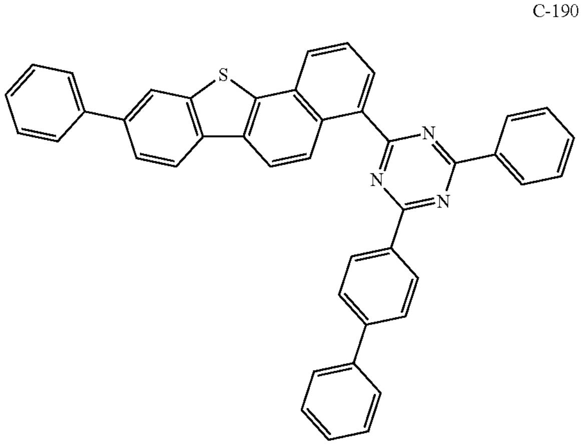
-continued
C-191
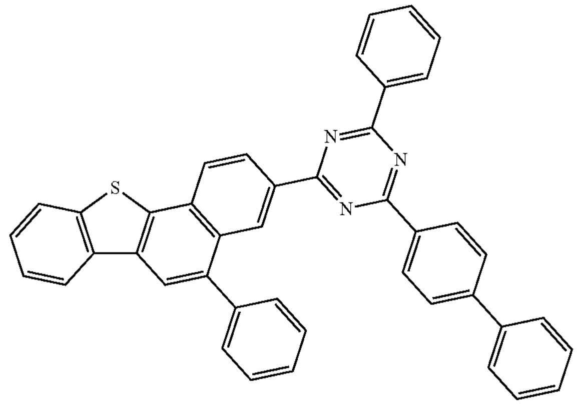
C-192
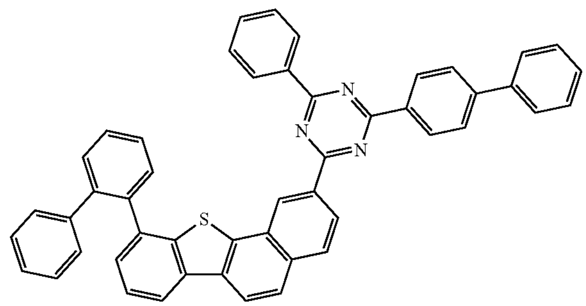
C-193
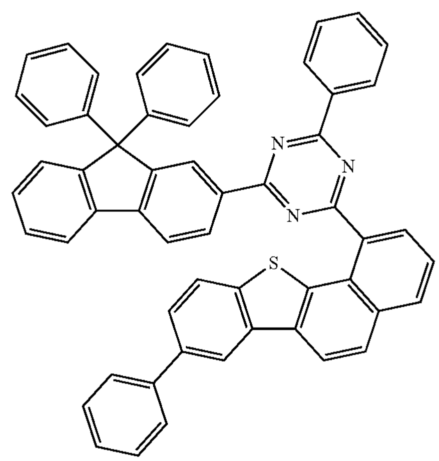
C-194
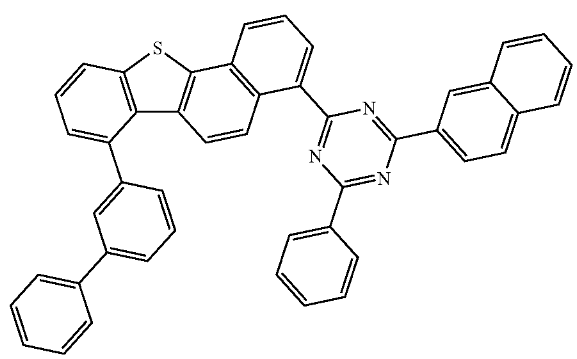

-continued
C-195
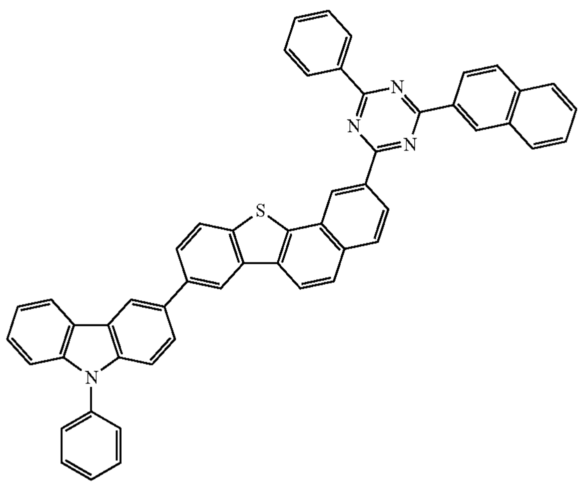
C-196
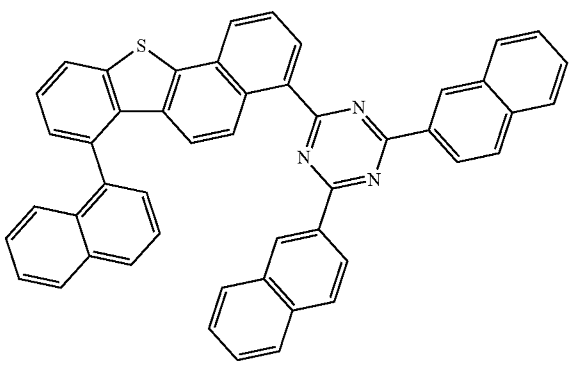
C-197
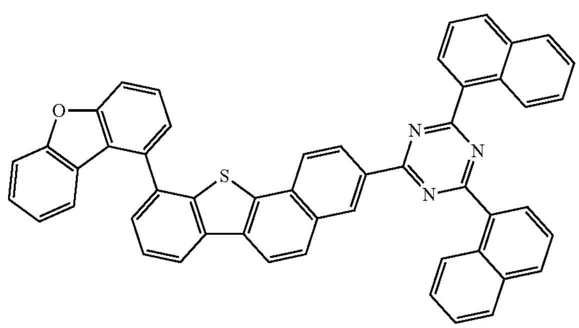
C-198
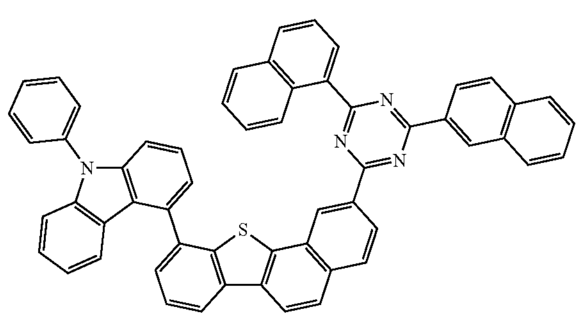
-continued
C-199
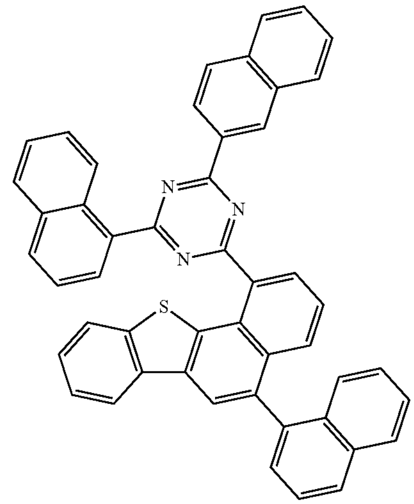
C-200
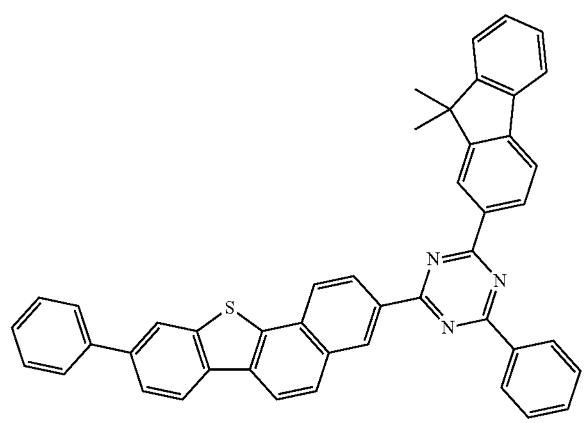
C-201
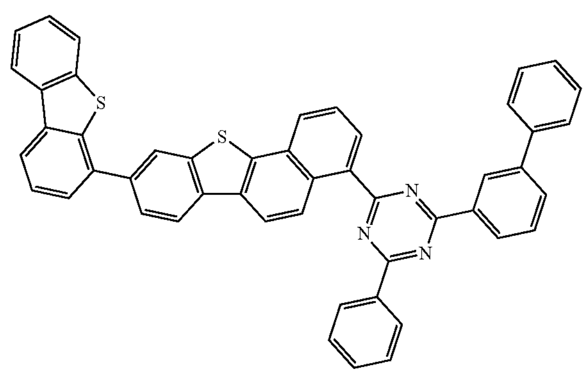

C-202
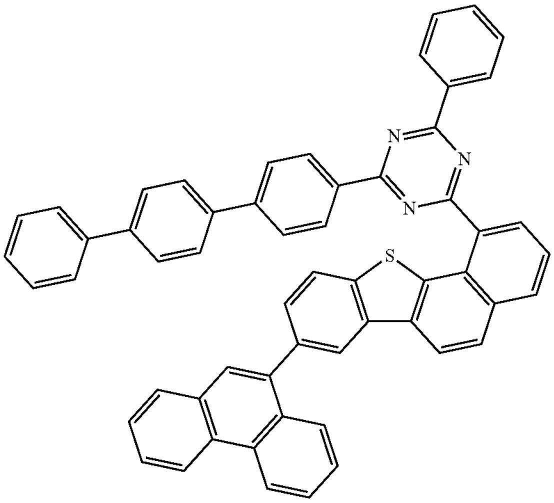
C-203
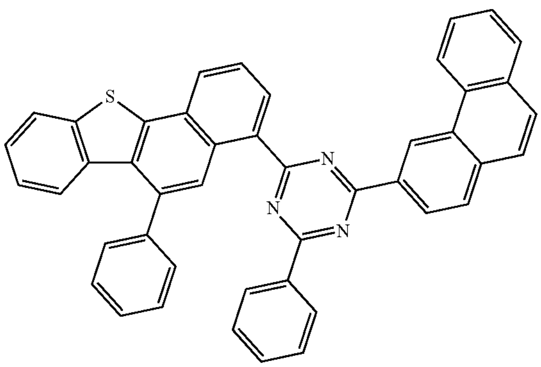
C-204
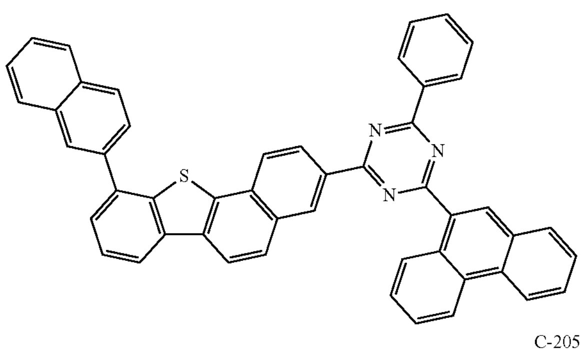
C-205
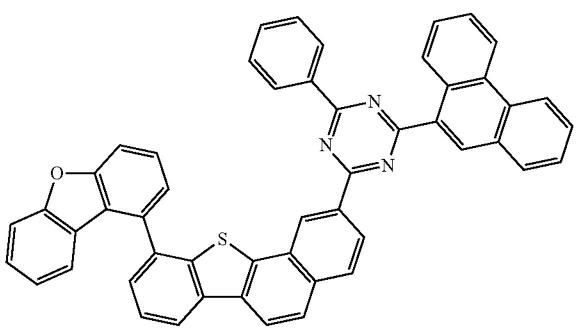
C-206
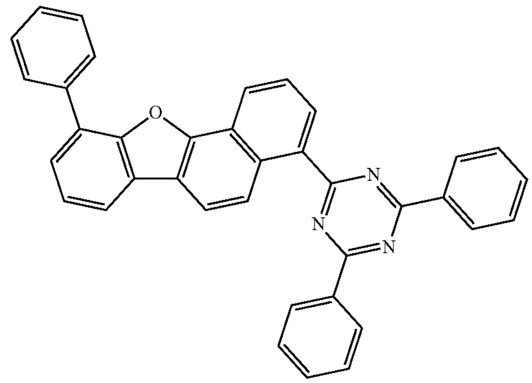
C-207
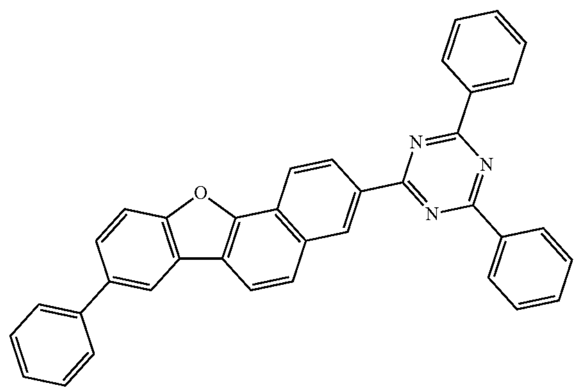
C-208
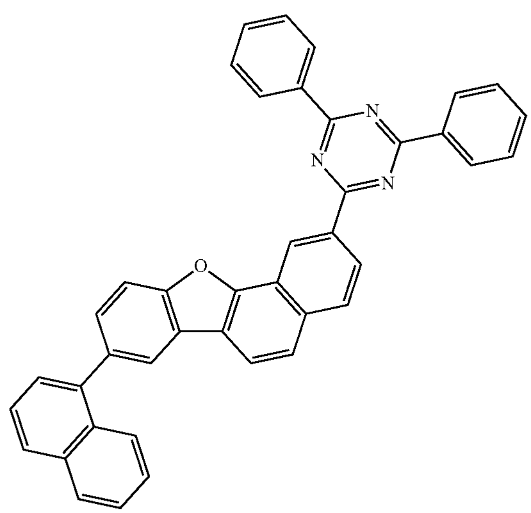

C-209
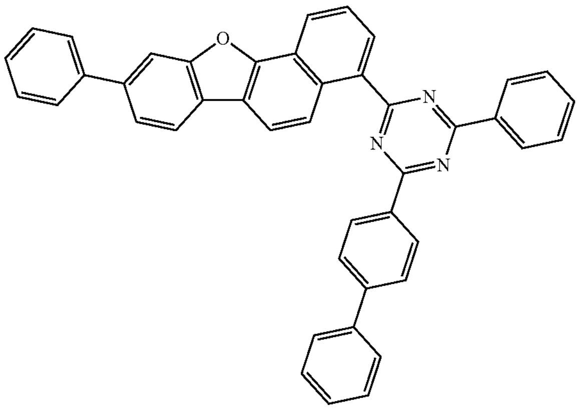
C-210
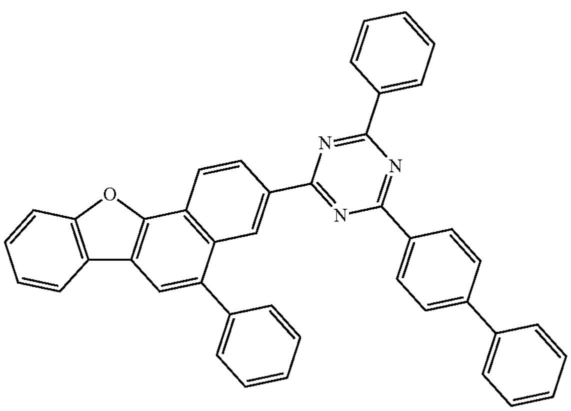
C-211
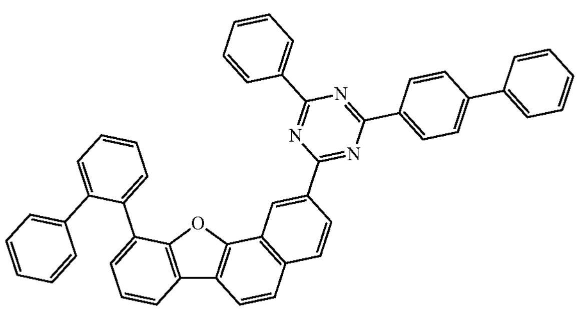
C-212
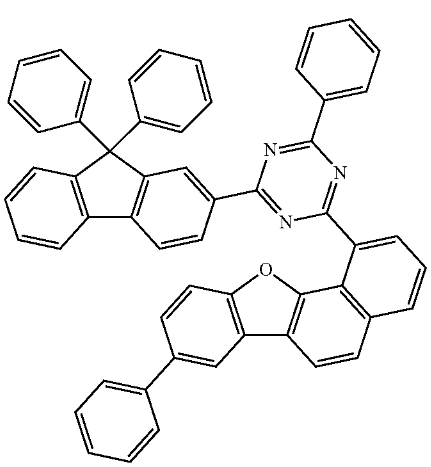
C-213
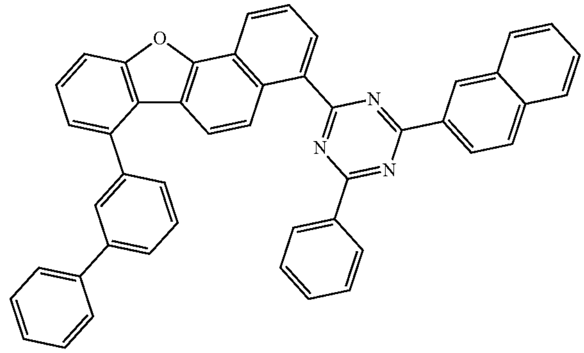
C-214
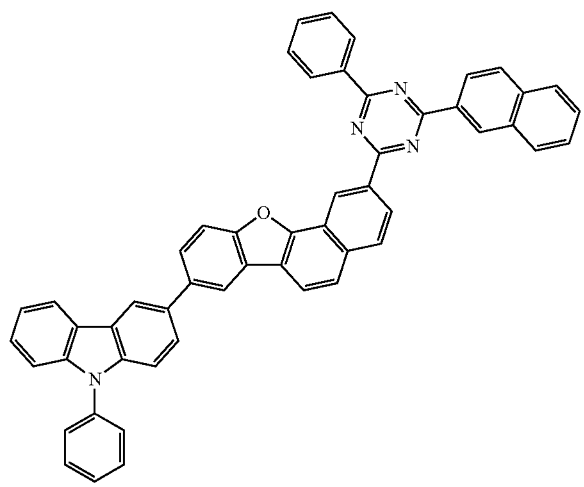
C-215
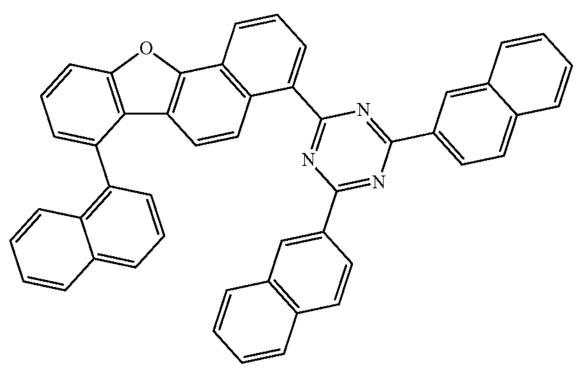
C-216
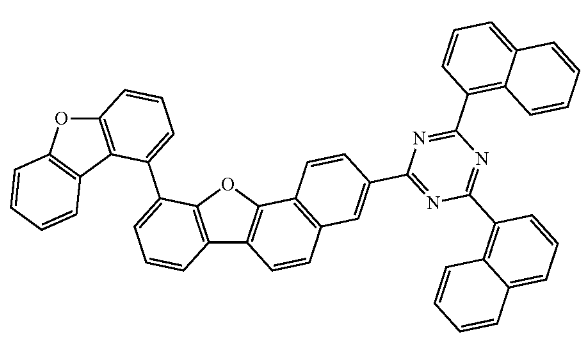

-continued
C-217
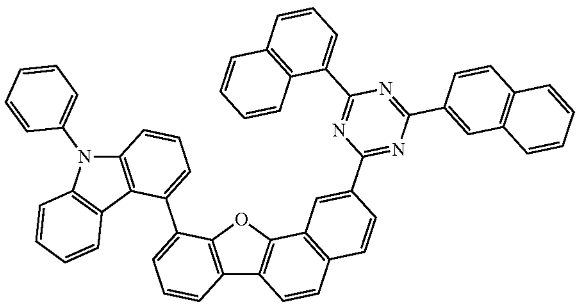
C-218
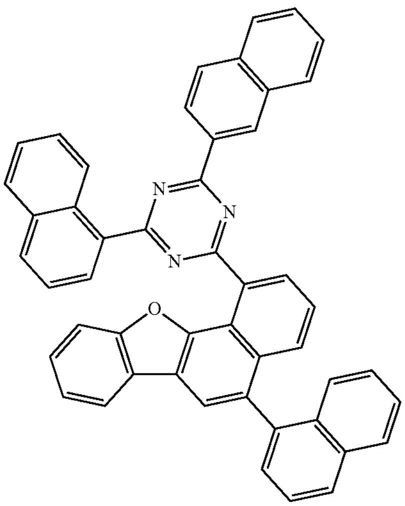
C-219
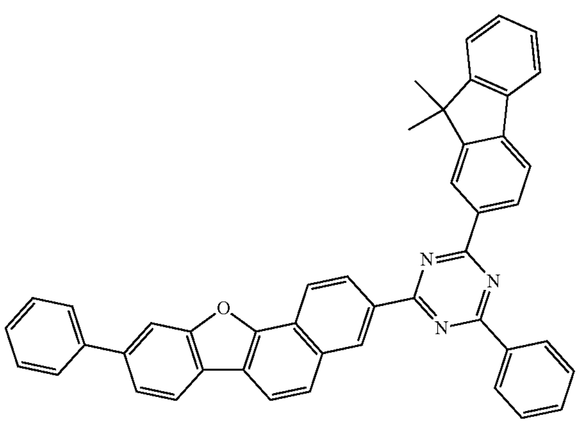
C-220
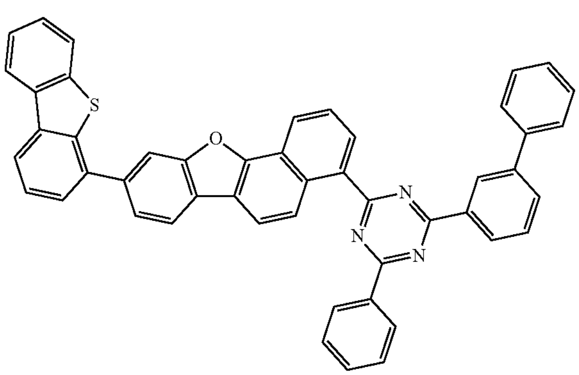
-continued
C-221
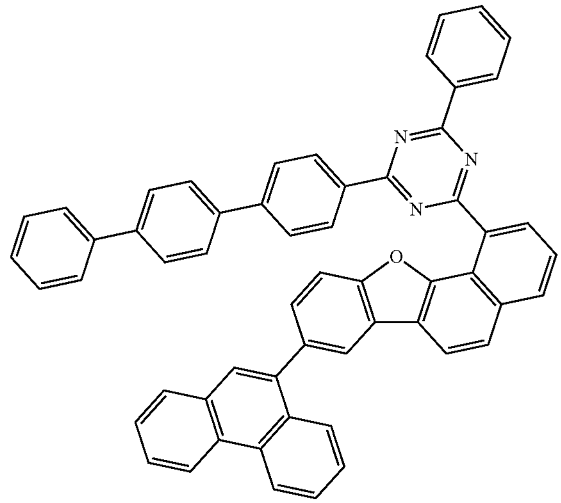
C-222
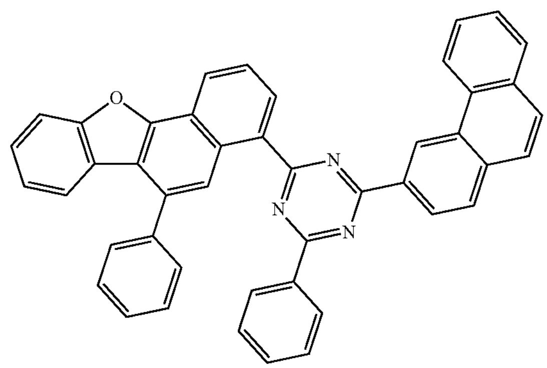
C-223
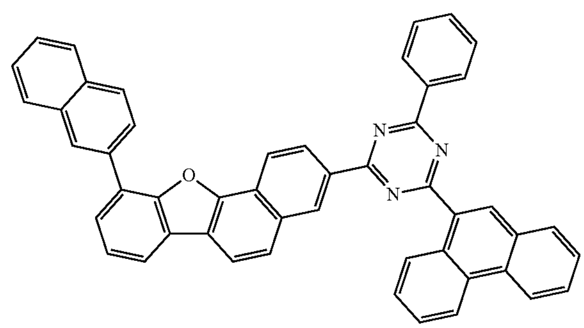
C-224
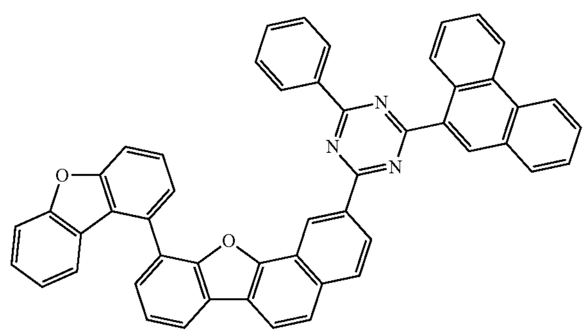

-continued
C-225
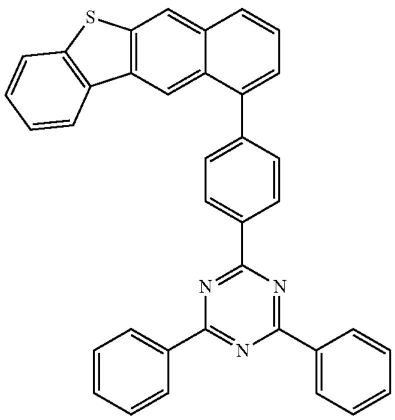
C-226
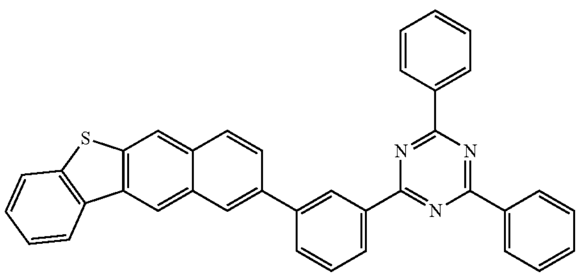
C-227
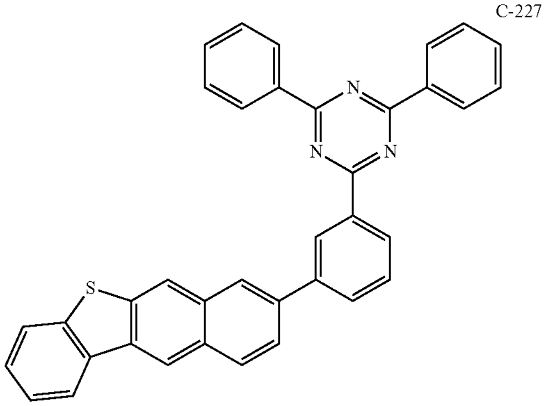
C-228
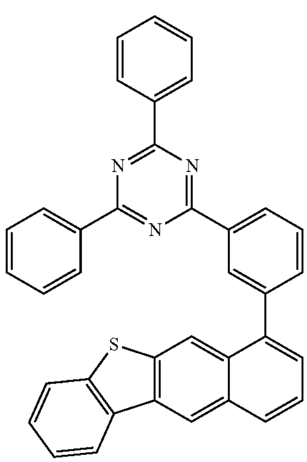
-continued
C-229
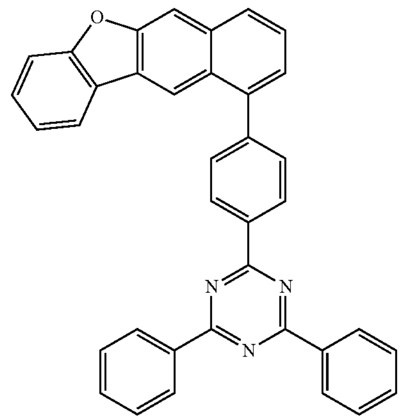
C-230
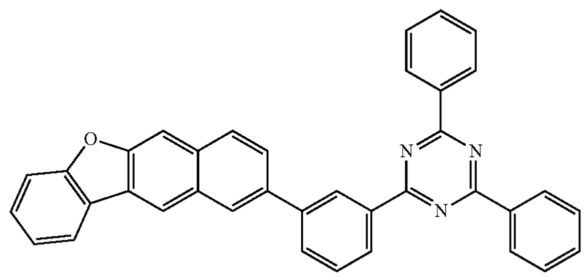
C-231
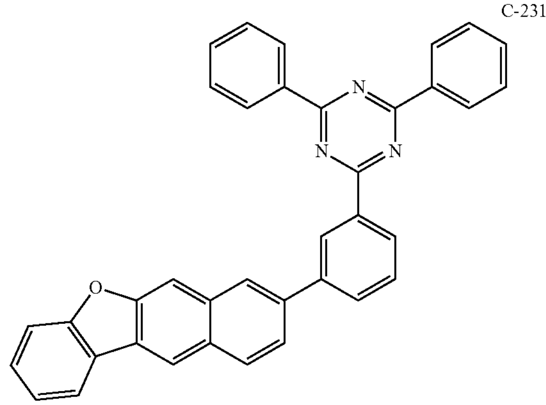
C-232
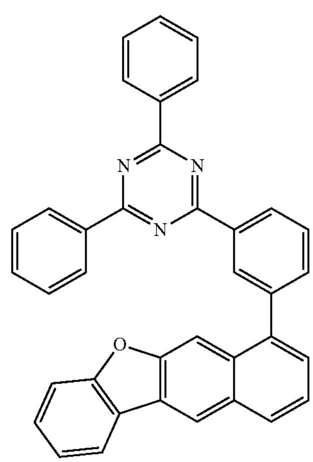

-continued
C-233
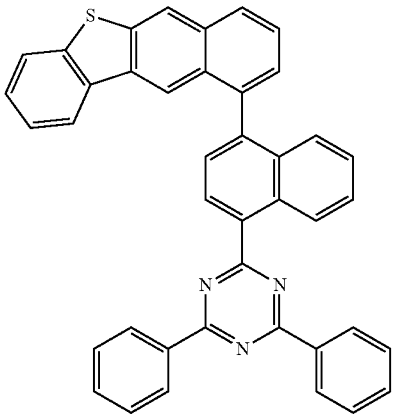
C-234
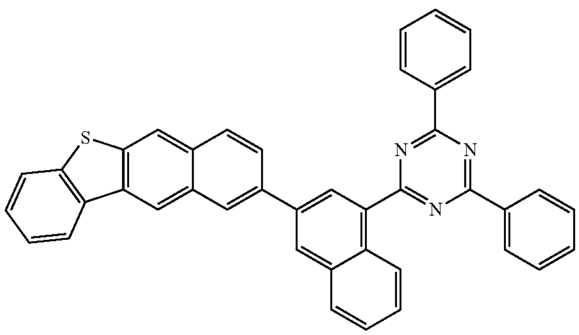
C-235
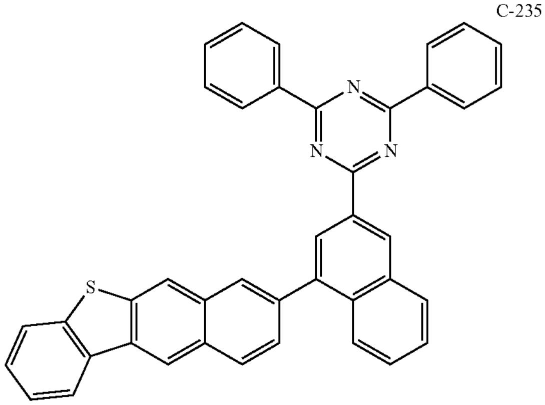
C-236
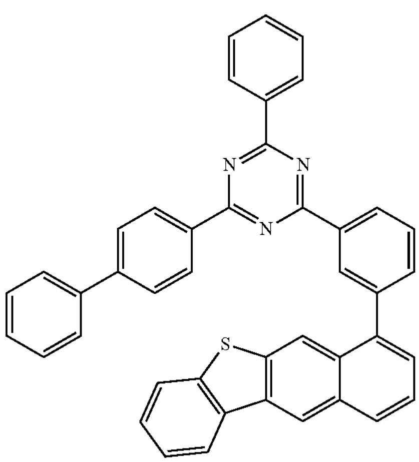
-continued
C-237
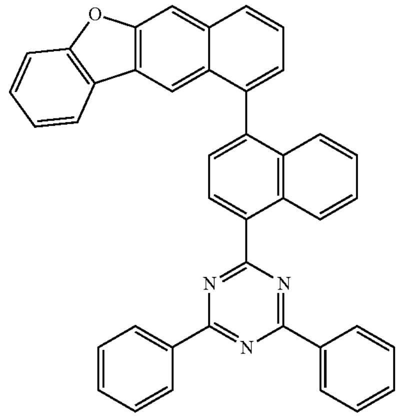
C-238
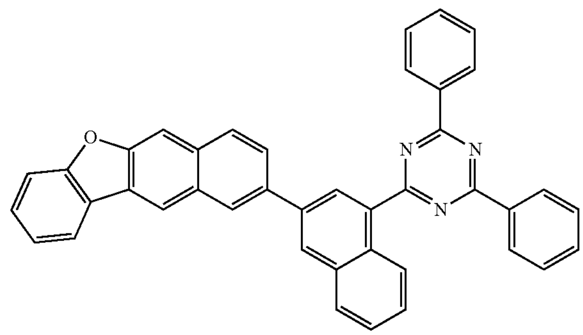
C-239
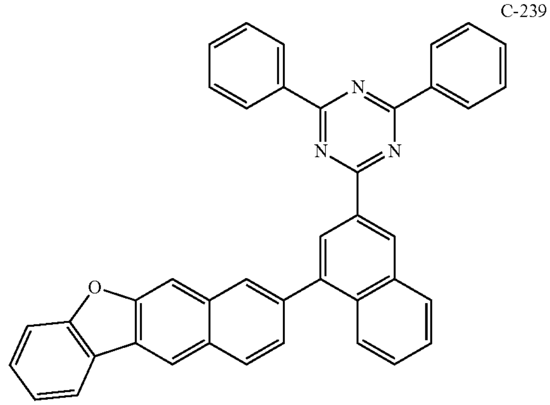
C-240
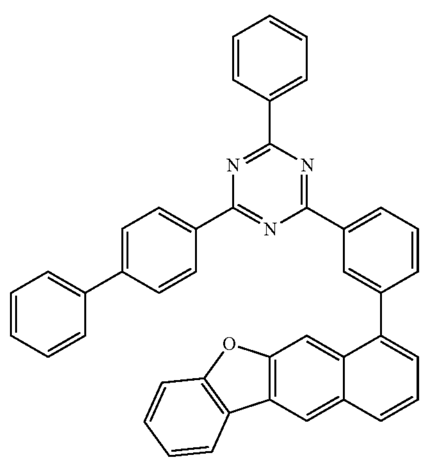

-continued
C-241
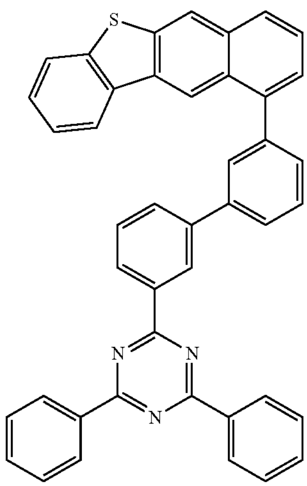
C-242
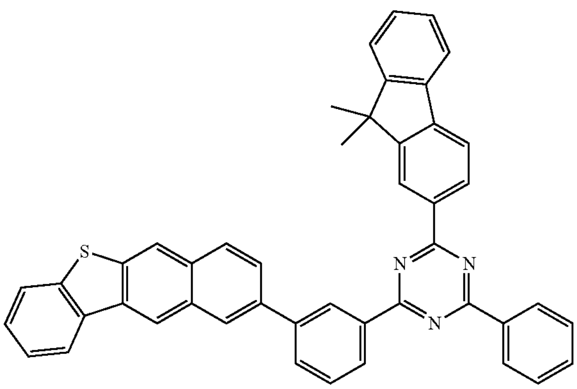
C-243
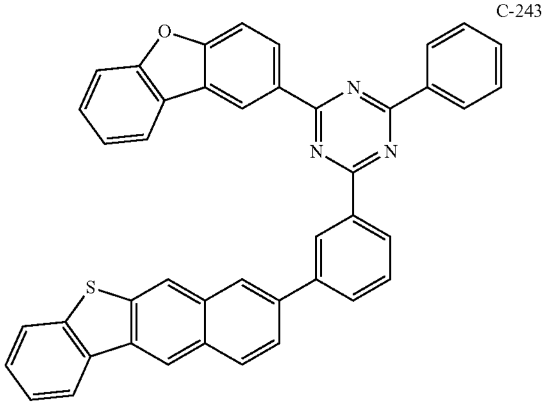
-continued
C-244
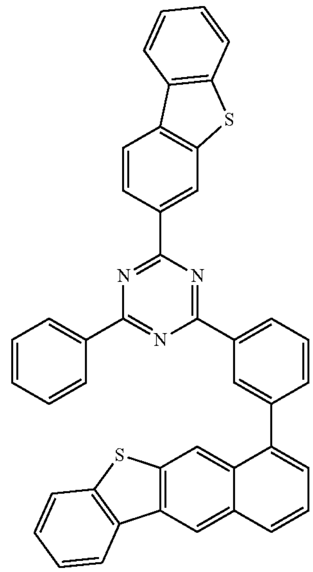
C-245
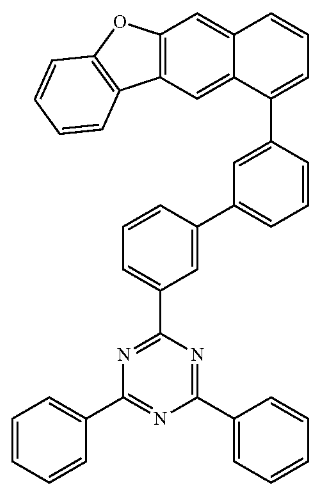
C-246
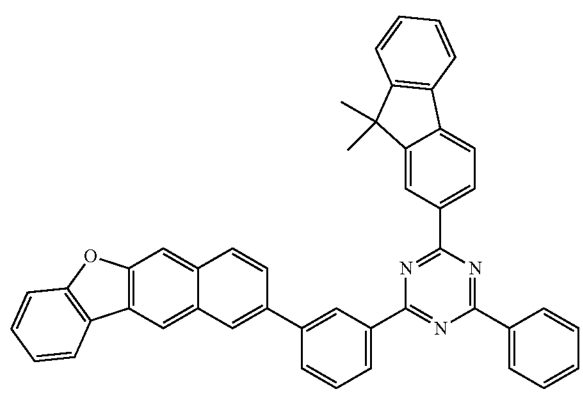

-continued
C-247
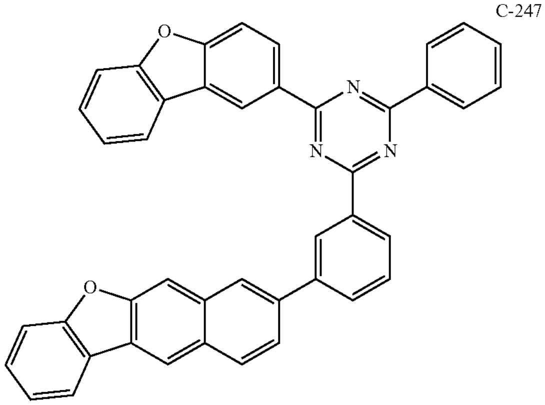
C-248
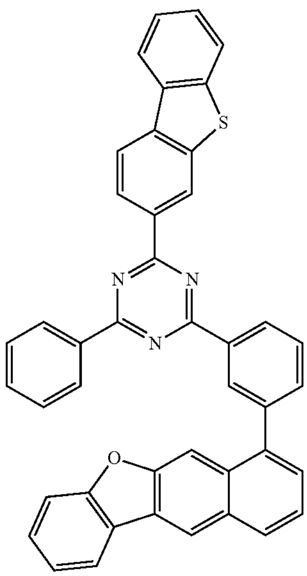
C-249
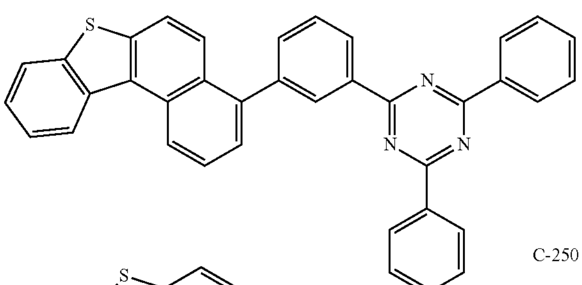
C-250
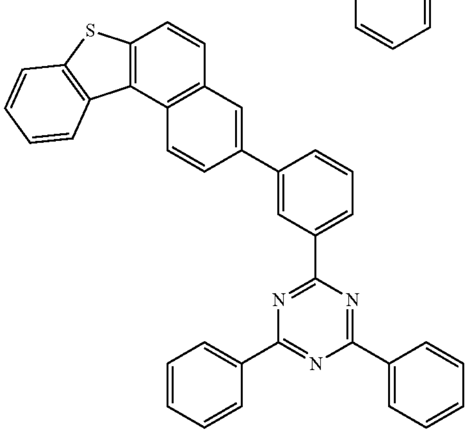
-continued
C-251
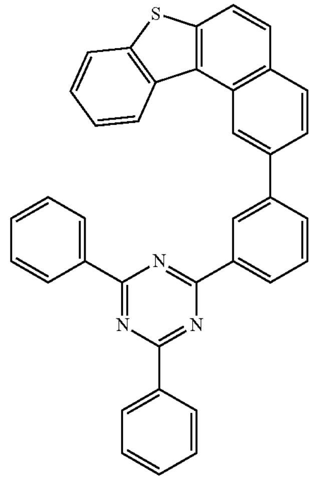
C-252
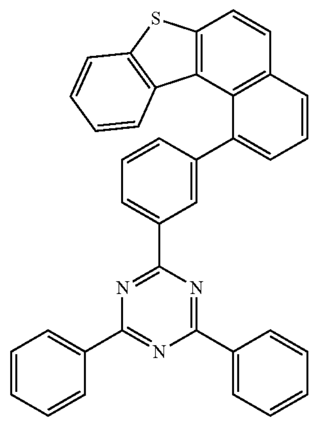
C-253
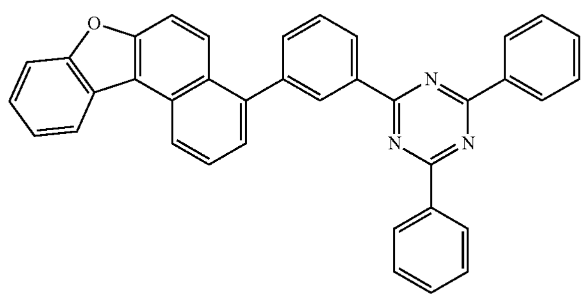
C-254
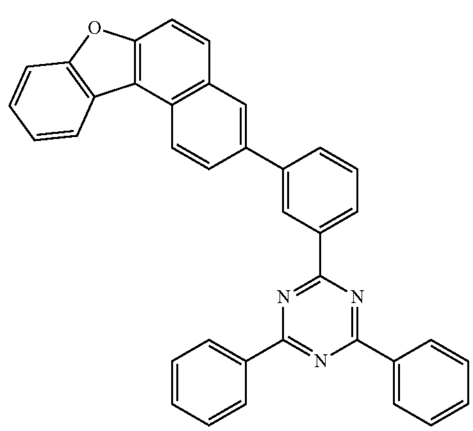

-continued
C-255
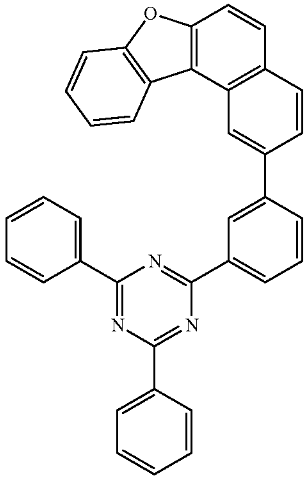
C-256
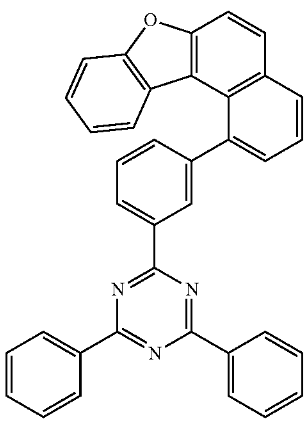
C-257
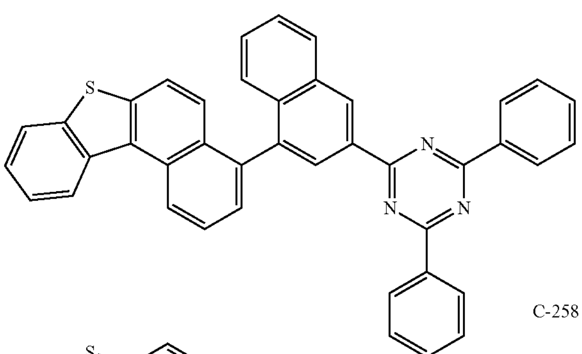
C-258
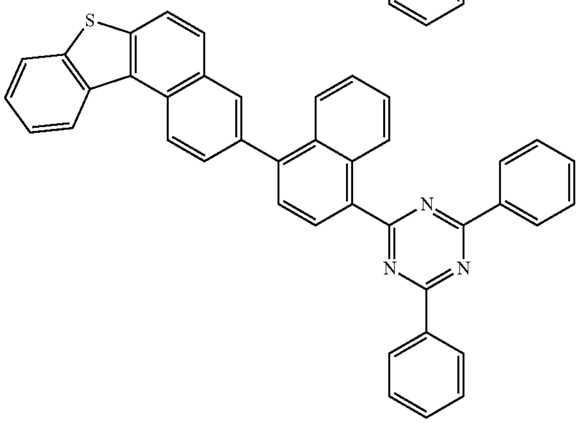
-continued
C-259
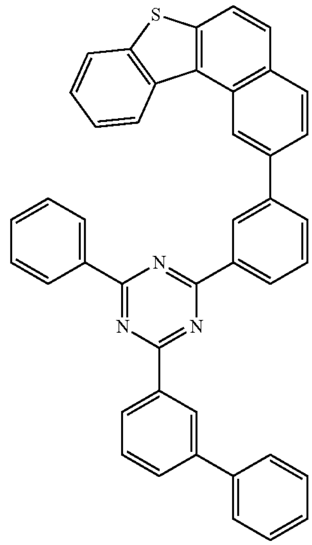
C-260
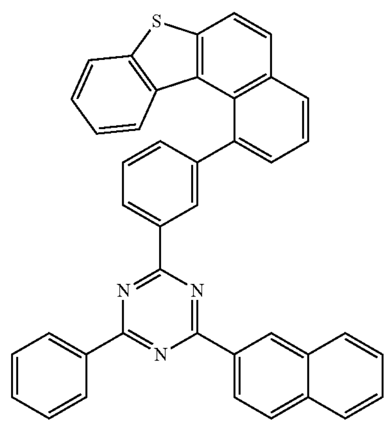
C-261
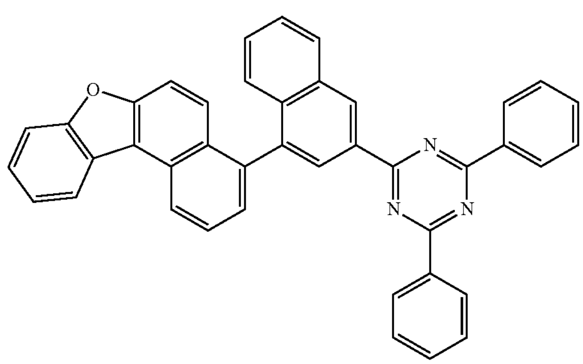

C-262
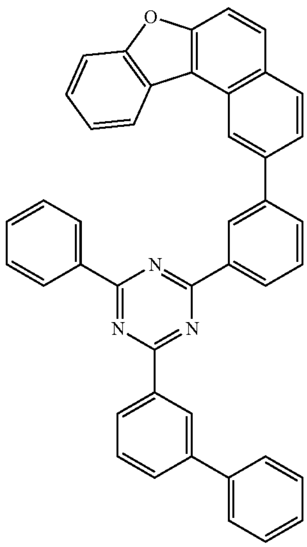
C-263
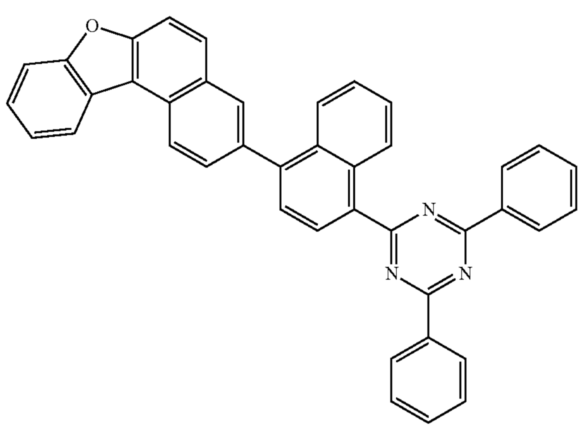
C-264
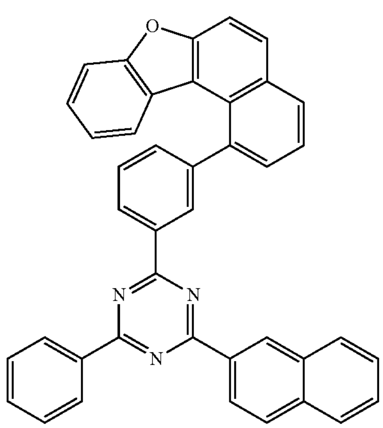
C-265
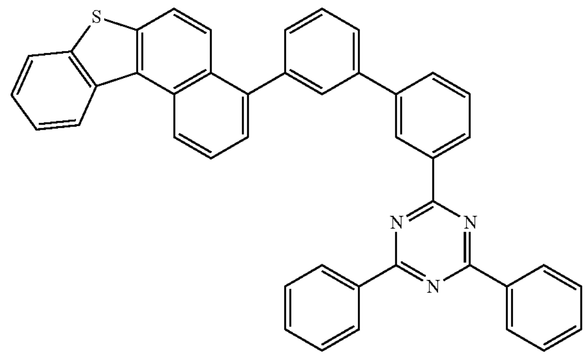
C-266
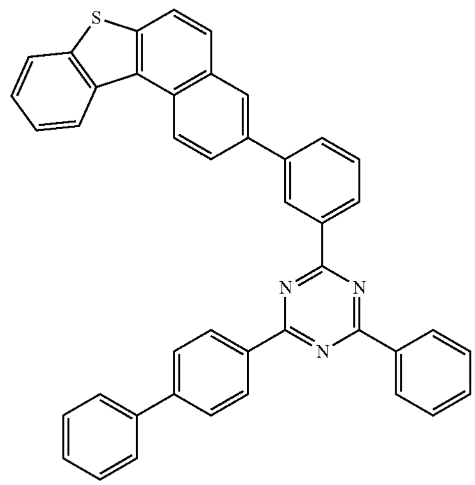
C-267
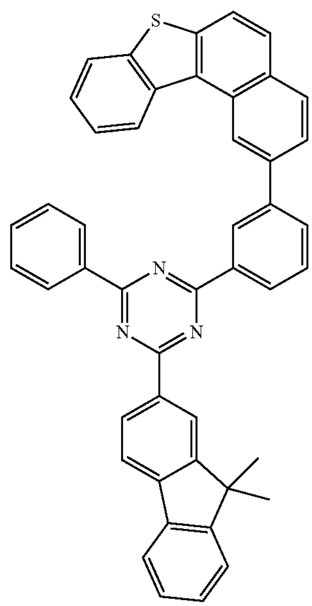

C-268
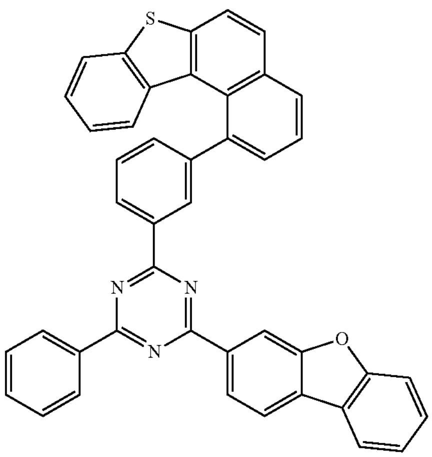
C-269
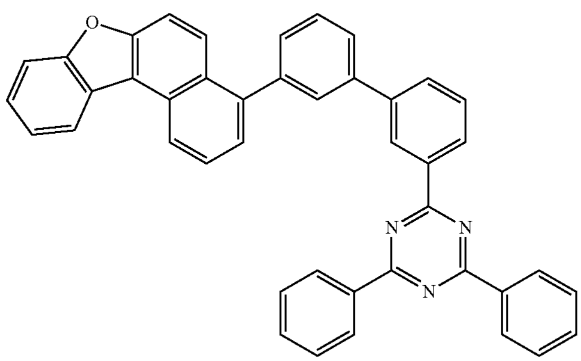
C-270
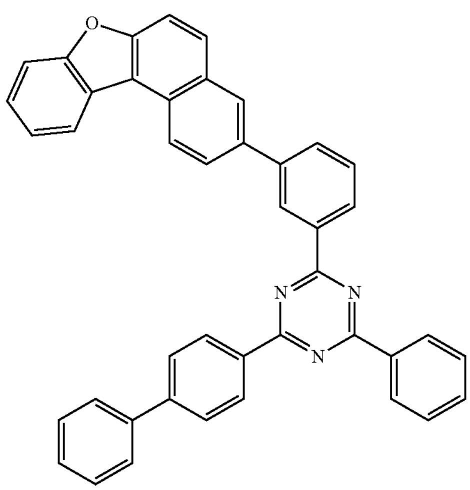
C-271
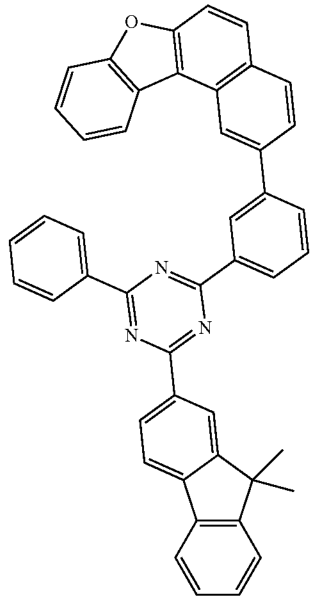
C-272
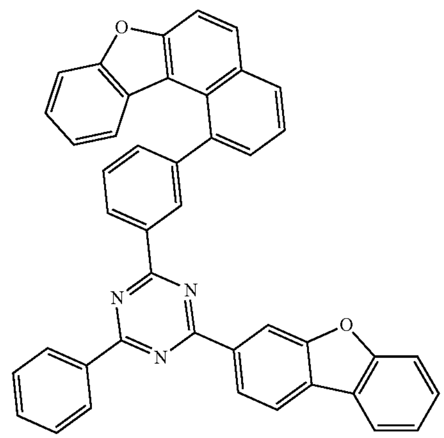
C-273
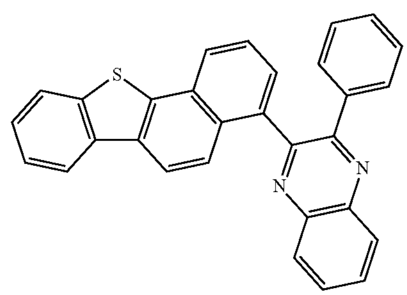
C-274
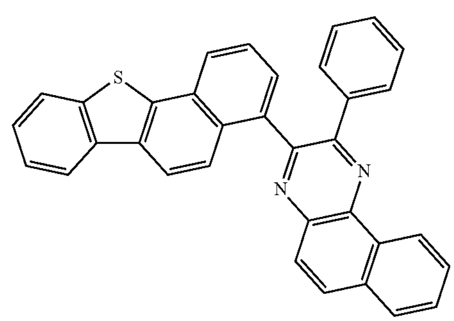

C-275
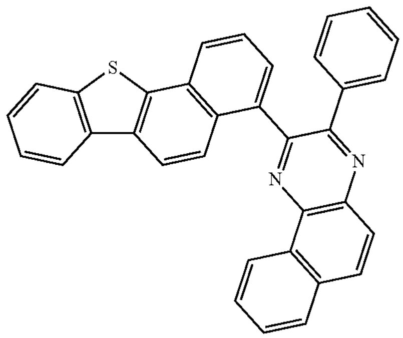
C-276
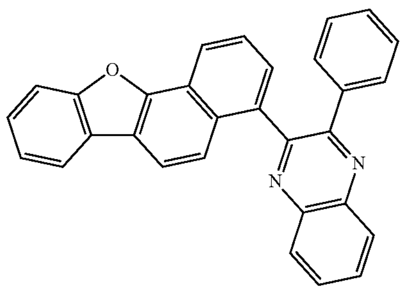
C-277
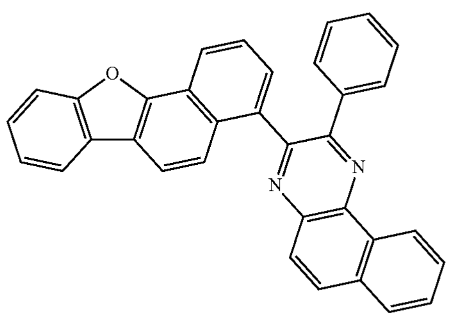
C-278
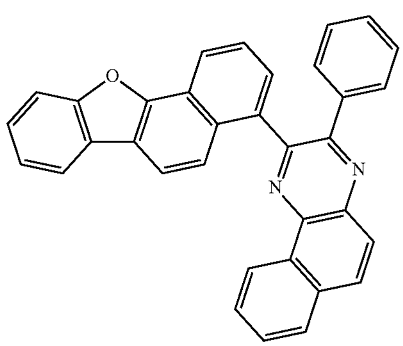
C-279
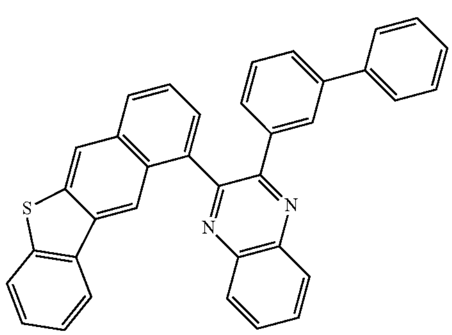
C-280
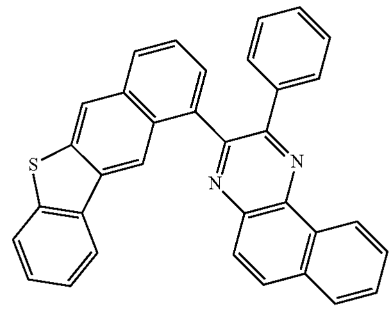
C-281
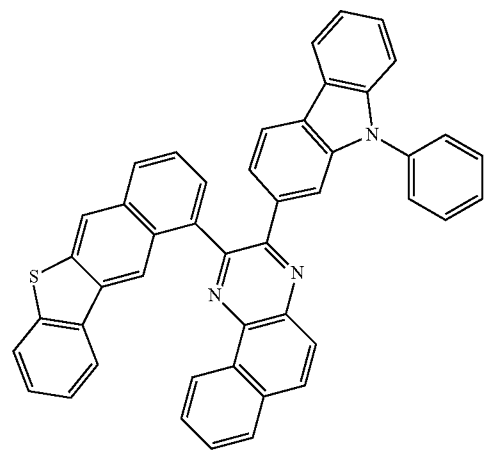
C-282
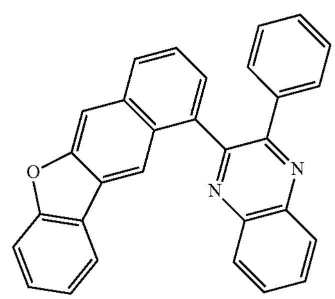
C-283
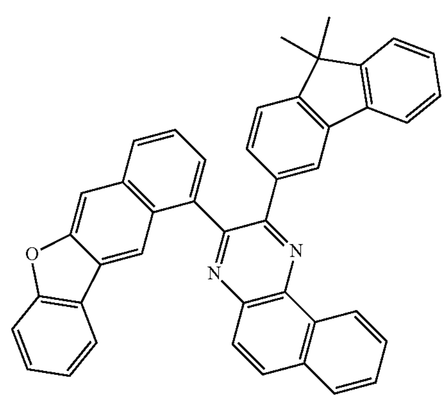

-continued
C-284
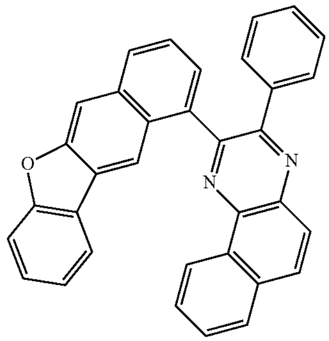
C-285
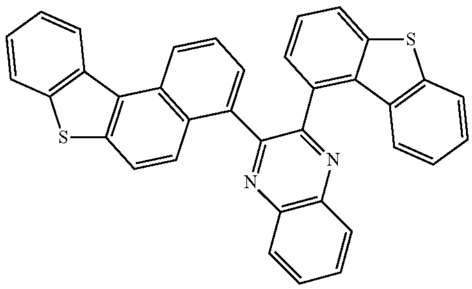
C-286
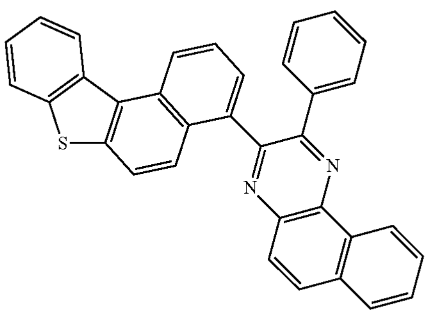
C-287
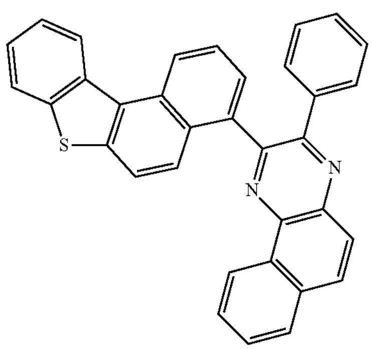
C-288
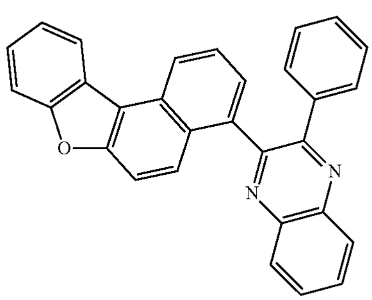
-continued
C-289
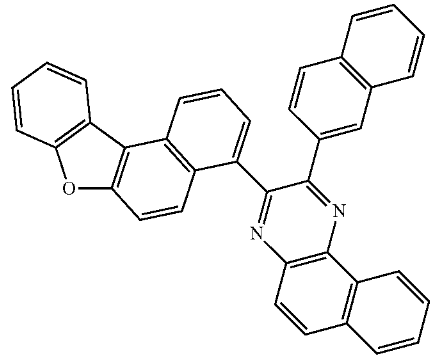
C-290
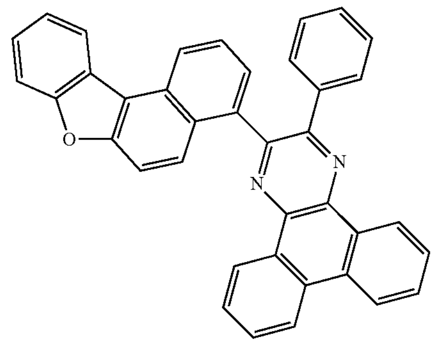
C-291
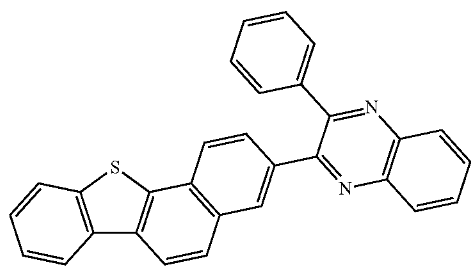
C-292
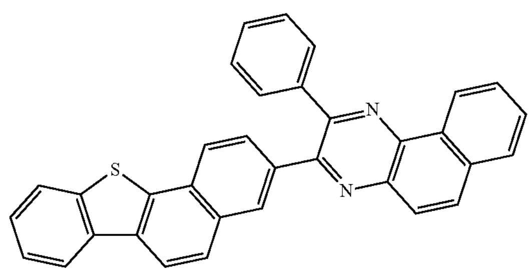
C-293
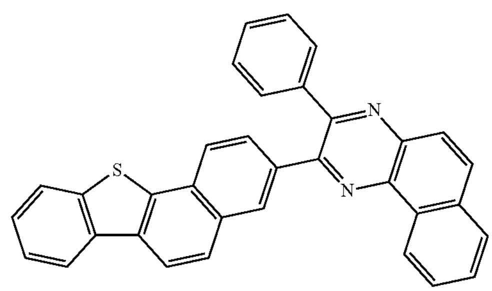

-continued
C-294
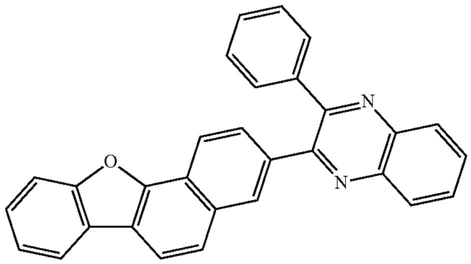
C-295
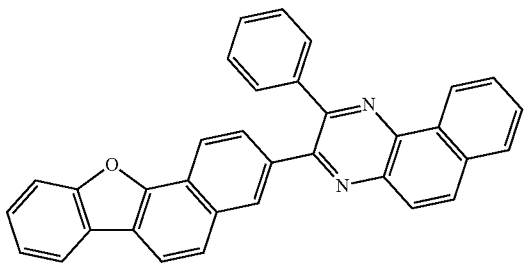
C-296
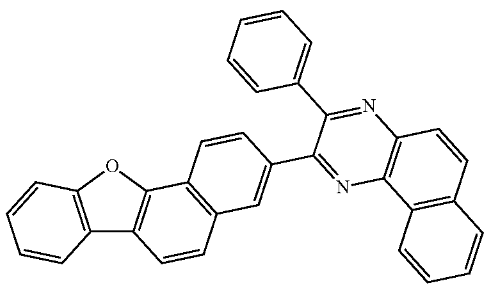
C-297
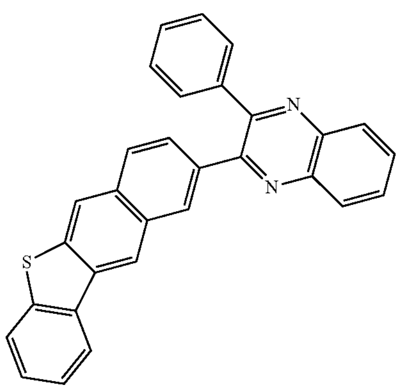
C-298
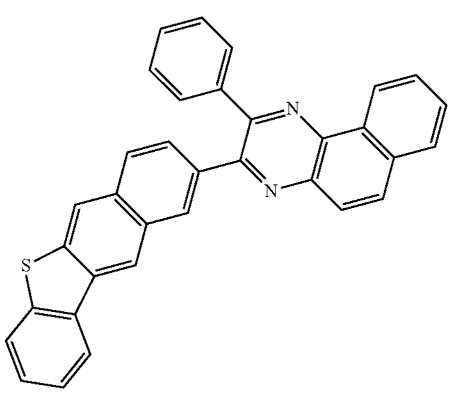
-continued
C-299
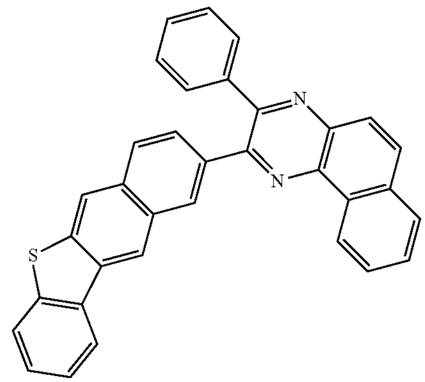
C-300
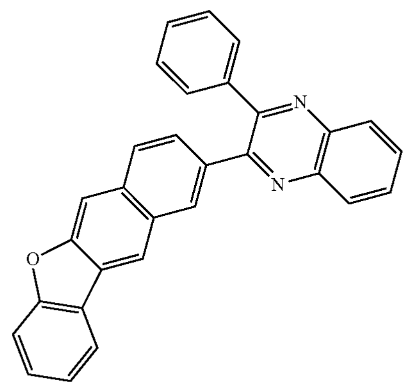
C-301
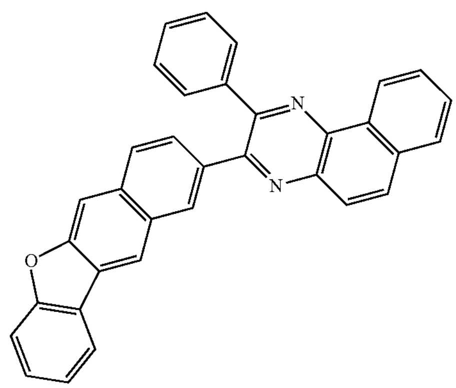
C-302
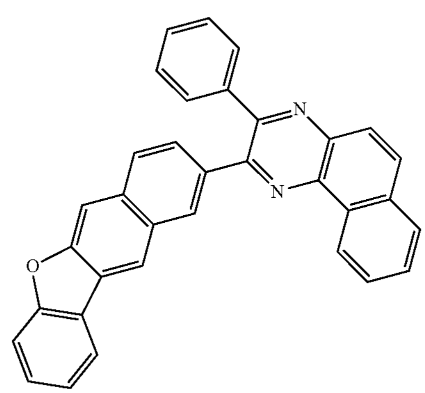

-continued
C-303
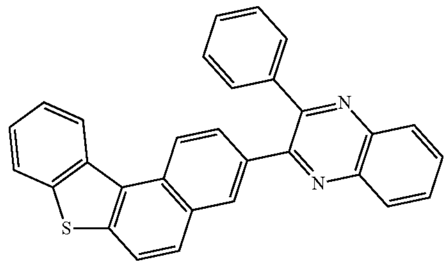
C-304
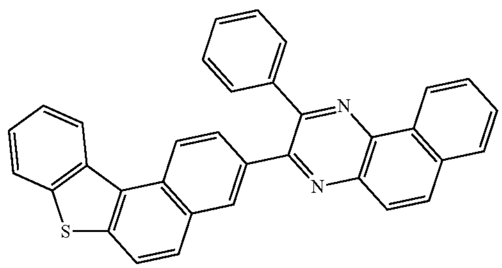
C-305
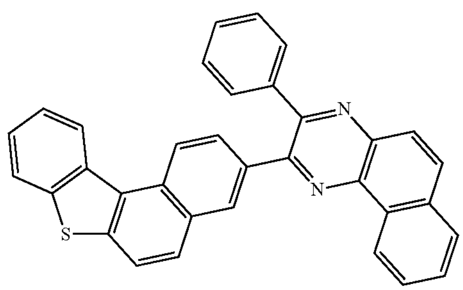
C-306
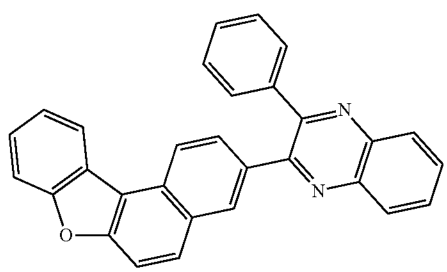
C-307
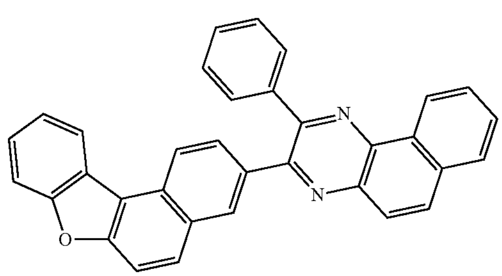
-continued
C-308
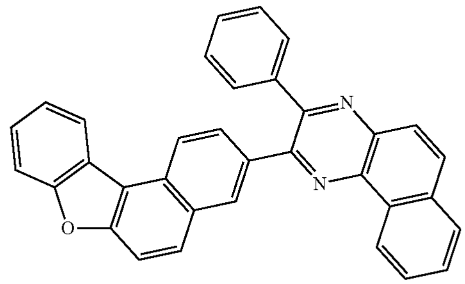
C-309
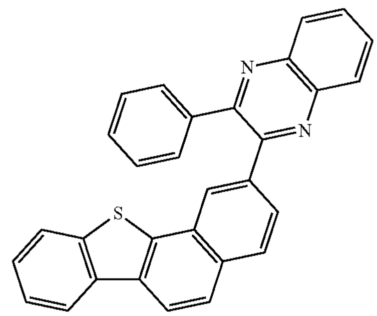
C-310
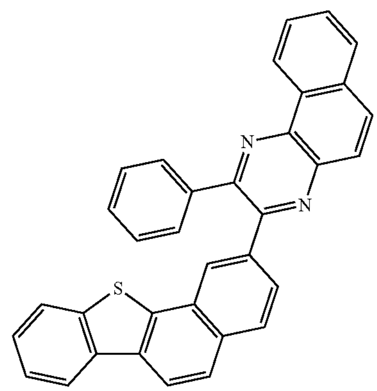
C-311
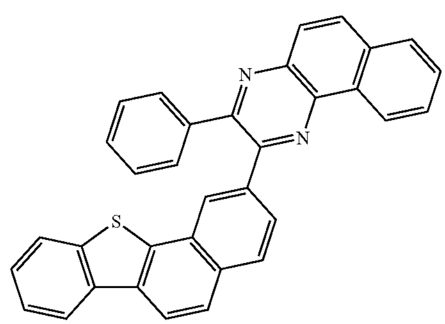
C-312
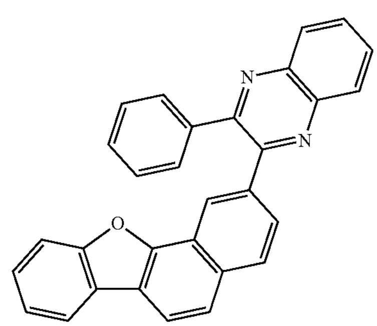

C-313
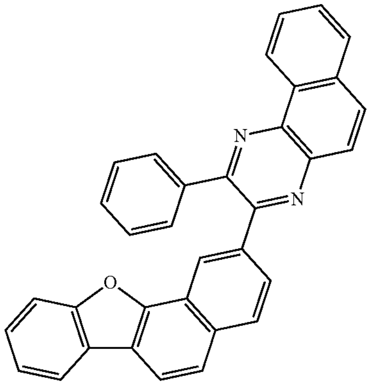
C-314
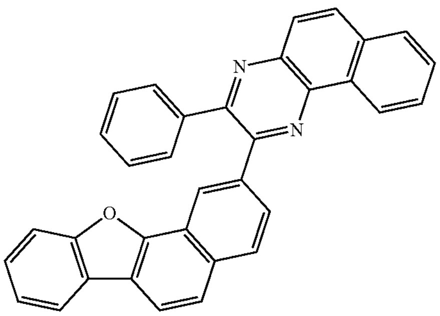
C-315
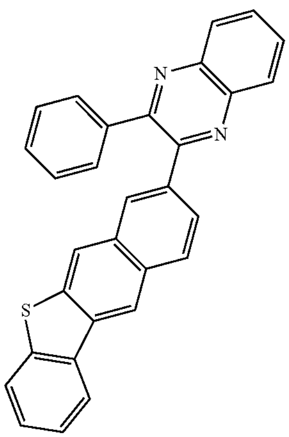
C-316
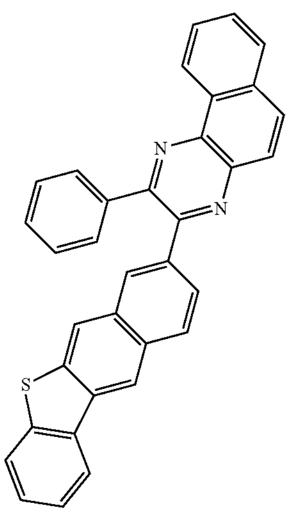
C-317
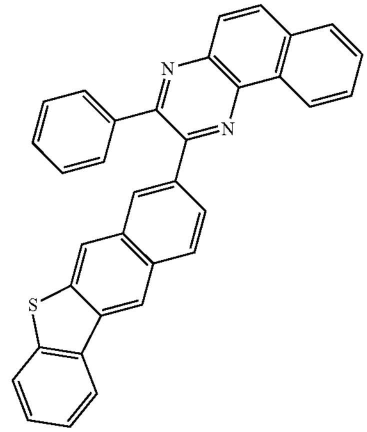
C-318
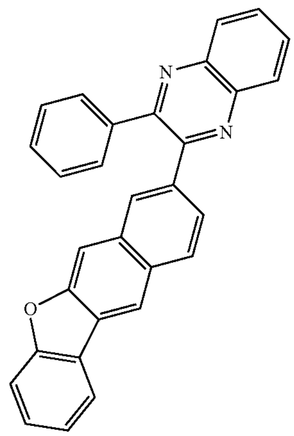
C-319
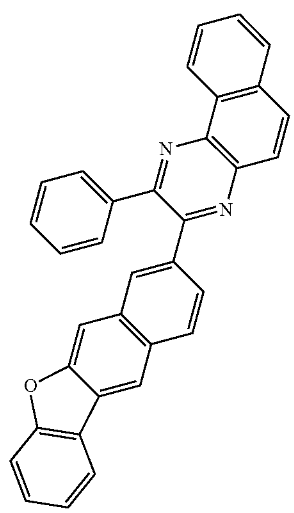

-continued
C-320
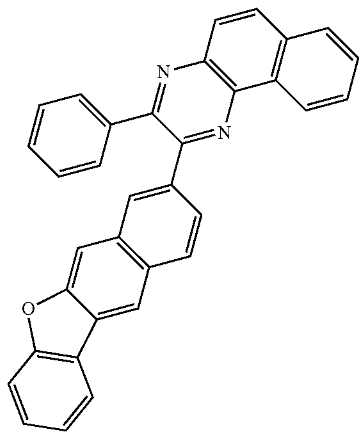
C-321
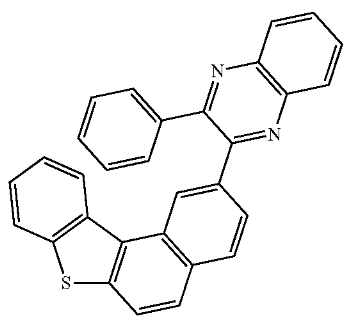
C-322
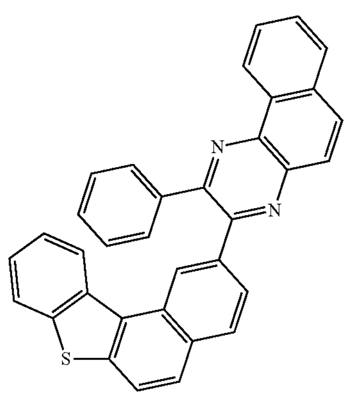
C-323
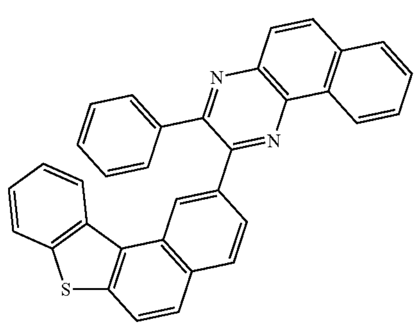
-continued
C-324
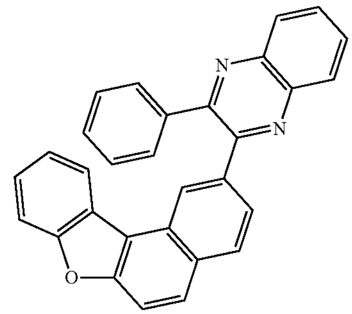
C-325
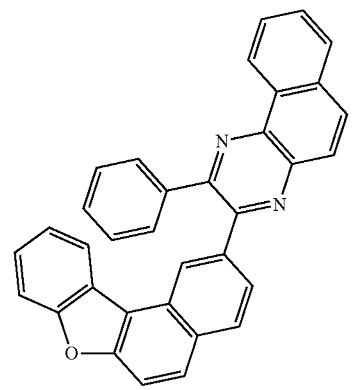
C-326
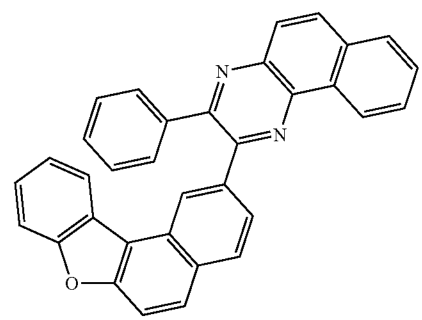
C-327
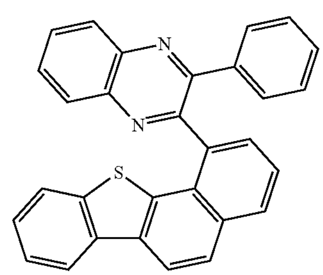
C-328
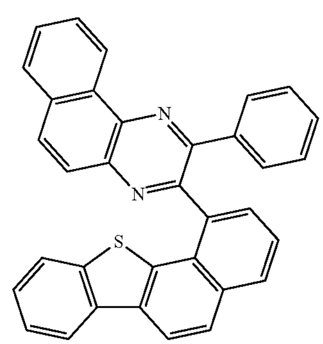

-continued
C-329
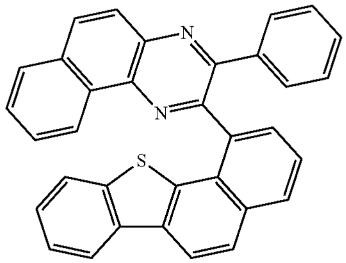
C-330
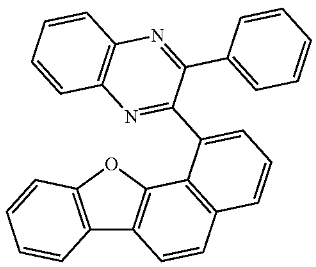
C-331
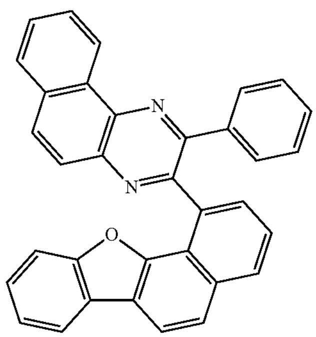
C-332
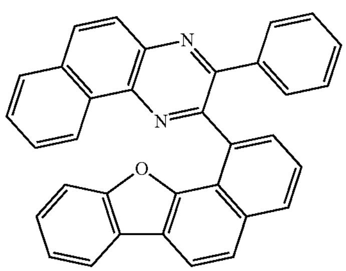
C-333
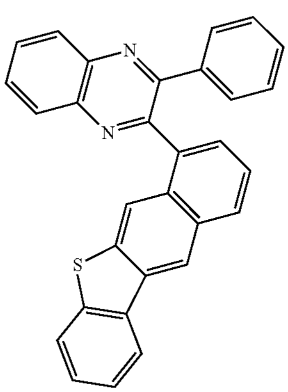
-continued
C-334
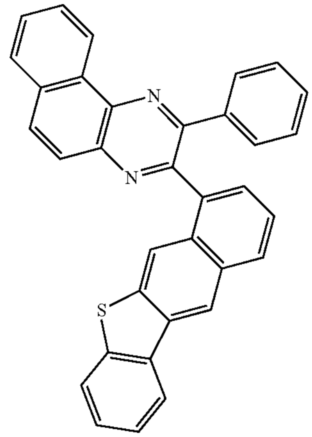
C-335
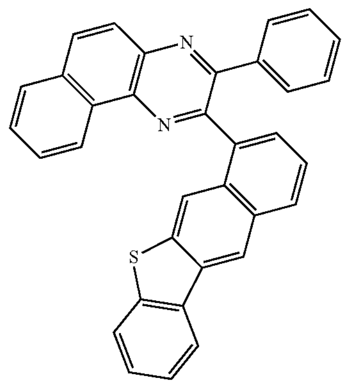
C-336
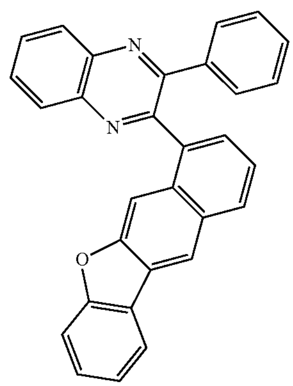
C-337
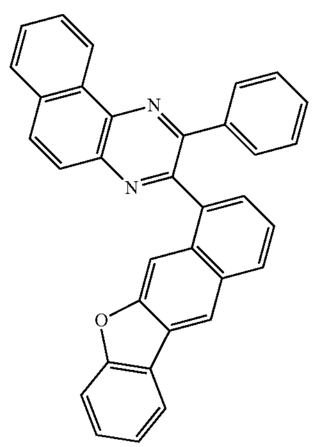

C-338
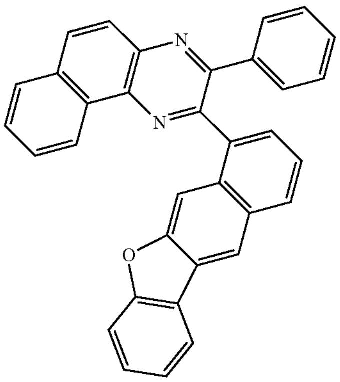
C-339
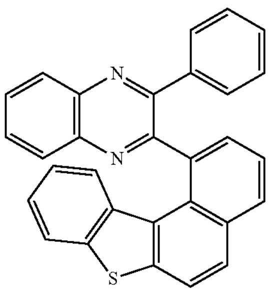
C-340
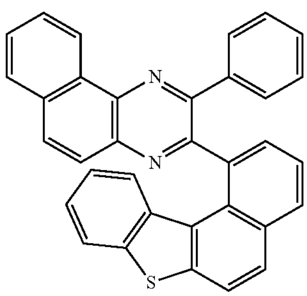
C-341
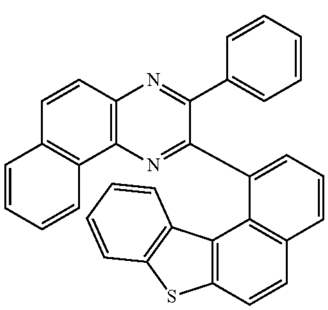
C-342
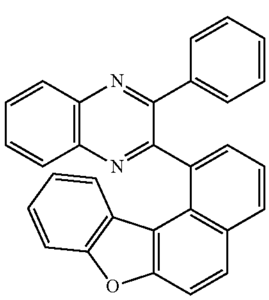
C-343
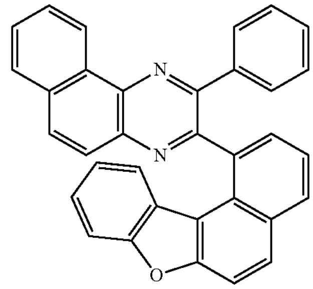
C-344
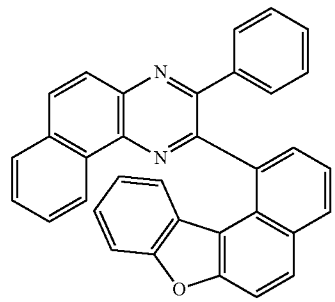
C-345
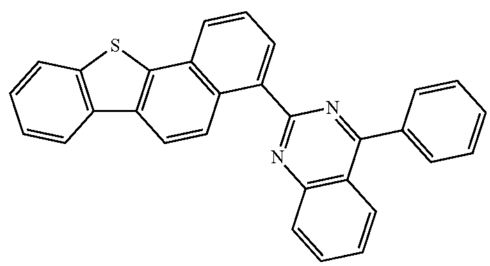
C-346
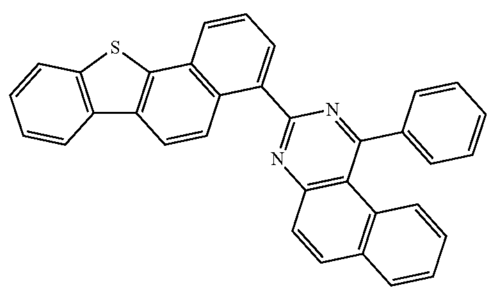
C-347
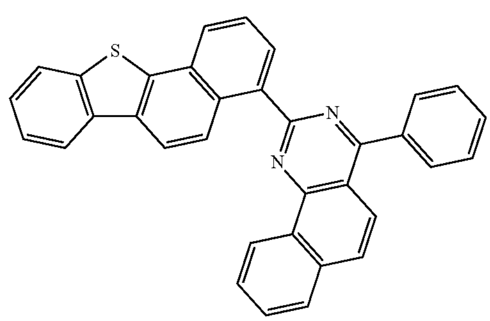

-continued
C-348
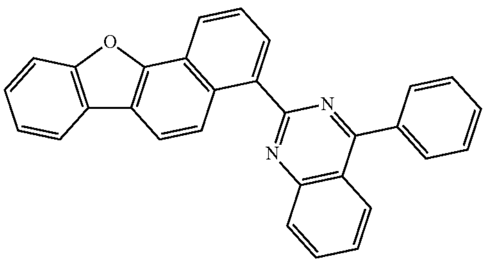
C-349
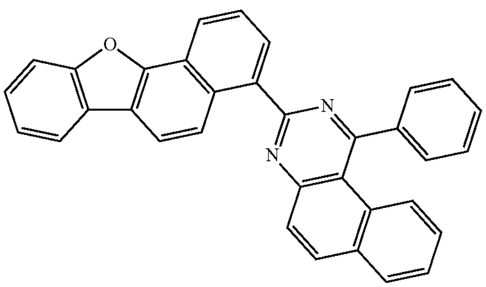
C-350
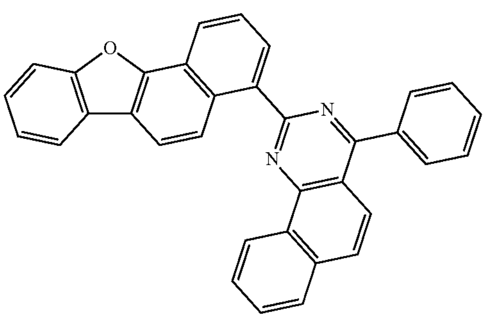
C-351
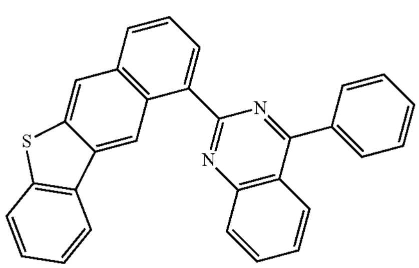
C-352
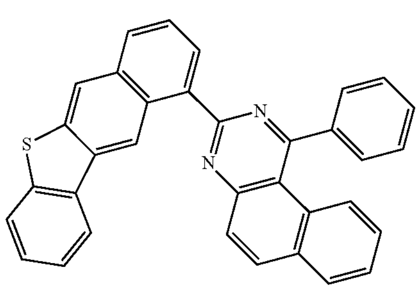
-continued
C-353
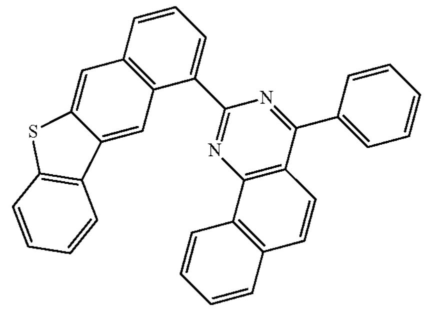
C-354
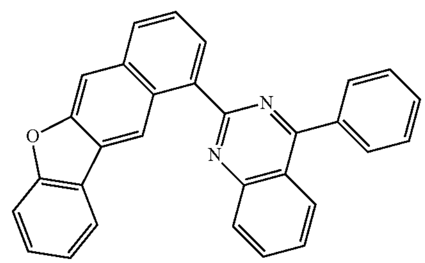
C-355
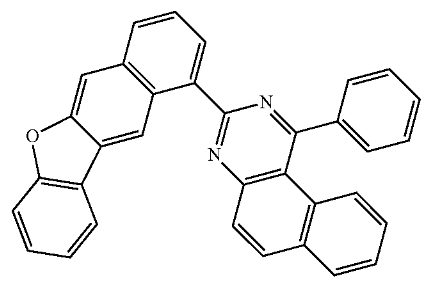
C-356
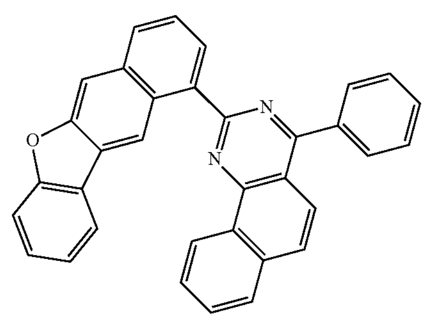
C-357
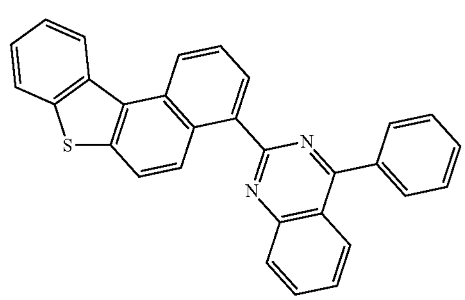

-continued
C-358
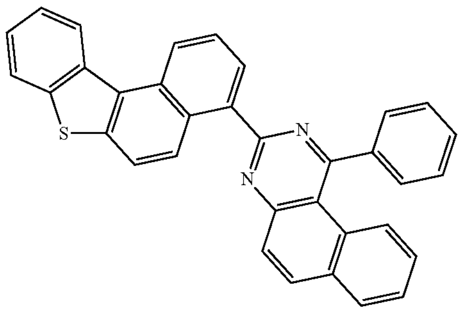
C-359
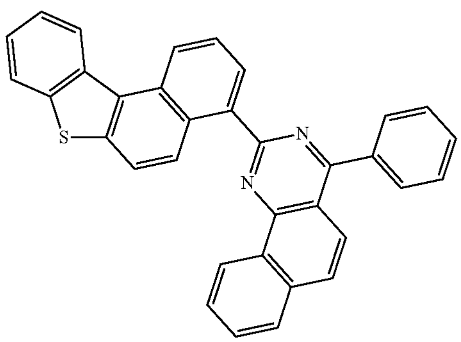
C-360
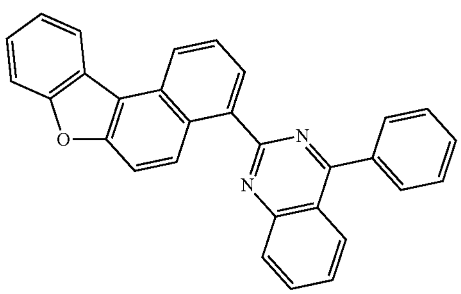
C-361
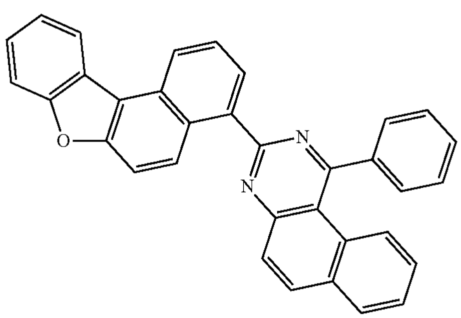
-continued
C-362
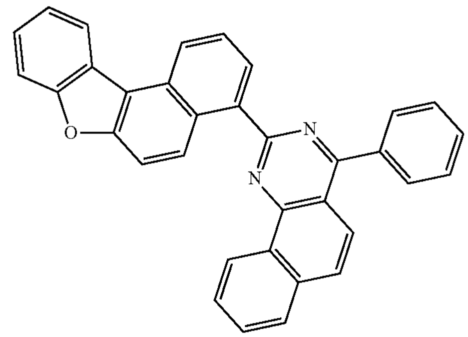
C-363
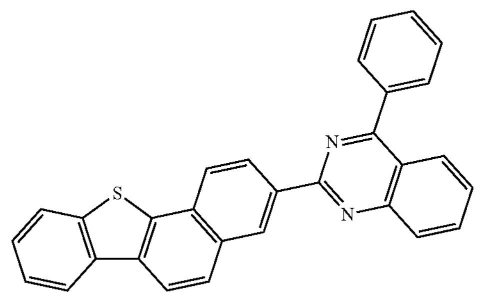
C-364
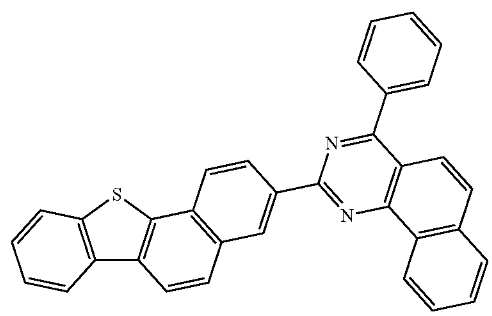
C-365
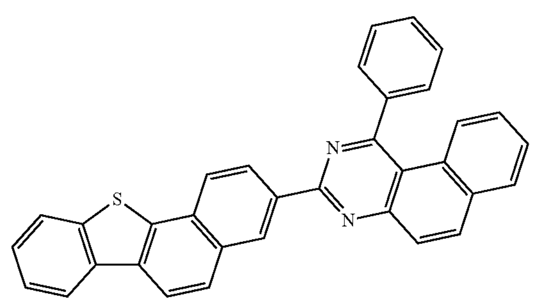
C-366
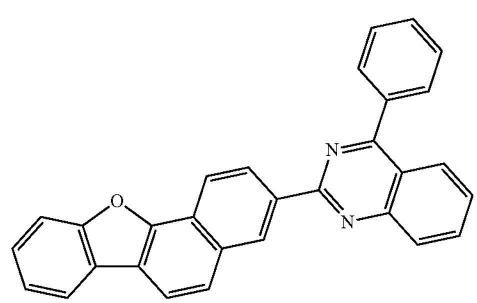

-continued
C-367
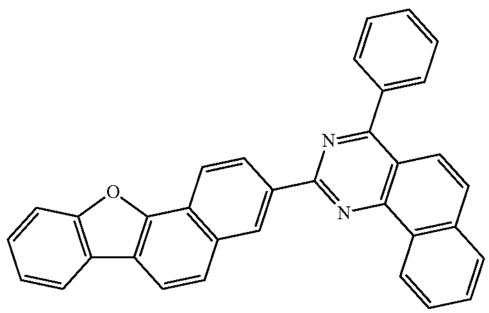
C-368
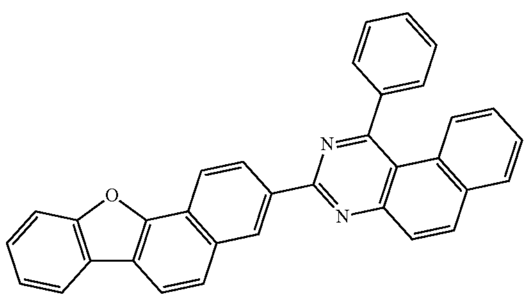
C-369
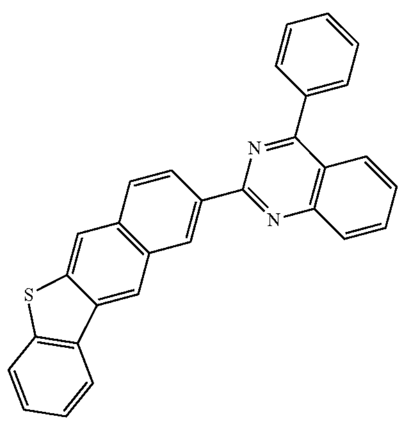
C-370
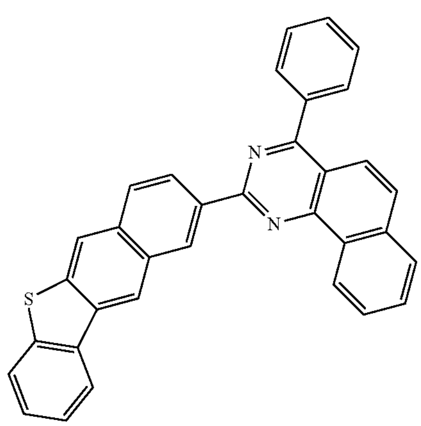
-continued
C-371
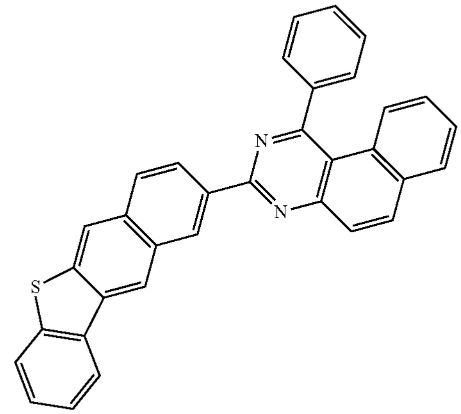
C-372
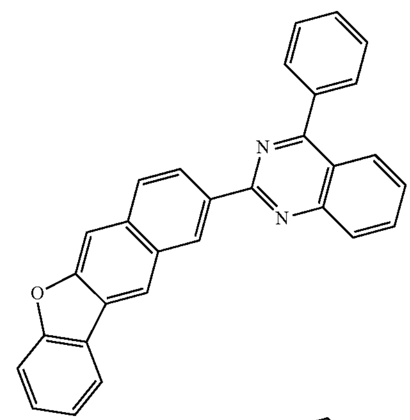
C-373
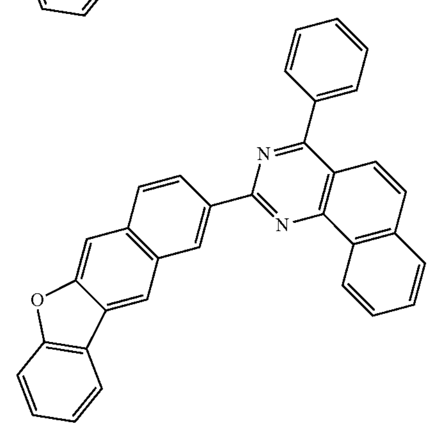
C-374
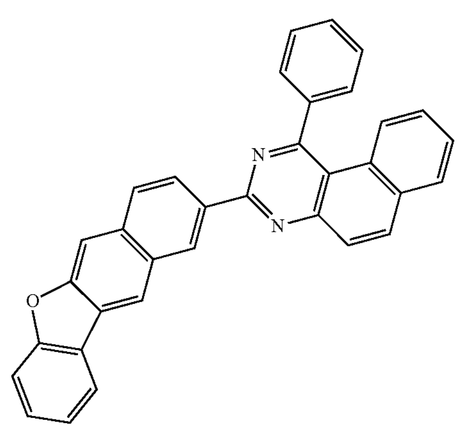

-continued
C-375
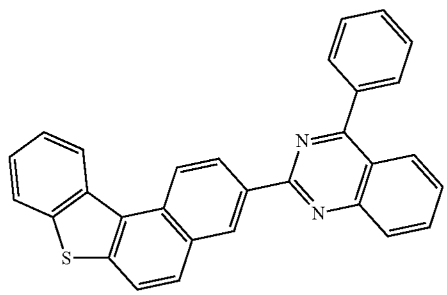
C-376
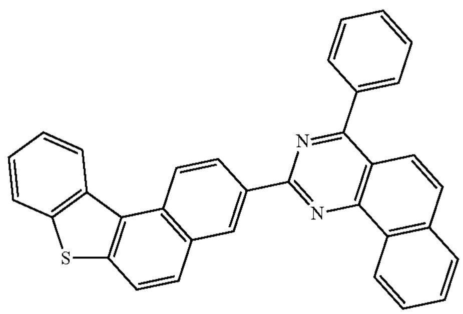
C-377
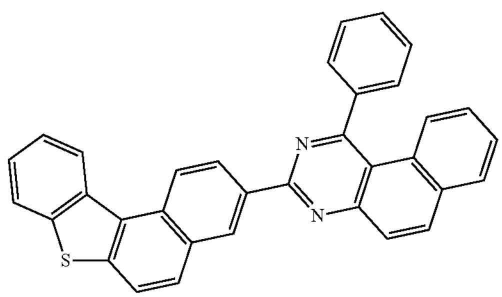
C-378
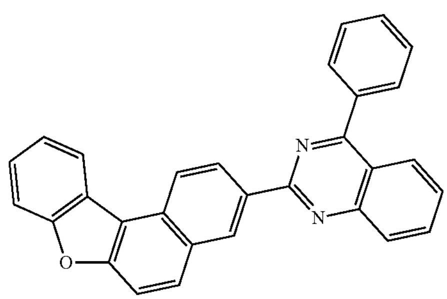
C-379
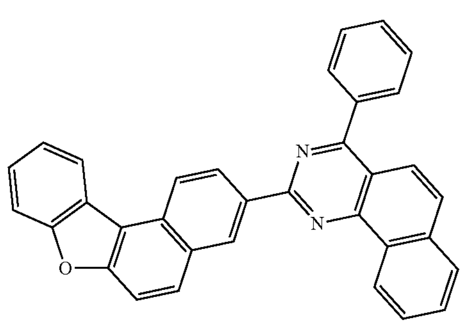
-continued
C-380
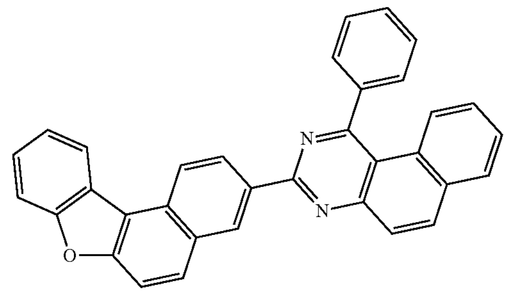
C-381
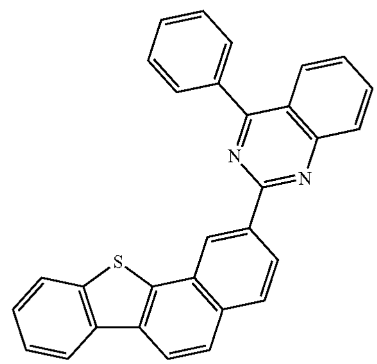
C-382
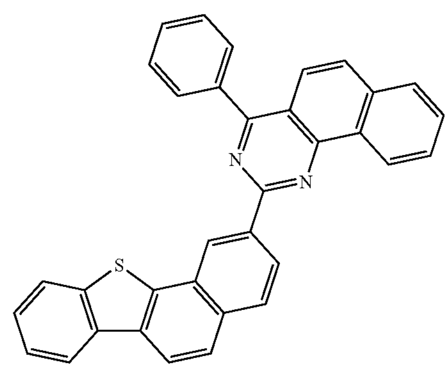
C-383
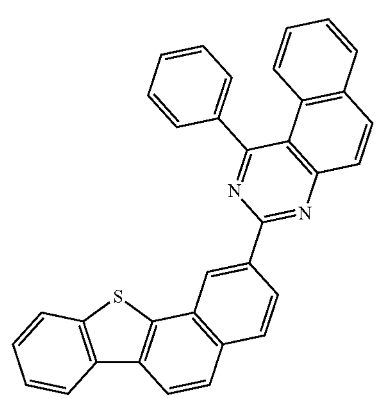

-continued
C-384
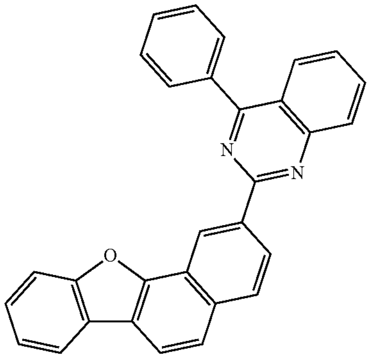
C-385
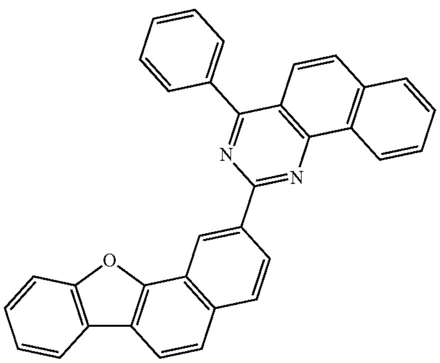
C-386
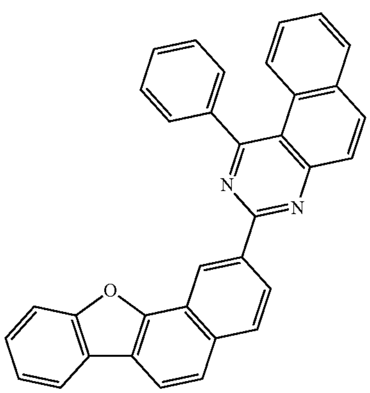
C-387
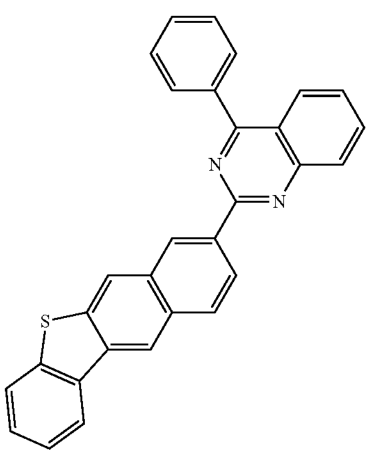
-continued
C-388
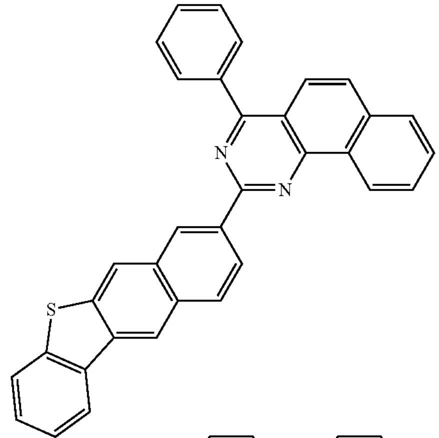
C-389
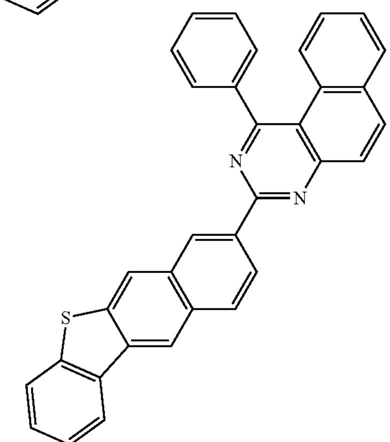
C-390
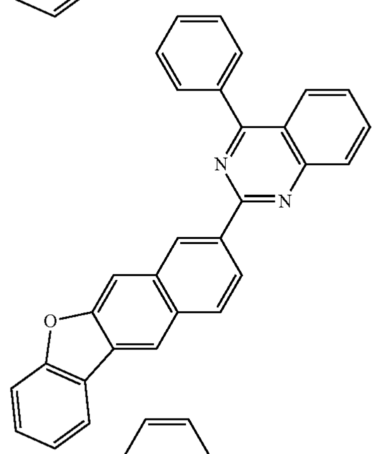
C-391
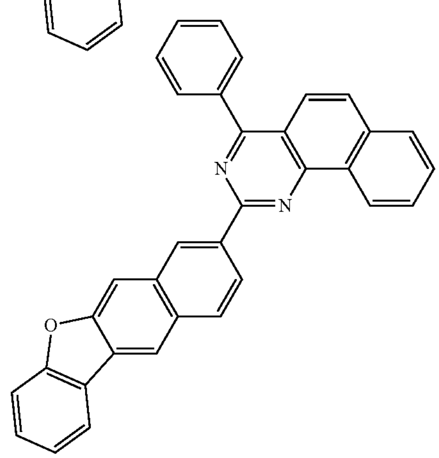

-continued
C-392
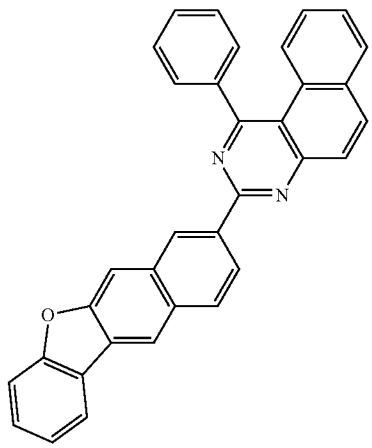
C-393
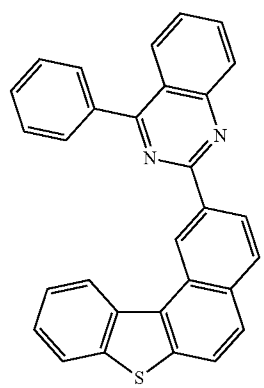
C-394
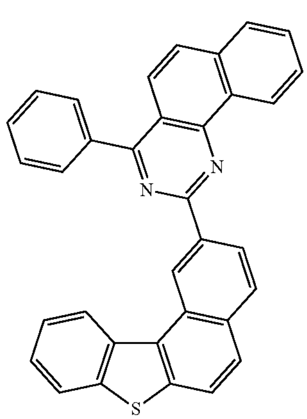
-continued
C-395
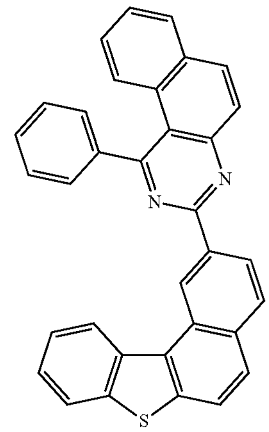
C-396
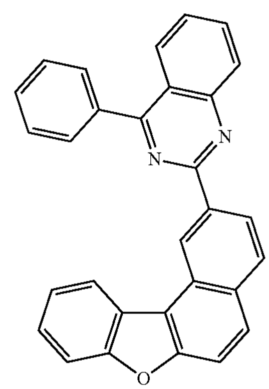
C-397
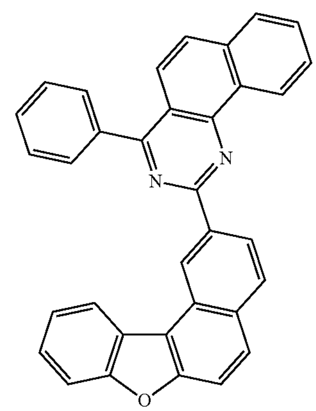
C-398
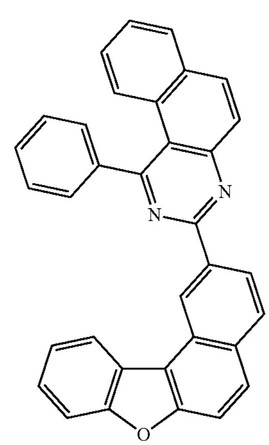

-continued
C-399
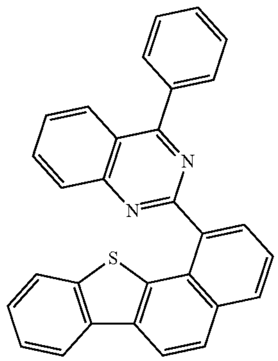
C-400
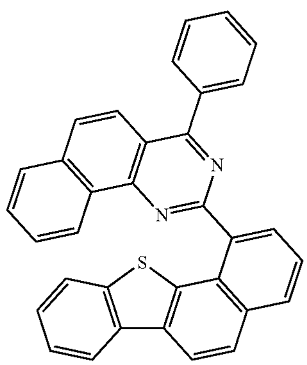
C-401
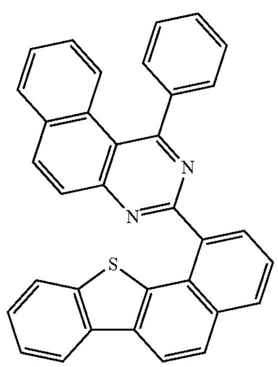
C-402
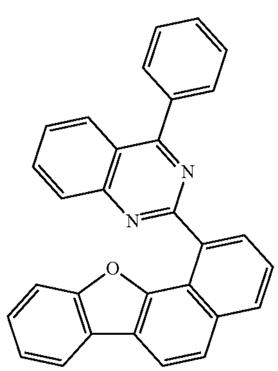
-continued
C-403
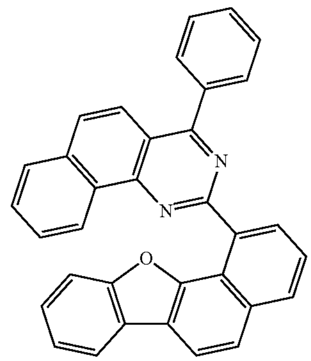
C-404
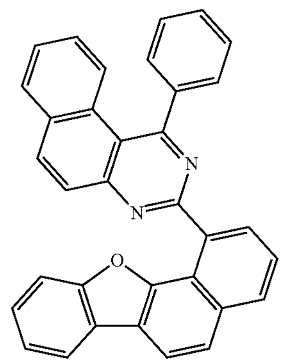
C-405
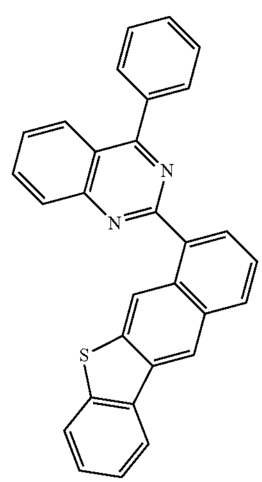

C-406
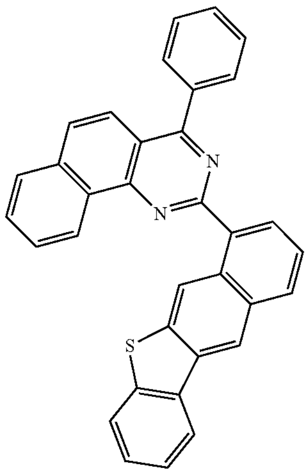
C-407
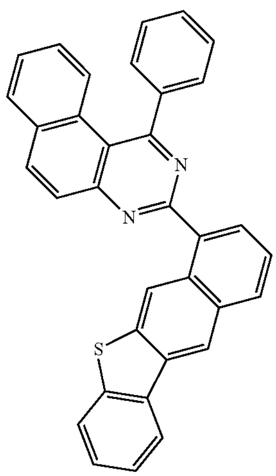
C-408
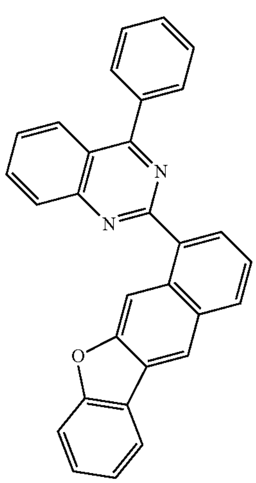
C-409
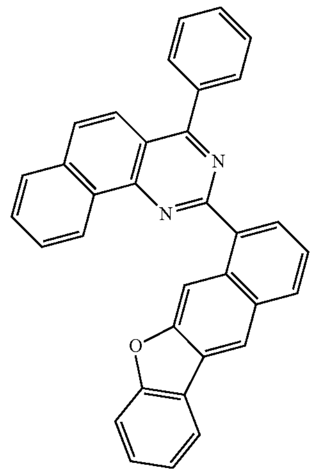
C-410
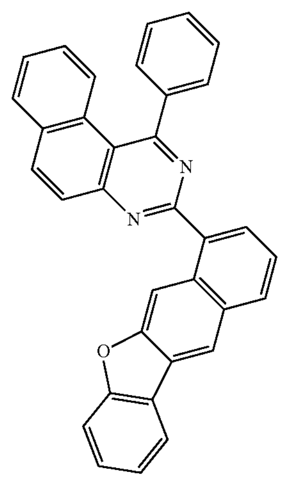
C-411
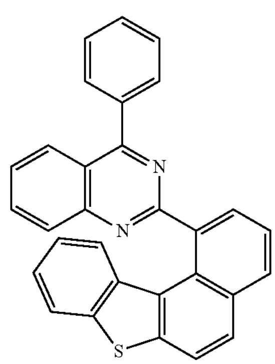

-continued
C-412
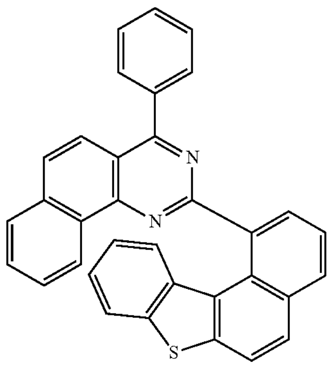
C-413
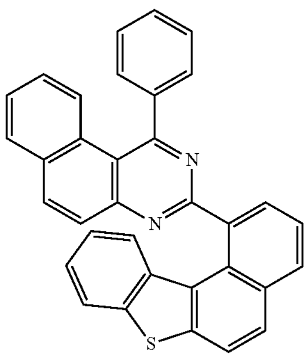
C-414
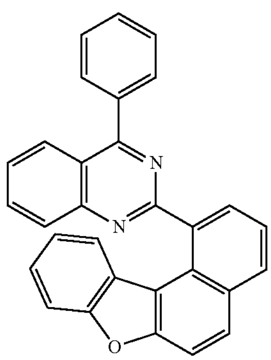
C-415
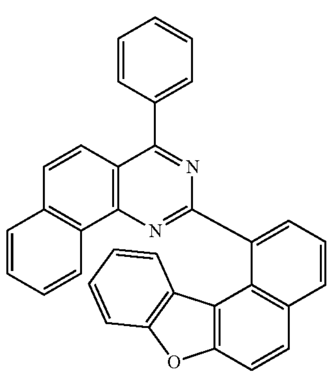
-continued
C-416
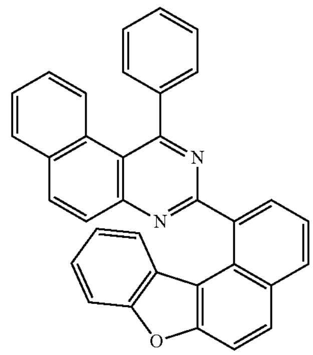
C-417
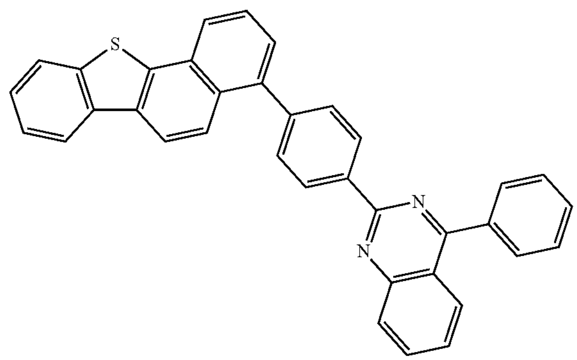
C-418
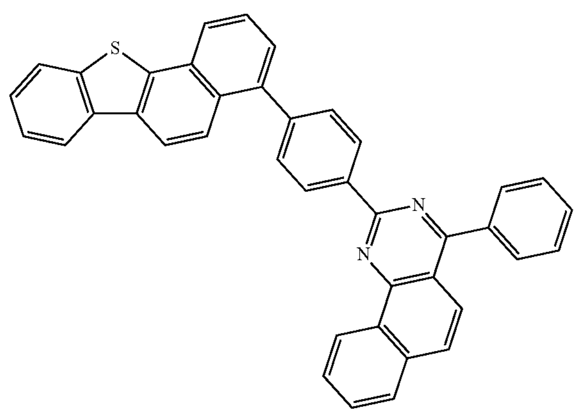
C-419
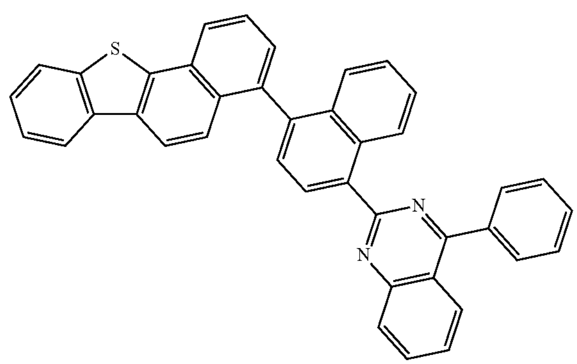

C-420
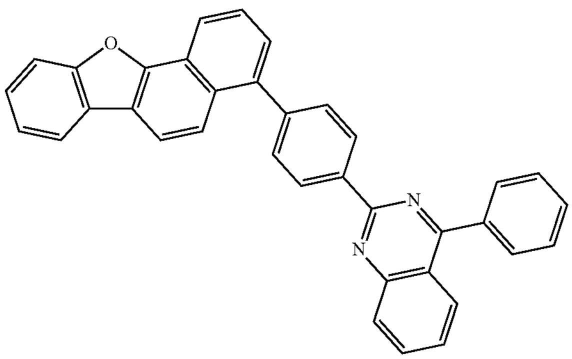
C-421
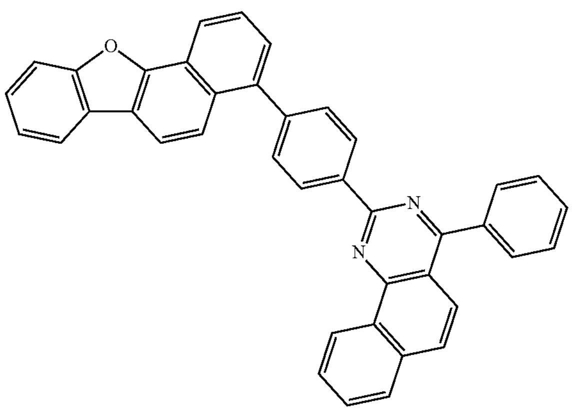
C-422
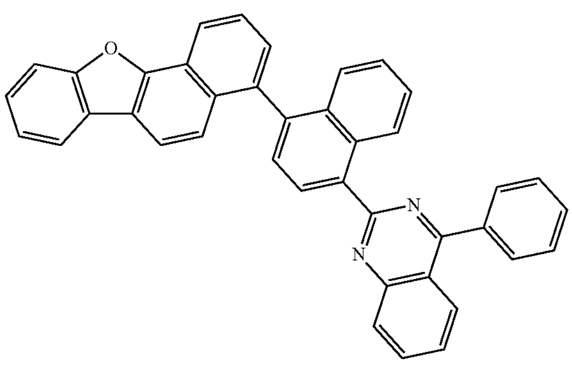
C-423
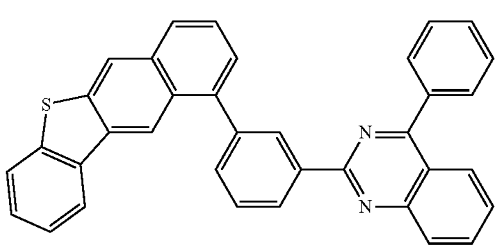
C-424
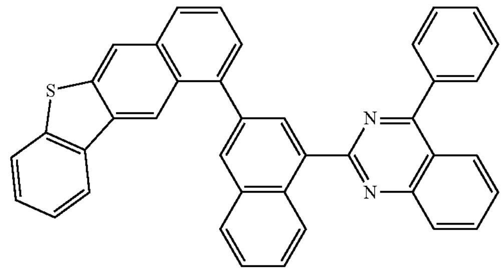
C-425
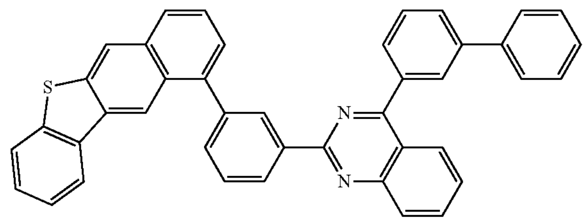
C-426
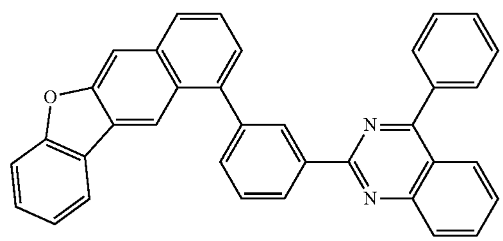
C-427
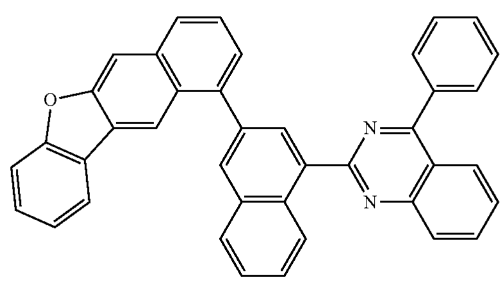
C-428
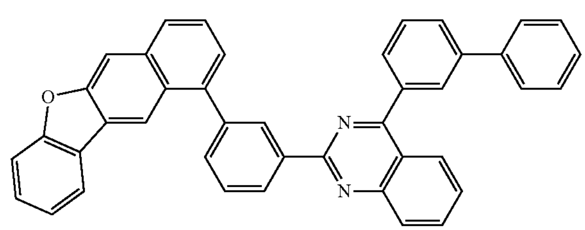

-continued
C-429
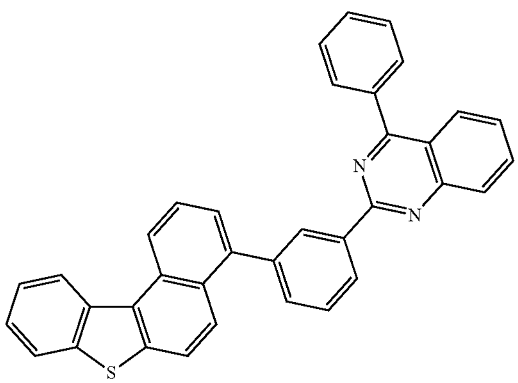
C-430
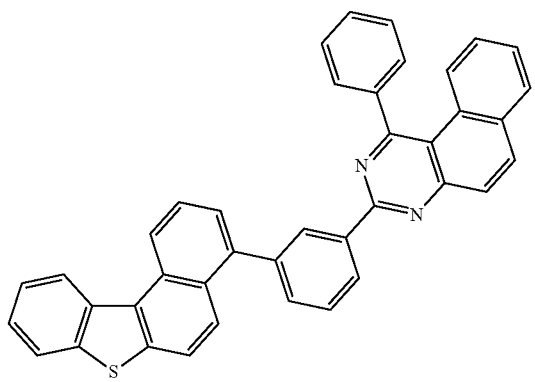
C-431
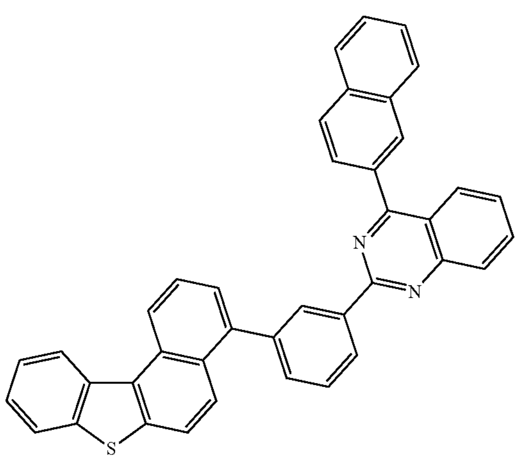
C-432
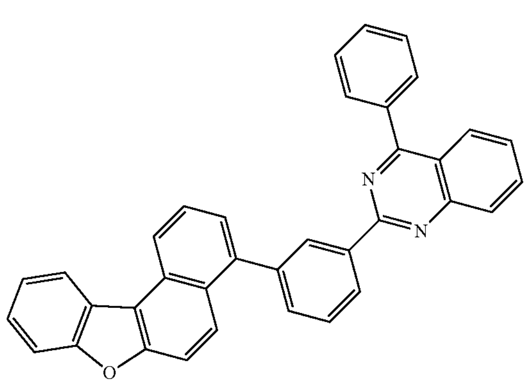
-continued
C-433
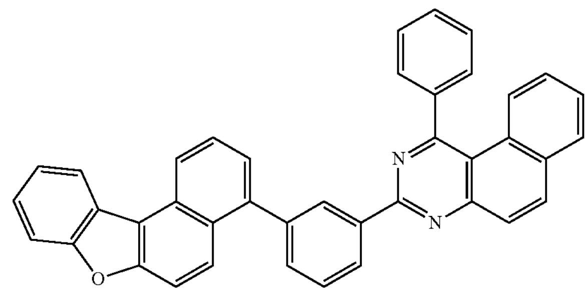
C-434
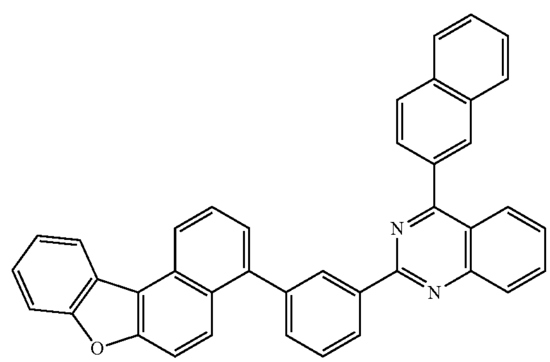
C-435
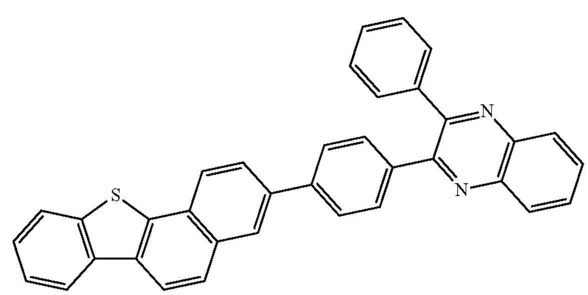
C-436
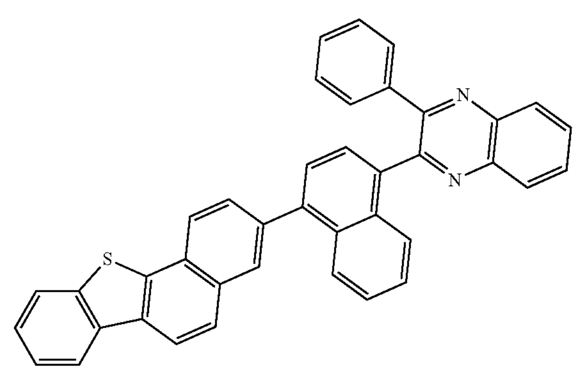

C-437
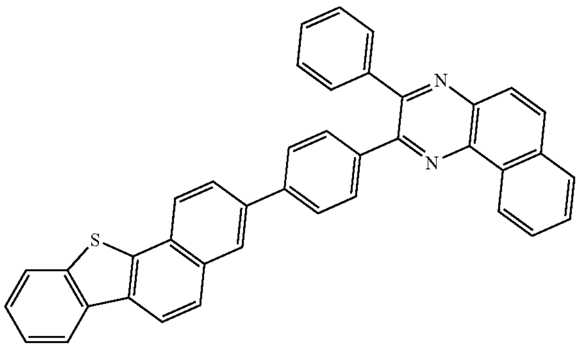
C-438
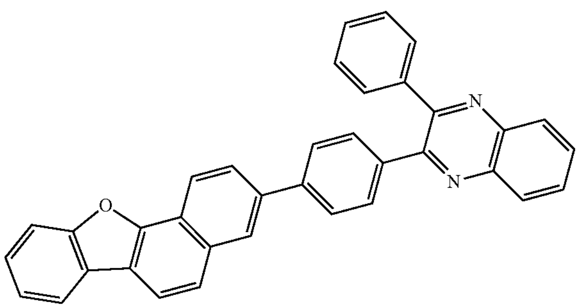
C-439
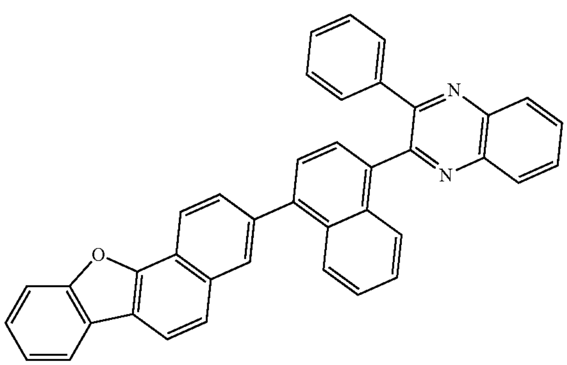
C-440
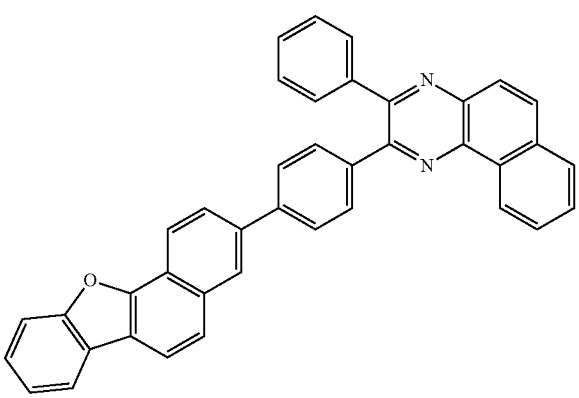
C-441
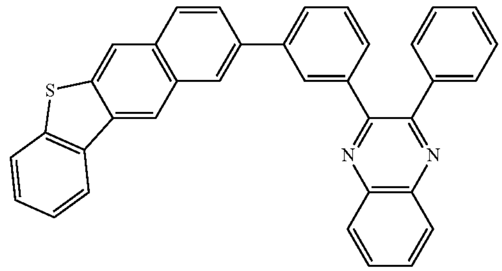
C-442
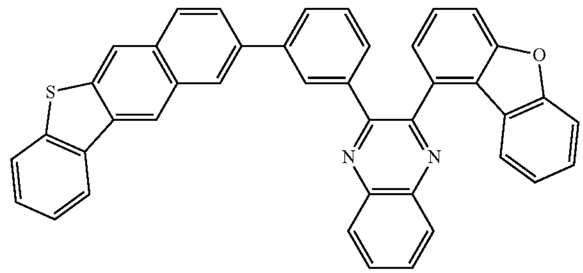
C-443
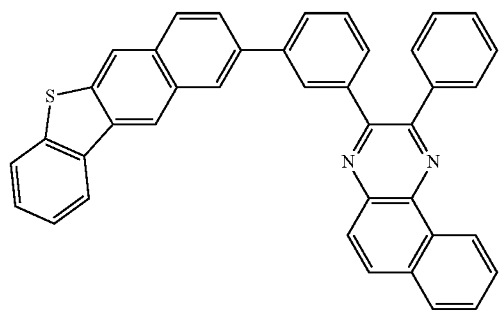
C-444
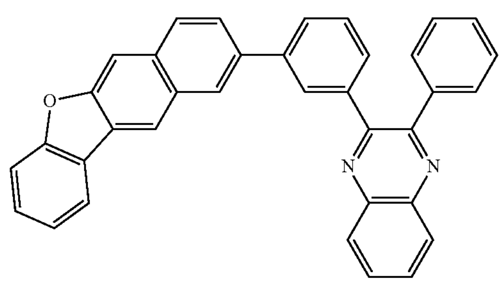
C-445
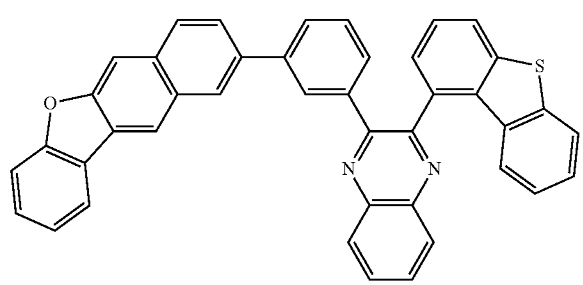

C-446
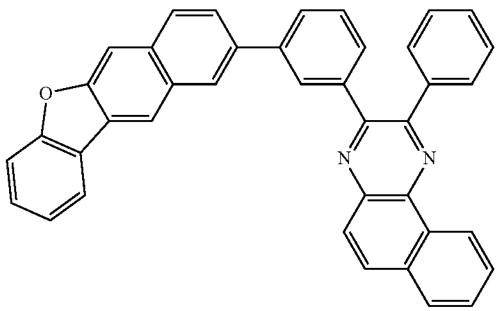
C-447
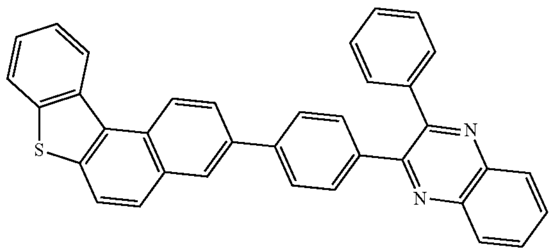
C-448
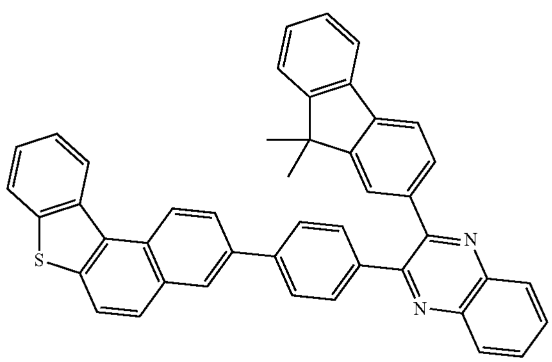
C-449
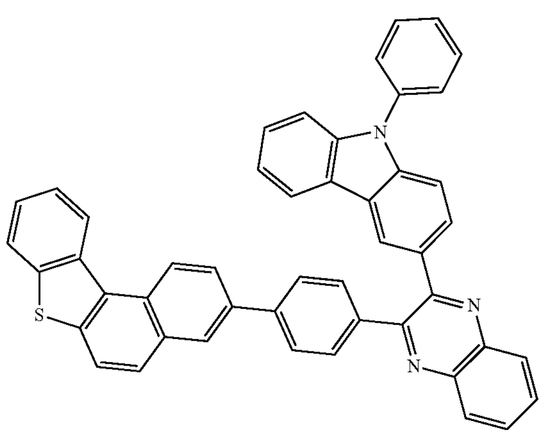
C-450
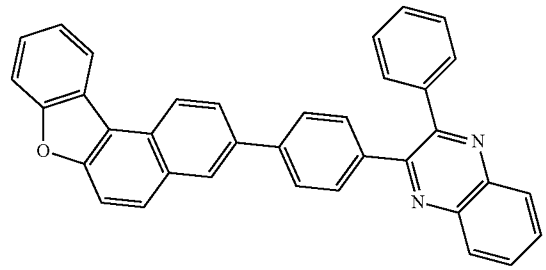
C-451
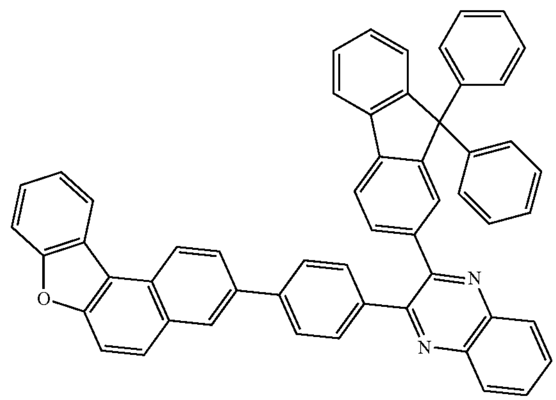
C-452
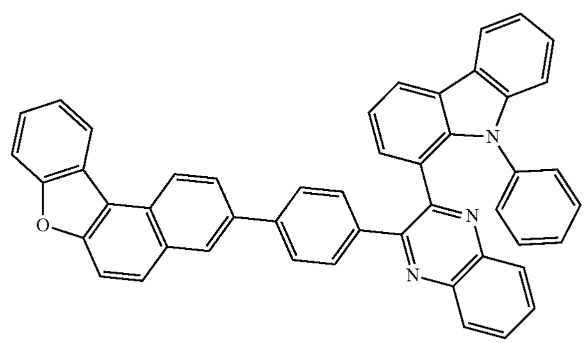
C-453
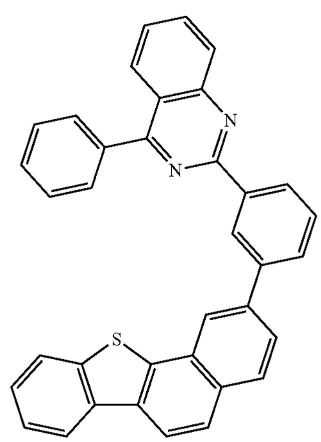

-continued
C-454
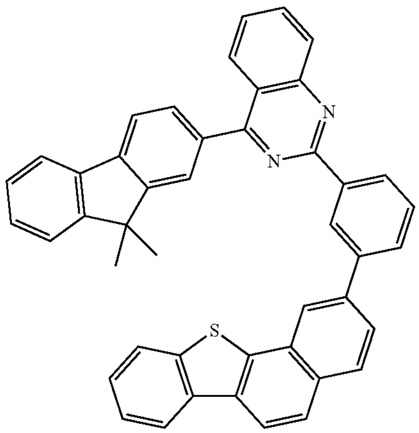
C-455
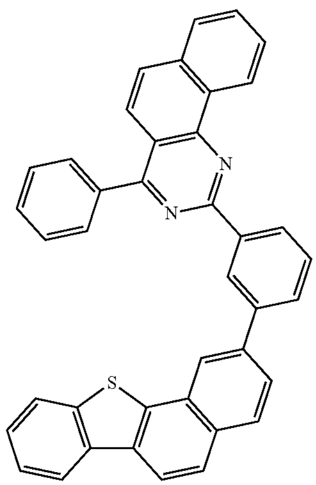
C-456
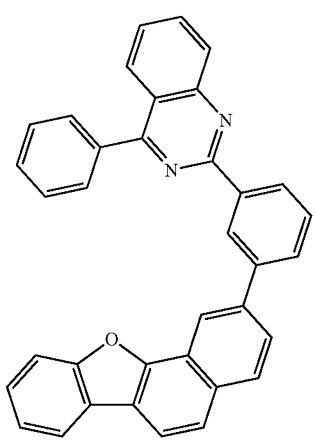
-continued
C-457
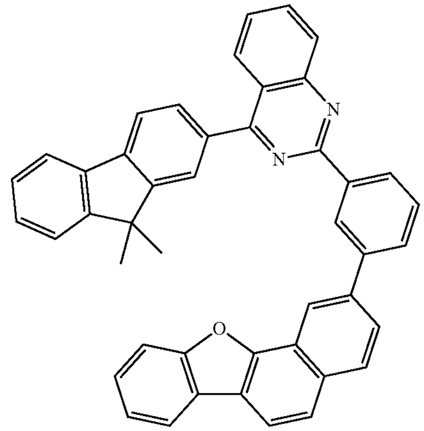
C-458
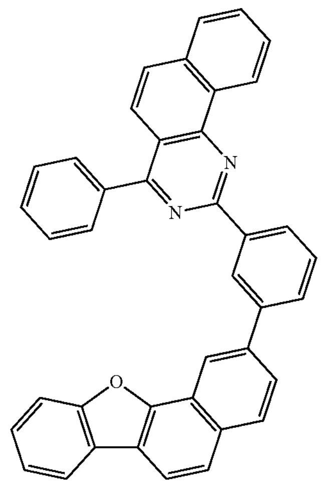
C-459
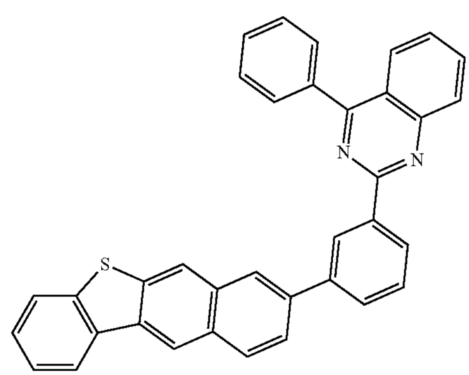

-continued
C-460
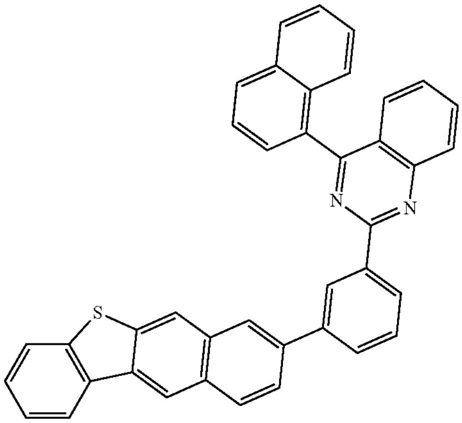
C-461
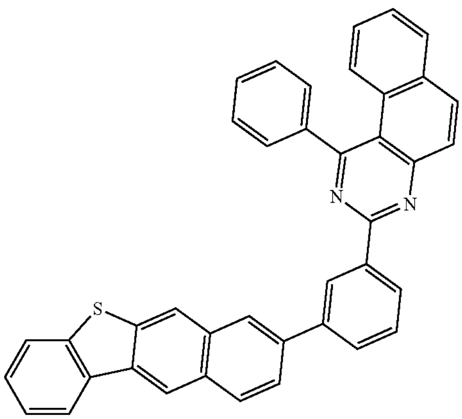
C-462
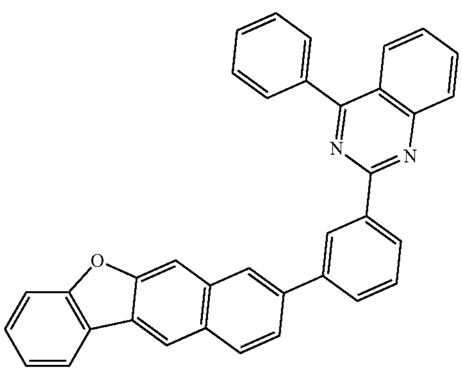
C-463
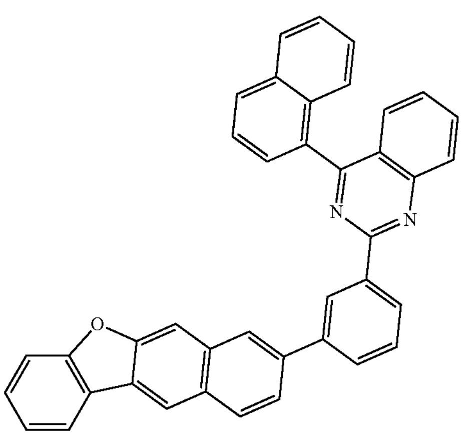
-continued
C-464
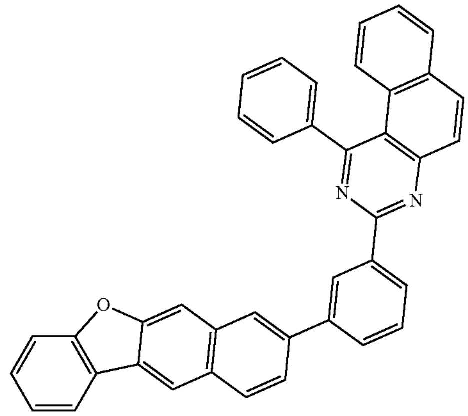
C-465
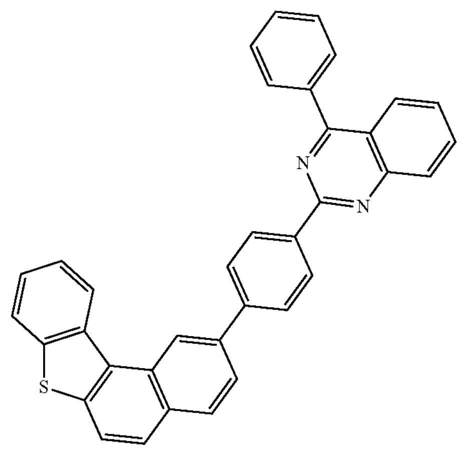
C-466
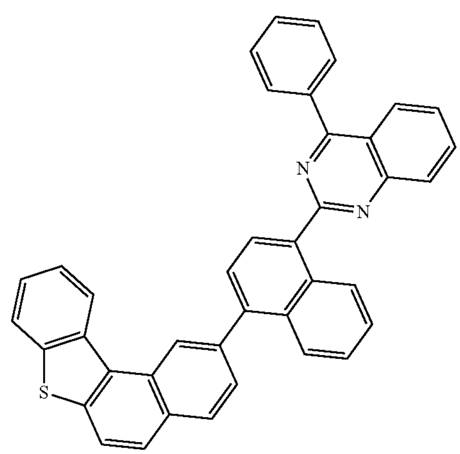

C-467
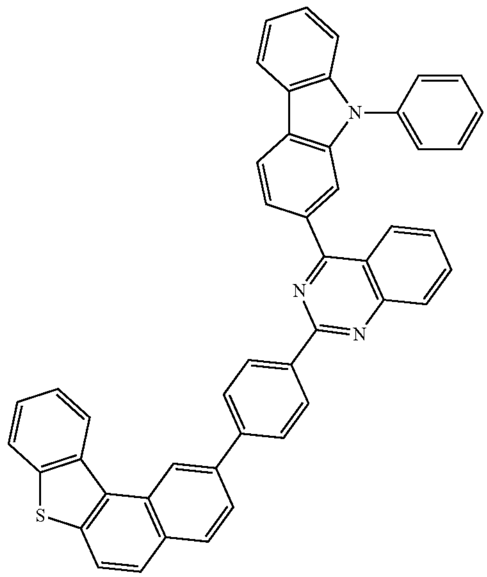
C-468
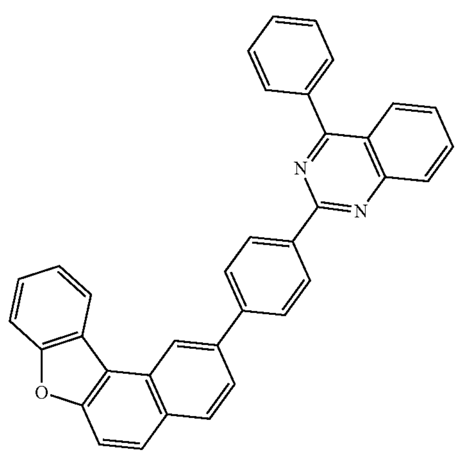
C-469
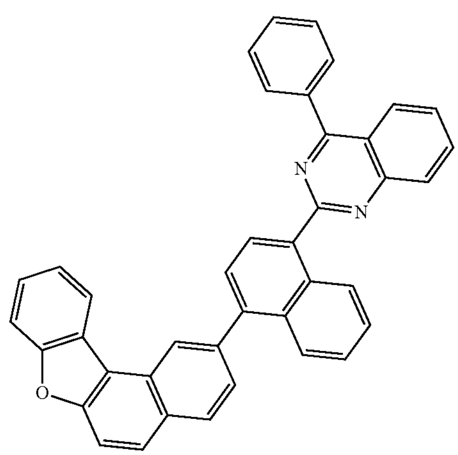
C-470
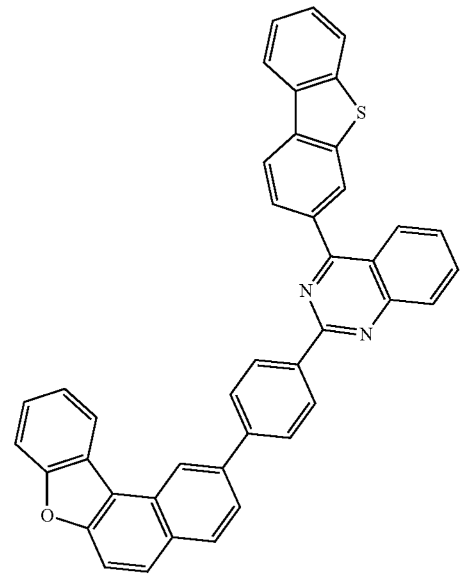
C-471
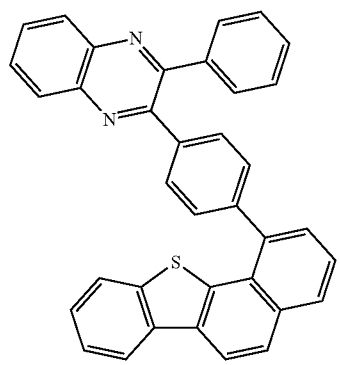
C-472
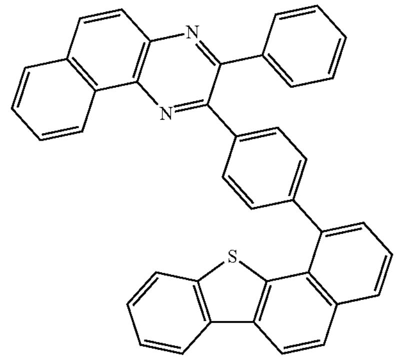

-continued
C-473
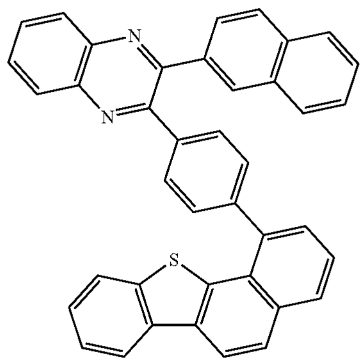
C-474
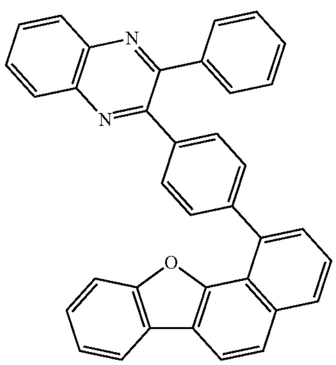
C-475
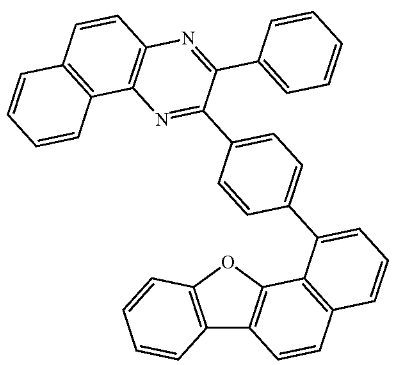
C-476
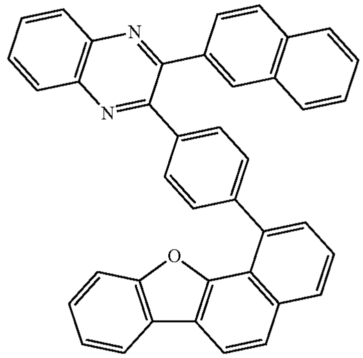
-continued
C-477
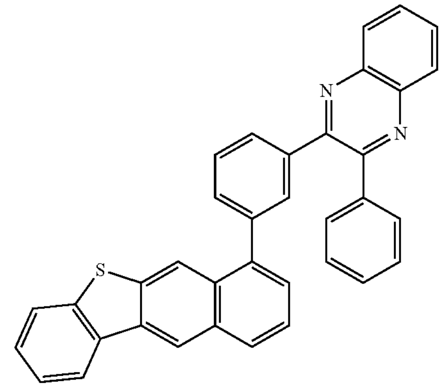
C-478
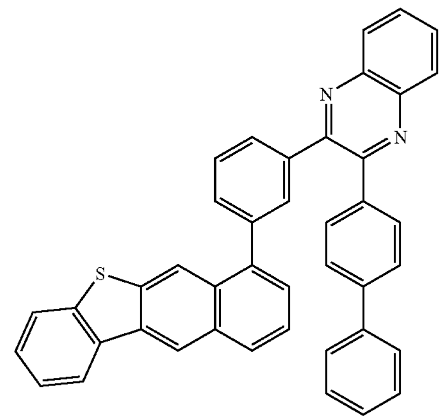
C-479
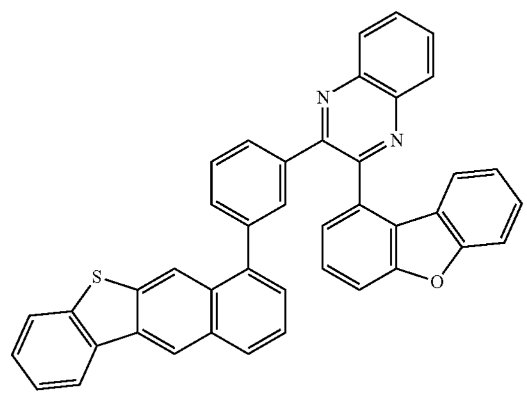
C-480
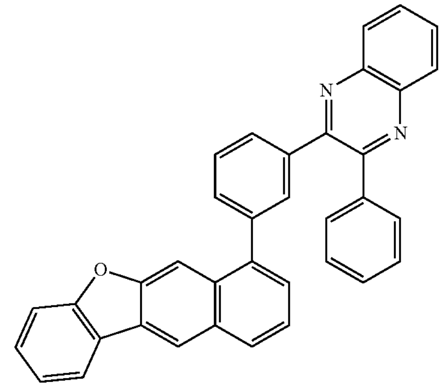

C-481
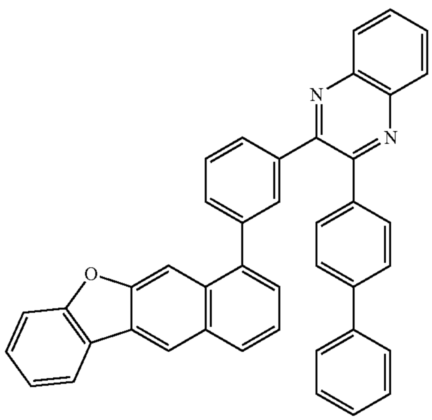
C-482
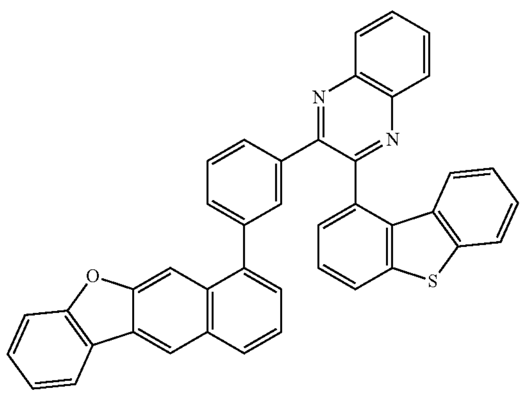
C-483
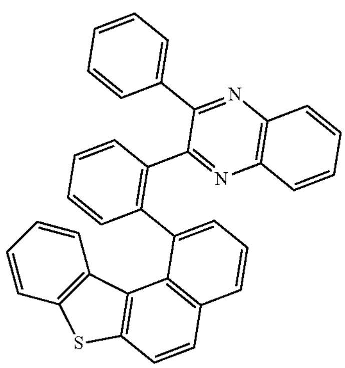
C-484
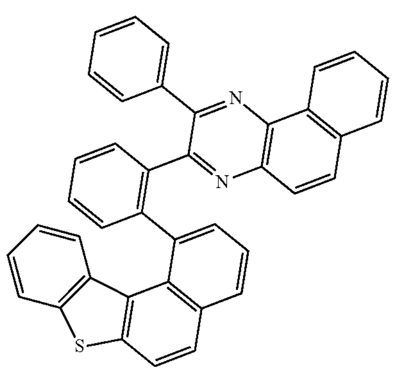
C-485
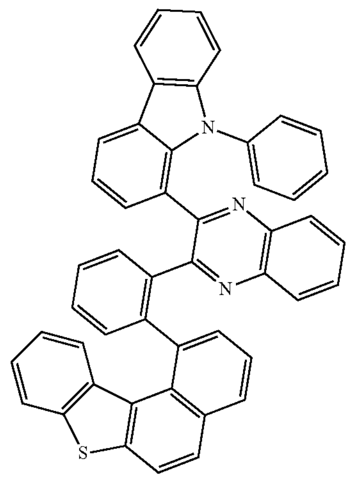
C-486
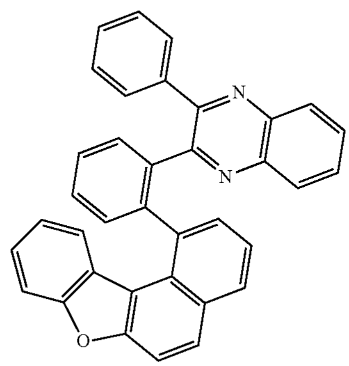
C-487
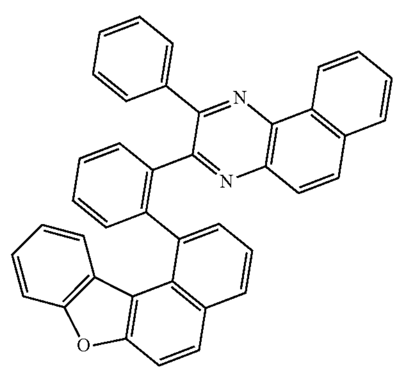

-continued
C-488
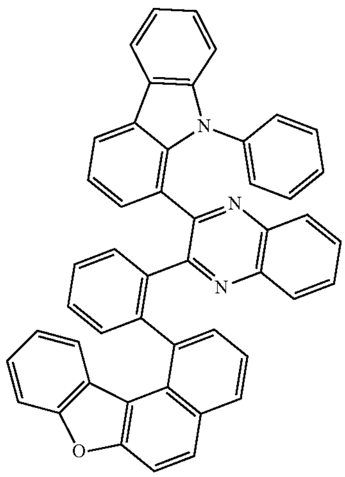
C-489
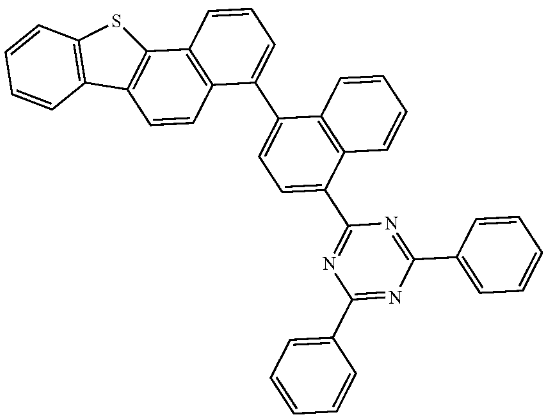
C-490
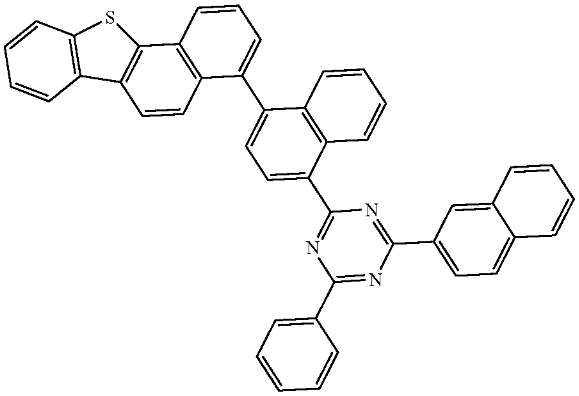
-continued
C-491
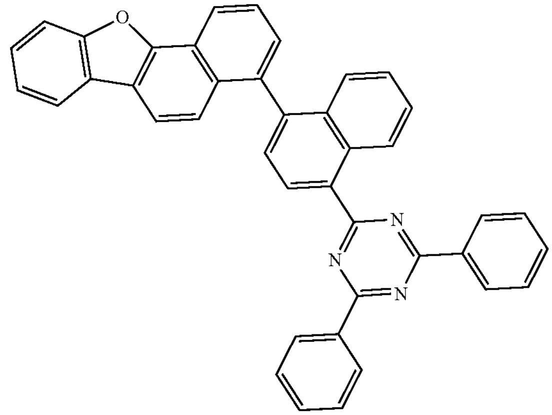
C-492
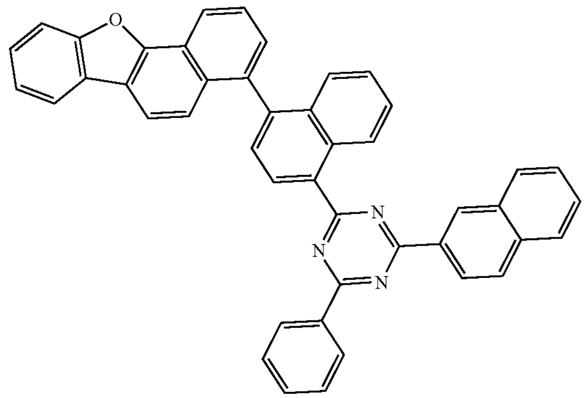
C-493
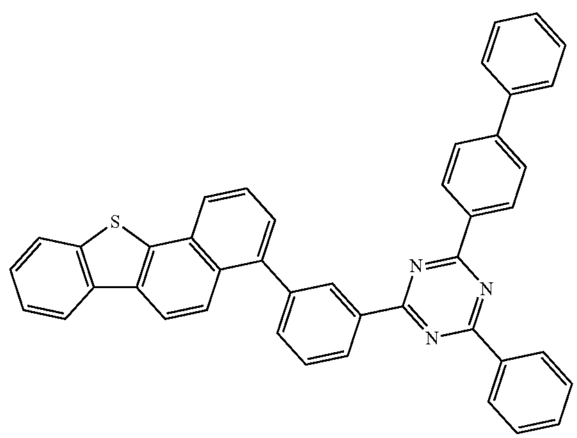
C-494
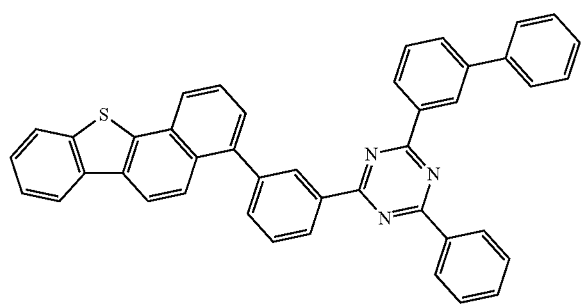

C-495
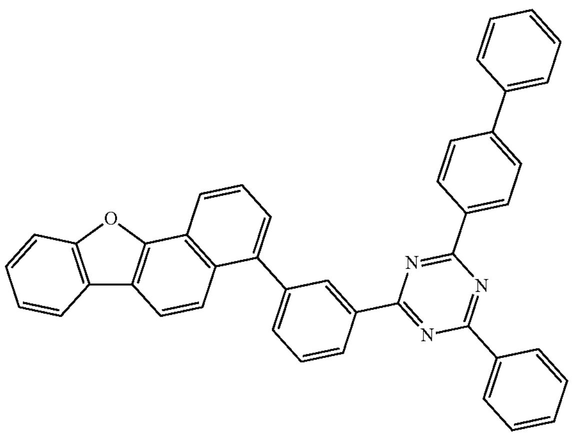
C-496
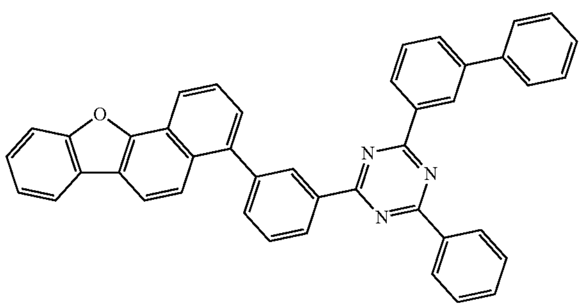
C-497
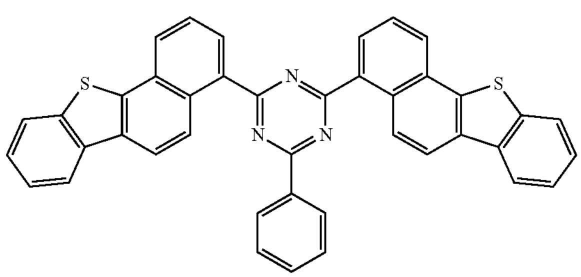
C-498
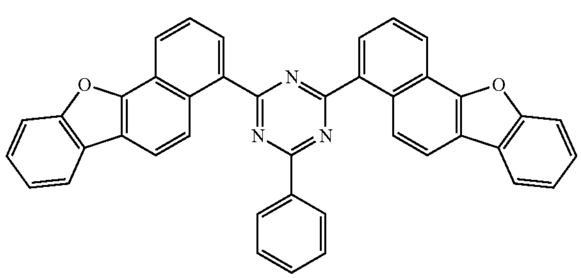
C-499
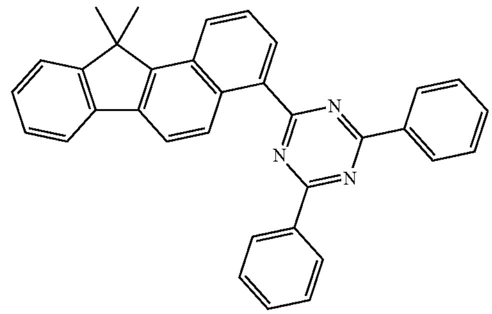
C-500
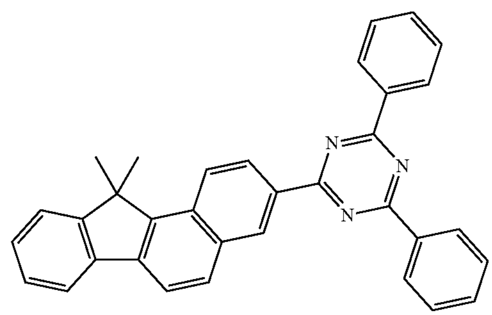
C-501
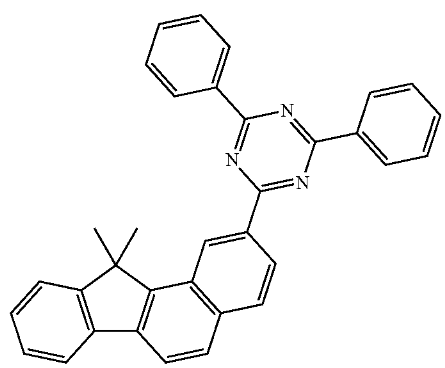
C-502
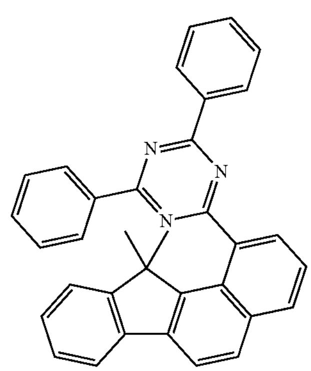

-continued
C-503
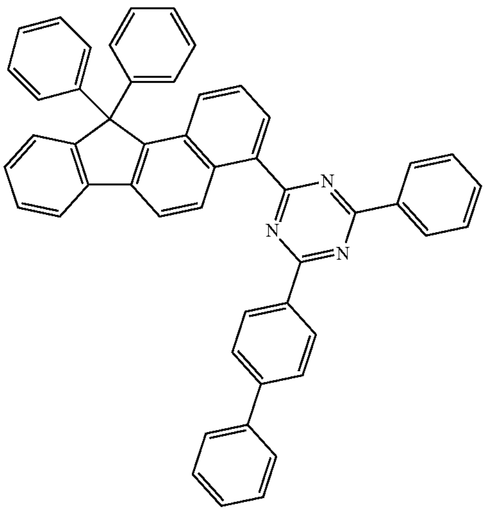
C-504
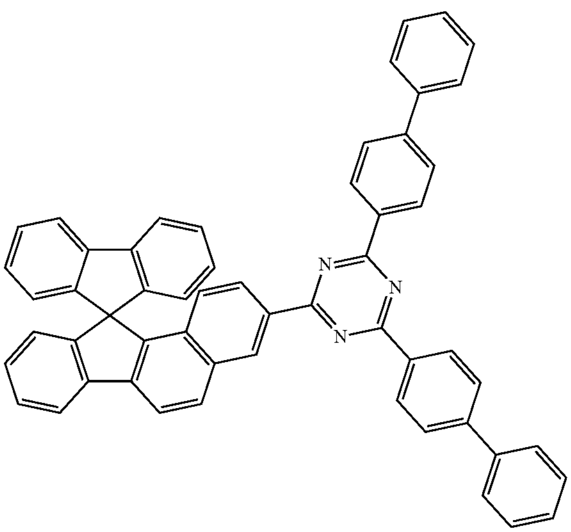
C-505
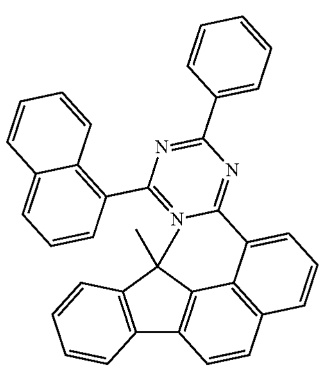
-continued
C-506
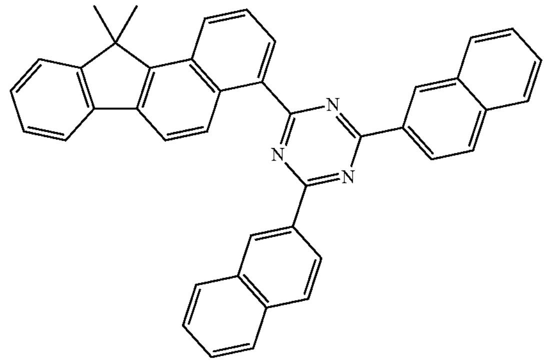
C-507
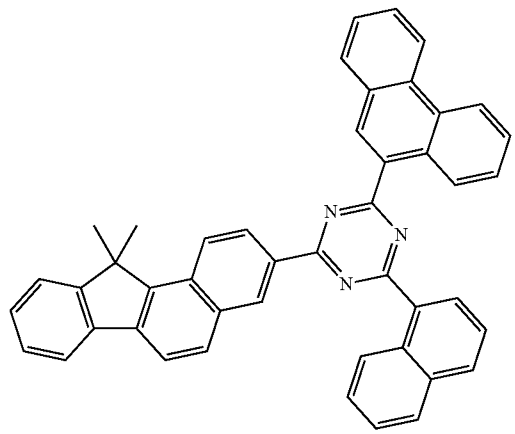
C-508
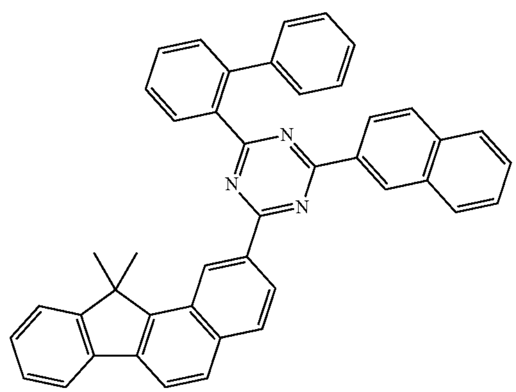
C-509
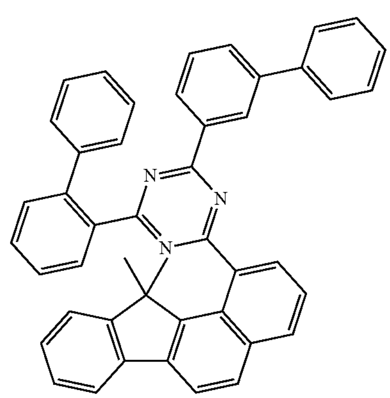

C-510
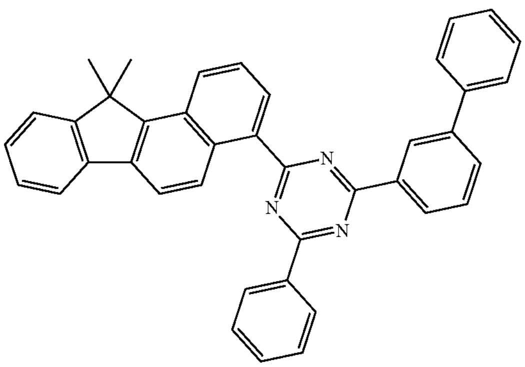
C-511
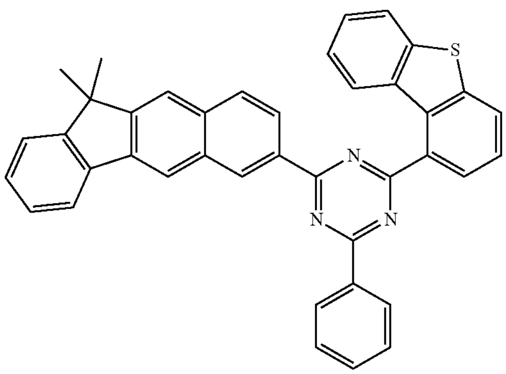
C-512
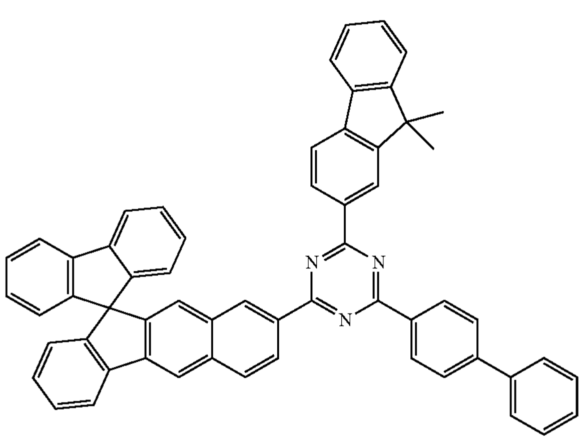
C-513
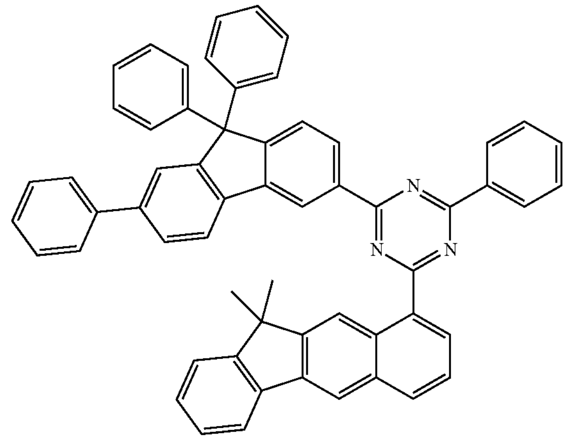
C-514
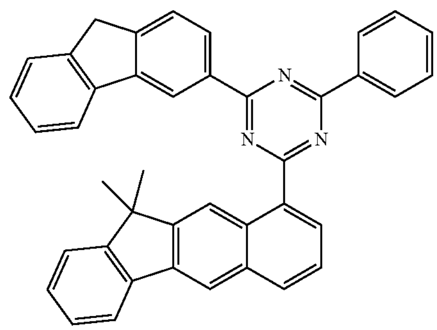
C-515
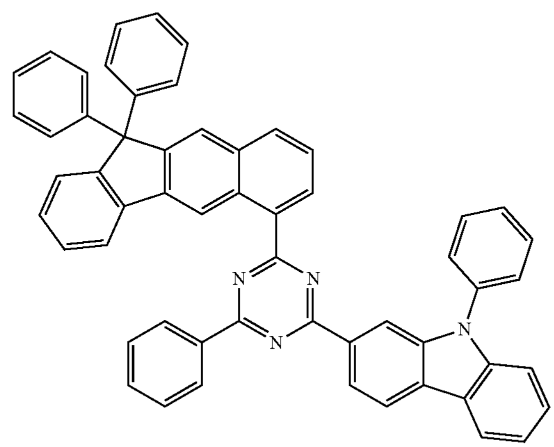
C-516
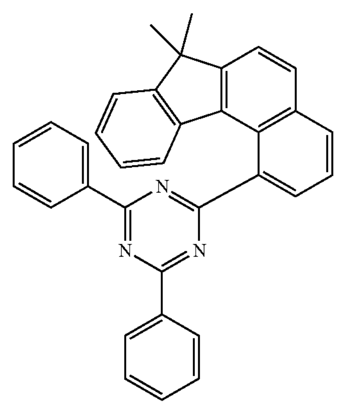

-continued
C-517
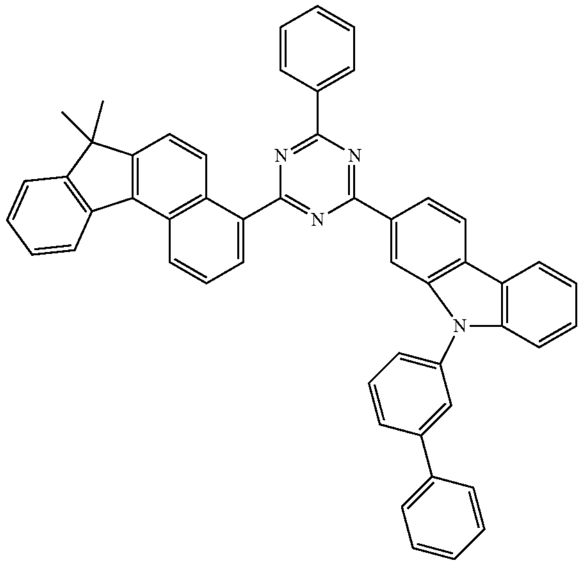
C-518
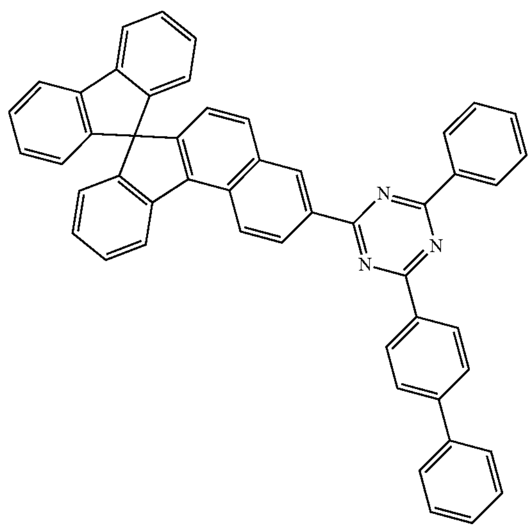
C-519
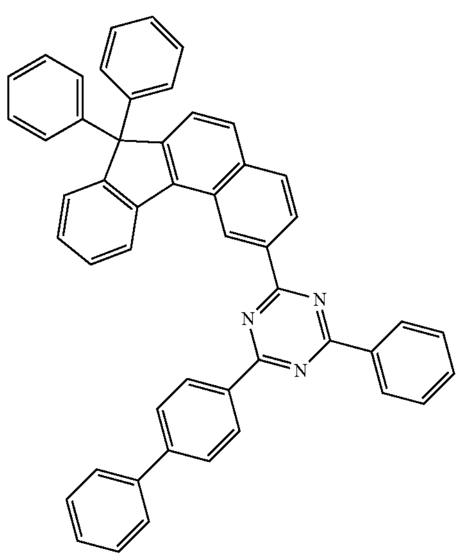
-continued
C-520
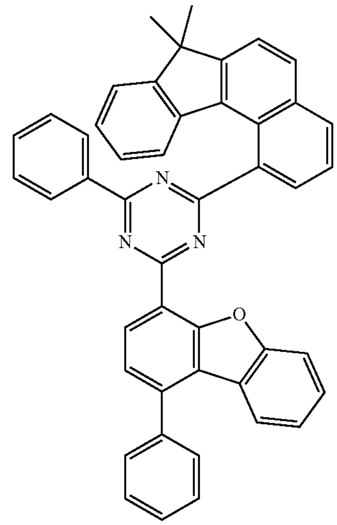
C-521
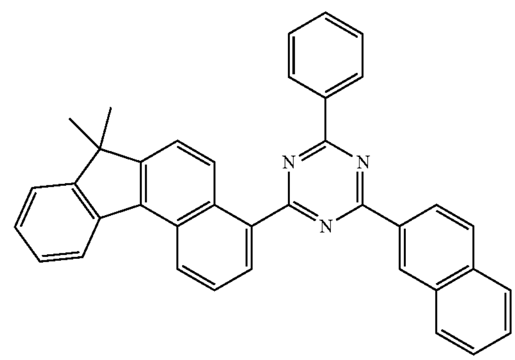
C-522
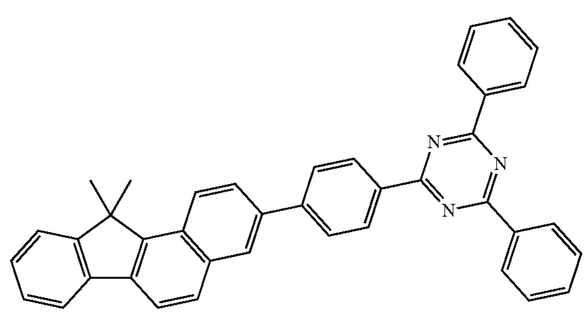

C-523
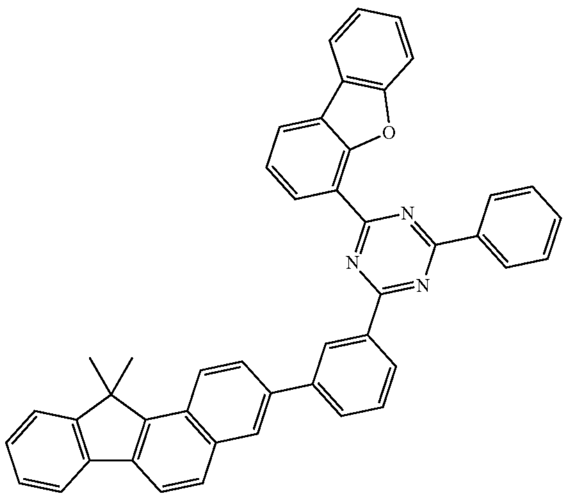
C-524
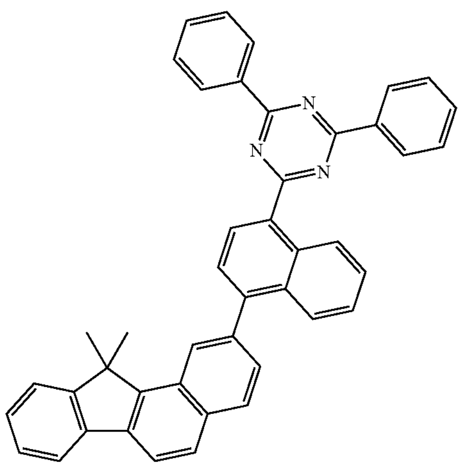
C-525
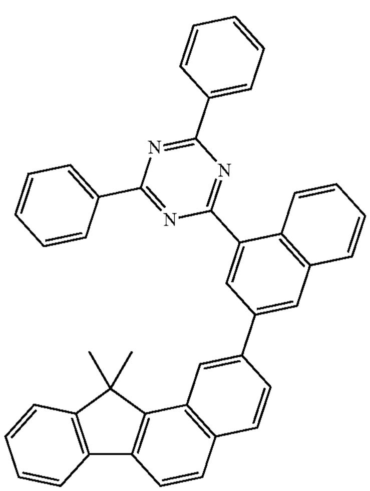
C-526
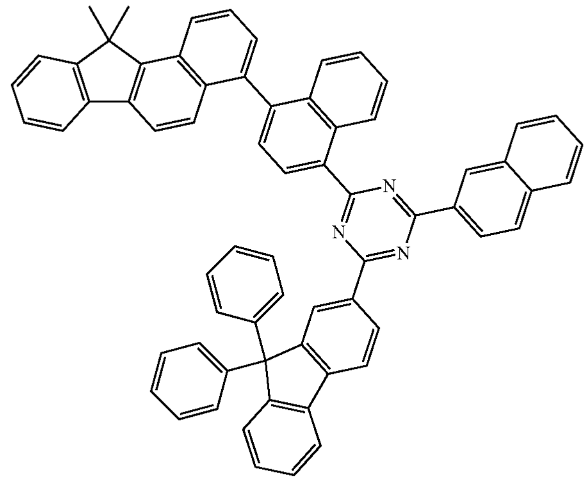
C-527
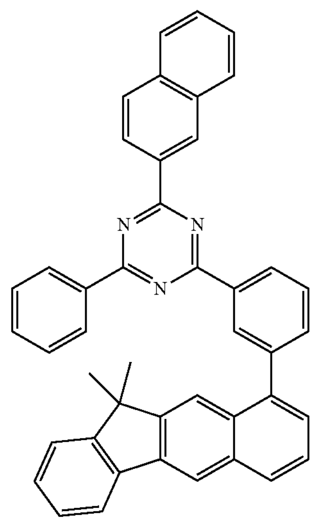
C-528
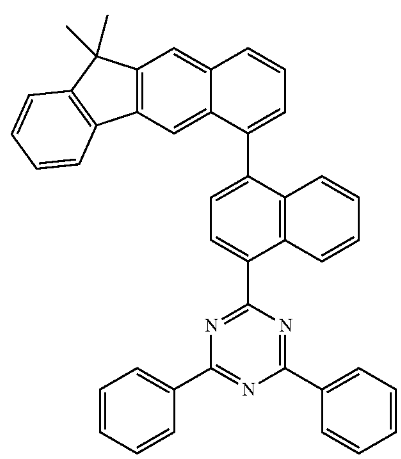

C-529
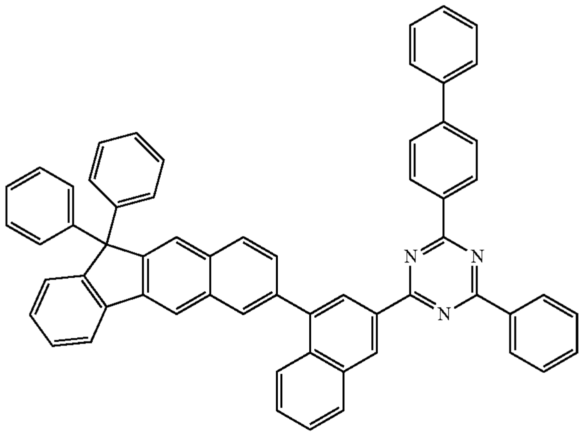
C-530
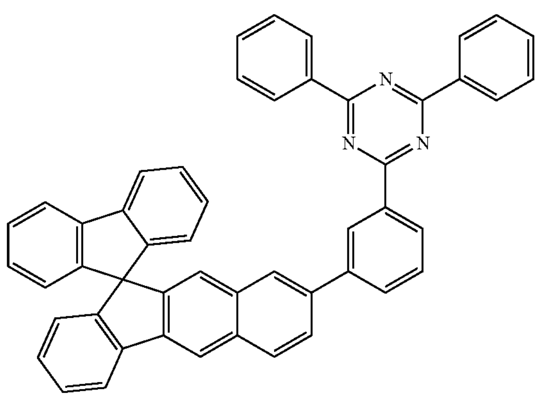
C-531
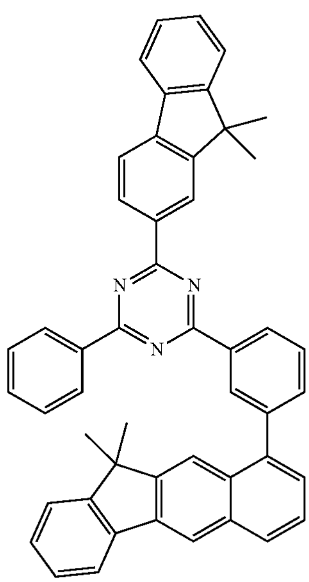
C-532
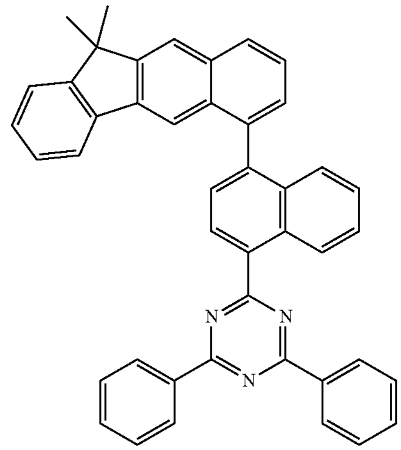
C-533
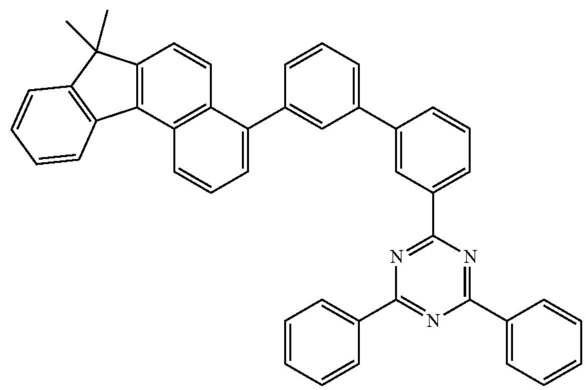
C-534
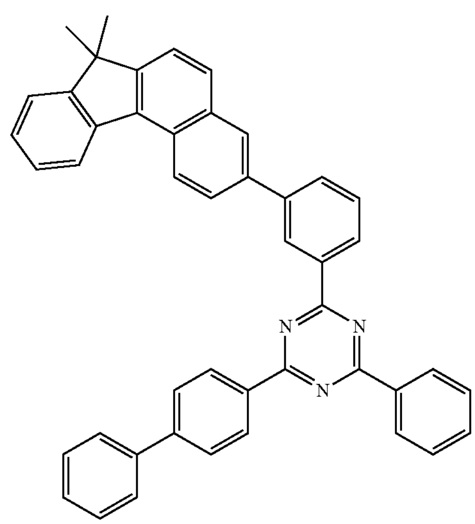

-continued
C-535
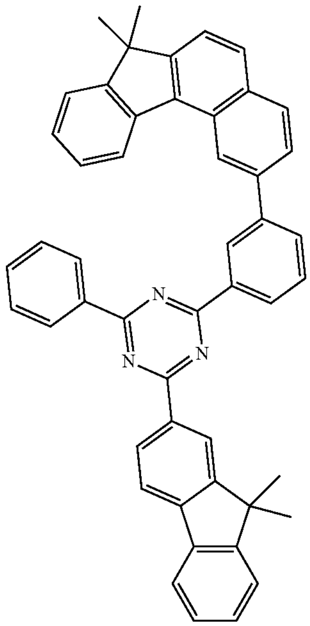
C-536
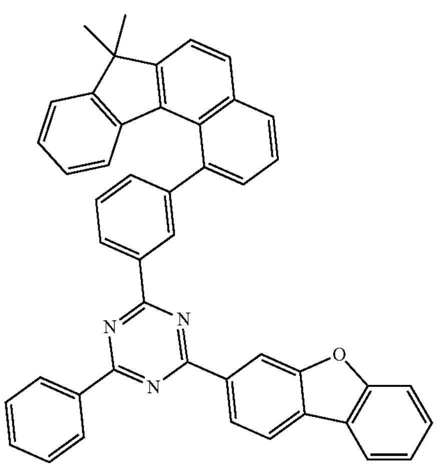
C-537
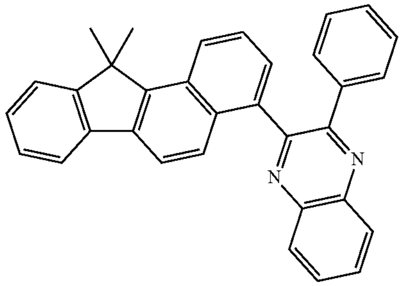
-continued
C-538
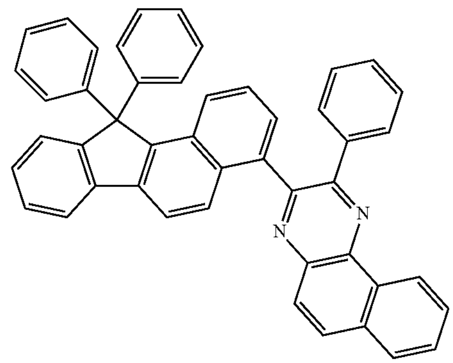
C-539
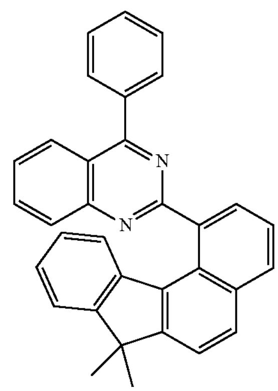
C-540
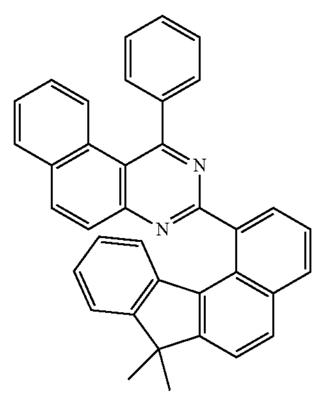
C-541
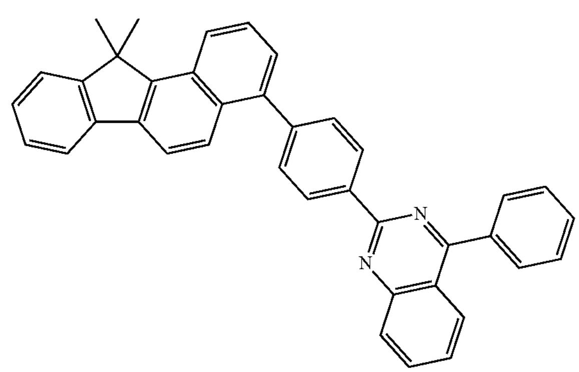

-continued
C-542
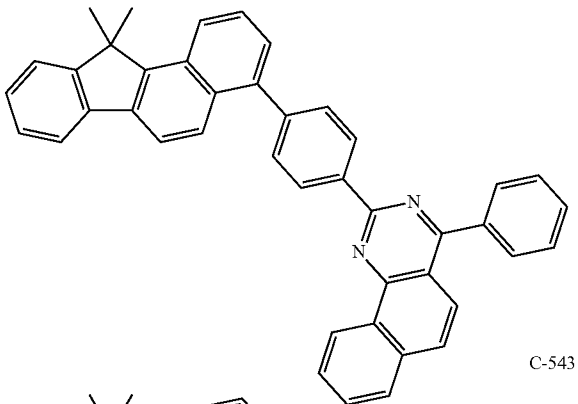
C-543
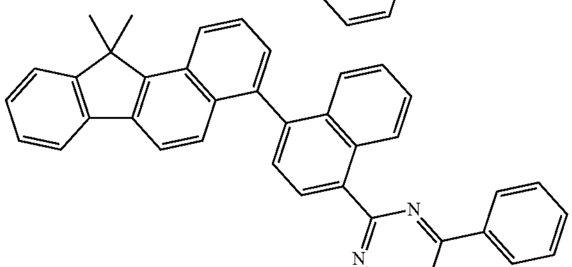
C-544
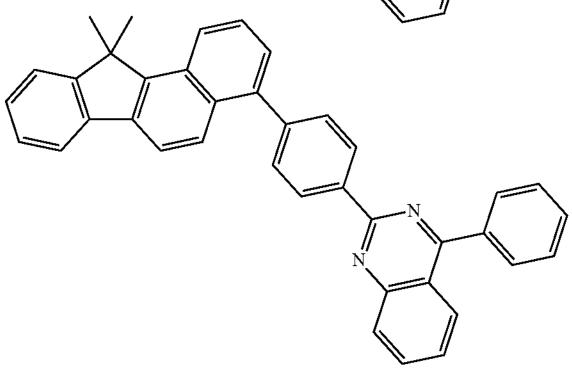
C-545
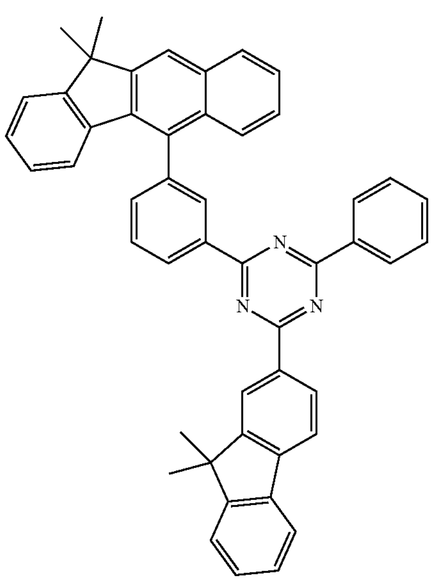
-continued
C-546
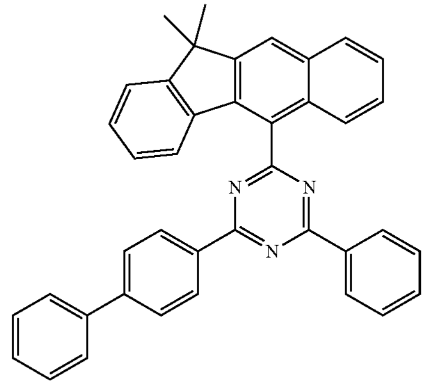
C-547
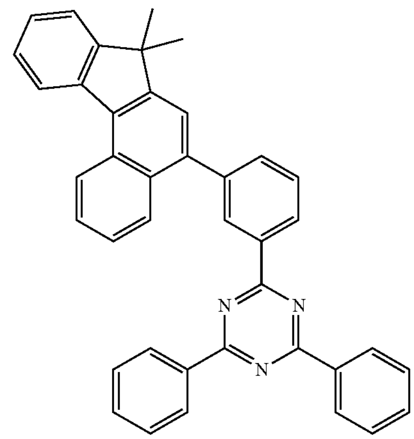
C-548
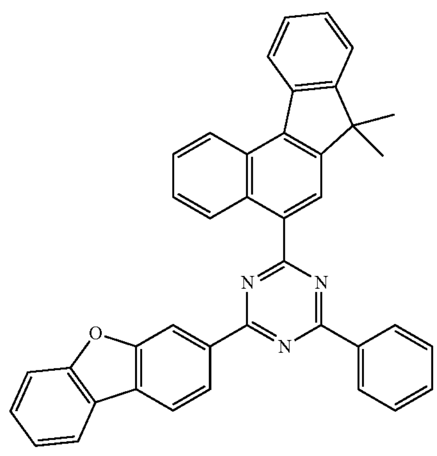
C-549
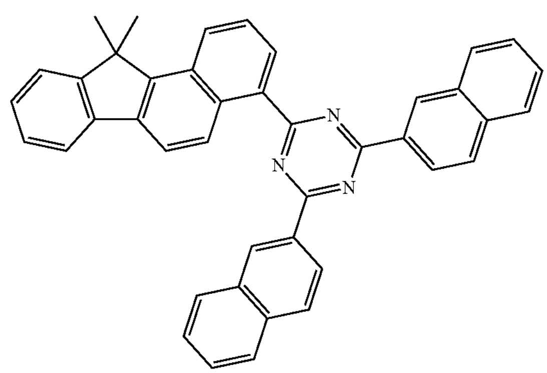

C-550
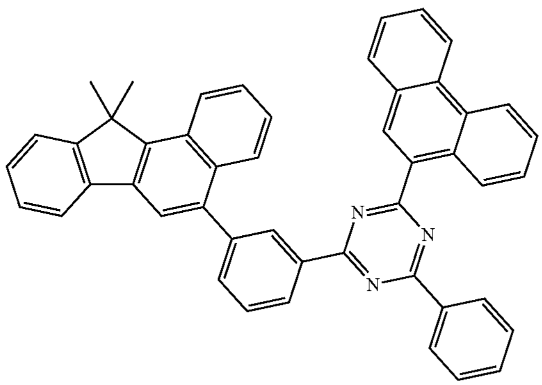
C-551
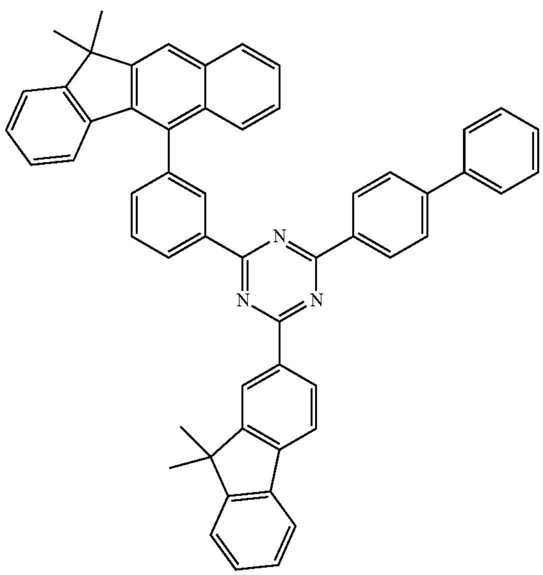
C-552
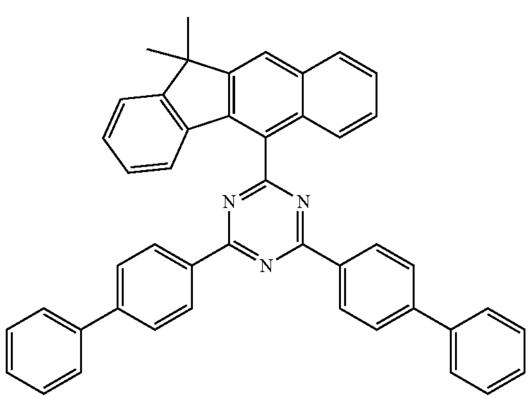
C-553
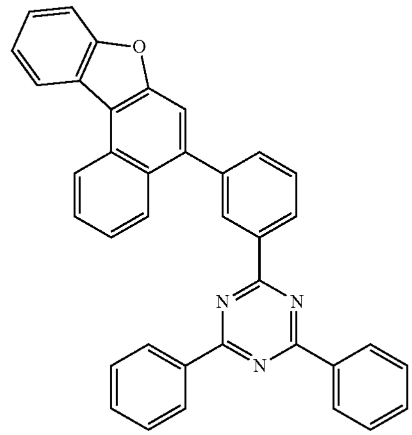
C-554
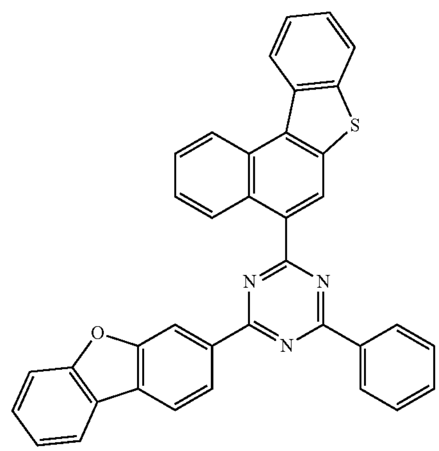
C-555
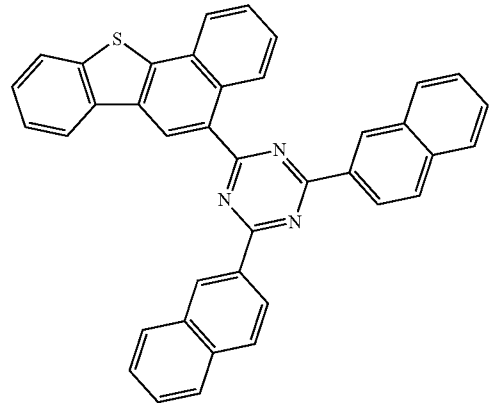

-continued
C-556
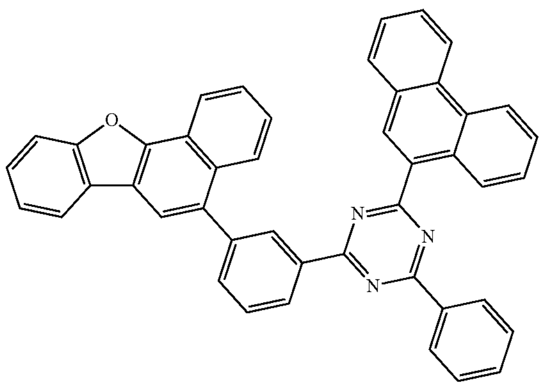
C-557
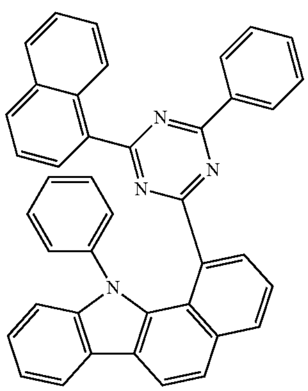
C-558
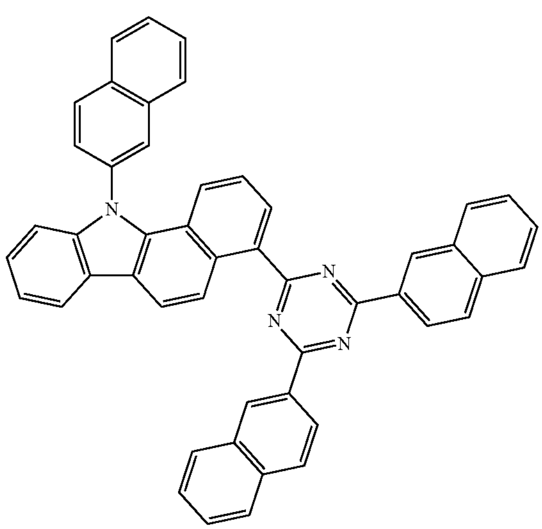
-continued
C-559
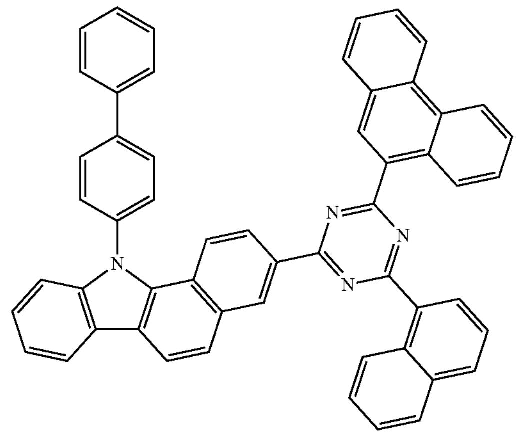
C-560
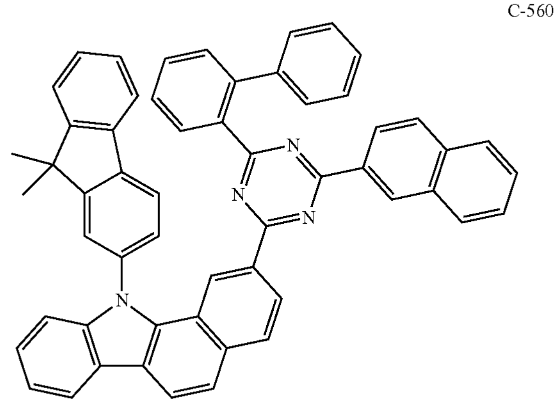
C-561
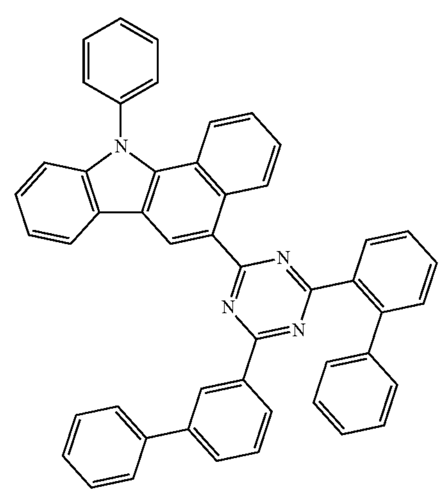

-continued
C-562
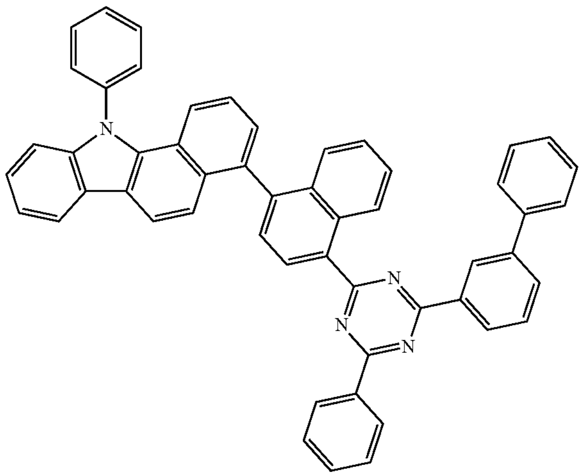
C-563
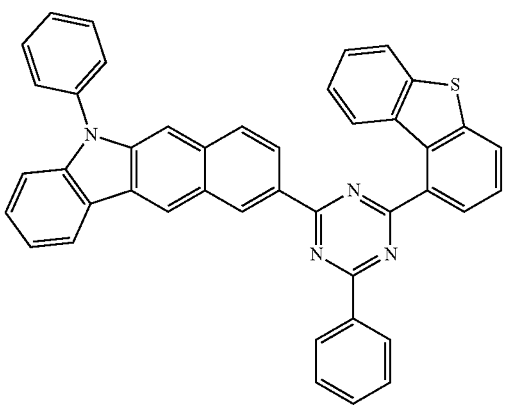
C-564
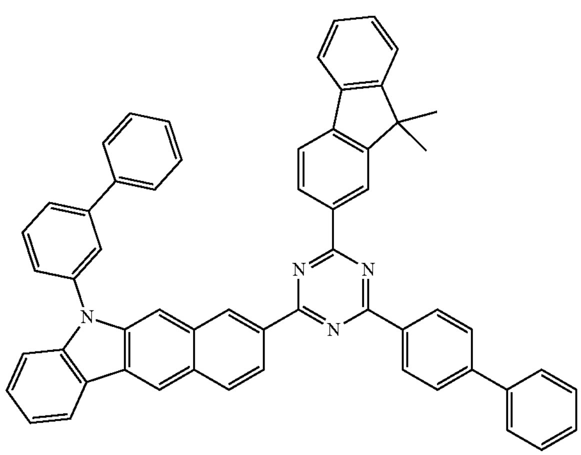
-continued
C-565
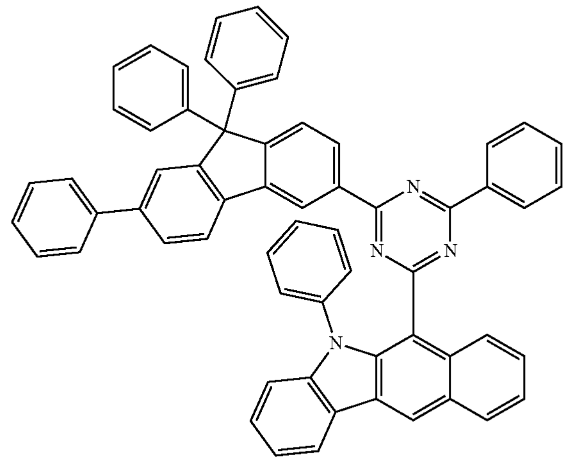
C-566
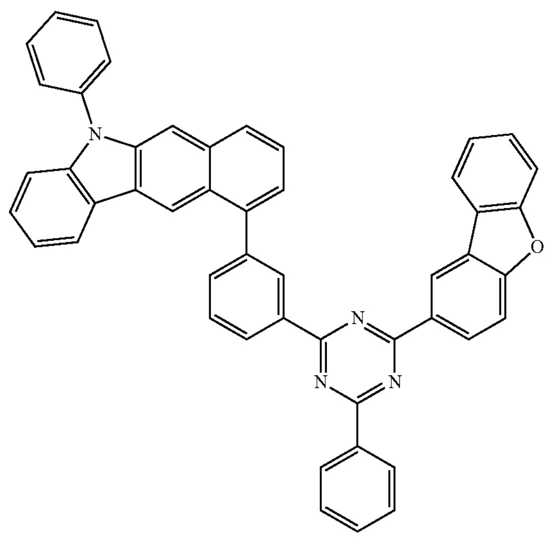
C-567
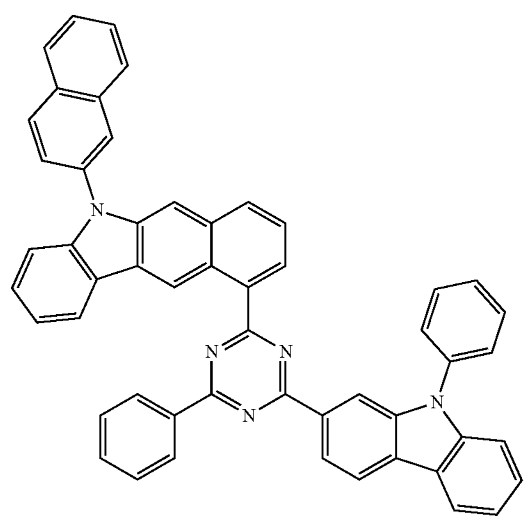

-continued
C-568
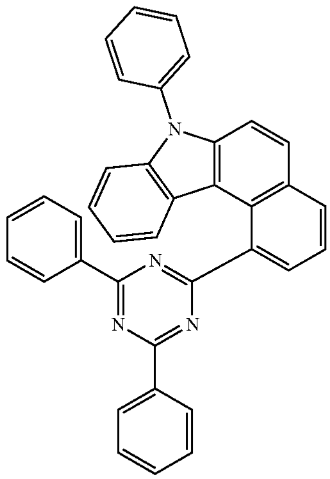
C-569
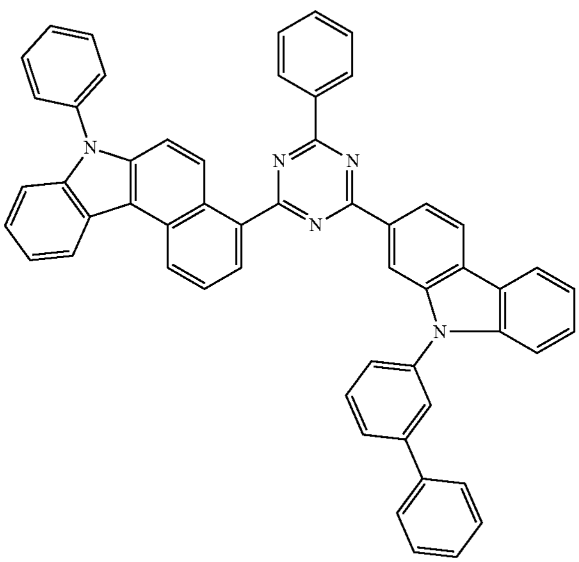
C-570
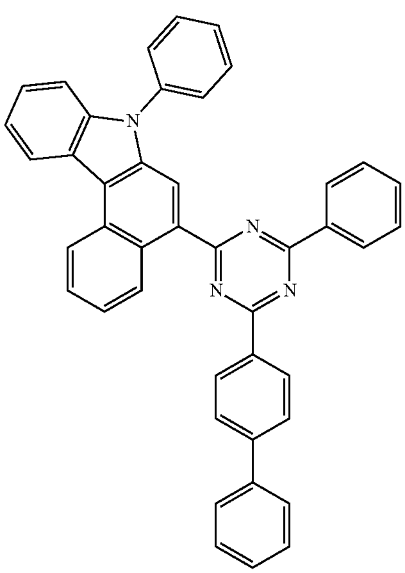
-continued
C-571
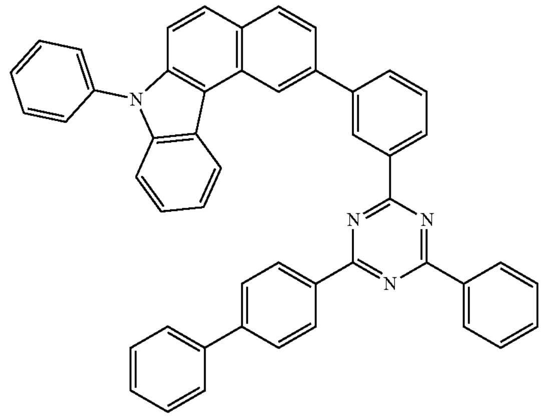
C-572
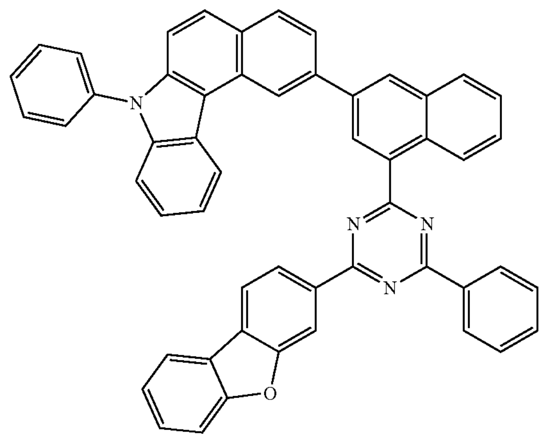
C-573
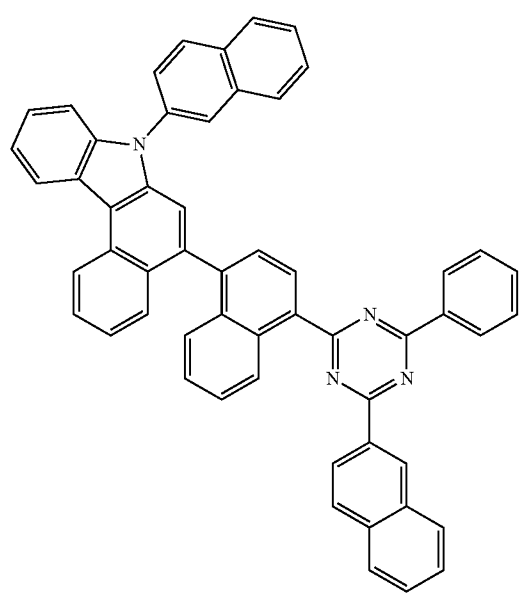

-continued
C-574
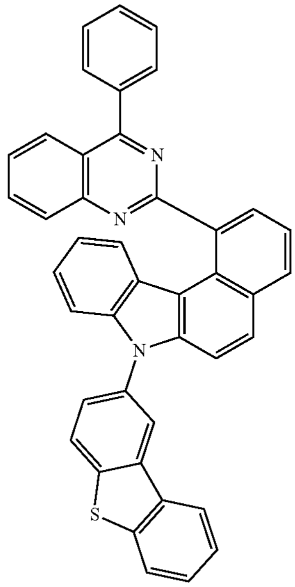
C-575
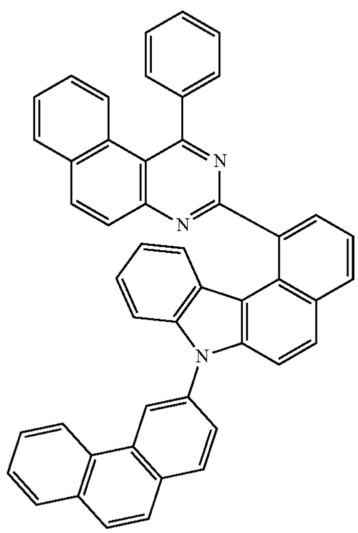
C-576
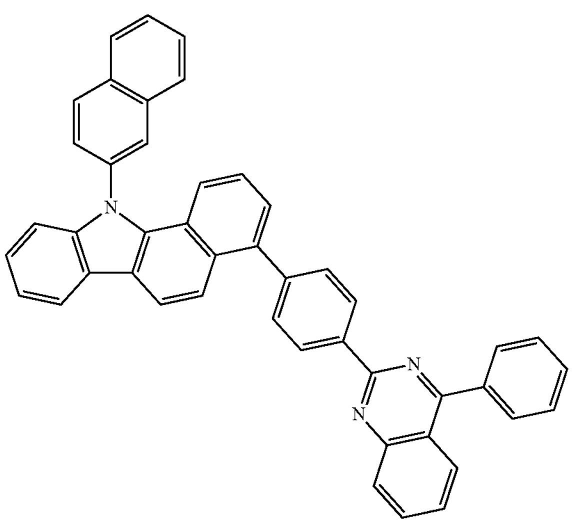
-continued
C-577
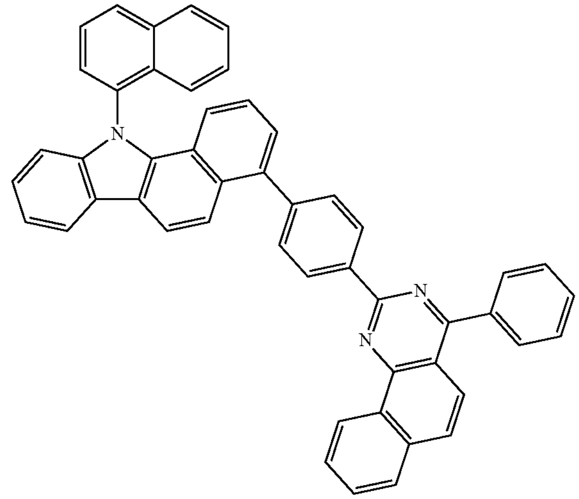
C-578
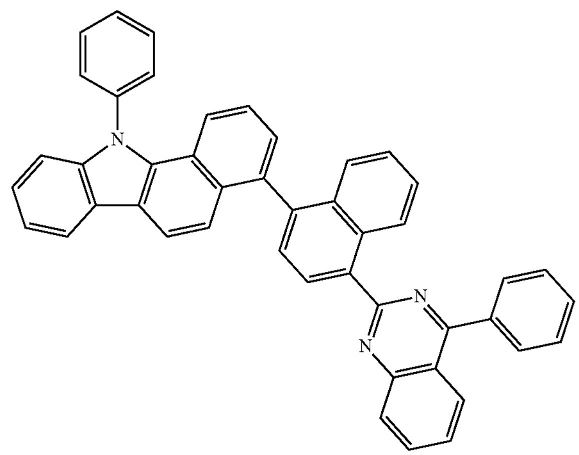
C-579
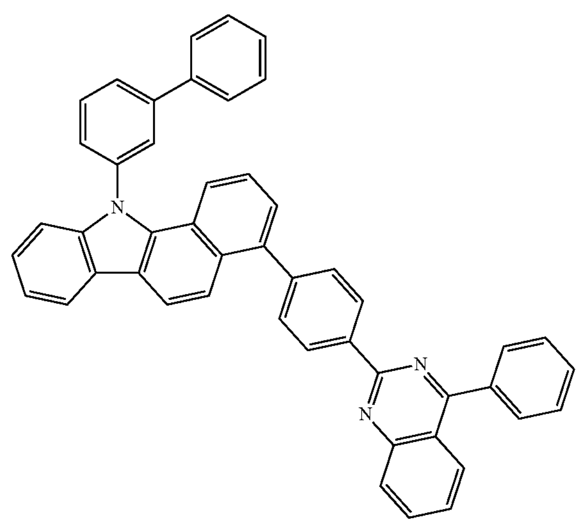

-continued
C-580
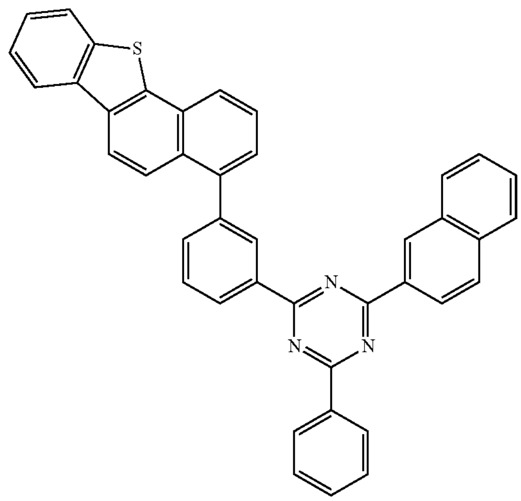
C-581
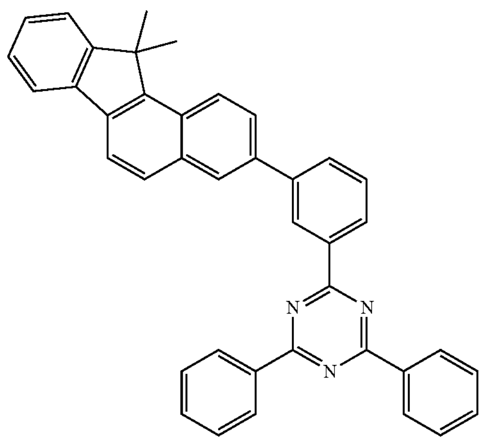
C-582
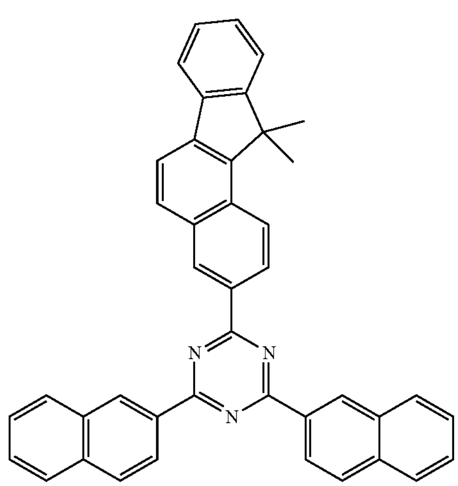
-continued
C-583
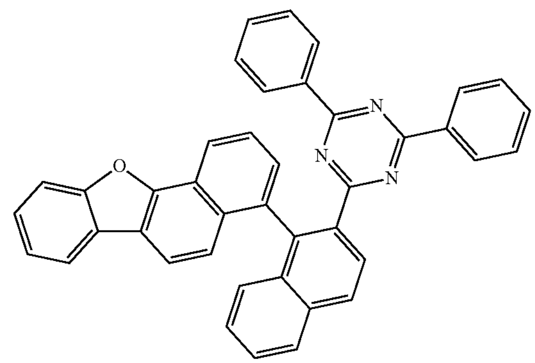
C-584
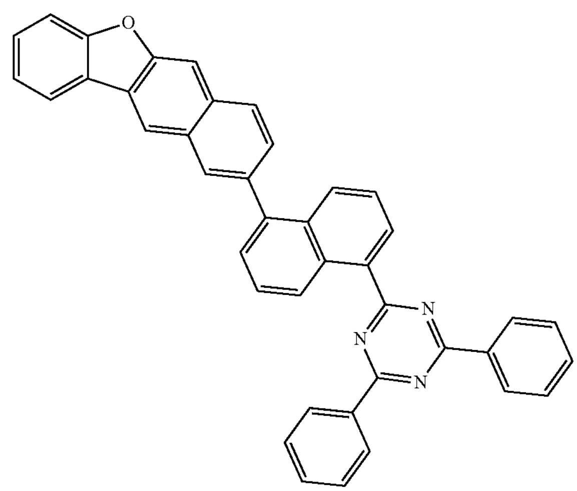
C-585
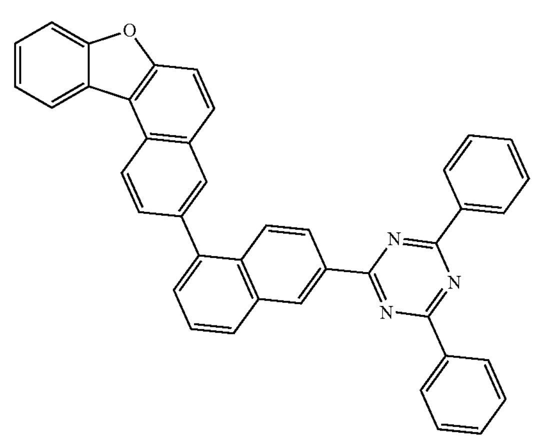

-continued
C-586
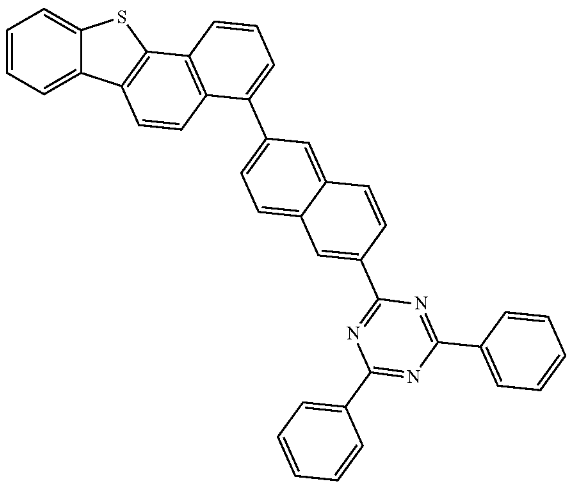
C-587
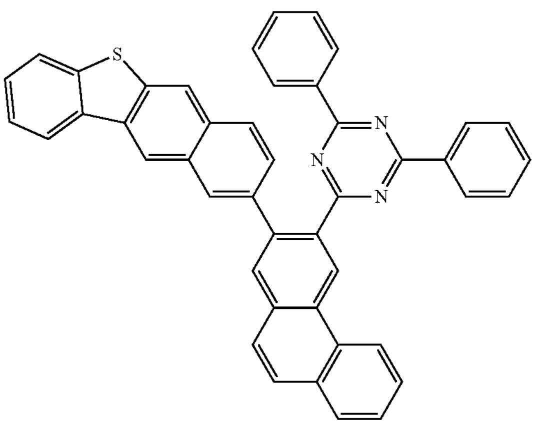
C-588
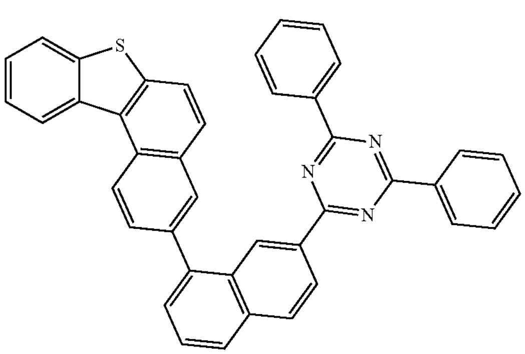
-continued
C-589
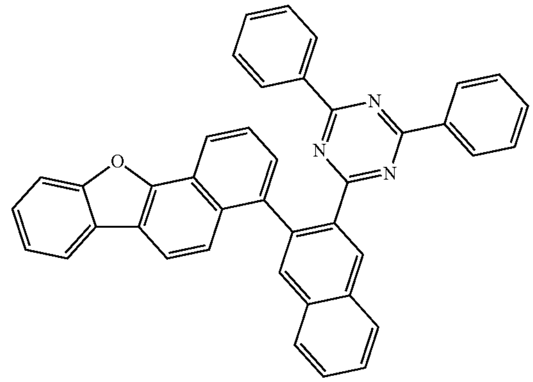
C-590
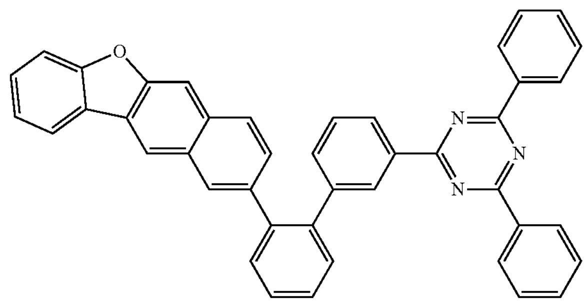
C-591
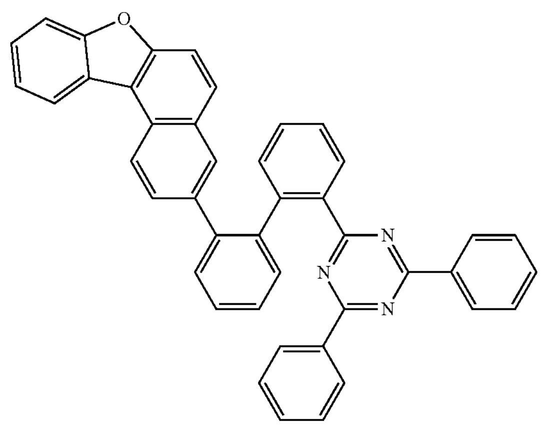
C-592
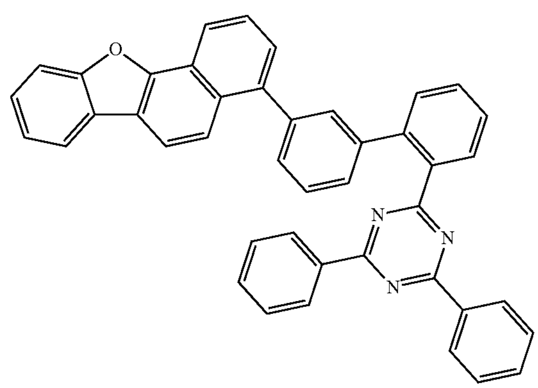

-continued
C-593
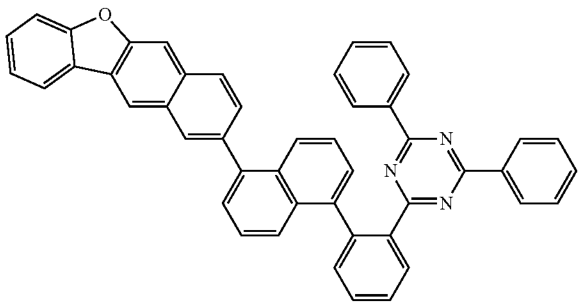
C-594
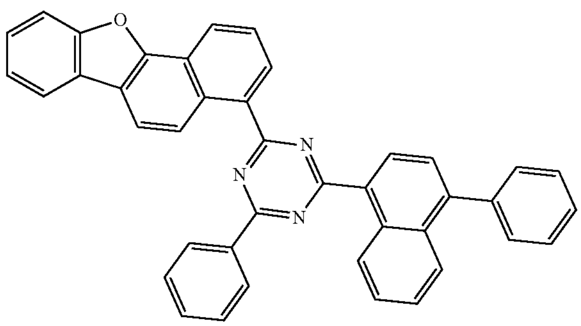
C-595
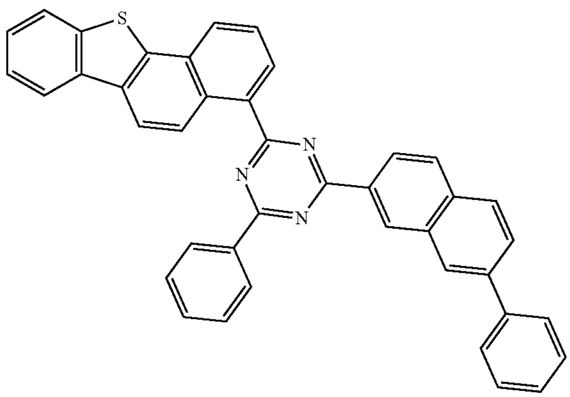
C-596
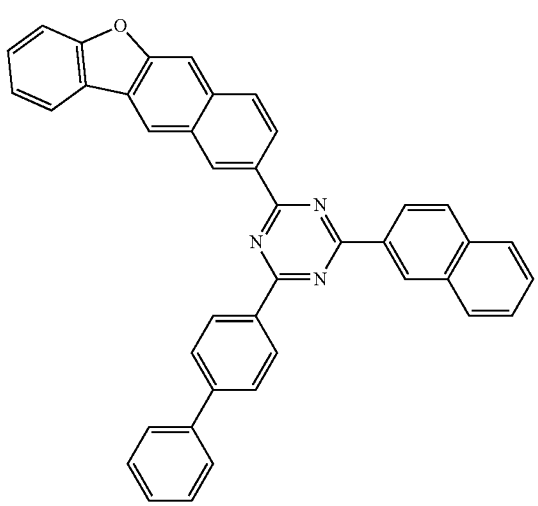
and
-continued
C-597
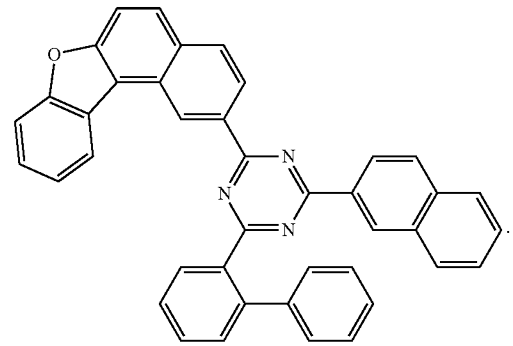
.
3. The host materials according to claim 1, wherein the compound represented by formula 2 is selected from the group consisting of:
H-1
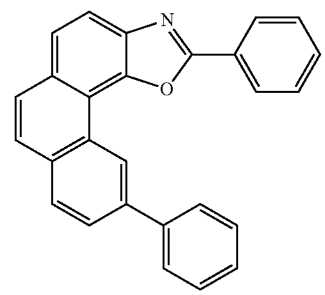
H-2
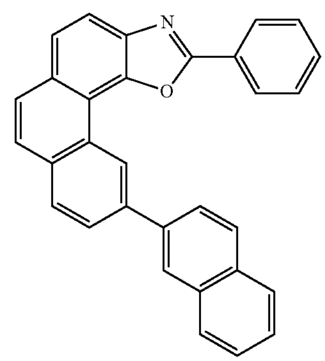
H-3
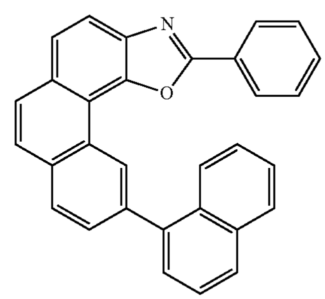

H-4
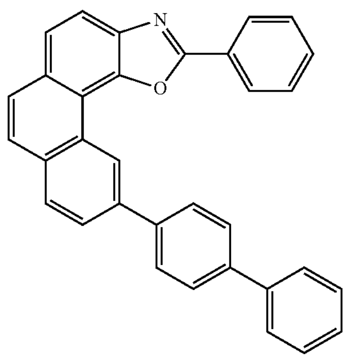
H-5
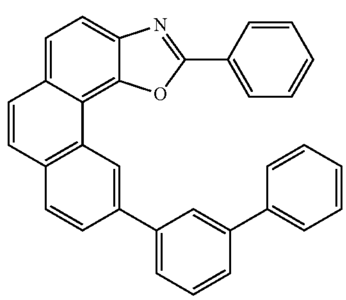
H-6
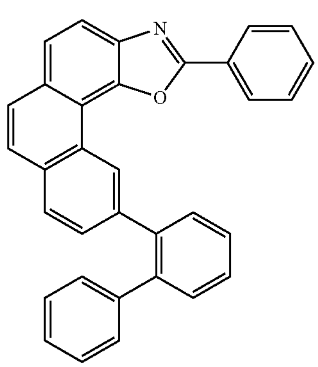
H-7
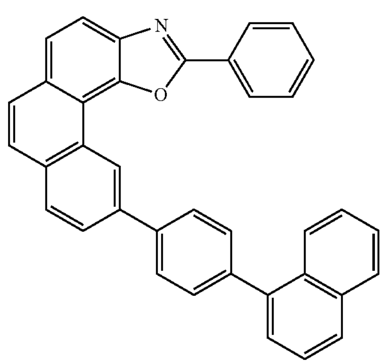
H-8
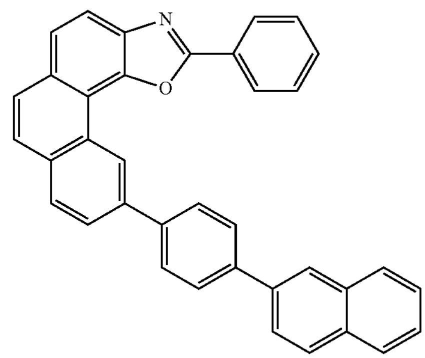
H-9
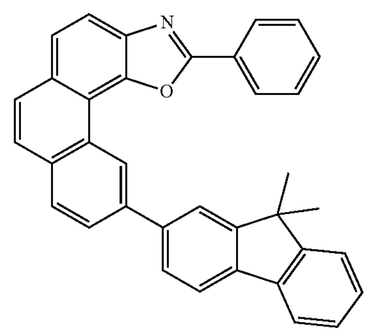
H-10
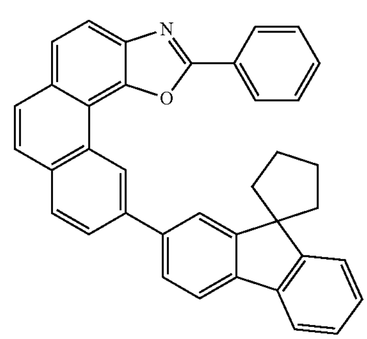
H-11
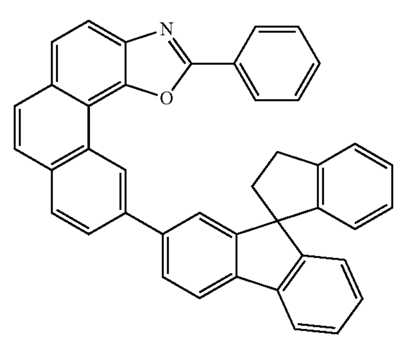

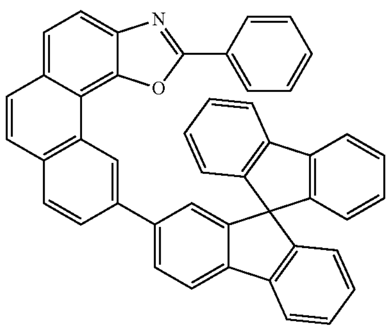
H-12
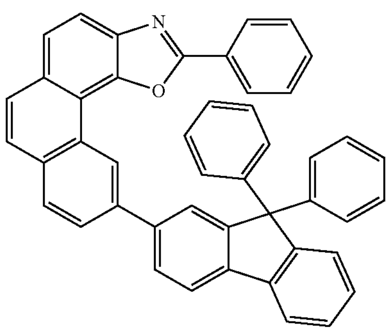
H-13
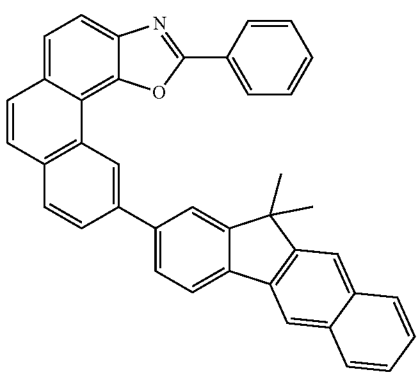
H-14
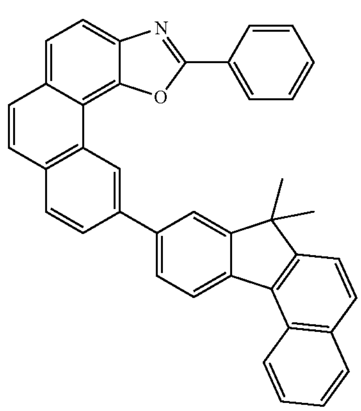
H-15
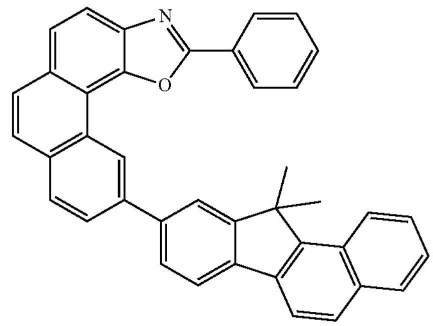
H-16
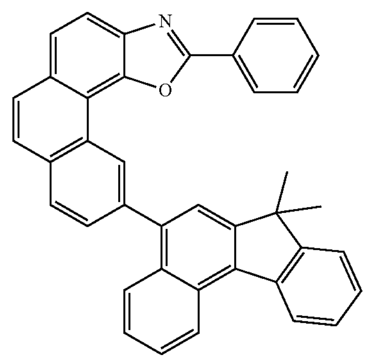
H-17
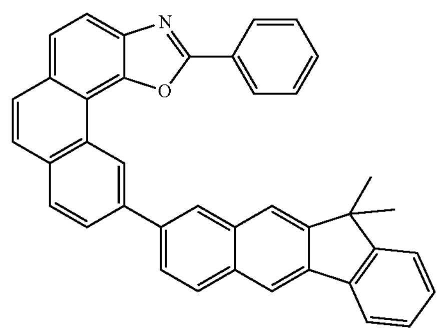
H-18
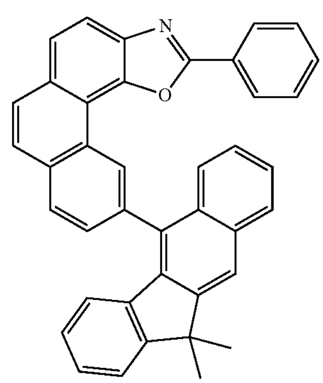
H-19

-continued
H-20
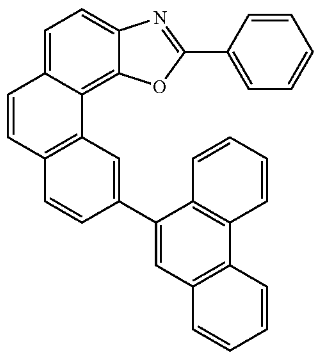
H-21
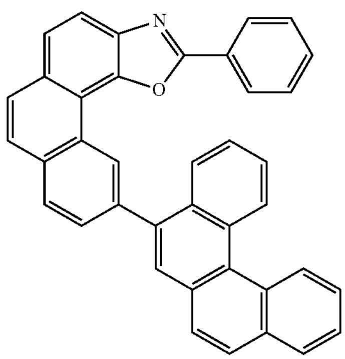
H-22
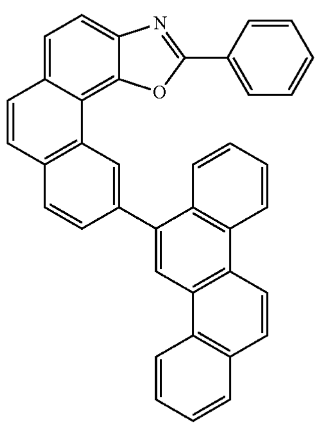
H-23
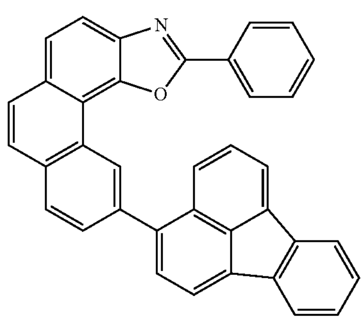
-continued
H-24
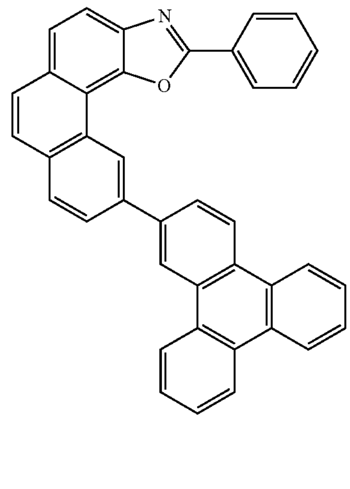
H-25
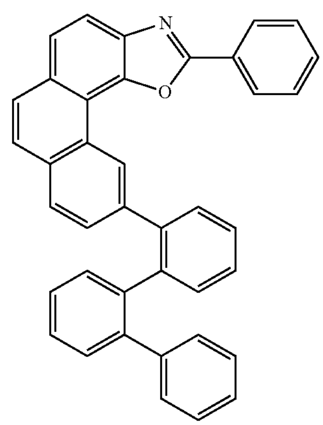
H-26
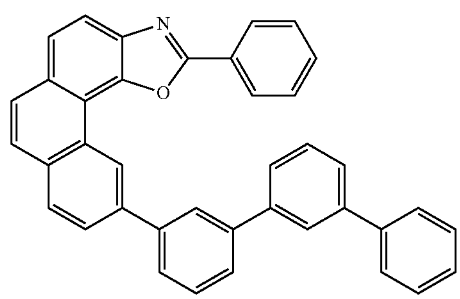
H-27
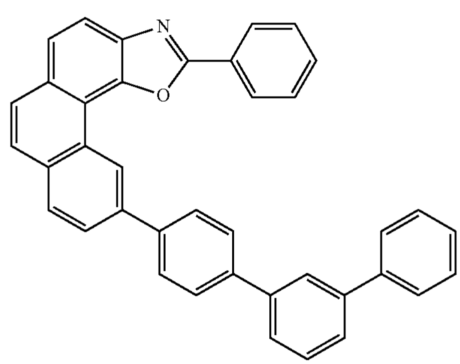

-continued
H-28
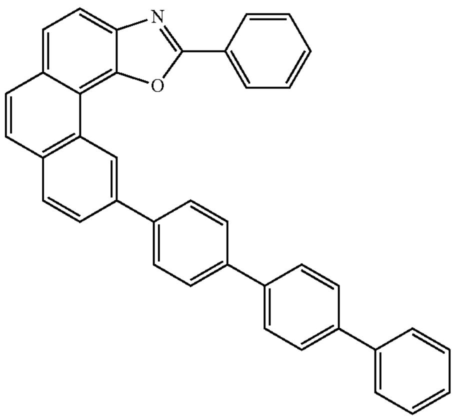
H-29
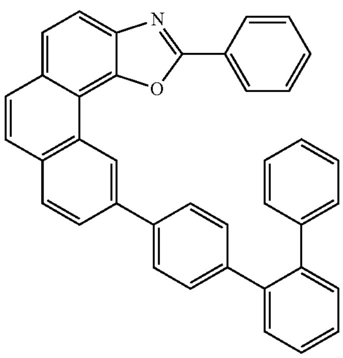
H-30
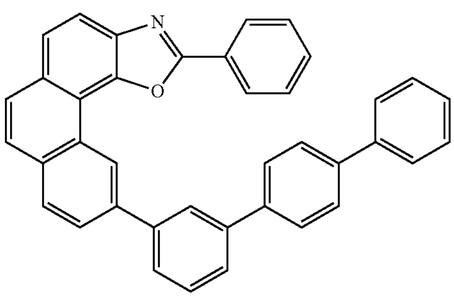
H-31
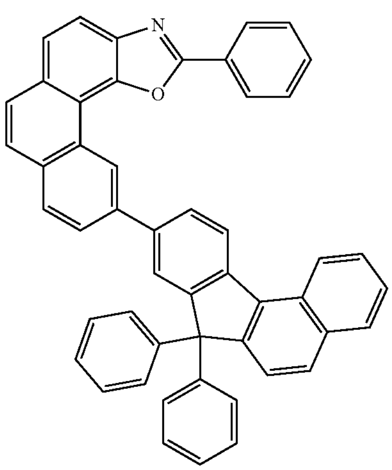
-continued
H-32
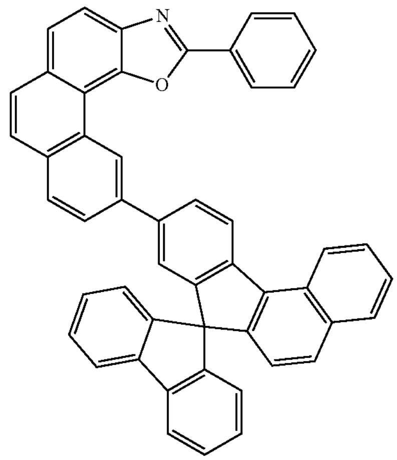
H-33
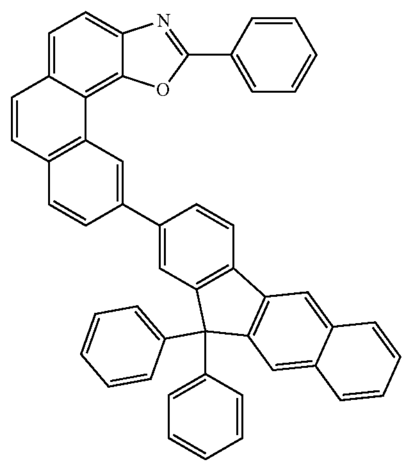
H-34
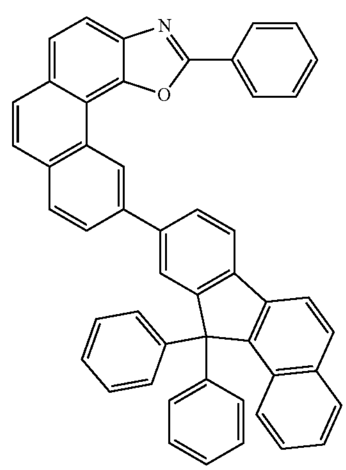

-continued
H-35
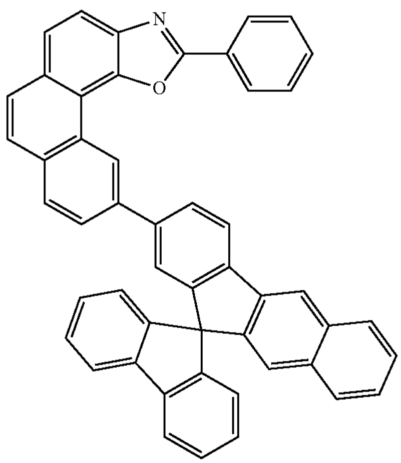
H-36
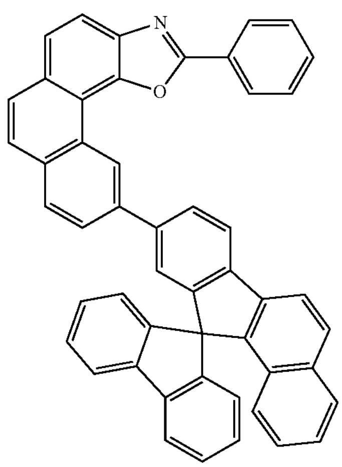
H-37
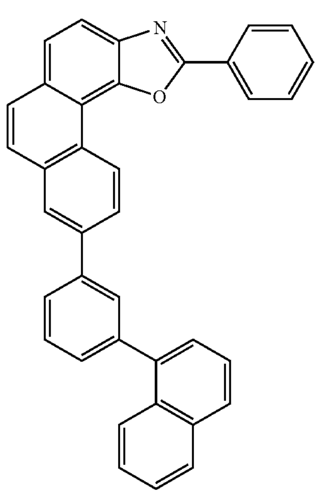
-continued
H-38
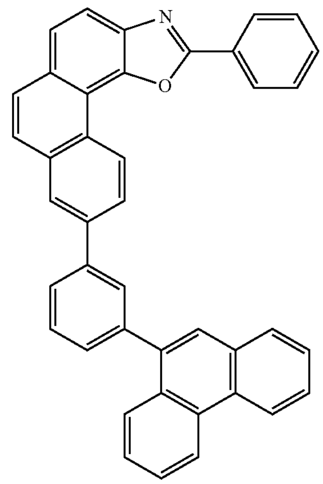
H-39
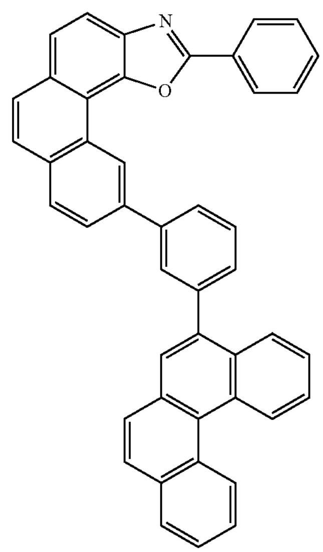
H-40
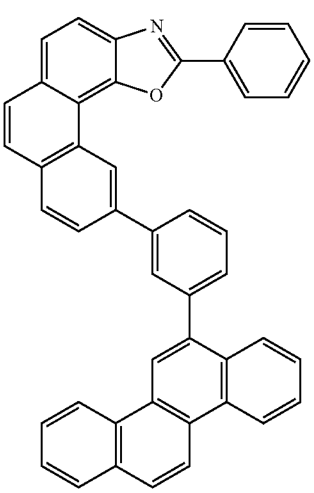

-continued
H-41
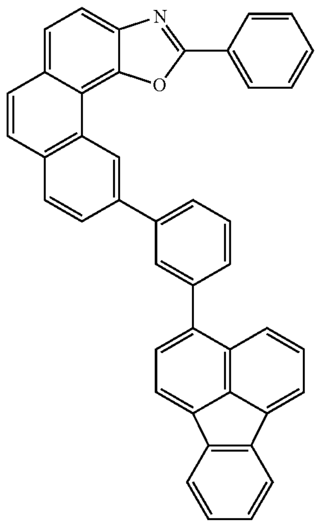
H-42
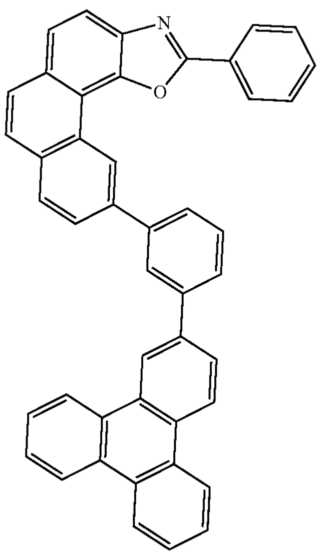
H-43
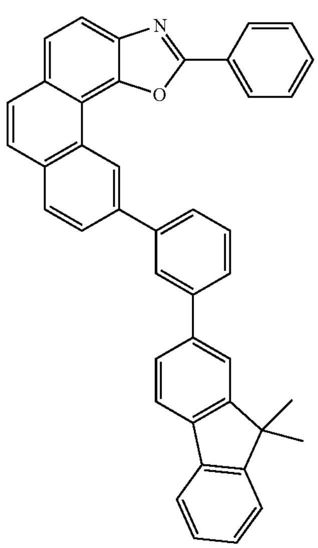
-continued
H-44
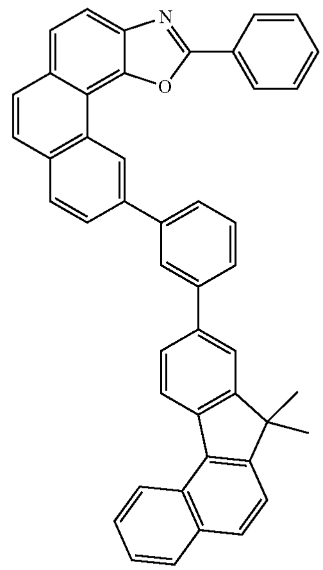
H-45
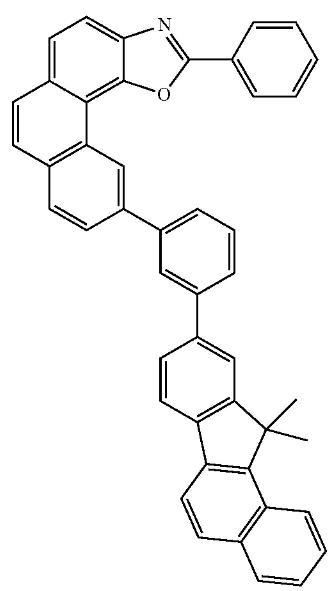

-continued
H-46
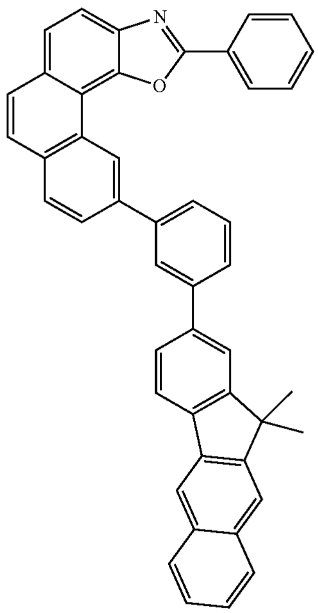
H-47
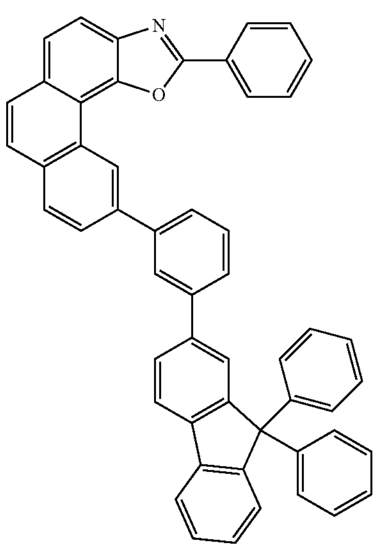
-continued
H-48
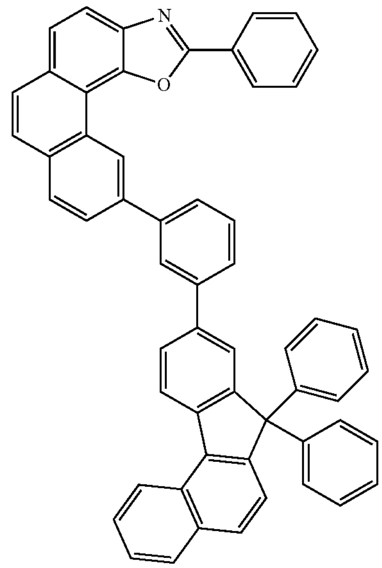
H-49
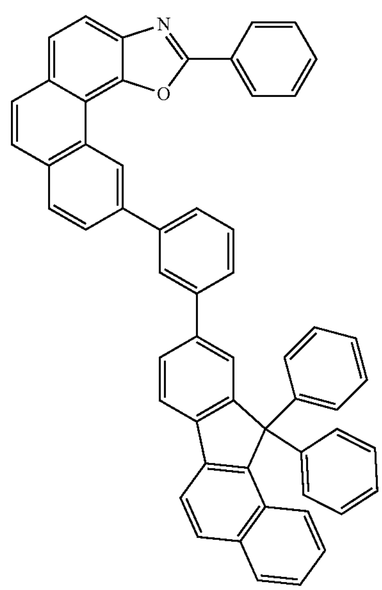

-continued
H-50
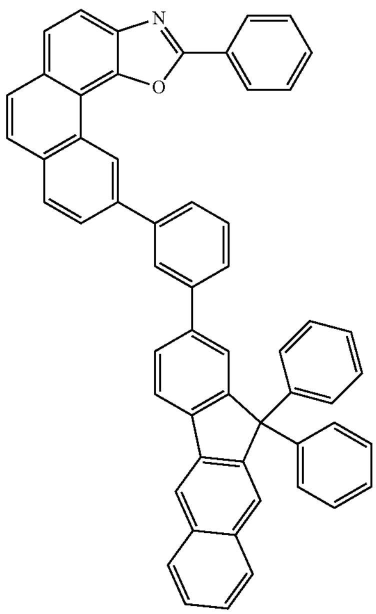
H-51
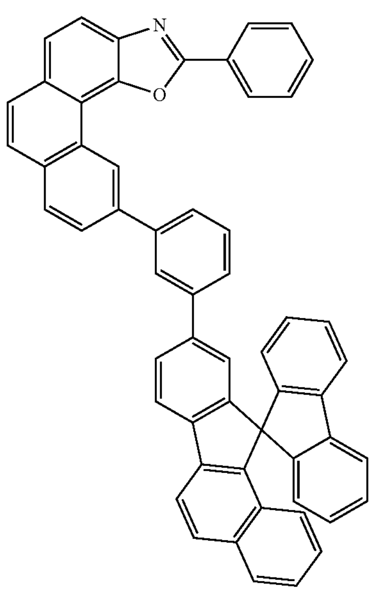
-continued
H-52
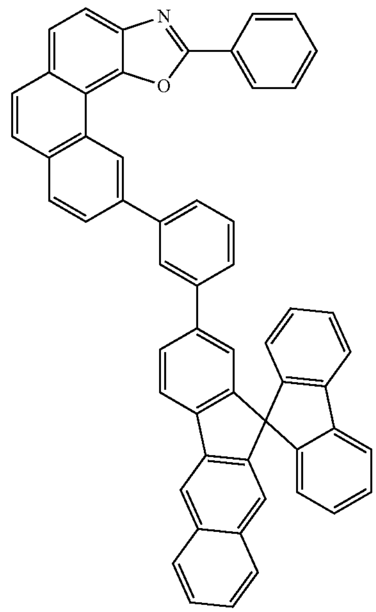
H-53
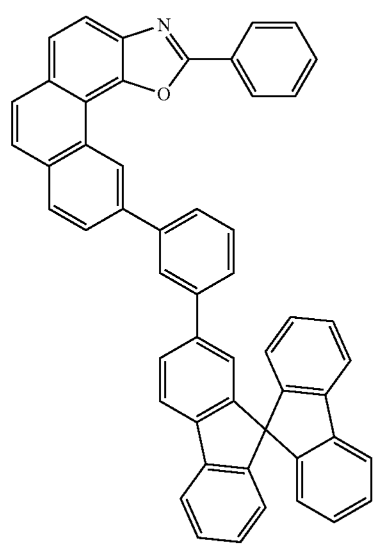

H-54
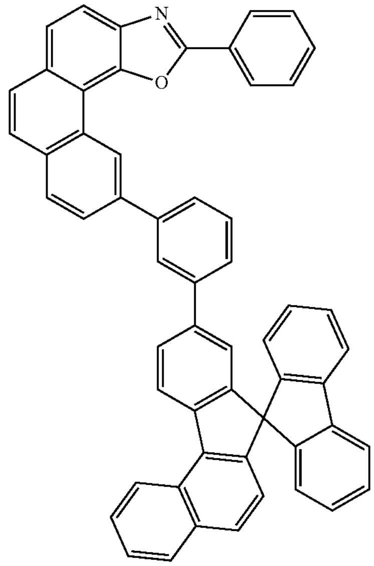
H-55
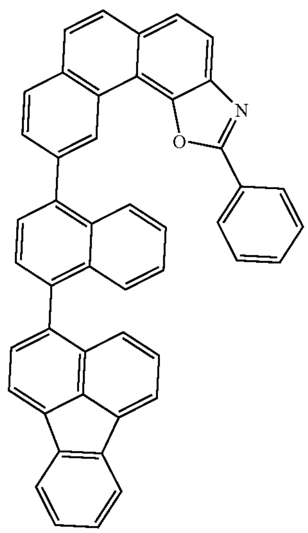
H-56
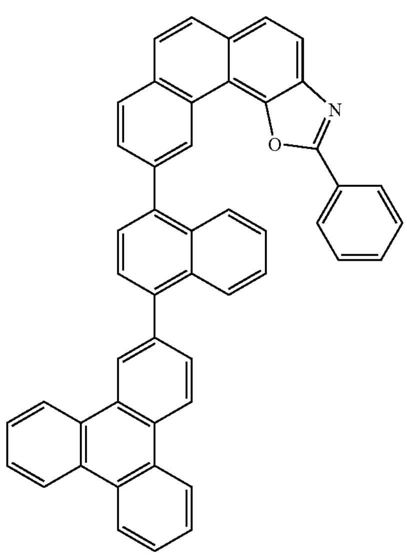
H-57
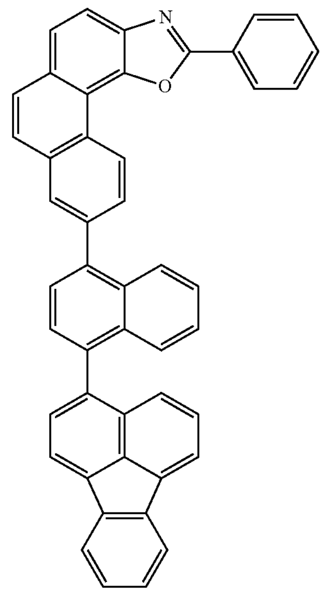
H-58
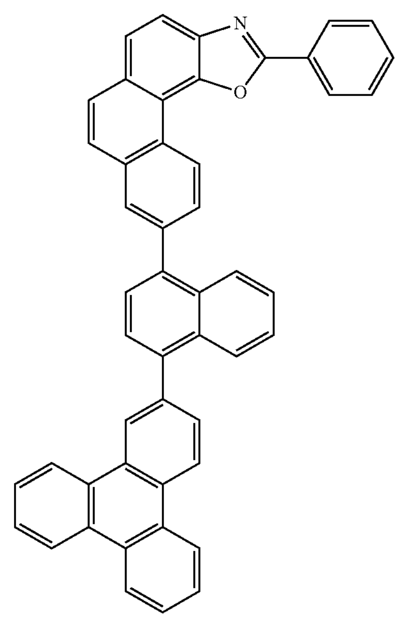

-continued
H-59
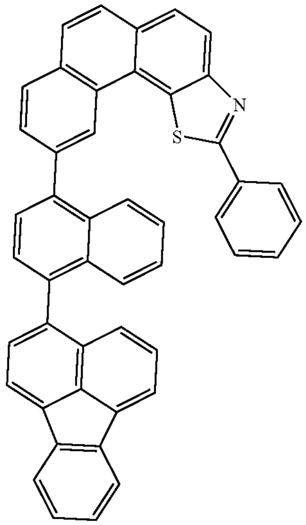
H-60
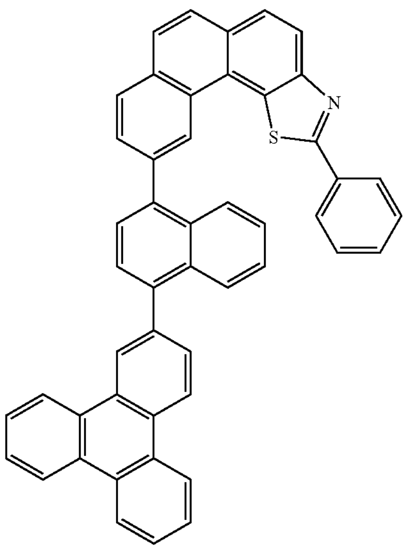
H-61
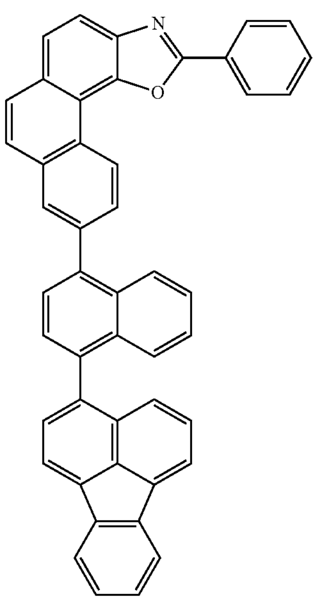
-continued
H-62
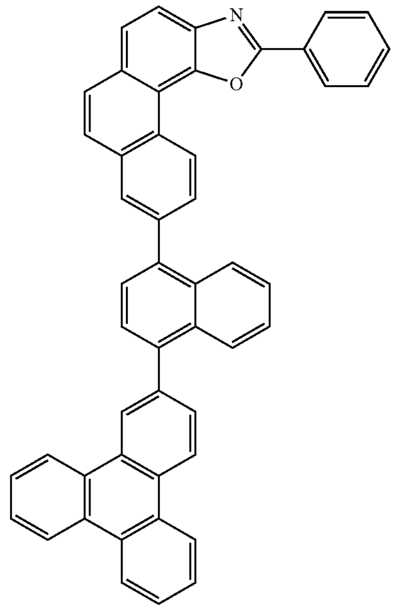
H-63
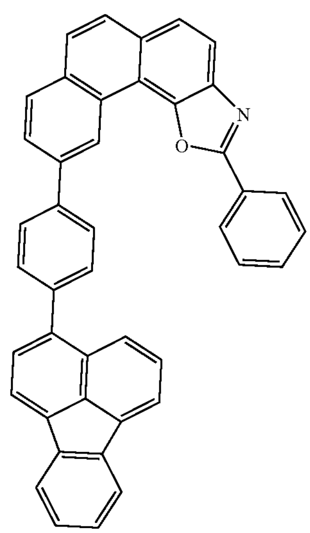

-continued
H-64
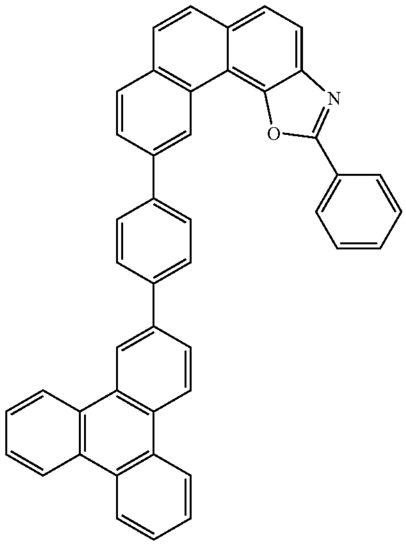
H-65
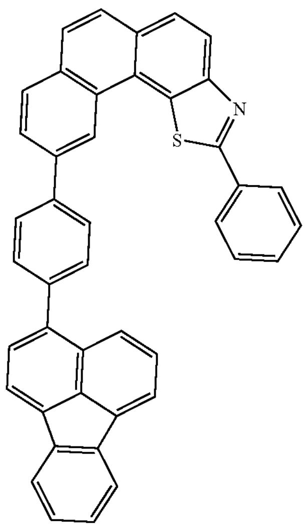
H-66
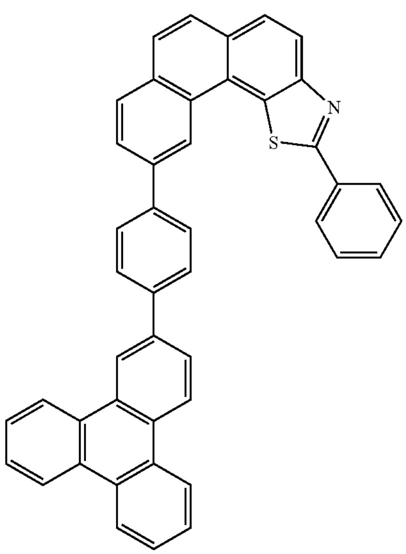
-continued
H-67
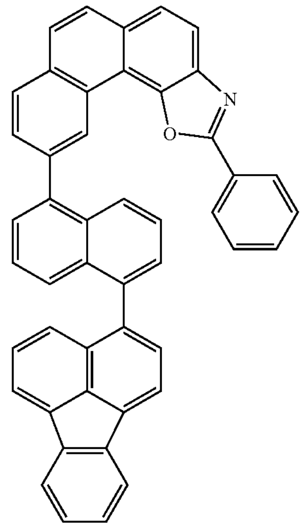
H-68
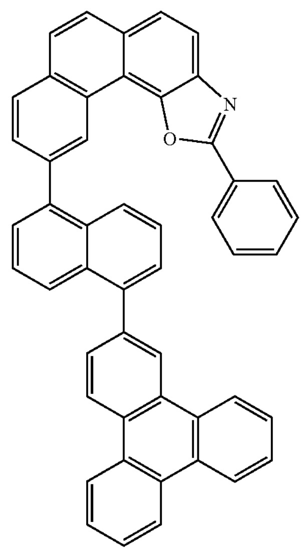
H-69
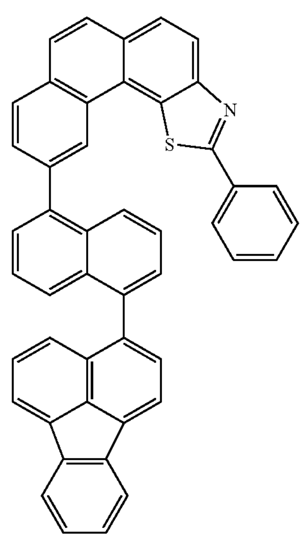

H-70
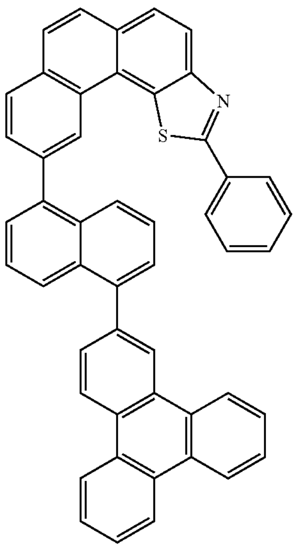
H-71
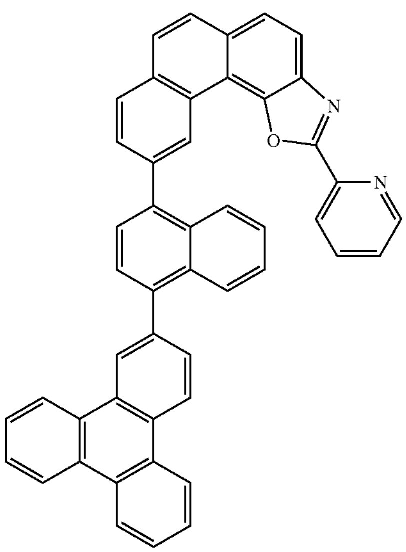
H-72
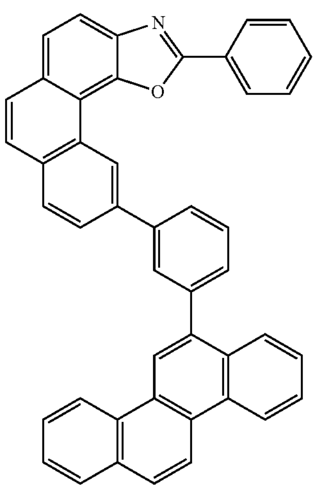
H-73
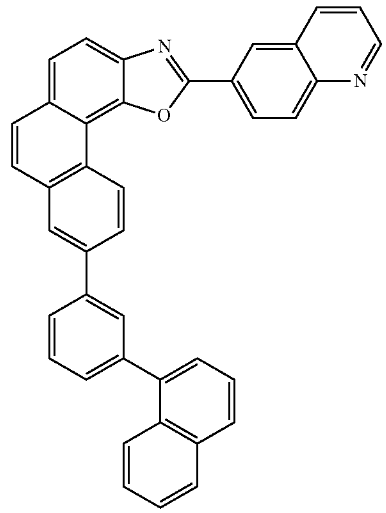
H-74
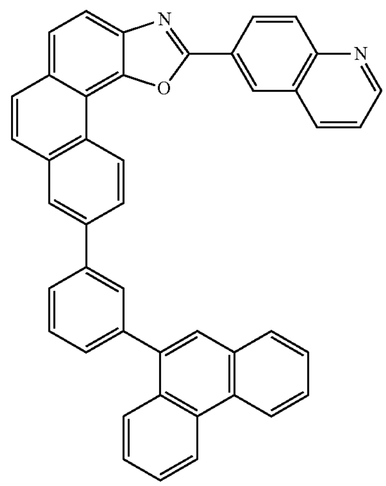
H-75
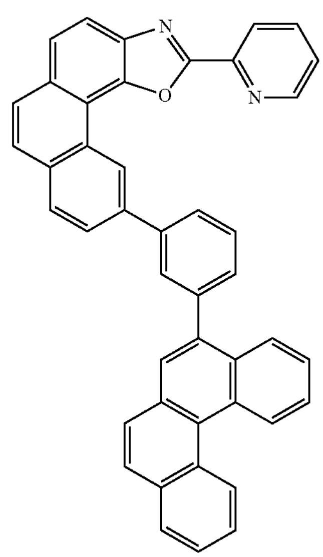

H-76
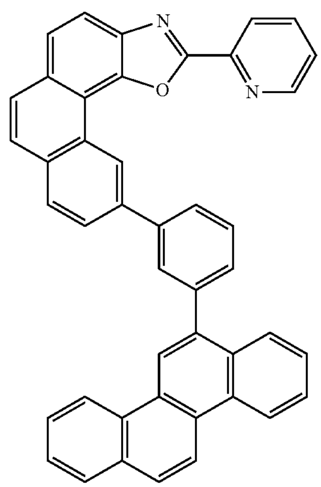
H-77
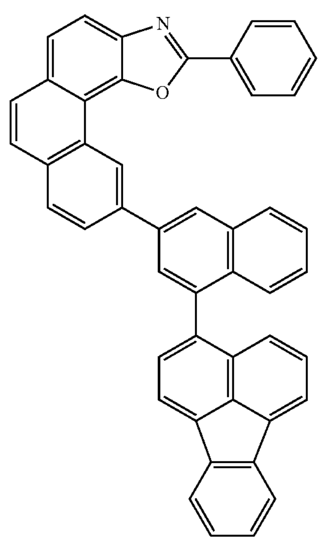
H-78
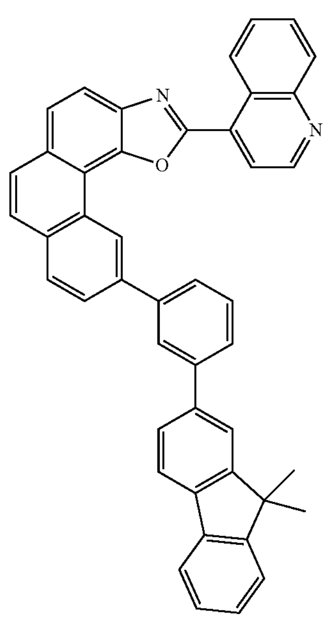
H-79
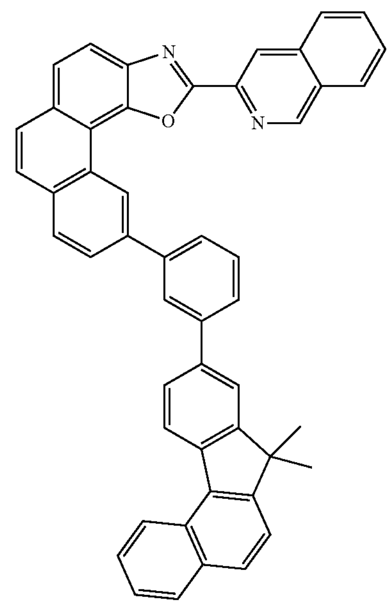
H-80
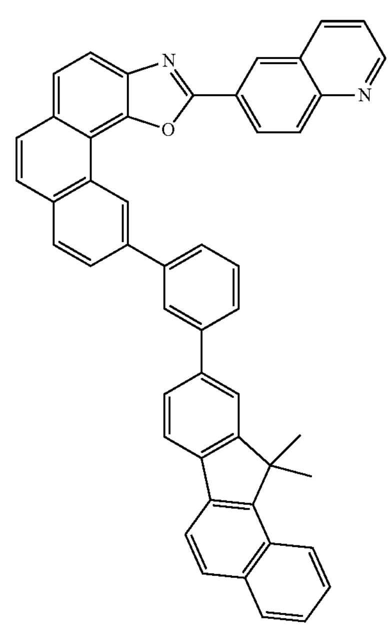

H-81
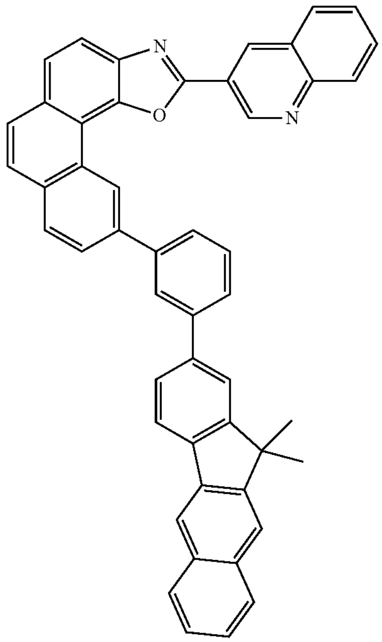
H-83
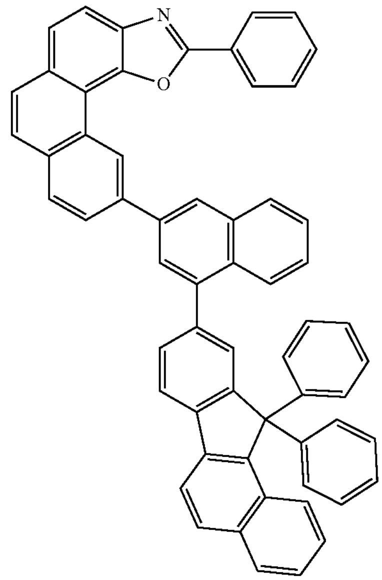
H-82
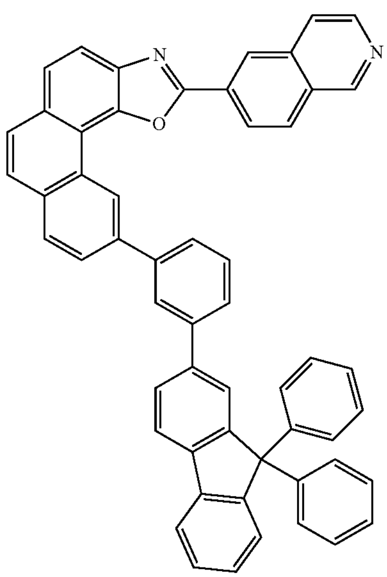
H-84
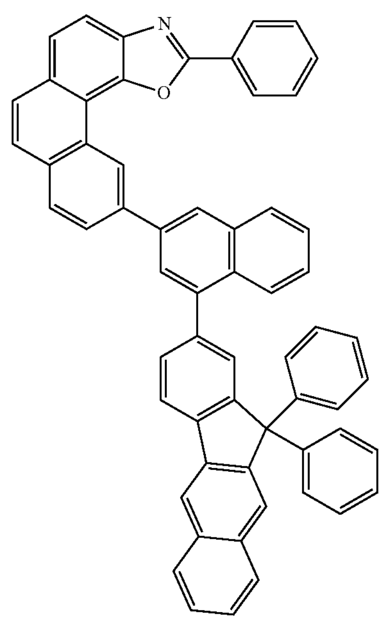

H-85
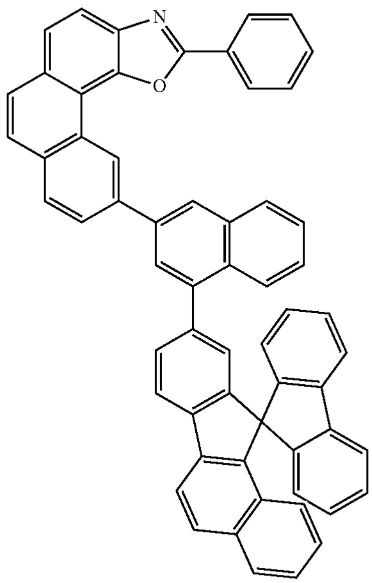
H-86
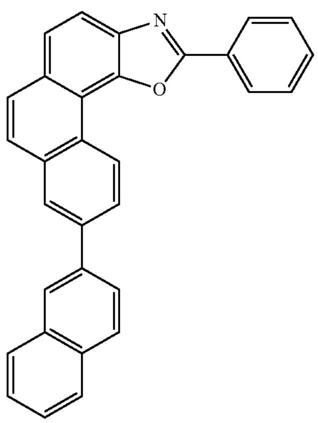
H-87
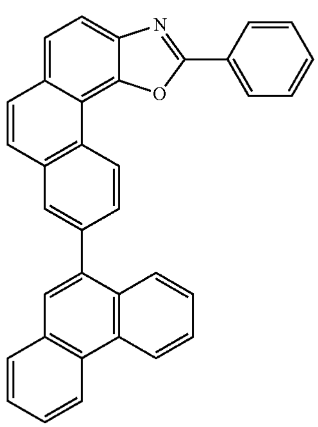
H-88
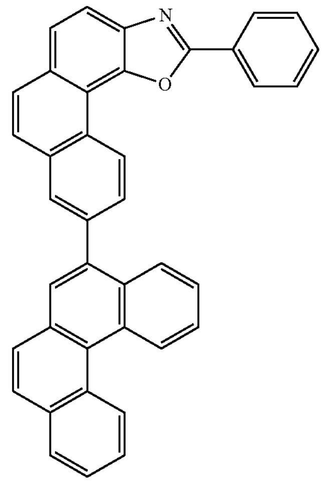
H-89
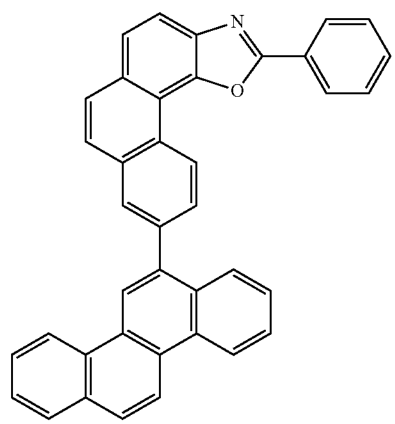
H-90
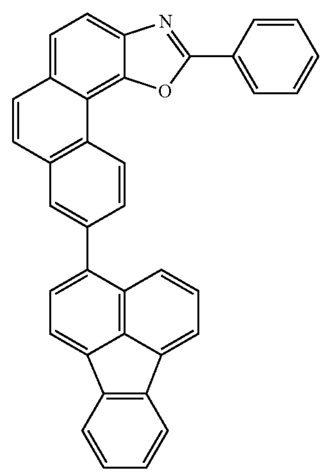

-continued
H-91
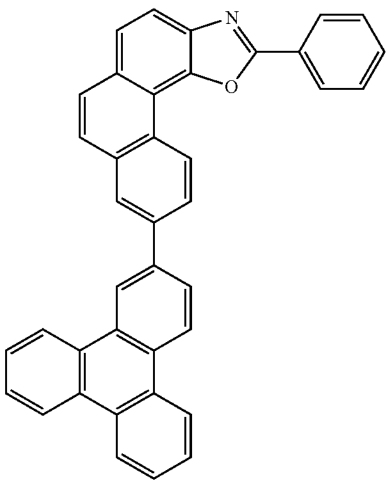
H-92
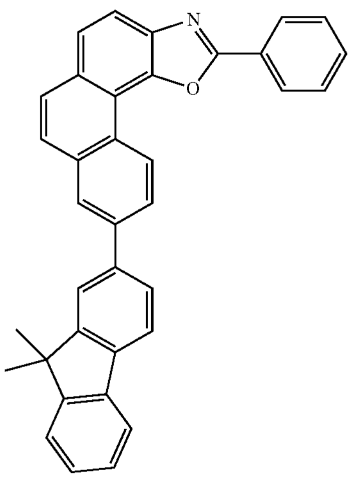
H-93
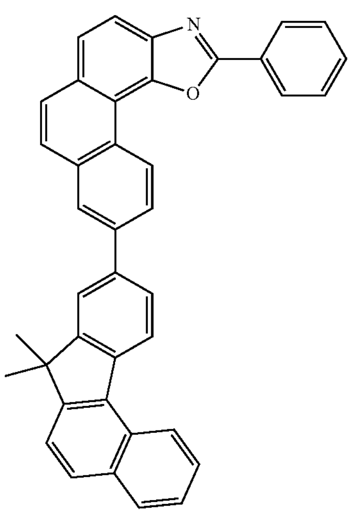
-continued
H-94
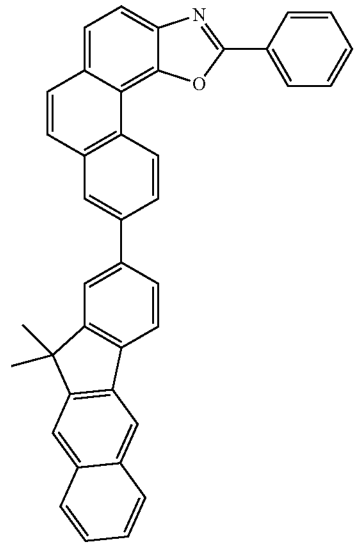
H-95
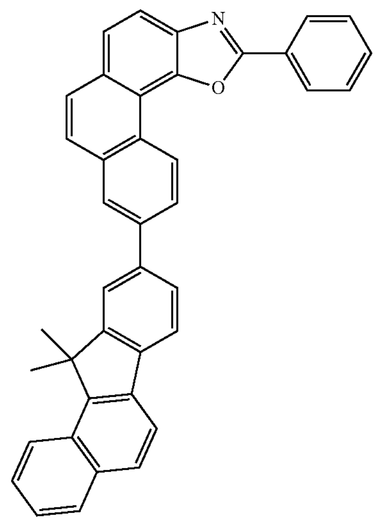
H-96
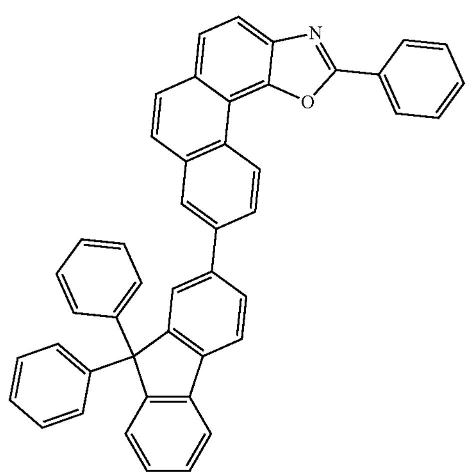

H097
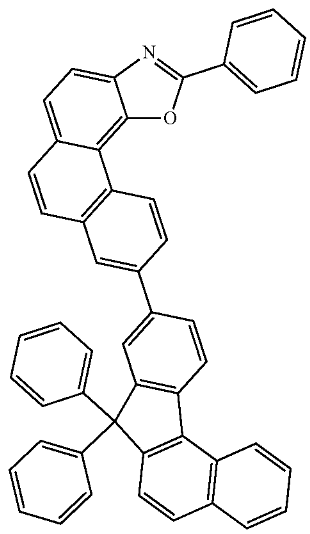
H-98
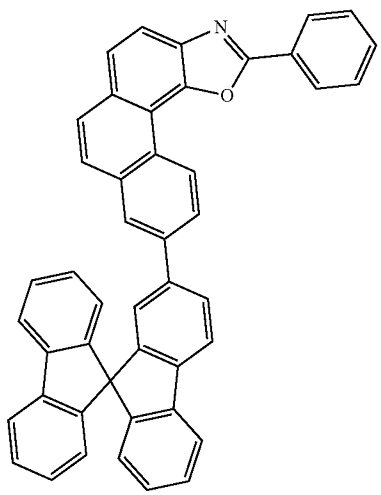
H-99
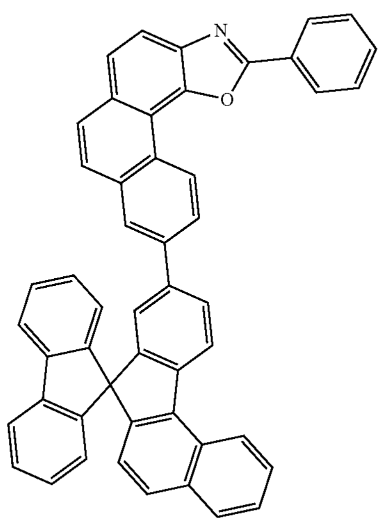
H-100
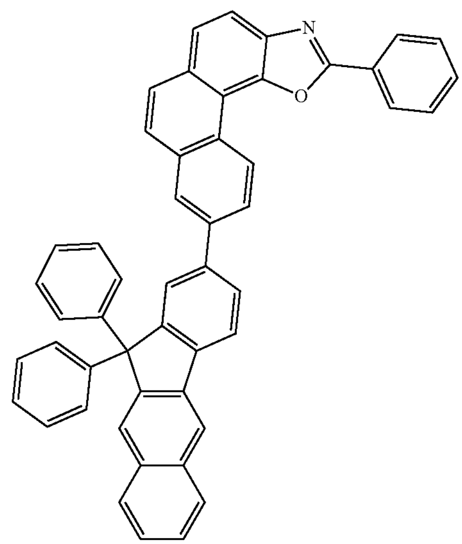
H-101
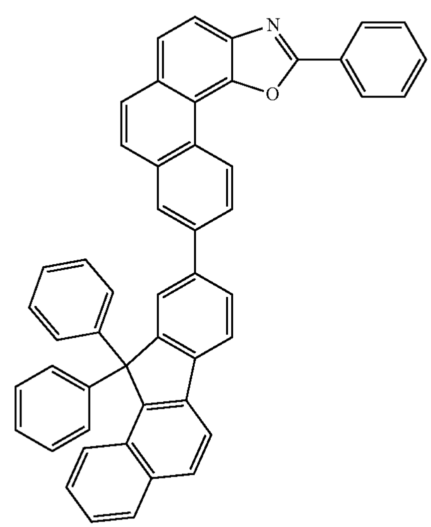
H-102
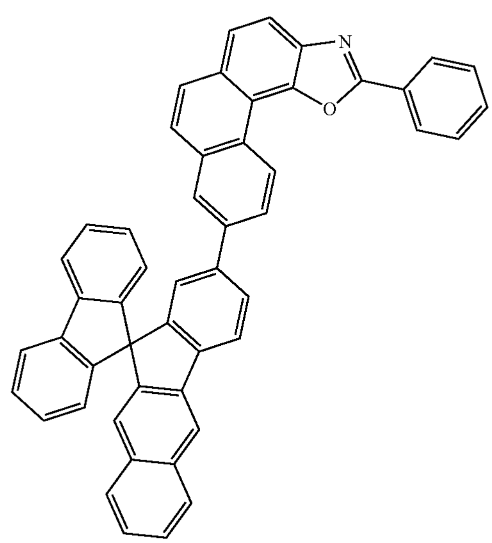

-continued
H1-3
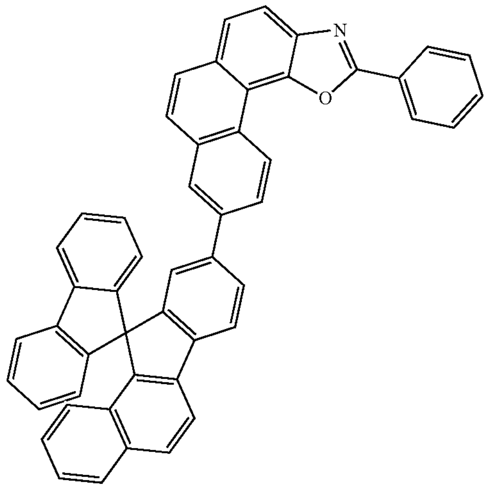
H-104
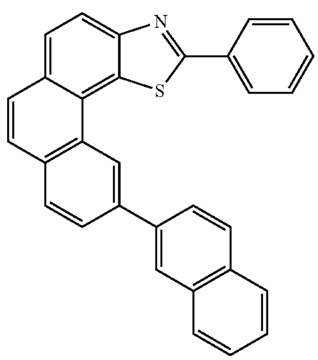
H-105
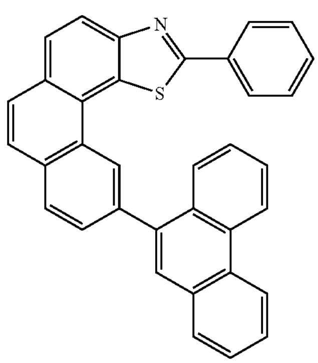
H-106
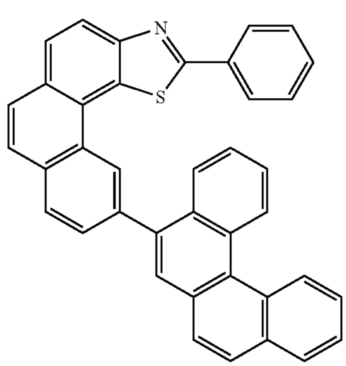
-continued
H-107
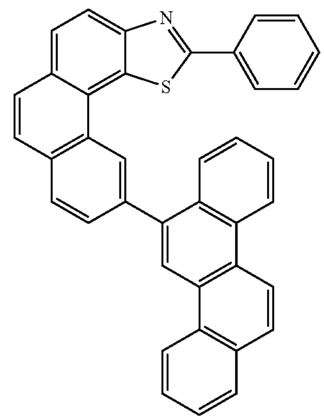
H-108
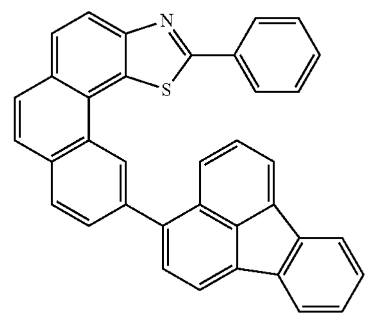
H-109
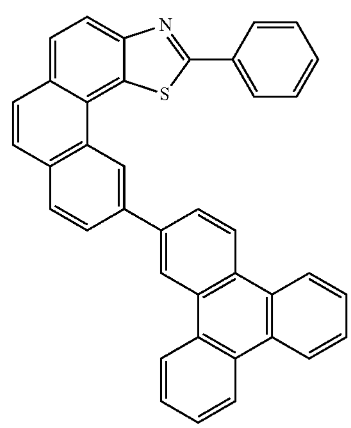
H-110
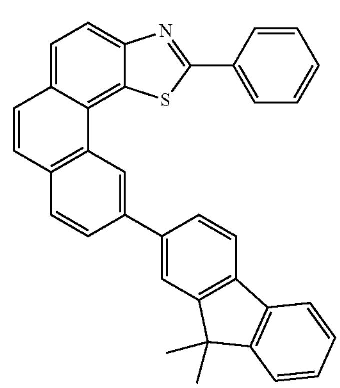

H-111
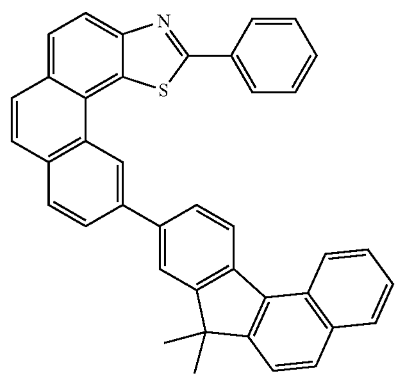
H-112
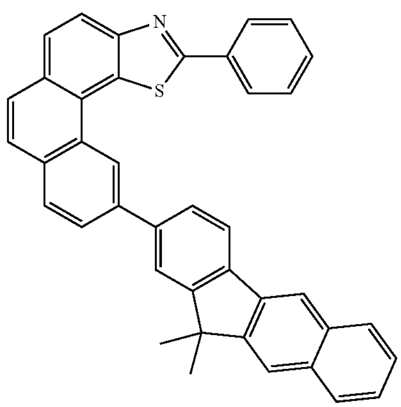
H-113
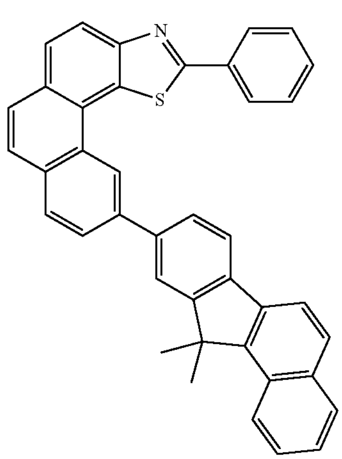
H-114
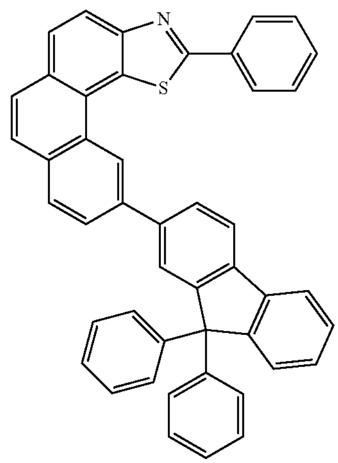
H-115
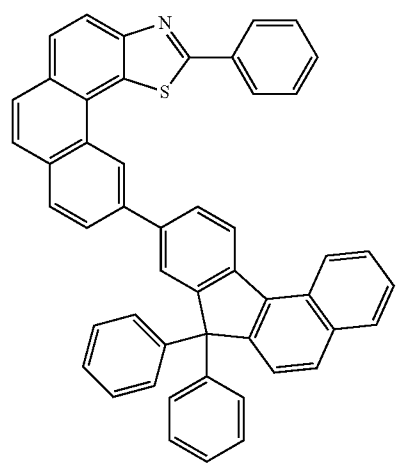
H-116
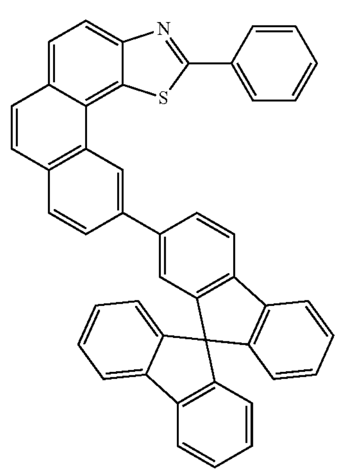

-continued
H-117
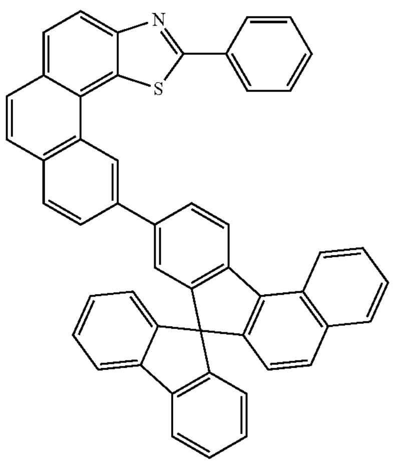
H-118
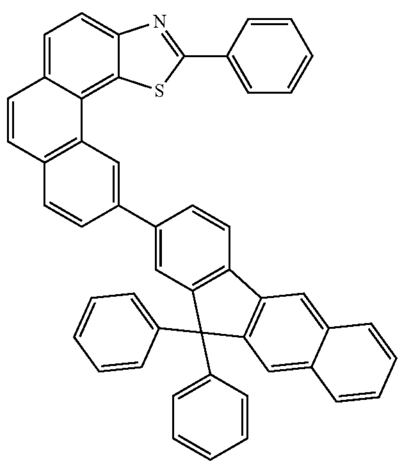
H-119
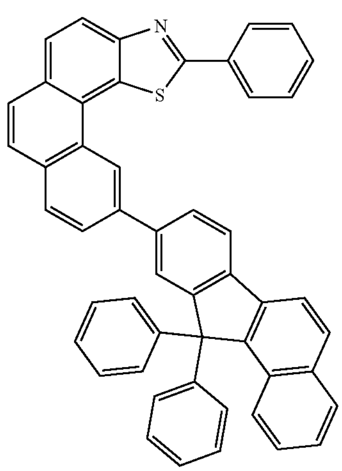
-continued
H-120
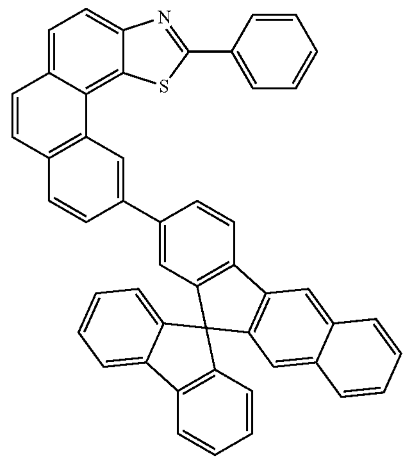
H-121
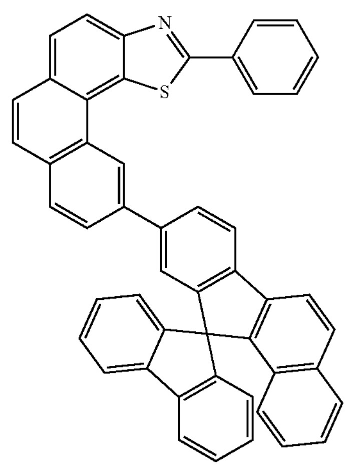
H-122
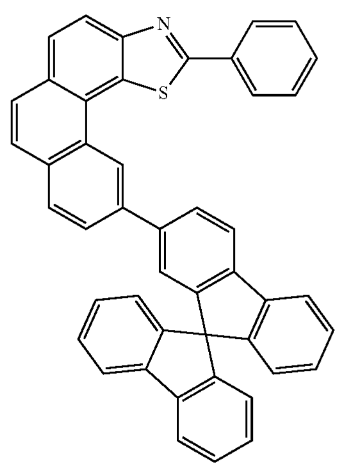

-continued
H-123
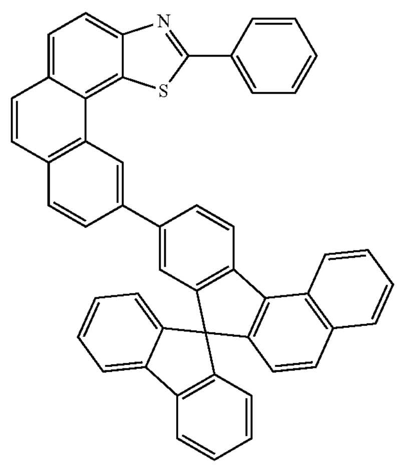
H-124
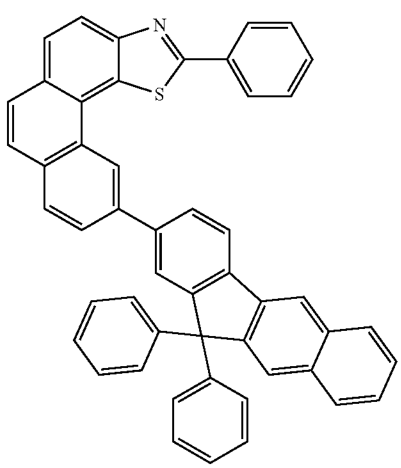
H-125
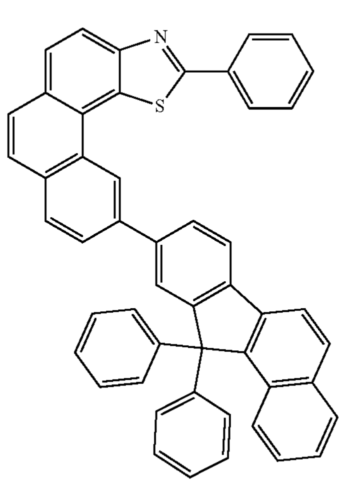
-continued
H-126
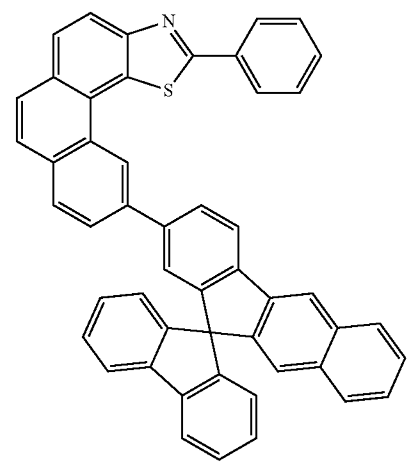
H-127
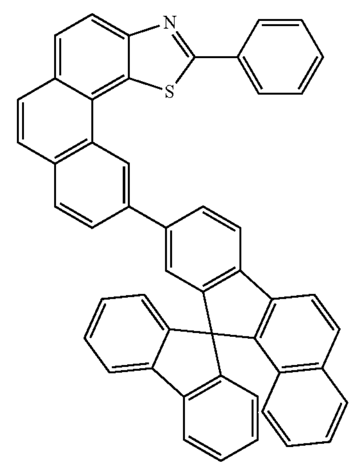
H-128
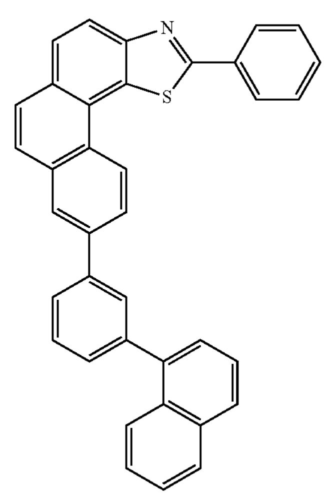

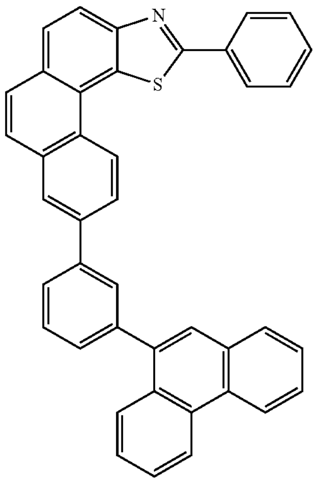
H-129
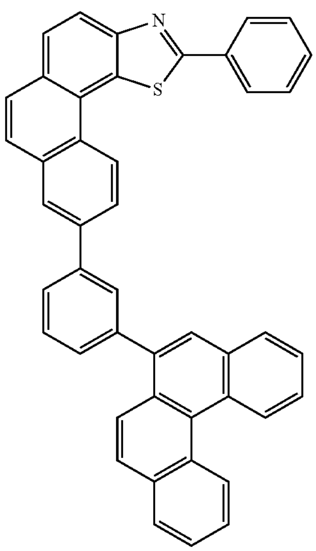
H-130
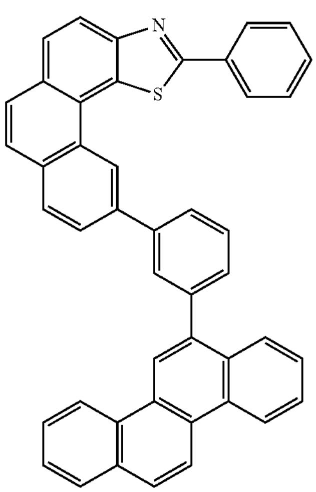
H-131
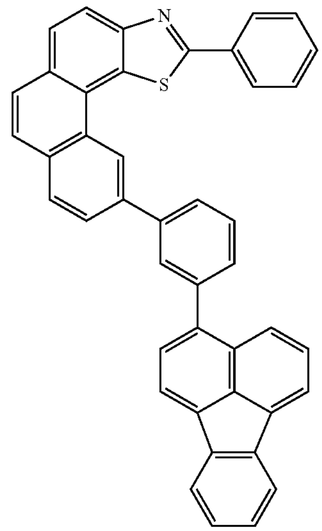
H-132
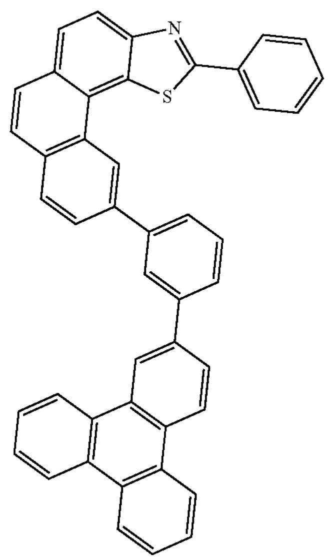
H-133
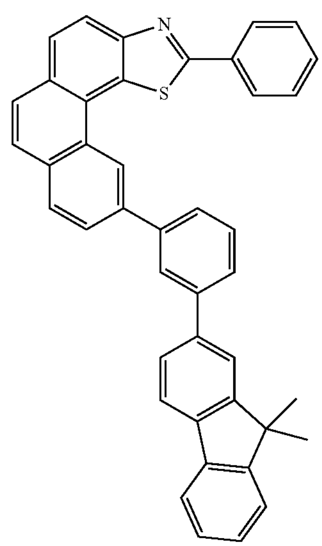
H-134

H-135
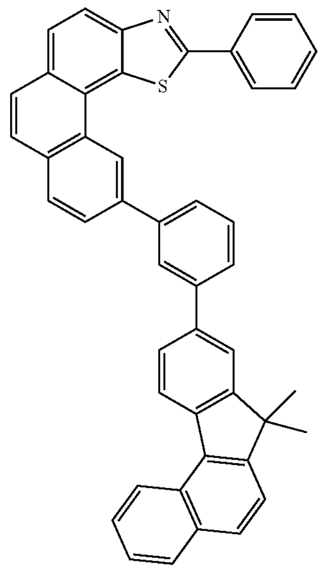
H-137
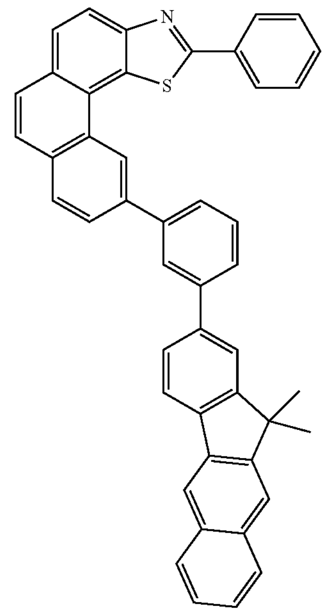
H-136
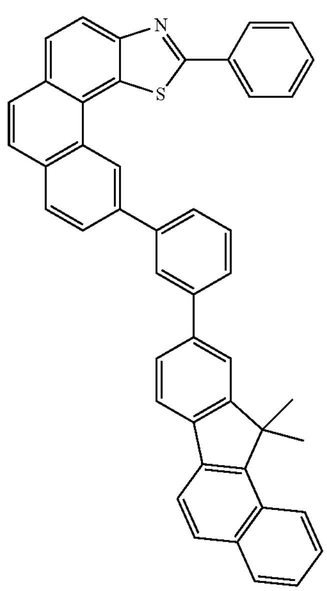
H-138
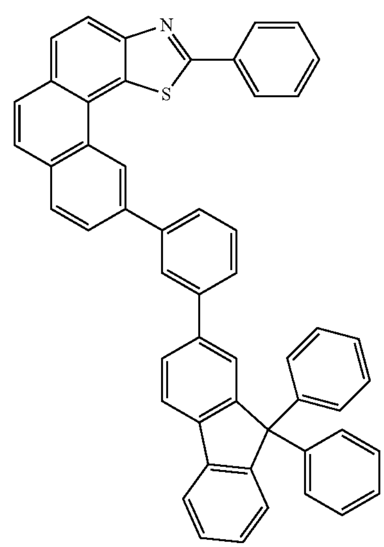

H-139
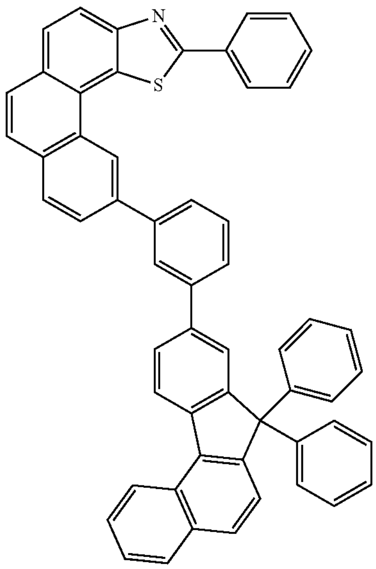
H-140
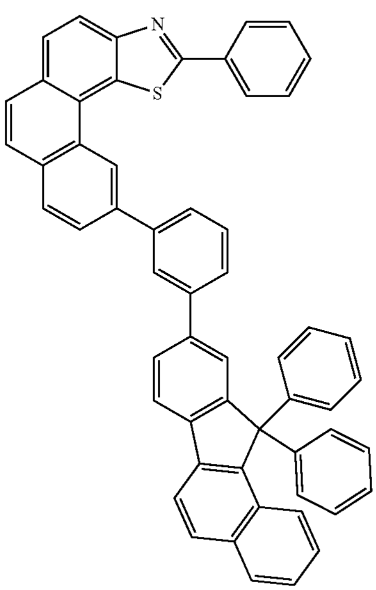
H-141
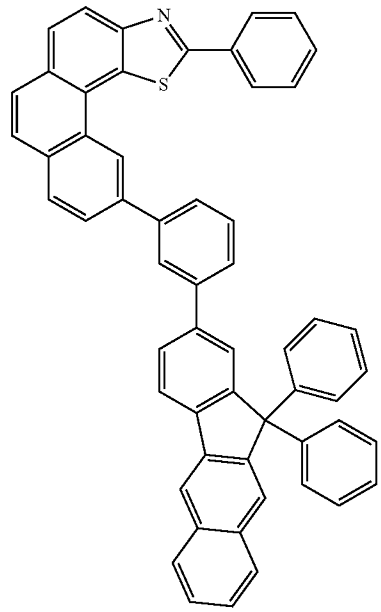
H-142
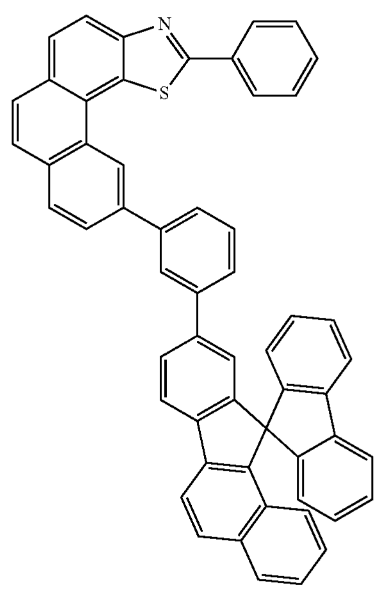

H-143
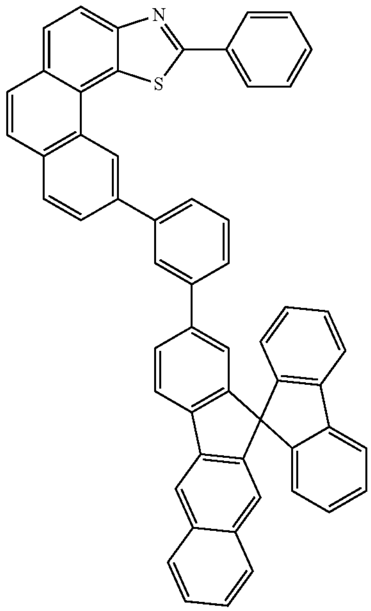
H-144
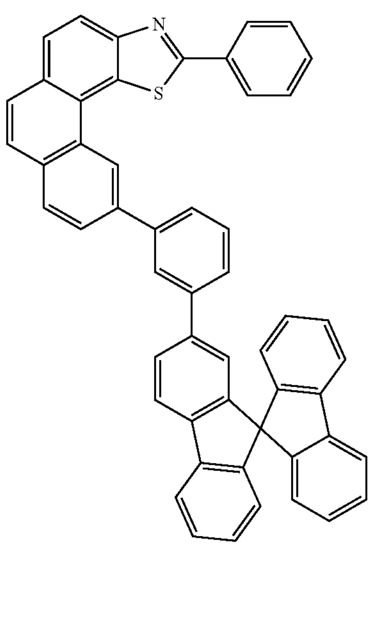
H-145
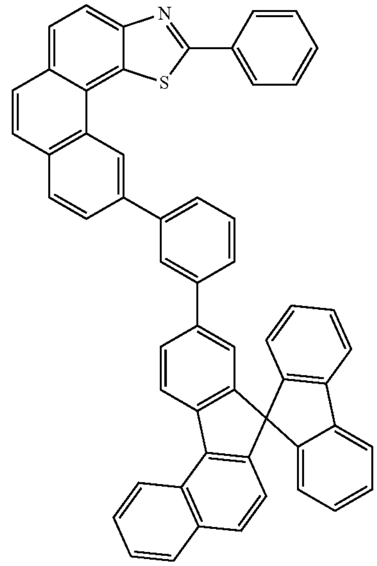
H-146
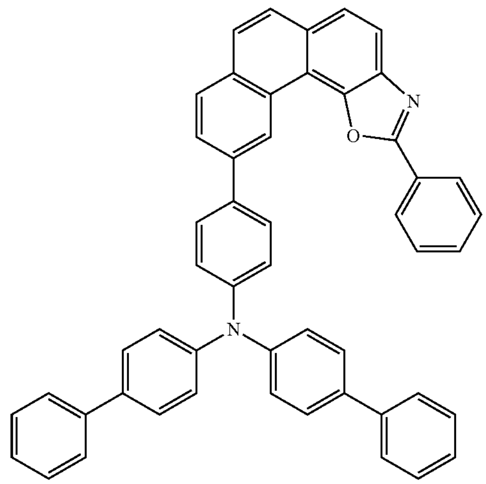
H-147
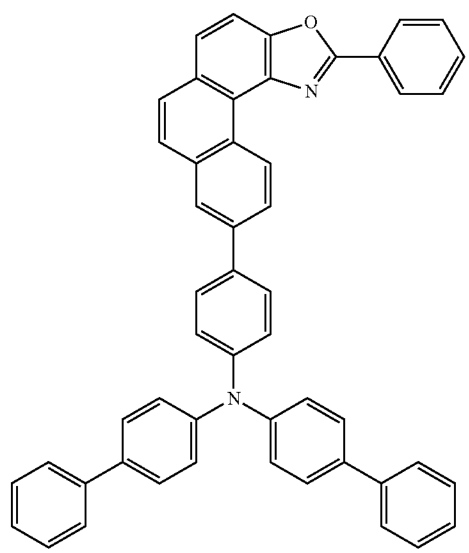

H-148
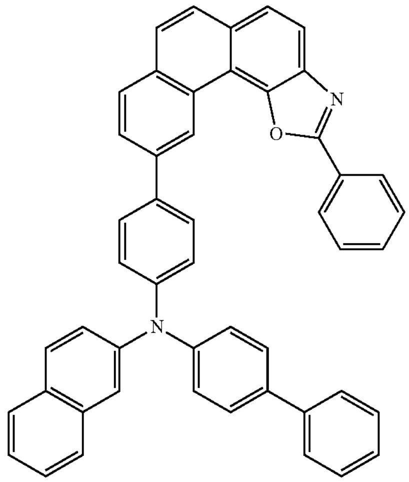
H-149
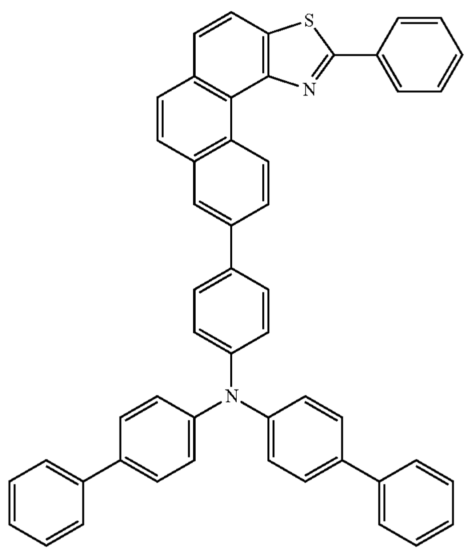
H-150
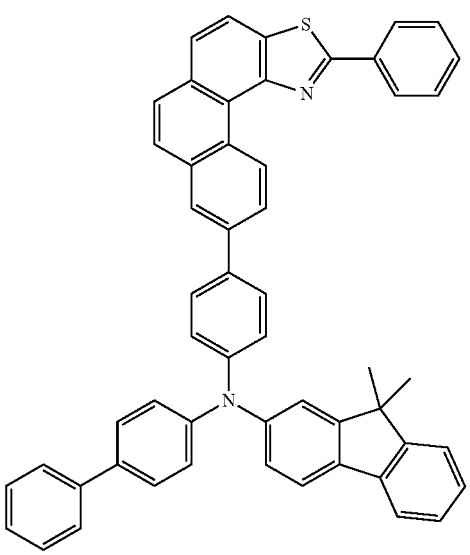
H-151
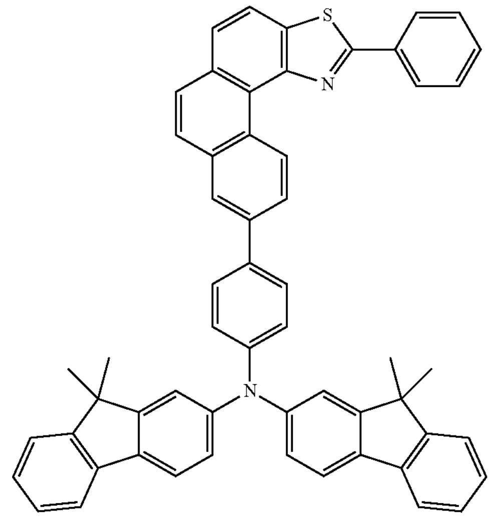
H-152
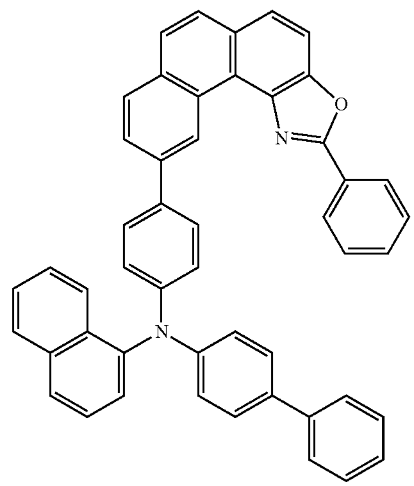
H-153
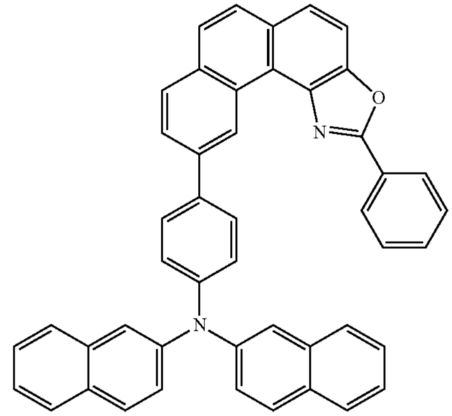

H-154
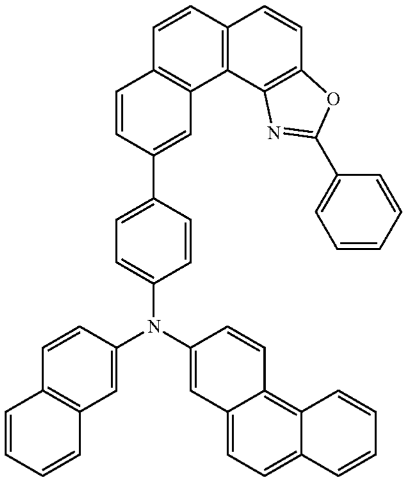
H-155
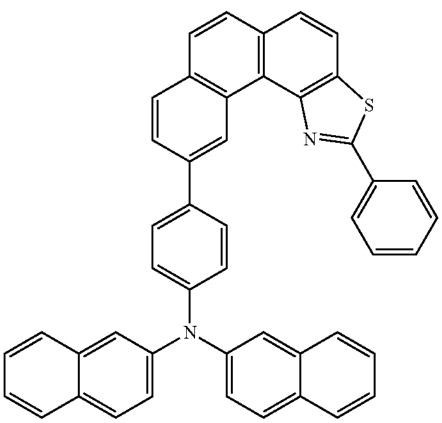
H-156
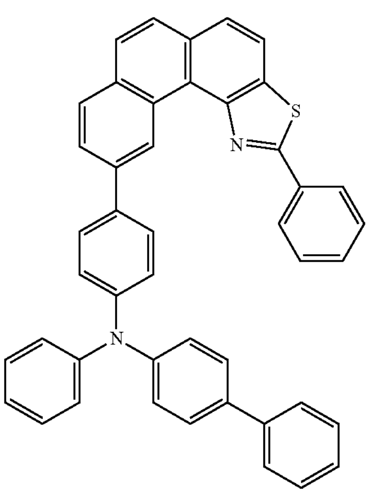
H-157
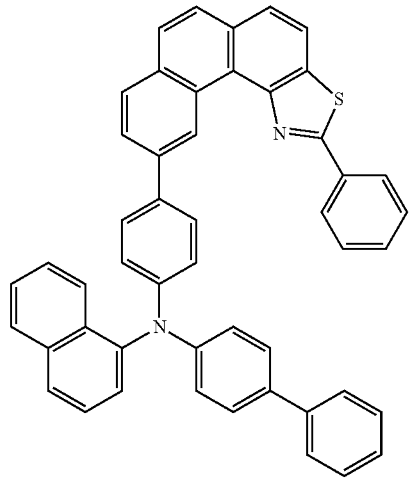
H-158
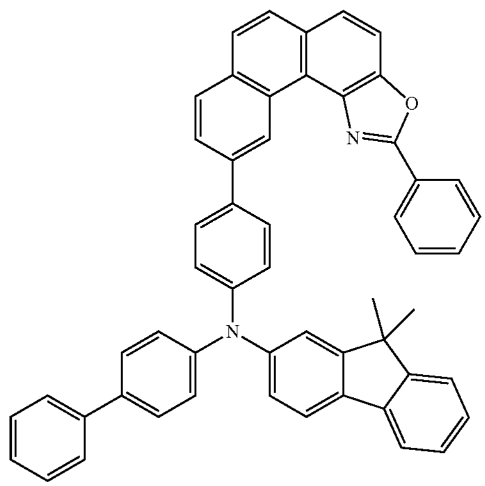
H-159
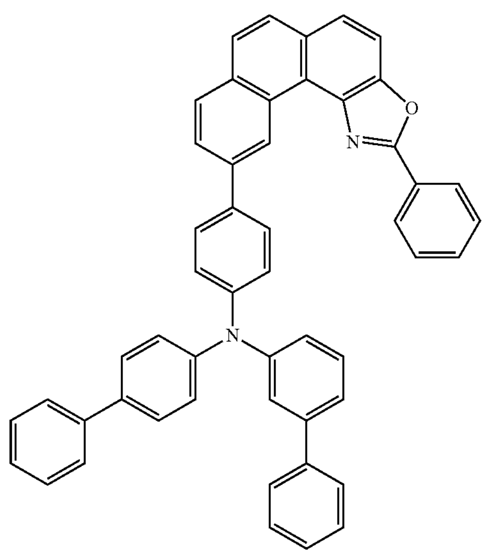

H-160
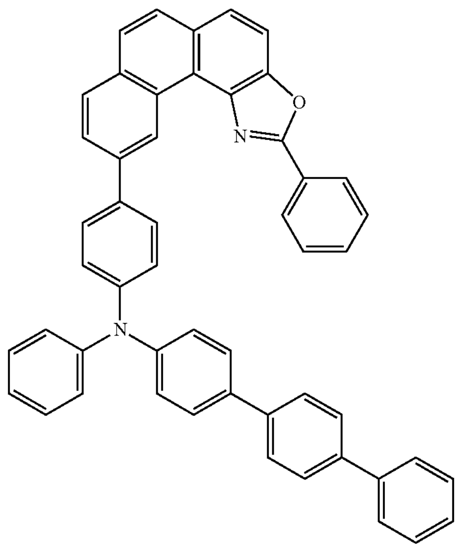
H-161
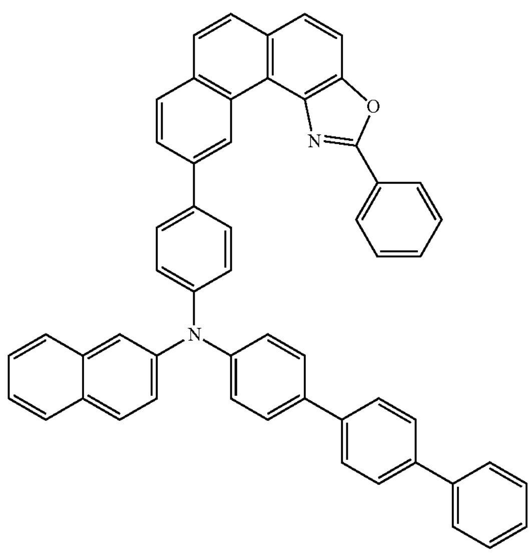
H-162
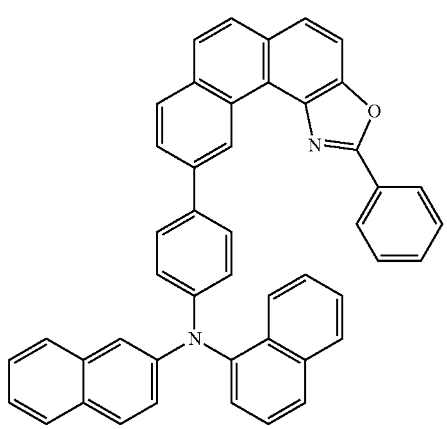
H-163
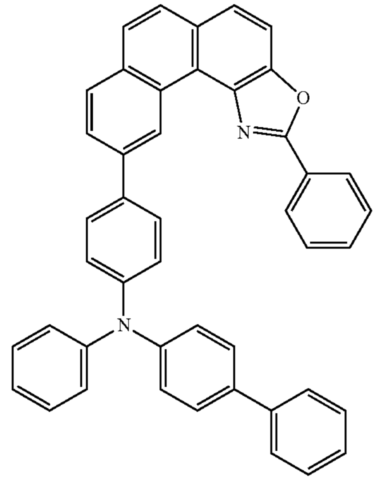
H-164
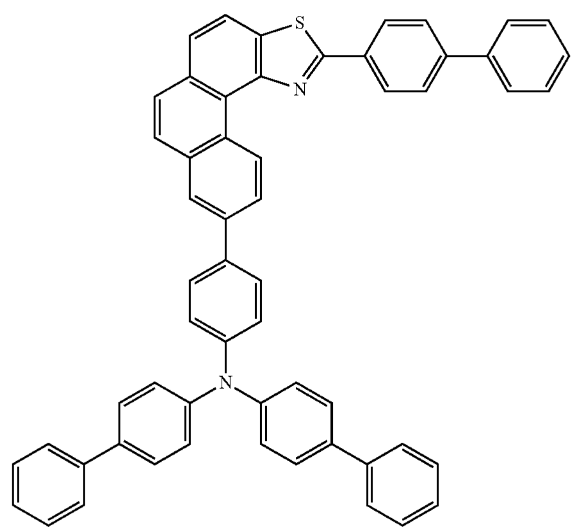
H-165
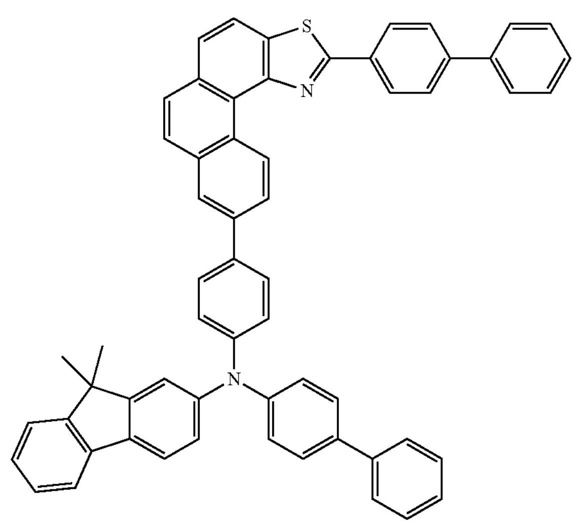

-continued
H-166
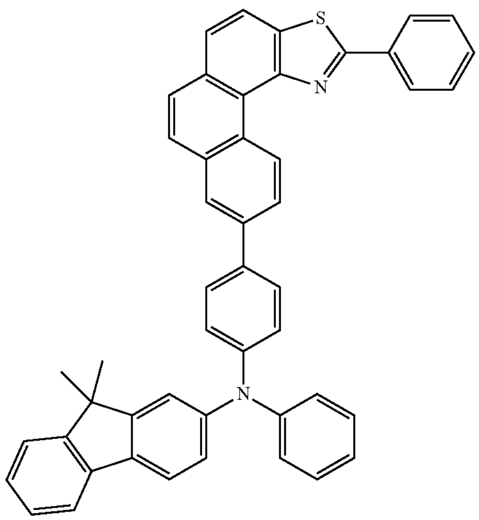
H-167
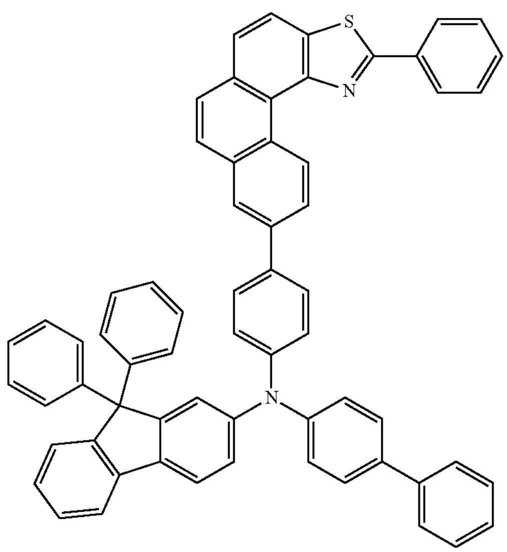
H-168
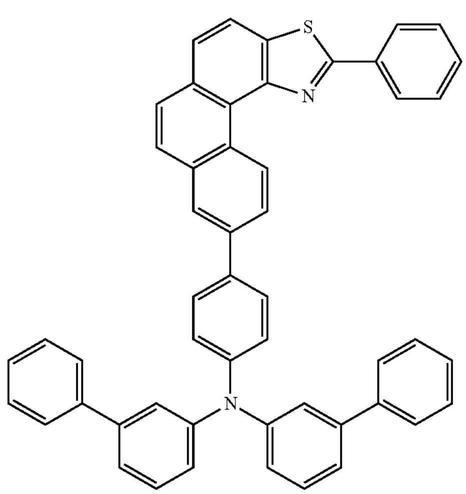
-continued
H-169
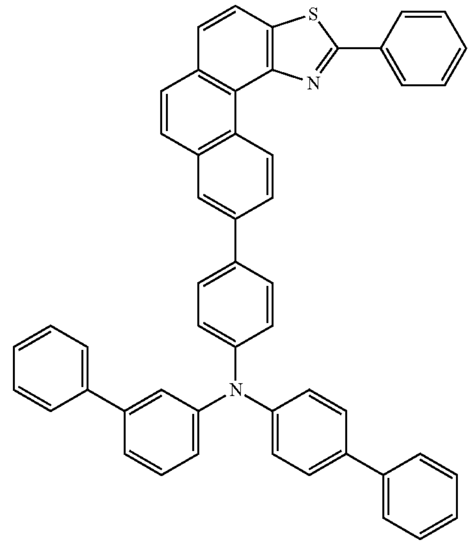
H-170
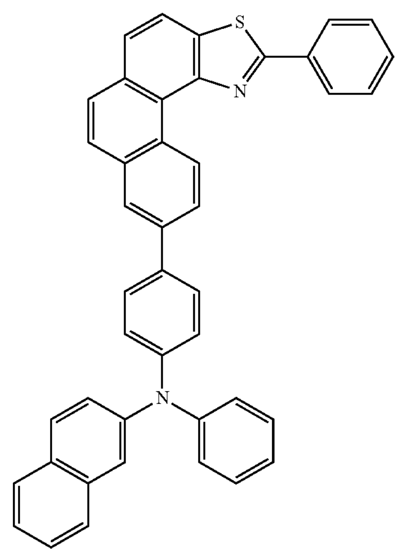
H-171
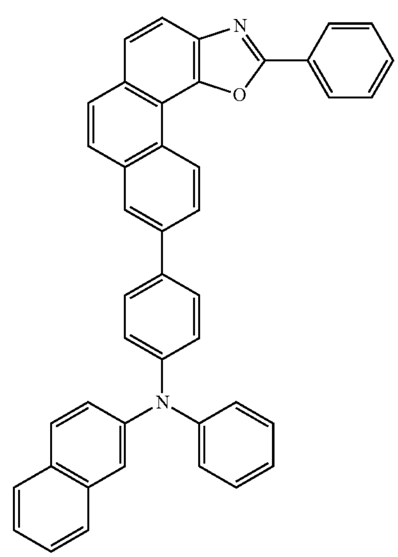

-continued
H-172
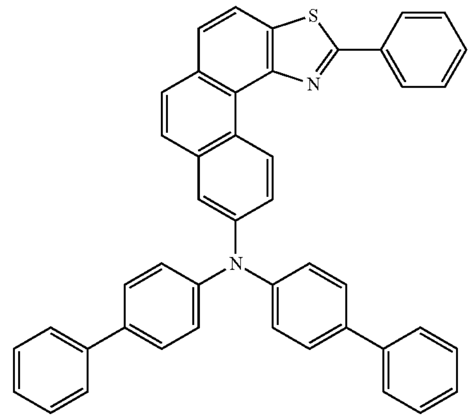
H-173
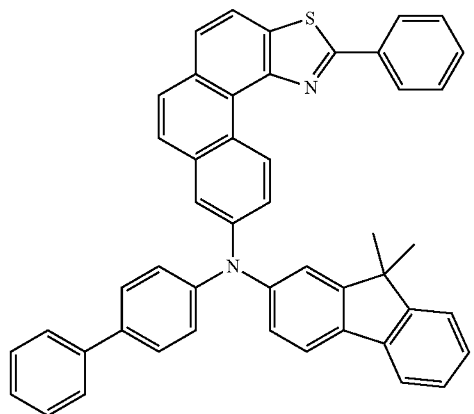
H-174
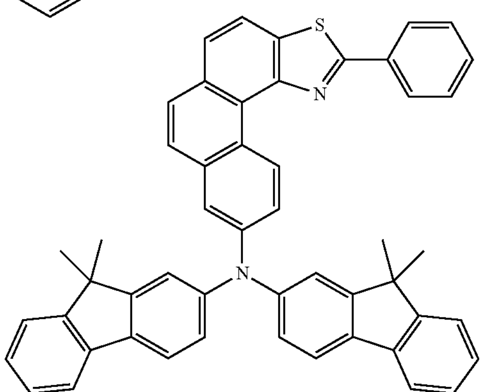
H-175
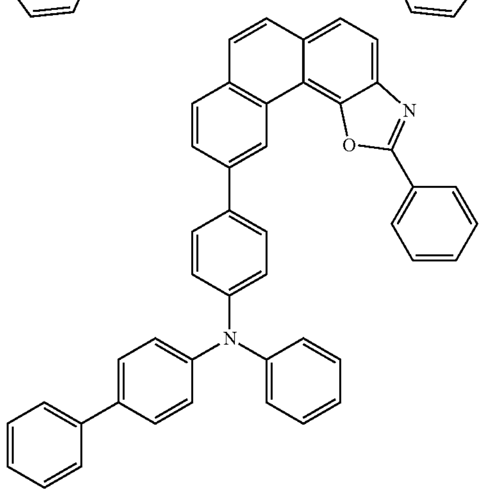
-continued
H-176
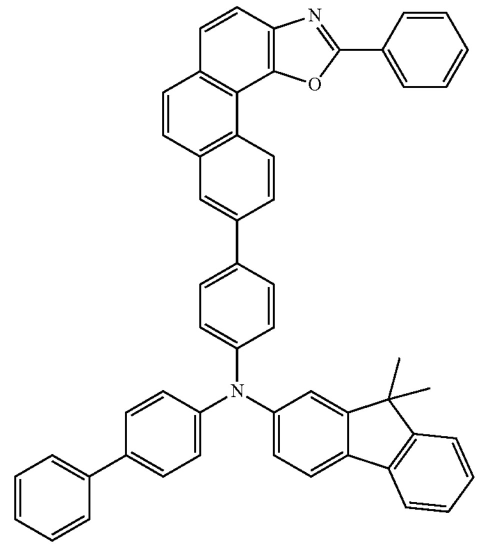
H-177
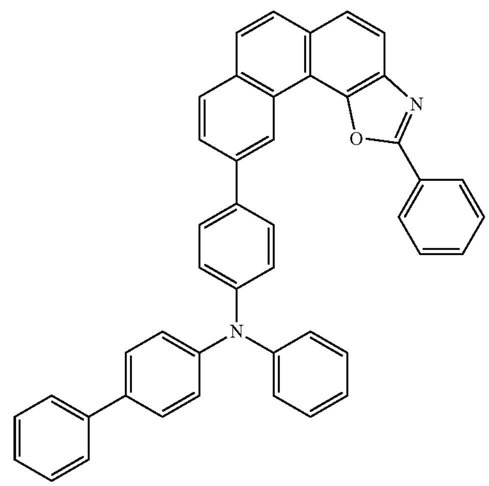
H-178
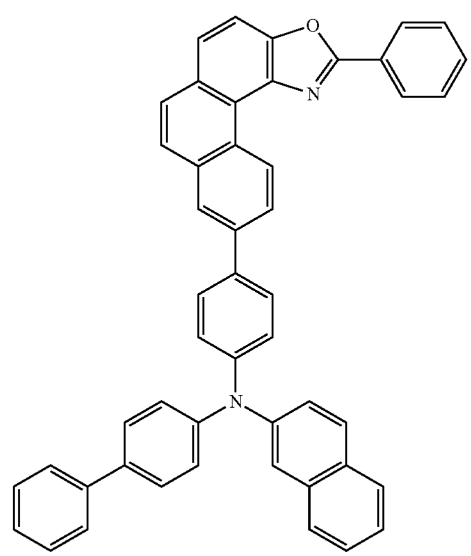

-continued
H-179
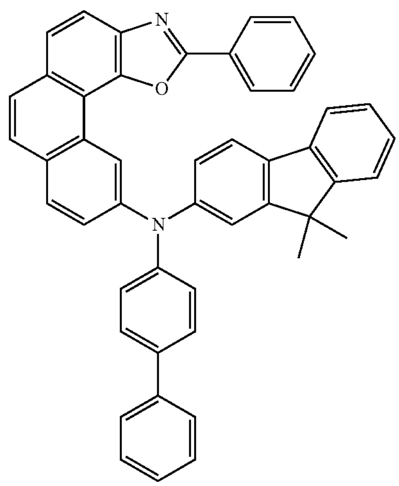
H-180
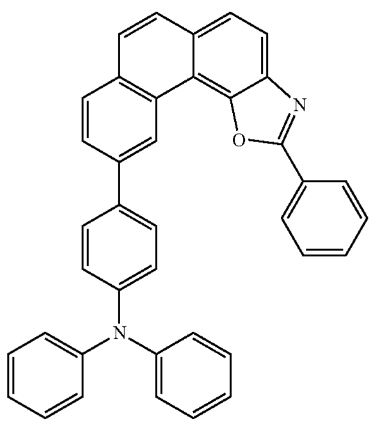
H-181
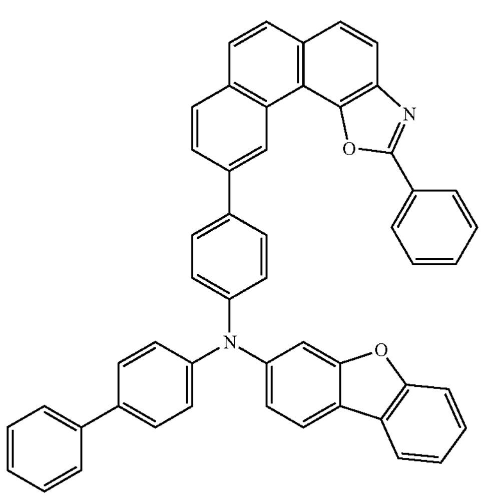
-continued
H-182
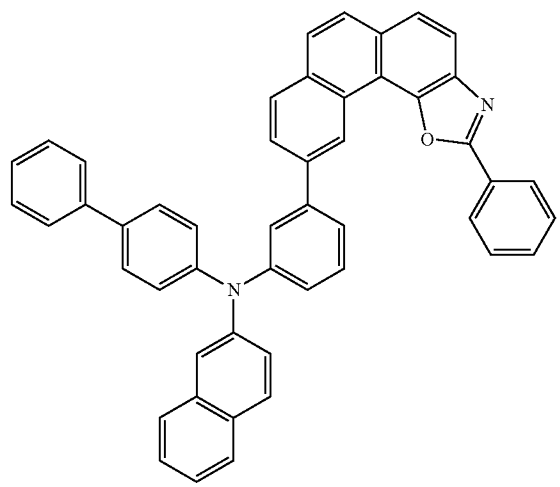
H-183
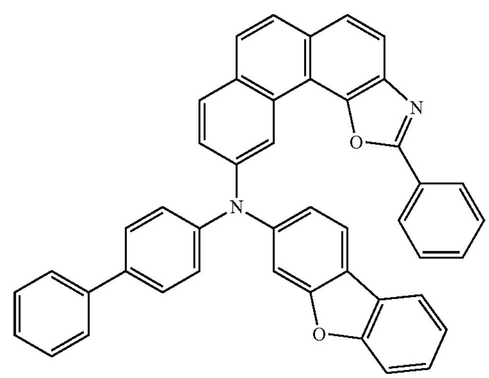
H-184
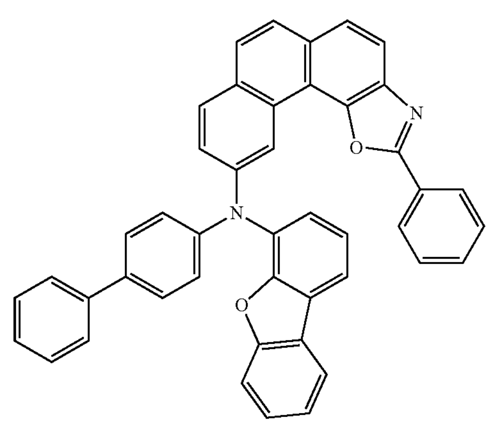

H-185
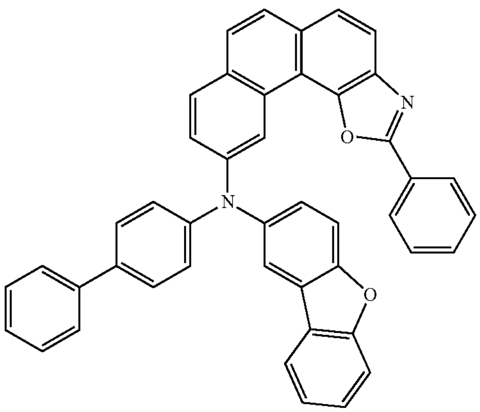
H-186
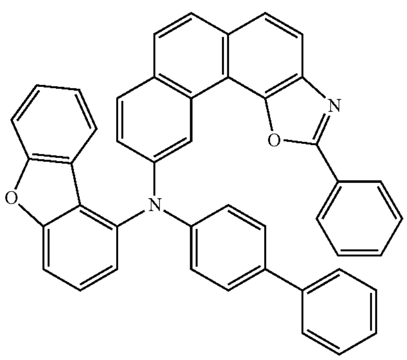
H-187
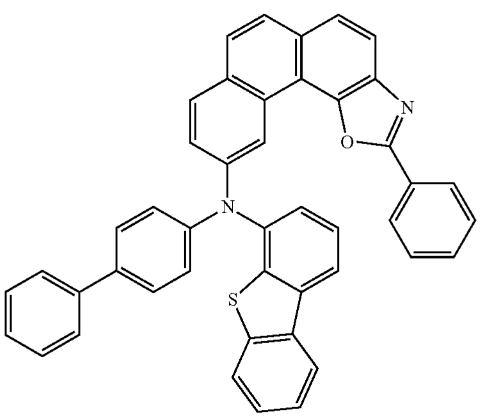
H-188
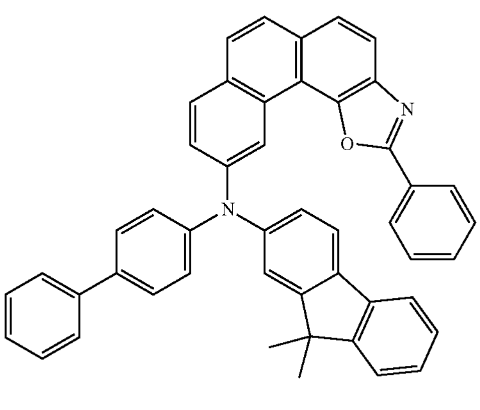
H-189
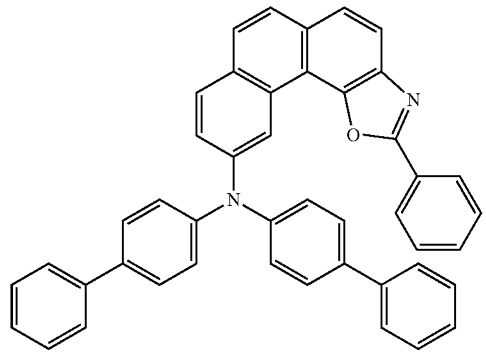
H-190
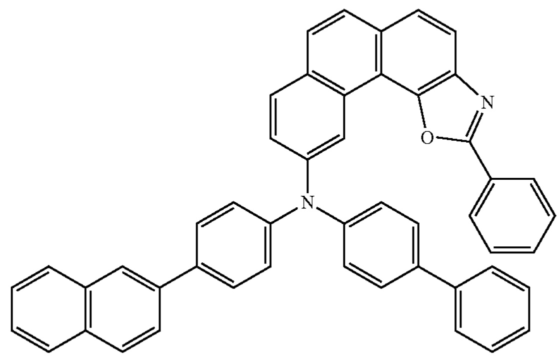
H-191
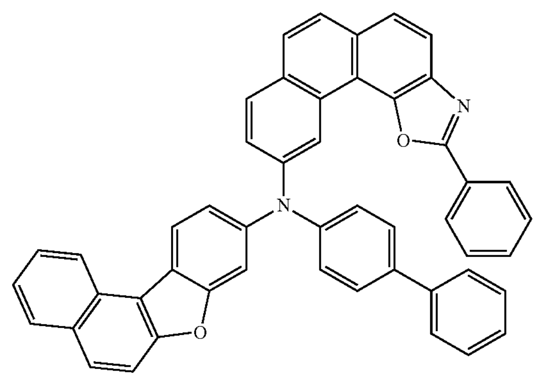
H-192
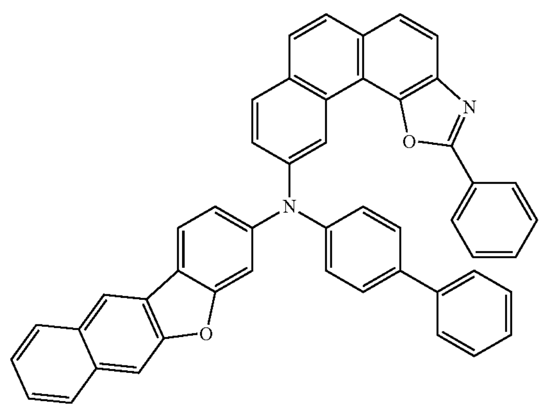

-continued
H-193
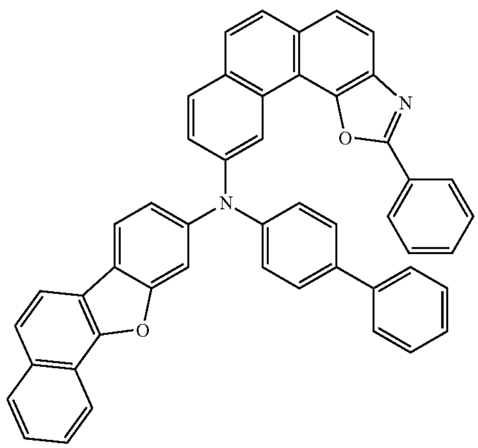
H-194
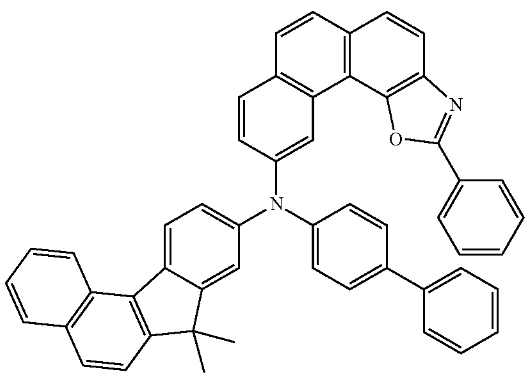
H-195
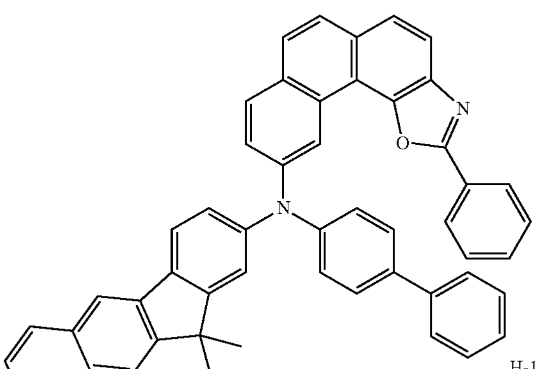
H-196
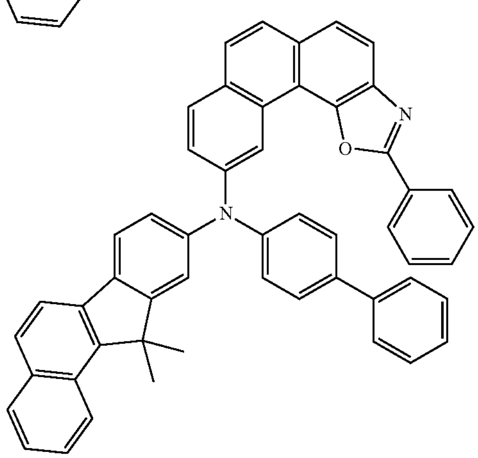
-continued
H-197
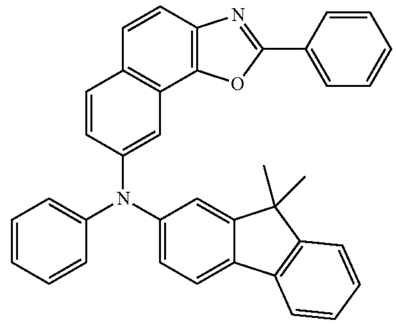
H-198
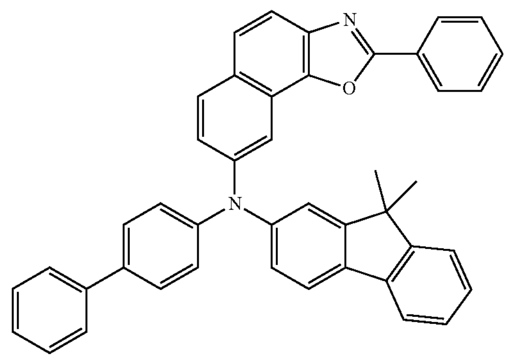
H-199
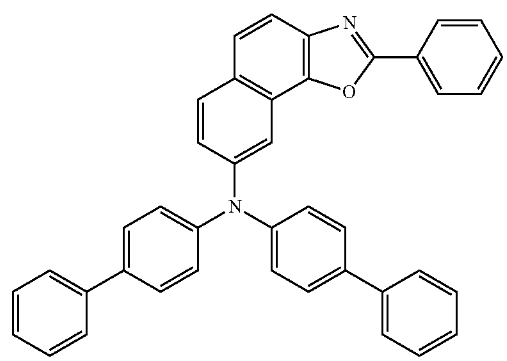
H-200
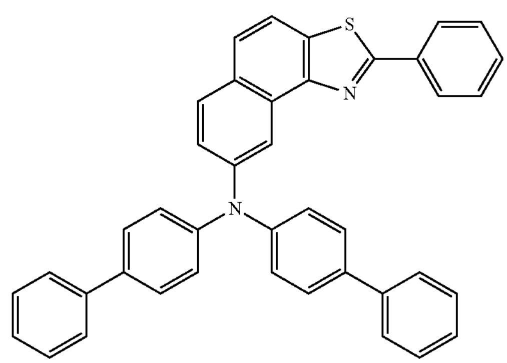

-continued
H-201
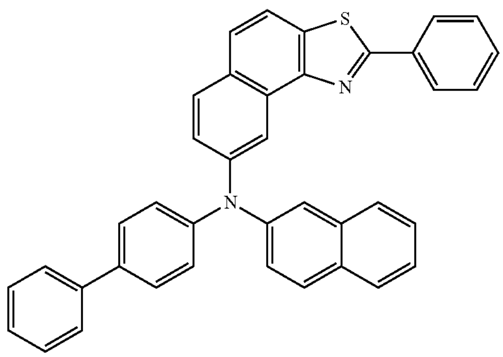
H-202
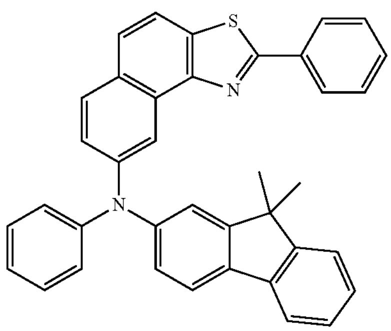
H-203
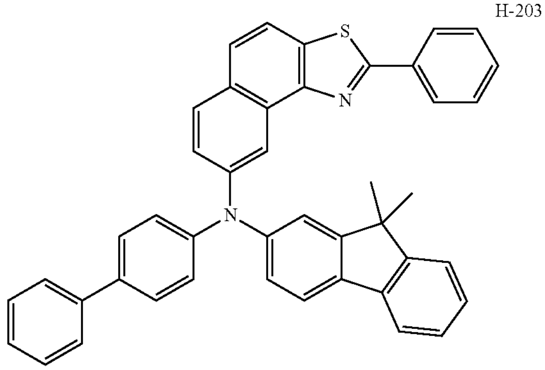
H-204
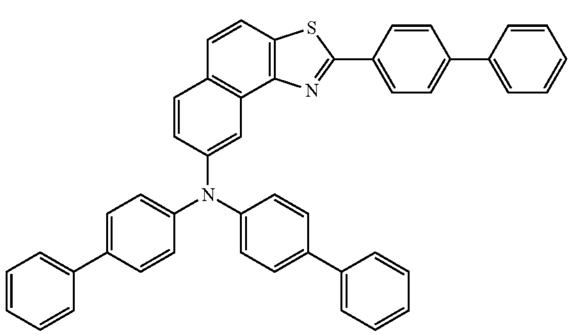
-continued
H-205
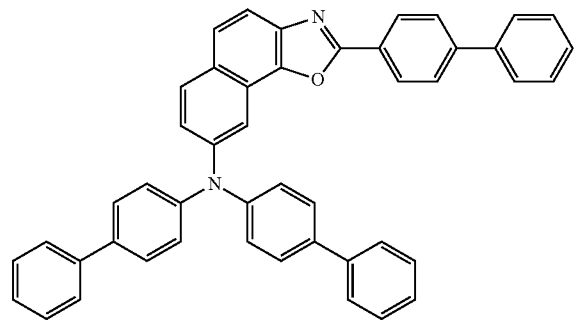
H-206
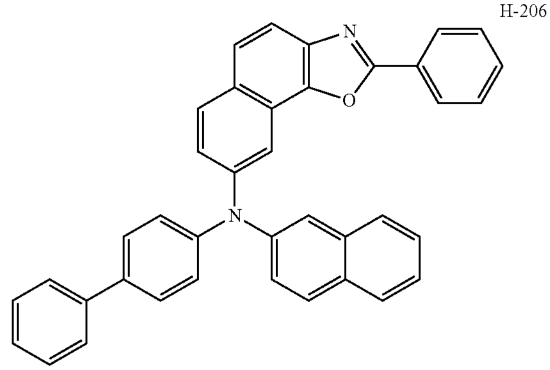
H-207
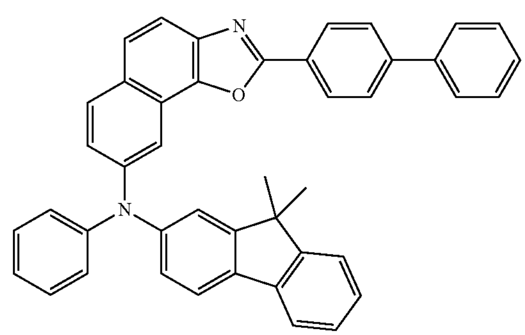
H-208
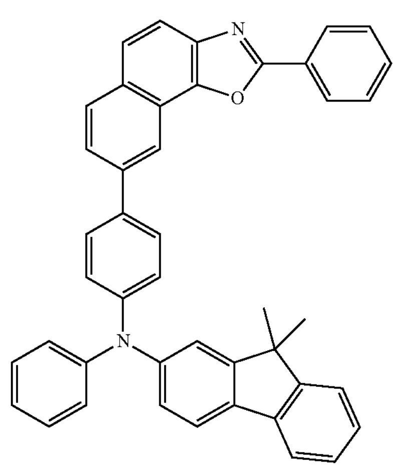

-continued
H-209
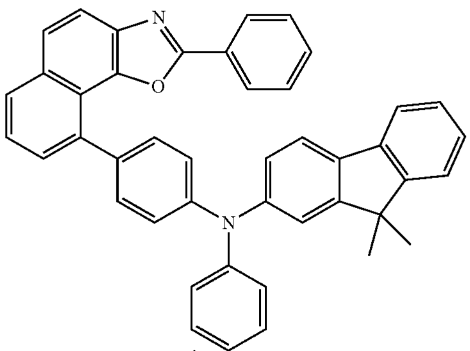
H-210
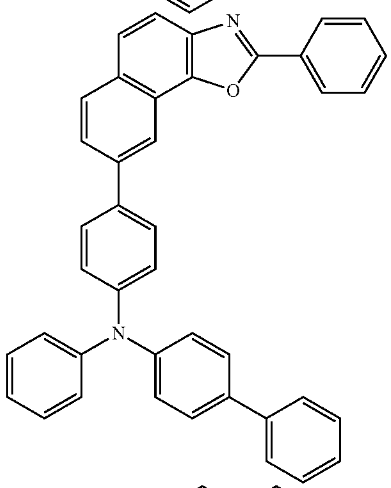
H-211
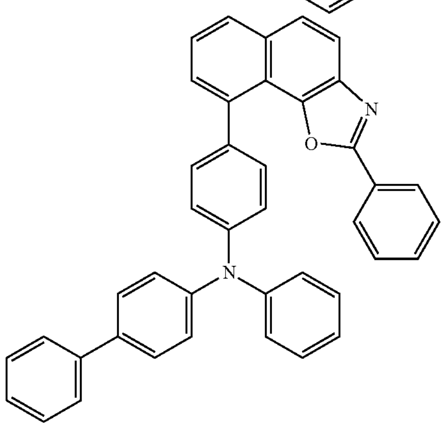
H-212
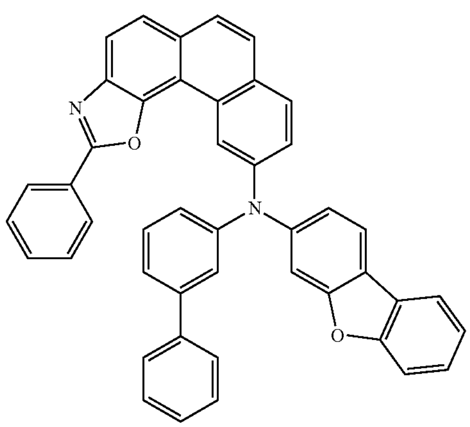
-continued
H-213
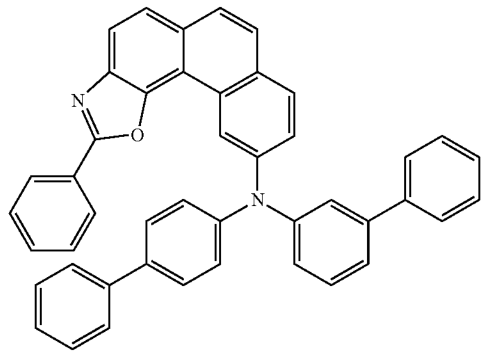
H-214
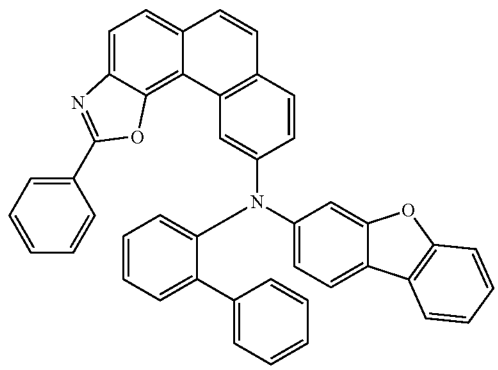
H-215
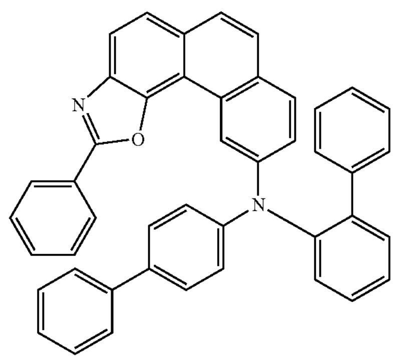
H-216
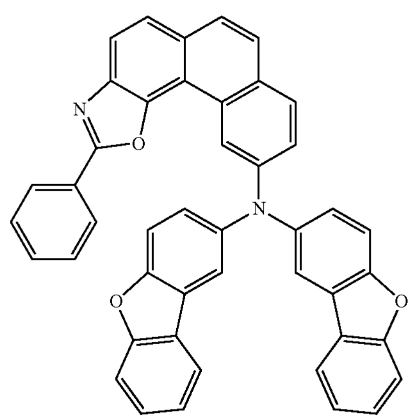

-continued
H-217
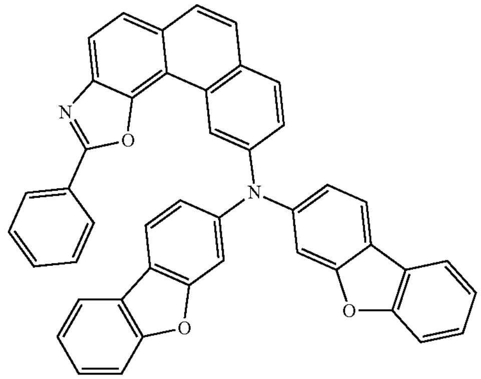
H-218
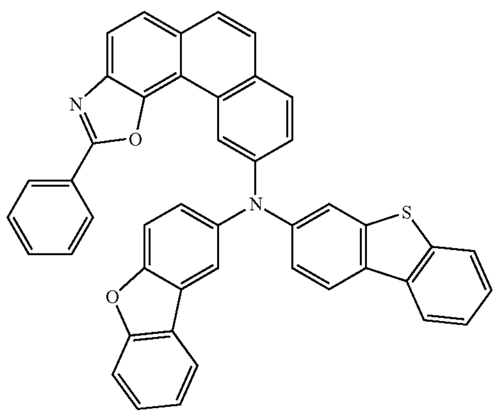
H-219
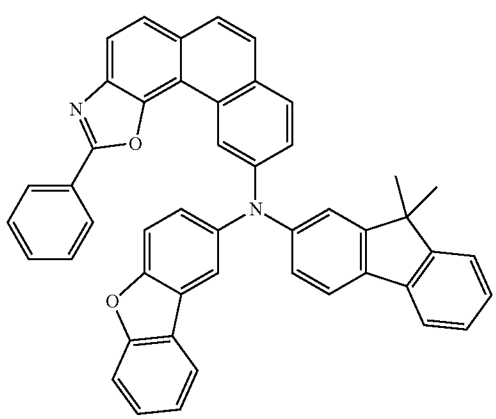
H-220
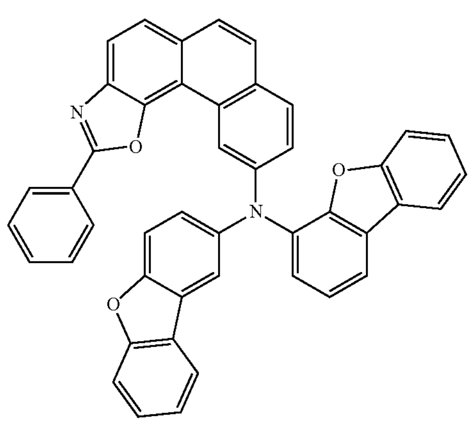
-continued
H-221
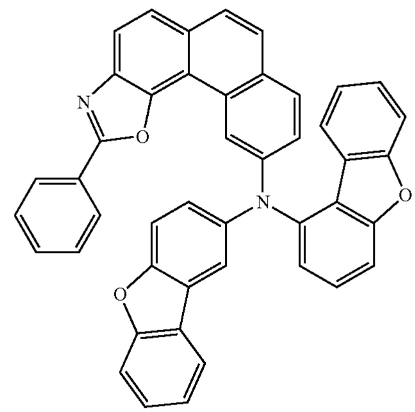
H-222
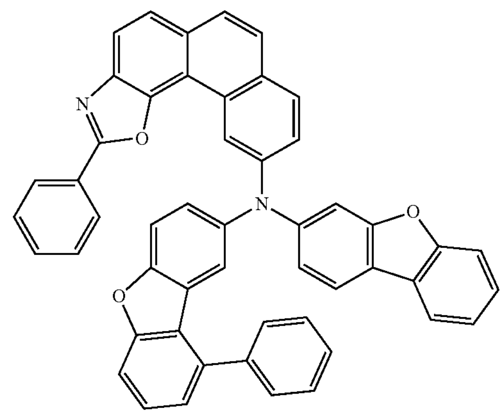
H-223
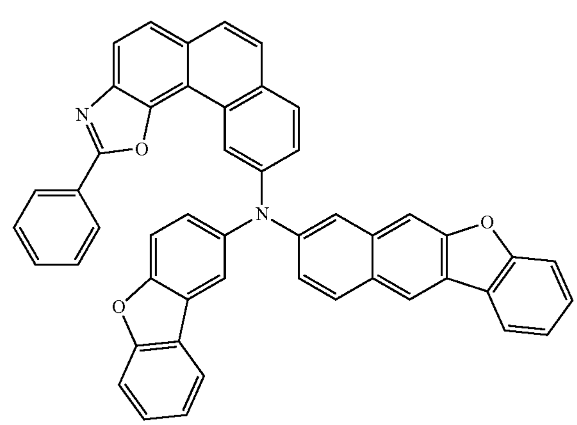

-continued
H-224
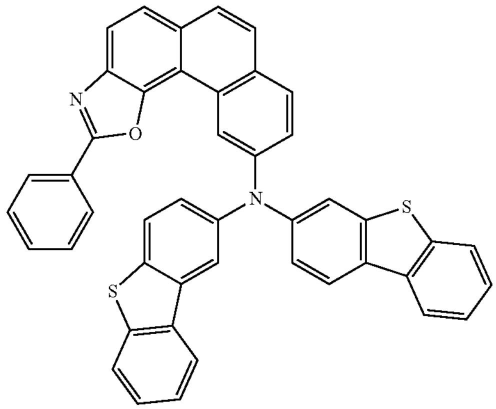
H-225
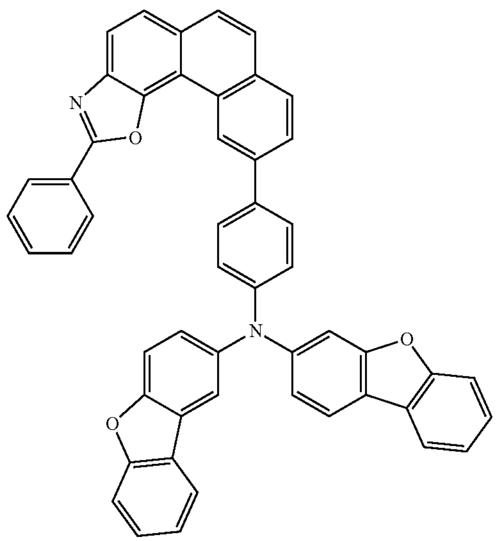
H-226
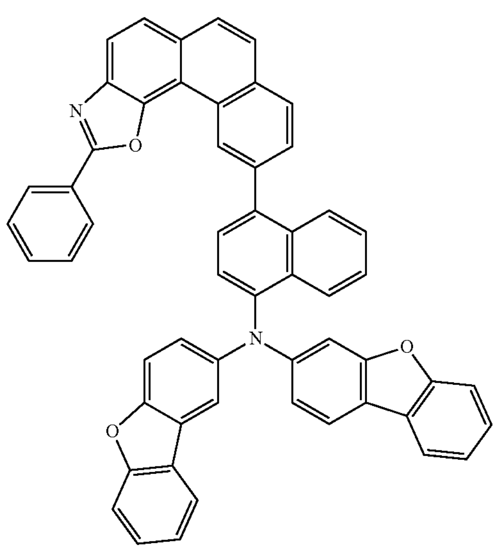
-continued
H-227
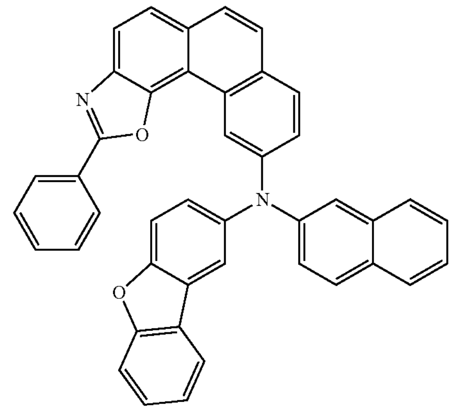
H-228
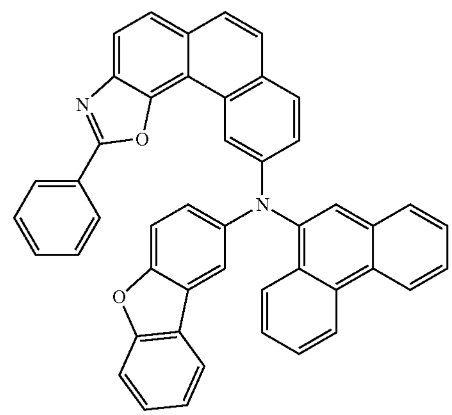
H-229
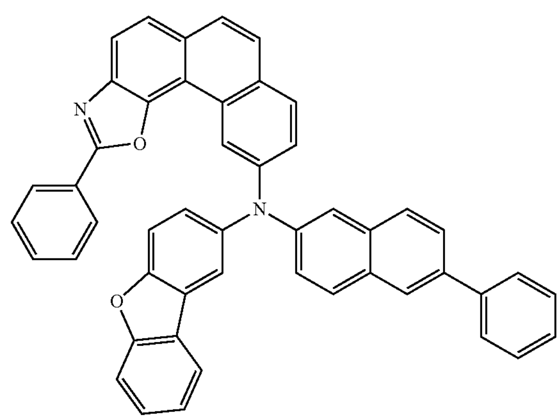

-continued
H-230
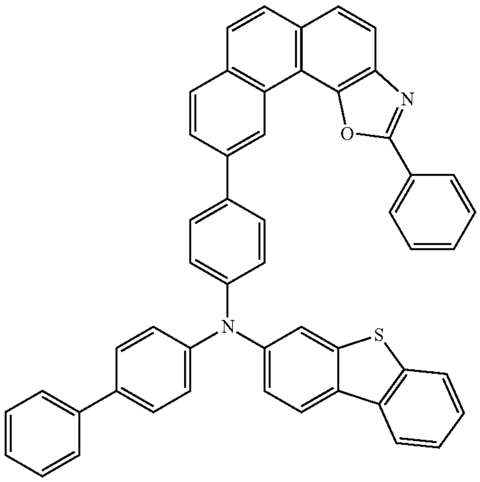
H-231
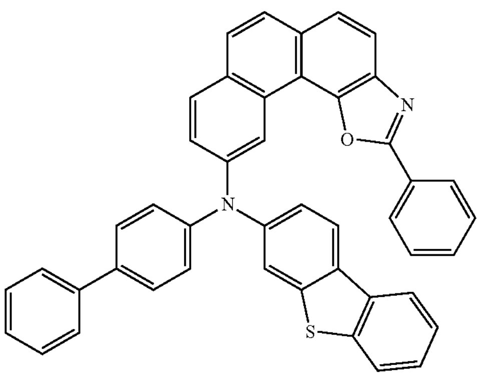
H-232
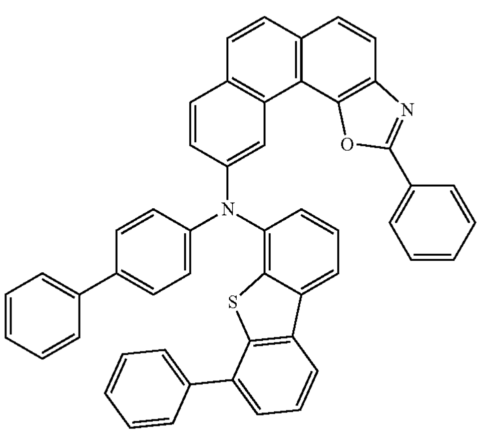
-continued
H-233
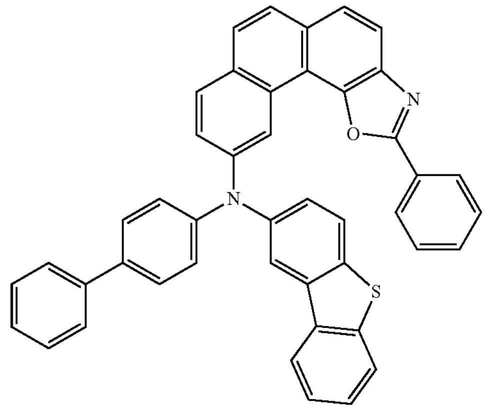
H-234
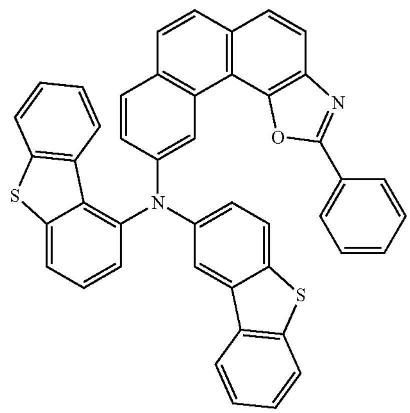
H-235
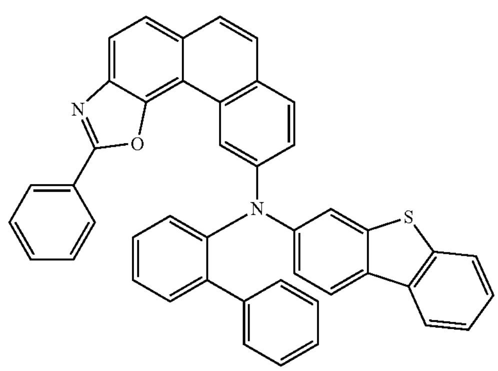

-continued

H-236

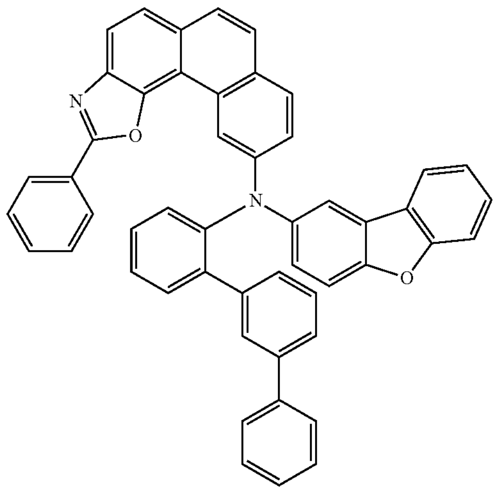

H-237

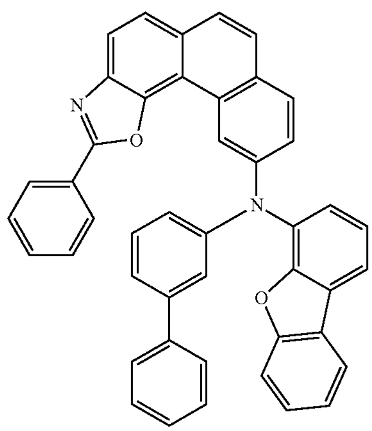

H-238

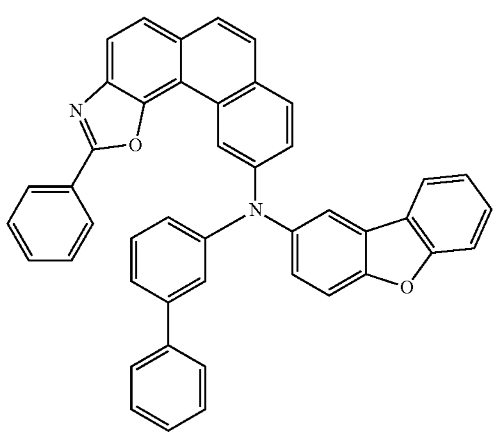

-continued

H-239

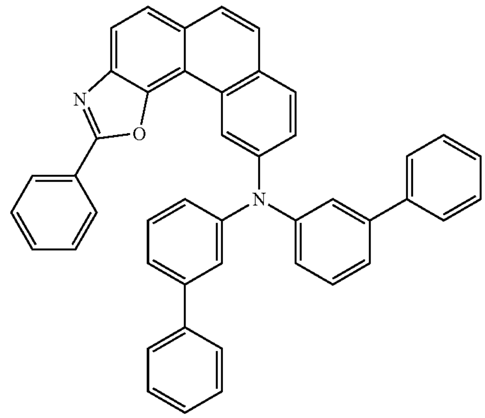

and

H-240

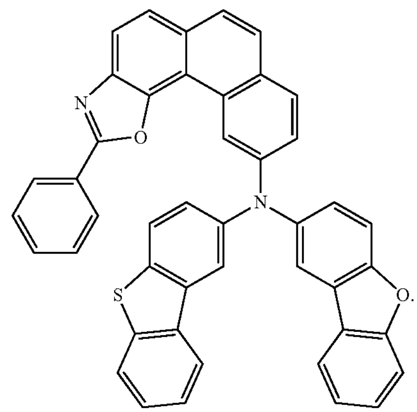

4. An organic electroluminescent device comprising: an anode; a cathode; and at least one light-emitting layer(s) between the anode and the cathode, wherein at least one light-emitting layer(s) comprise(s) a plurality of host materials comprising a first host material comprising a compound represented by the following formula 1 and a second host material comprising a compound represented by the following formula 2:

(1)

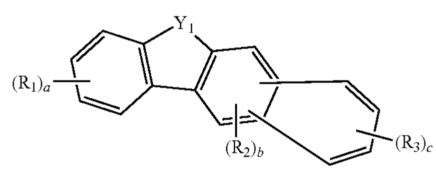

wherein, $Y_1$ represents O, S, $CR_{11}R_{12}$, or $NR_{13}$;

$R_{11}$ to $R_{13}$ each independently represent hydrogen, deuterium, halogen, cyano, a substituted or unsubstituted (C1-C30)alkyl, a substituted or unsubstituted (C3-C30) cycloalkyl, a substituted or unsubstituted (C3-C30) cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; or $R_{11}$ and $R_{12}$ may be linked to each other to form a ring;

$R_1$ to $R_3$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di- (C1-C30)alkylamino, a substituted or unsubstituted (C1-C30)alkyl(C6-C30)arylamino, a substituted or unsubstituted mono- or di- (C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

provided that at least one of $R_{13}$, $R_2$, and $R_3$ represent(s) $-L_1-(Ar_1)_d$;

$L_1$ represents a single bond, a substituted or unsubstituted (C6-C30)arylene, or a substituted or unsubstituted (3- to 30-membered)heteroarylene;

$Ar_1$ each independently represent(s) a substituted or unsubstituted (3- to 30-membered)heteroaryl containing at least one nitrogen (N);

a and c each independently represent an integer of 1 to 4, b and d represent an integer of 1 or 2; and when a to d are equal to 2 or more, each $R_1$, each $R_2$, each $R_3$, and each $Ar_1$ may be the same or different, (2)

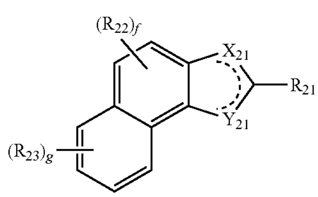

wherein, $X_{21}$ and $Y_{21}$ each independently represent —N═, —$NR_{24}$—, —O—, or —S—, provided that one of $X_{21}$ and $Y_{21}$ represents —N═, and the other represents —$NR_{24}$—, —O—, or —S—;

$R_{21}$ represents a substituted or unsubstituted (C6-C30)aryl or a substituted or unsubstituted (3- to 30-membered) heteroaryl;

$R_{22}$ to $R_{24}$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30)aliphatic ring and (C6-C30)aromatic ring, a substituted or unsubstituted mono- or di- (C1-C30)alkylamino, a substituted or unsubstituted mono- or di- (C6-C30)arylamino, a substituted or unsubstituted (C1-C30)alkyl(C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

provided that at least one of $R_{22}$ and $R_{23}$ represent(s) $-L_{21}-Ar_{21}$;

$L_{21}$ represents a single bond or a substituted or unsubstituted (C6-C30)arylene;

$Ar_{21}$ represents a substituted or unsubstituted (C6-C30) aryl, a substituted or unsubstituted (3- to 30-membered) heteroaryl, a substituted or unsubstituted fused ring of (C3-C30)aliphatic ring and (C6-C30)aromatic ring, a substituted or unsubstituted mono- or di- (C1-C30) alkylamino, a substituted or unsubstituted mono- or di-(C6-C30)arylamino, a substituted or unsubstituted (C1-C30)alkyl(C6-C30)arylamino, a substituted or unsubstituted mono- or di- (3- to 30-membered)heteroarylamino, or a substituted or unsubstituted (C6-C30)aryl (3- to 30-membered)heteroarylamino;

f represents an integer of 1 or 2, g represents an integer of 1 to 4; and when f and g are equal to 2 or more, each $R_{22}$ and each $R_{23}$ may be the same or different.

5. An organic electroluminescent compound represented by the following formula 3-1:

(3-1)

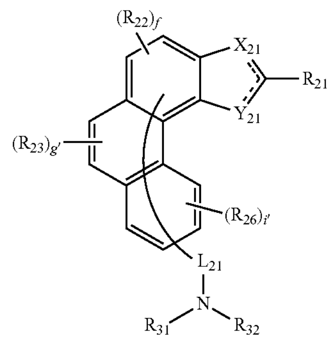

wherein, $X_{21}$ and $Y_{21}$ each independently represent —N═, —$NR_{24}$—, —O—, or —S—, provided that one of $X_{21}$ and $Y_{21}$ represents —N═, and the other represents —$NR_{24}$—, —O—, or —S—;

$R_{21}$ represents a substituted or unsubstituted (C6-C30)aryl or a substituted or unsubstituted (3- to 30-membered) heteroaryl;

$R_{22}$ to $R_{24}$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30)aliphatic ring and (C6-C30)aromatic ring, a substituted or unsubstituted mono- or di- (C1-C30)alkylamino, a substituted or unsubstituted mono- or di- (C6-C30)arylamino, a substituted or unsubstituted (C1-C30)alkyl(C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

$R_{26}$ represents hydrogen, deuterium, halogen, cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di- (C6-C30)arylamino, a substituted or unsubstituted (C1-C30)alkyl(C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

f represents an integer of 1 or 2;

when f is equal to 2 or more, each $R_{22}$ may be the same or different;

g' represents an integer of 1 or 2, and i' represents an integer of 1 to 4;

when g' and i' are equal to 2 or more, each $R_{23}$, and each $R_{26}$ may be the same or different;

$L_{21}$ represents a single bond or a substituted or unsubstituted (C6-C30)arylene;

$R_{31}$ and $R_{32}$ each independently represent a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, or a substituted or unsubstituted (3- to 30-membered)heteroaryl; provided that at least one of $R_{31}$ and $R_{32}$ represent(s) a substituted or unsubstituted (3- to 30-membered)heteroaryl.

6. The organic electroluminescent compound according to claim 5, wherein the compound represented by formula 3-1 is selected from the group consisting of:

H-181

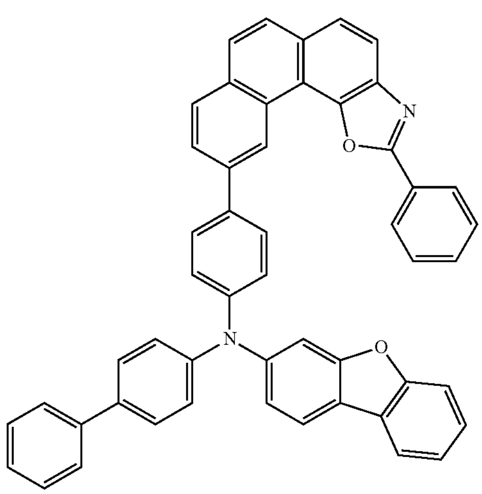

-continued

H-183

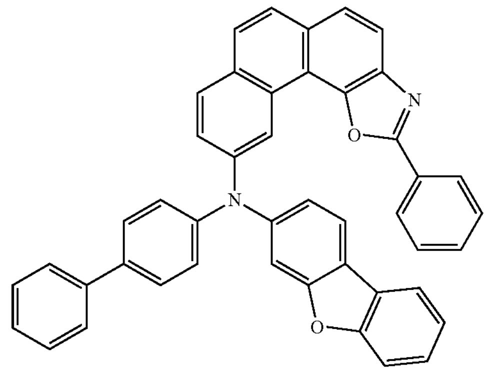

H-184

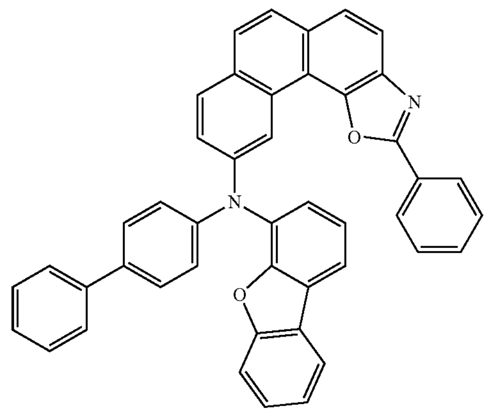

H-185

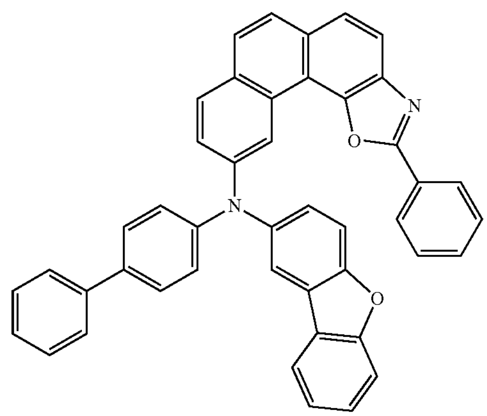

H-186

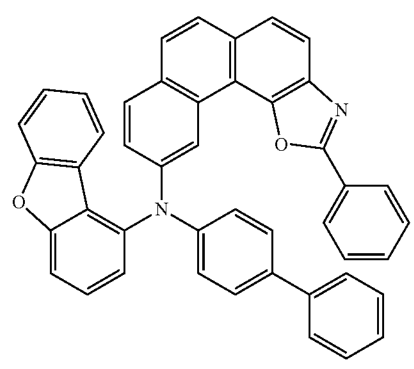

-continued
H-187
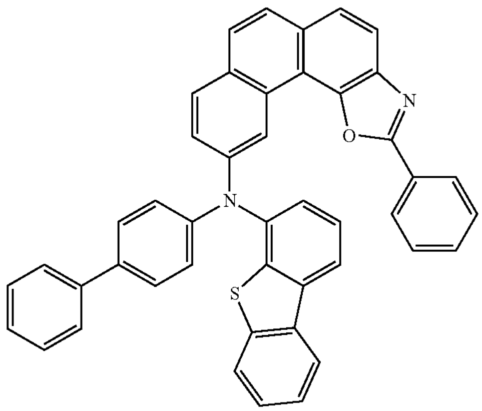
H-191
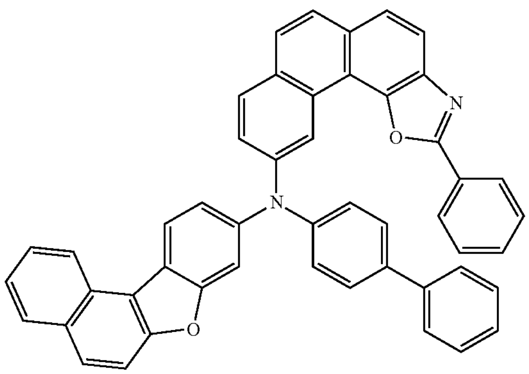
H-192
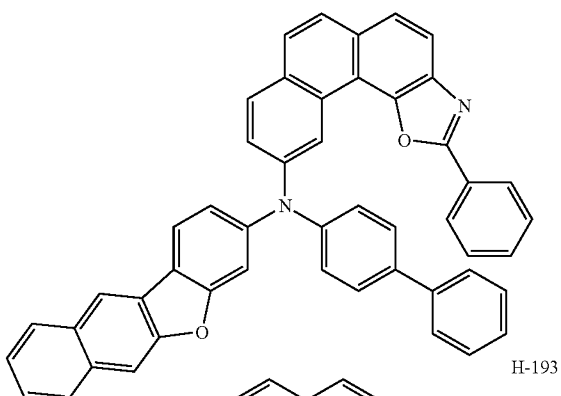
H-193
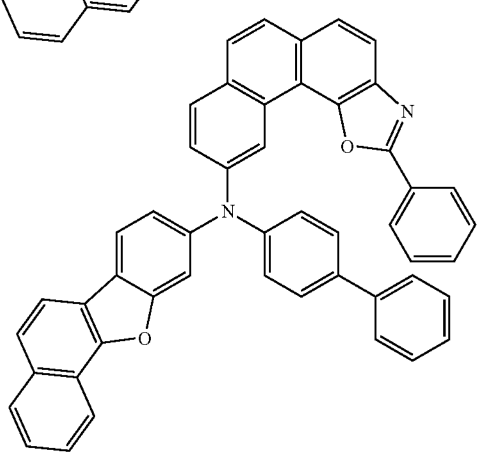
-continued
H-212
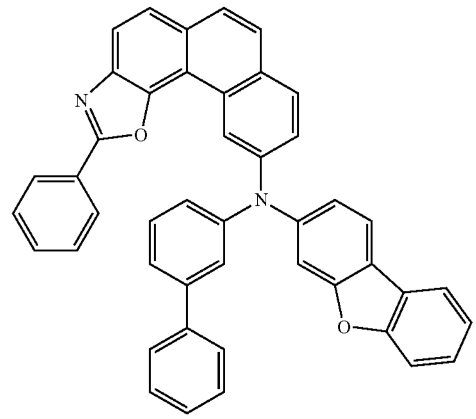
H-214
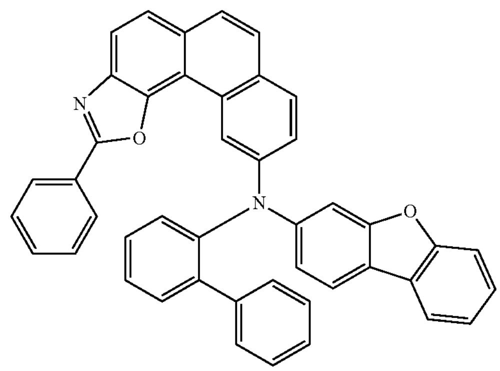
H-216
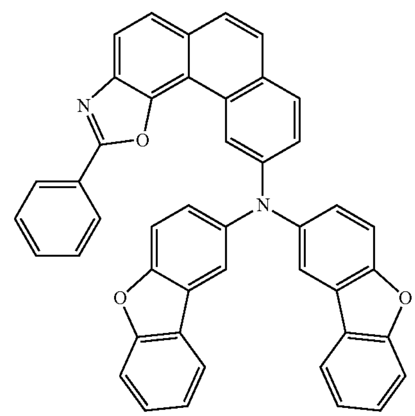
H-217
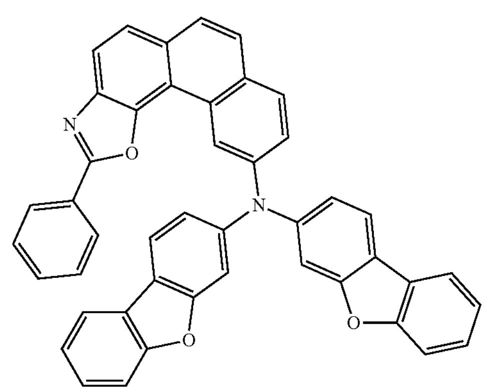

-continued
H-218
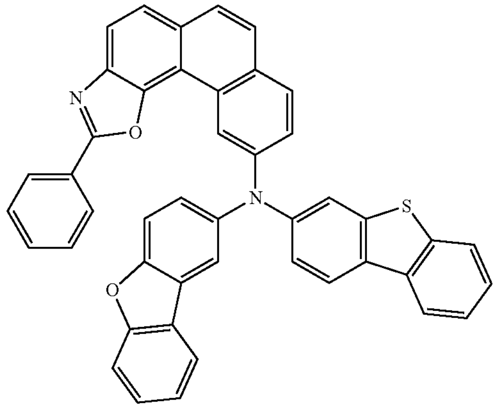
H-219
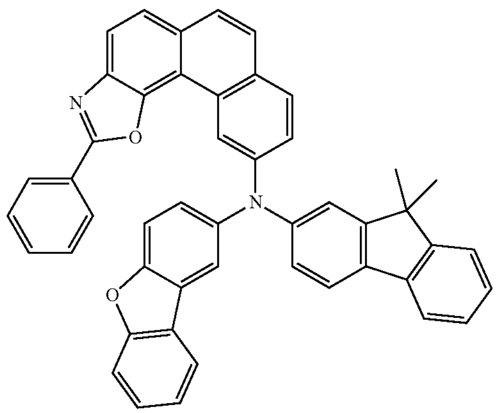
H-220
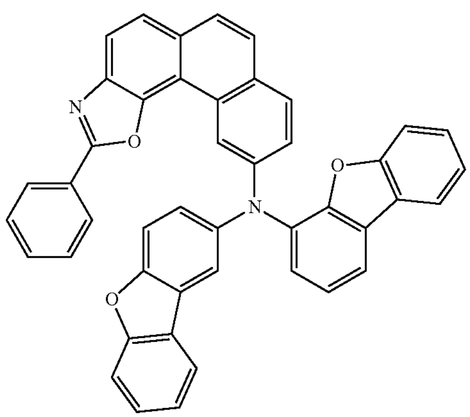
H-221
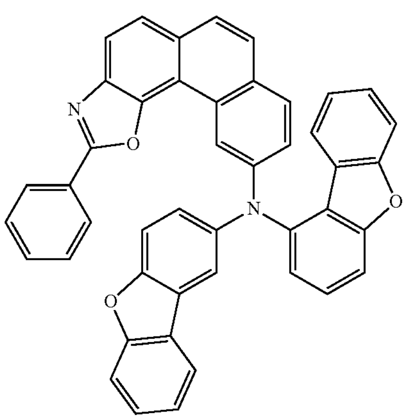
-continued
H-222
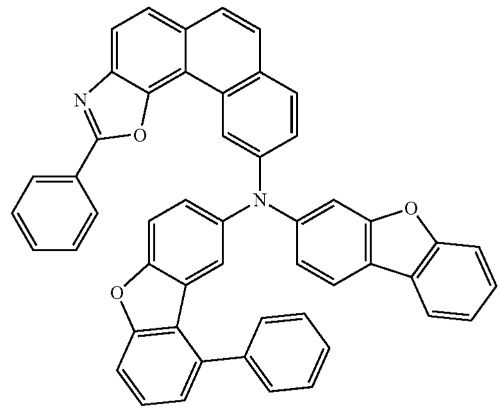
H-223
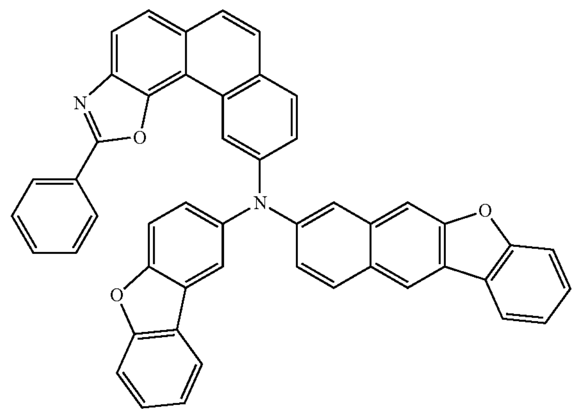
H-224
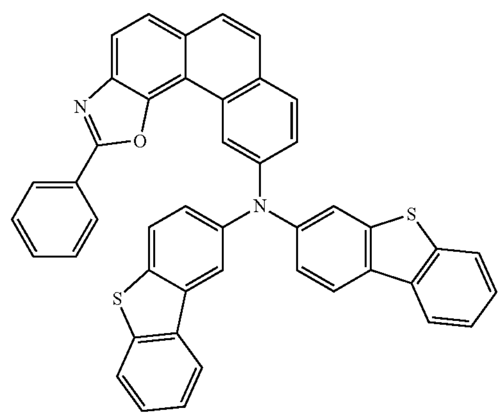

H-225
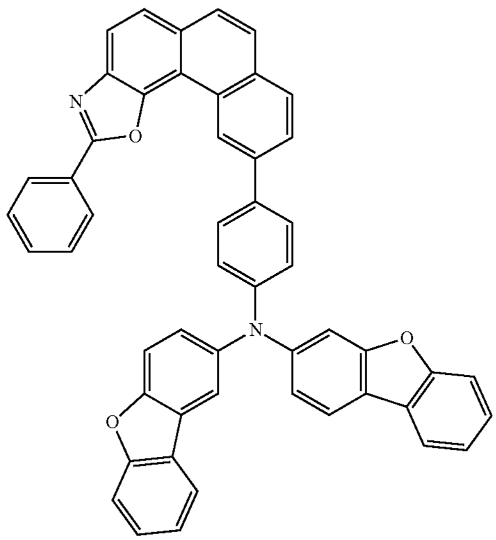
H-226
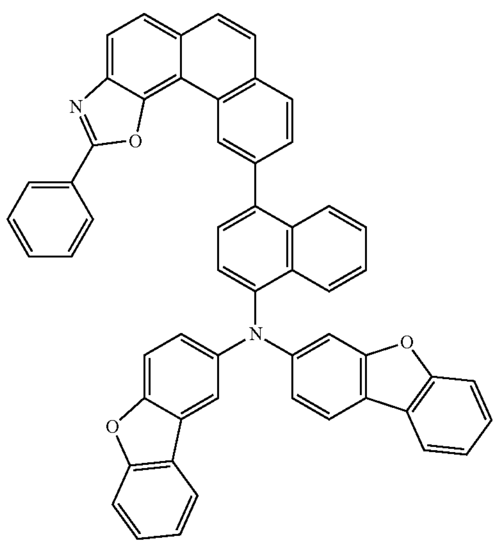
H-227
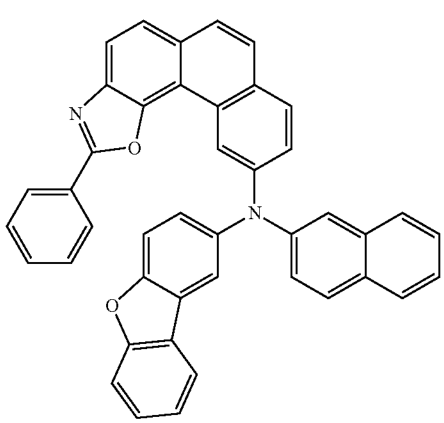
H-228
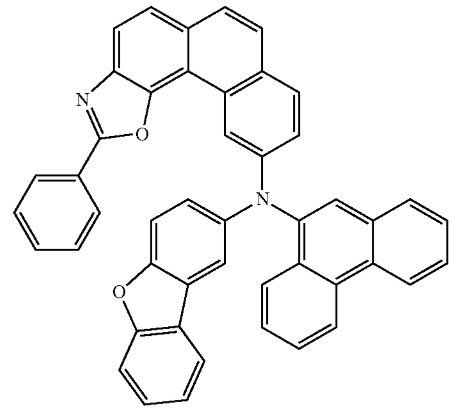
H-229
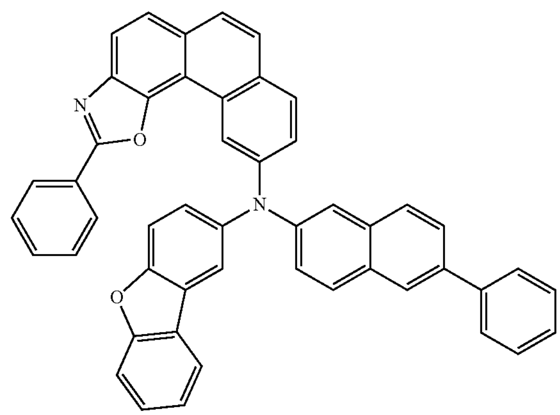
H-230
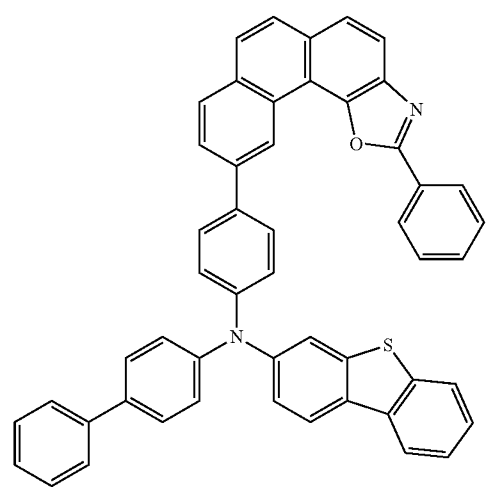

-continued
H-231
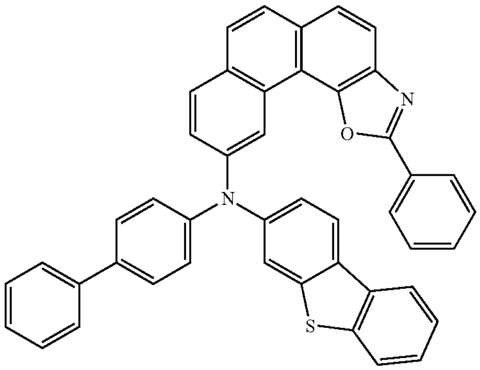
H-232
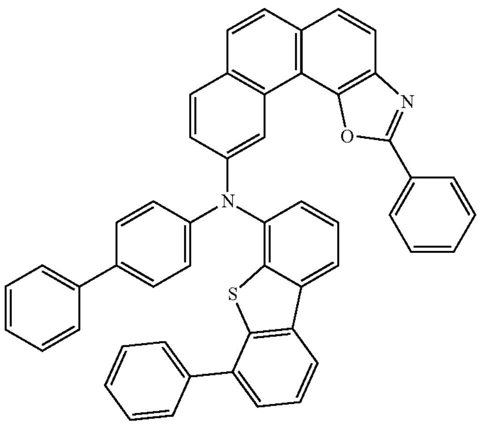
H-233
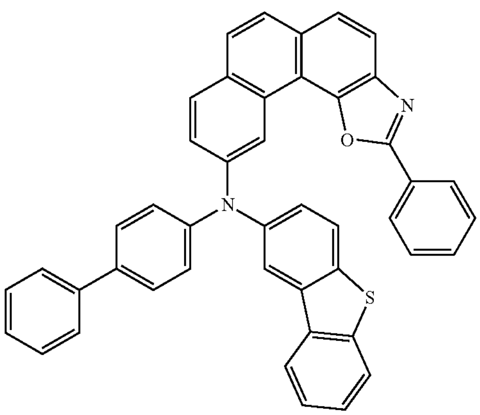
H-234
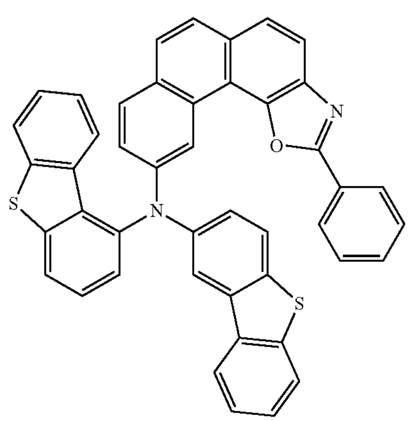
-continued
H-235
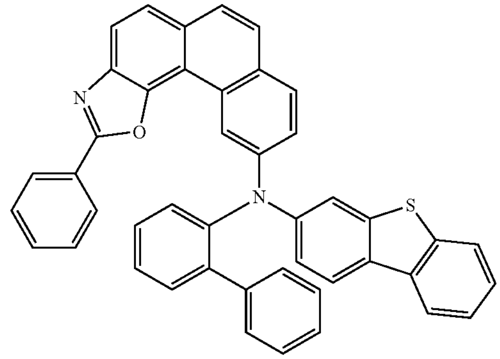
H-236
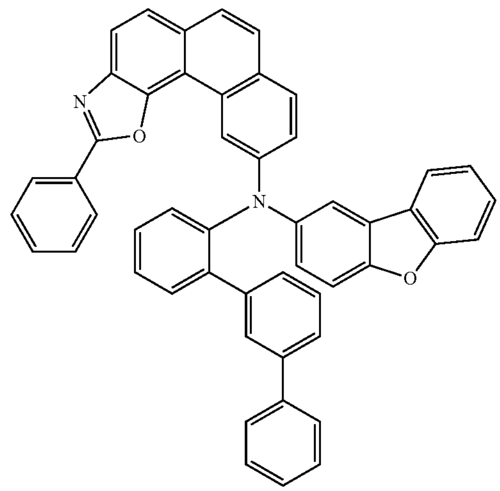
H-237
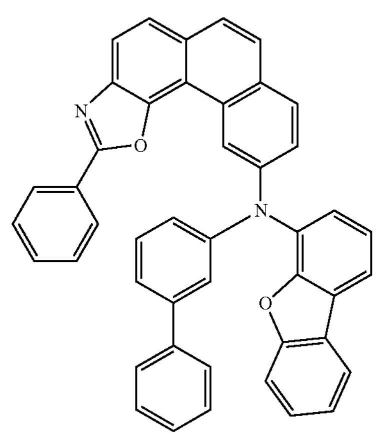

-continued

H-238

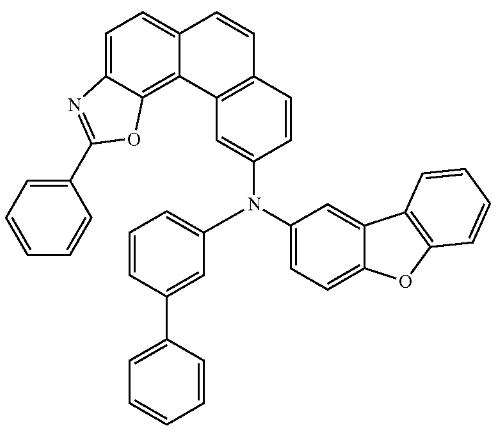

and

H-240

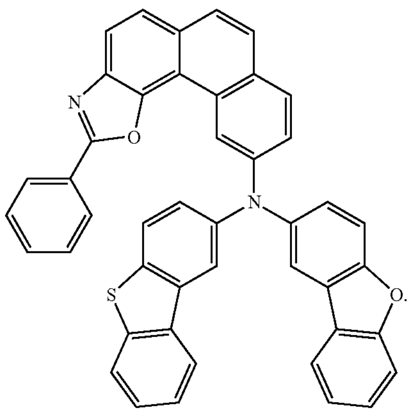

7. An organic electroluminescent device comprising the organic electroluminescent compound according to claim 6.

8. The organic electroluminescent device according to claim 7, wherein the organic electroluminescent compound is contained in a hole transport zone and/or a light-emitting layer.

9. The organic electroluminescent device according to claim 4, wherein the formula 1 is represented by any one of the following formulas 1-1 to 1-9:

(1-1)

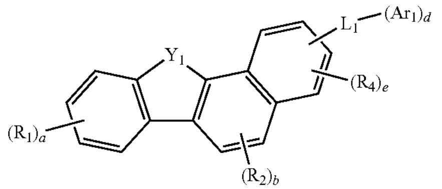

(1-2)

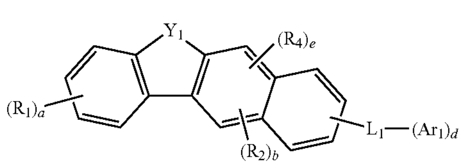

-continued (1-3)

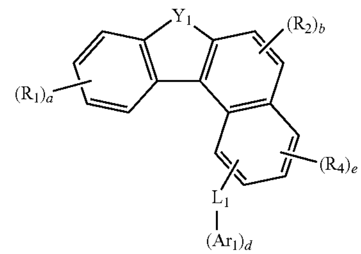

(1-4)

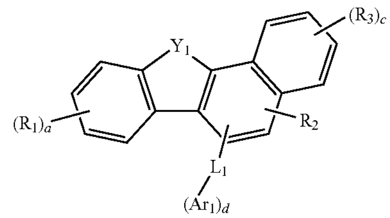

(1-5)

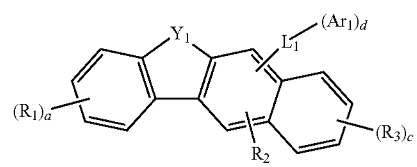

(1-6)

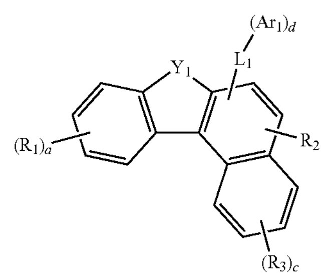

(1-7)

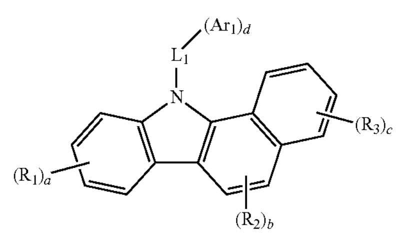

(1-8)

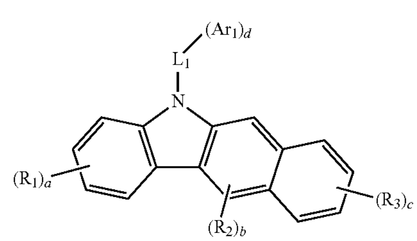

-continued (1-9)

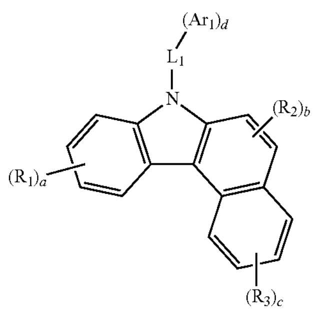

wherein, $Y_1$, $L_1$, $Ar_1$, $R_1$ to $R_3$, and a to d are as defined in claim 5;

$R_4$ each independently is as defined as $R_3$; and e represents an integer of 1 to 3, when e is equal to 2 or more, each $R_4$ may be the same or different.

10. The organic electroluminescent device according to claim 4, wherein the formula 2 is represented by any one of the following formulas 2-1 to 2-5:

(2-1)

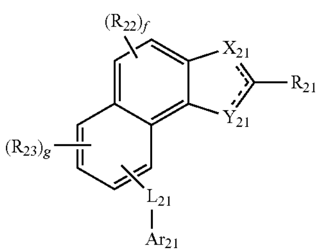

(2-2)

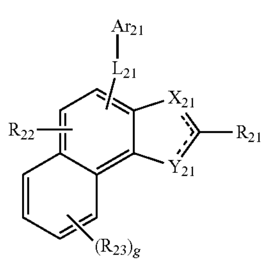

(2-3)

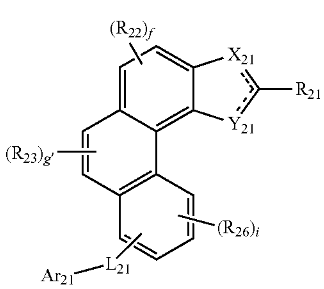

-continued (2-4)

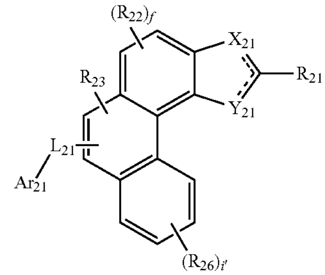

(2-5)

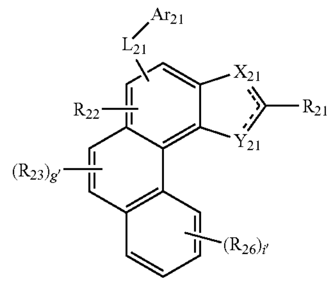

wherein, $X_{21}$, $Y_{21}$, $L_{21}$, $Ar_{21}$, $R_{21}$ to $R_{23}$, f, and g are as defined in claim 5;

$R_{25}$ and $R_{26}$ each independently represent hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di- (C1-C30)alkylamino, a substituted or unsubstituted mono- or di- (C6-C30)arylamino, a substituted or unsubstituted (C1-C30)alkyl (C6-C30)arylamino, a substituted or unsubstituted mono- or di- (3- to 30-membered)heteroarylamino, or a substituted or unsubstituted (C6-C30)aryl(3- to 30-membered)heteroarylamino; or may be linked to an adjacent substituent to form a ring;

g' represents an integer of 1 or 2, h and i each independently represent an integer of 1 to 3, and i' represents an integer of 1 to 4; and when g', h, i, and i' are equal to 2 or more, each $R_{23}$, each $R_{25}$, and each $R_{26}$ may be the same or different.

11. The organic electroluminescent device according to claim 4, wherein $Ar_1$ each independently represent(s) a substituted or unsubstituted pyridyl, a substituted or unsubstituted pyrimidinyl, a substituted or unsubstituted triazinyl, a substituted or unsubstituted pyrazinyl, a substituted or unsubstituted pyridazinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, or a substituted or unsubstituted benzothienopyrimidinyl.

12. The organic electroluminescent device according to claim 4, wherein $Ar_{21}$ represents a substituted or unsubstituted phenyl, a substituted or unsubstituted naphthyl, a substituted or unsubstituted o-biphenyl, a substituted or unsubstituted m-biphenyl, a substituted or unsubstituted p-biphenyl, a substituted or unsubstituted o-terphenyl, a substituted or unsubstituted m-terphenyl, a substituted or unsubstituted p-terphenyl, a substituted or unsubstituted triphenylenyl, a substituted or unsubstituted phenanthrenyl, a substituted or unsubstituted chrysenyl, a substituted or unsubstituted fluoranthenyl, a substituted or unsubstituted fluorenyl, a substituted or unsubstituted benzofluorenyl, a substituted or unsubstituted spirobifluorenyl, a substituted or unsubstituted spiro[cyclopentane-fluorene]yl, a substituted or unsubstituted spiro[dihydroindene-fluorene]yl, a substituted or unsubstituted spiro[benzofluorene-fluorene]yl, a substituted or unsubstituted carbazolyl, a substituted or unsubstituted benzocarbazolyl, a substituted or unsubstituted dibenzocarbazolyl, a substituted or unsubstituted dibenzothiophenyl, a substituted or unsubstituted benzothiophenyl, a substituted or unsubstituted benzonaphthothiophenyl, a substituted or unsubstituted dibenzofuranyl, a substituted or unsubstituted benzofuranyl, a substituted or unsubstituted benzonaphthofuranyl, or an amino substituted with at least one of phenyl, naphthyl, naphthylphenyl, phenylnaphthyl, o-biphenyl, m-biphenyl, p-biphenyl, o-terphenyl, m-terphenyl, p-terphenyl, fluorenyl, benzofluorenyl, phenanthrenyl, benzonaphthofuranyl, dibenzothiophenyl, and dibenzofuranyl.

13. The organic electroluminescent device according to claim 4, wherein the compound represented by formula 1 is selected from the group consisting of:

C-1

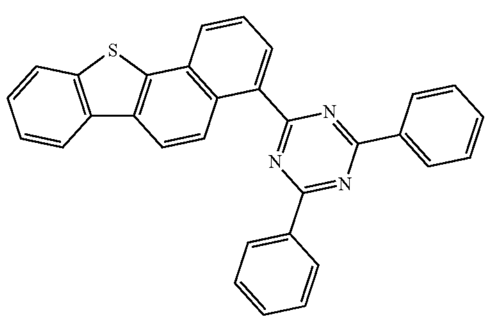

C-2

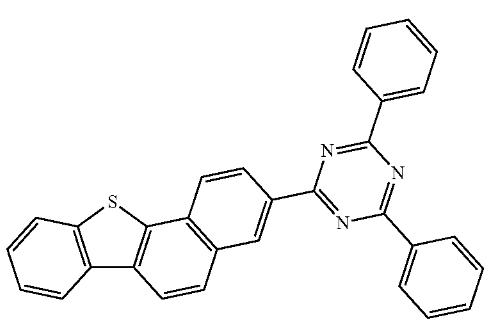

-continued

C-3

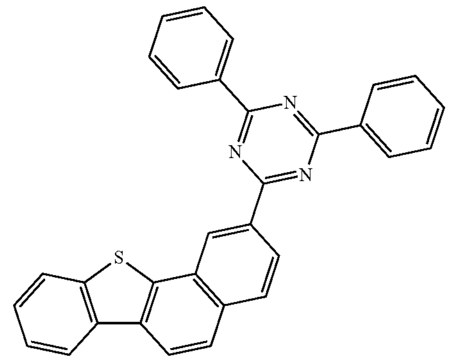

C-4

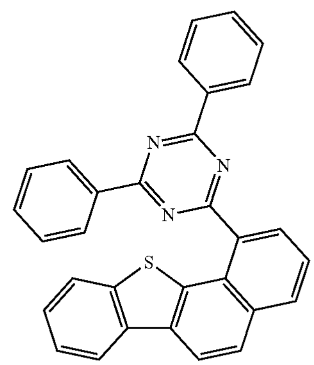

C-5

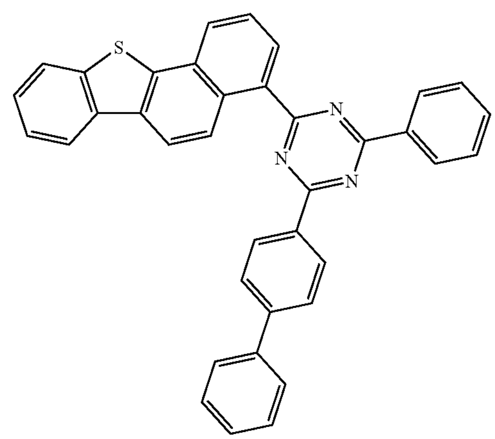

C-6

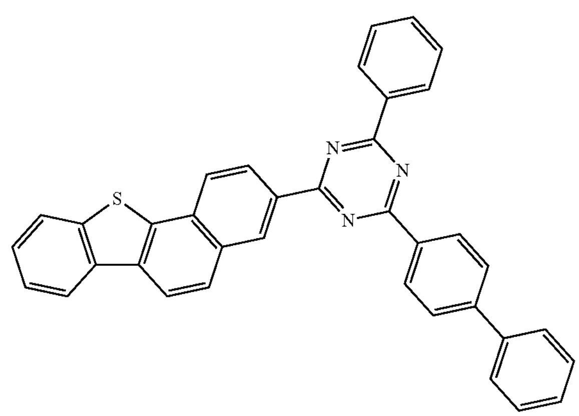

-continued
C-7
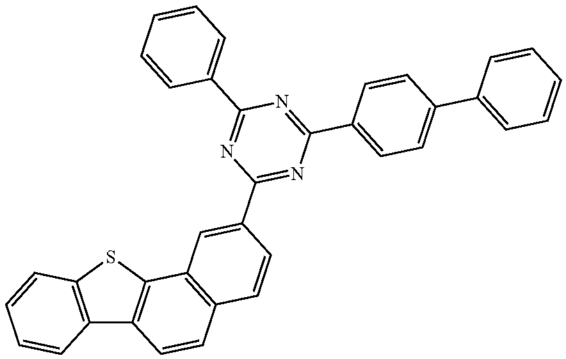
C-8
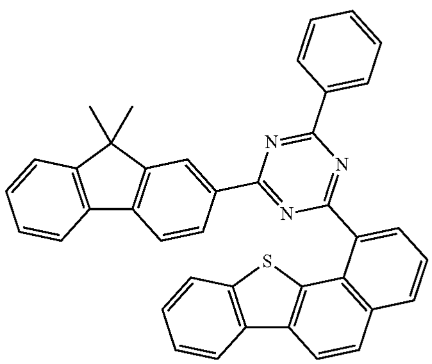
C-9
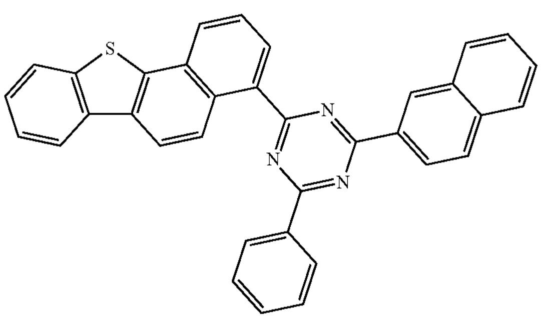
C-10
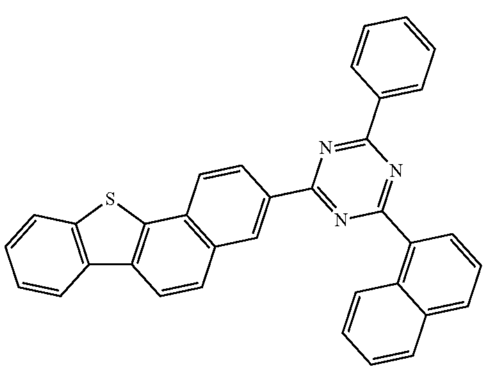
-continued
C-11
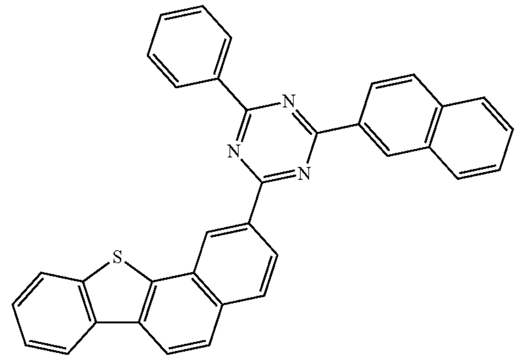
C-12
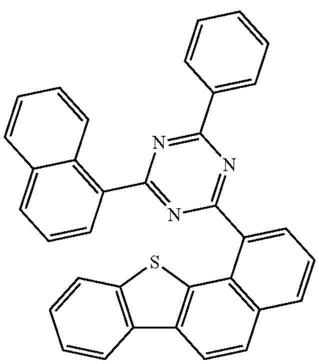
C-13
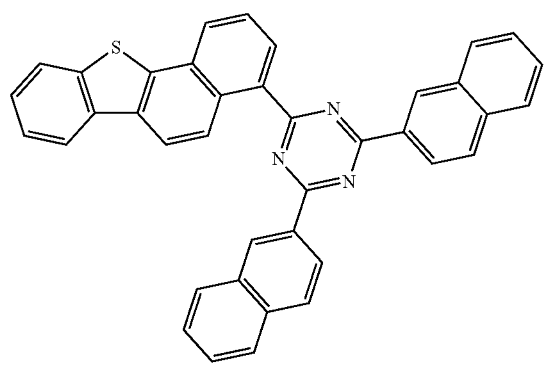
C-14
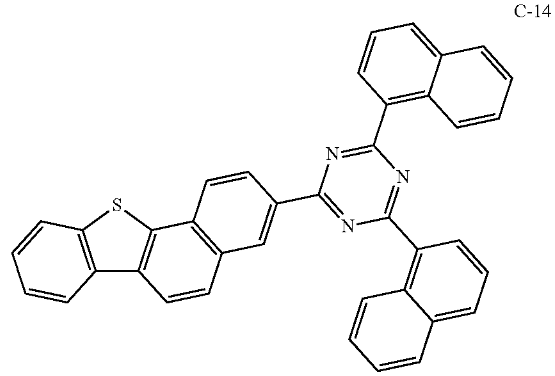

C-15
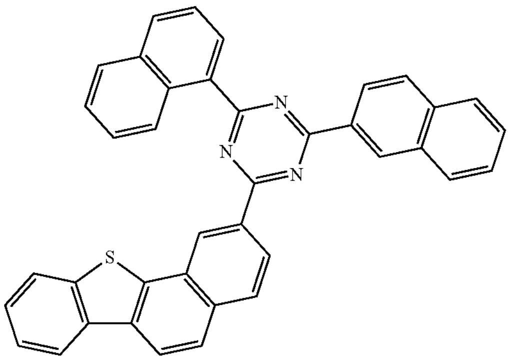
C-16
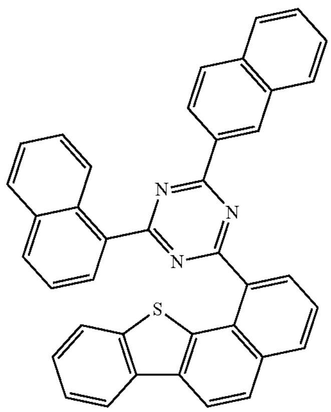
C-17
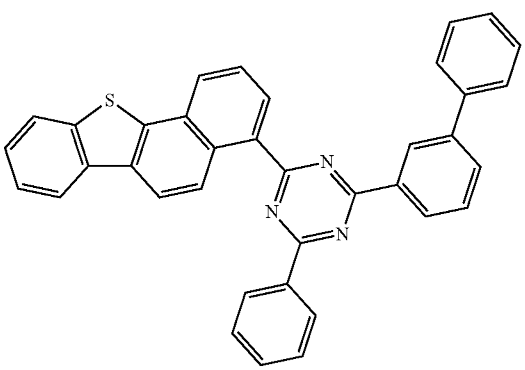
C-18
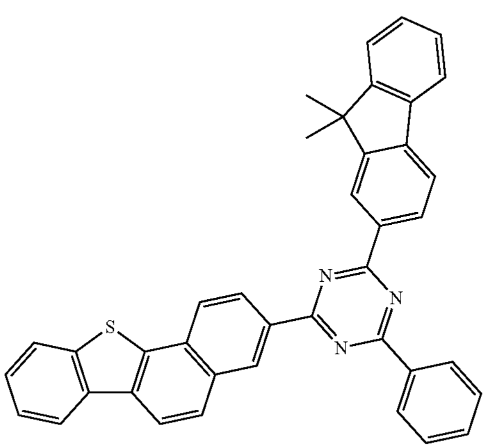
C-19
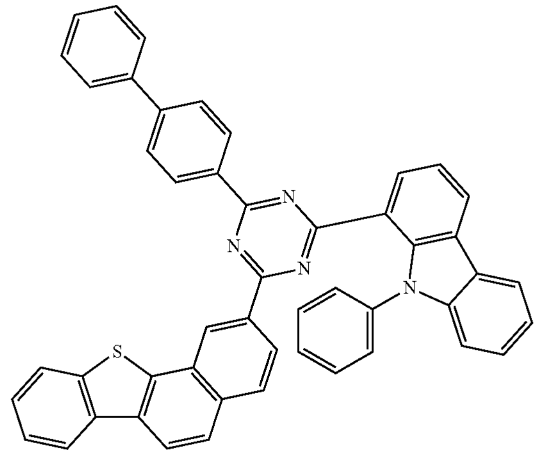
C-20
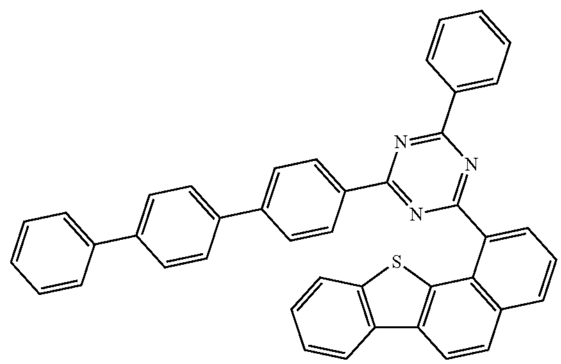
C-21
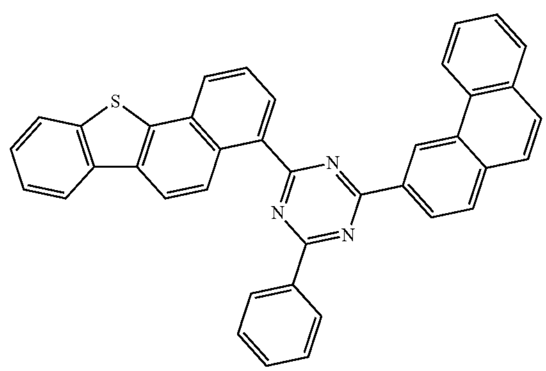
C-22
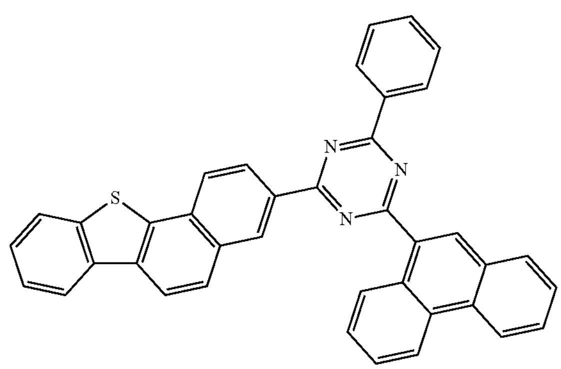

-continued
C-23
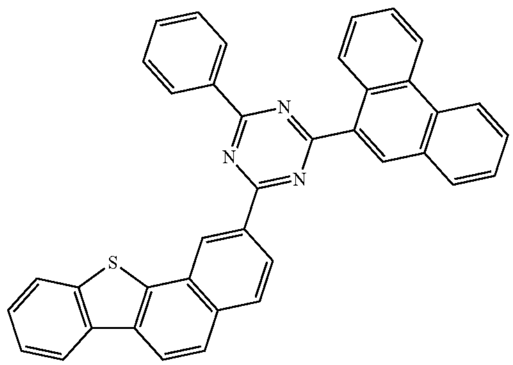
C-24
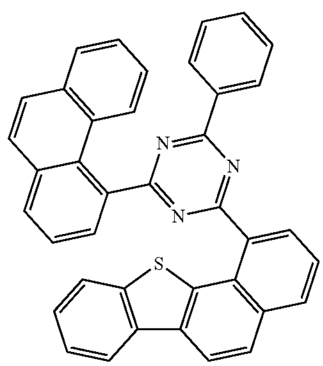
C-25
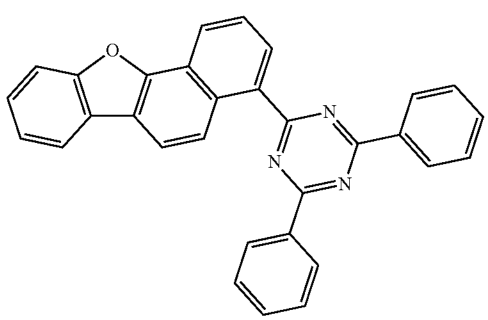
C-26
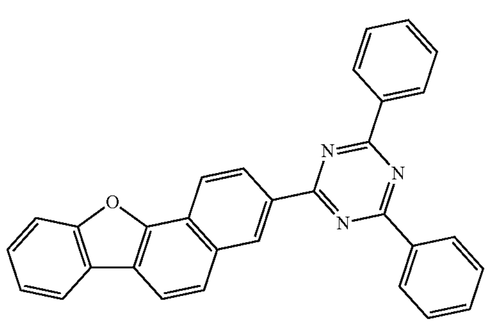
-continued
C-27
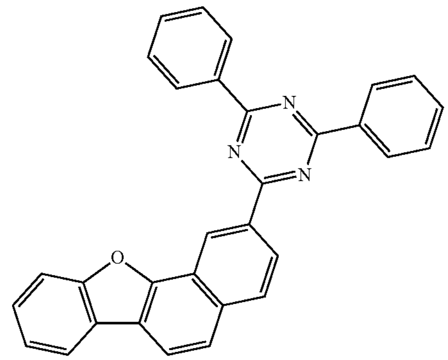
C-28
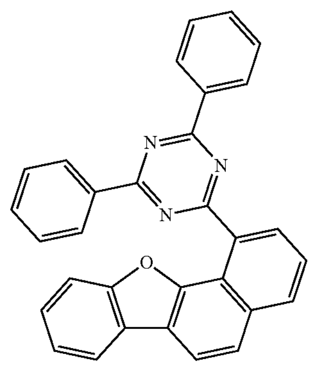
C-29
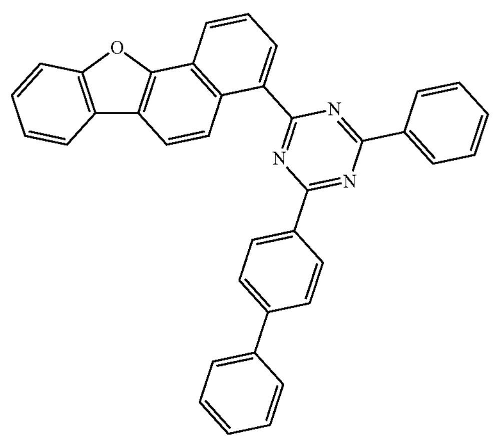
C-30
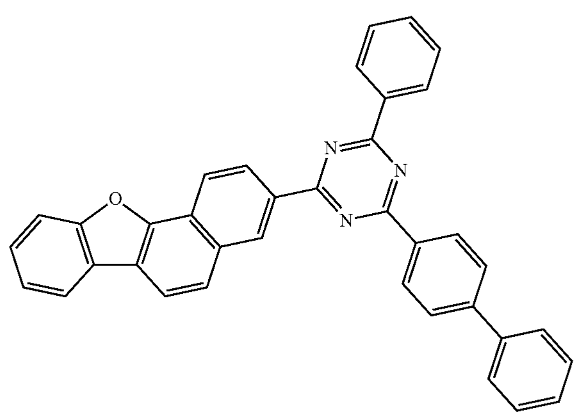

-continued
C-31
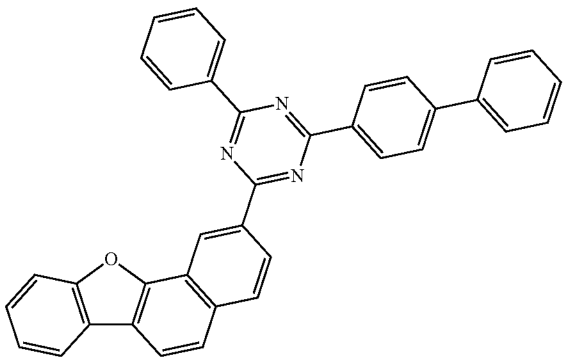
C-32
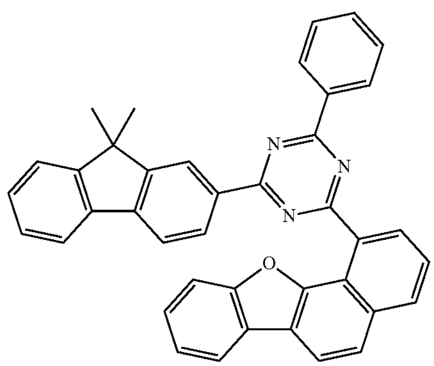
C-33
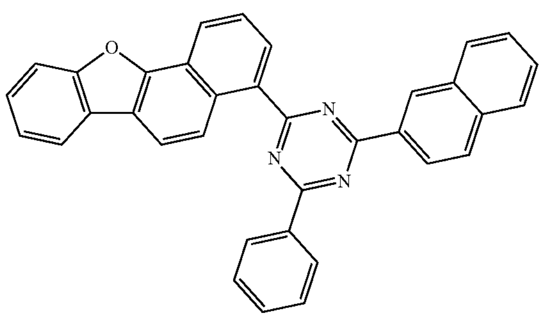
C-34
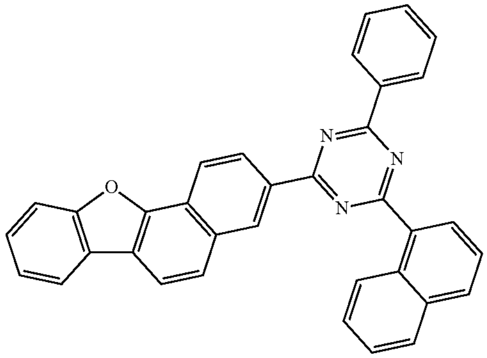
-continued
C-35
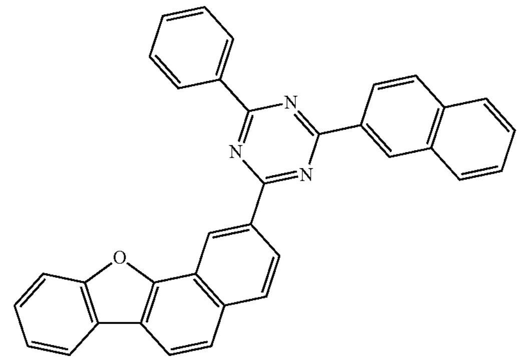
C-36
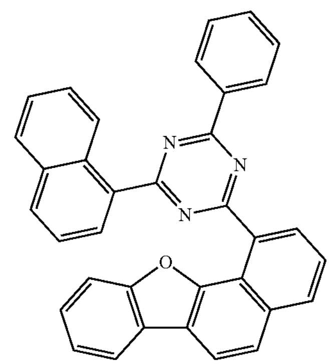
C-37
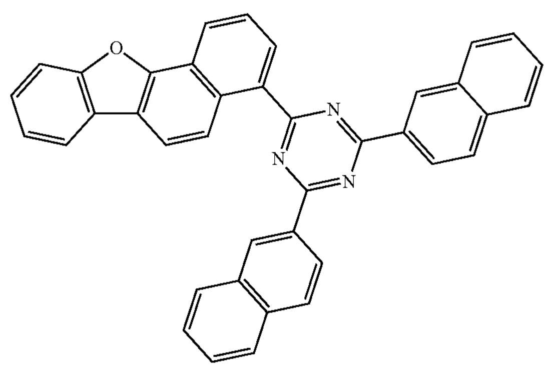
C-38
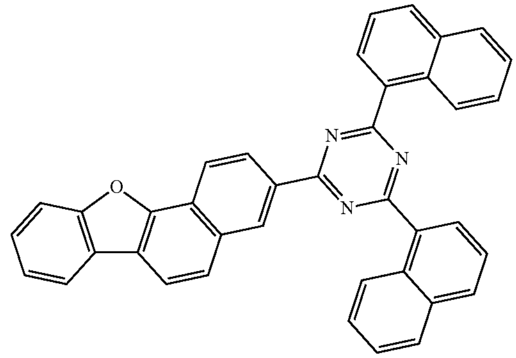

-continued
C-39
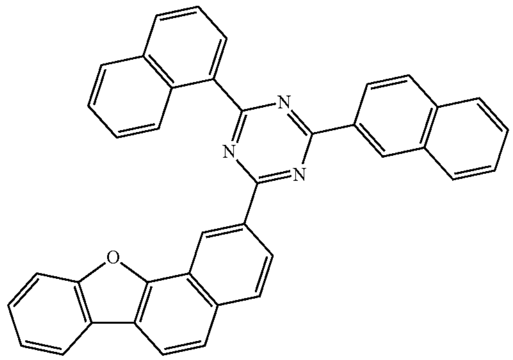
C-40
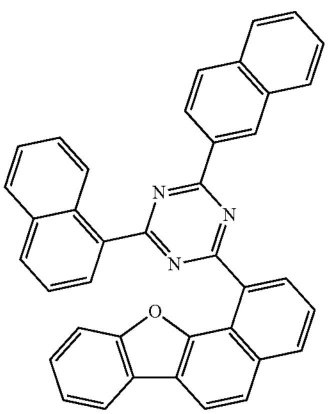
C-41
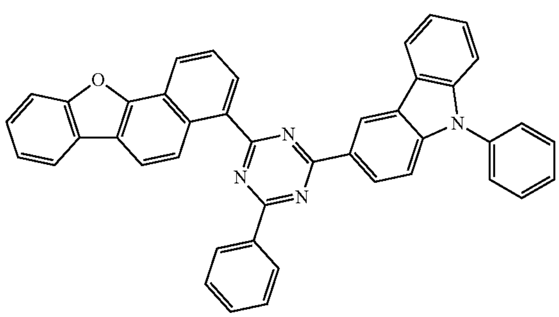
C-42
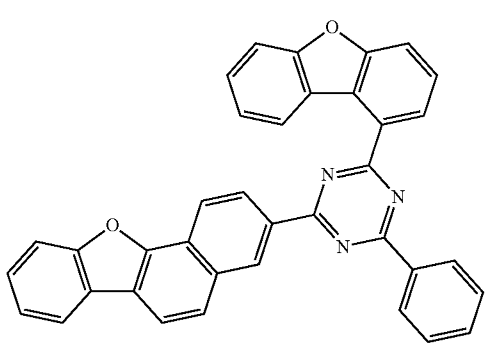
-continued
C-43
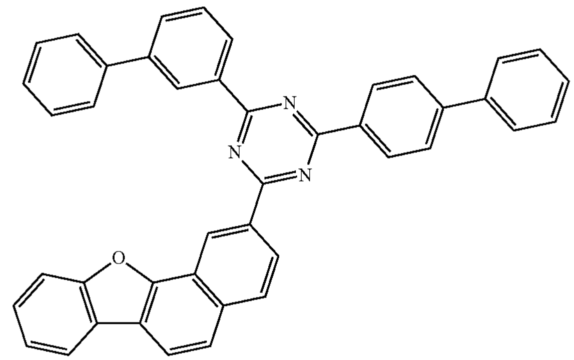
C-44
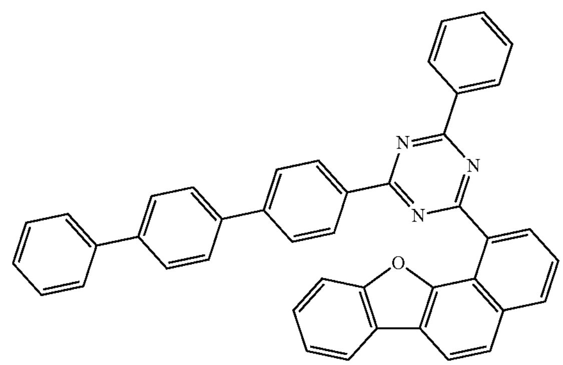
C-45
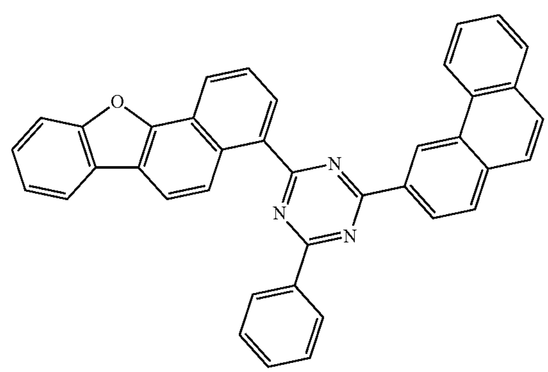
C-46
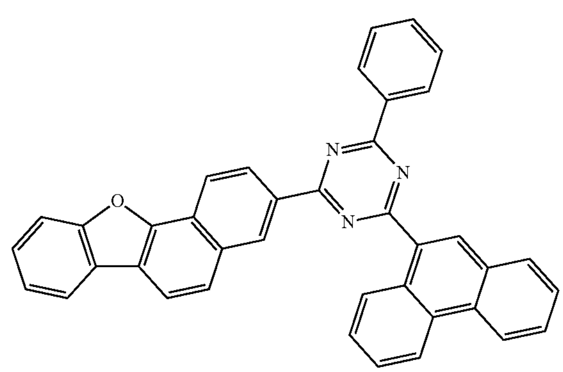

-continued
C-47
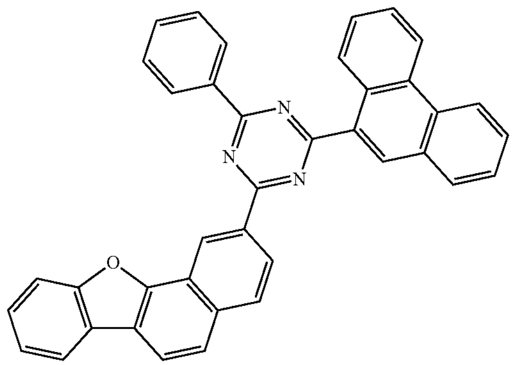
C-48
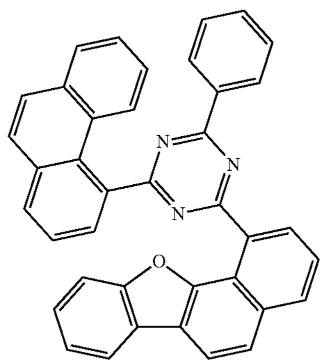
C-49
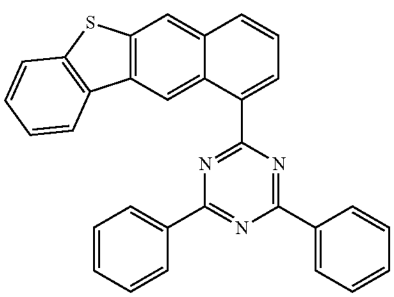
C-50
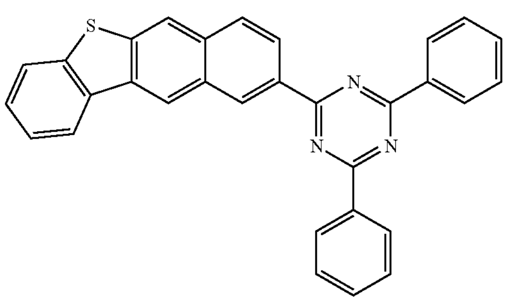
-continued
C-51
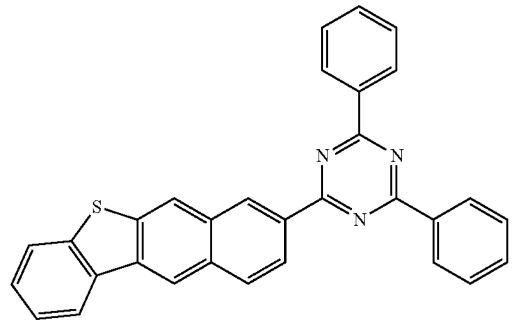
C-52
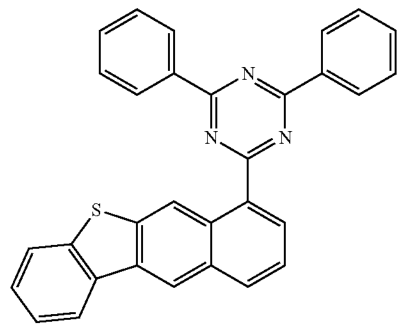
C-53
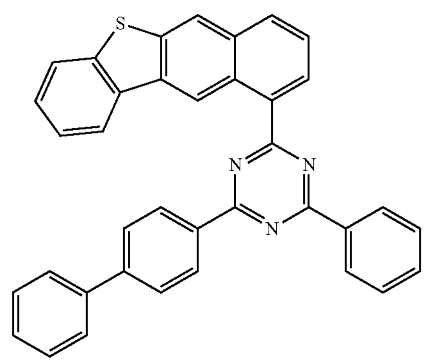
C-54
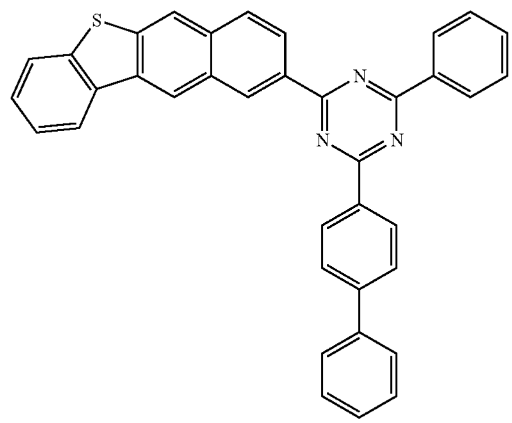

C-55
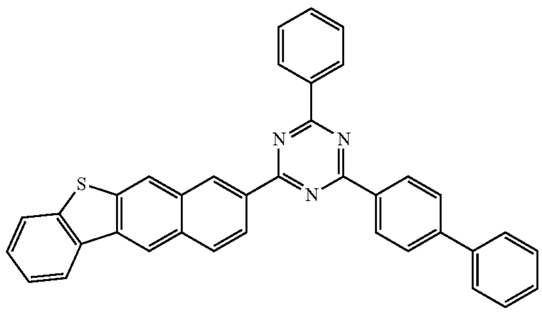
C-56
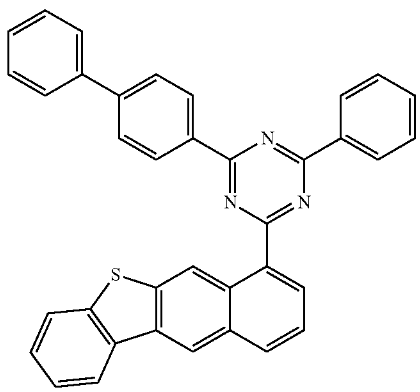
C-57
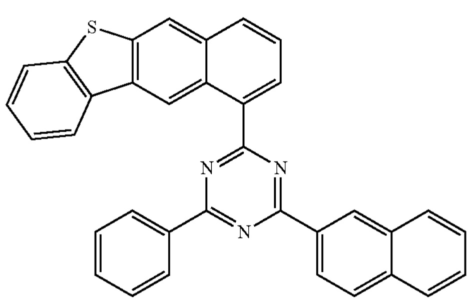
C-58
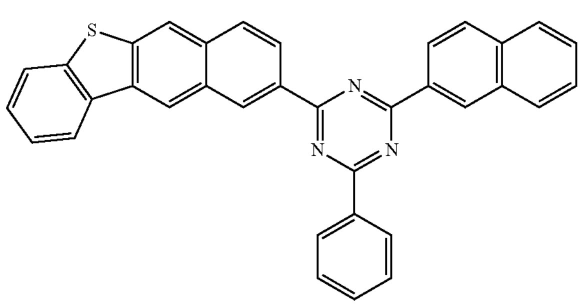
C-59
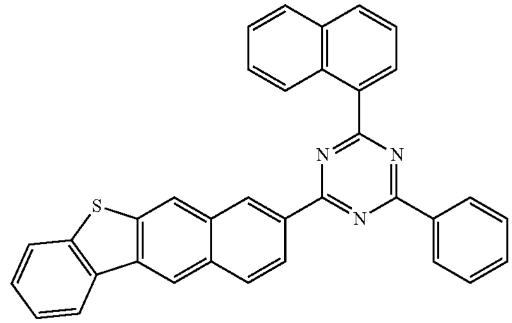
C-60
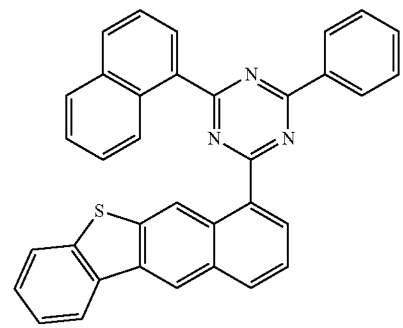
C-61
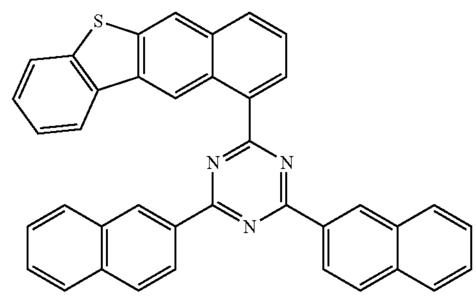
C-62
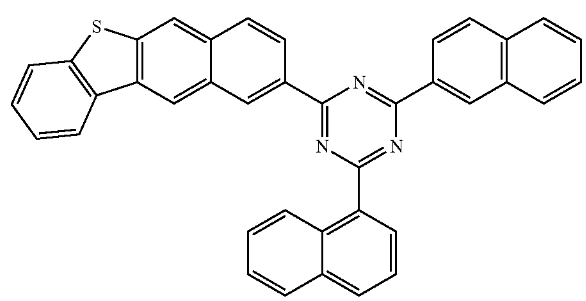
C-63
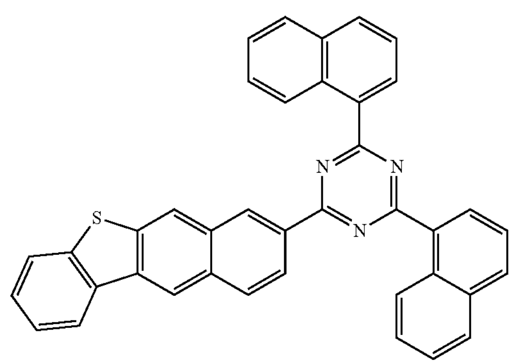

-continued
C-64
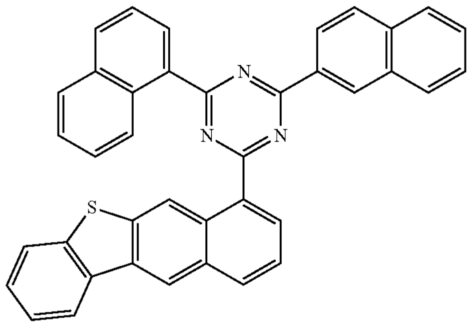
C-65
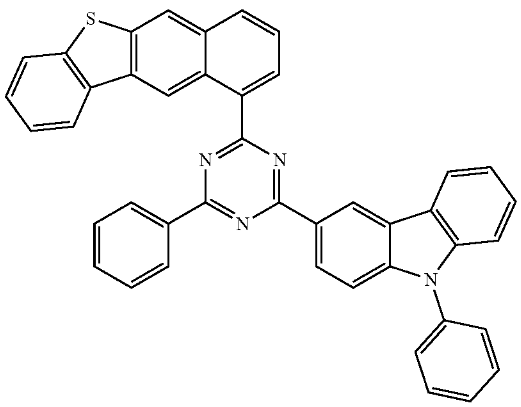
C-66
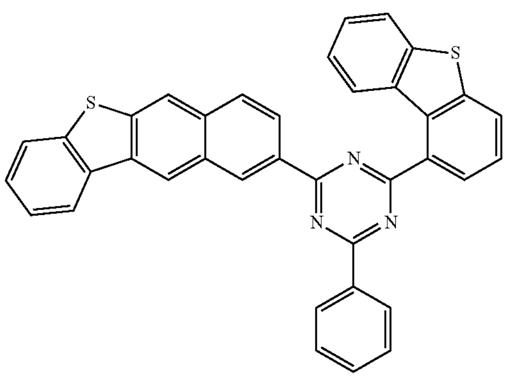
C-67
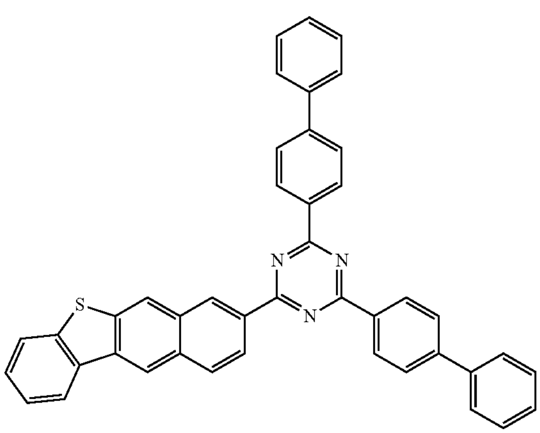
-continued
C-68
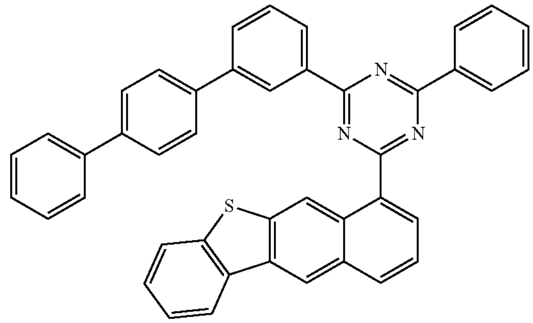
C-69
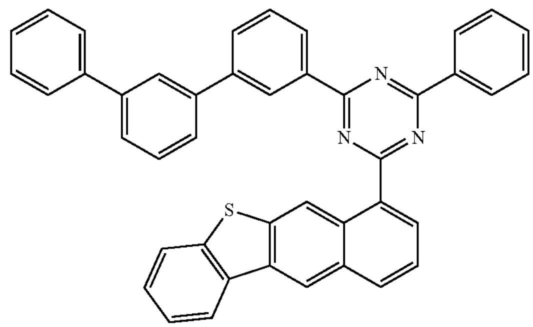
C-70
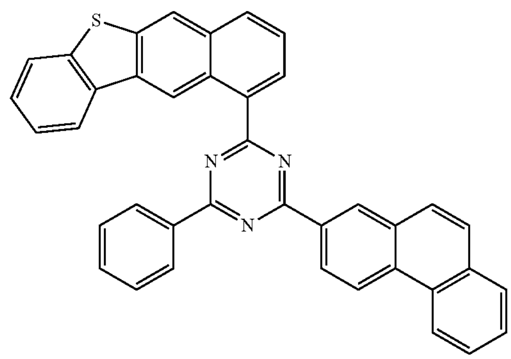
C-71
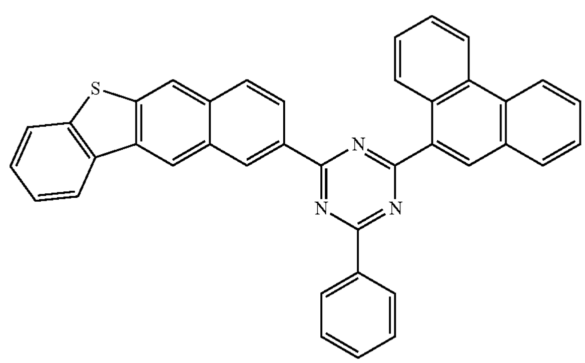

-continued
C-72
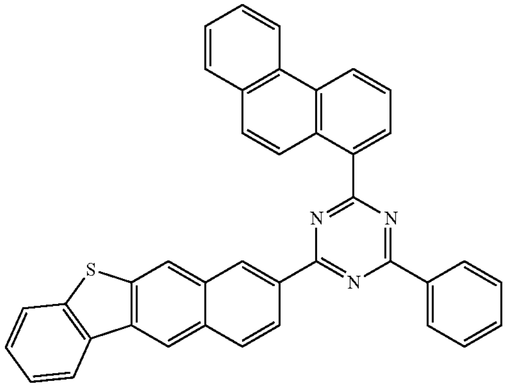
C-73
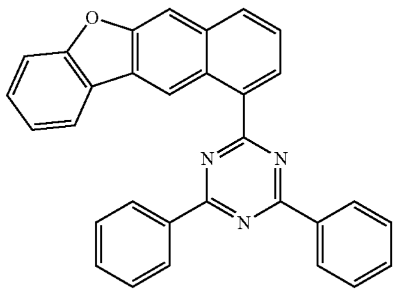
C-74
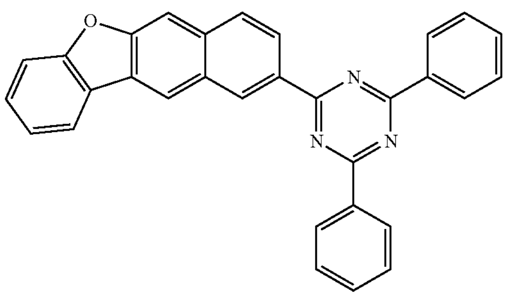
C-75
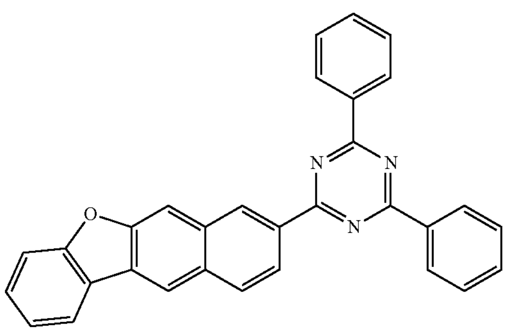
C-76
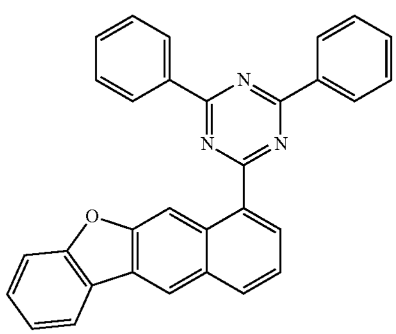
-continued
C-77
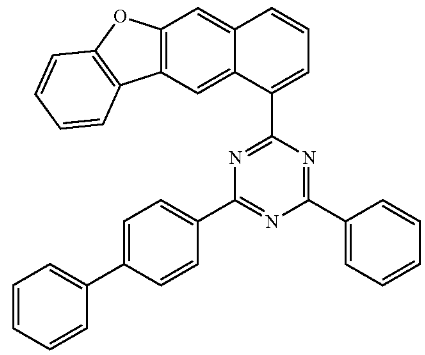
C-78
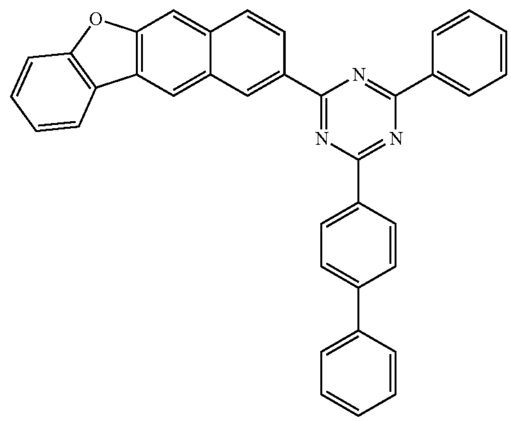
C-79
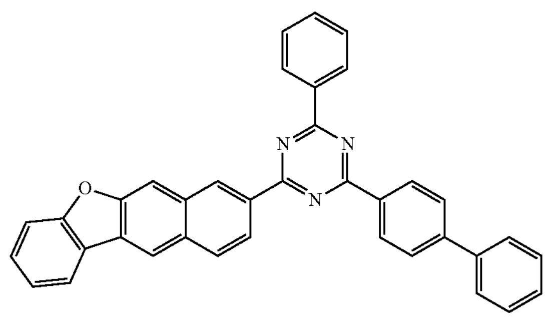
C-80
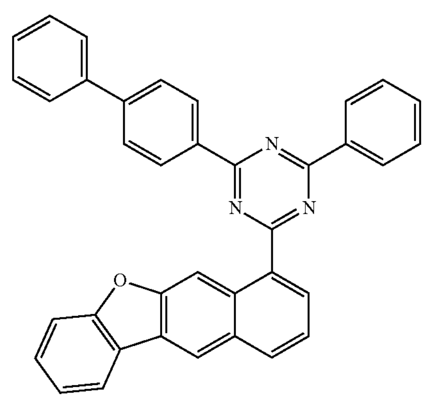

-continued
C-81
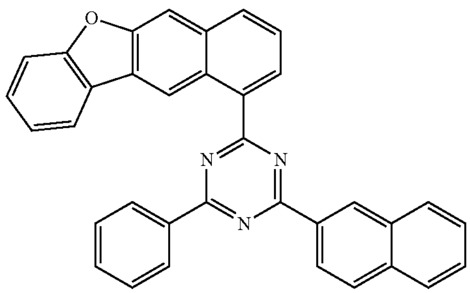
C-82
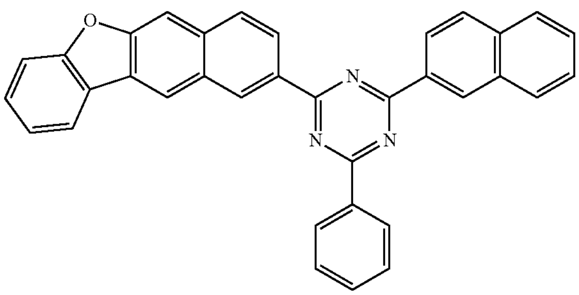
C-83
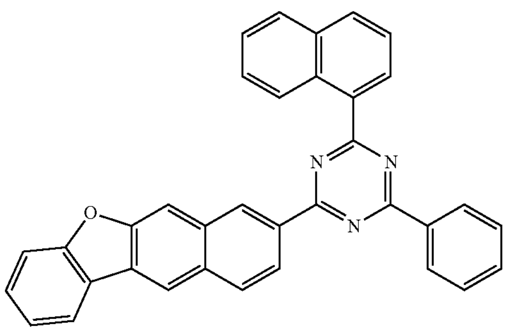
C-84
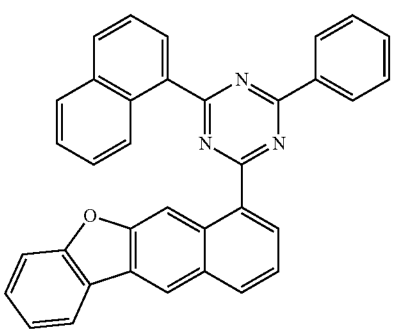
C-85
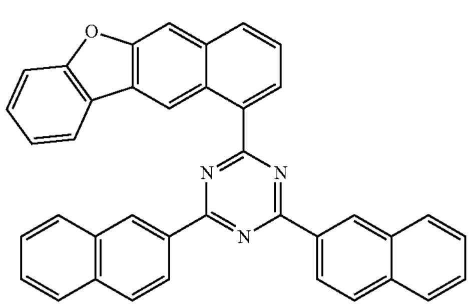
-continued
C-86
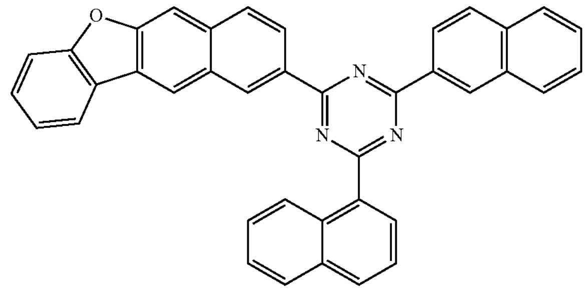
C-87
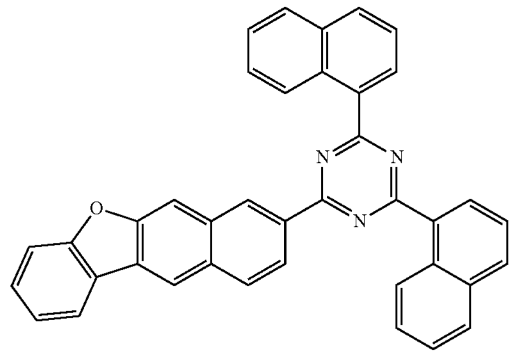
C-88
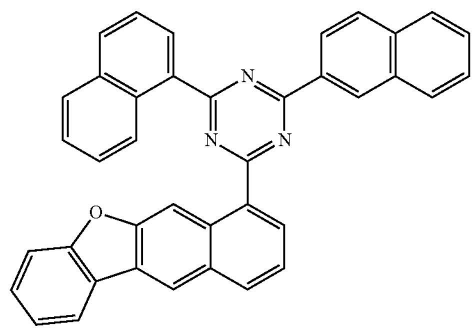
C-89
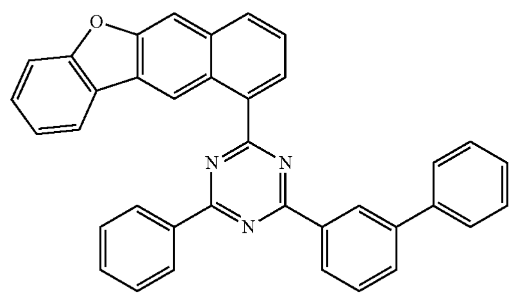
C-90
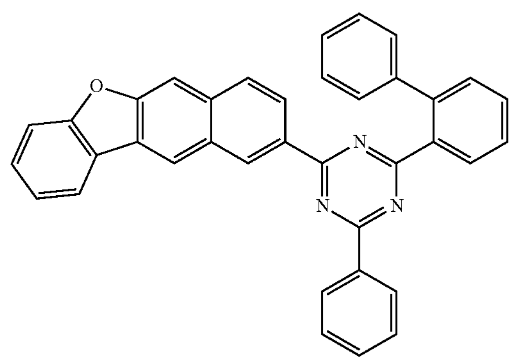

C-91
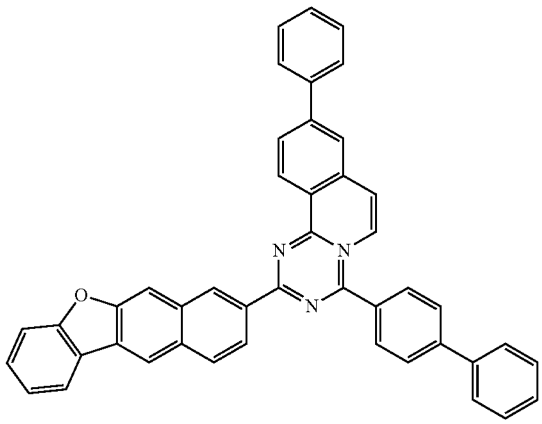
C-92
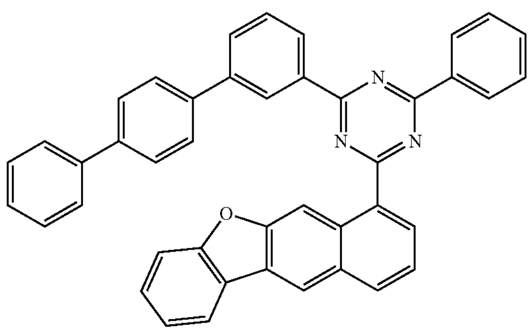
C-97
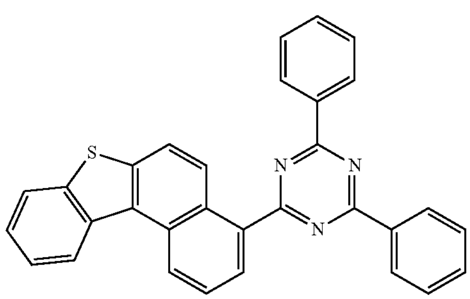
C-98
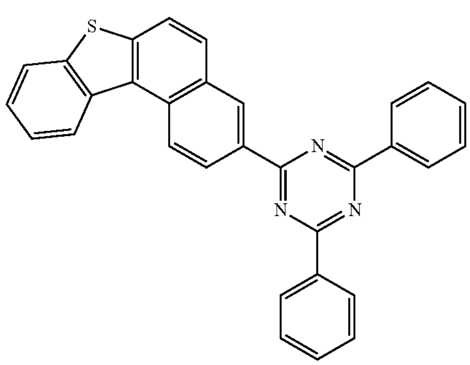
C-99
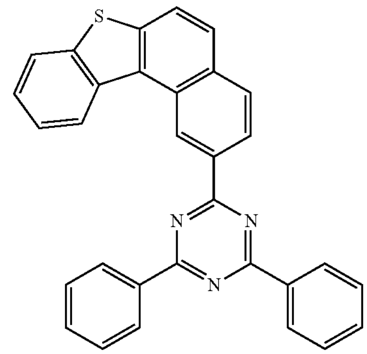
C-100
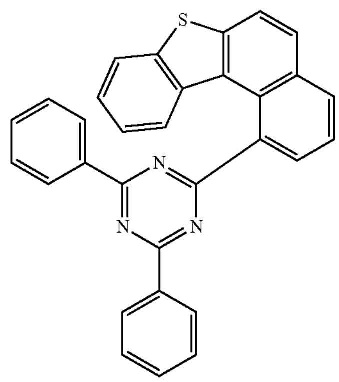
C-101
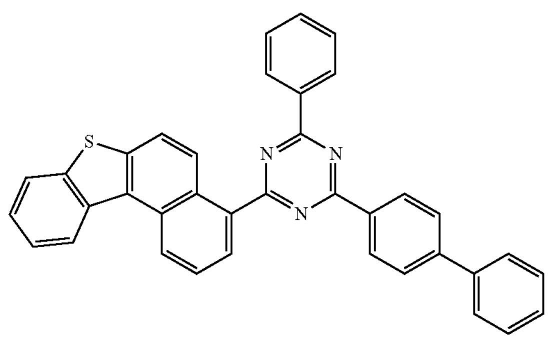
C-102
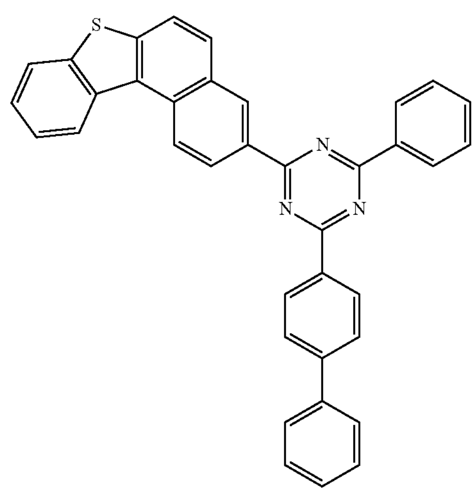

-continued
C-103
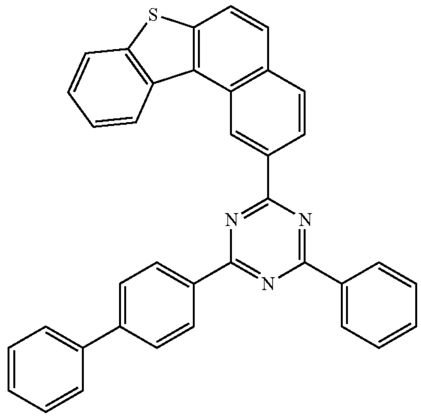
C-104
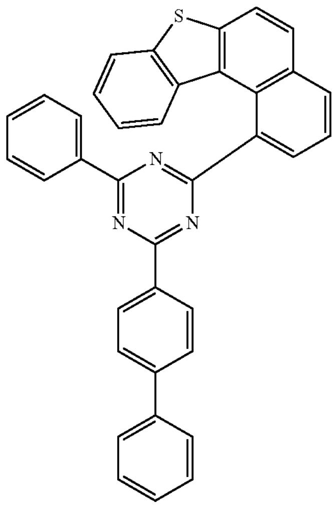
C-105
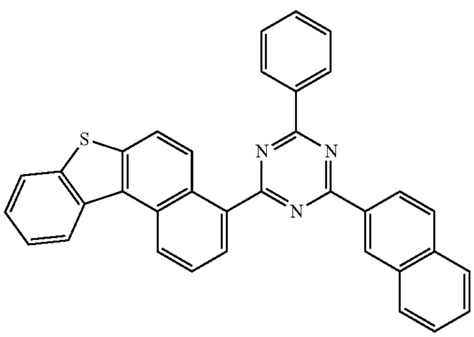
C-106
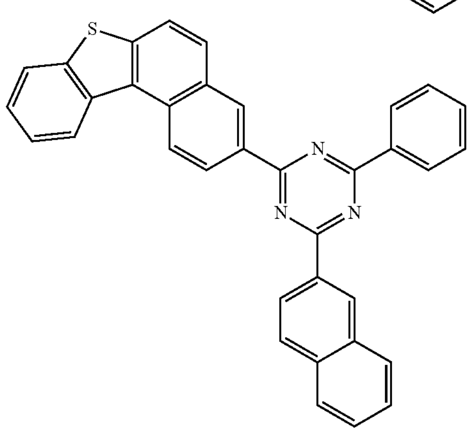
-continued
C-107
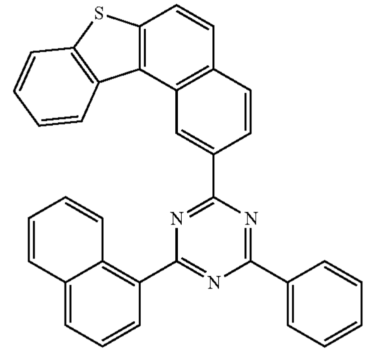
C-108
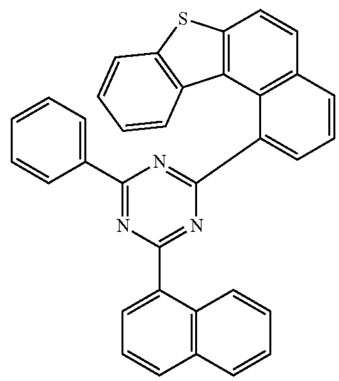
C-109
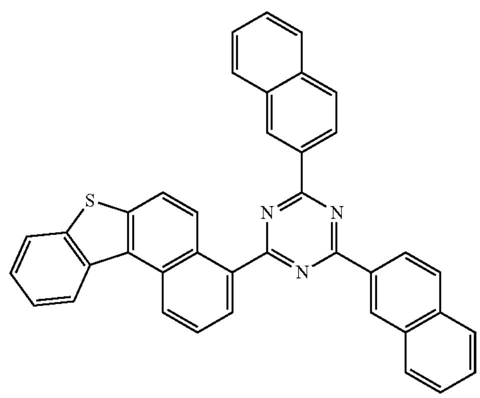
C-110
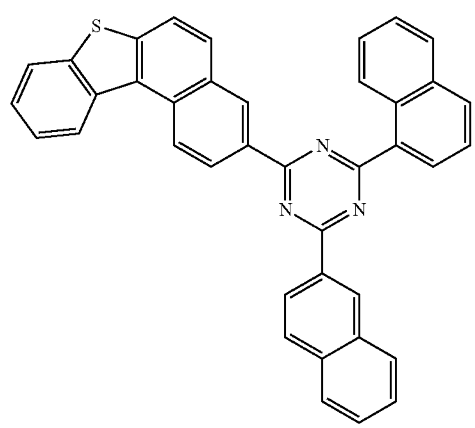

C-111
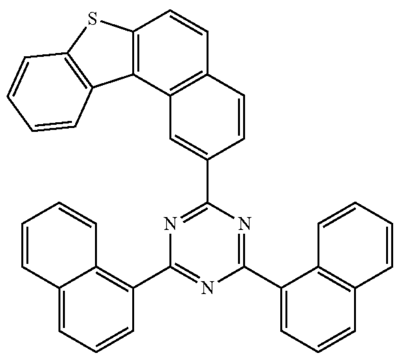
C-112
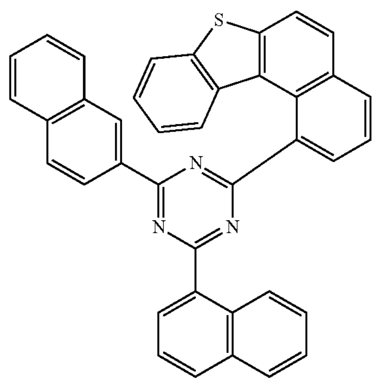
C-113
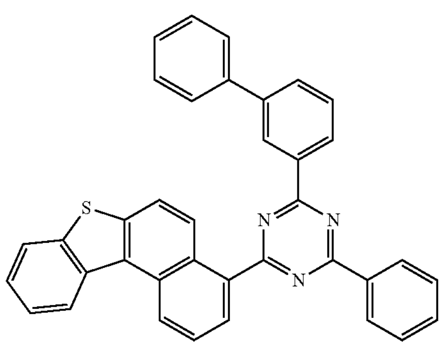
C-114
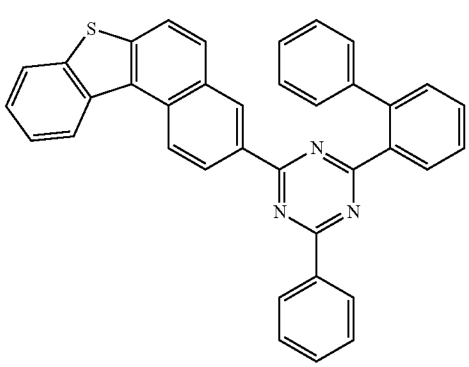
C-115
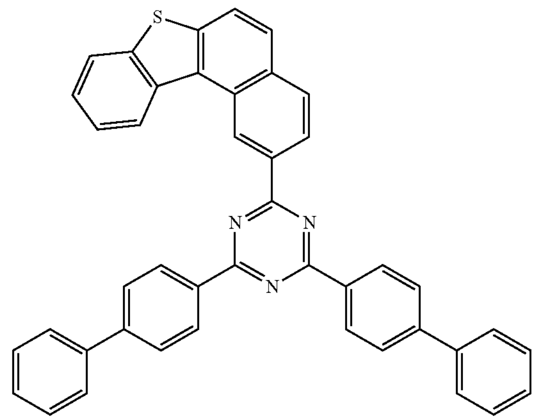
C-116
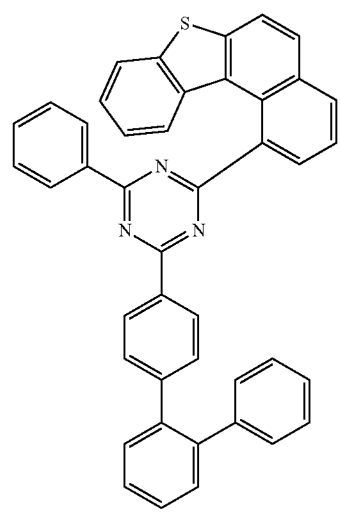
C-117
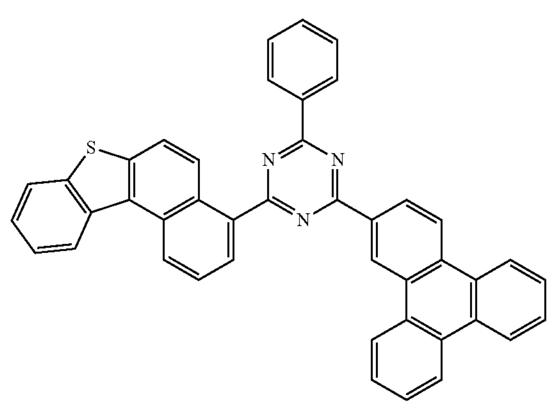

C-118
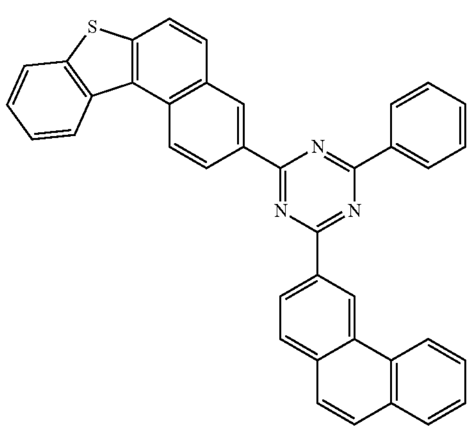
C-119
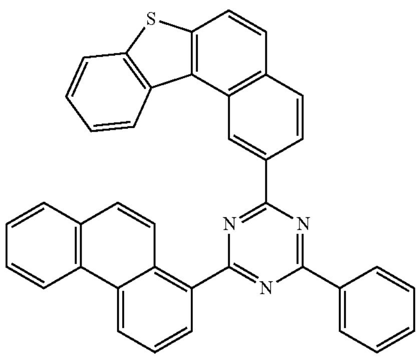
C-120
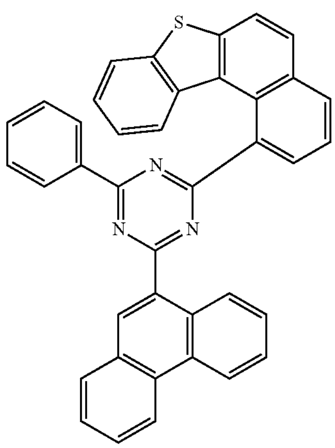
C-121
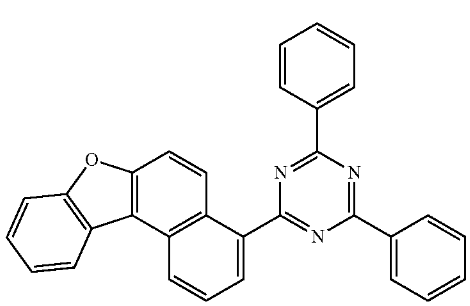
C-122
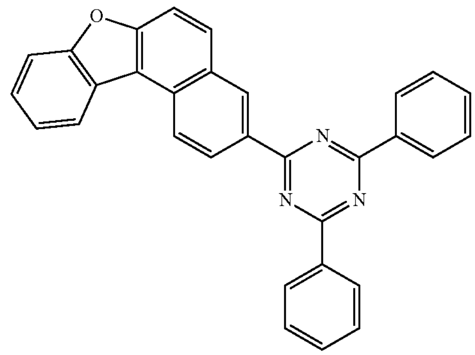
C-123
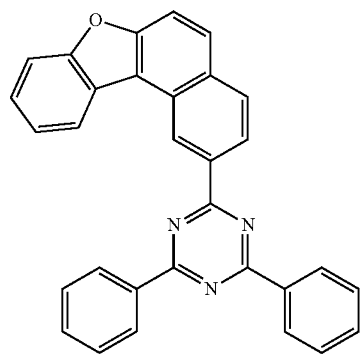
C-124
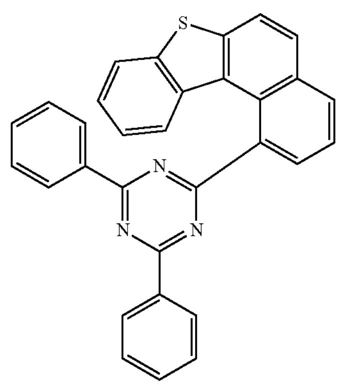
C-125
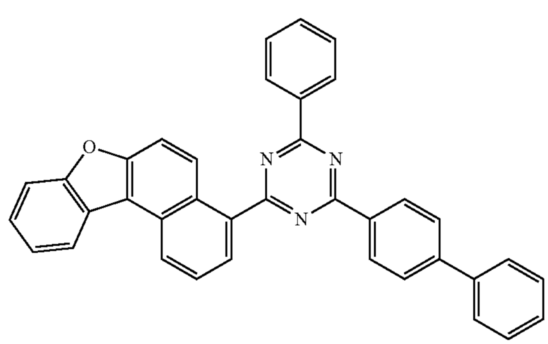

C-126
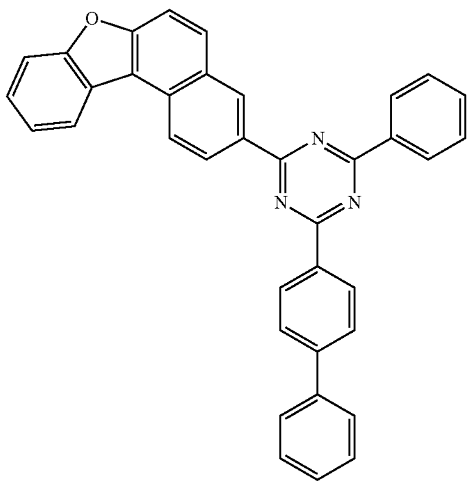
C-127
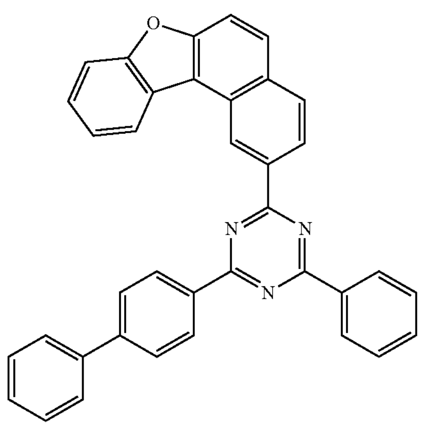
C-128
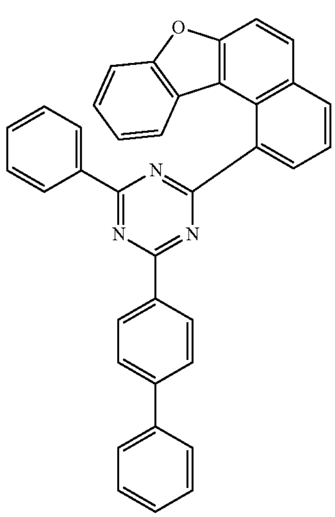
C-129
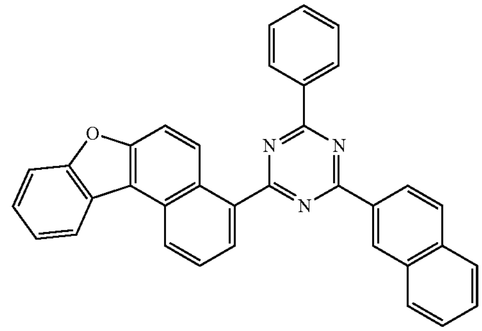
C-130
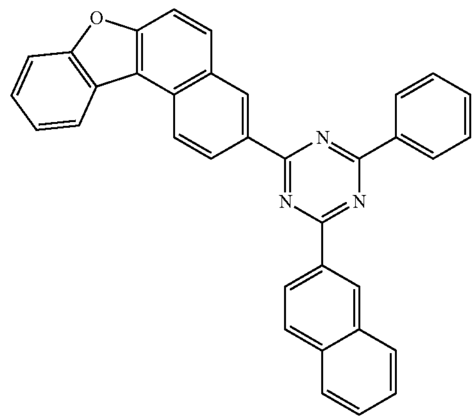
C-131
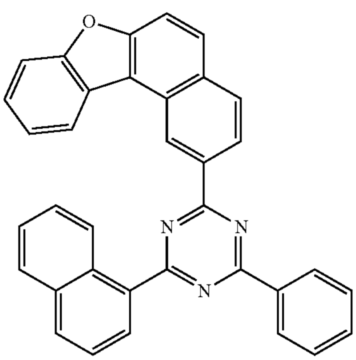
C-132
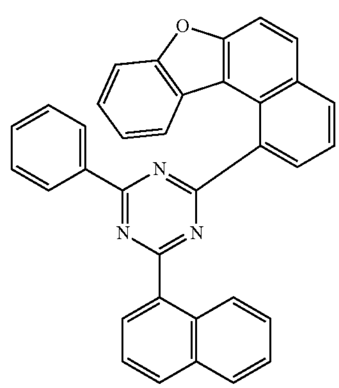

C-133
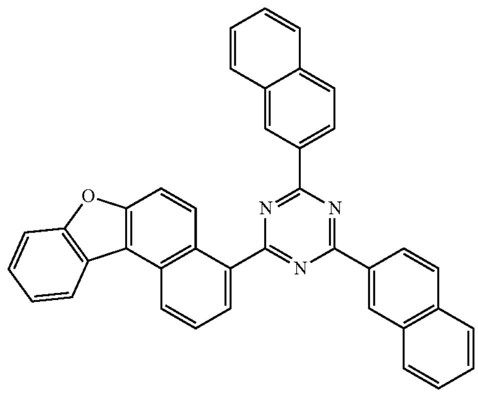
C-134
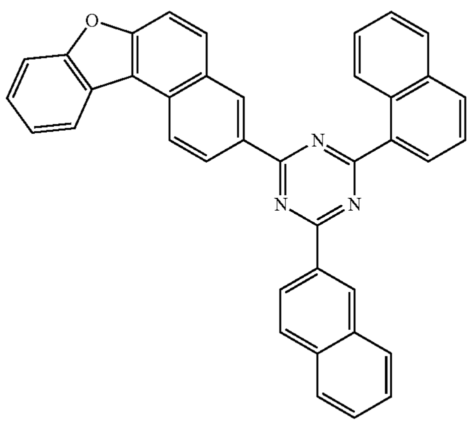
C-135
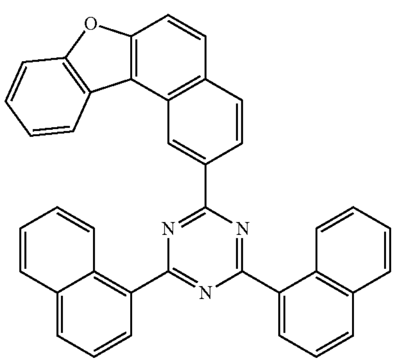
C-136
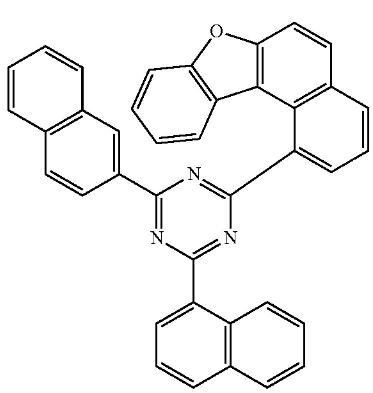
C-137
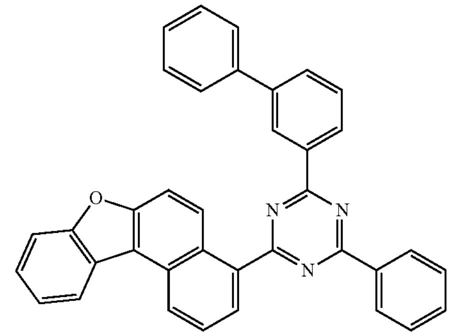
C-138
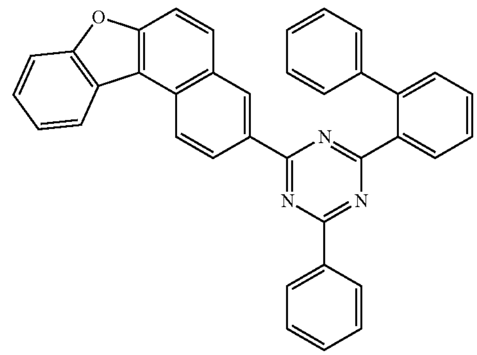
C-139
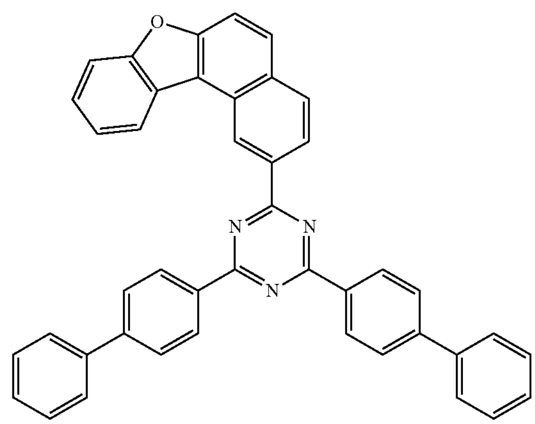
C-140
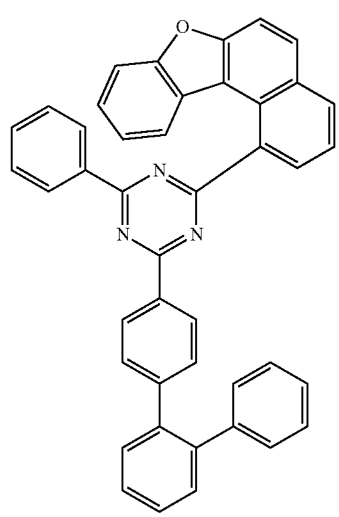

-continued
C-141
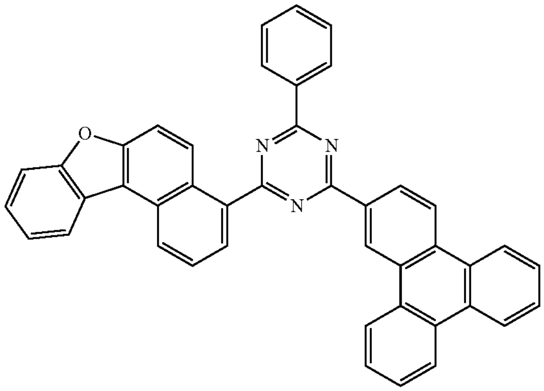
C-142
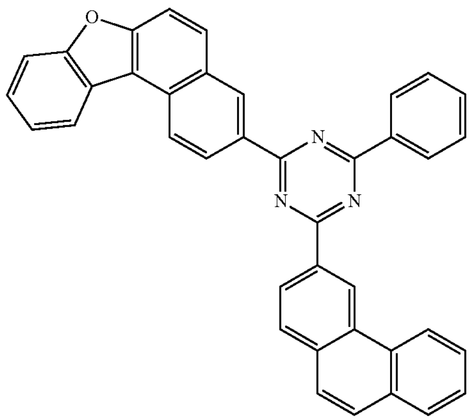
C-143
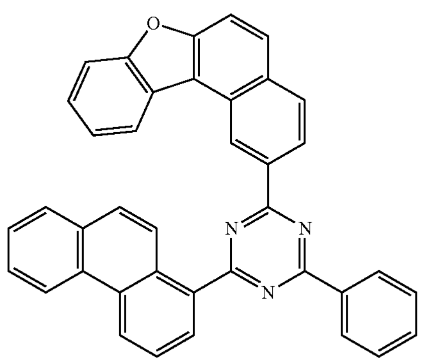
C-144
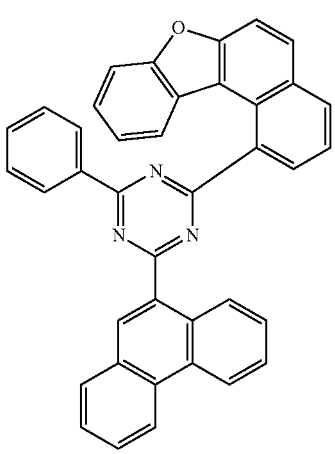
-continued
C-145
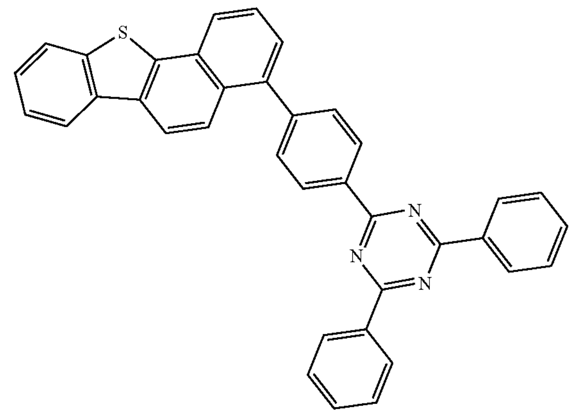
C-146
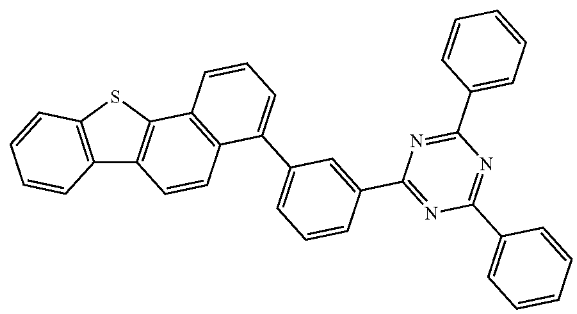
C-147
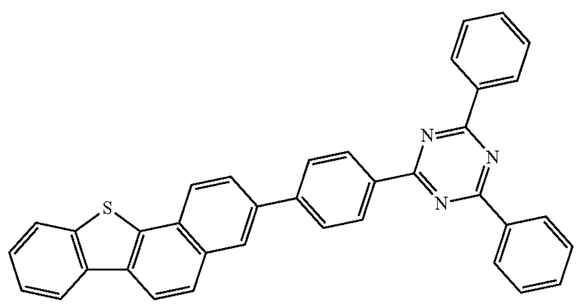
C-148
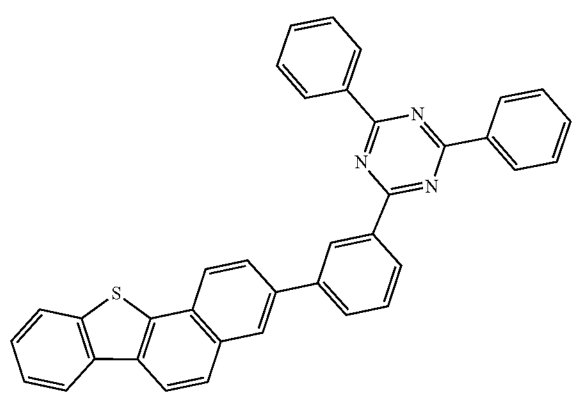

-continued
C-149
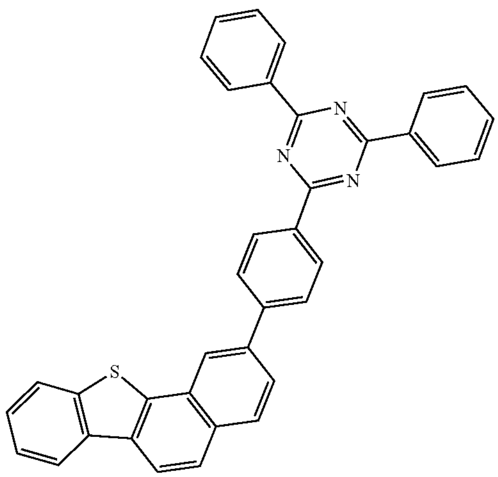
C-150
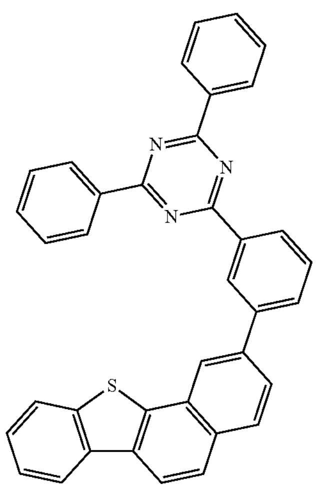
C-151
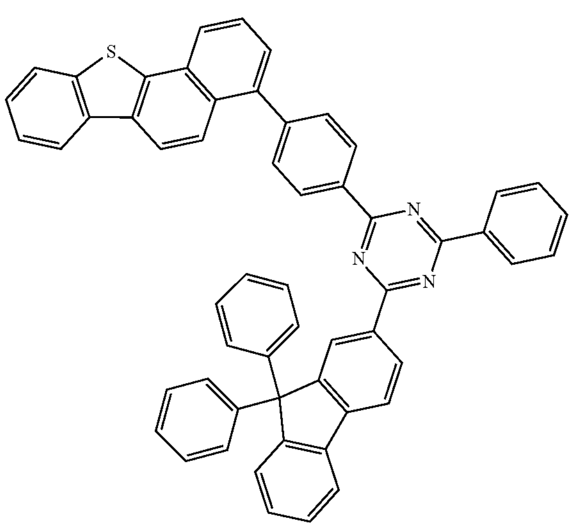
-continued
C-152
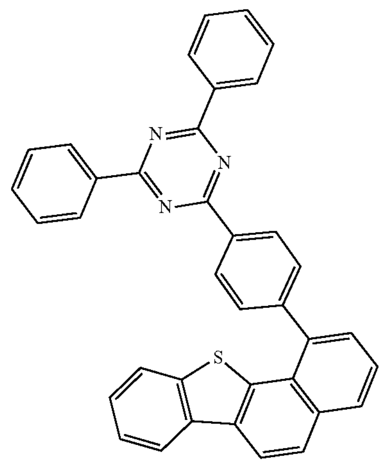
C-153
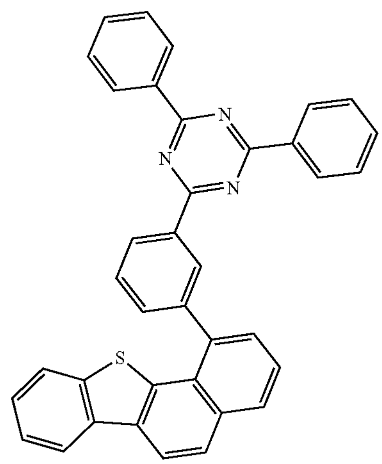
C-154
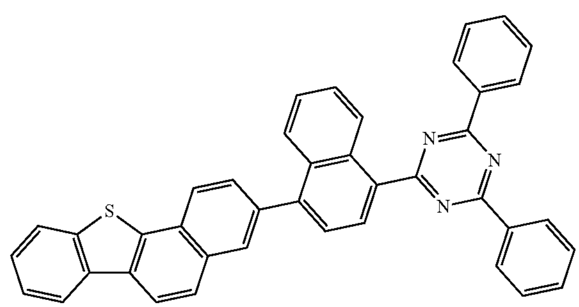

-continued
C-155
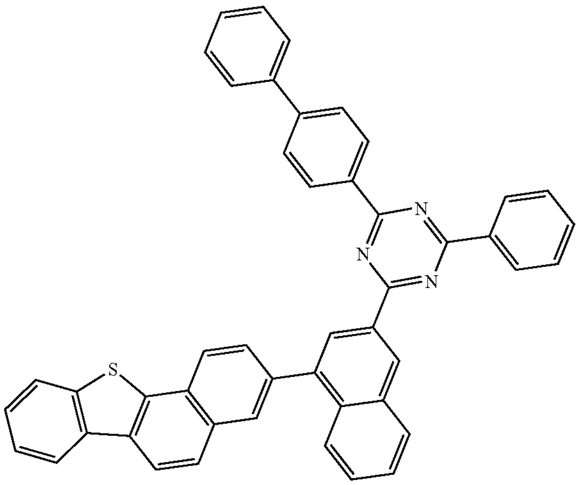
C-156
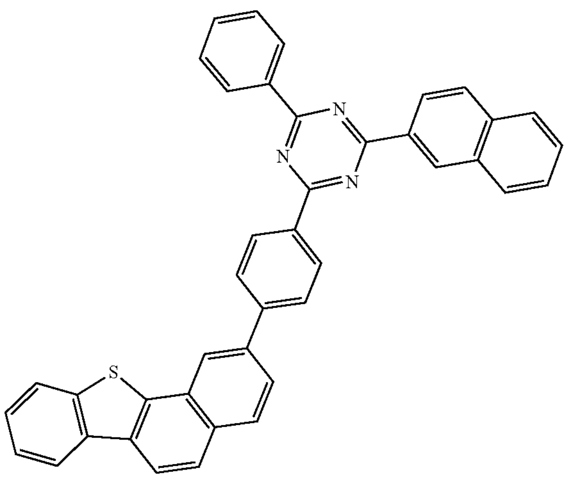
C-157
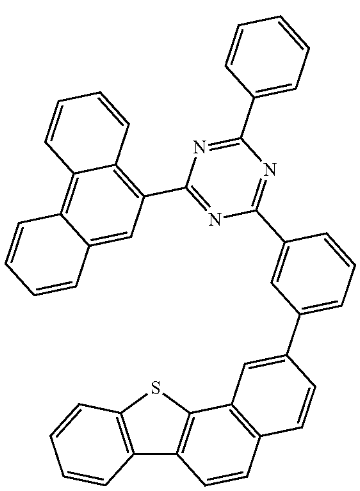
-continued
C-158
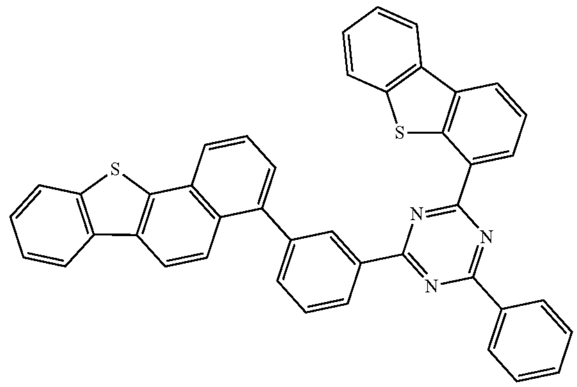
C-159
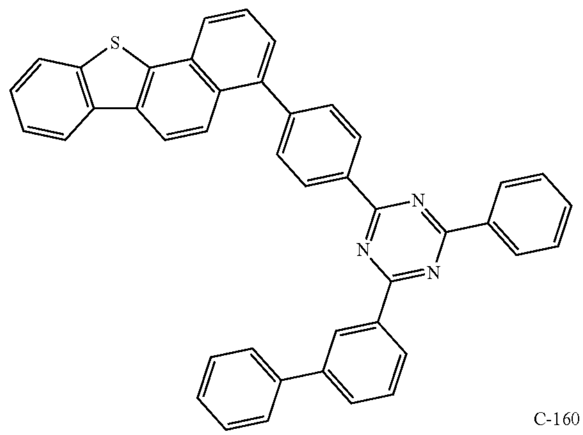
C-160
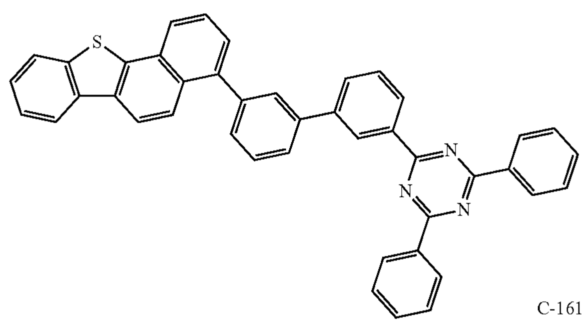
C-161
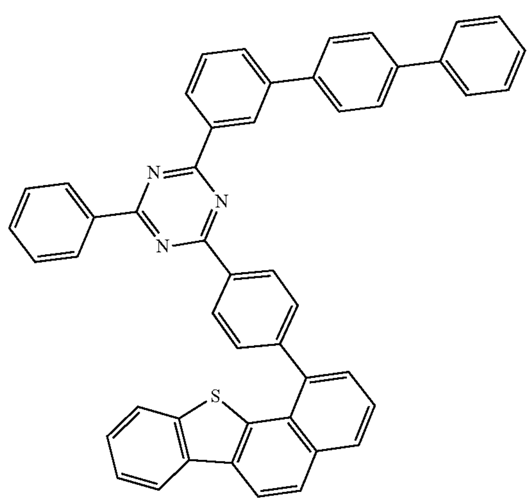

C-162
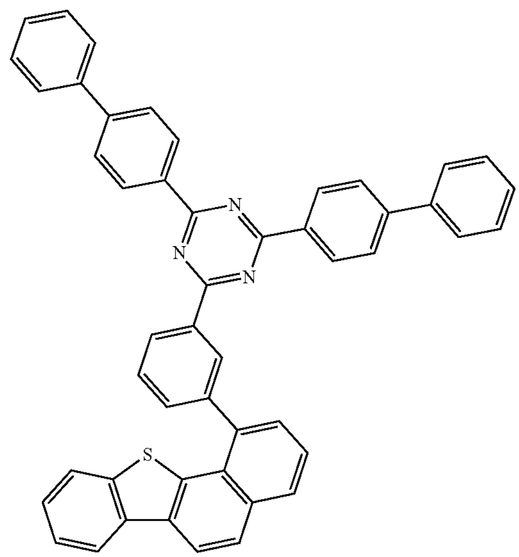
C-163
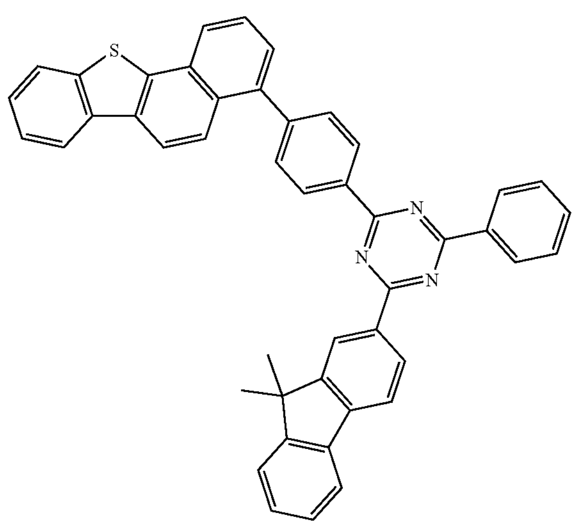
C-164
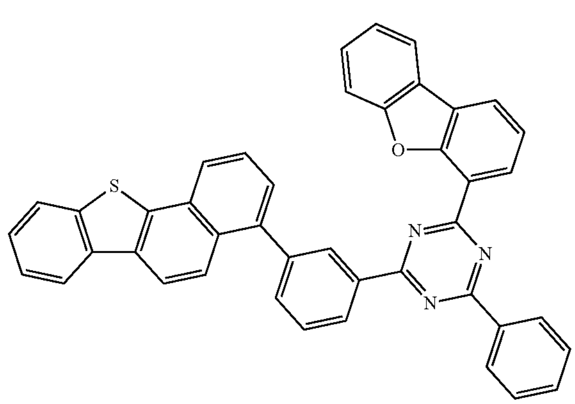
C-165
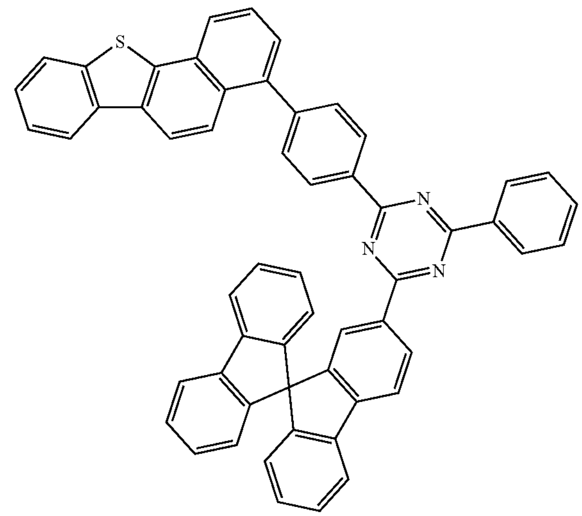
C-166
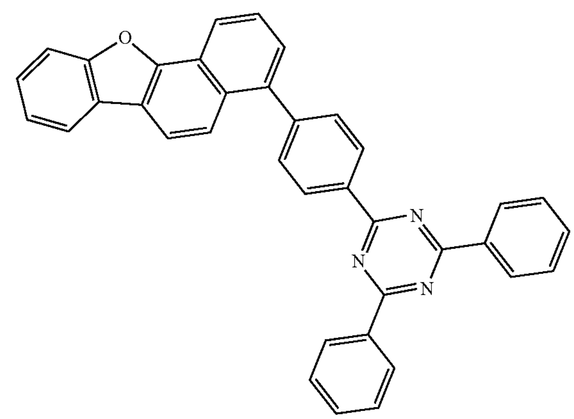
C-167
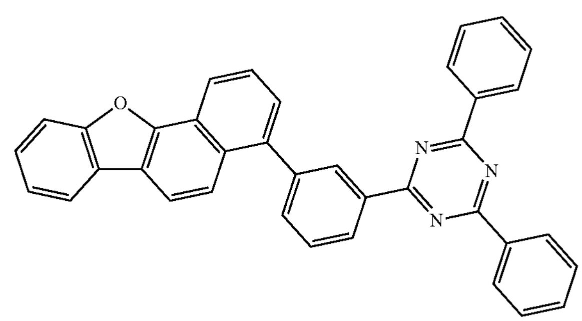
C-168
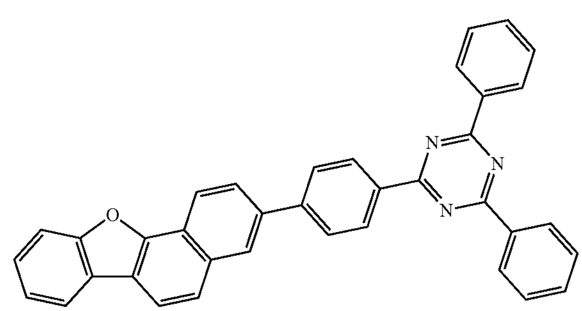

-continued
C-169
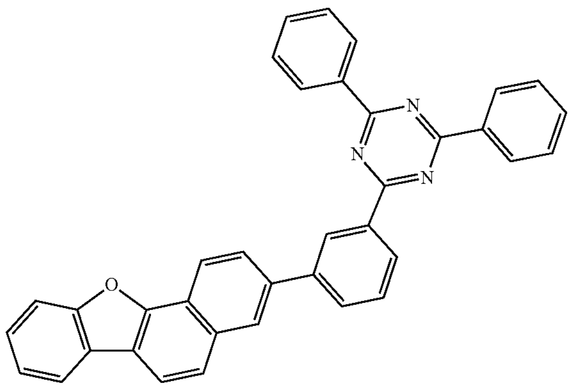
C-170
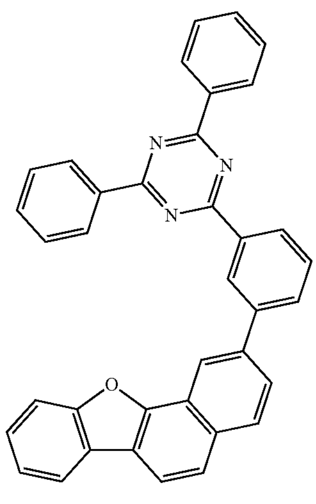
C-171
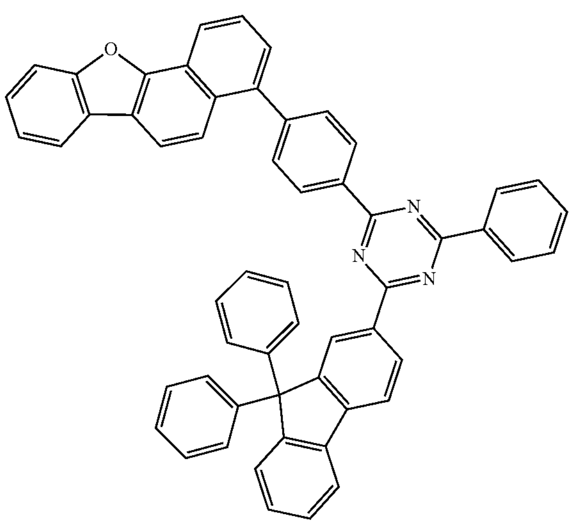
-continued
C-172
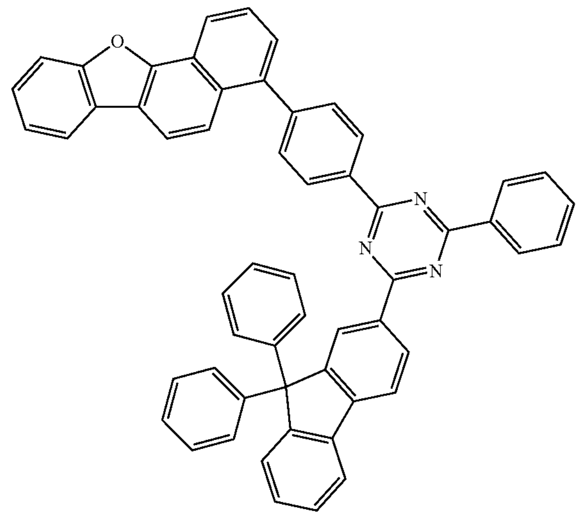
C-173
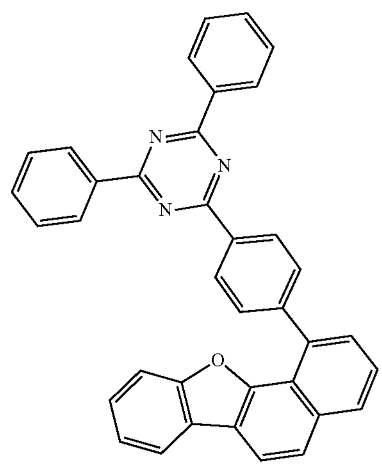
C-174
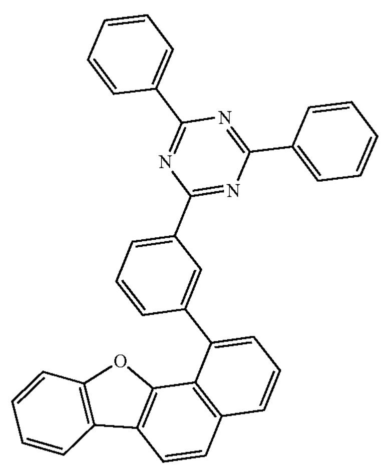

-continued
C-175
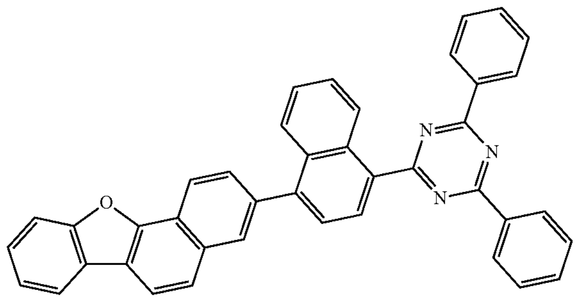
C-176
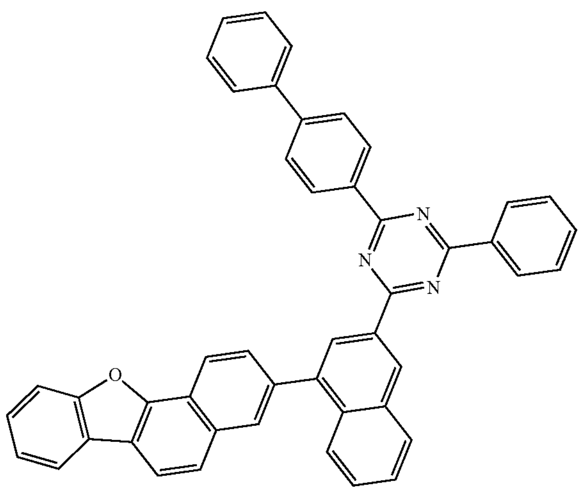
C-177
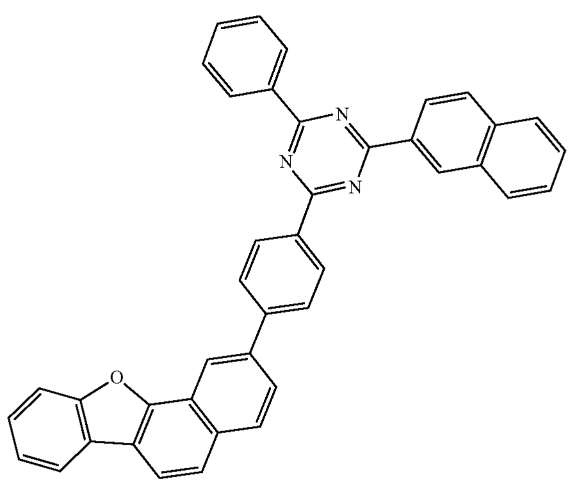
-continued
C-178
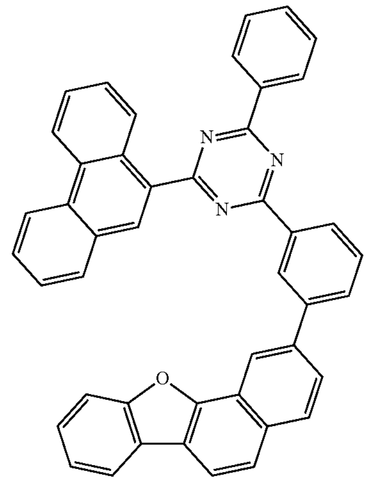
C-179
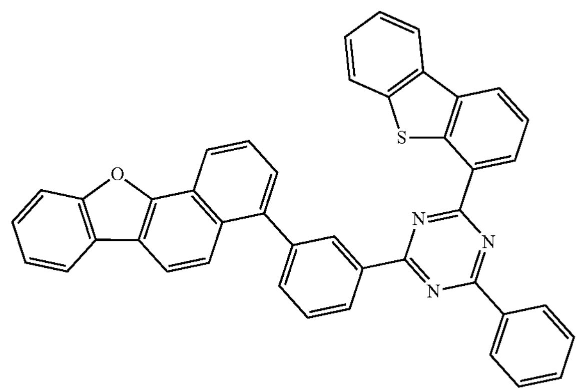
C-180
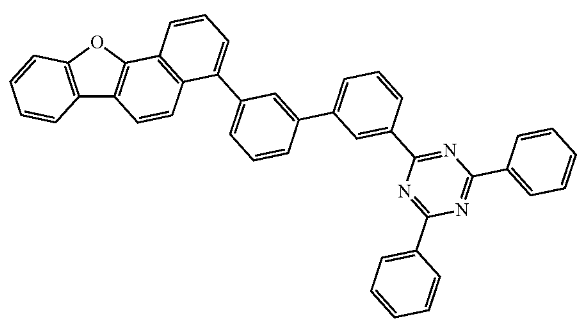
C-181
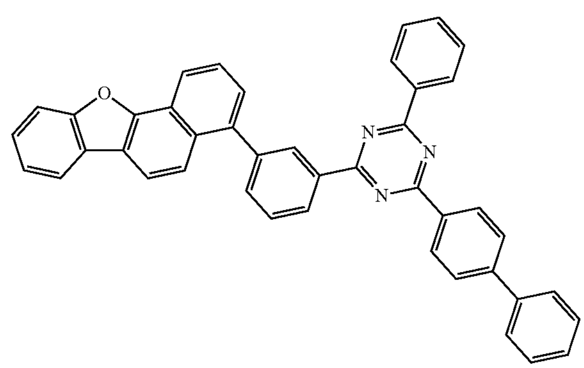

-continued
C-182
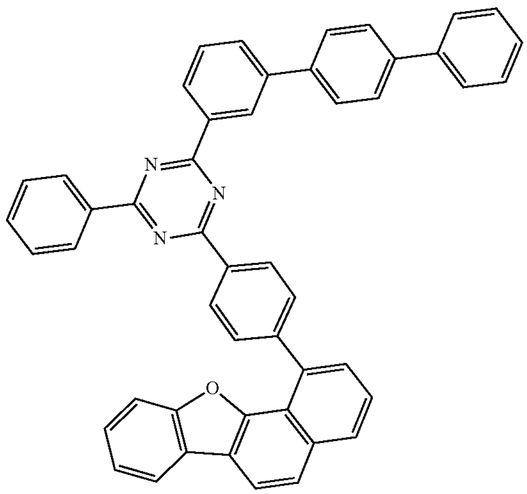
C-183
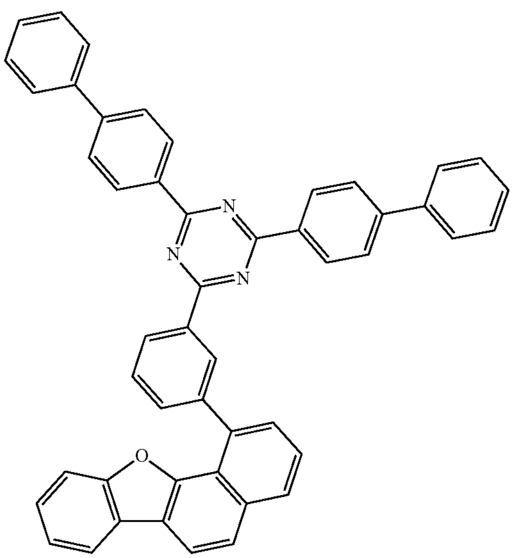
C-184
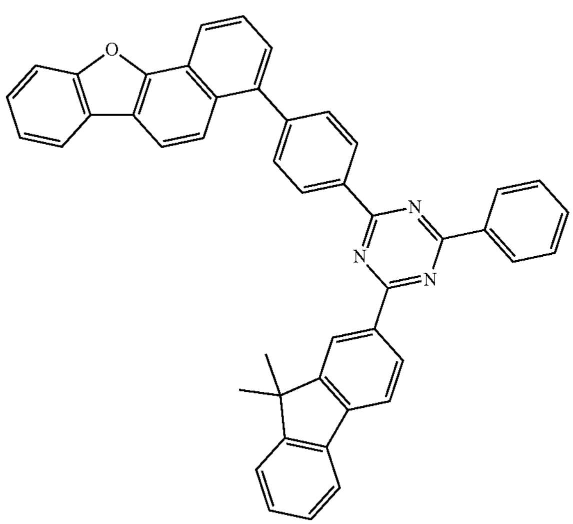
-continued
C-185
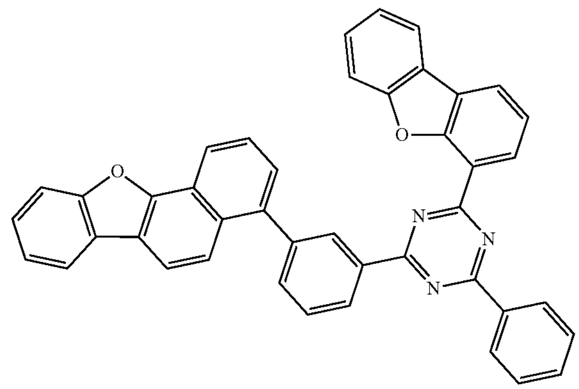
C-186
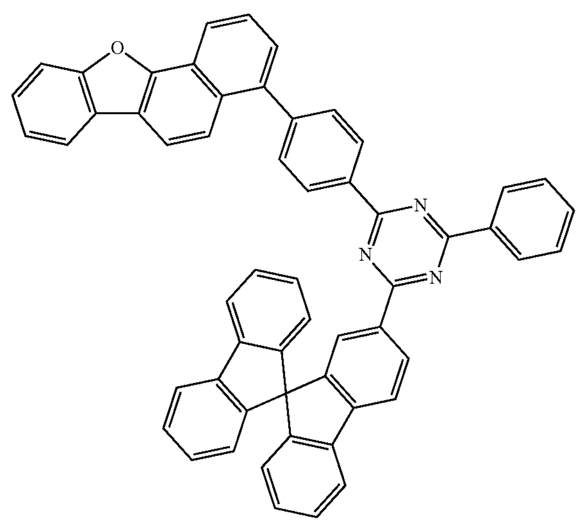
C-187
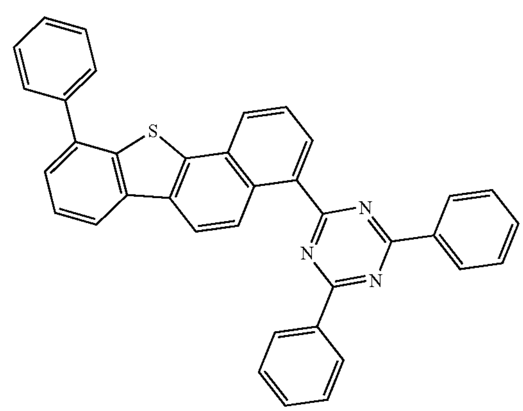

-continued
C-188
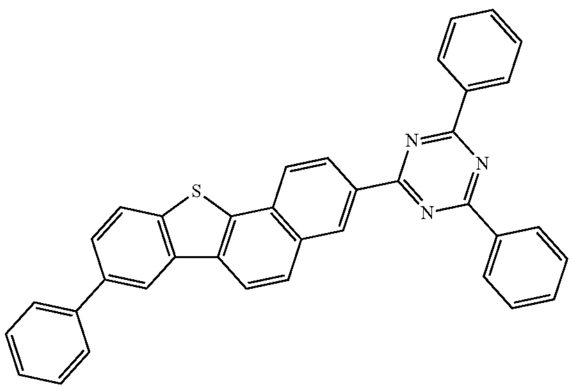
C-189
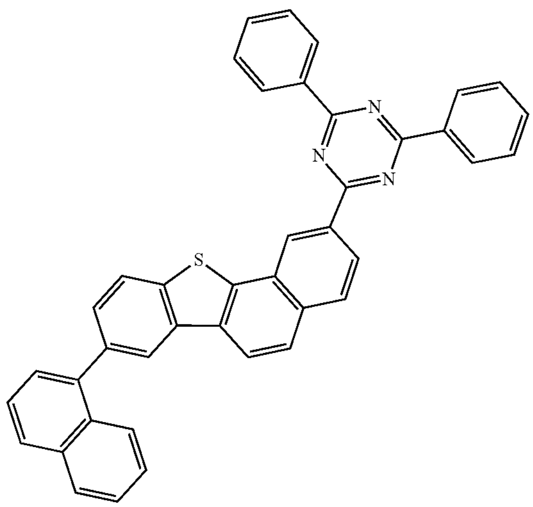
C-190
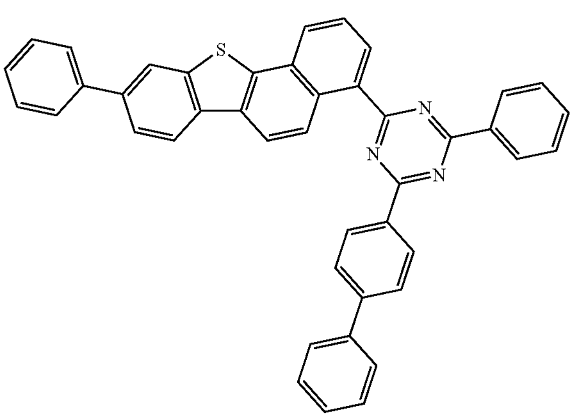
-continued
C-191
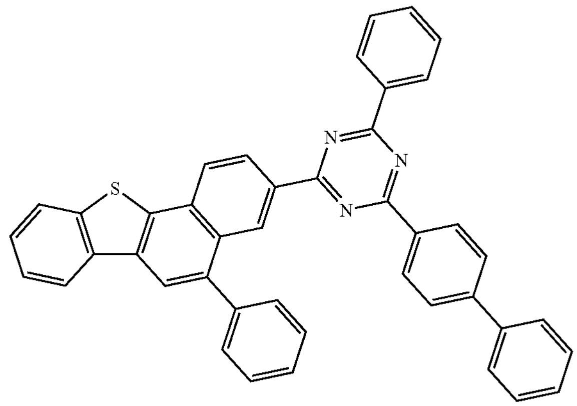
C-192
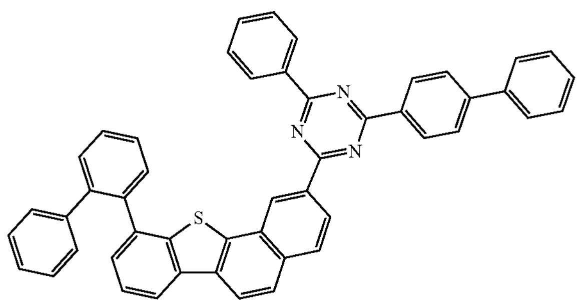
C-193
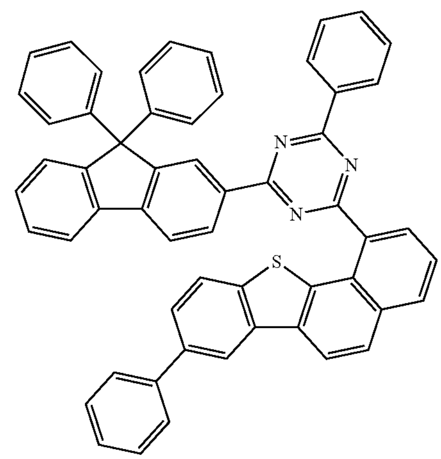
C-194
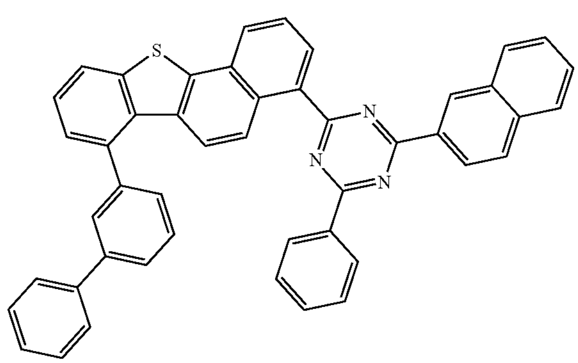

C-195
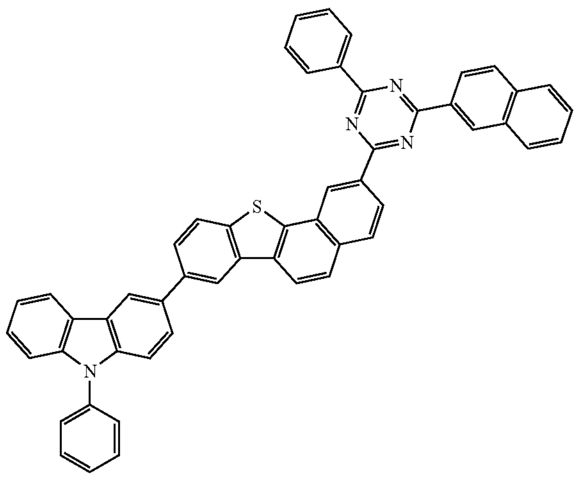
C-196
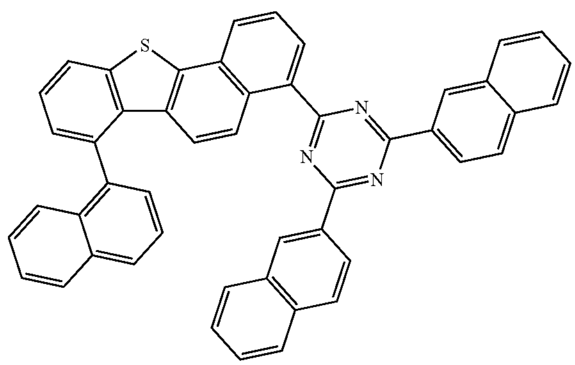
C-197
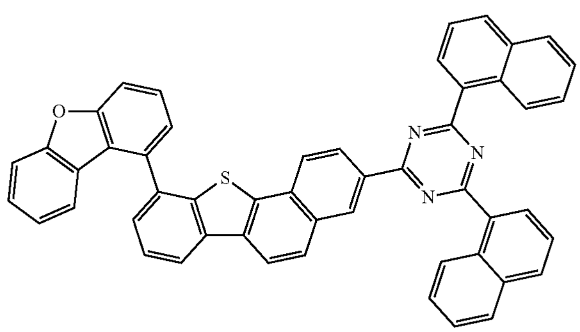
C-198
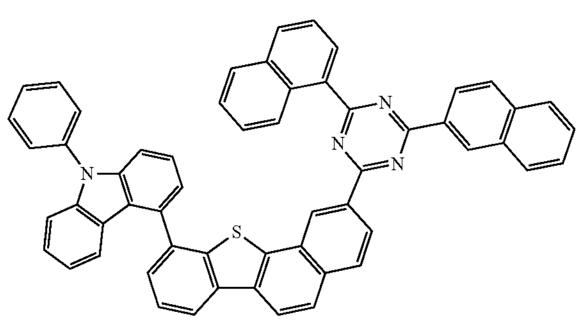
C-199
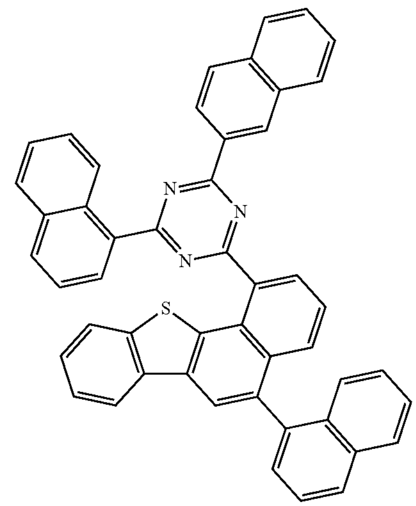
C-200
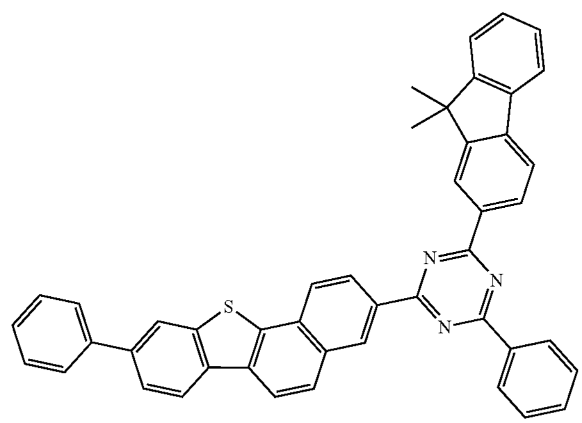
C-201
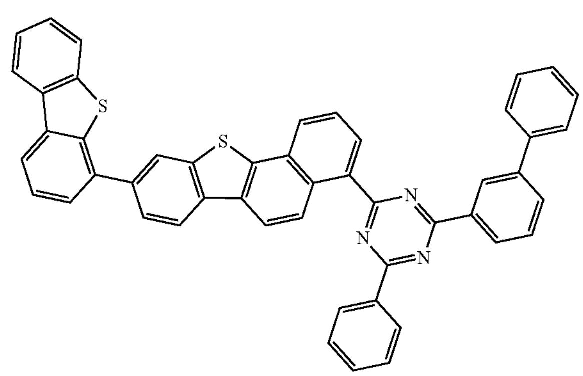

-continued
C-202
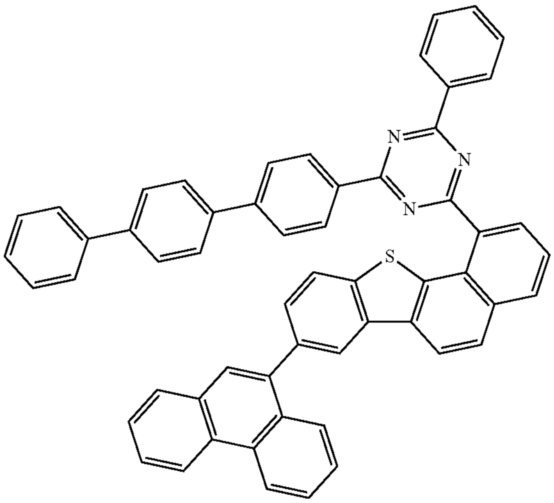
C-203
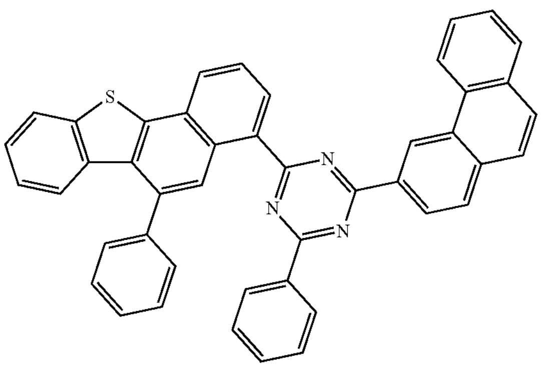
C-204
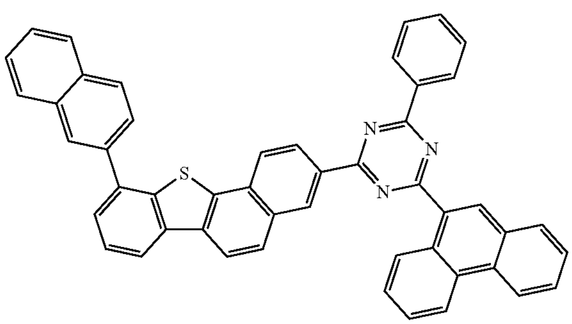
C-205
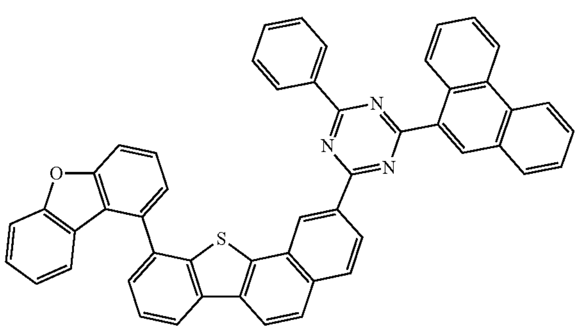
-continued
C-206
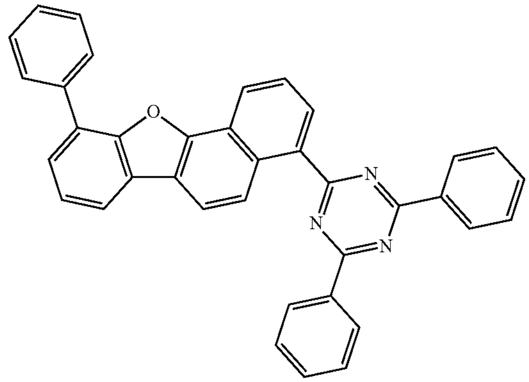
C-207
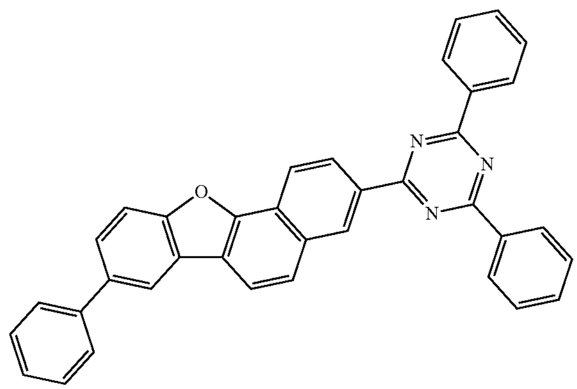
C-208
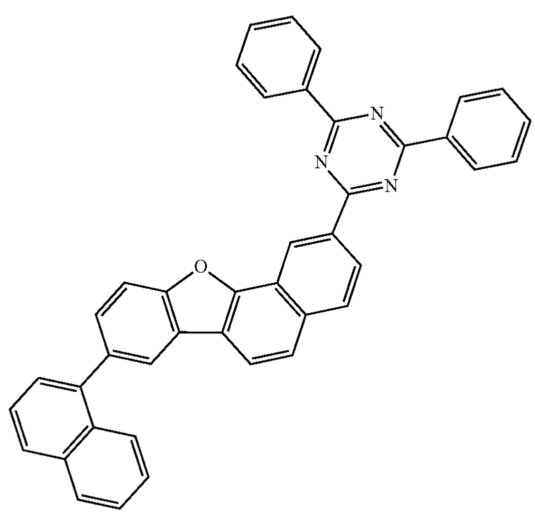

-continued
C-209
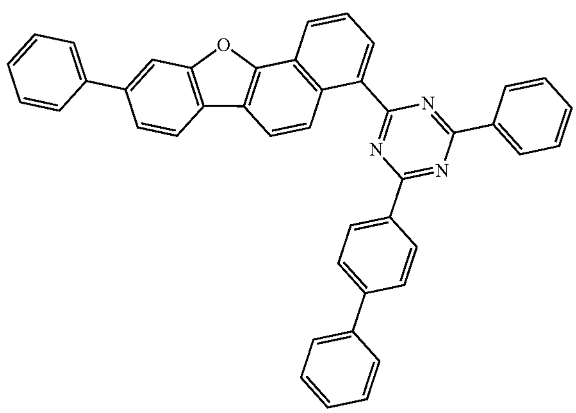
C-210
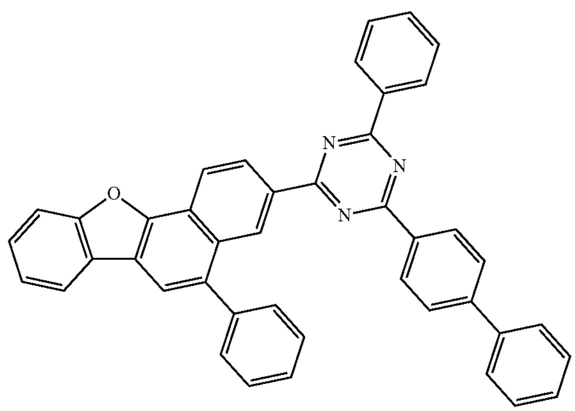
C-211
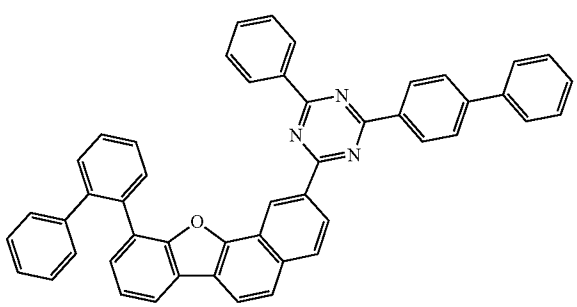
C-212
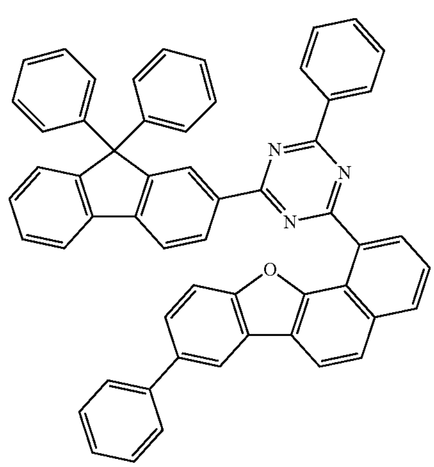
-continued
C-213
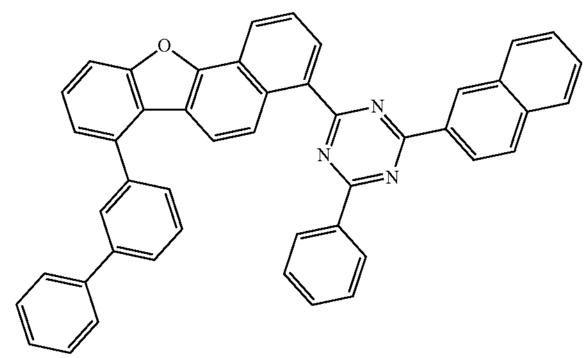
C-214
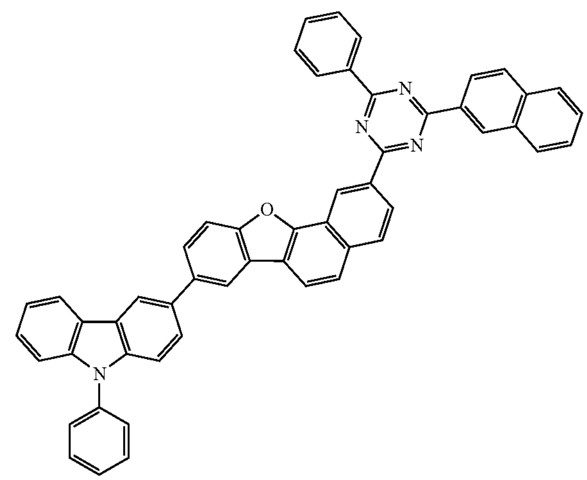
C-215
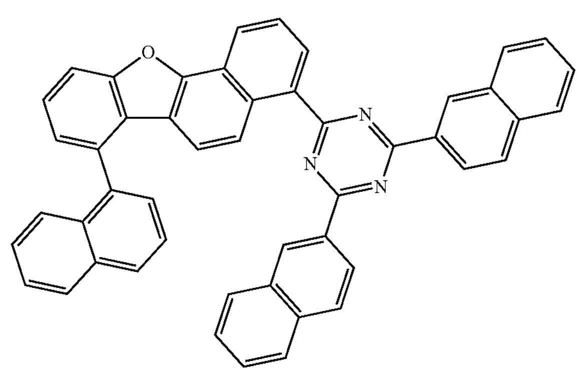
C-216
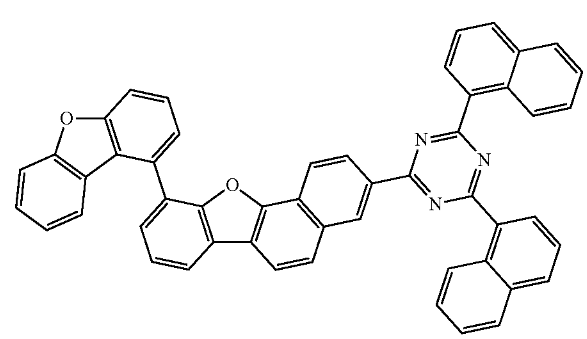

C-217
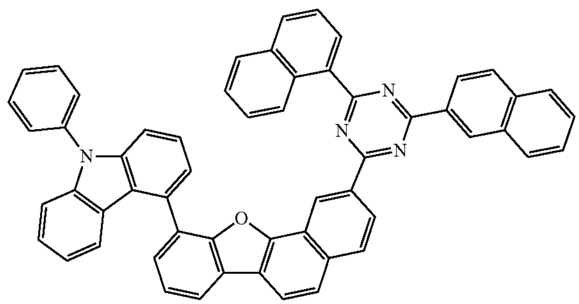
C-218
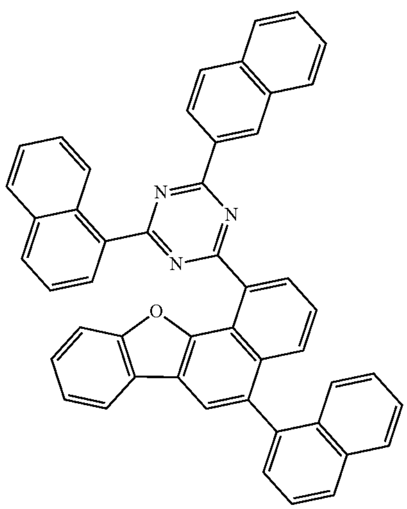
C-219
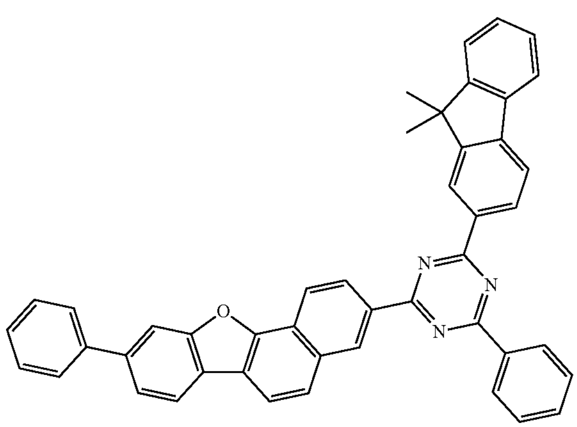
C-220
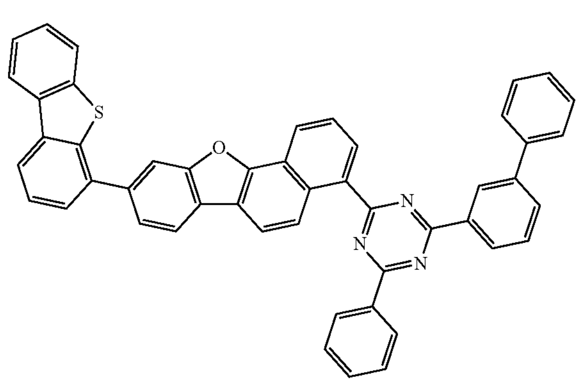
C-221
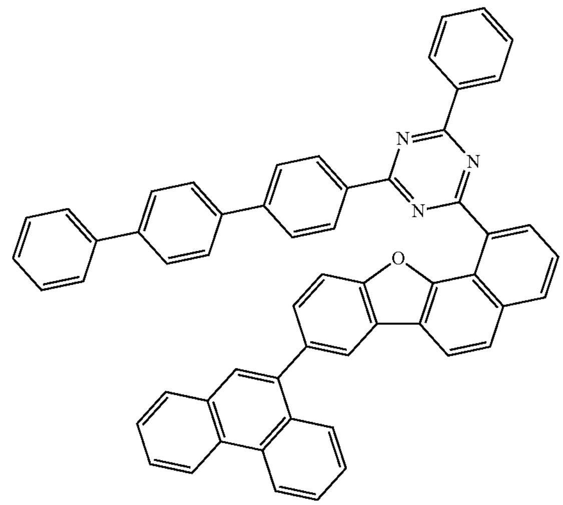
C-222
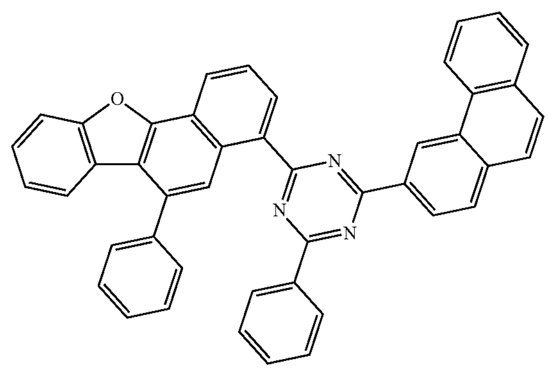
C-223
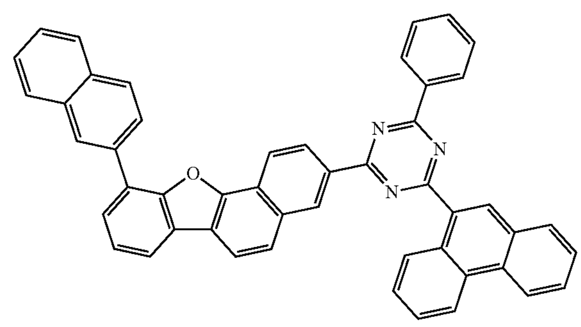
C-224
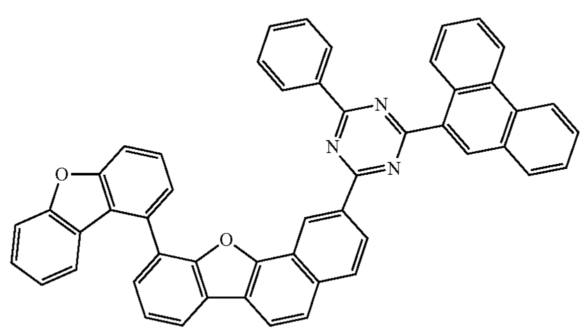

C-225
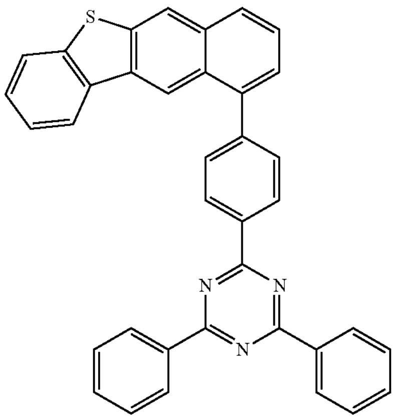
C-226
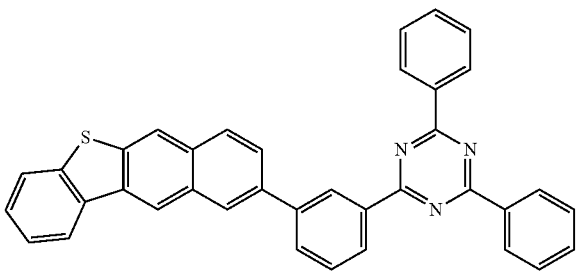
C-227
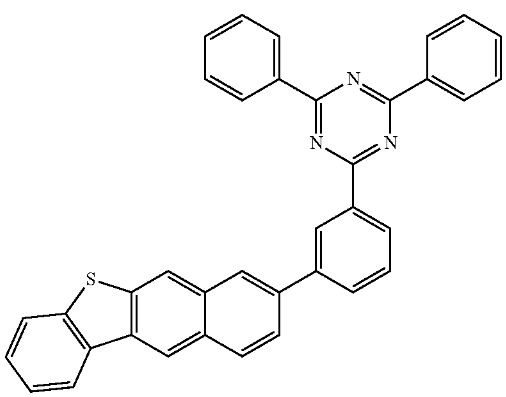
C-228
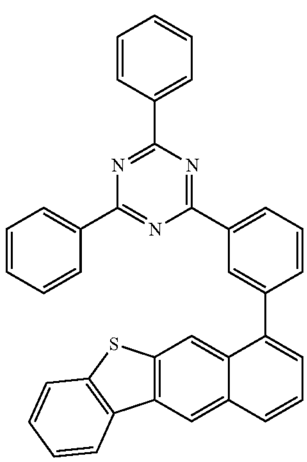
C-229
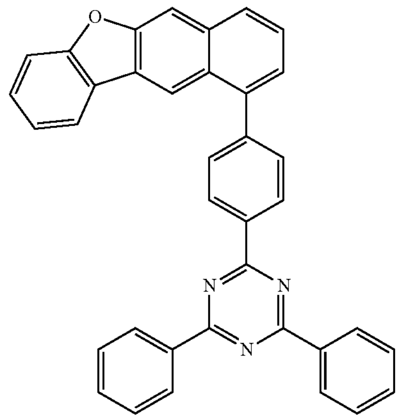
C-230
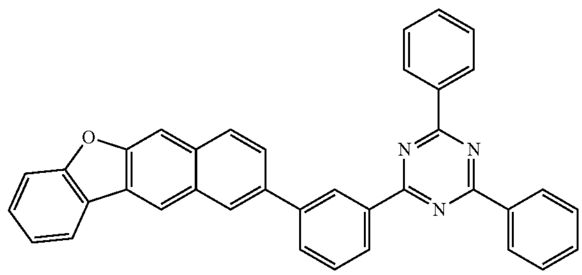
C-231
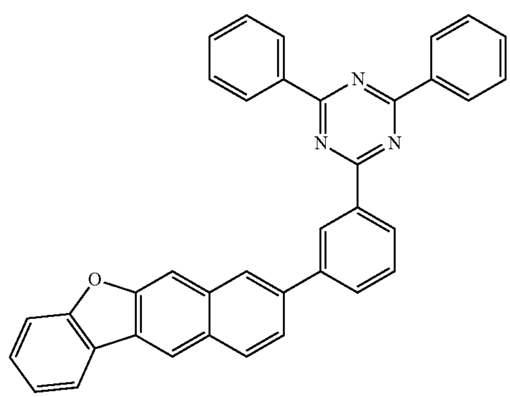
C-232
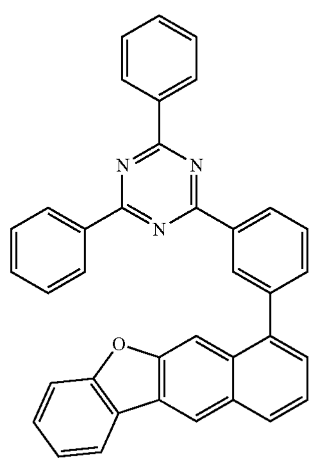

-continued
C-233
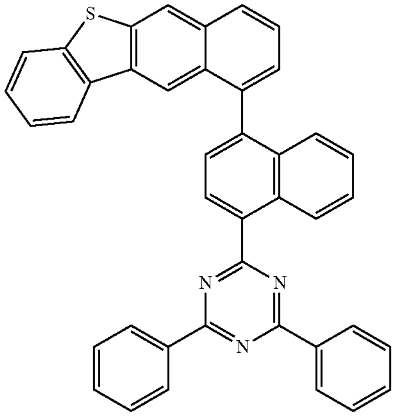
C-234
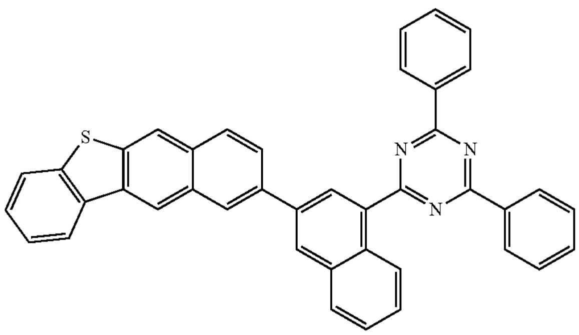
C-235
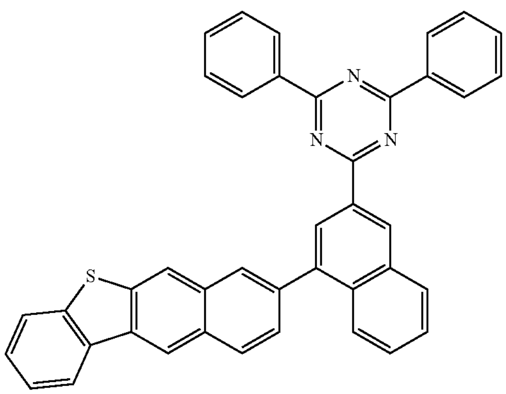
C-236
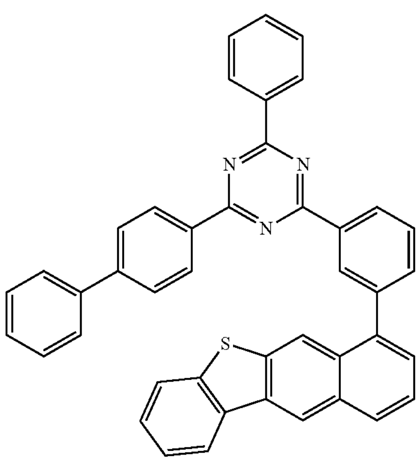
-continued
C-237
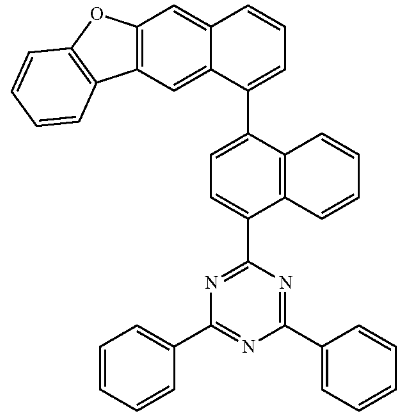
C-238
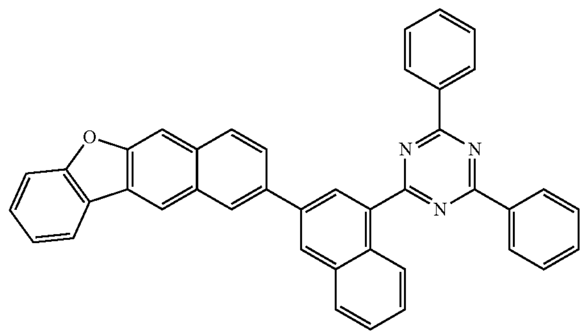
C-239
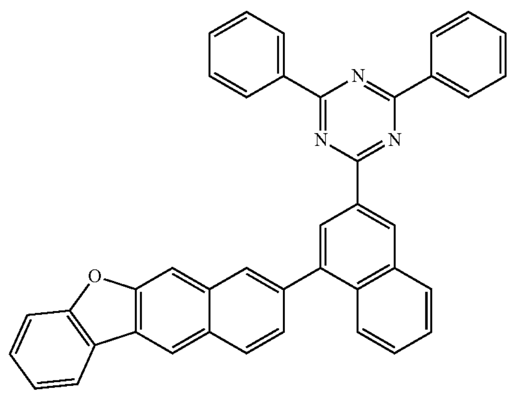
C-240
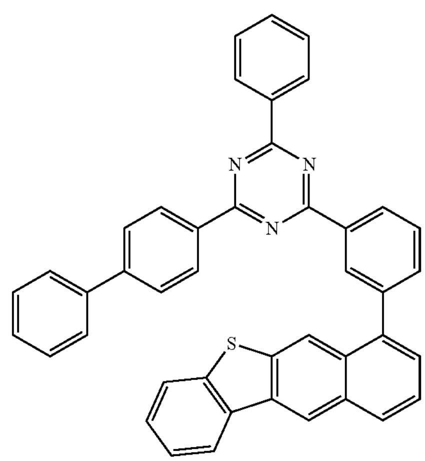

-continued
C-241
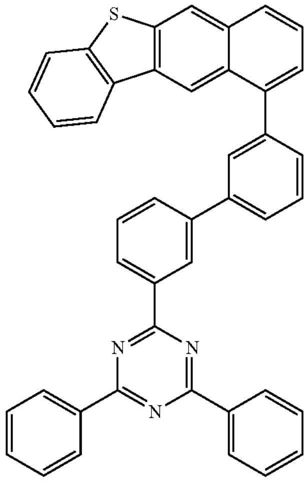
C-242
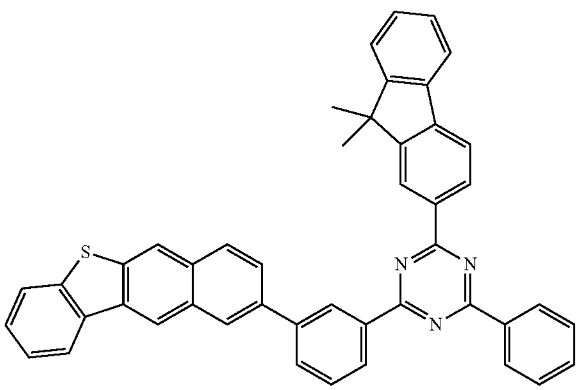
C-243
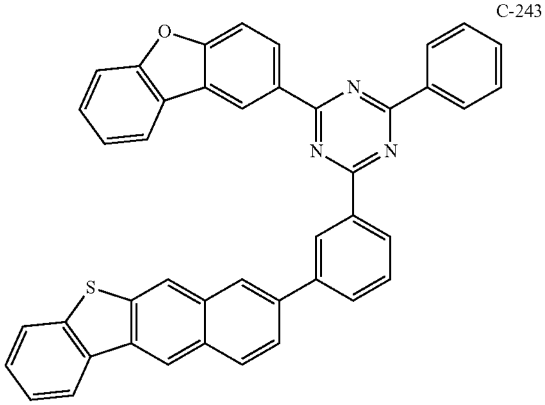
-continued
C-244
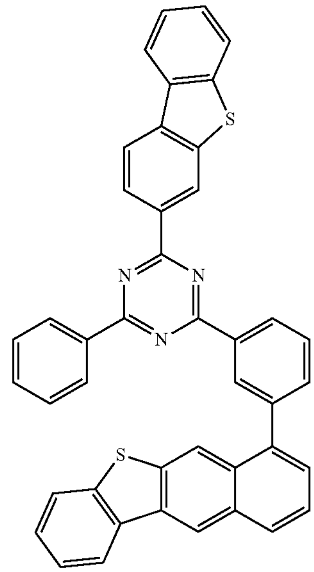
C-245
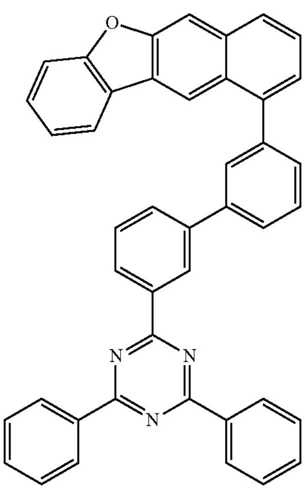
C-246
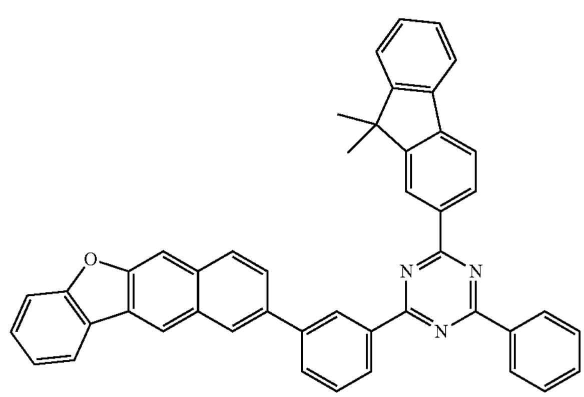

-continued
C-247
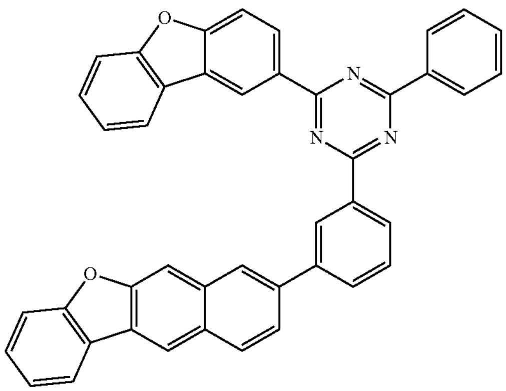
C-248
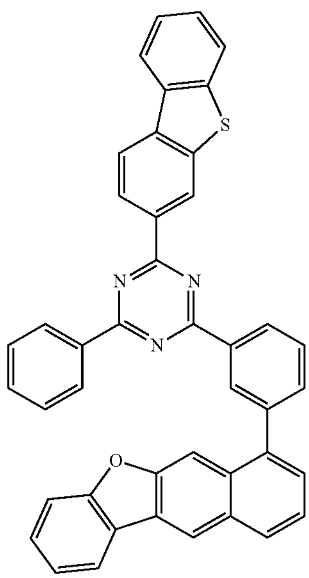
C-249
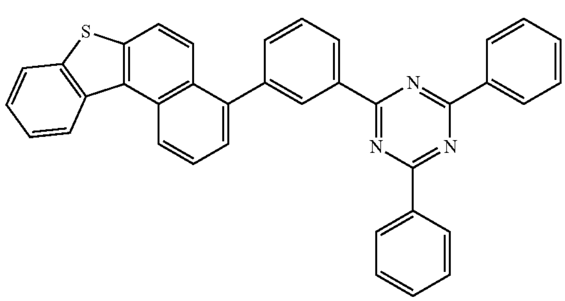
-continued
C-250
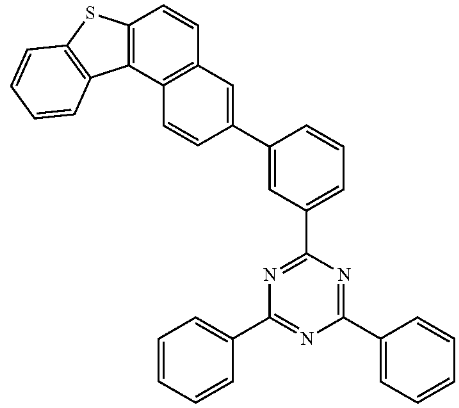
C-251
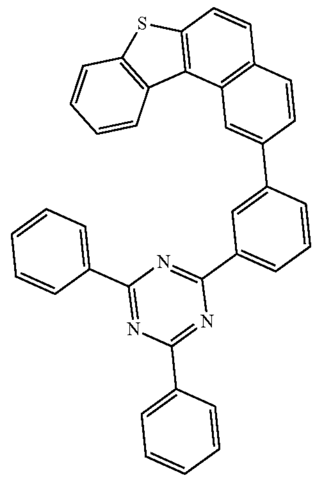
C-252
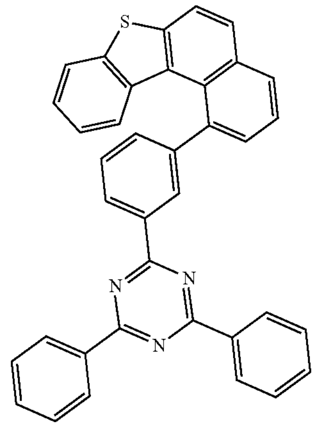
C-253
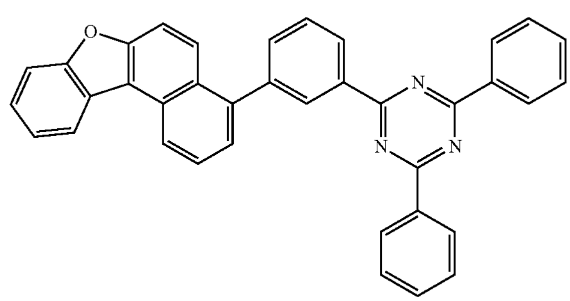

-continued
C-254
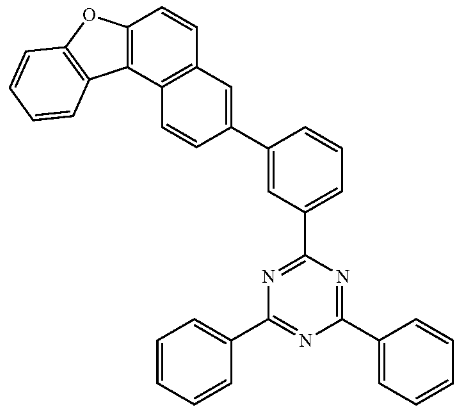
C-255
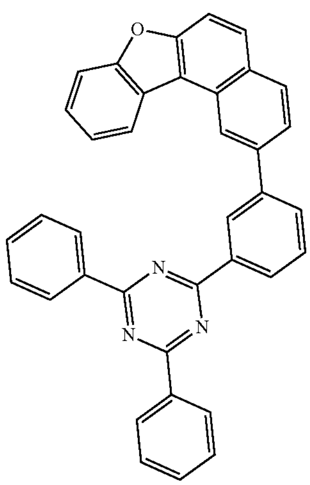
C-256
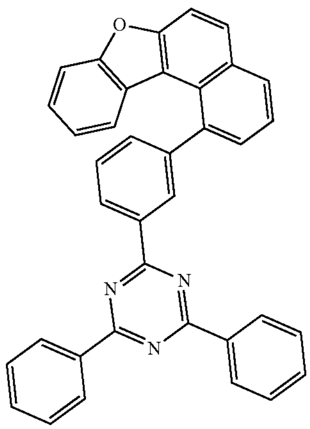
-continued
C-257
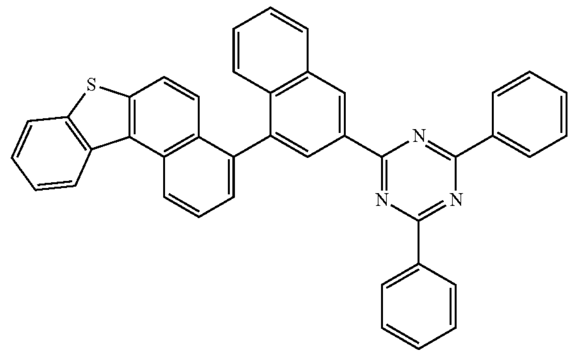
C-258
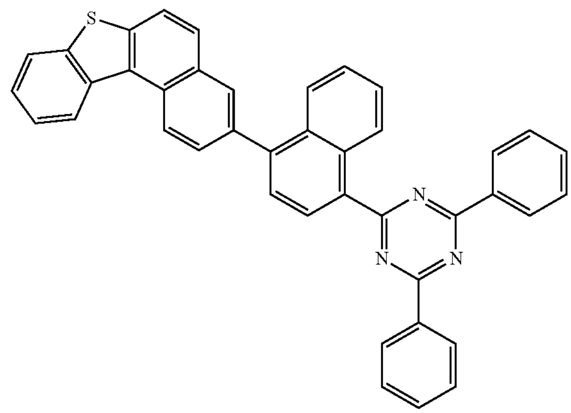
C-259
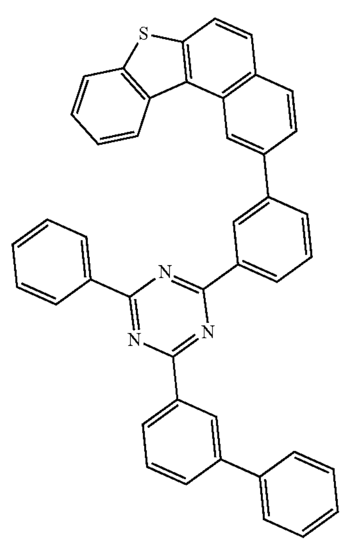

-continued
C-260
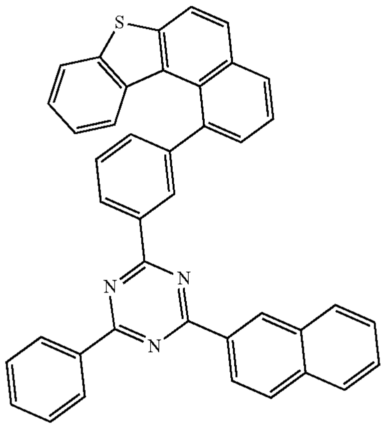
C-261
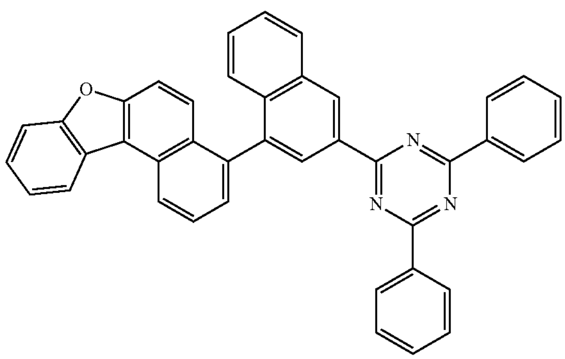
C-262
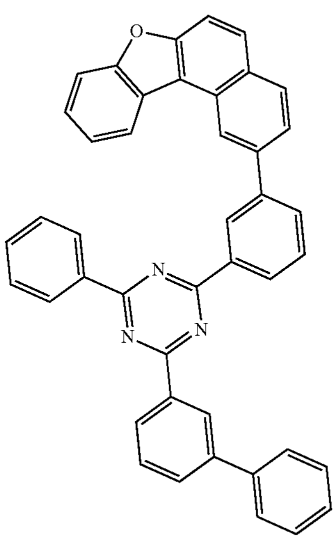
-continued
C-263
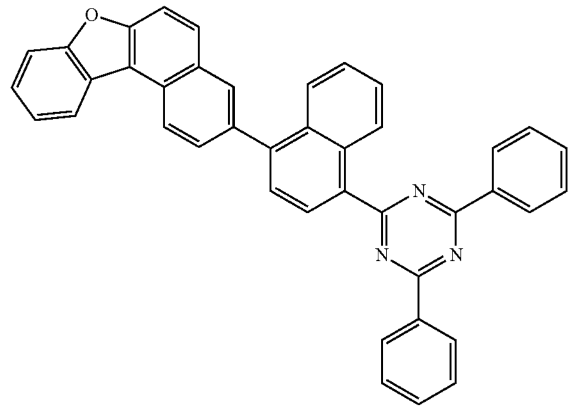
C-264
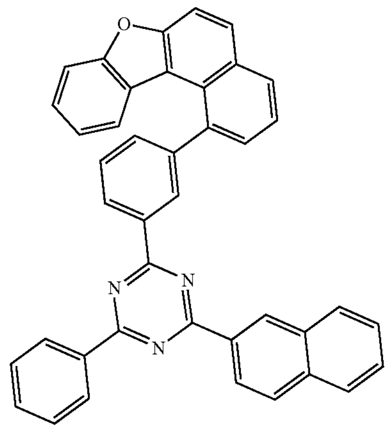
C-265
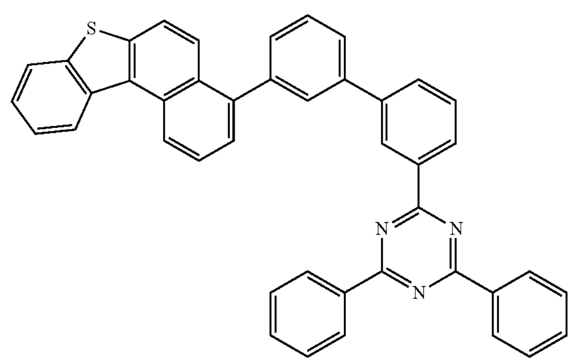

-continued
C-266
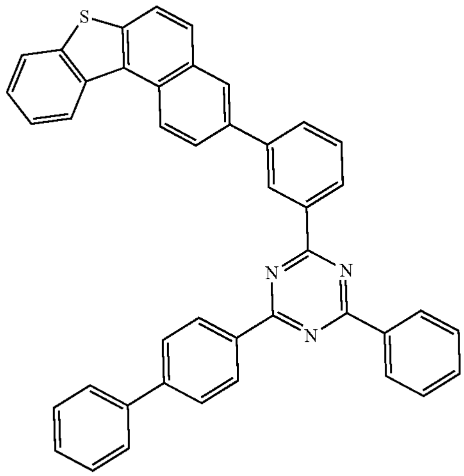
C-267
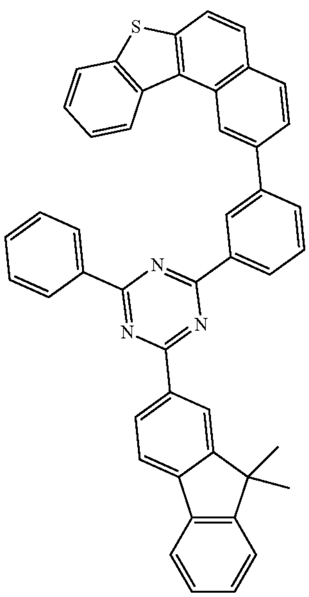
C-268
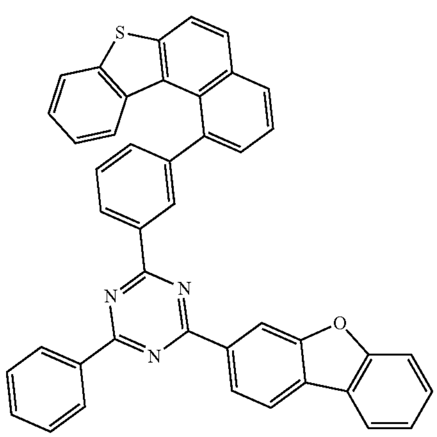
-continued
C-269
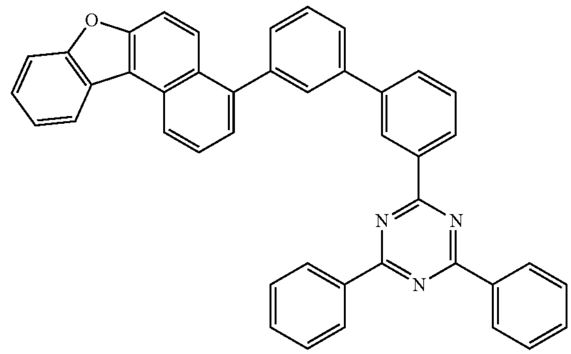
C-270
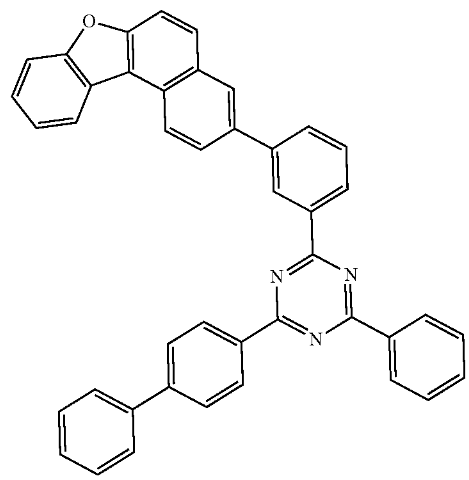
C-271
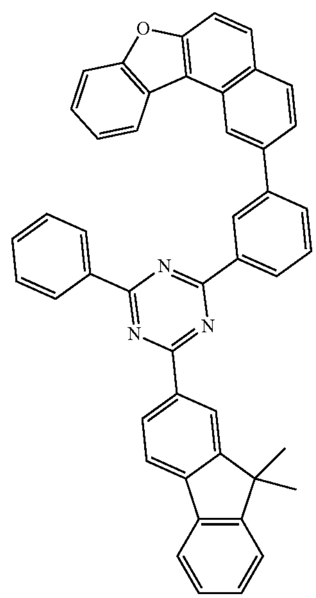

-continued
C-272
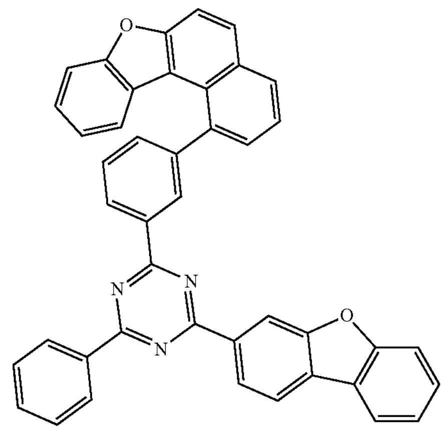
C-273
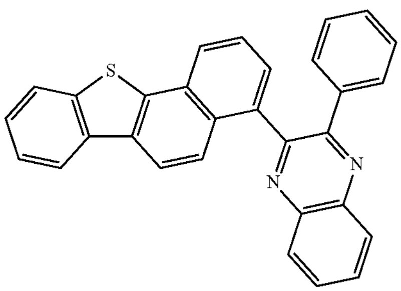
C-274
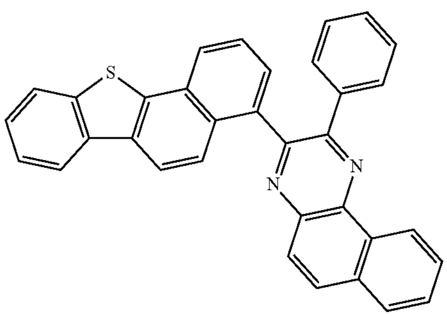
C-275
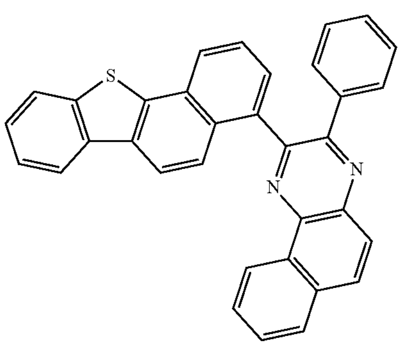
-continued
C-276
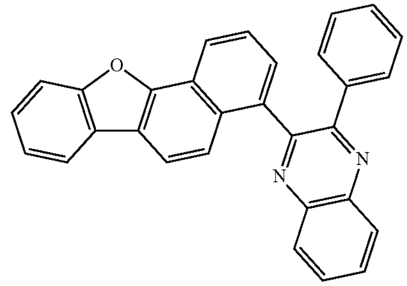
C-277
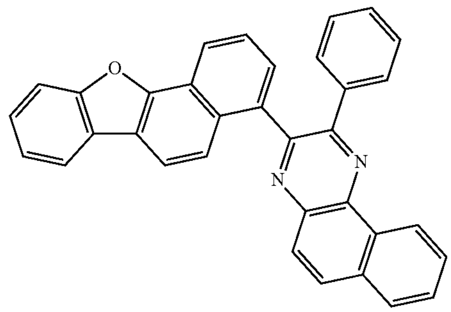
C-278
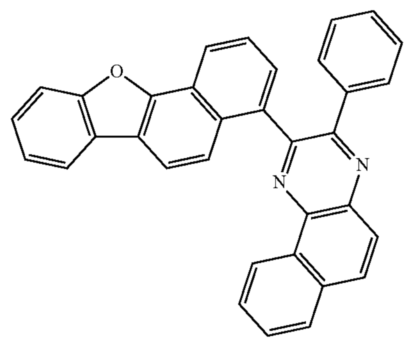
C-279
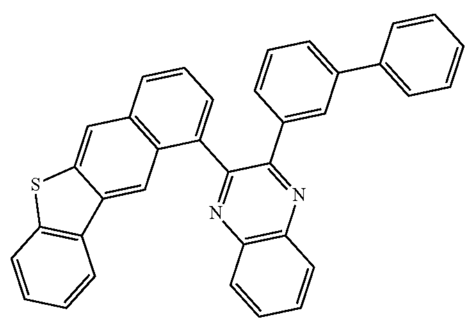
C-280
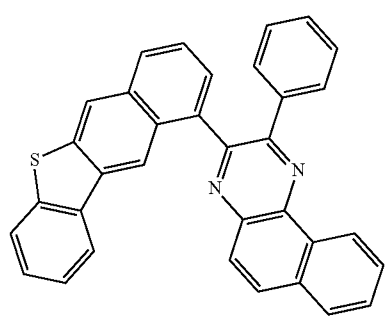

-continued
C-281
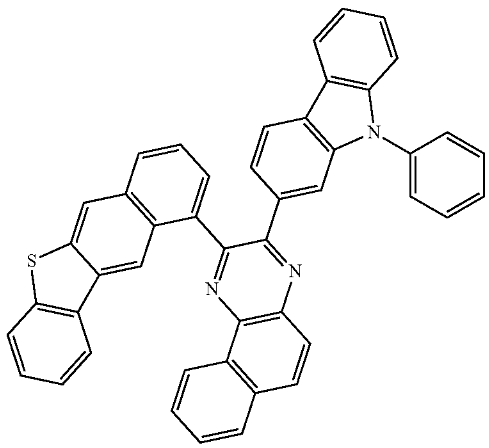
C-282
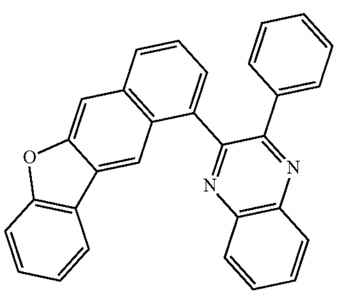
C-283
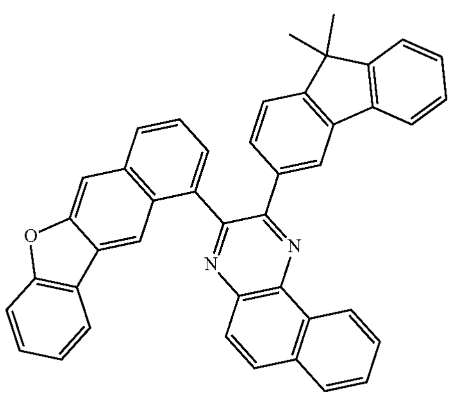
C-284
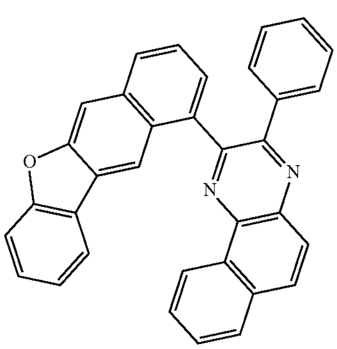
-continued
C-285
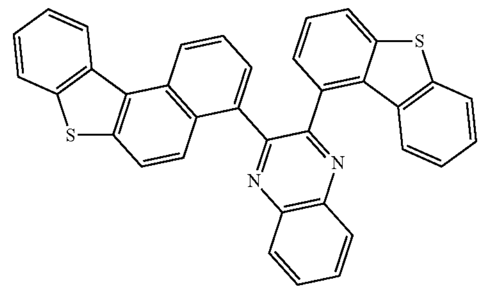
C-286
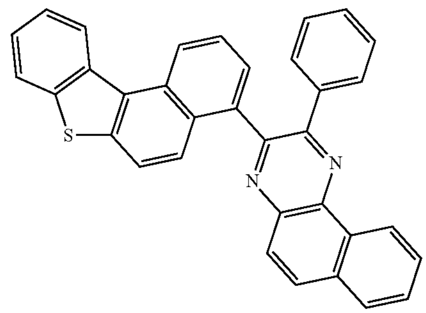
C-287
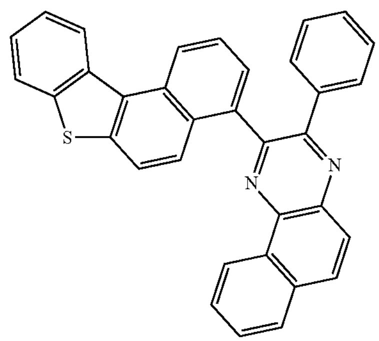
C-288
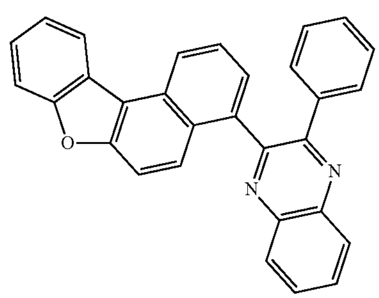
C-289
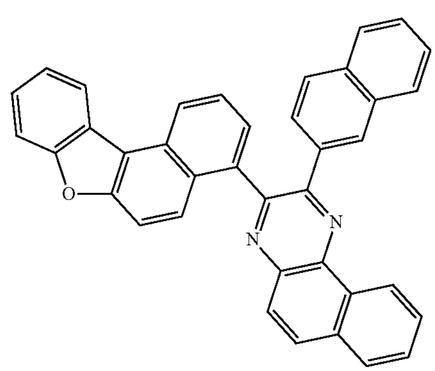

-continued
C-290
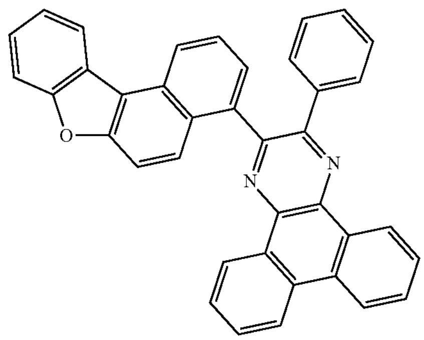
C-291
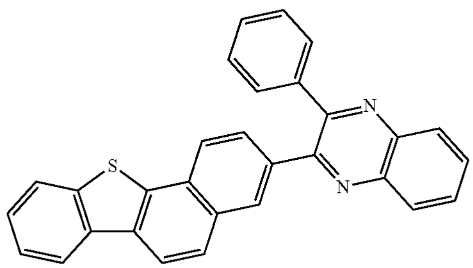
C-292
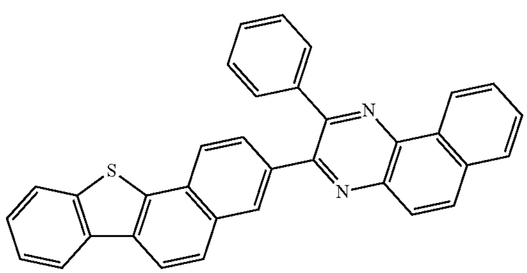
C-293
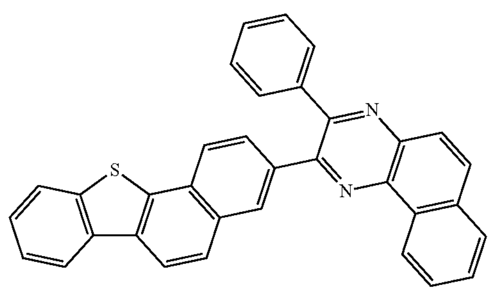
C-294
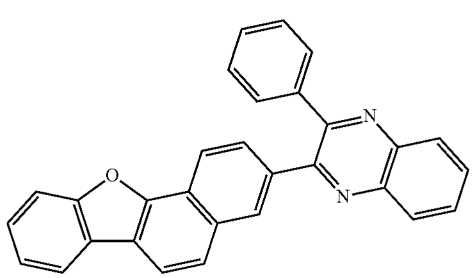
-continued
C-295
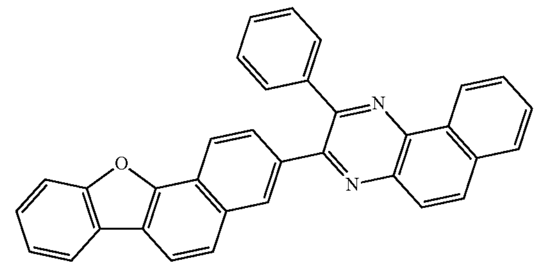
C-296
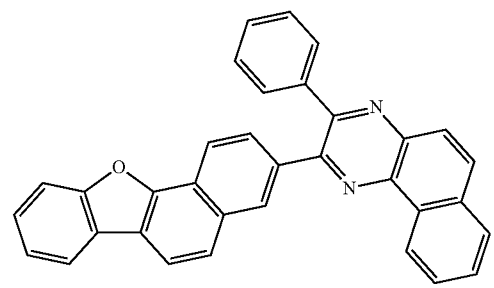
C-297
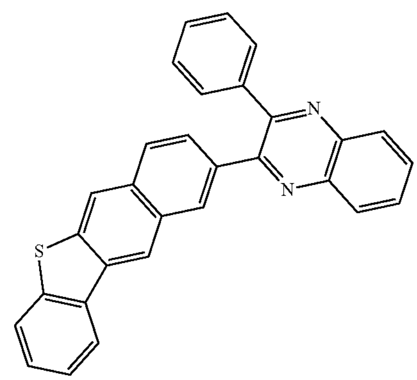
C-298
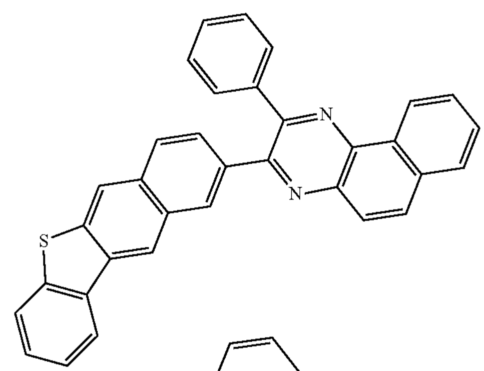
C-299
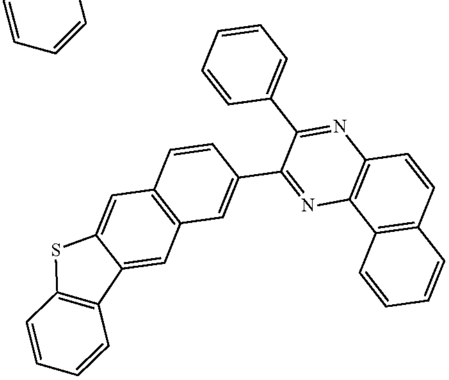

-continued
C-300
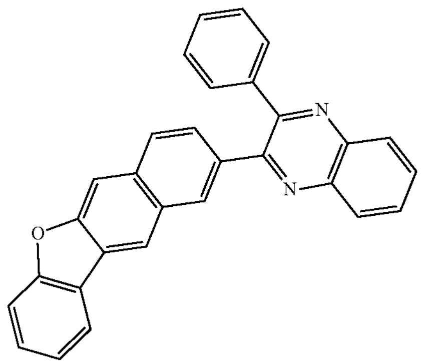
C-301
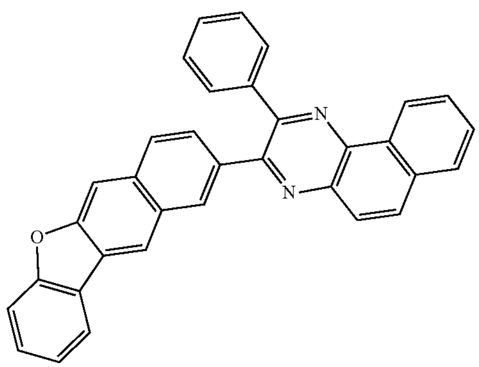
C-302
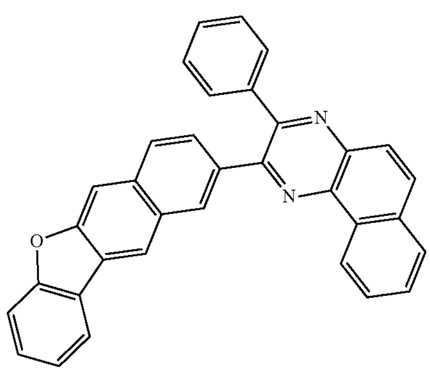
C-303
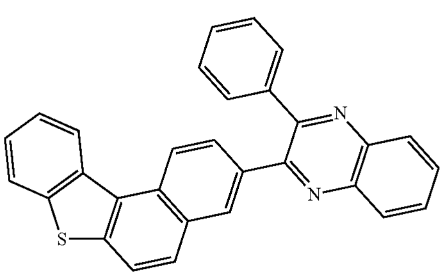
-continued
C-304
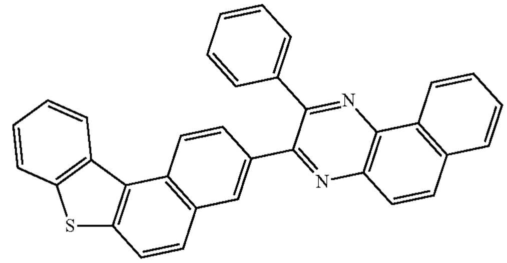
C-305
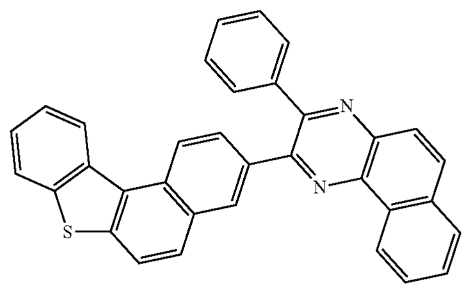
C-306
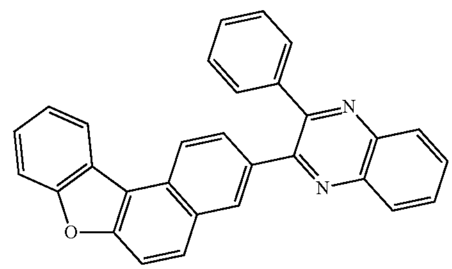
C-307
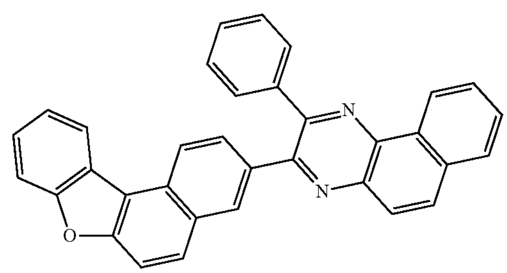
C-308
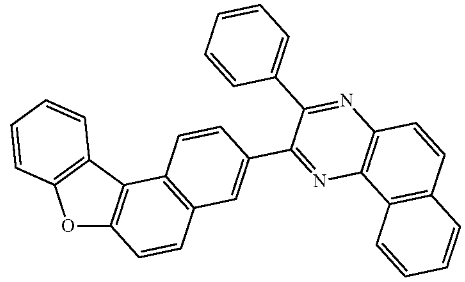

-continued
C-309
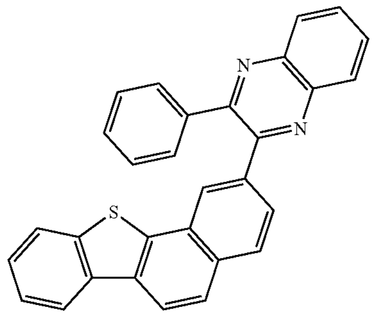
C-310
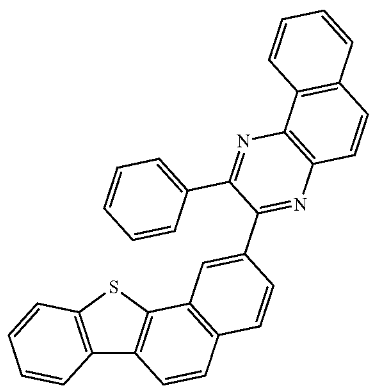
C-311
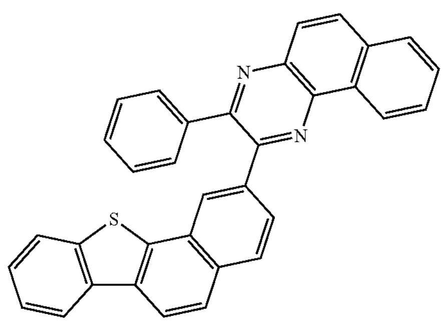
C-312
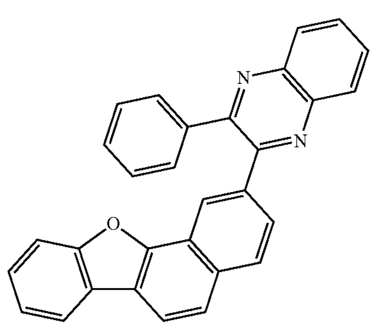
-continued
C-313
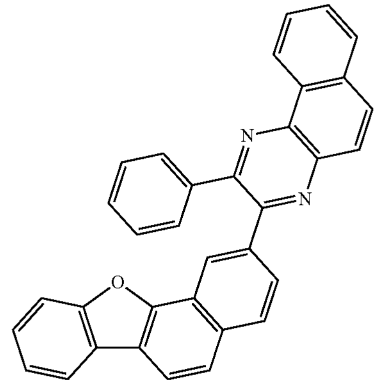
C-314
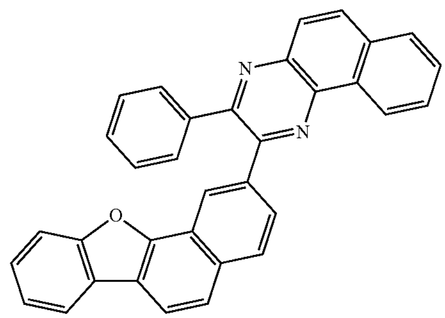
C-315
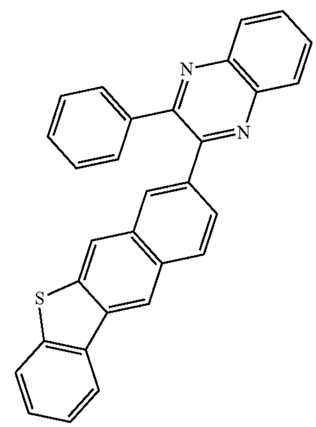
C-316
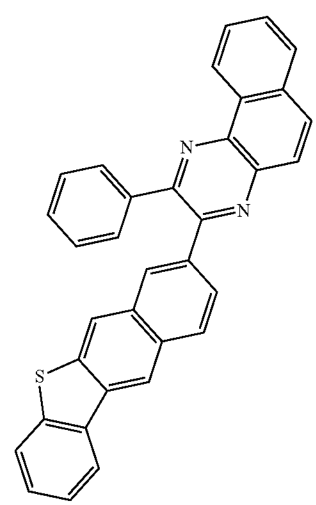

C-317
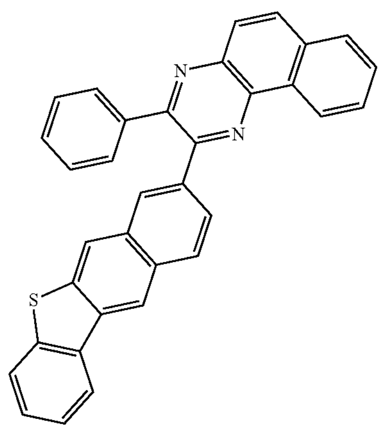
C-318
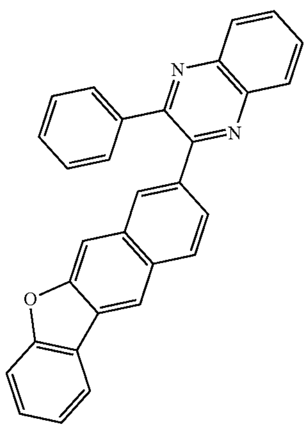
C-319
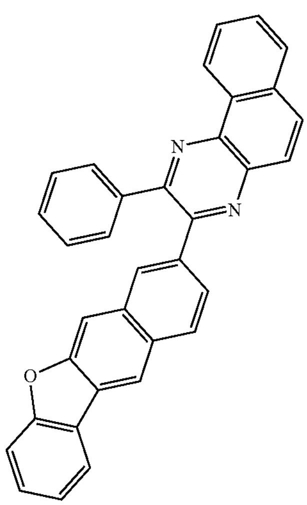
C-320
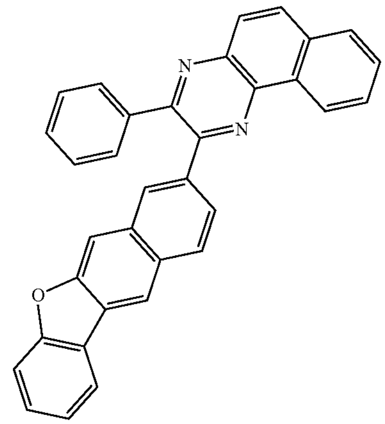
C-321
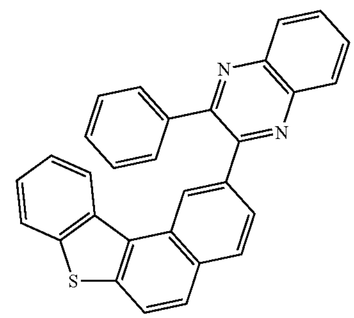
C-322
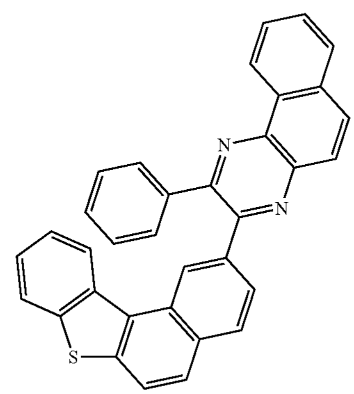
C-323
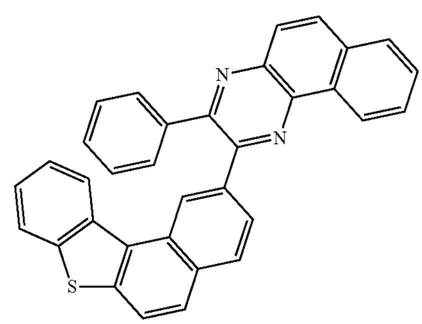

-continued
C-324
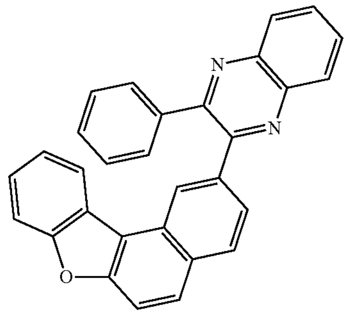
C-325
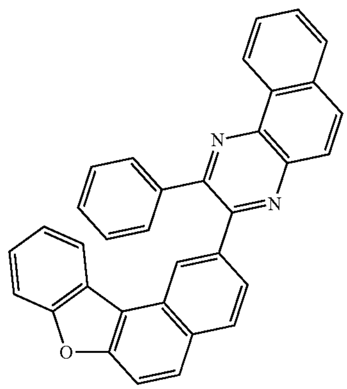
C-326
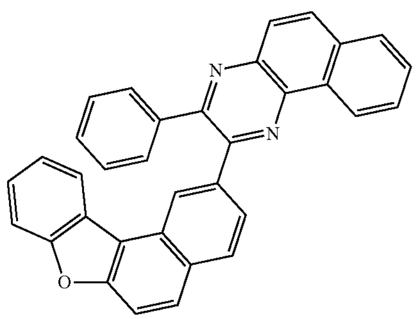
C-327
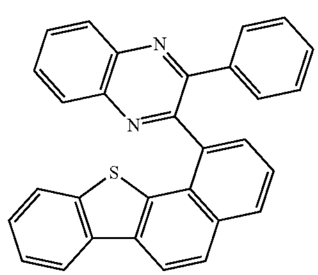
C-328
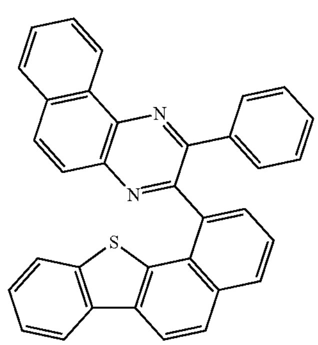
-continued
C-329
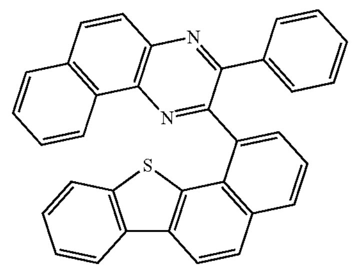
C-330
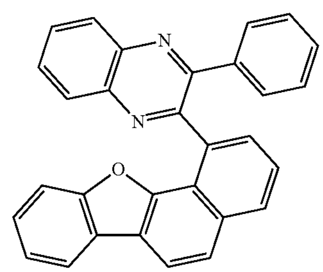
C-331
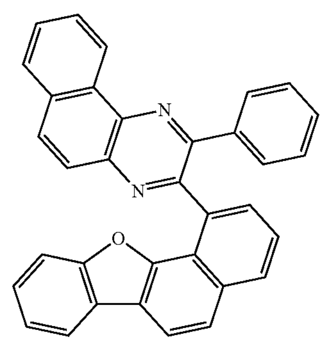
C-332
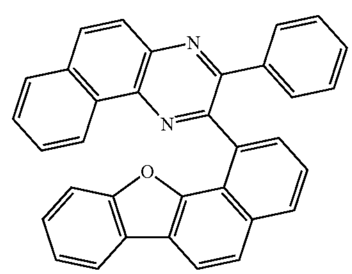
C-333
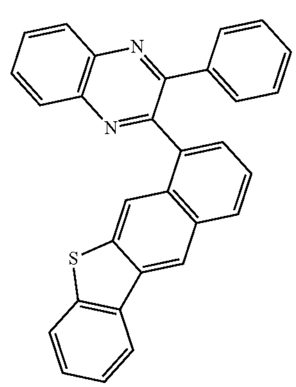

-continued
C-334
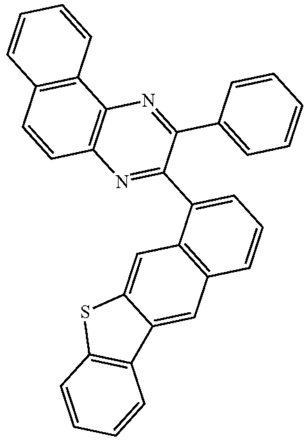
C-335
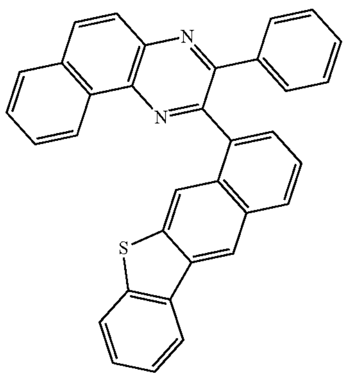
C-336
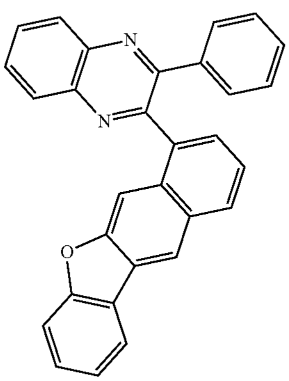
C-337
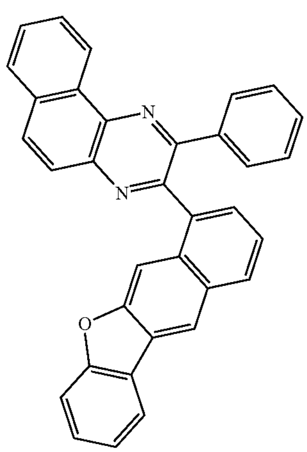
-continued
C-338
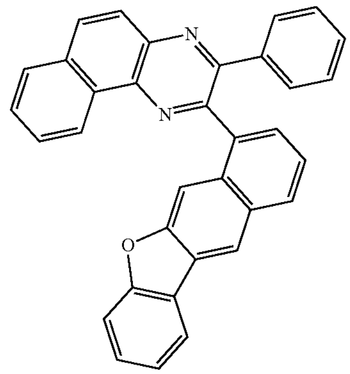
C-339
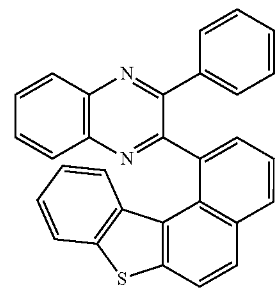
C-340
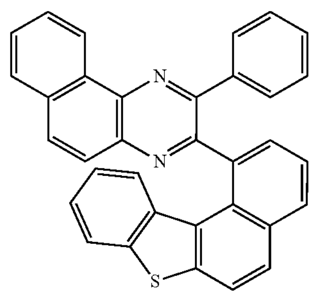
C-341
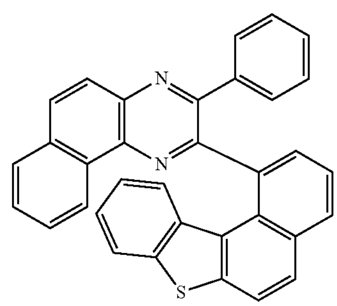
C-342
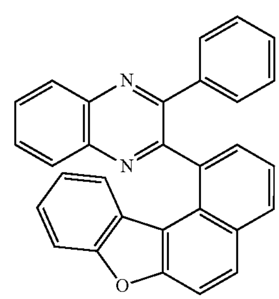

-continued
C-343
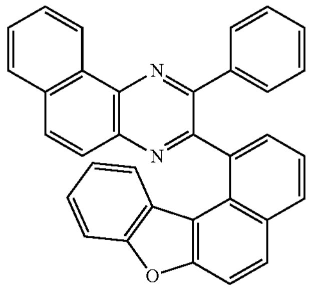
C-344
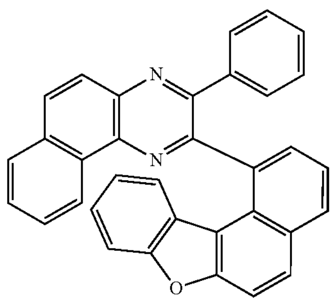
C-345
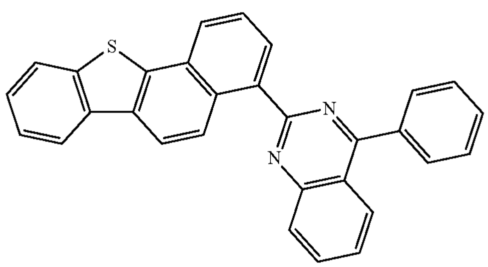
C-346
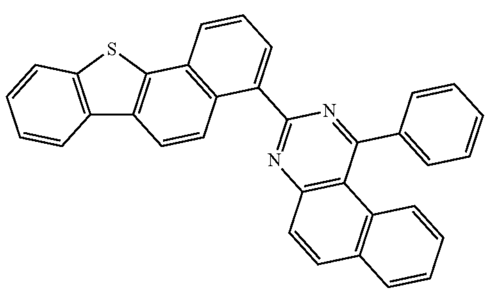
C-347
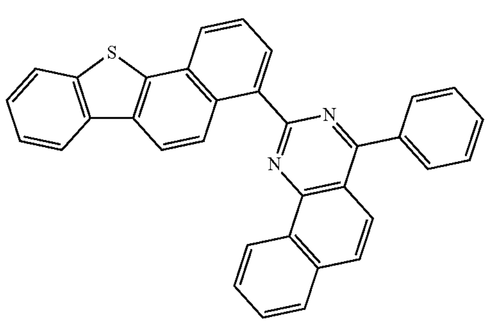
-continued
C-348
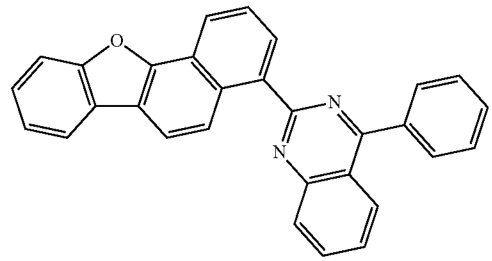
C-349
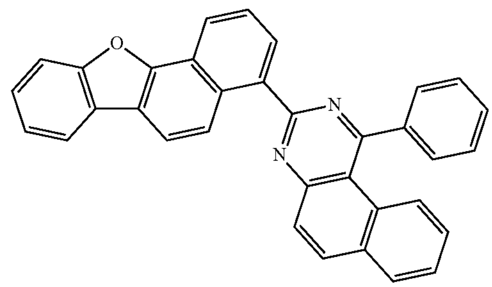
C-350
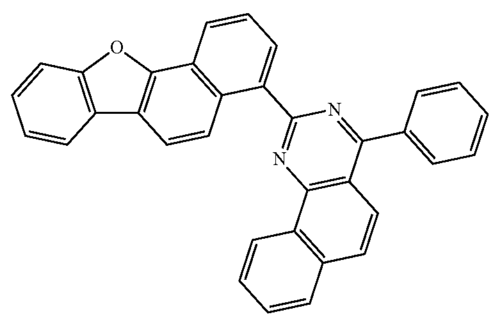
C-351
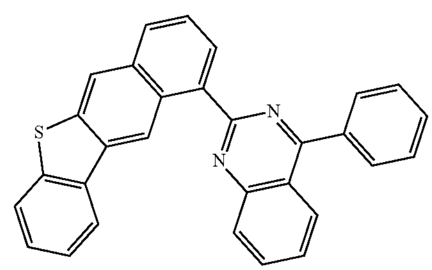
C-352
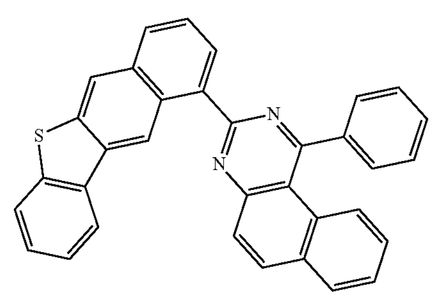

-continued
C-353
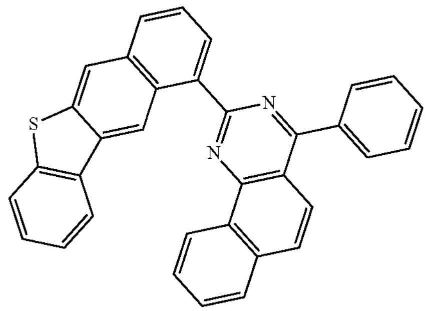
C-354
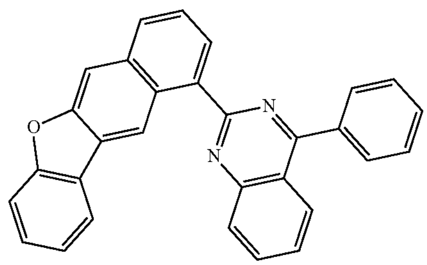
C-355
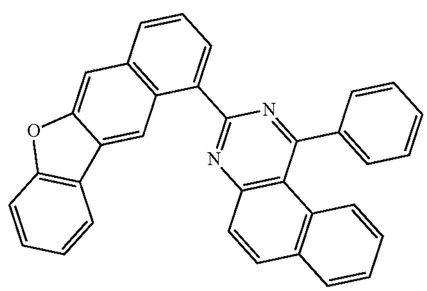
C-356
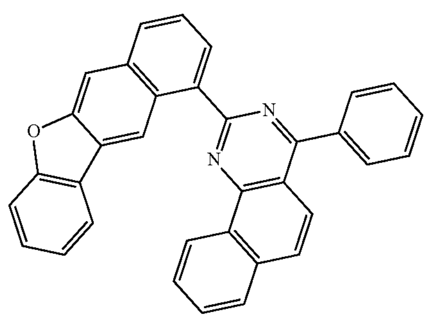
C-357
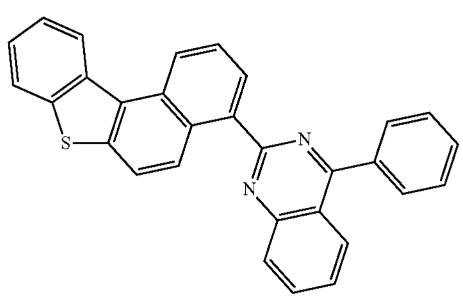
-continued
C-358
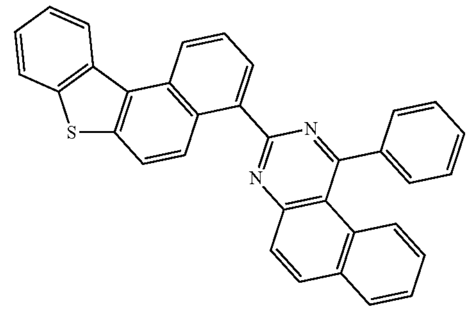
C-359
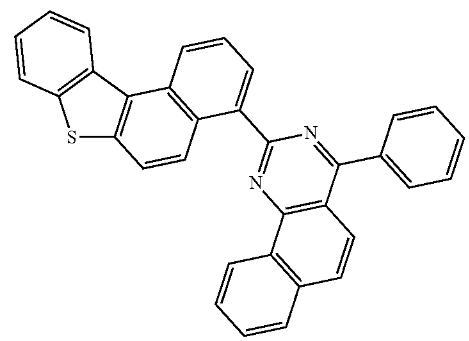
C-360
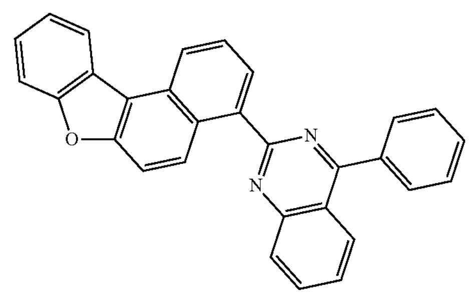
C-361
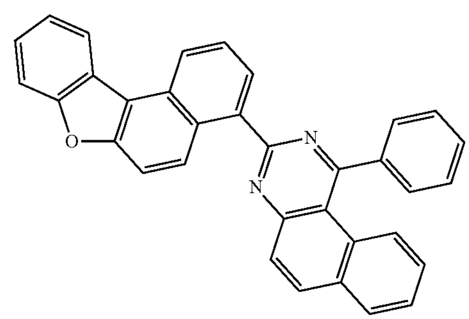
C-362
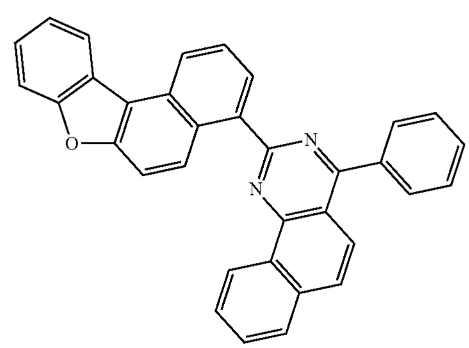

C-363
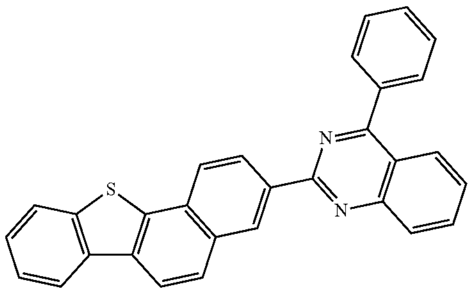
C-364
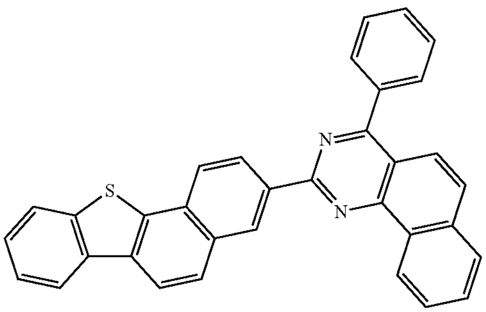
C-365
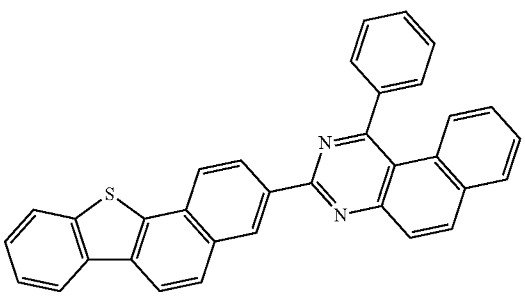
C-366
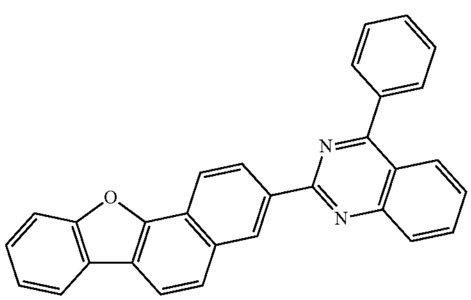
C-367
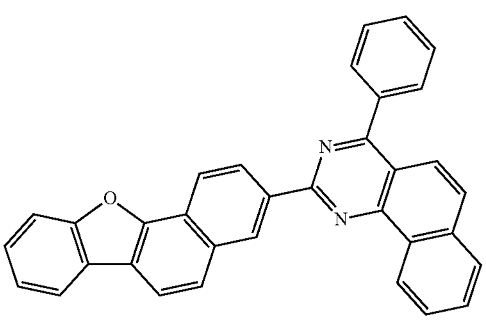
C-368
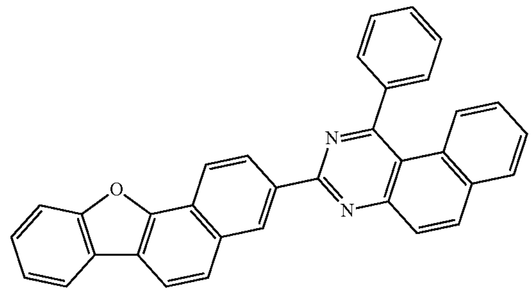
C-369
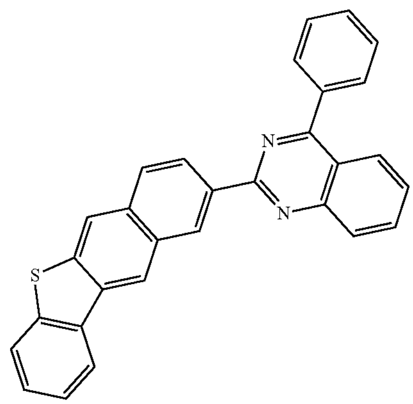
C-370
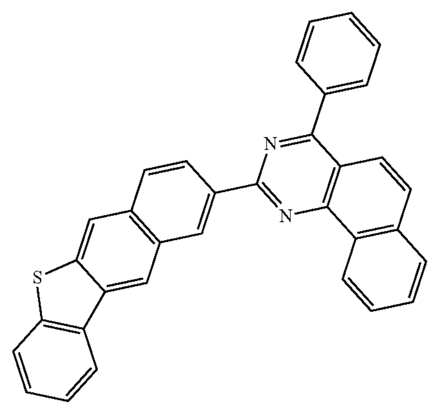
C-371
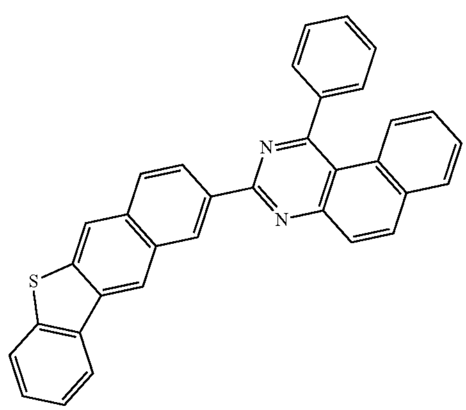

C-372
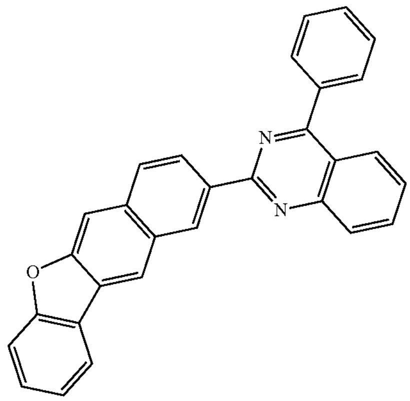
C-373
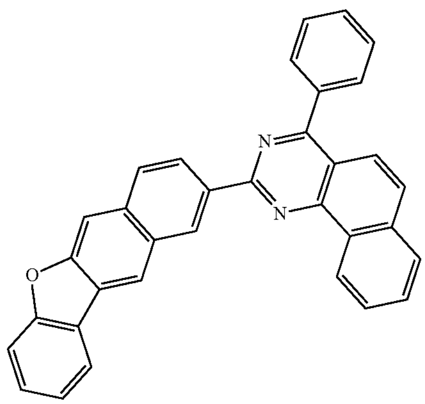
C-374
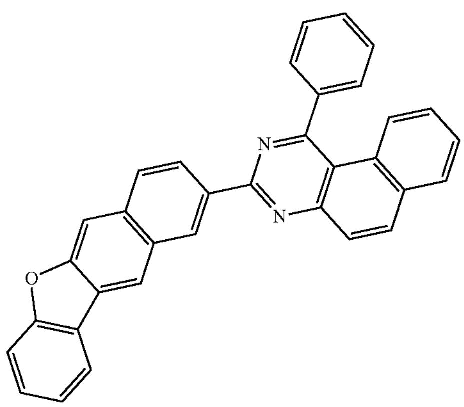
C-375
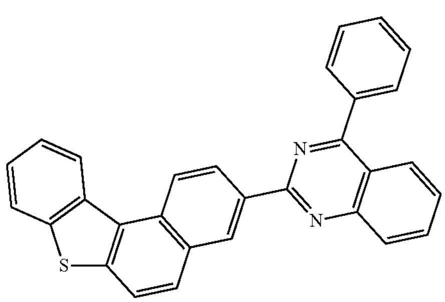
C-376
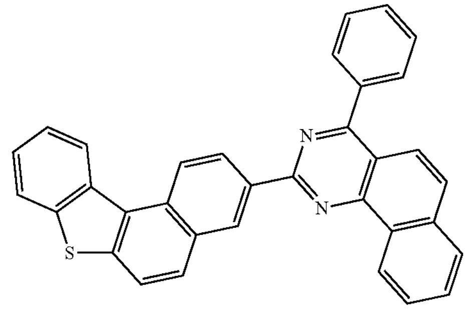
C-377
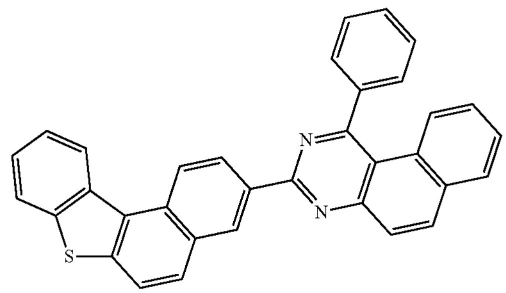
C-378
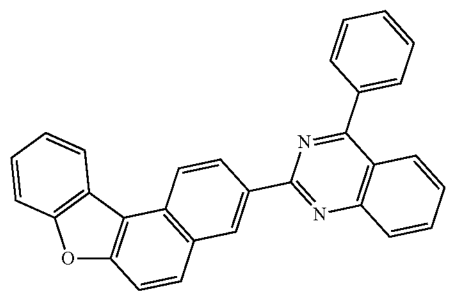
C-379
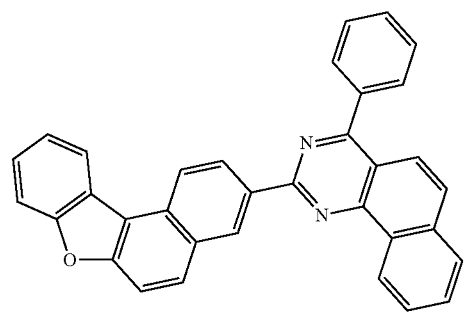
C-380
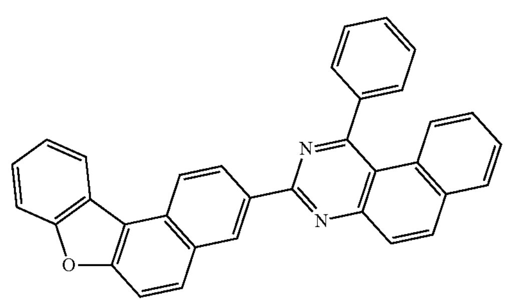

-continued
C-381
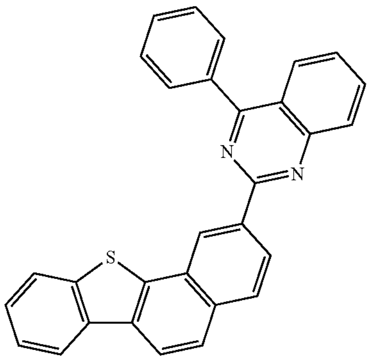
C-382
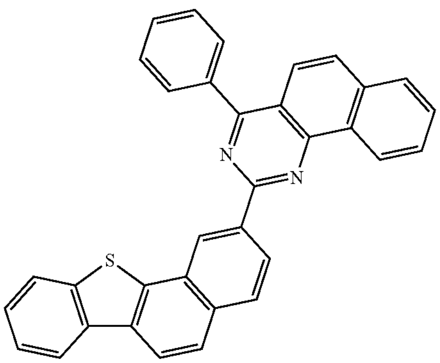
C-383
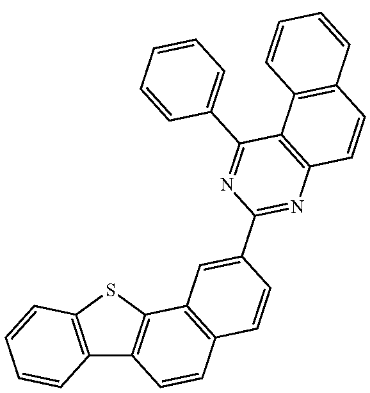
C-384
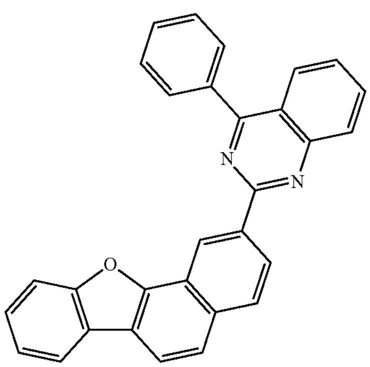
-continued
C-385
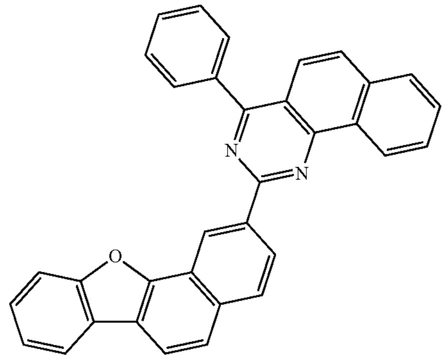
C-386
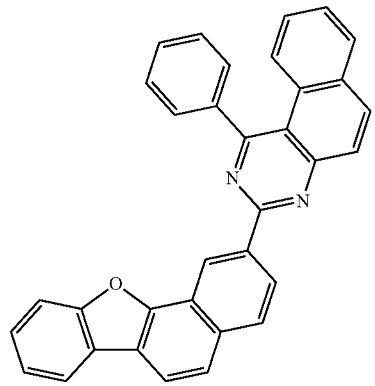
C-387
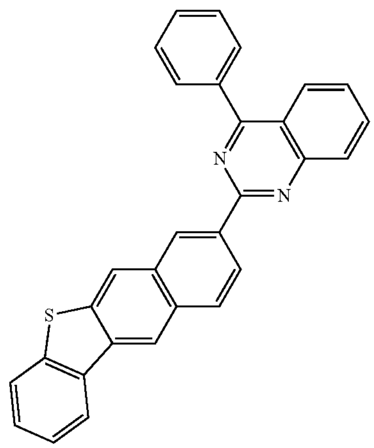
C-388
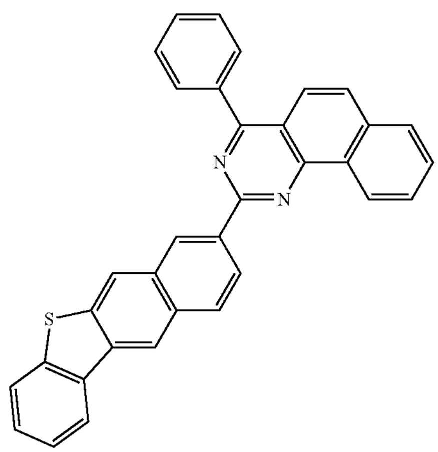

-continued
C-389
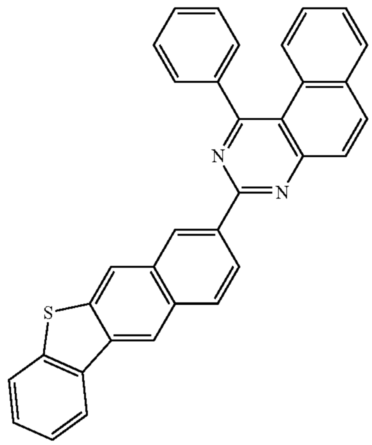
C-390
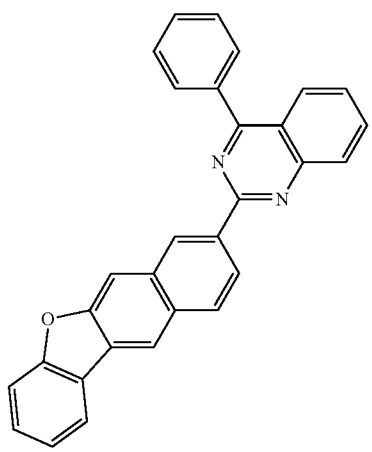
C-391
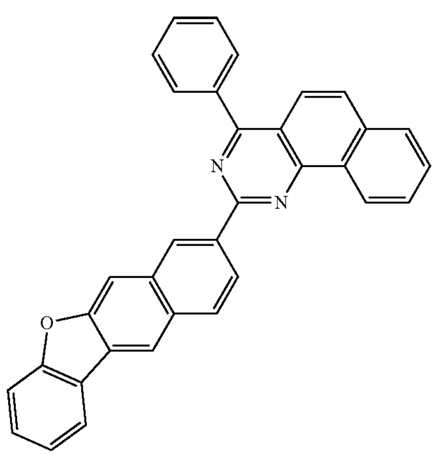
-continued
C-392
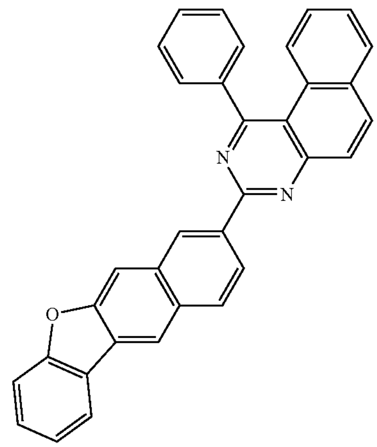
C-393
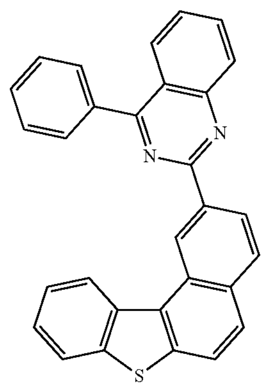
C-394
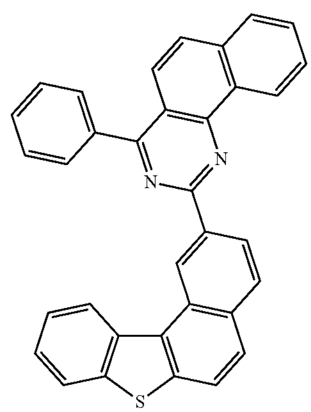

-continued
C-395
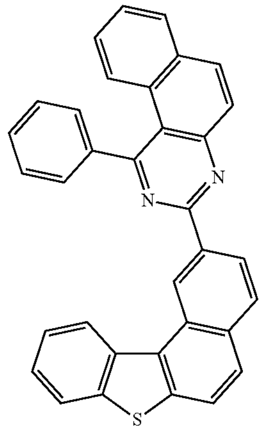
C-396
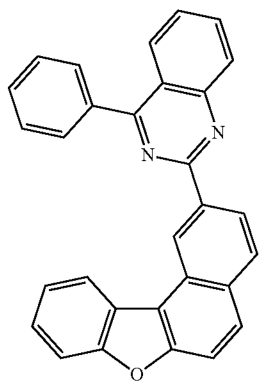
C-397
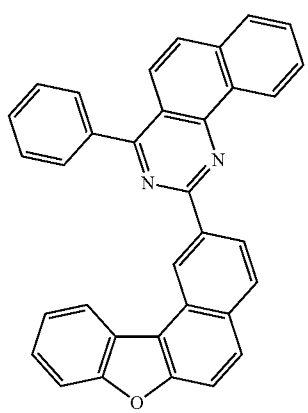
C-398
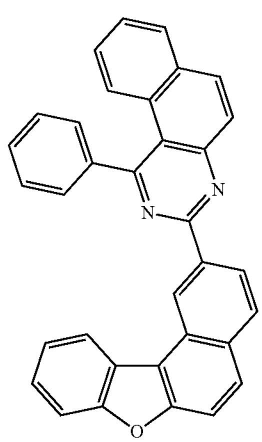
-continued
C-399
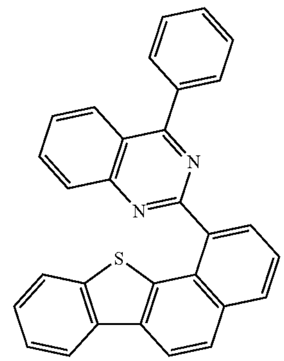
C-400
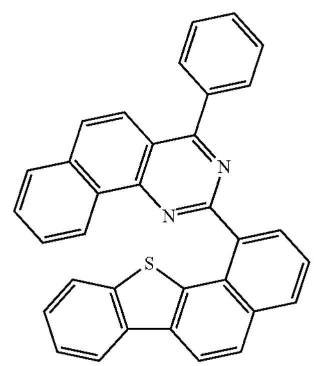
C-401
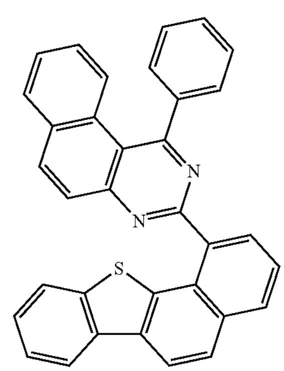
C-402
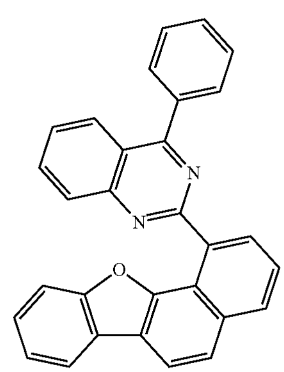

C-403
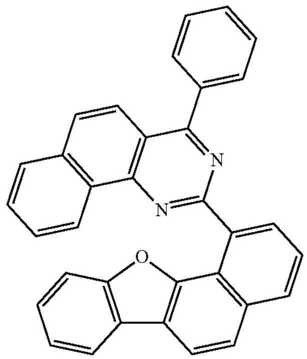
C-404
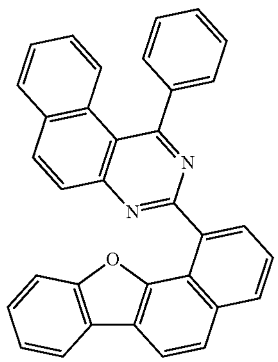
C-405
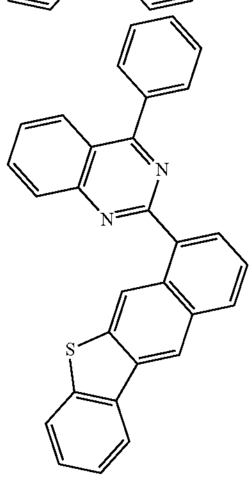
C-406
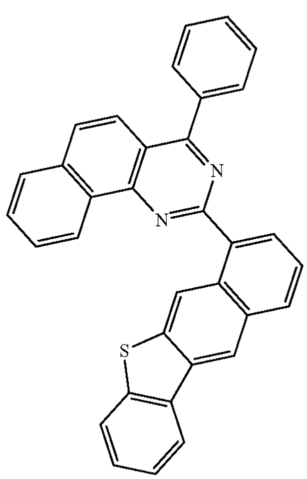
C-407
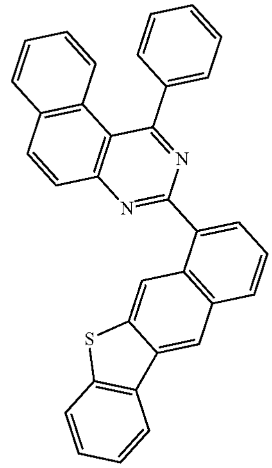
C-408
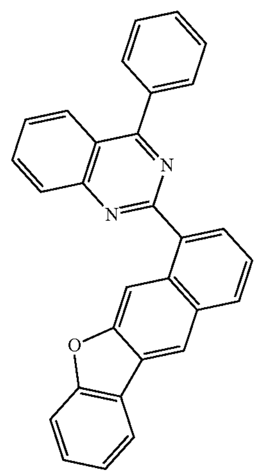
C-409
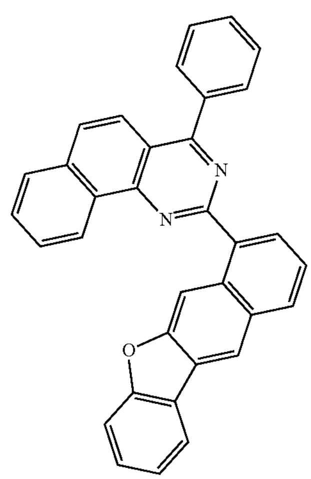

-continued
C-410
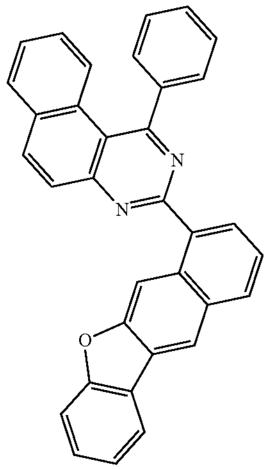
C-411
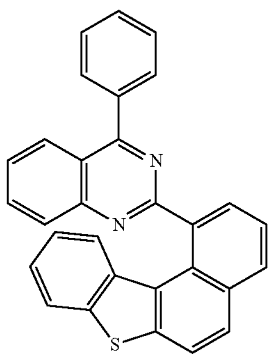
C-412
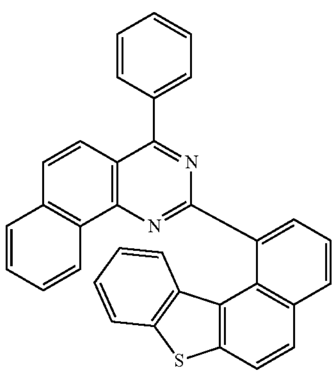
C-413
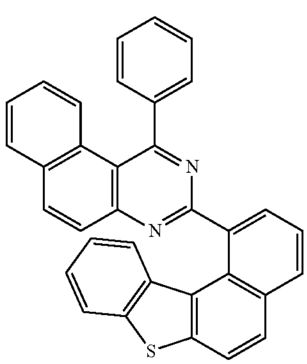
-continued
C-414
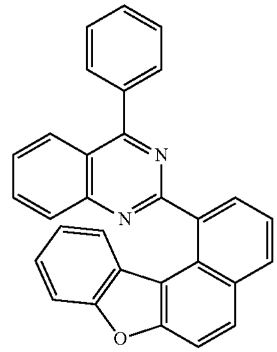
C-415
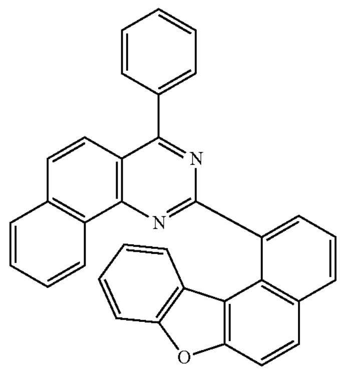
C-416
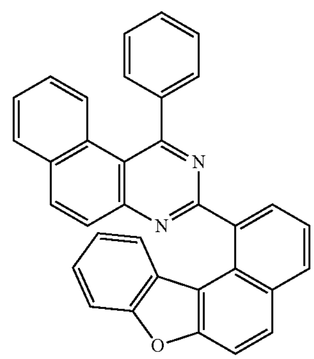
C-417
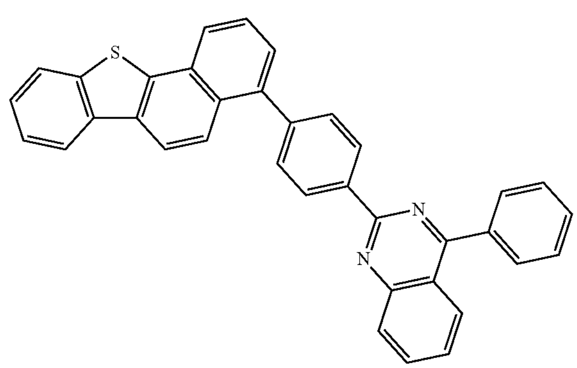

-continued
C-418
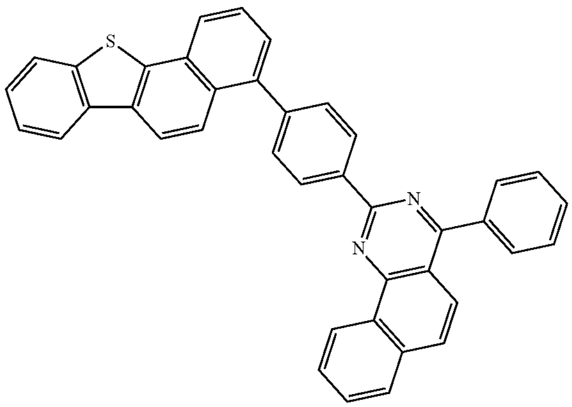
C-419
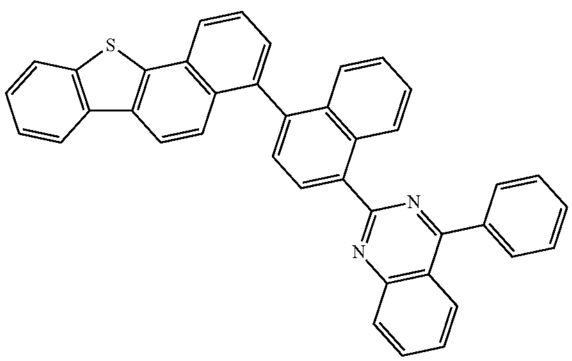
C-420
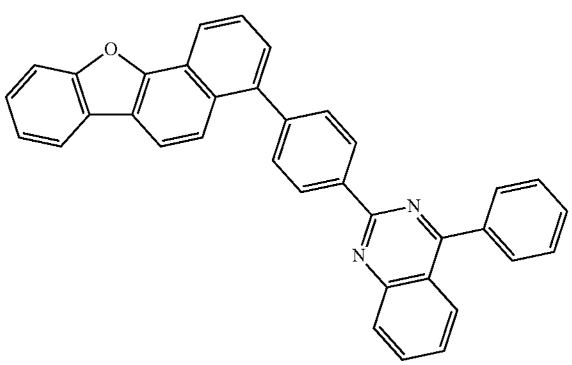
C-421
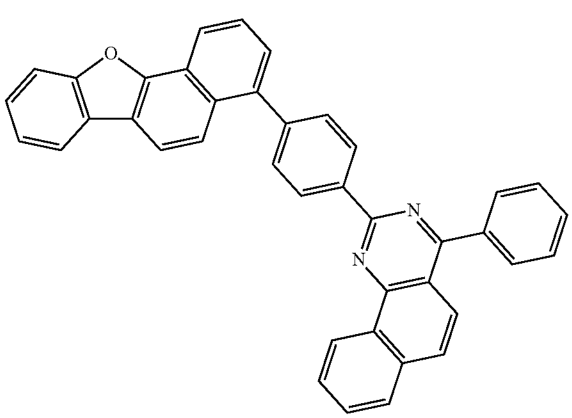
-continued
C-422
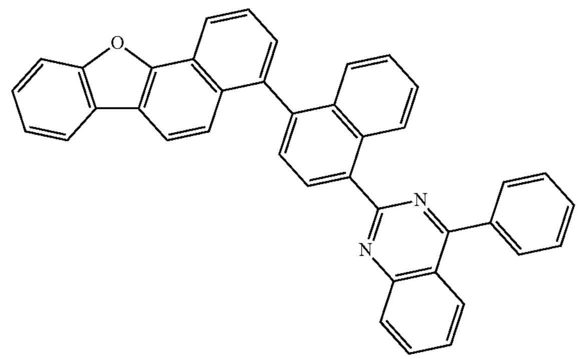
C-423
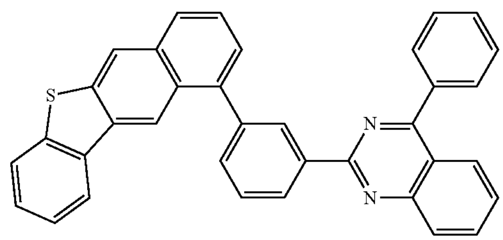
C-424
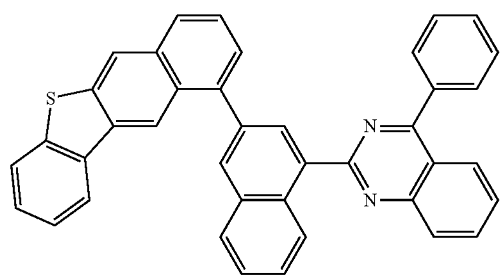
C-425
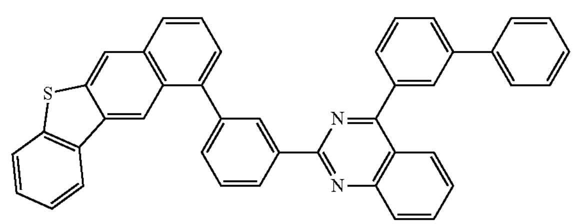
C-426
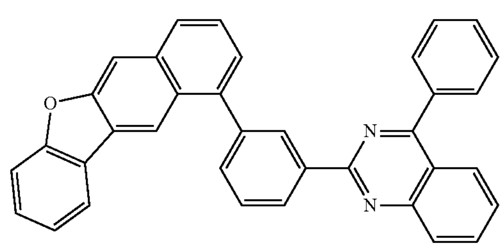

C-427
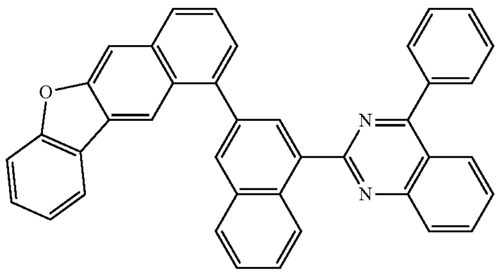
C-428
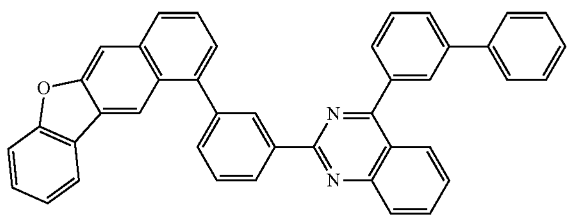
C-429
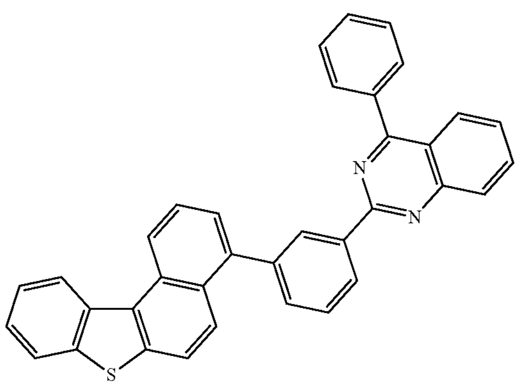
C-430
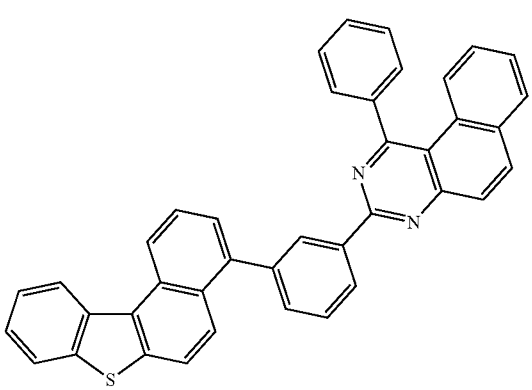
C-431
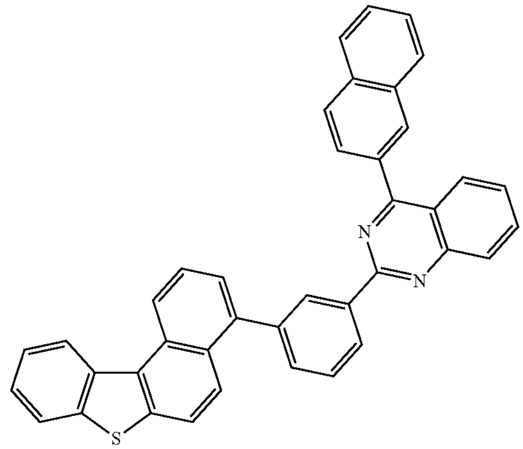
C-432
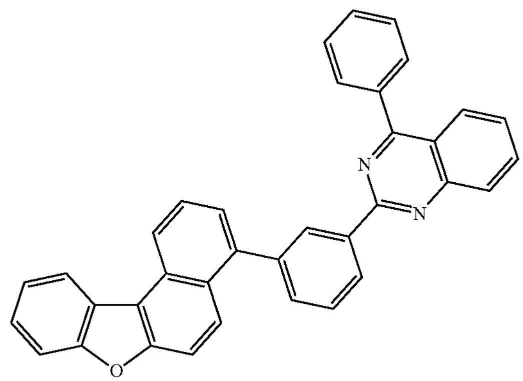
C-433
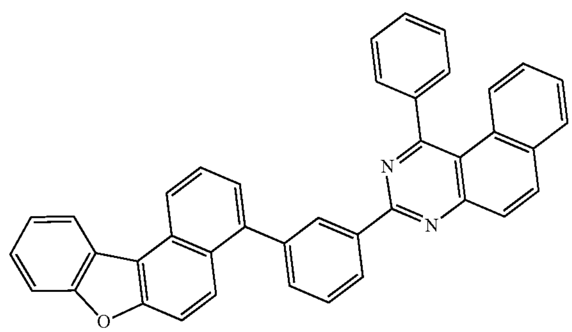
C-434
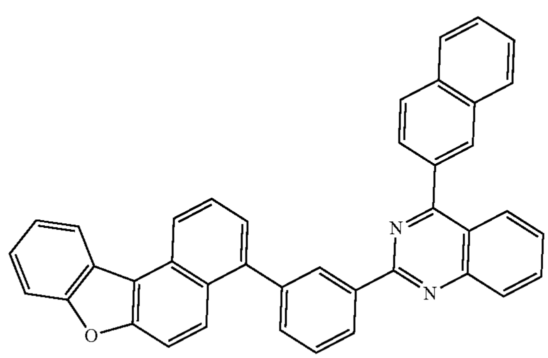

C-435
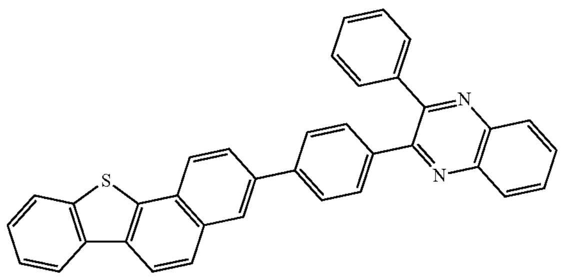
C-436
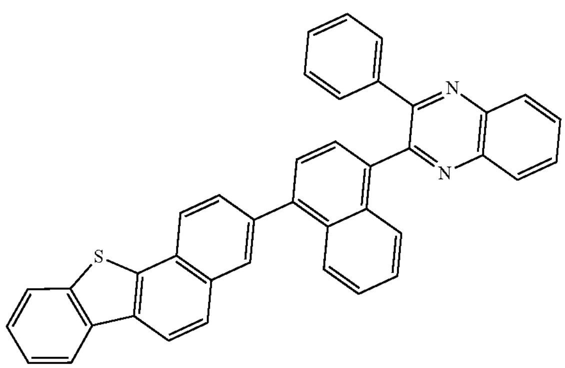
C-437
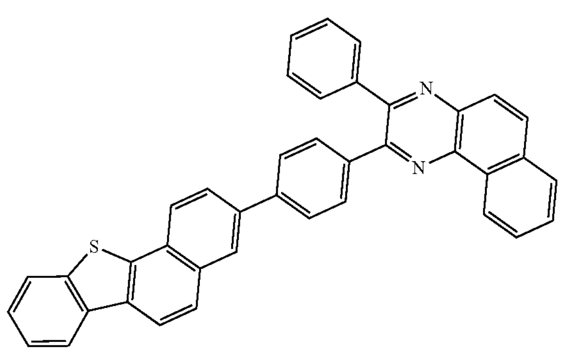
C-438
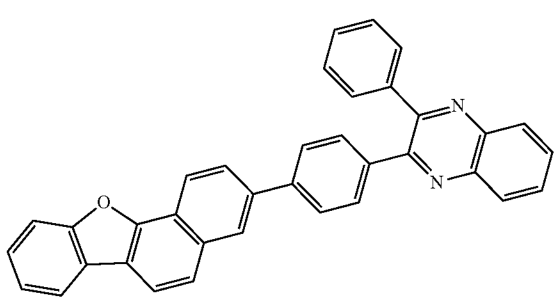
C-439
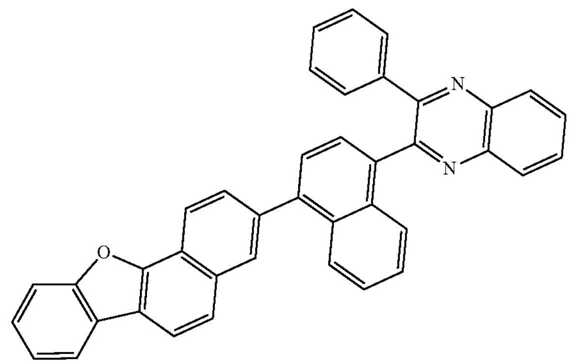
C-440
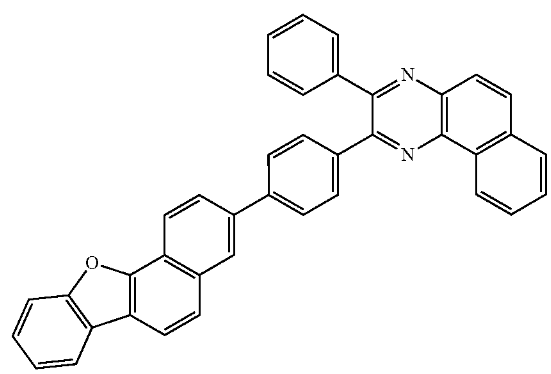
C-441
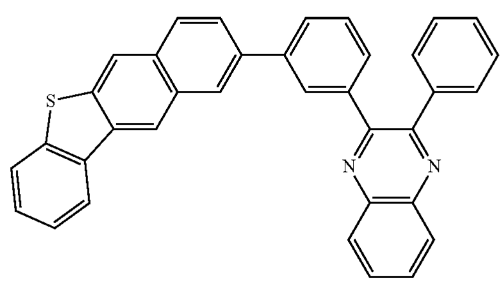
C-442
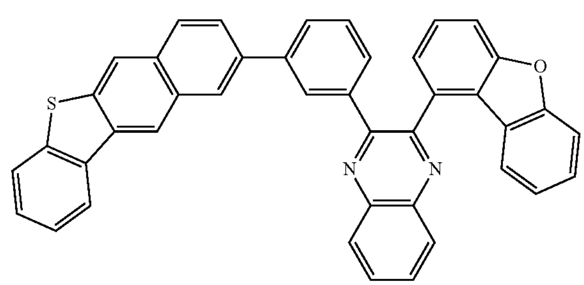

C-443
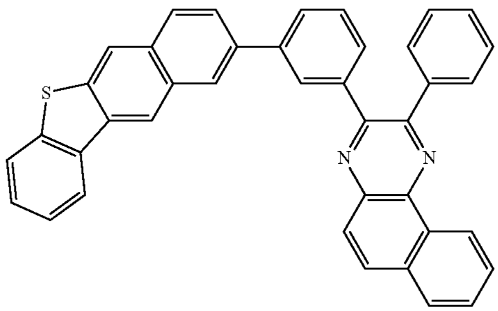
C-444
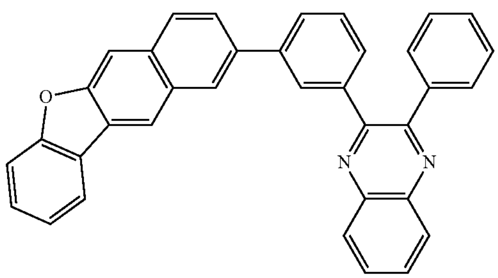
C-445
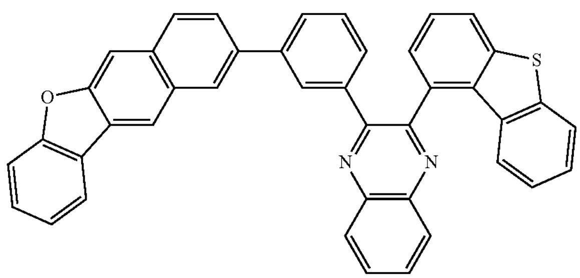
C-446
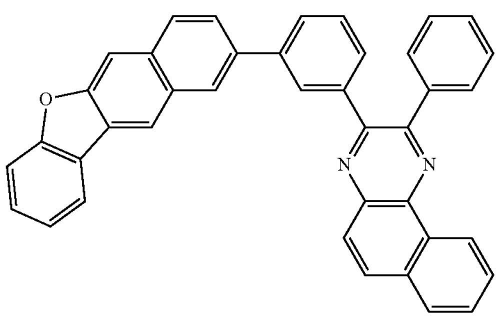
C-447
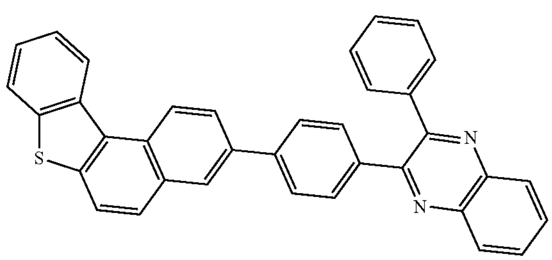
C-448
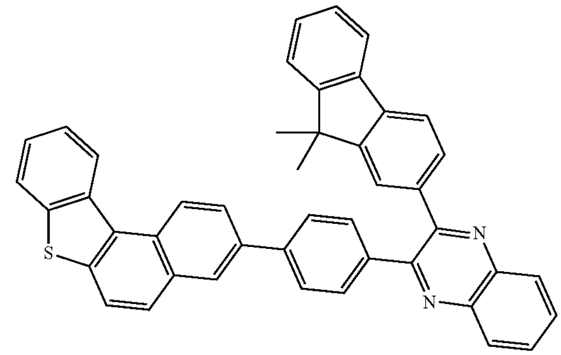
C-449
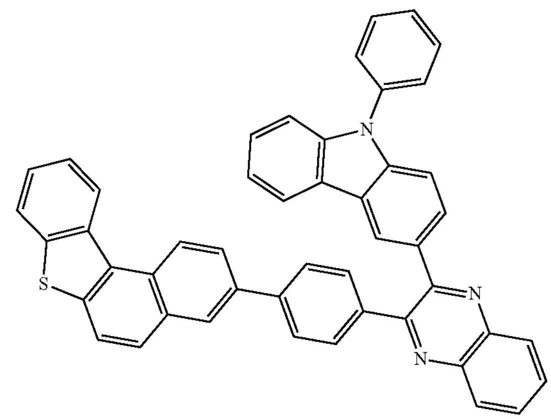
C-450
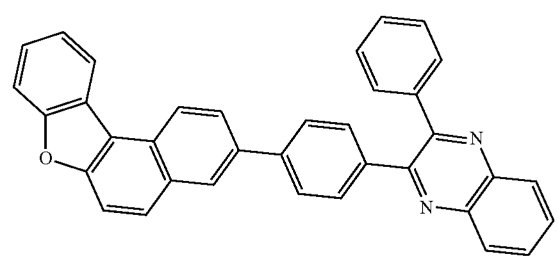
C-451
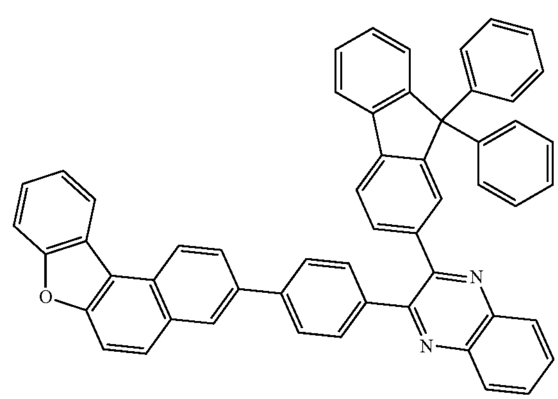

-continued
C-452
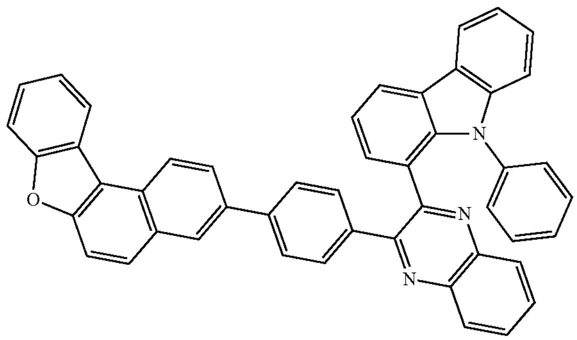
C-453
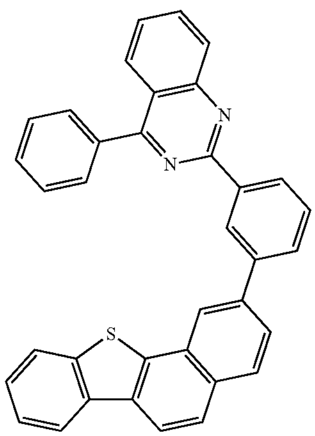
C-454
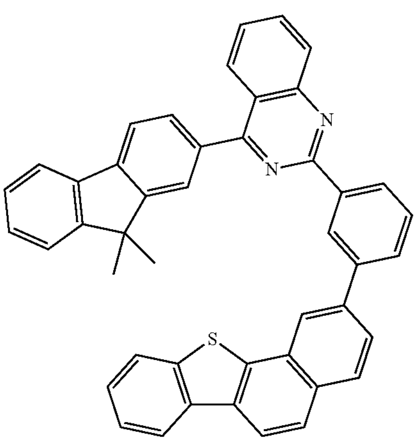
-continued
C-455
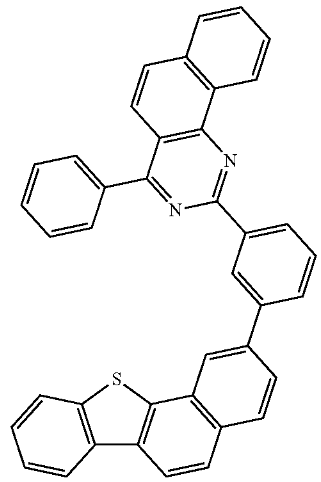
C-456
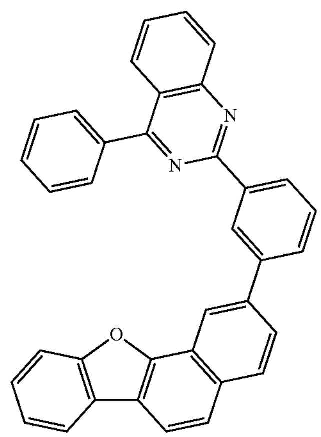
C-457
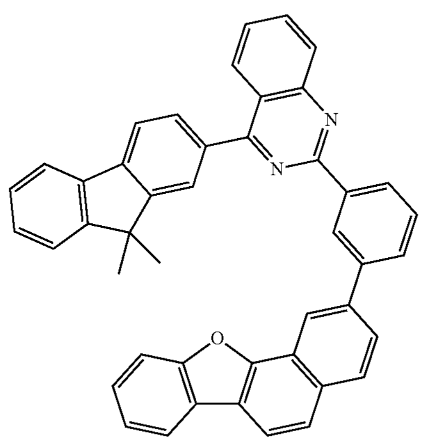

-continued
C-458
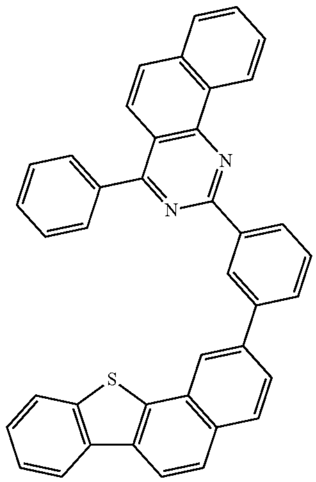
C-459
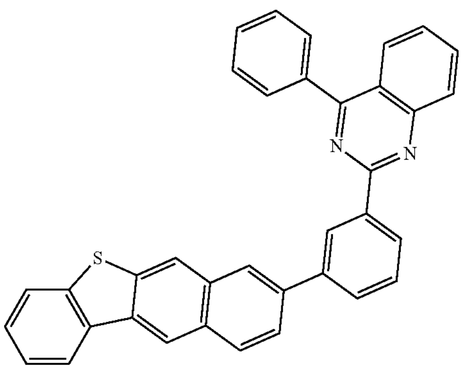
C-460
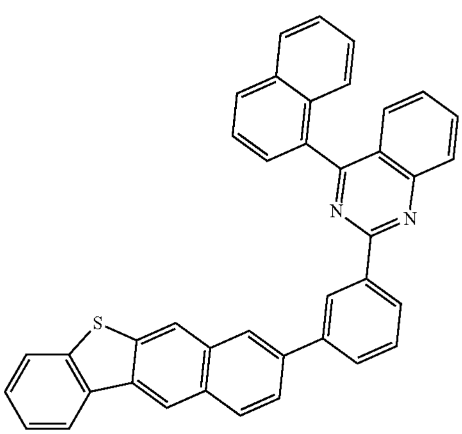
-continued
C-461
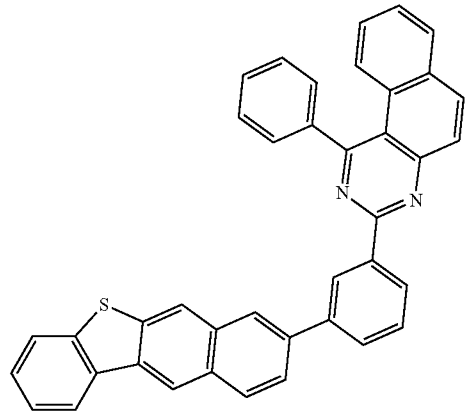
C-462
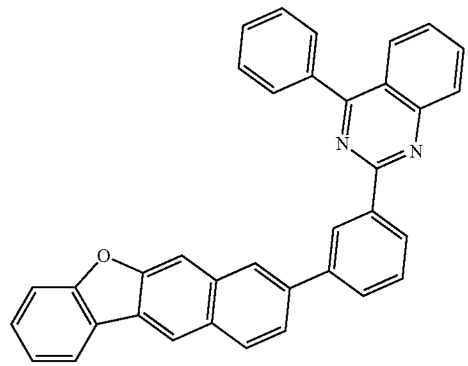
C-463
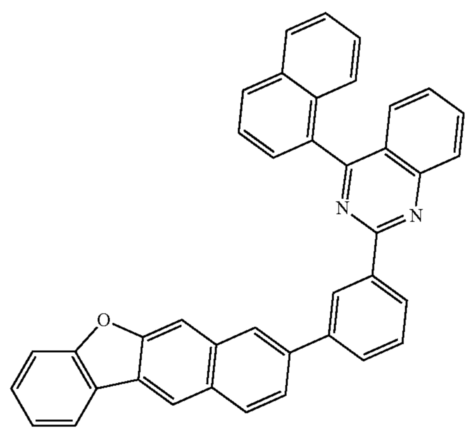
C-464
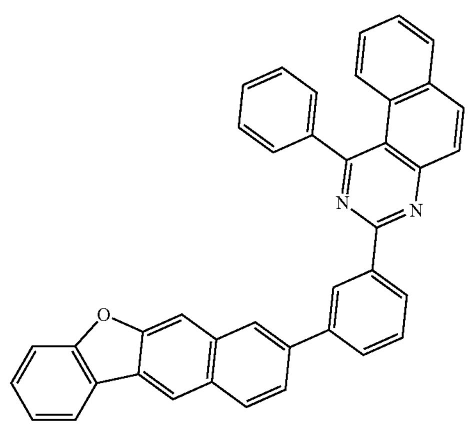

C-465
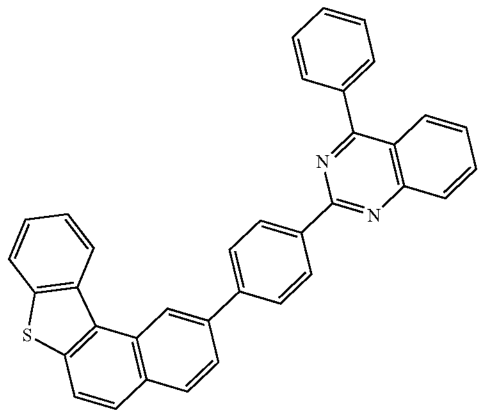
C-466
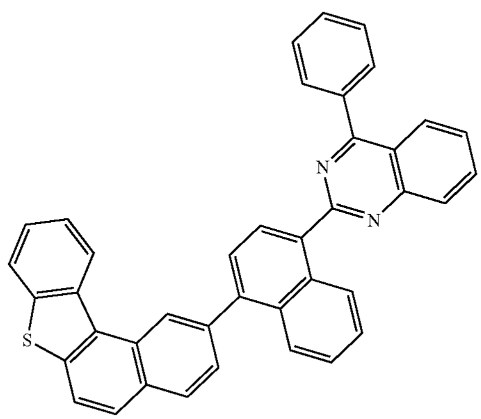
C-467
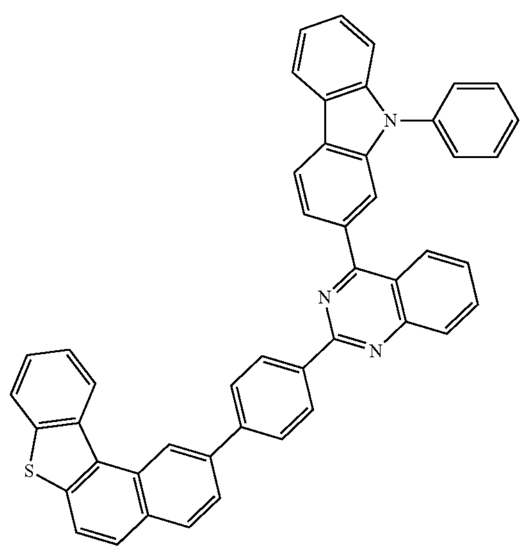
C-468
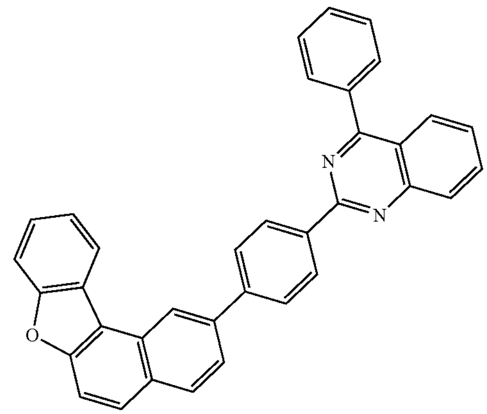
C-469
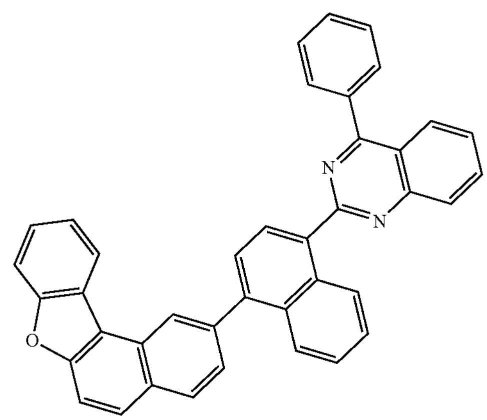
C-470
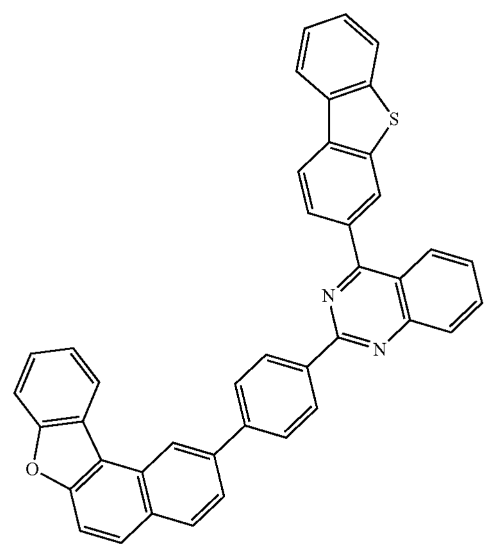

-continued
C-471
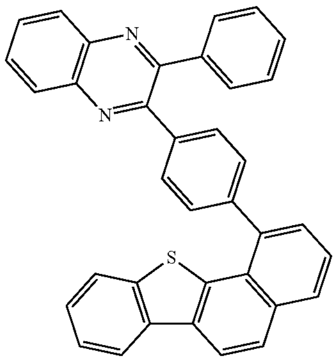
C-472
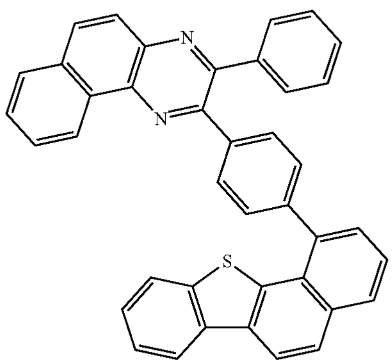
C-473
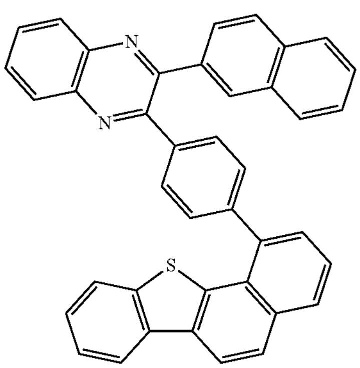
C-474
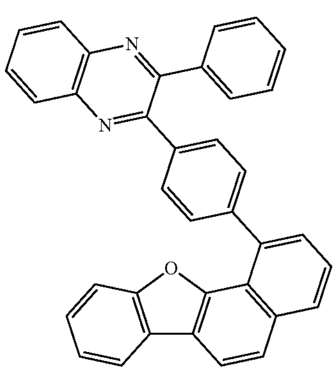
-continued
C-475
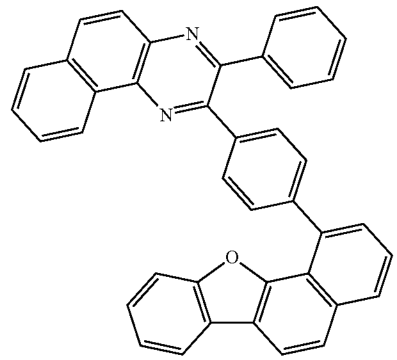
C-476
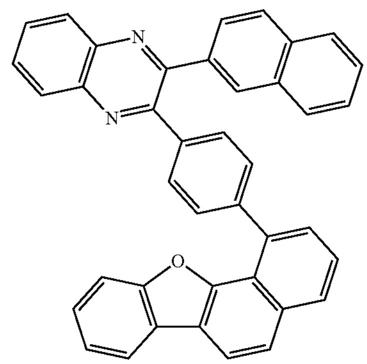
C-477
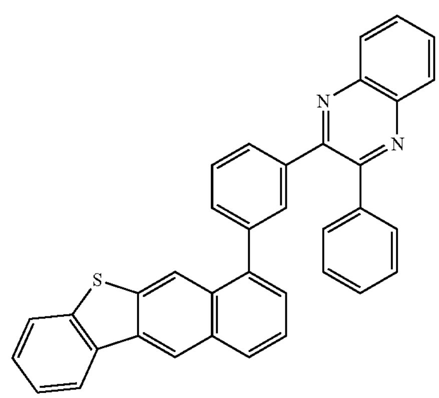
C-478
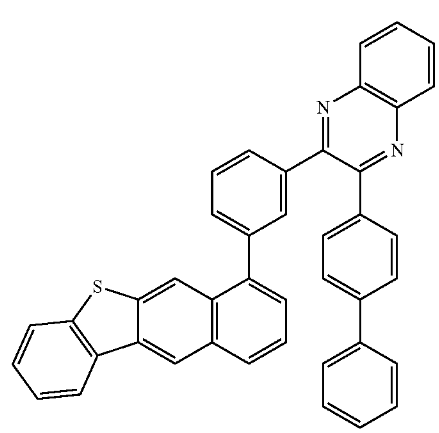

C-479
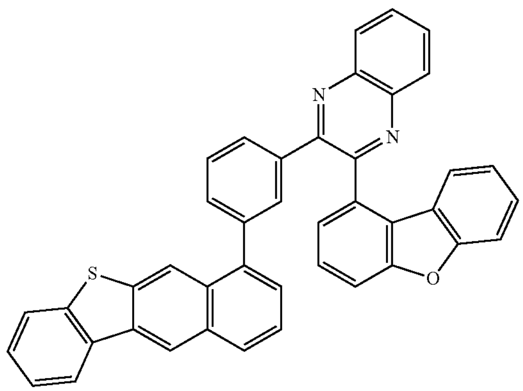
C-480
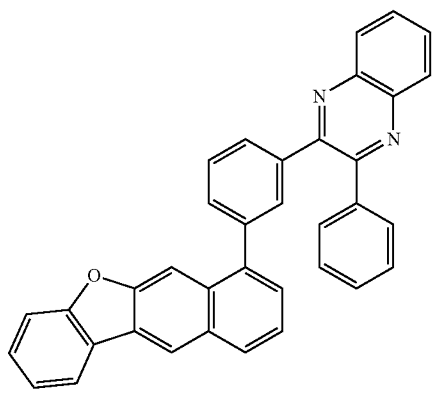
C-481
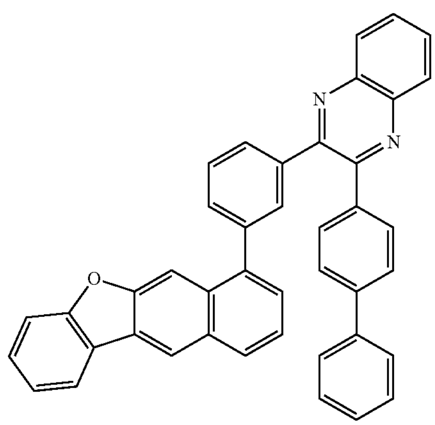
C-482
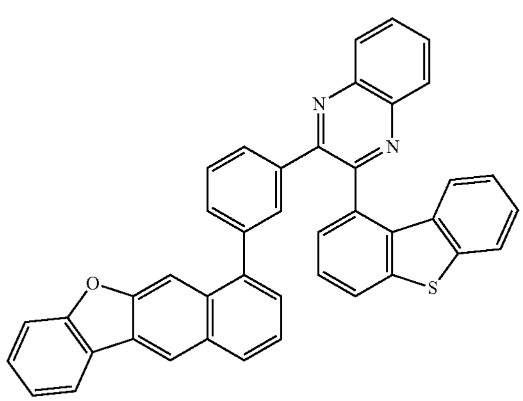
C-483
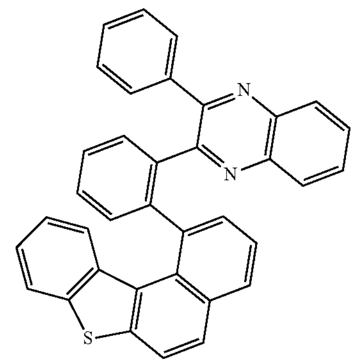
C-484
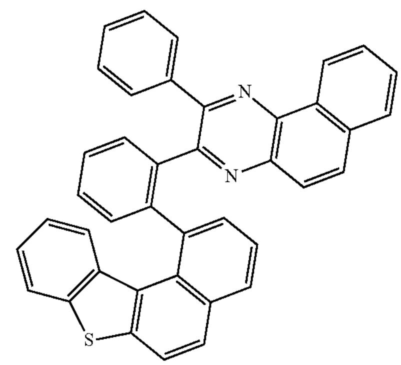
C-485
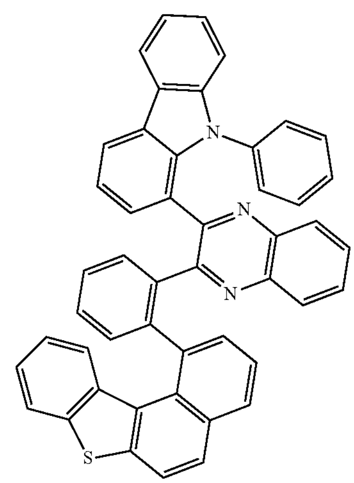
C-486
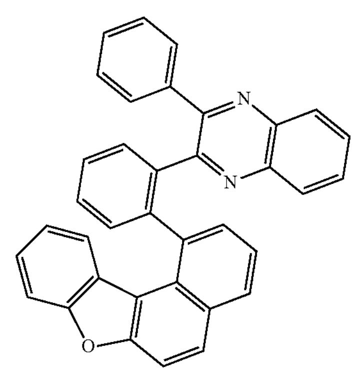

C-487
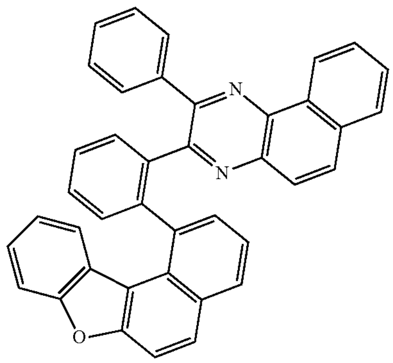
C-488
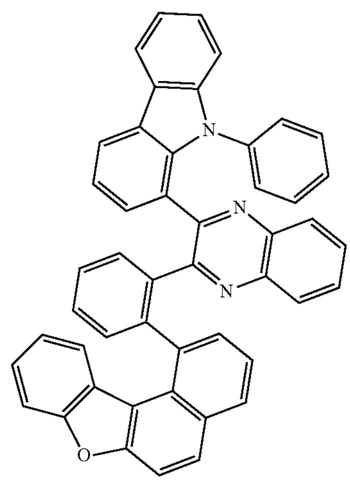
C-489
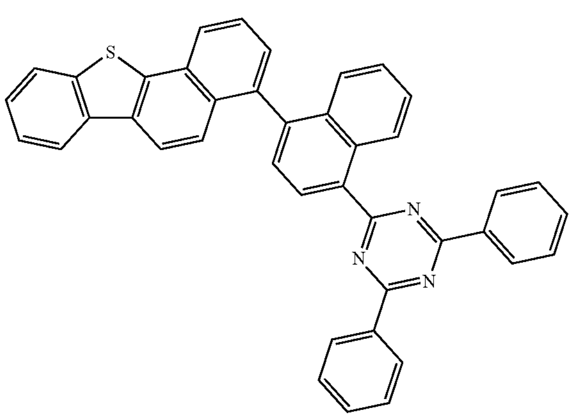
C-490
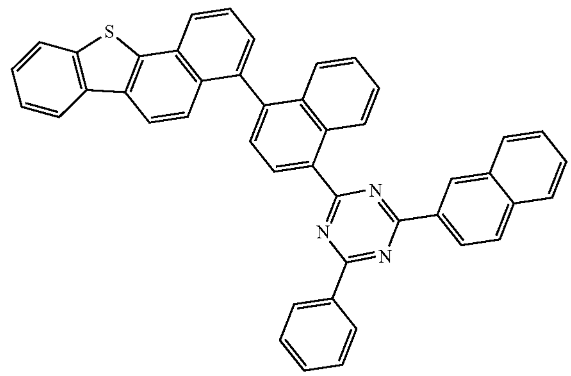
C-491
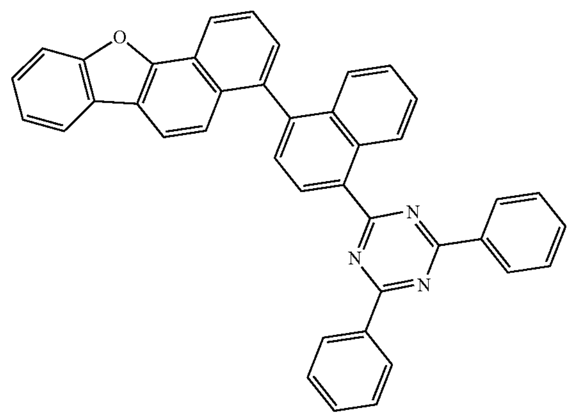
C-492
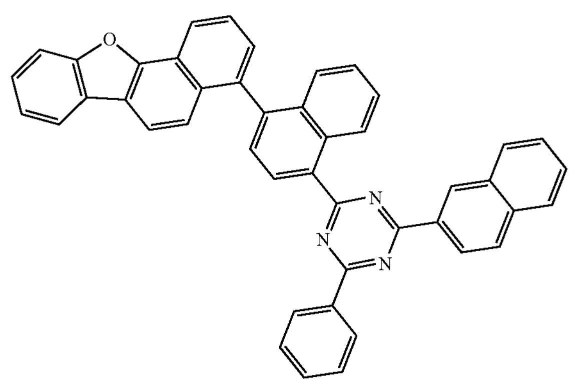

-continued
C-493
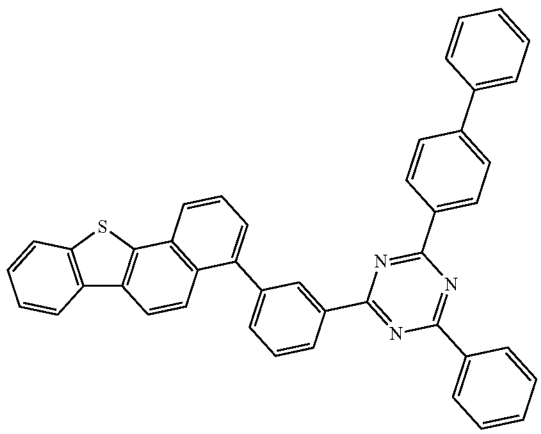
C-494
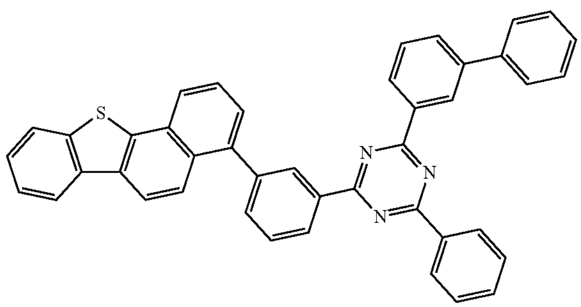
C-495
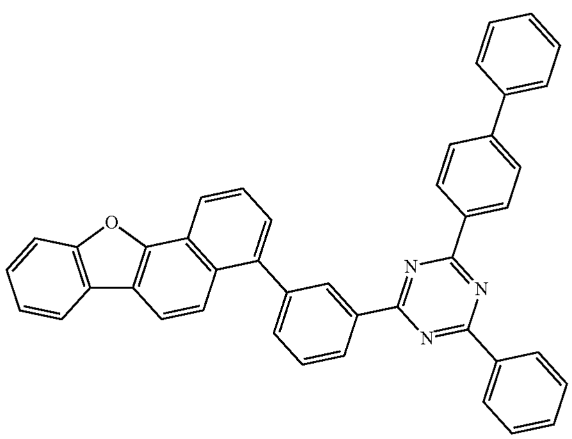
C-496
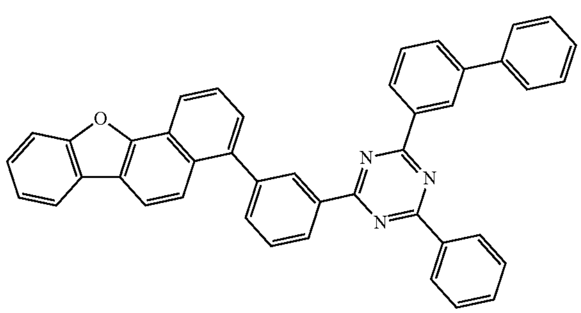
-continued
C-497
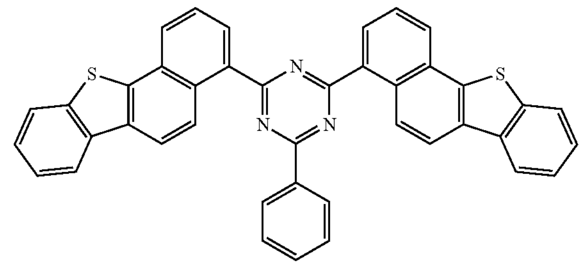
C-498
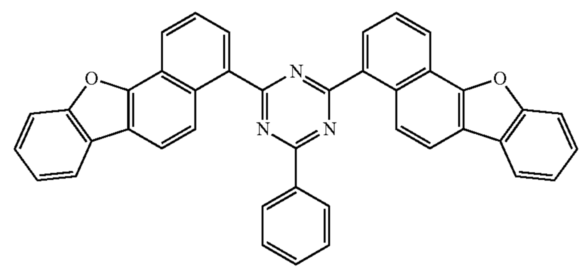
C-499
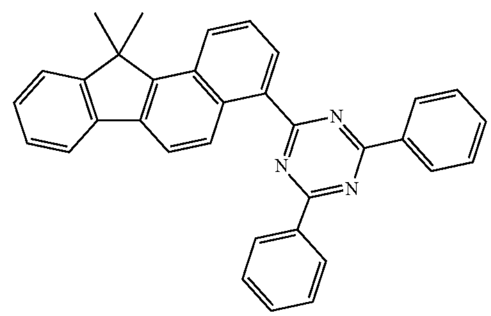
C-500
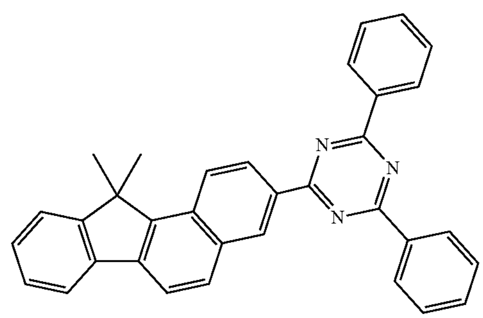
C-501
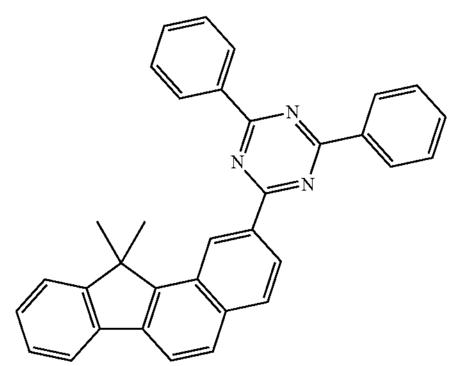

C-502
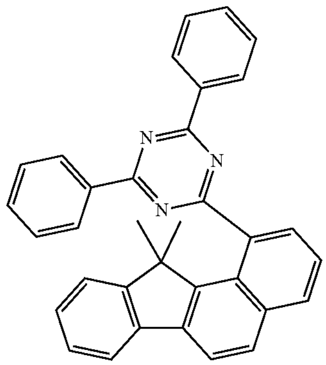
C-503
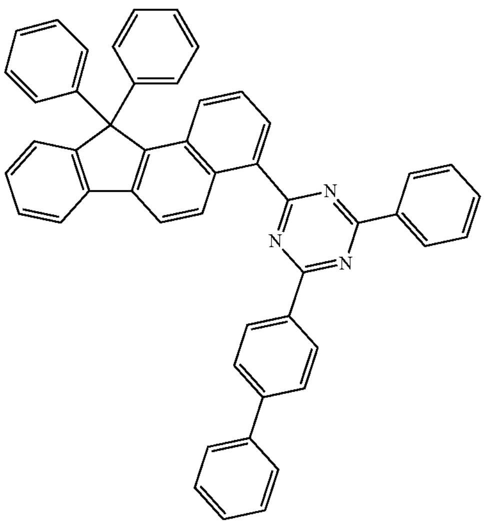
C-504
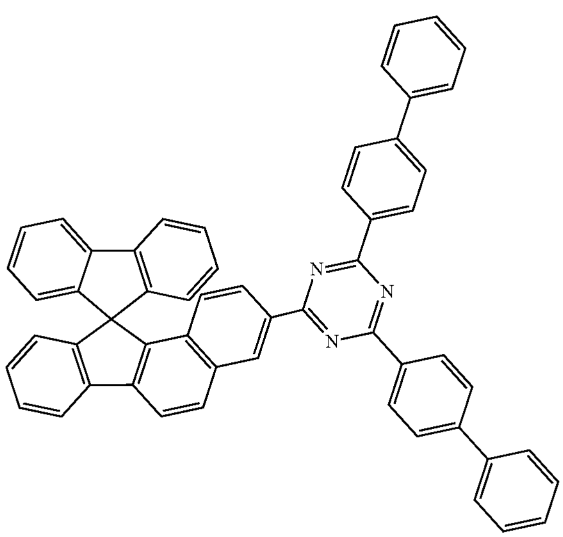
C-505
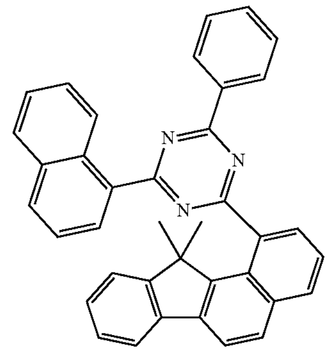
C-506
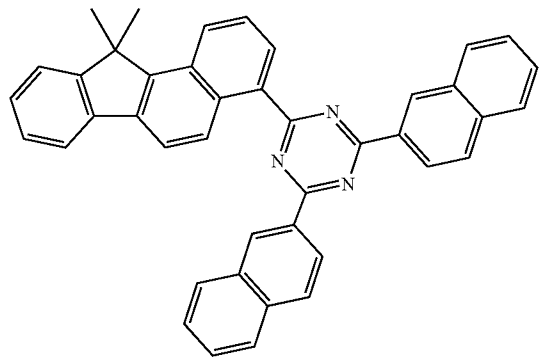
C-507
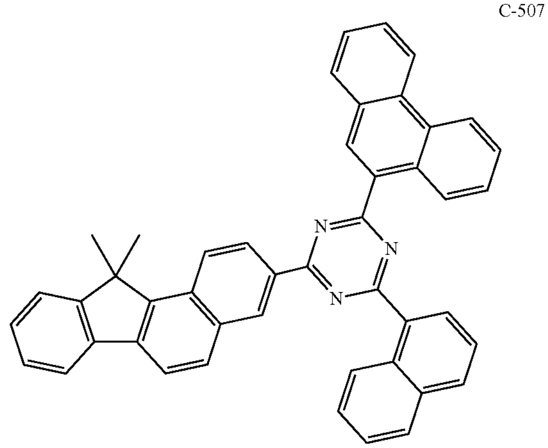
C-508
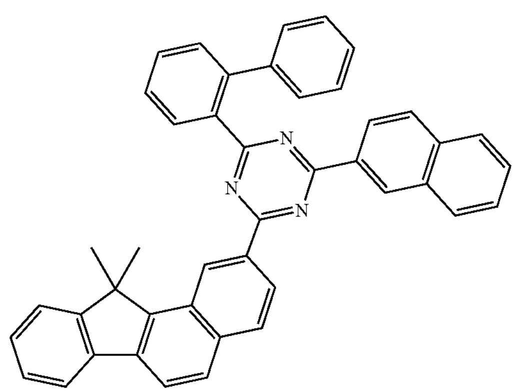

-continued
C-509
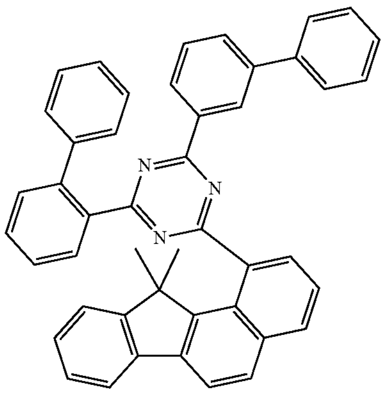
C-510
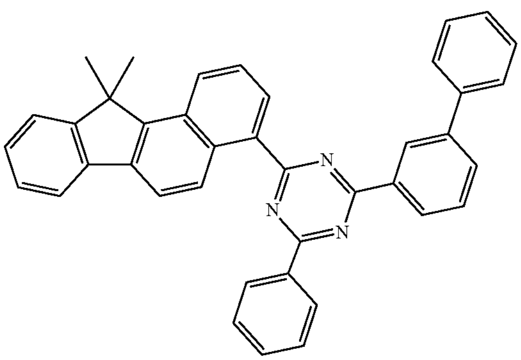
C-511
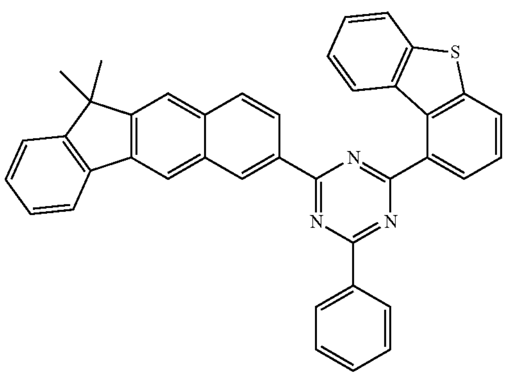
C-512
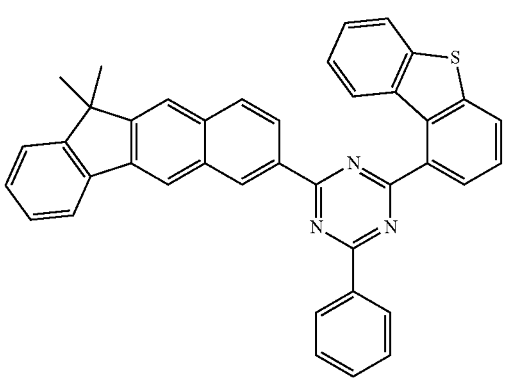
-continued
C-513
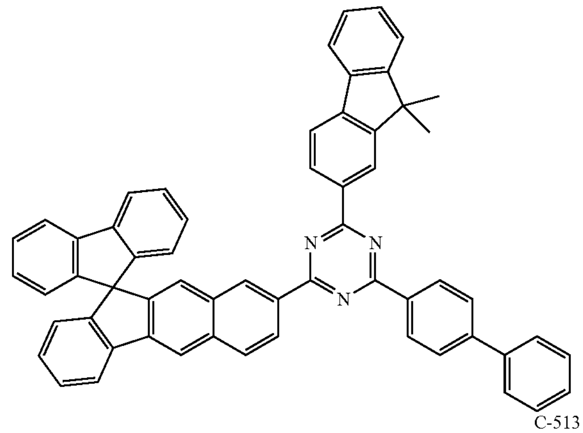
C-513
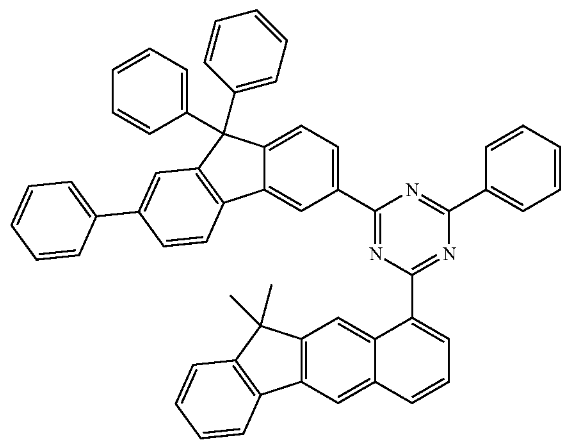
C-514
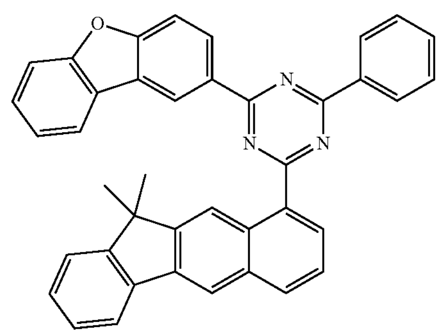
C-515
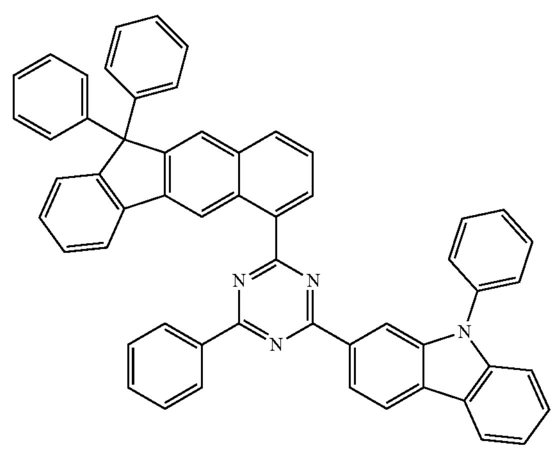

C-516
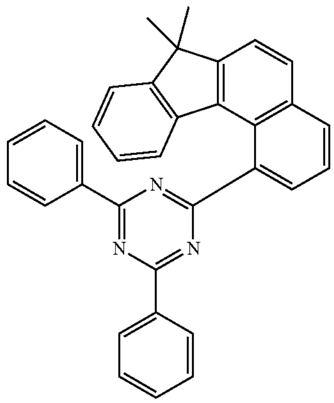
C-517
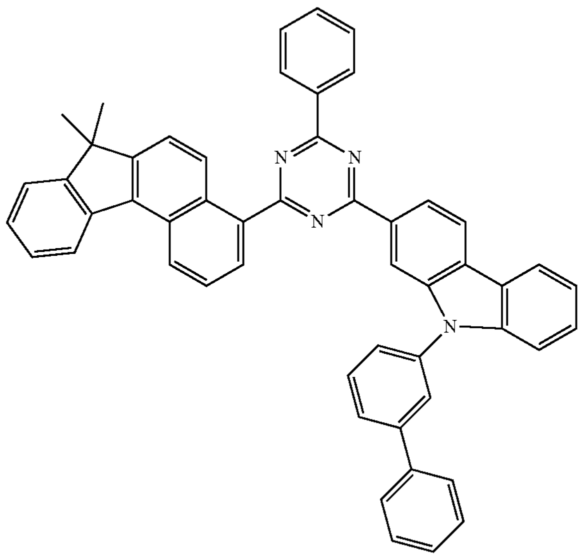
C-518
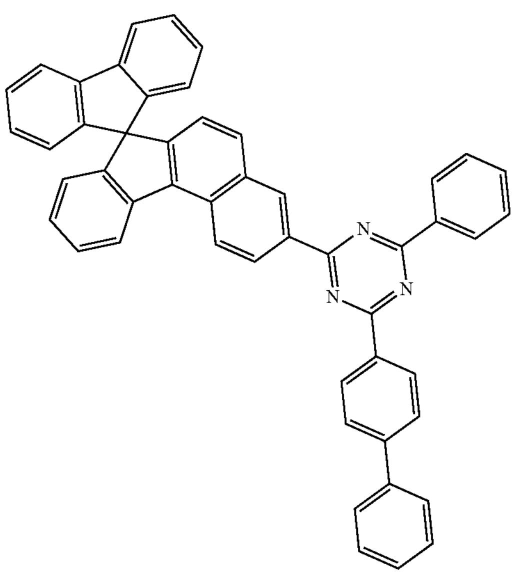
C-519
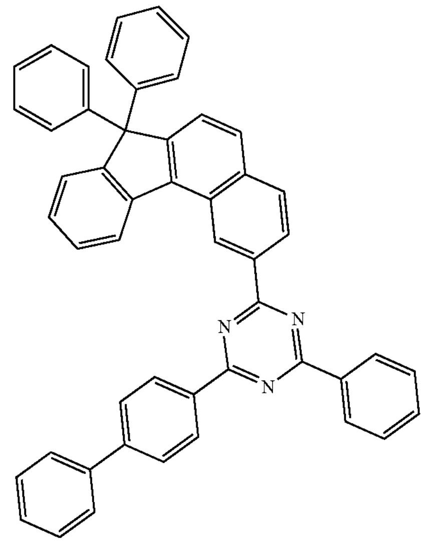
C-520
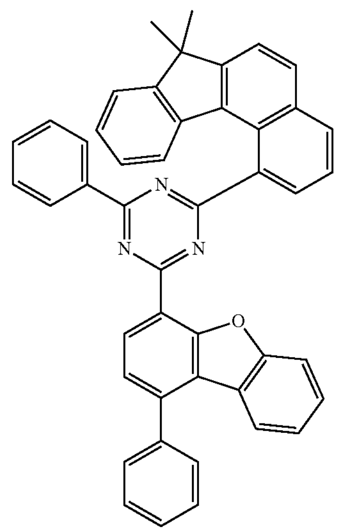
C-521
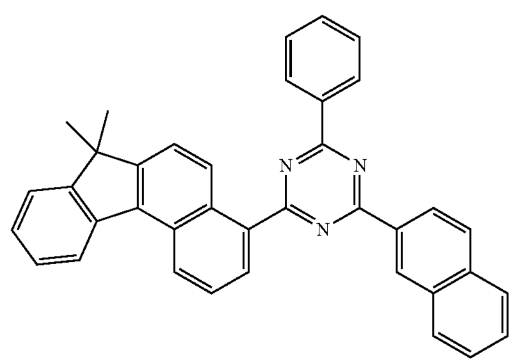

-continued
C-522
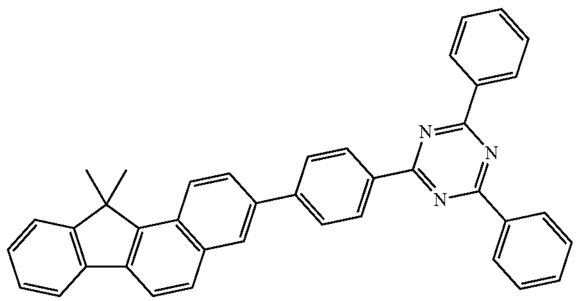
C-523
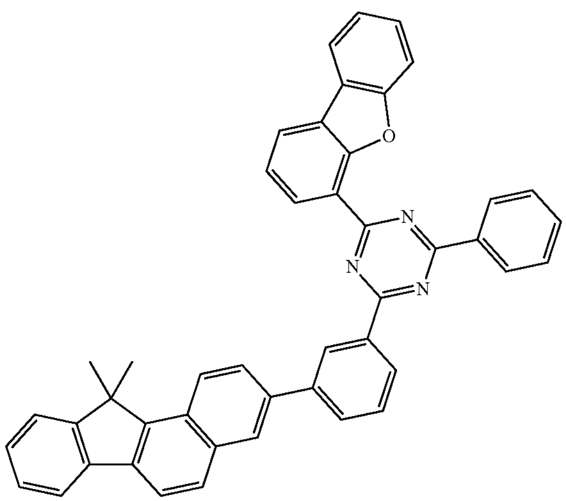
C-524
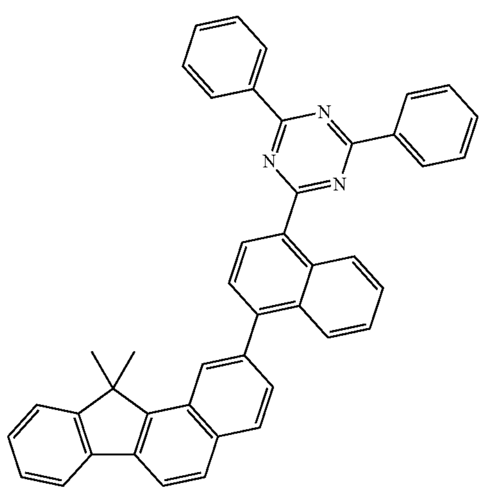
-continued
C-525
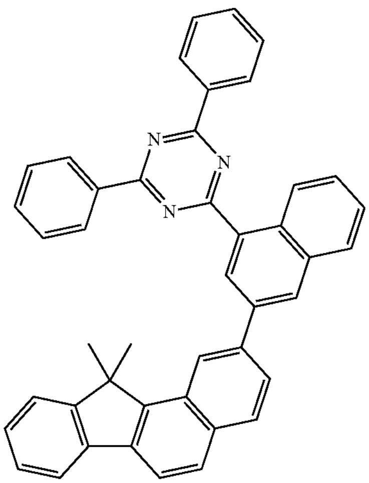
C-526
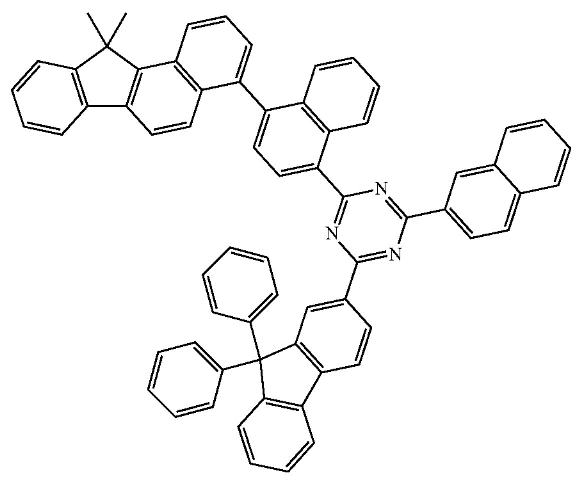
C-527
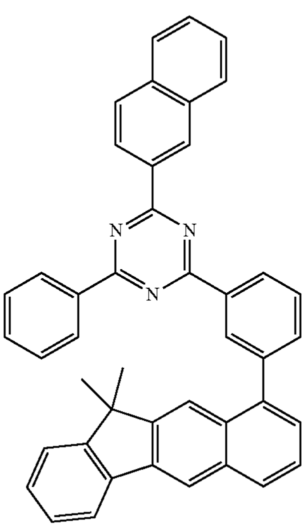

C-528
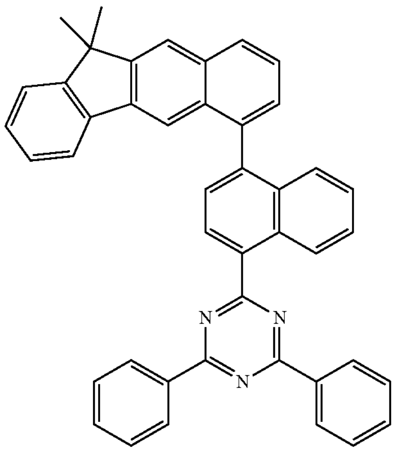
C-529
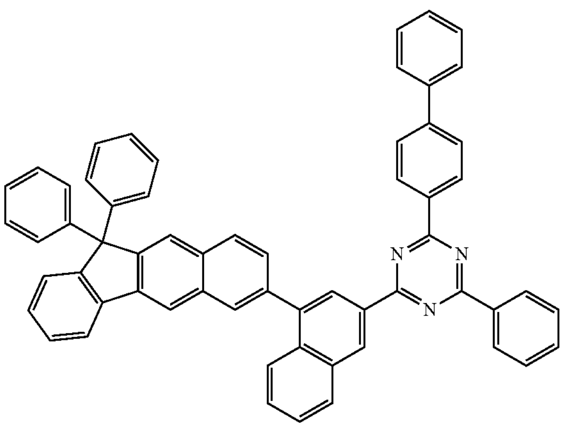
C-530
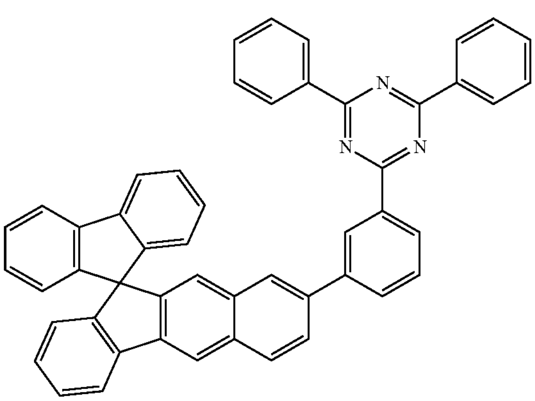
C-531
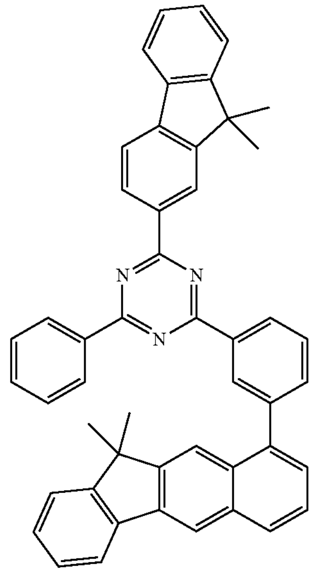
C-532
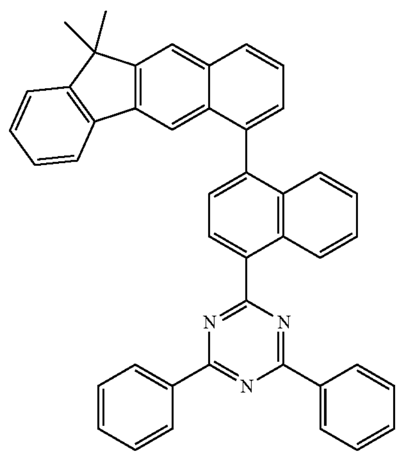
C-533
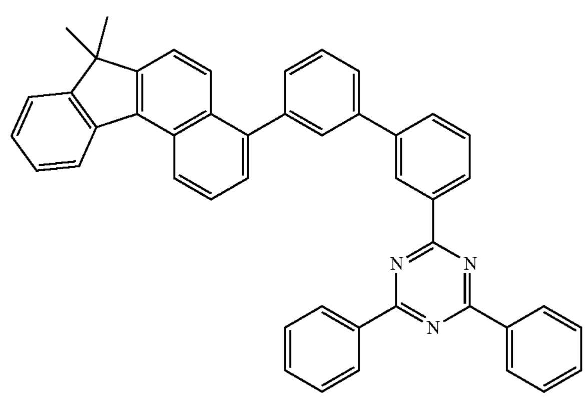

C-534
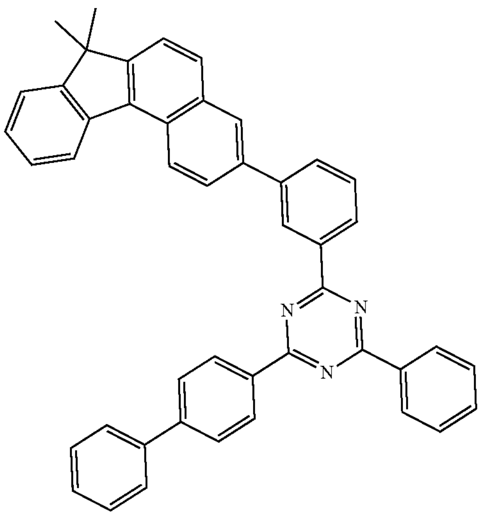
C-535
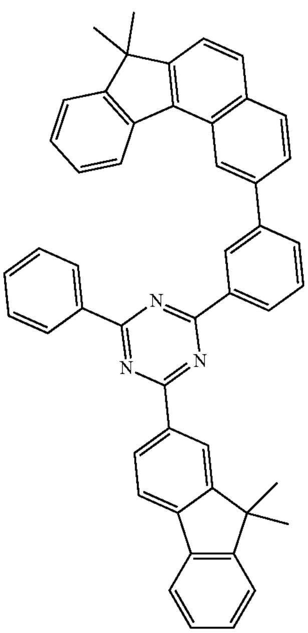
C-536
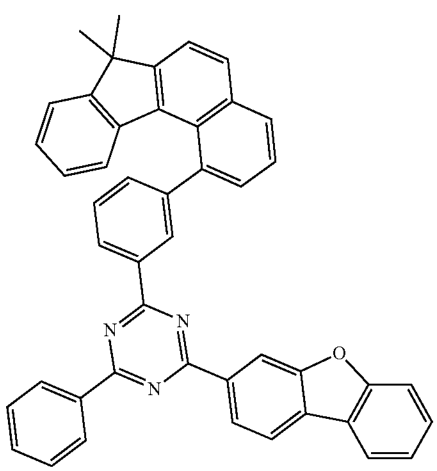
C-537
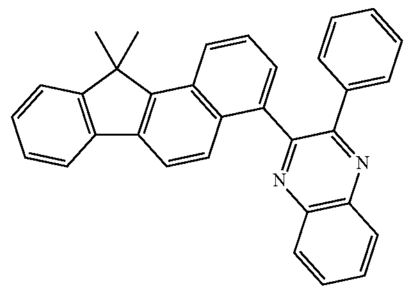
C-538
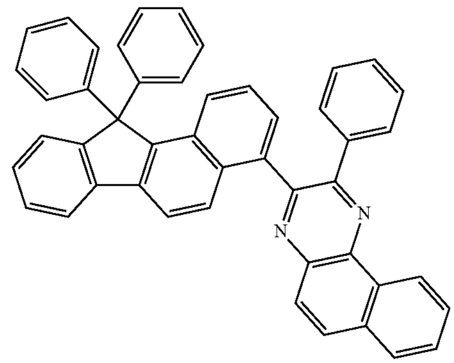
C-539
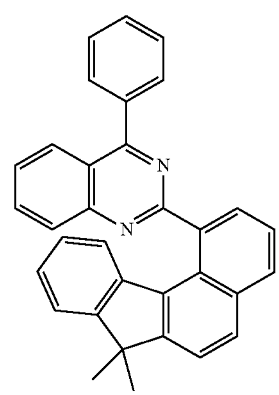
C-540
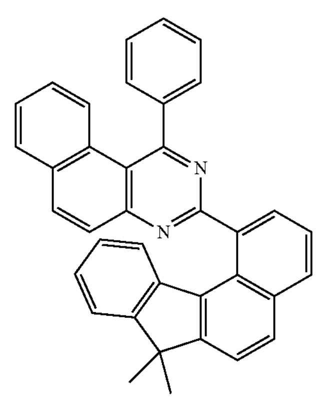

C-541
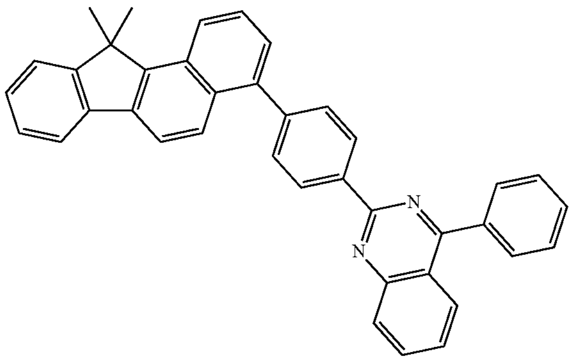
C-542
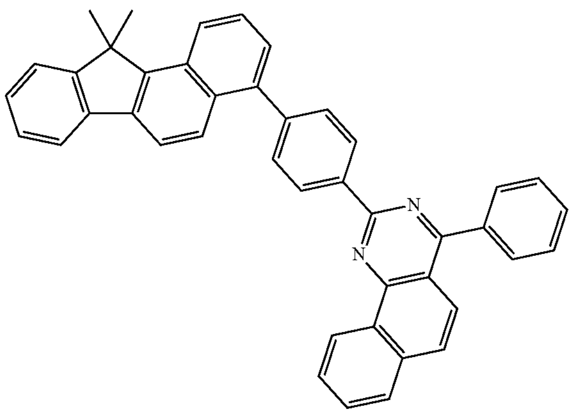
C-543
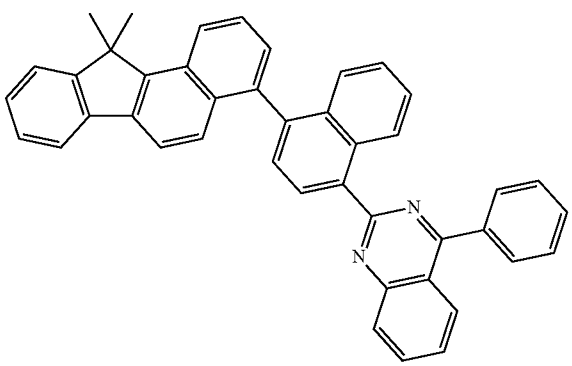
C-544
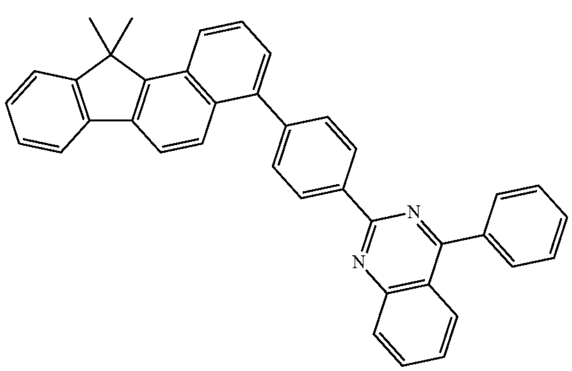
C-545
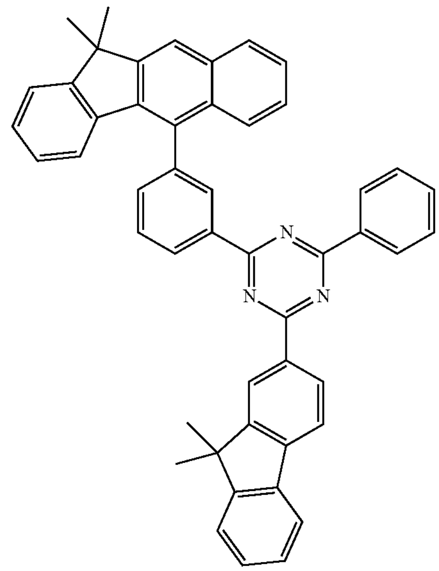
C-546
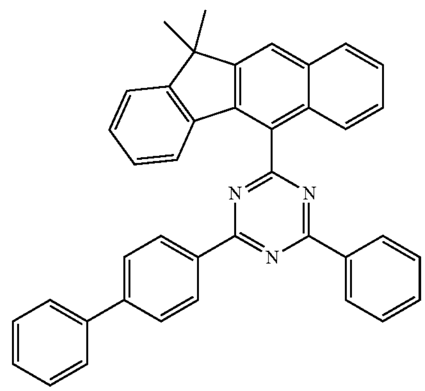
C-547
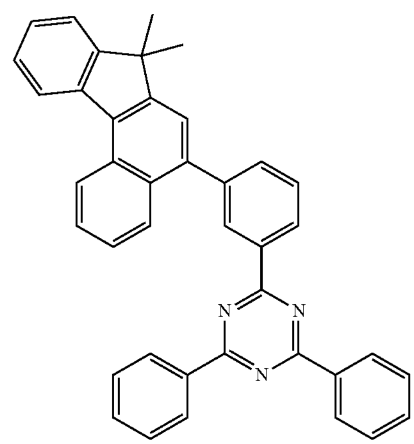

-continued
C-548
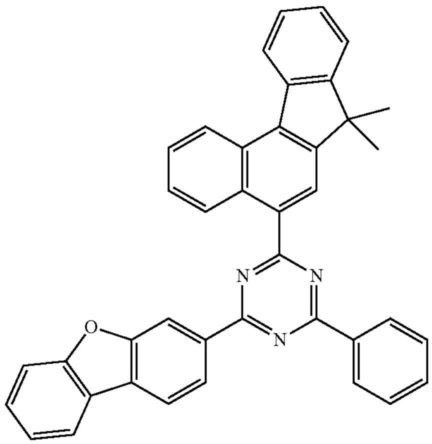
C-549
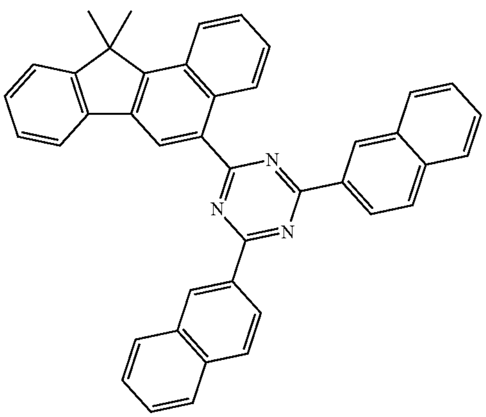
C-550
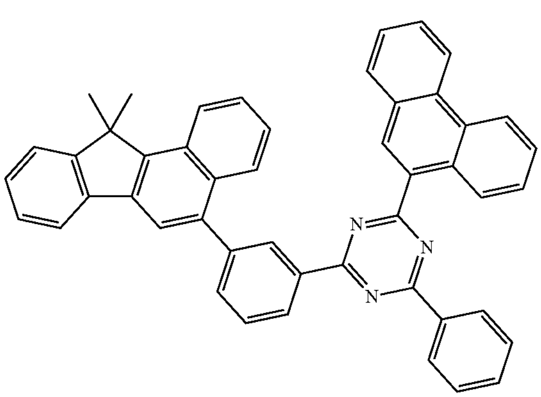
-continued
C-551
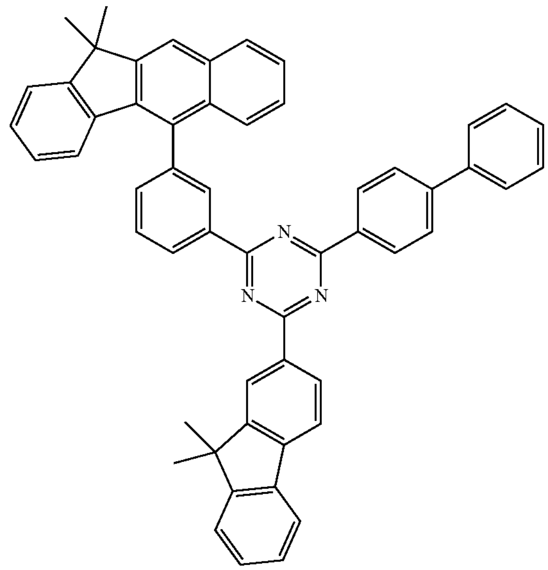
C-552
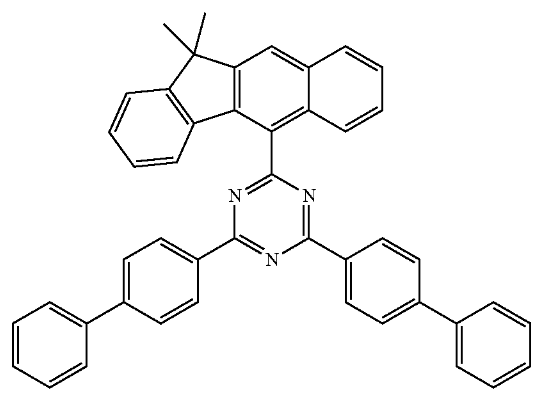
C-553
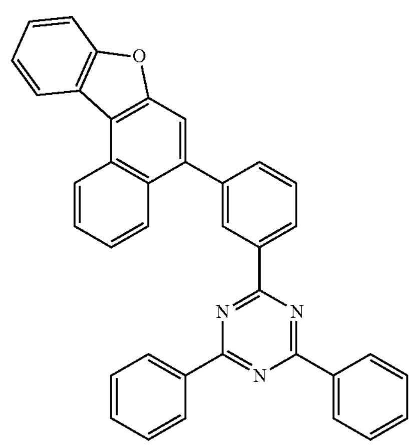

-continued
C-554
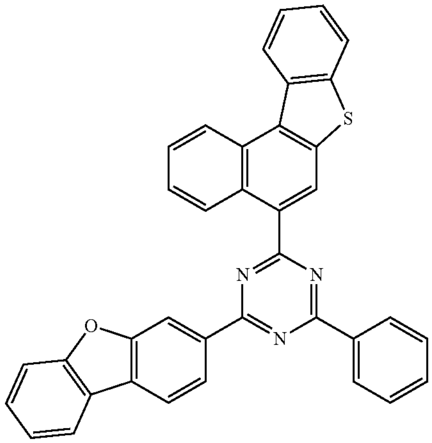
C-555
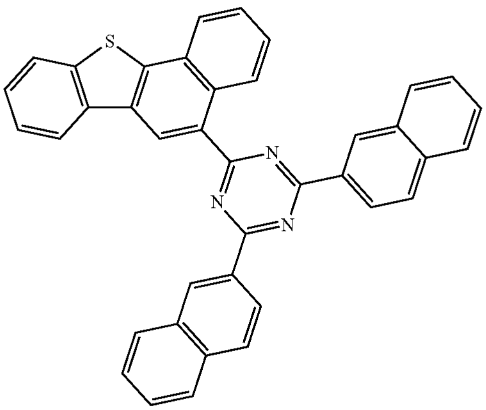
C-556
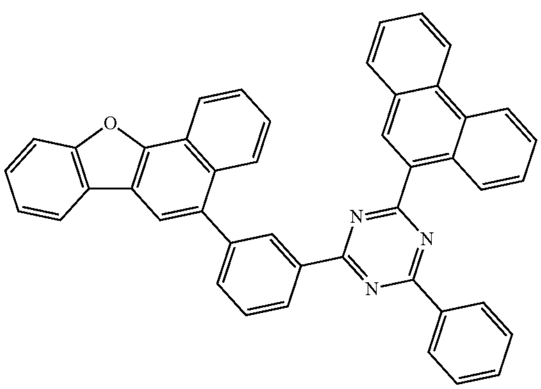
C-557
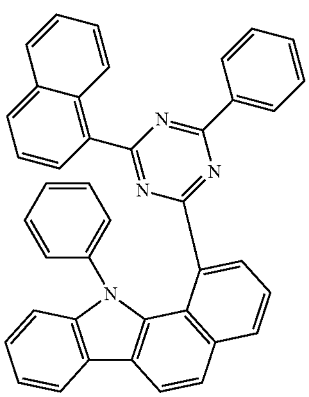
-continued
C-558
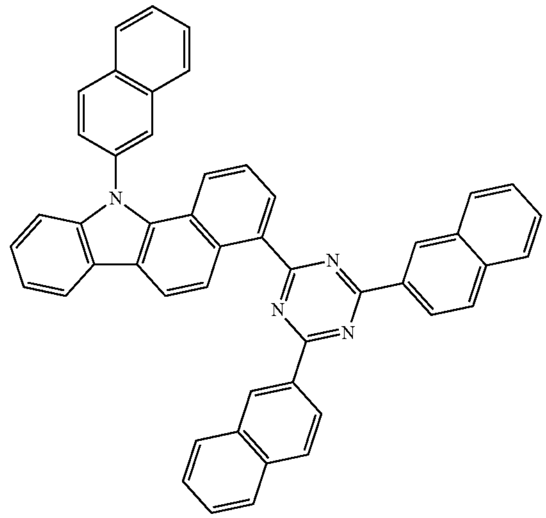
C-559
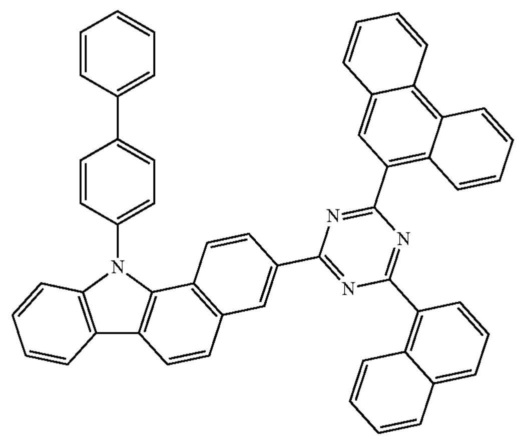
C-560
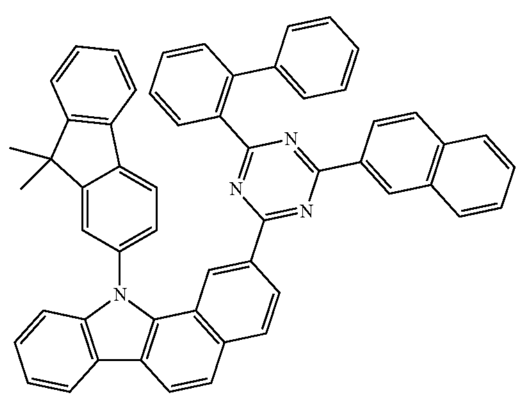

-continued
C-561
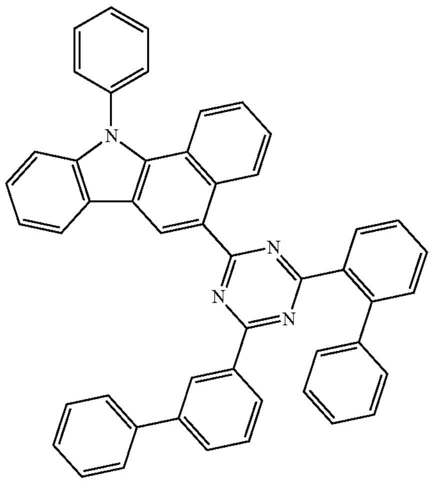
C-562
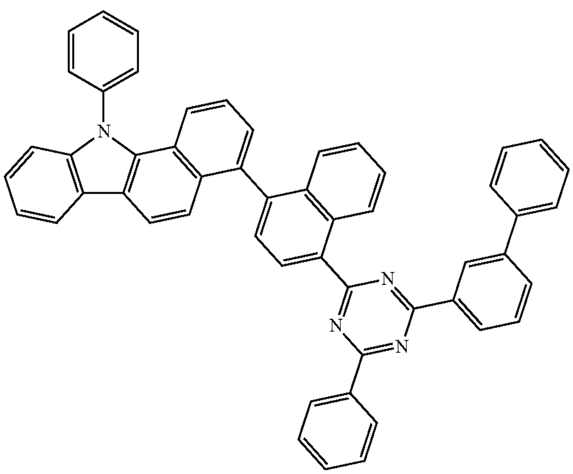
C-563
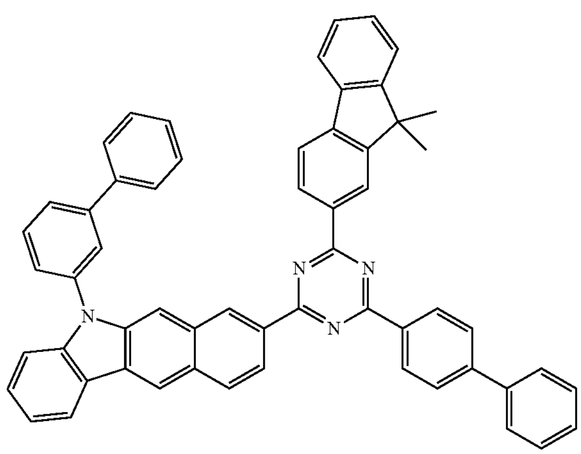
-continued
C-565
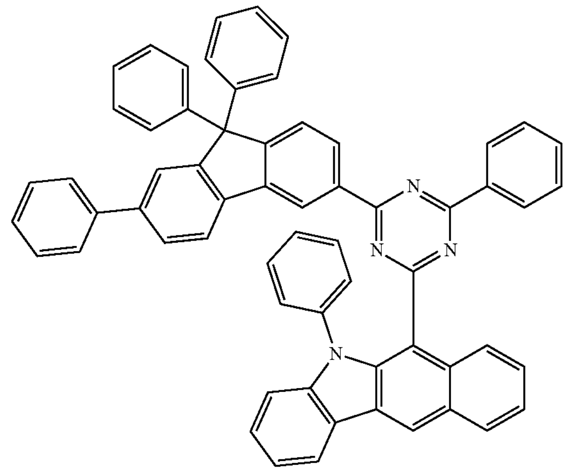
C-567
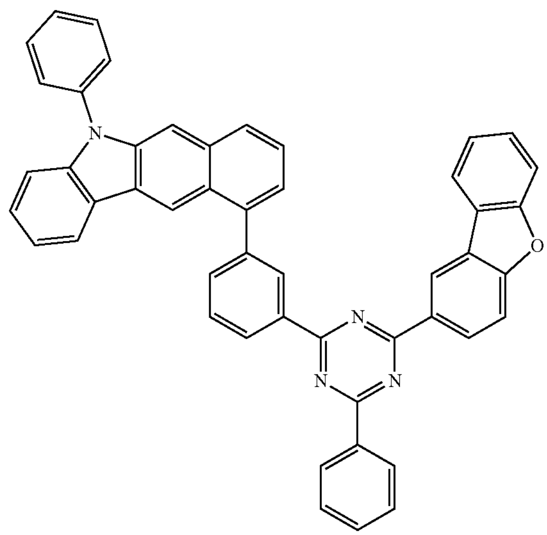
C-568
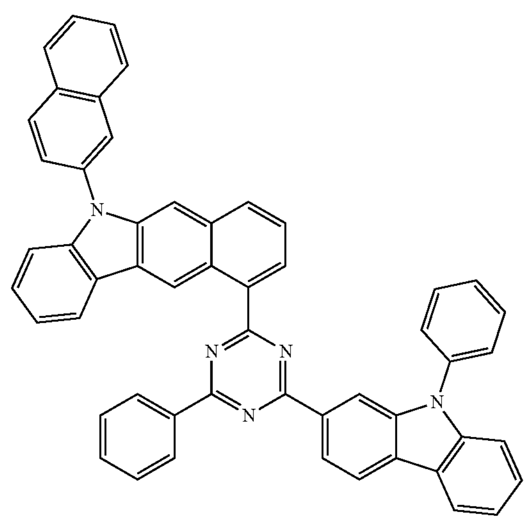

-continued
C-568
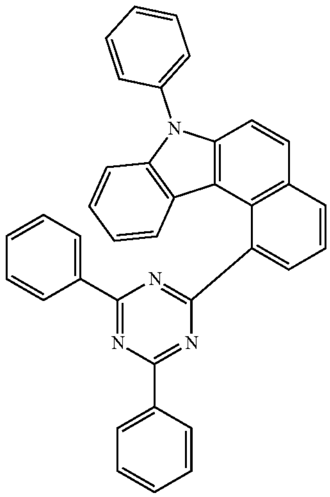
C-569
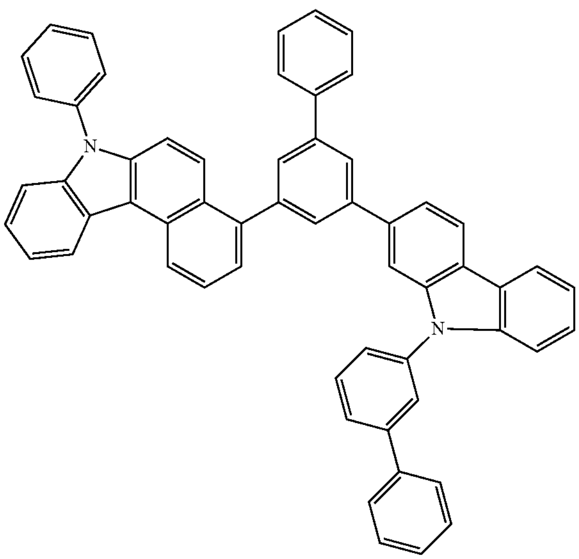
C-570
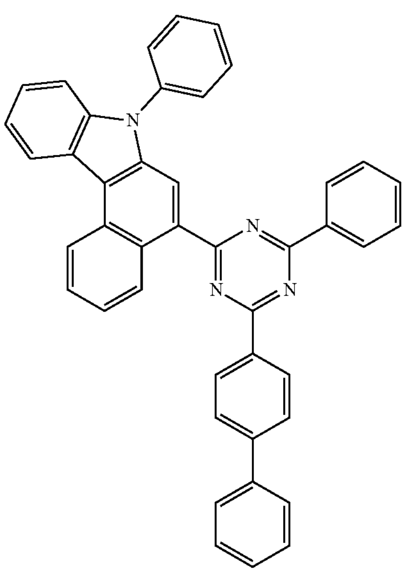
-continued
C-517
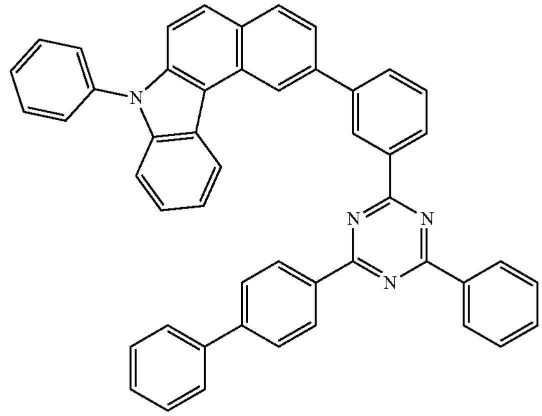
C-572
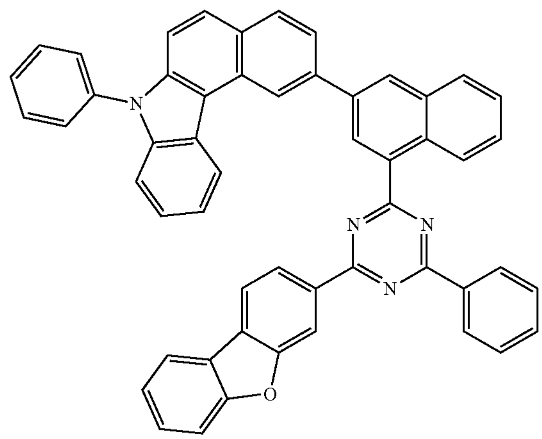
C-573
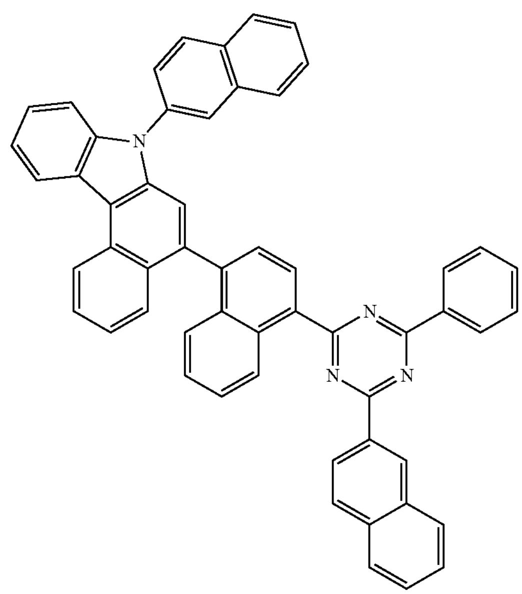

C-574
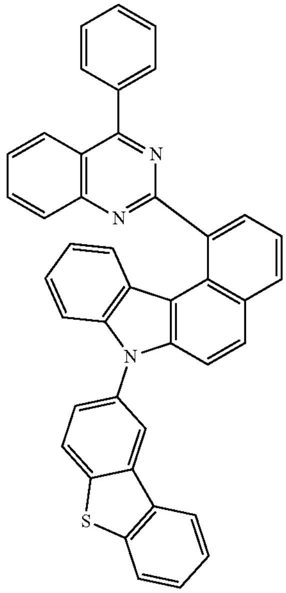
C-575
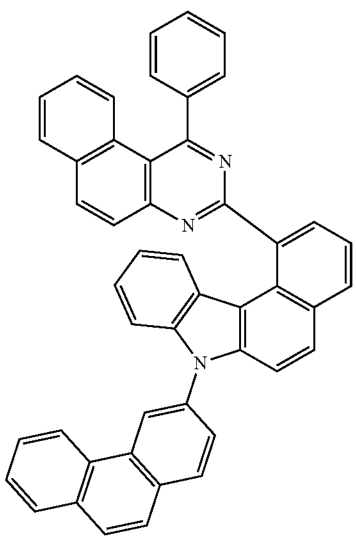
C-576
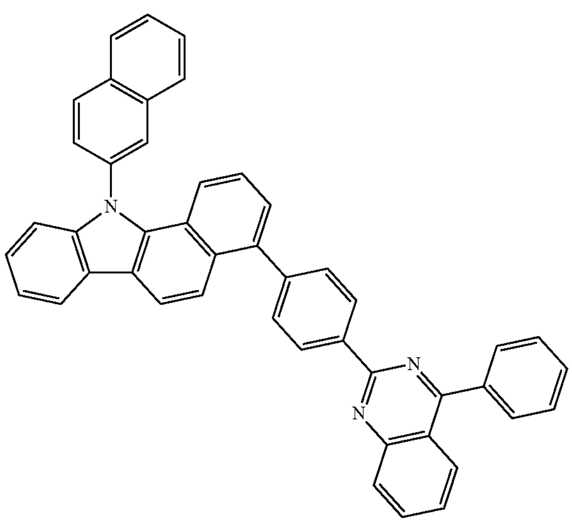
C-577
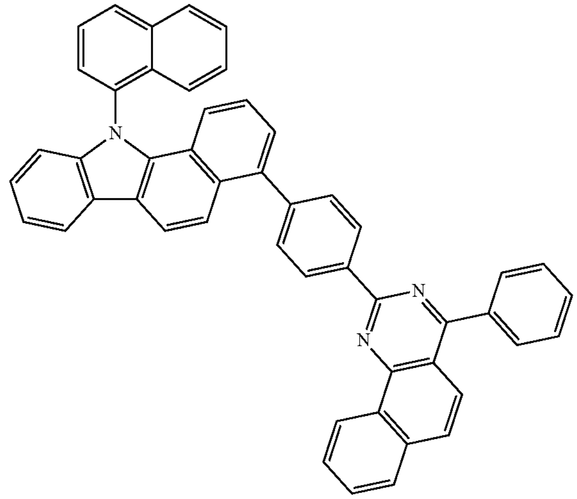
C-578
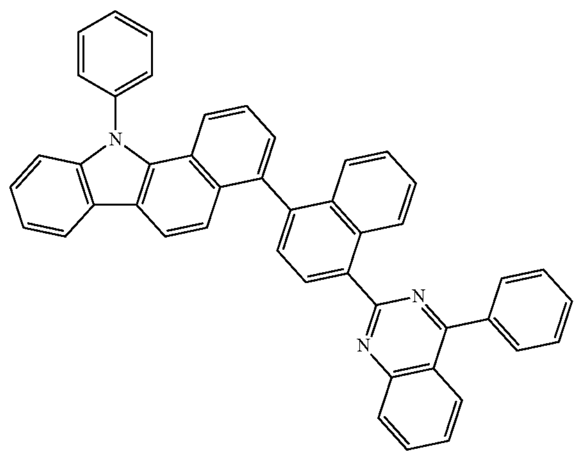
C-579
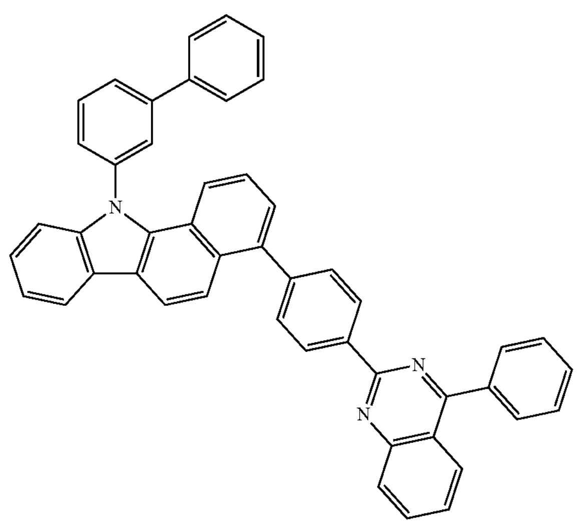

C-580
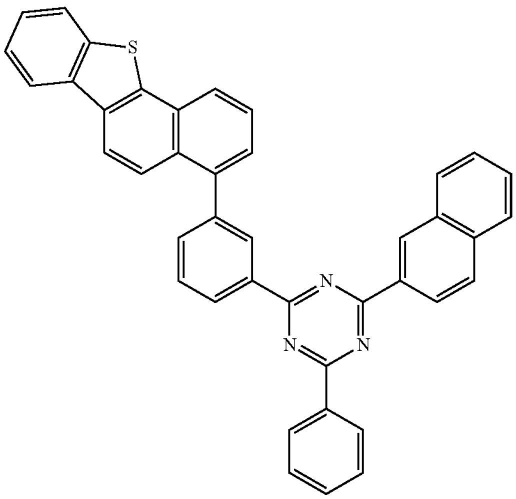
C-581
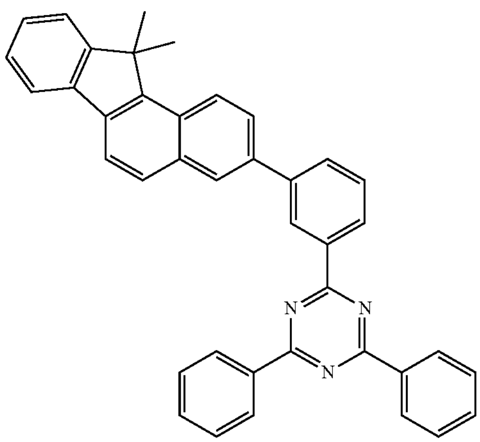
C-582
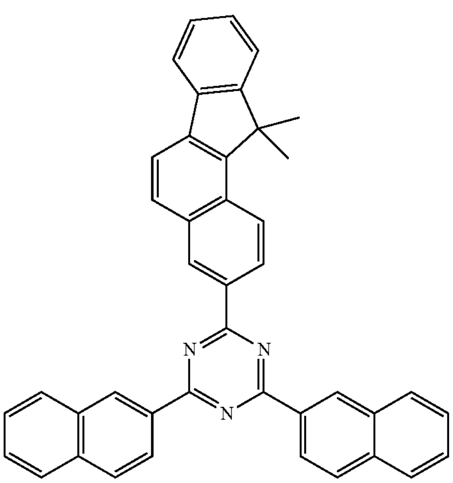
C-583
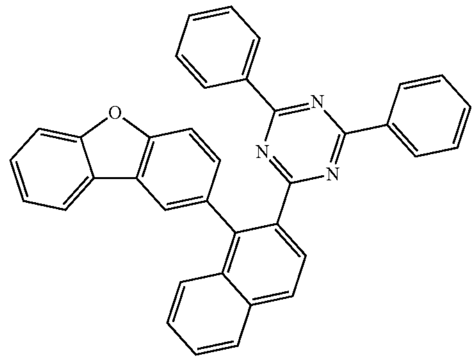
C-584
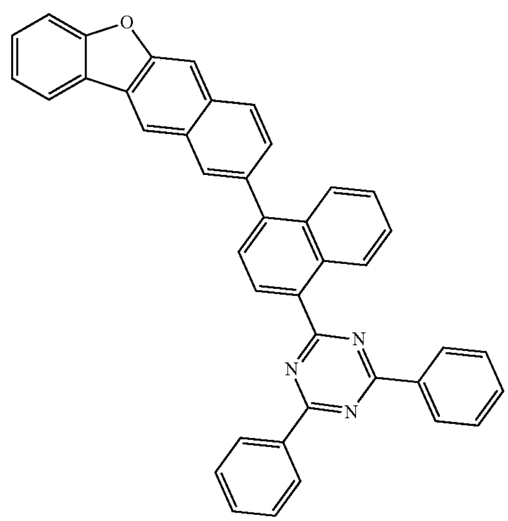
C-585
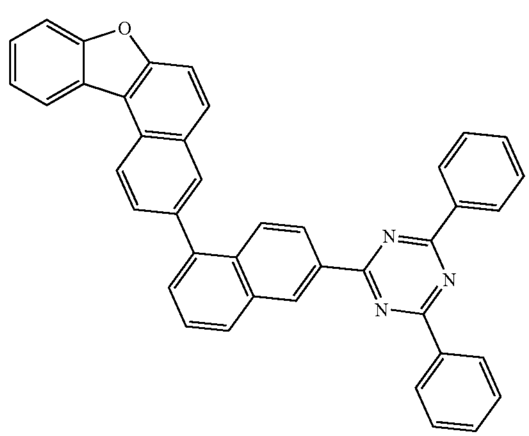

-continued
C-586
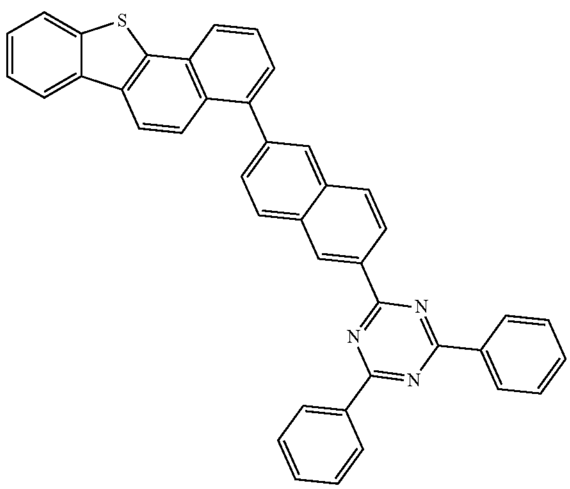
C-587
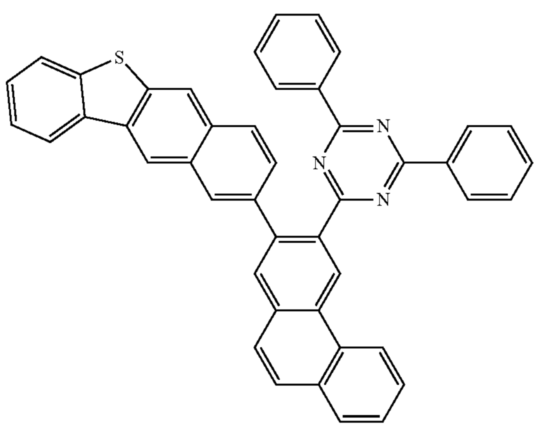
C-588
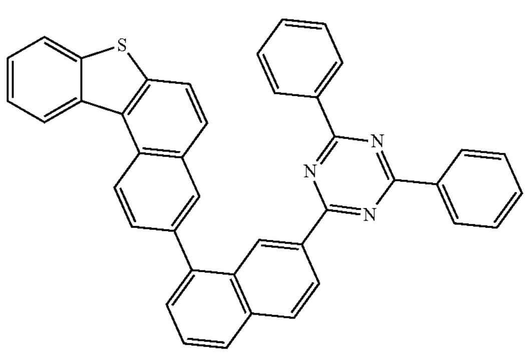
-continued
C-589
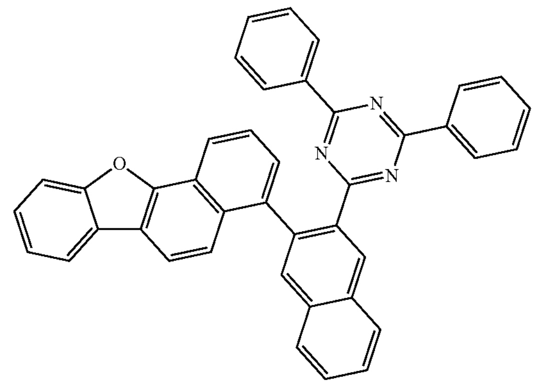
C-590
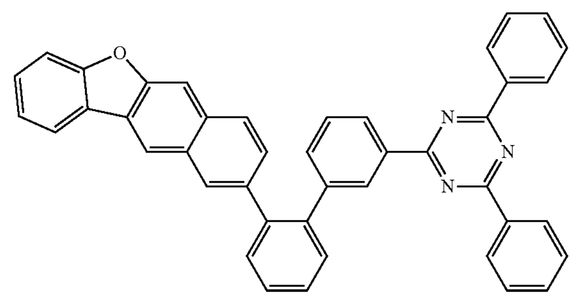
C-591
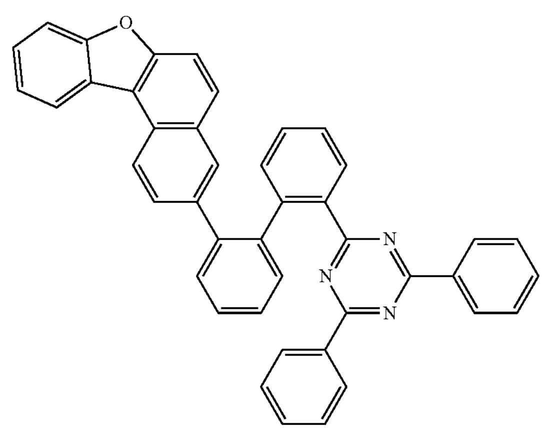
C-592
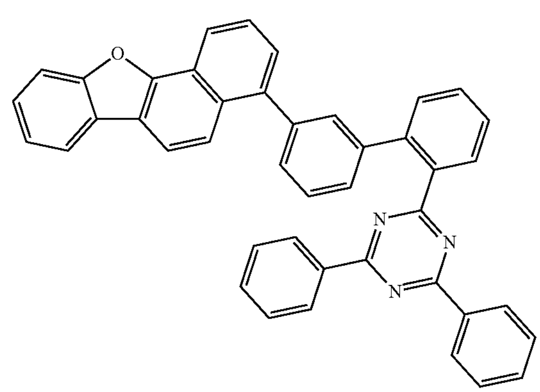

C-593
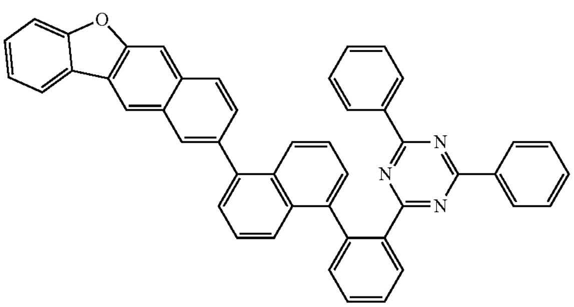
C-594
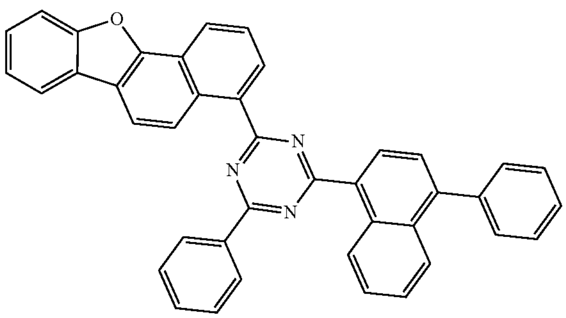
C-595
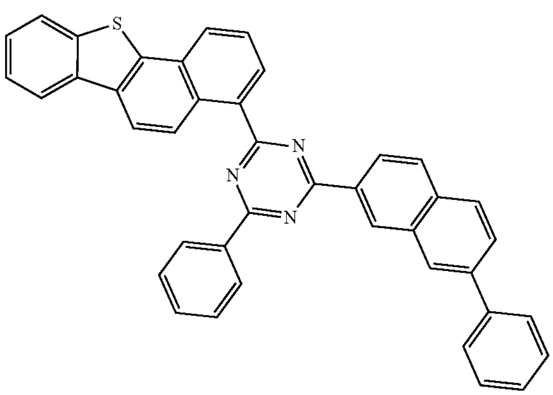
C-596
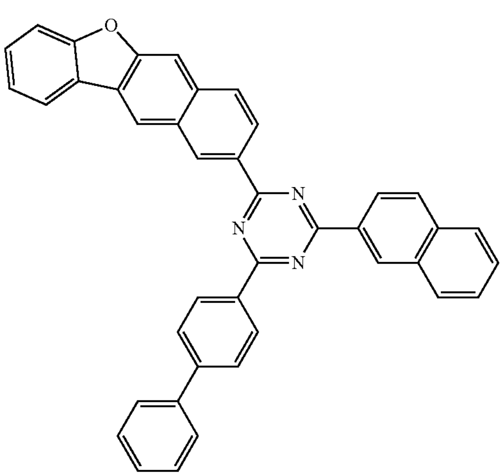
and
-continued
C-597
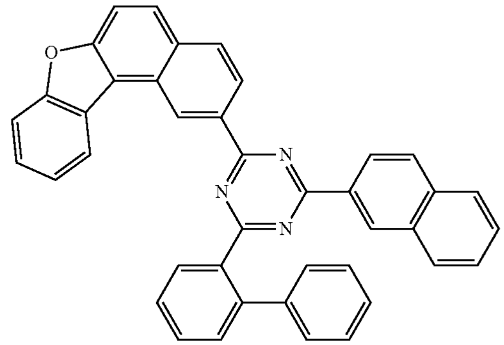
.
14. The organic electroluminescent device according to claim 4, wherein the compound represented by formula 2 is selected from the group consisting of:
H-1
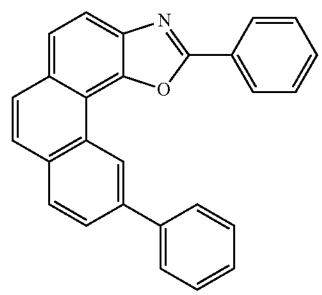
H-2
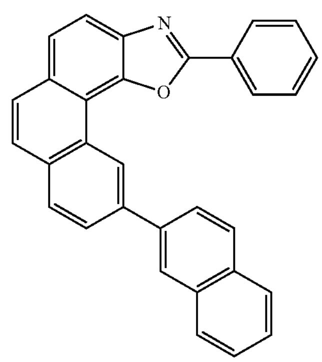
H-3
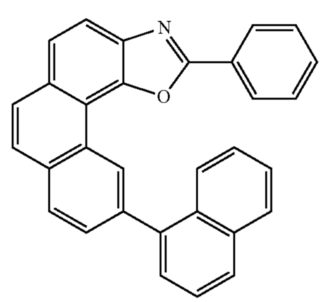

H-4
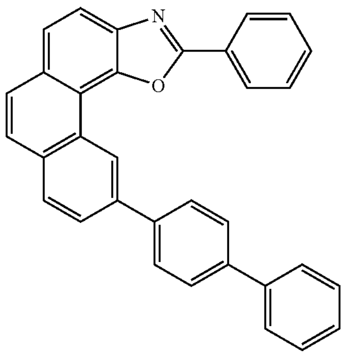
H-5
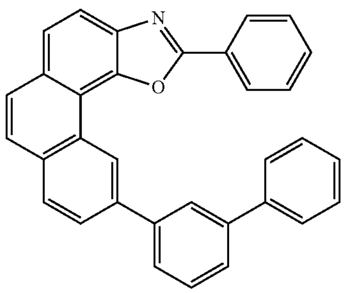
H-6
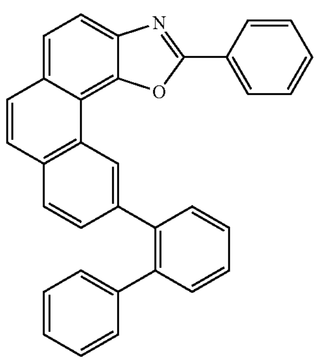
H-7
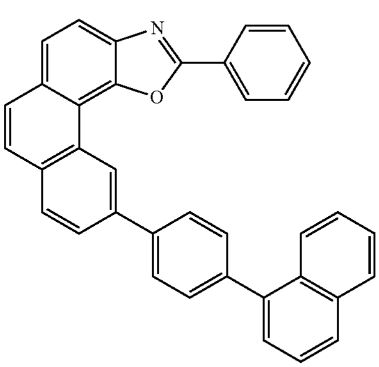
H-8
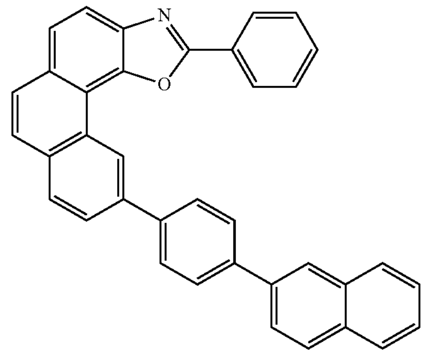
H-9
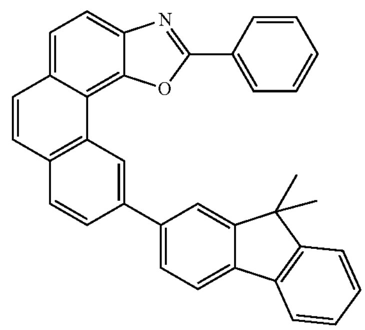
H-10
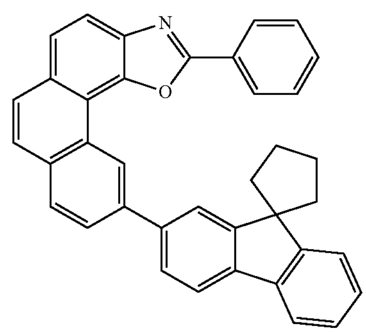
H-11
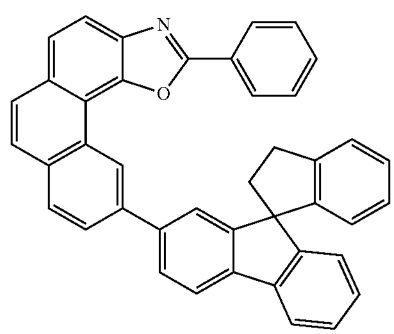

-continued
H-12
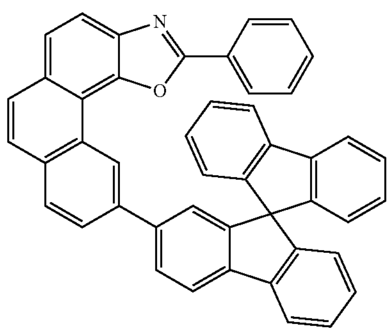
H-13
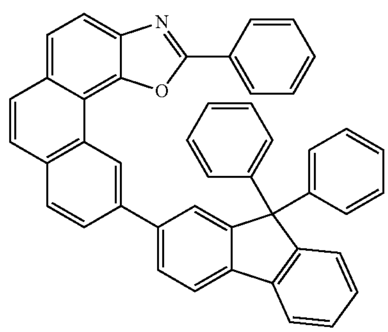
H-14
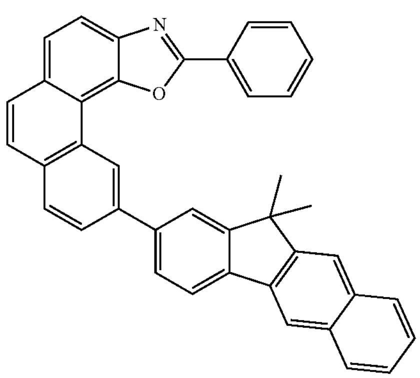
H-15
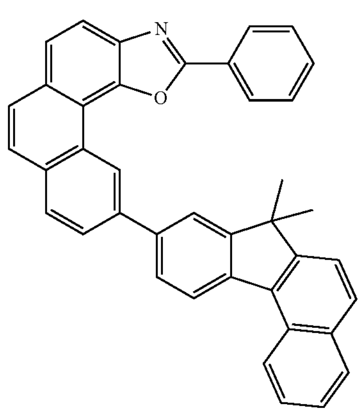
-continued
H-16
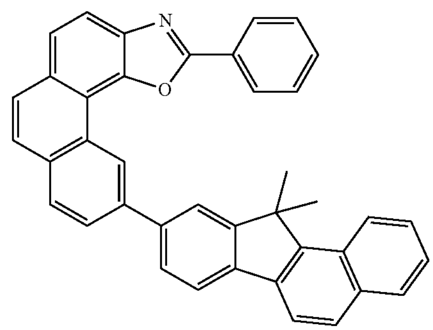
H-17
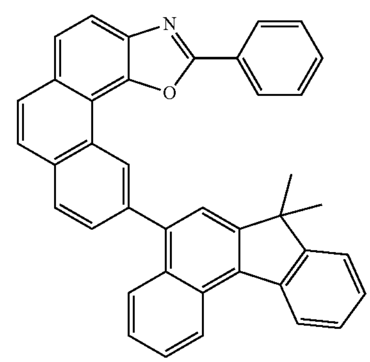
H-18
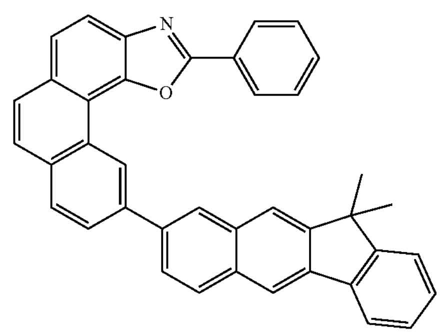
H-19
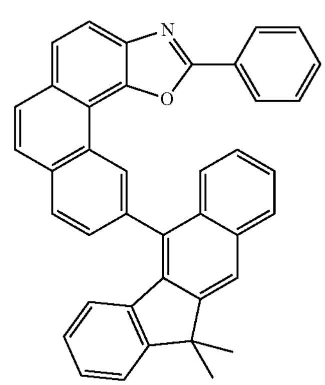

H-20
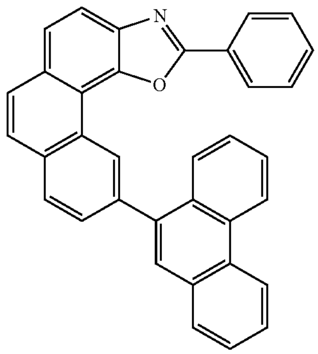
H-21
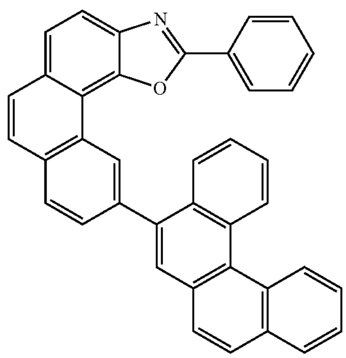
H-22
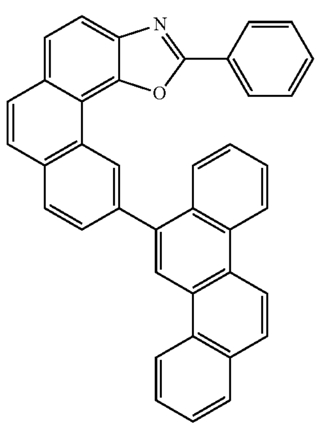
H-23
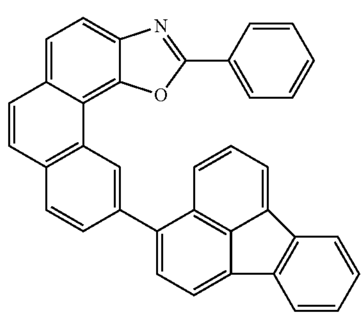
H-24
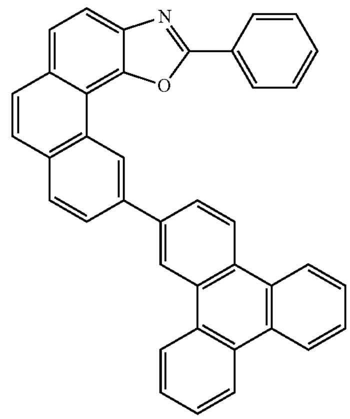
H-25
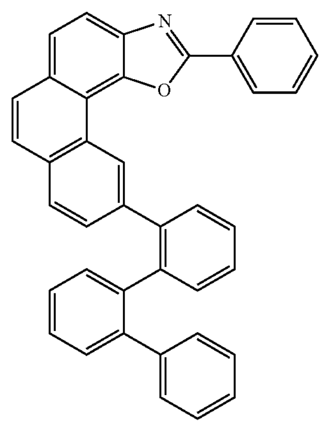
H-26
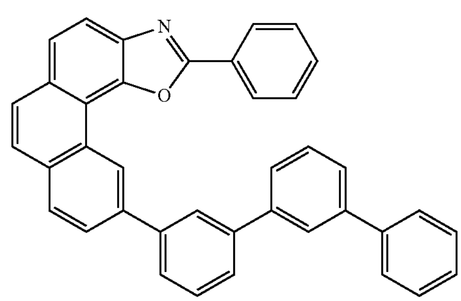
H-27
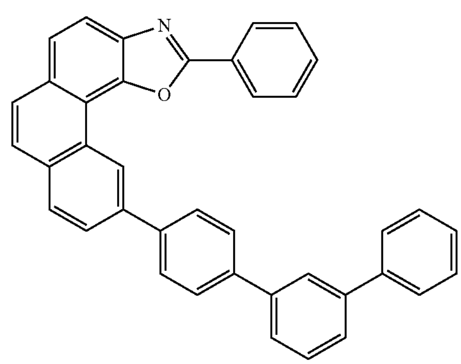

H-28
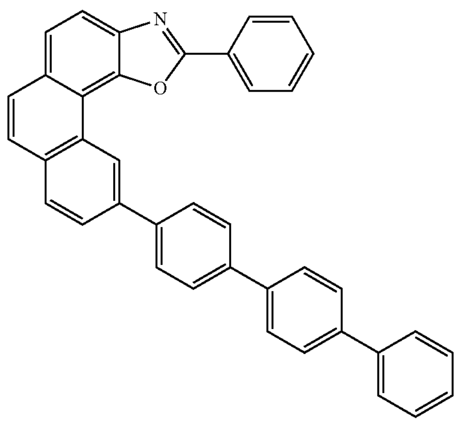
H-29
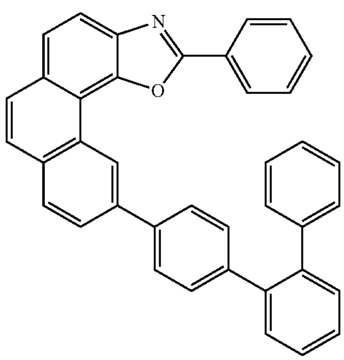
H-30
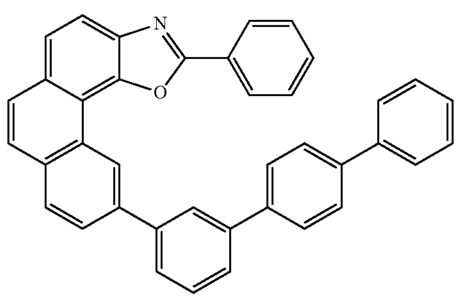
H-31
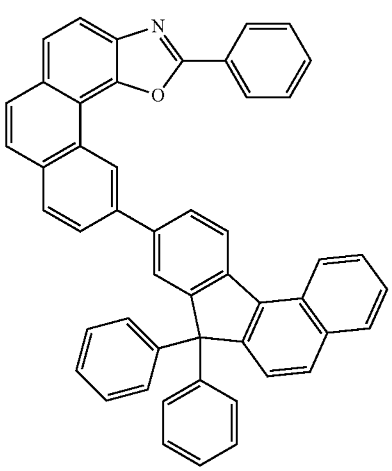
H-32
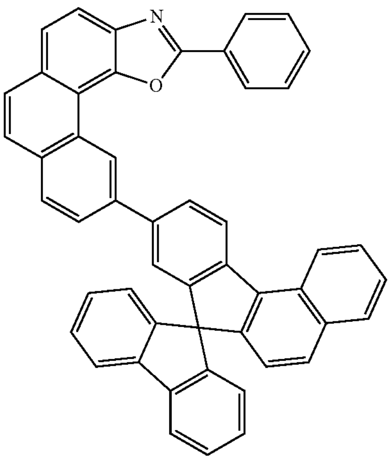
H-33
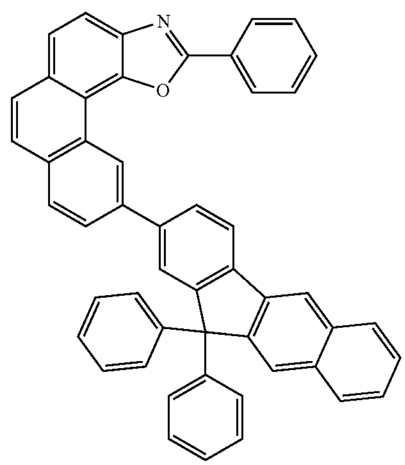
H-34
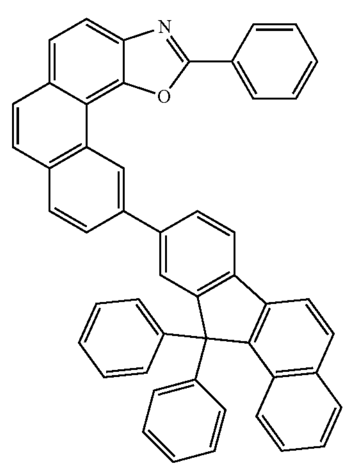

H-35
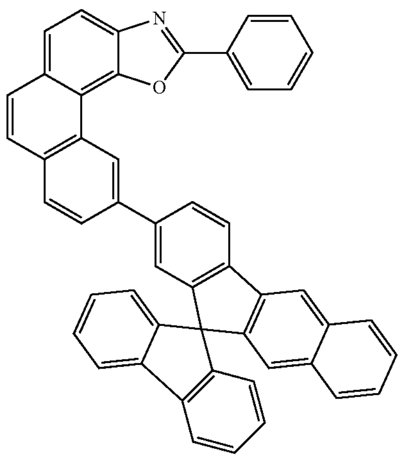
H-36
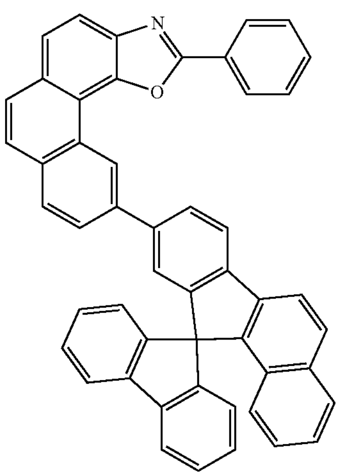
H-37
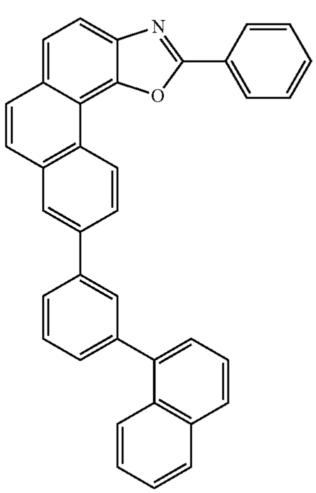
H-38
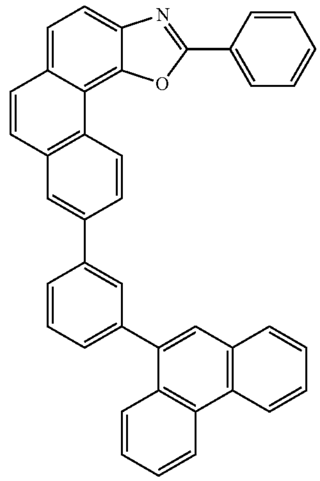
H-39
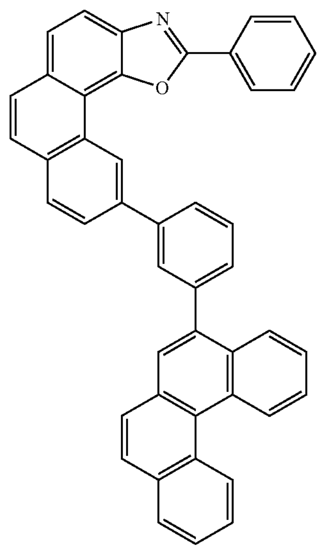
H-40
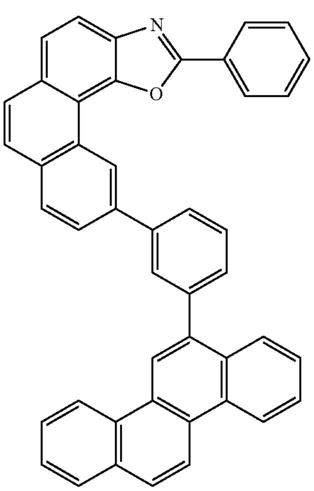

-continued
H-41
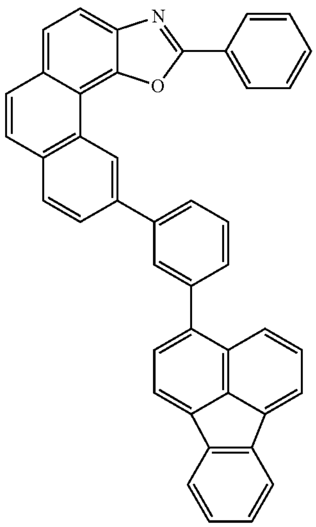
H-42
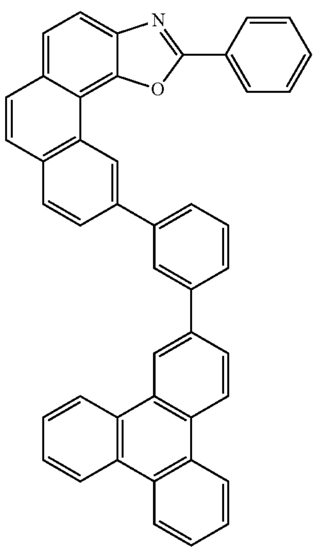
H-43
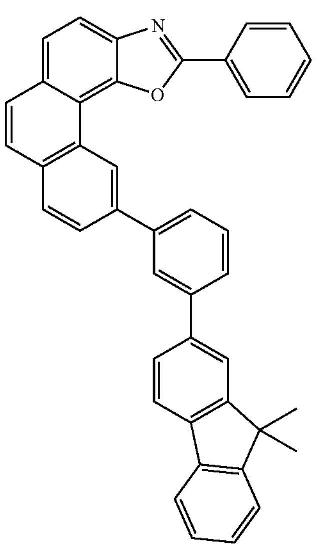
-continued
H-44
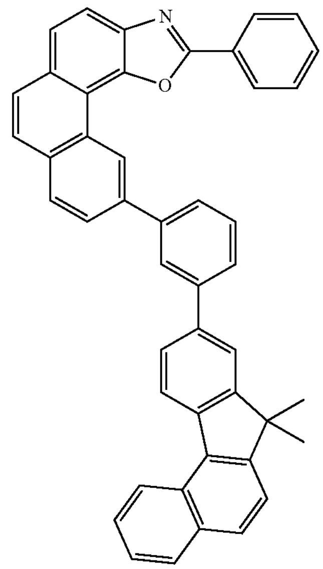
H-45
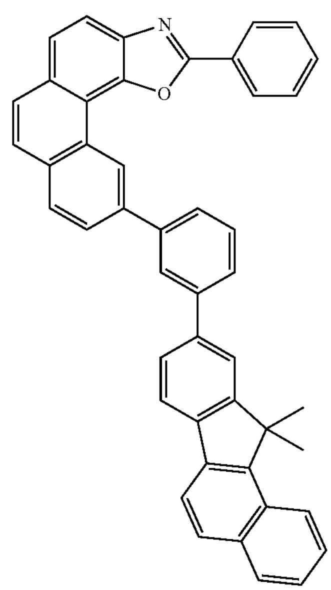

-continued
H-46
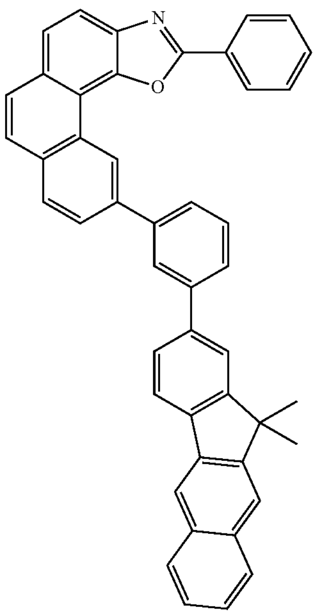
H-47
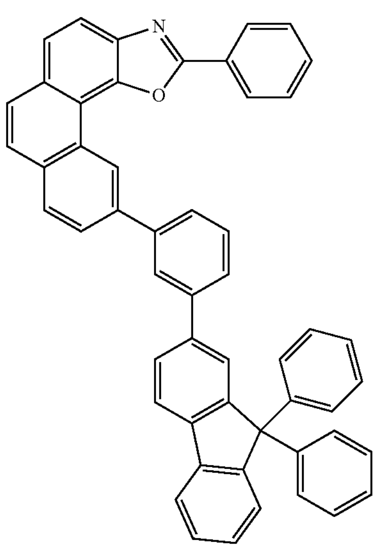
-continued
H-48
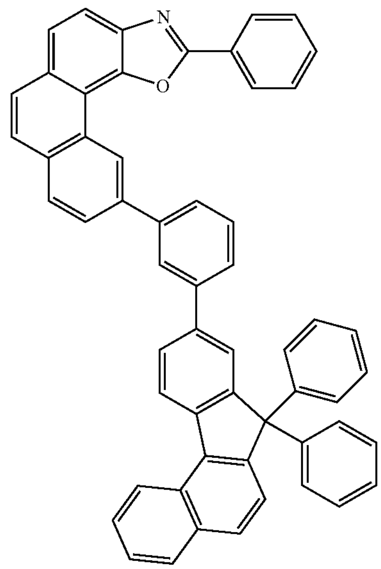
H-49
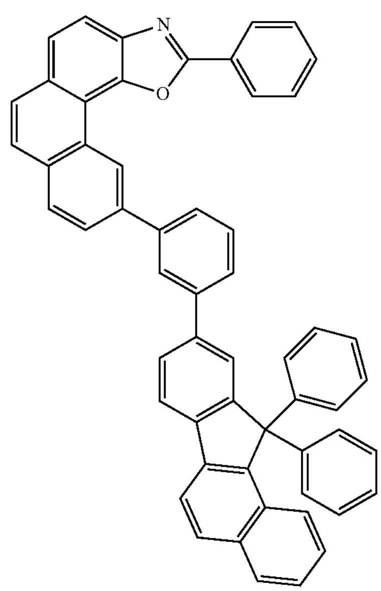

H-50
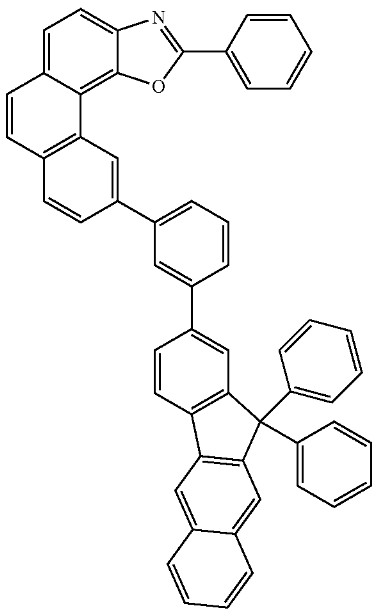
H-52
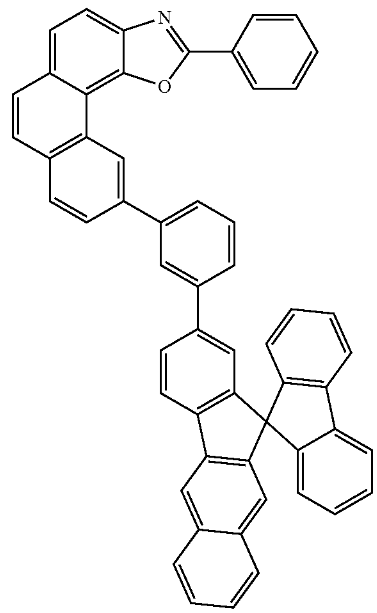
H-51
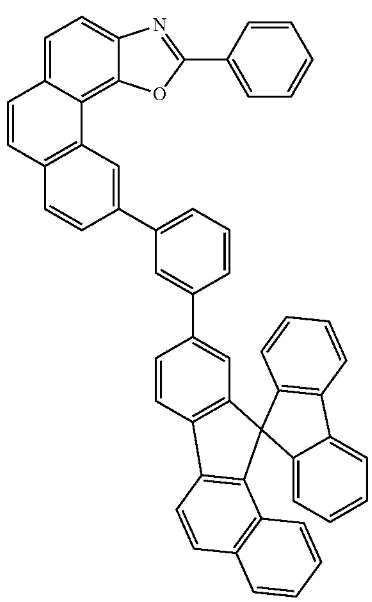
H-53
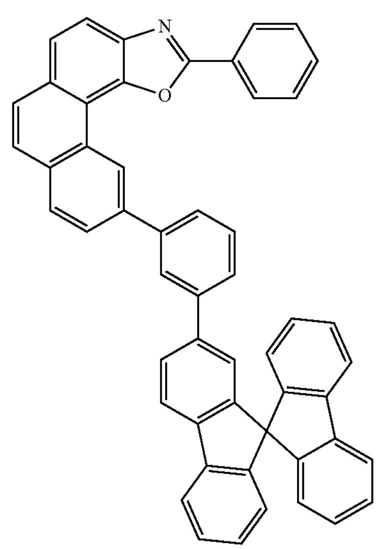

-continued
H-54
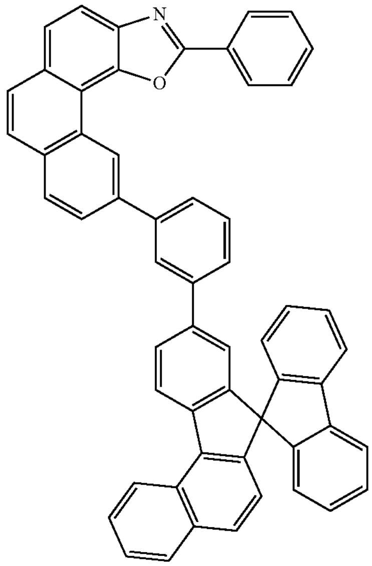
H-55
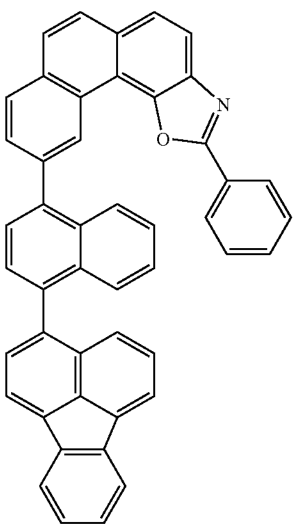
H-56
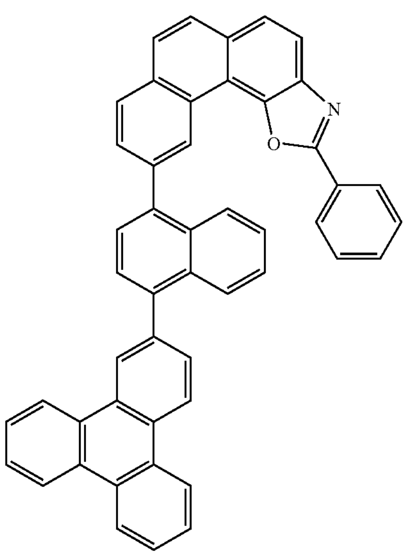
-continued
H-57
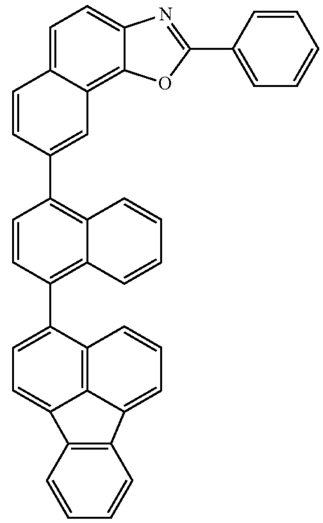
H-58
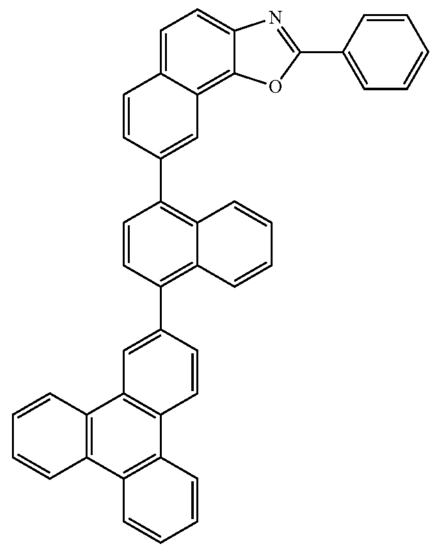
H-59
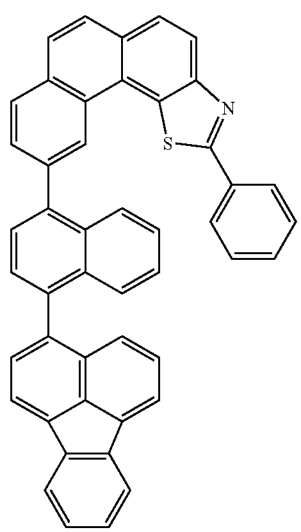

H-60
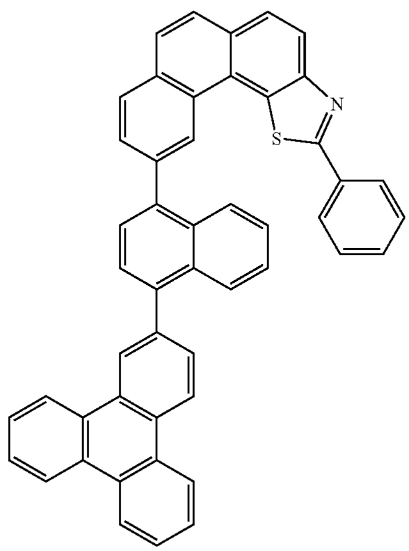
H-61
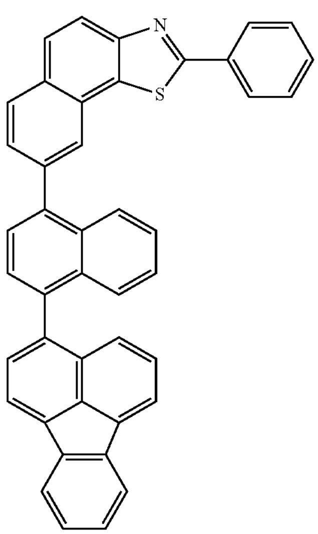
H-62
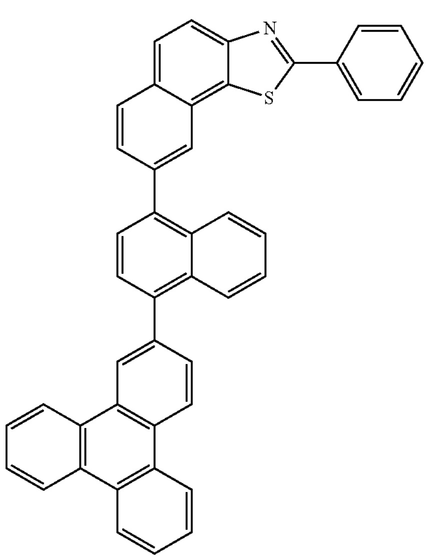
H-63
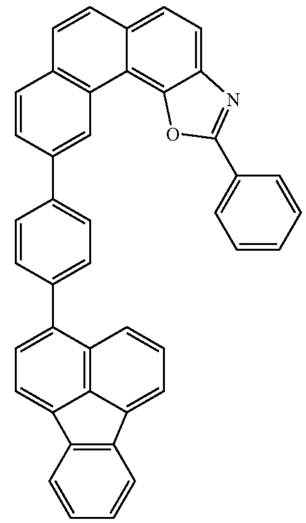
H-64
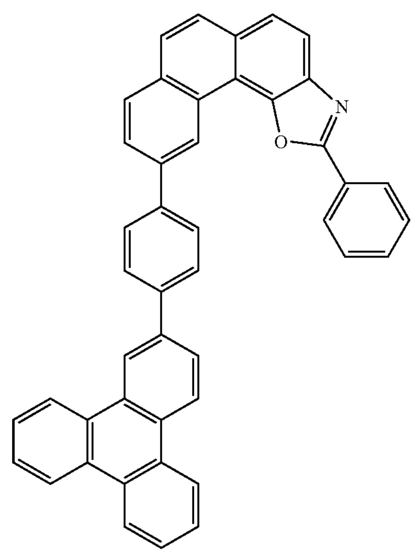
H-65
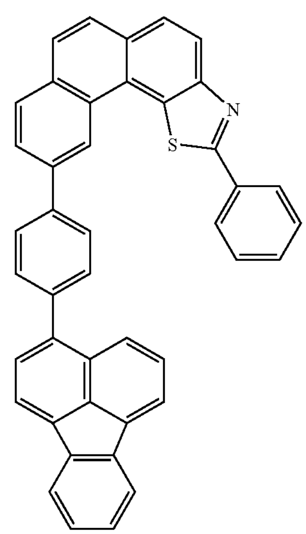

-continued
H-66
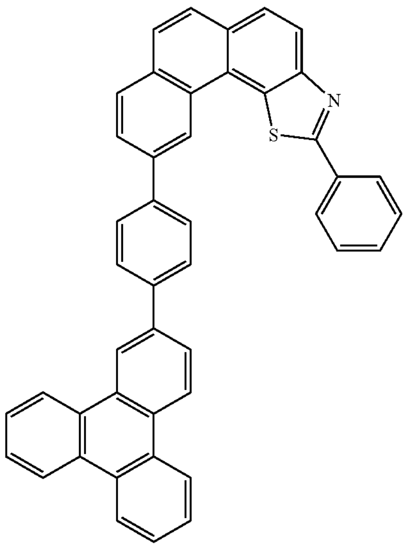
H-67
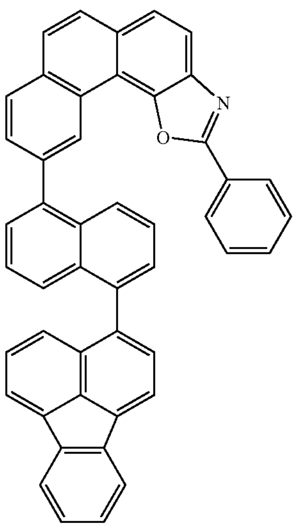
H-68
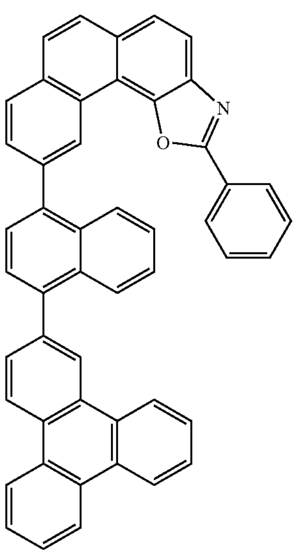
-continued
H-69
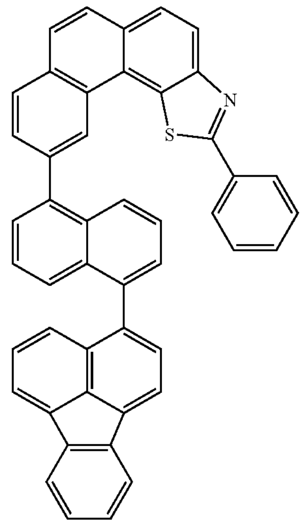
H-70
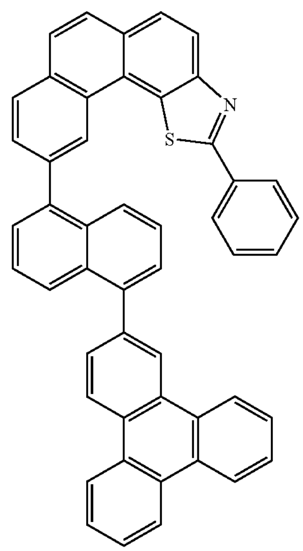
H-71
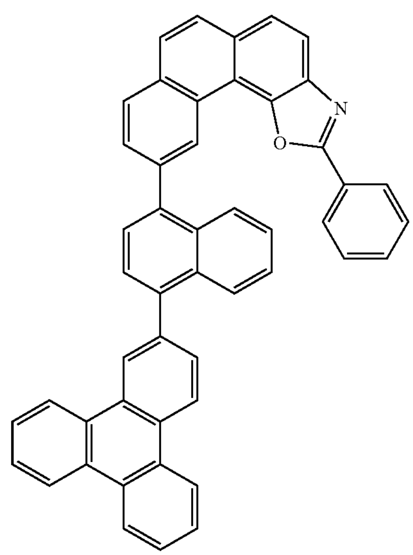

H-72
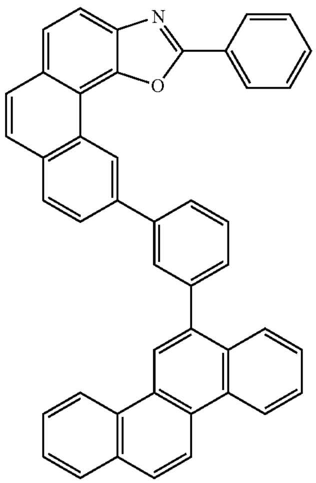
H-73
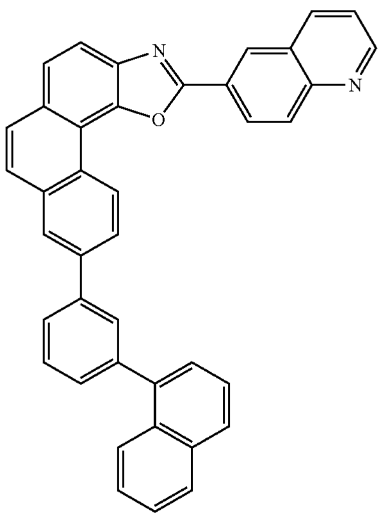
H-74
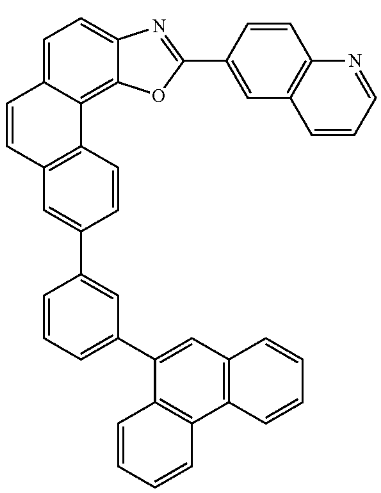
H-75
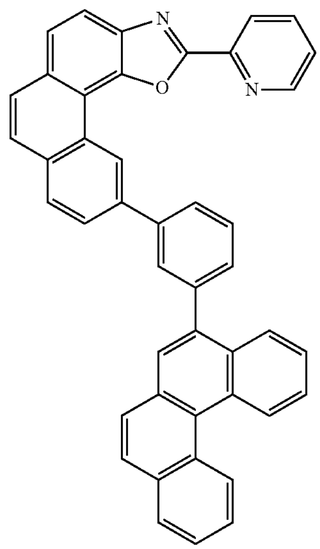
H-76
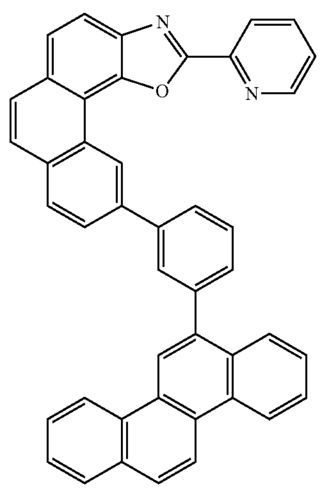
H-77
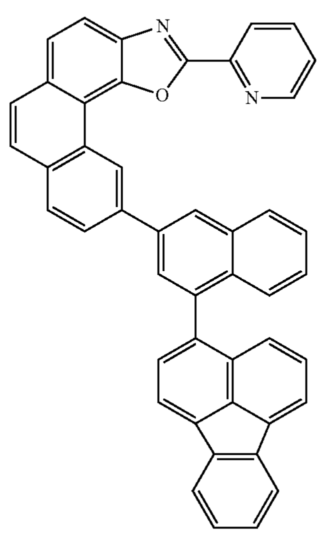

H-78
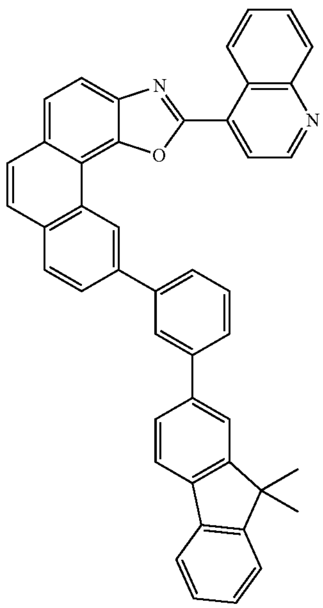
H-79
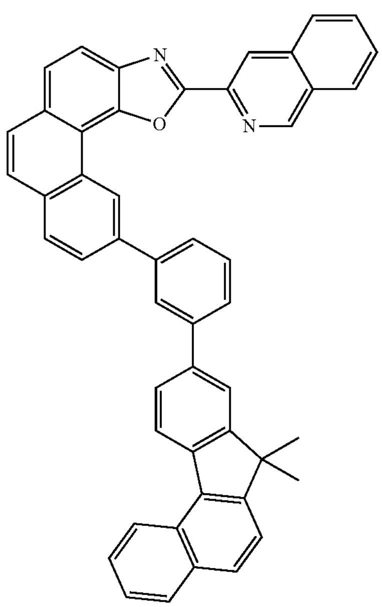
H-80
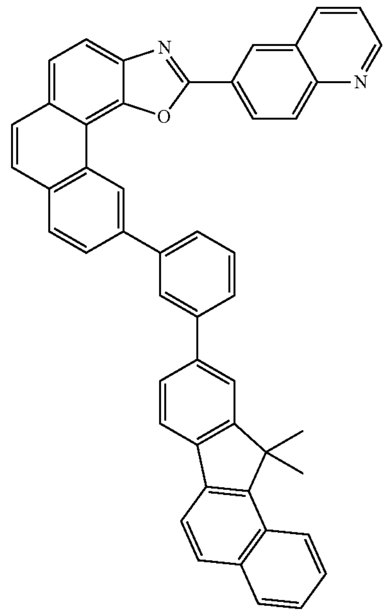
H-81
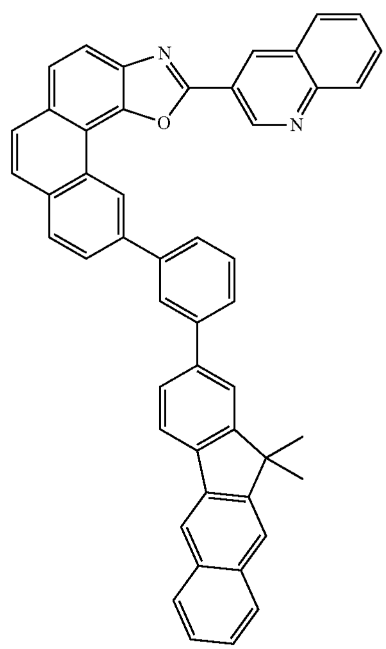

-continued
H-82
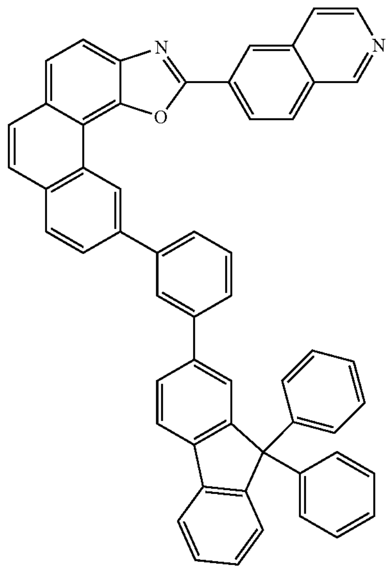
H-83
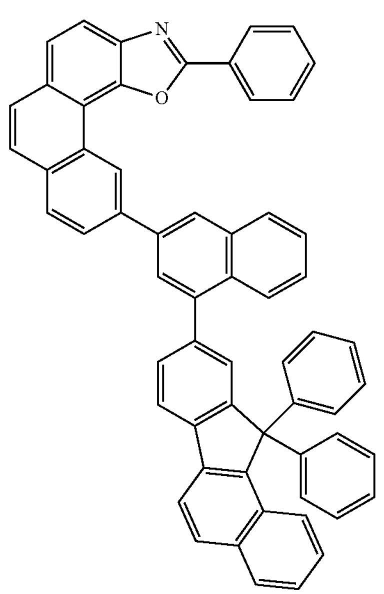
-continued
H-84
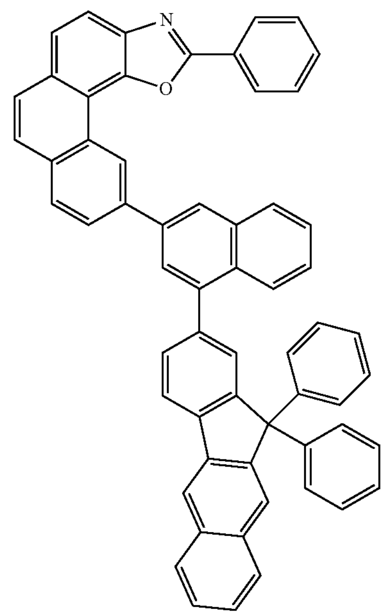
H-85
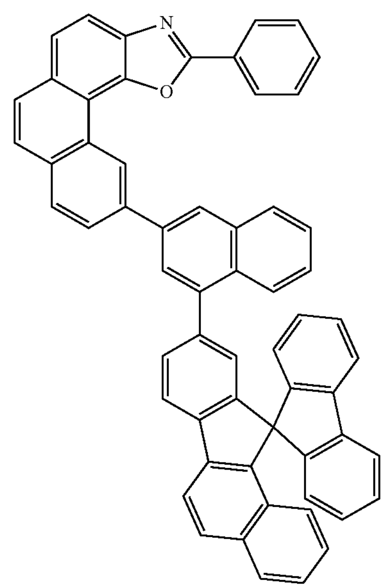
H-86
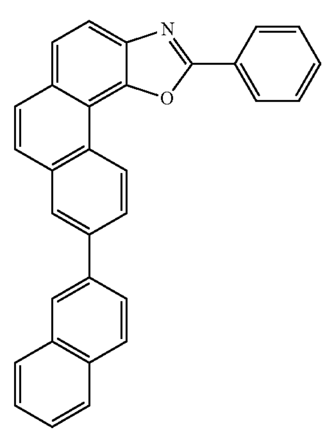

H-87
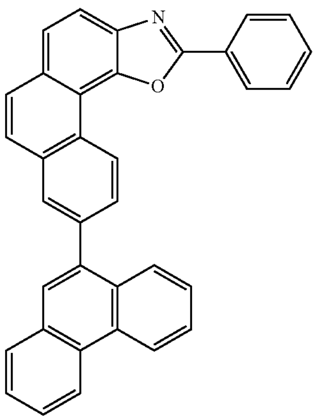
H-88
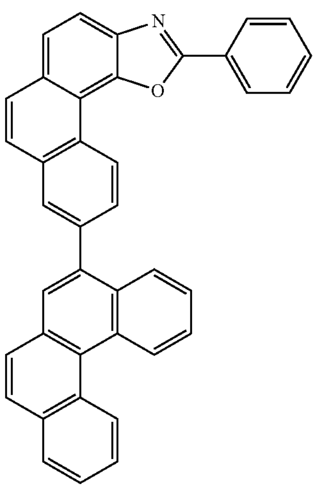
H-89
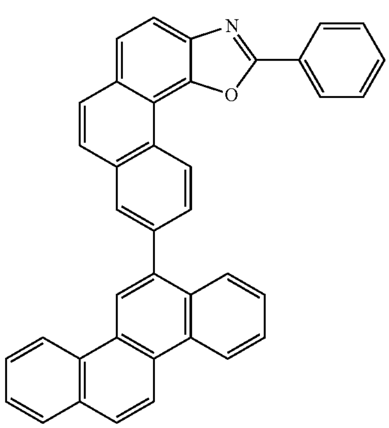
H-90
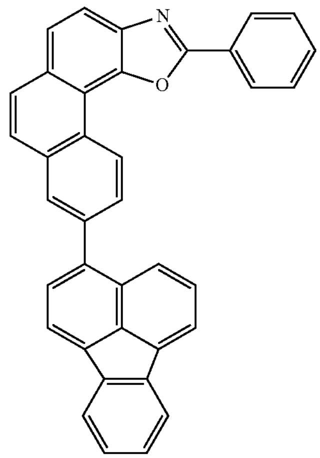
H-91
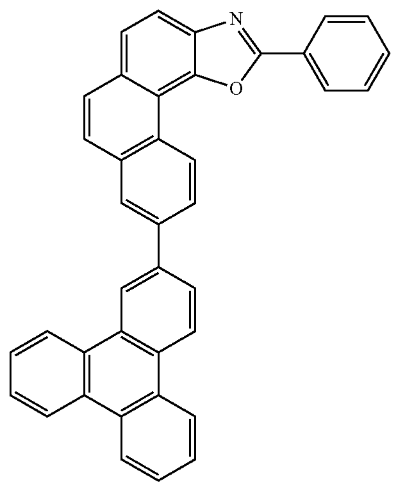
H-92
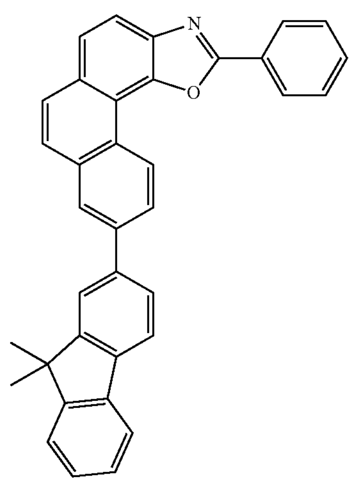

-continued
H-93
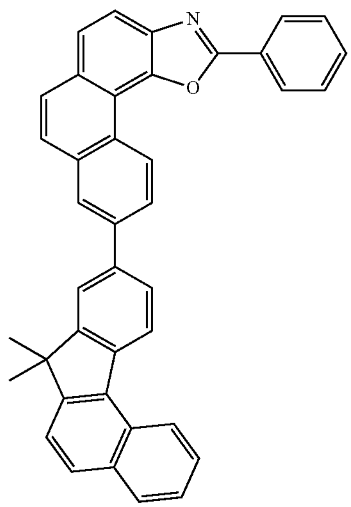
H-94
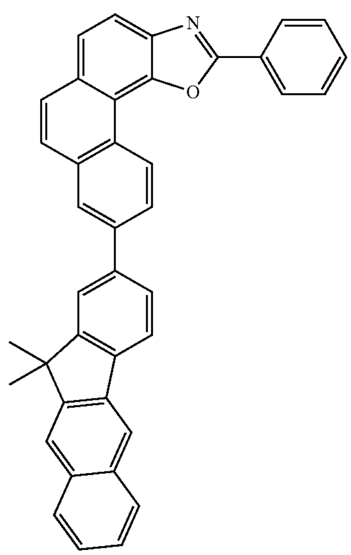
H-95
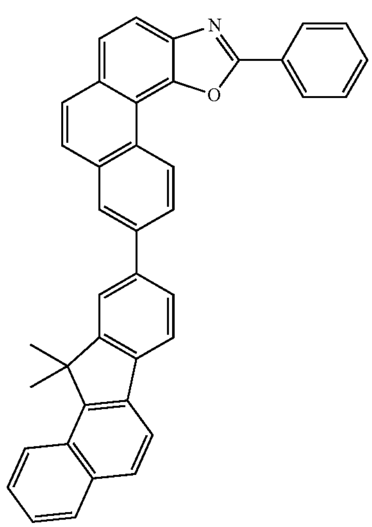
-continued
H-96
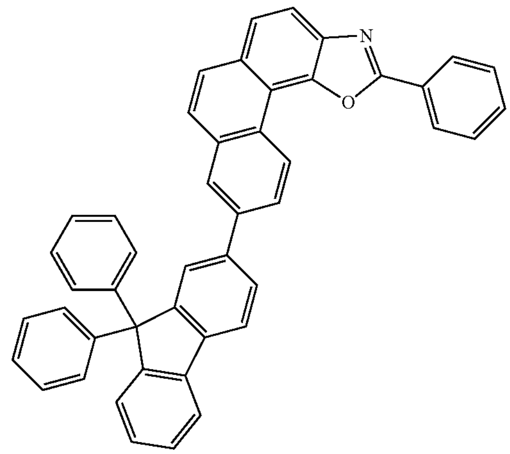
H-97
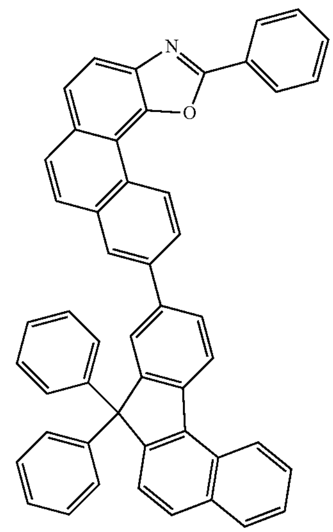
H-98
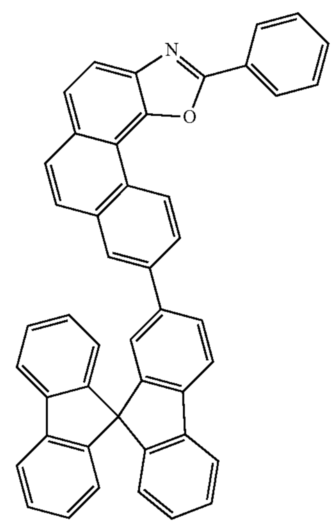

H-99
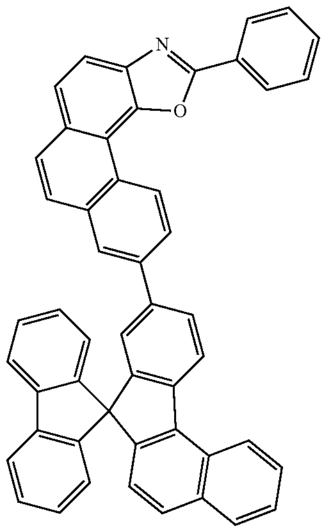
H-100
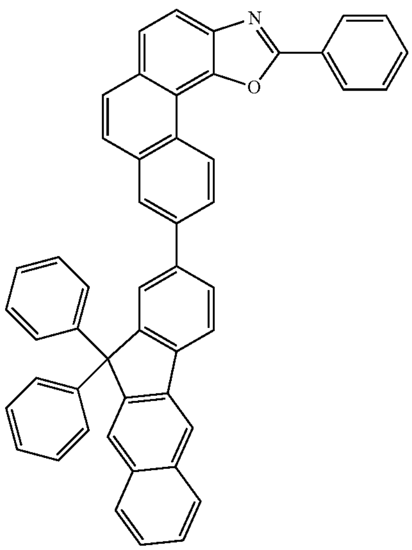
H-101
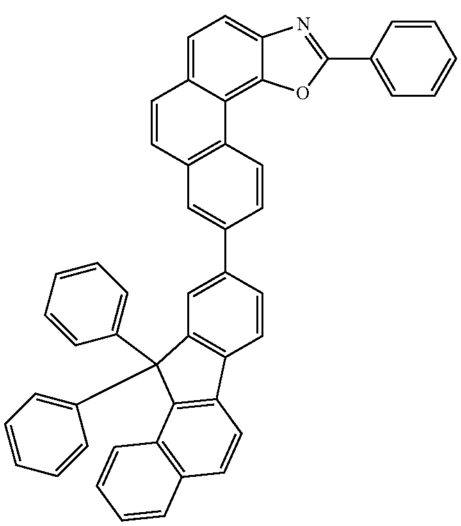
H-102
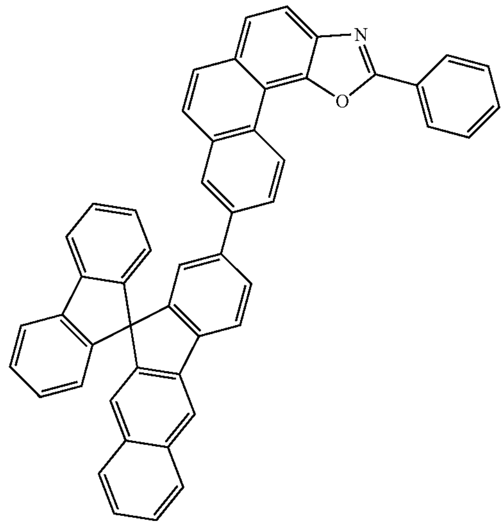
H-103
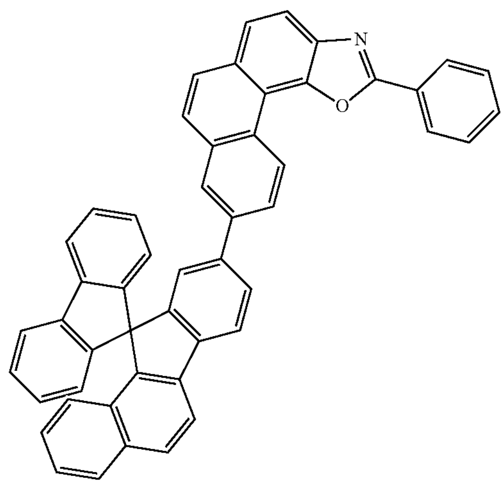
H-104
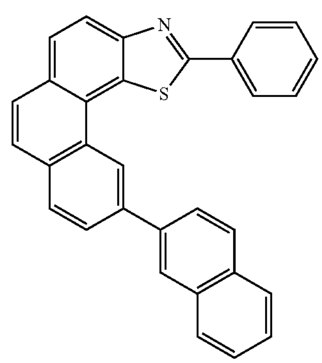

H-105
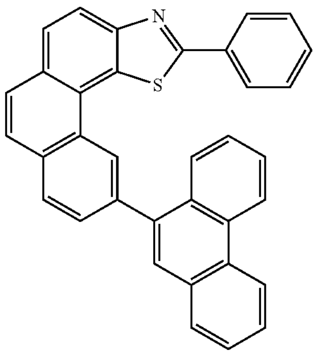
H-106
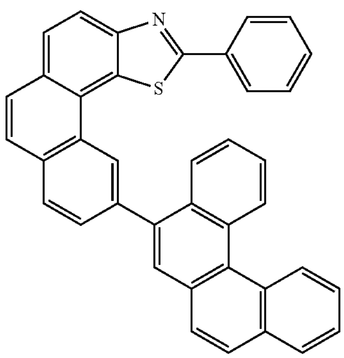
H-107
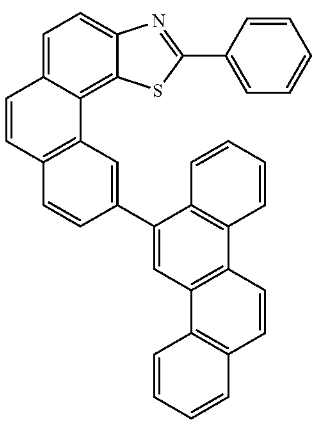
H-108
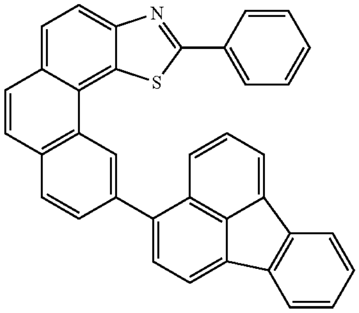
H-109
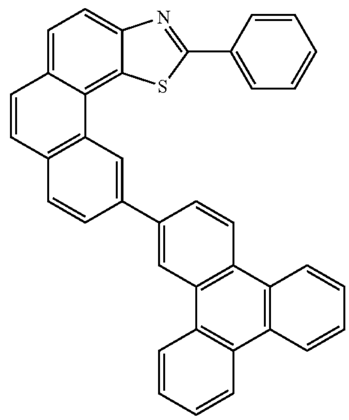
H-110
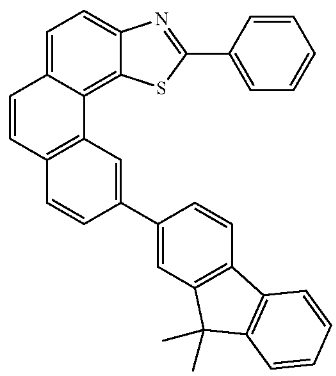
H-111
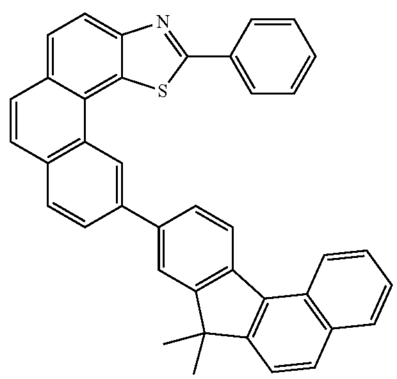
H-112
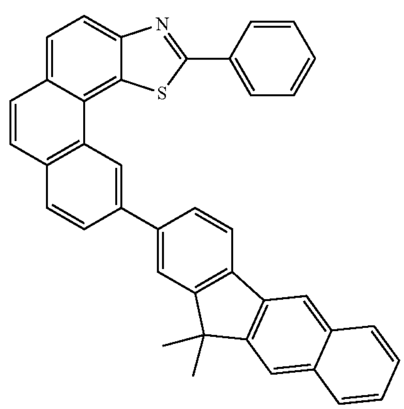

H-113
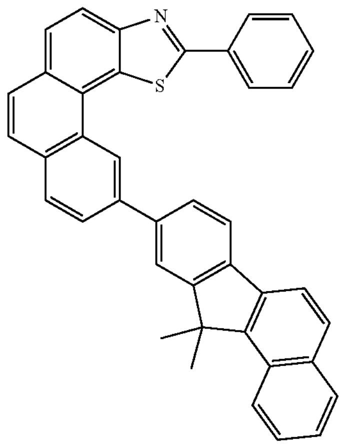
H-116
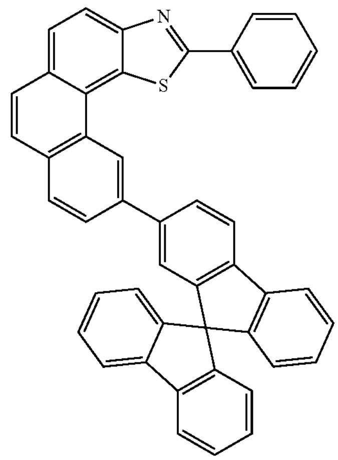
H-114
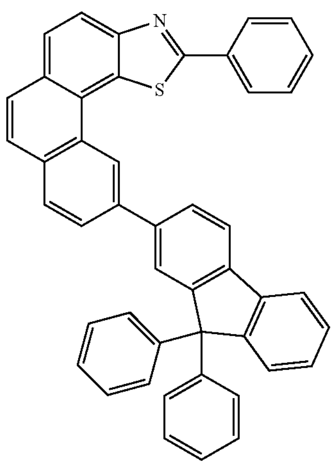
H-117
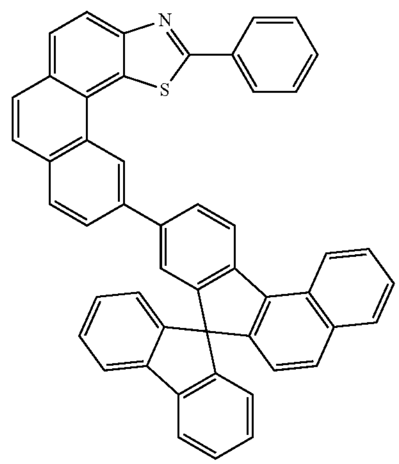
H-115
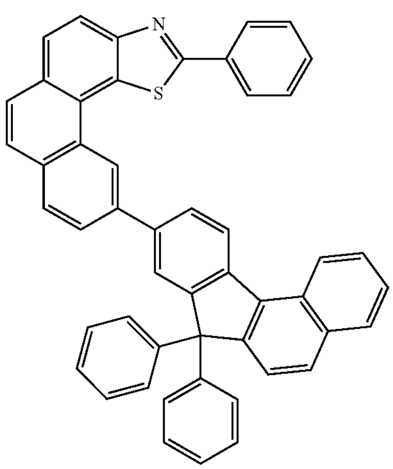
H-118
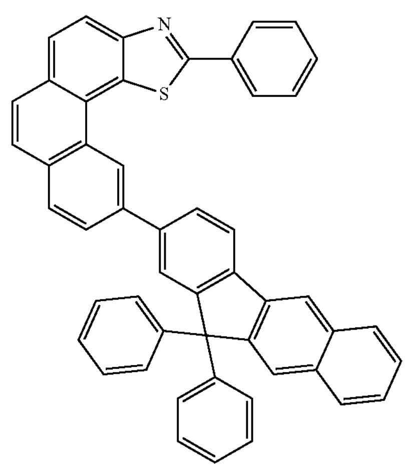

-continued
H-119
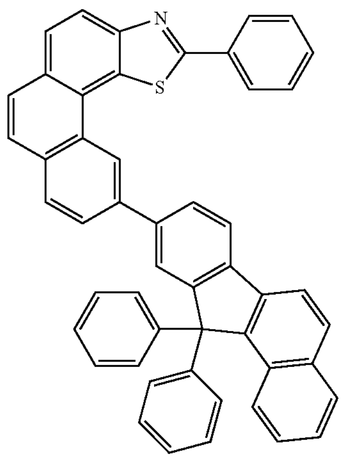
H-120
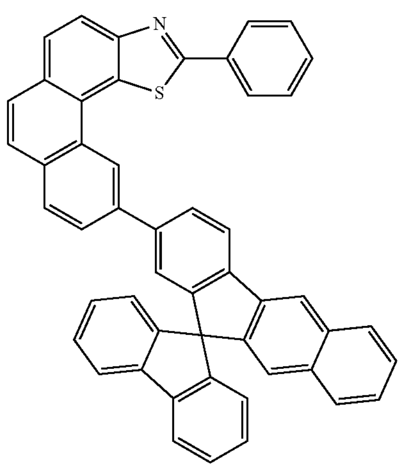
H-121
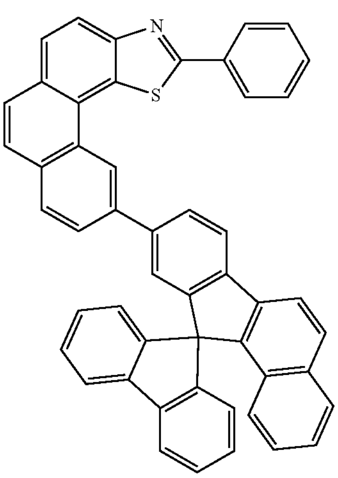
-continued
H-122
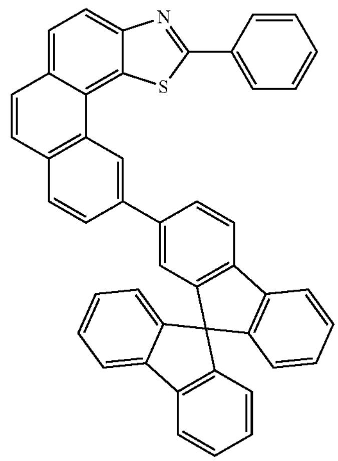
H-123
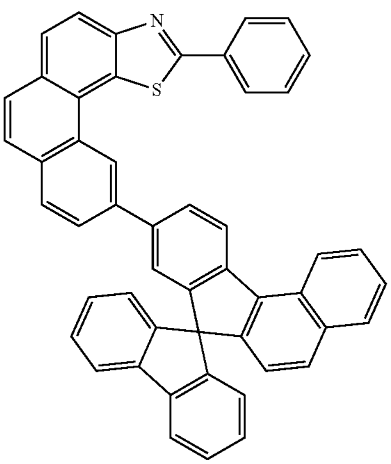
H-124
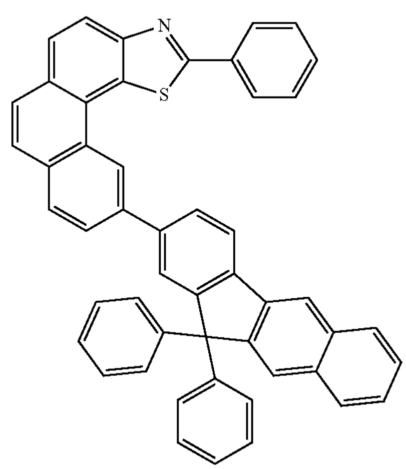

-continued
H-125
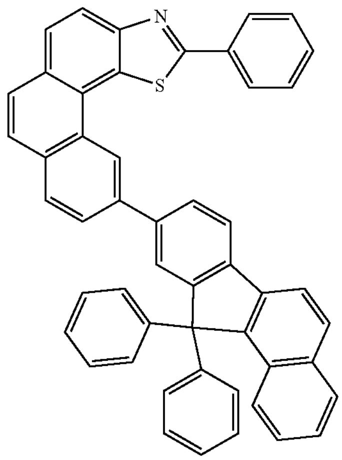
H-126
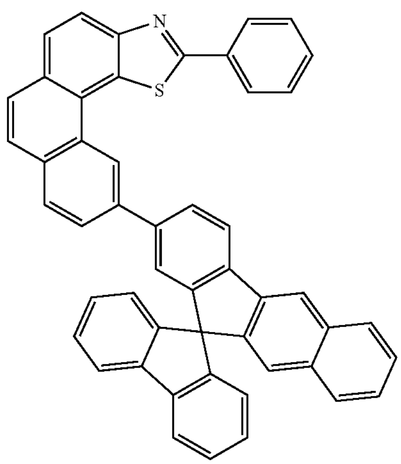
H-127
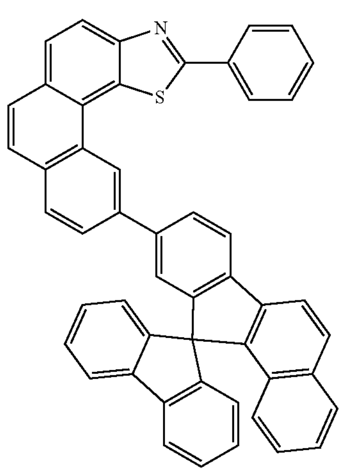
-continued
H-128
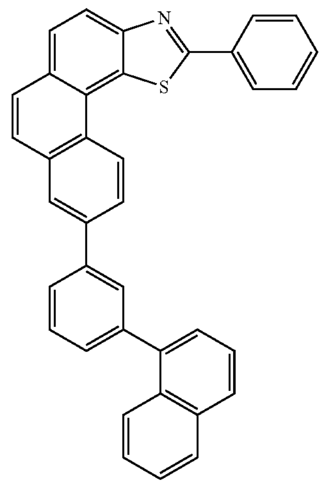
H-129
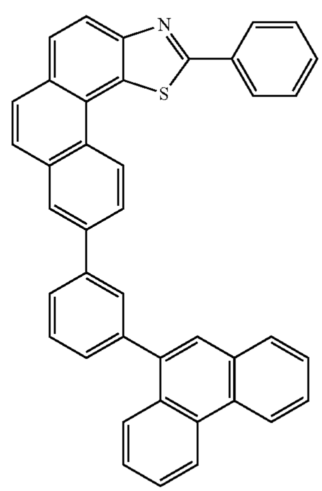
H-130
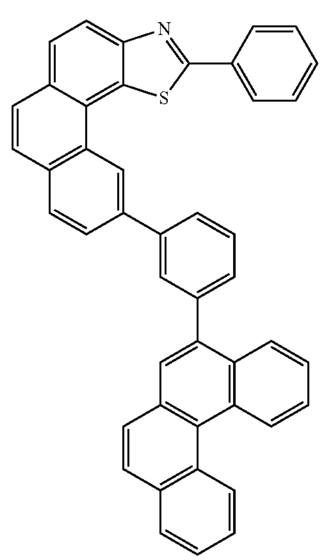

-continued
H-131
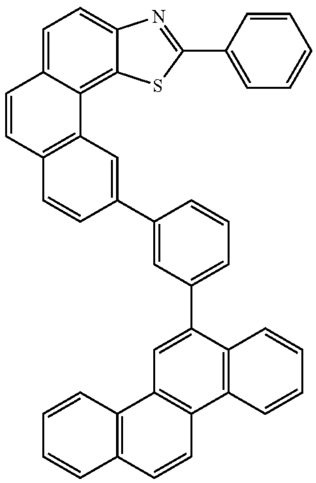
H-132
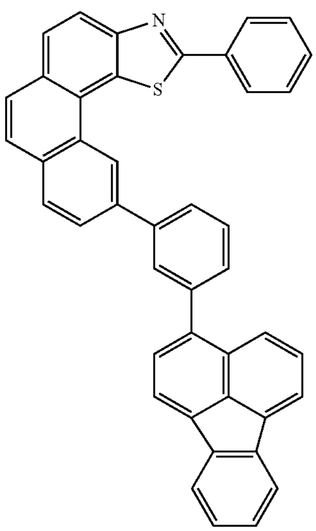
H-133
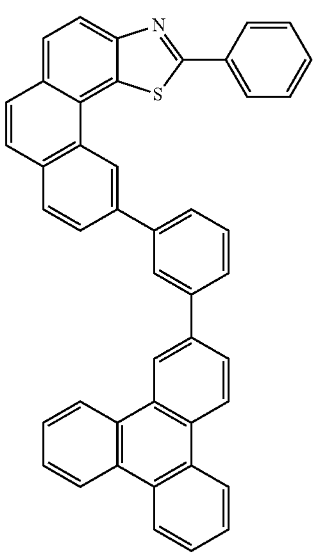
-continued
H-134
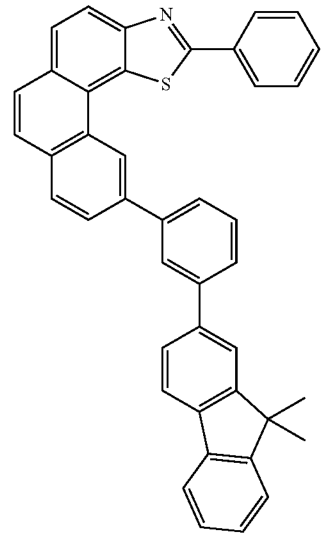
H-135
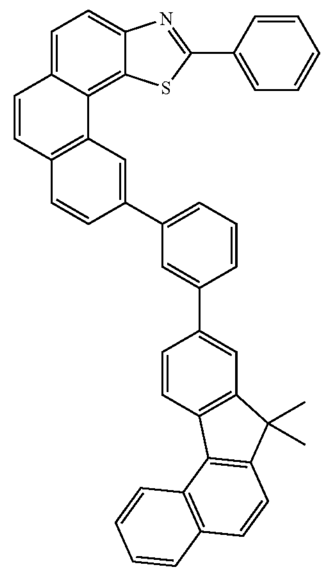
H-136
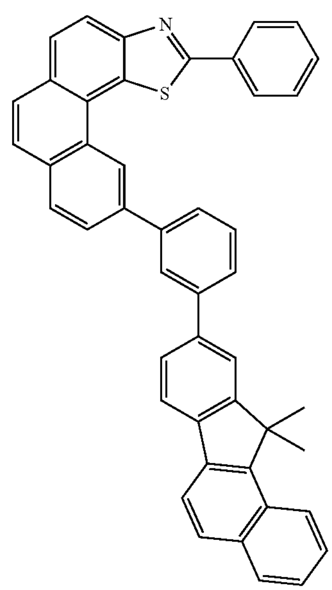

784
-continued
H-137
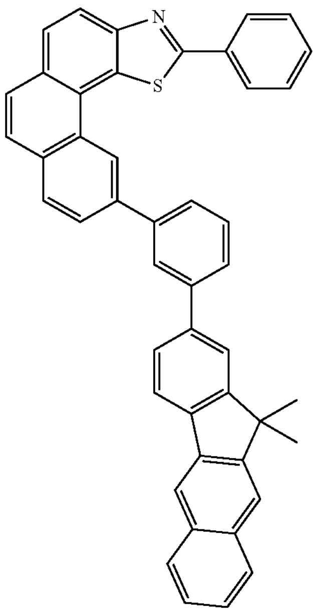
H-138
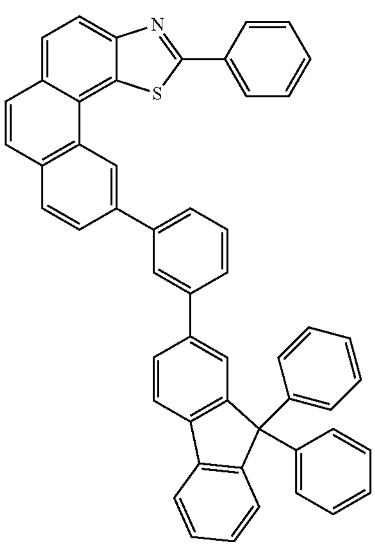
H-139
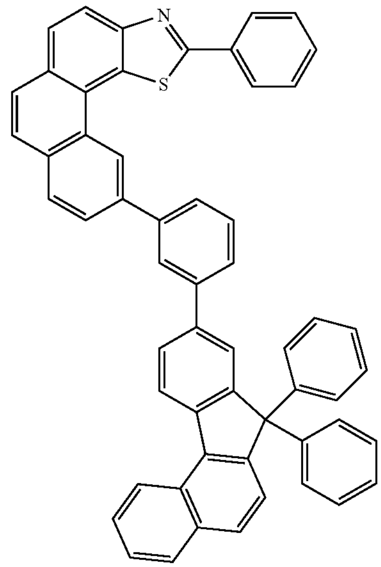
H-140
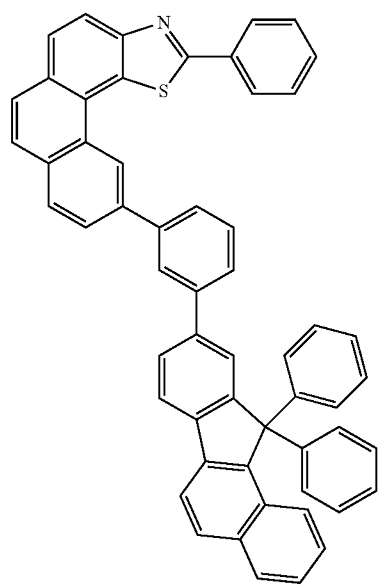

-continued
H-141
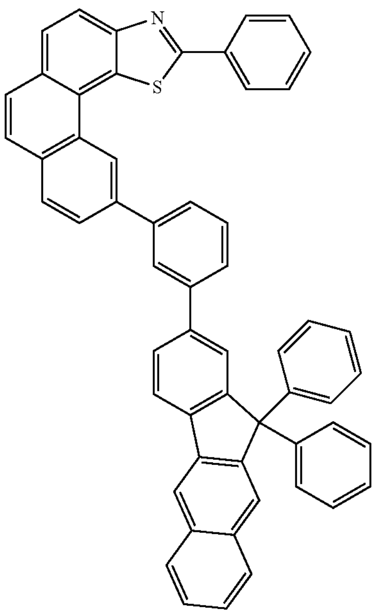
H-142
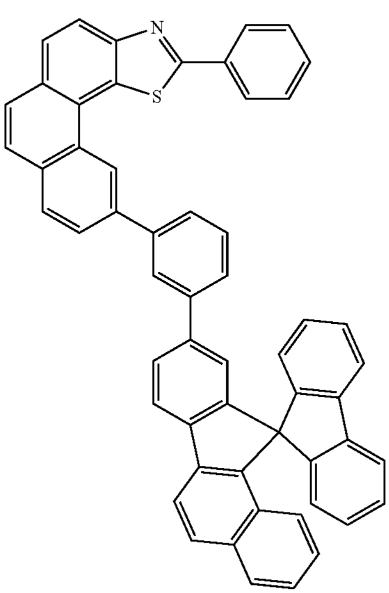
-continued
H-143
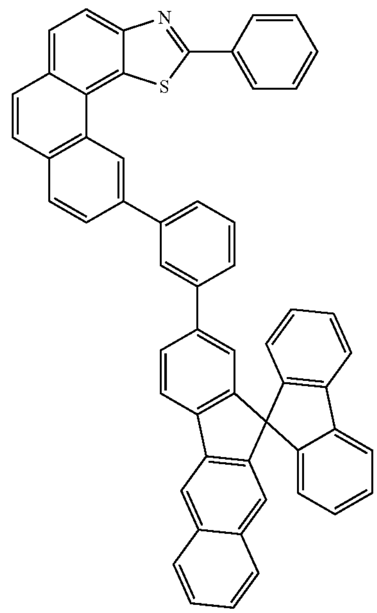
H-144
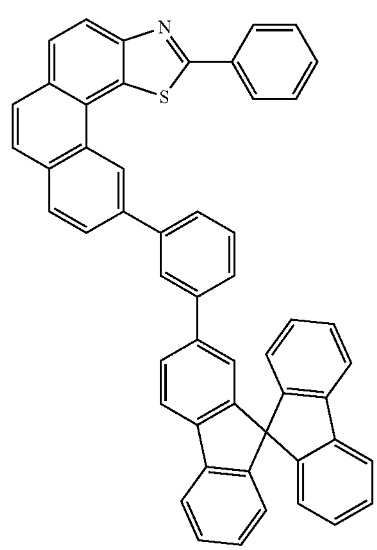

H-145
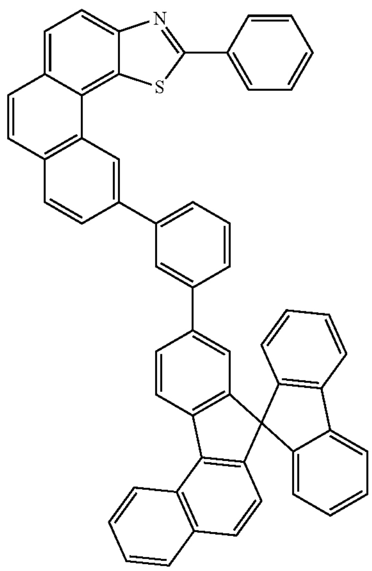
H-146
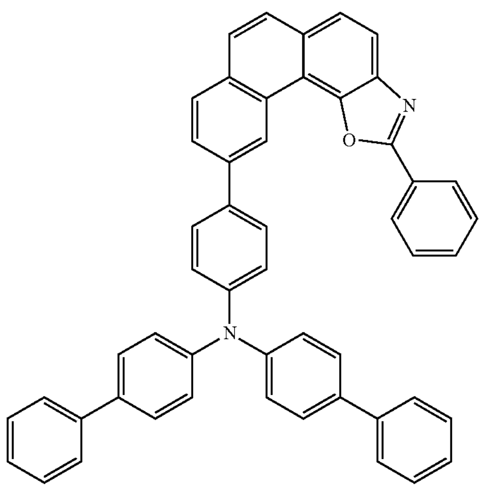
H-147
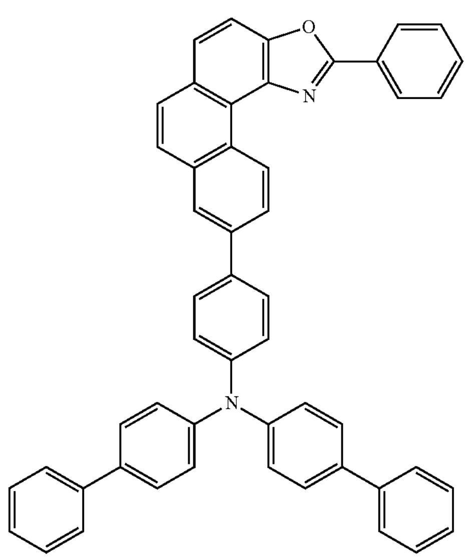
H-148
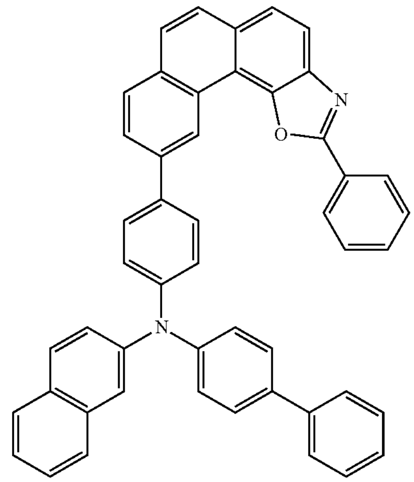
H-149
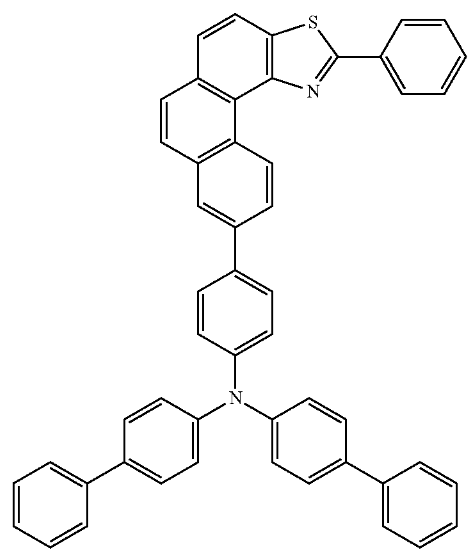
H-150
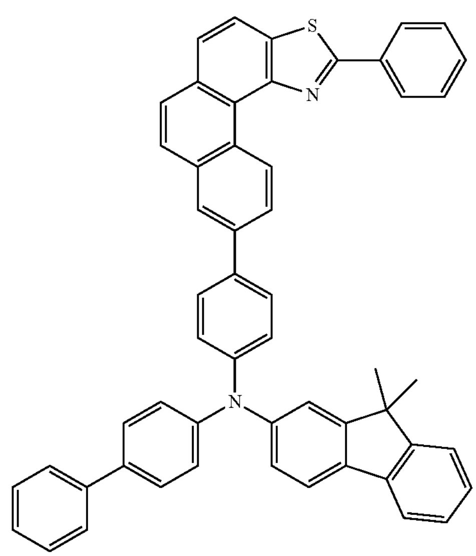

-continued
H-151
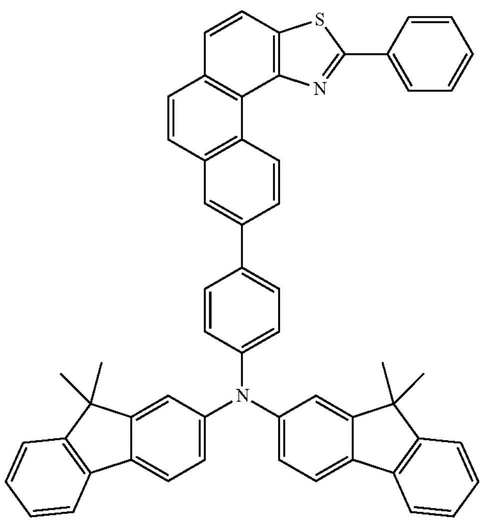
H-152
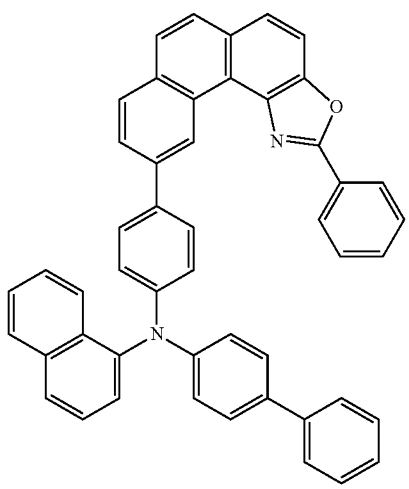
H-153
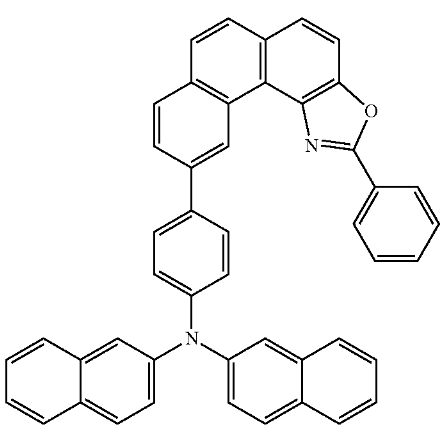
-continued
H-154
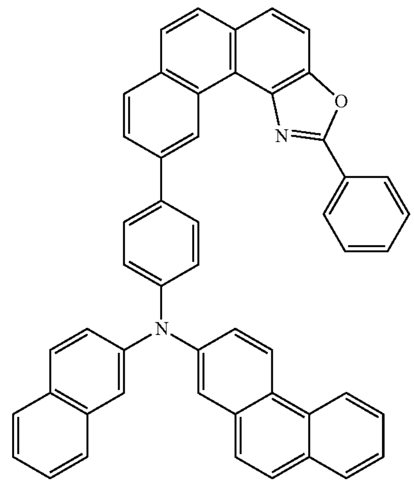
H-155
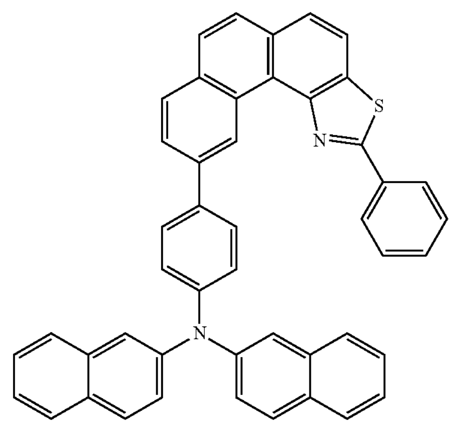
H-156
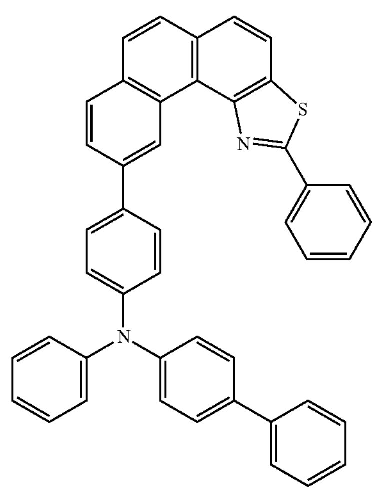

H-157
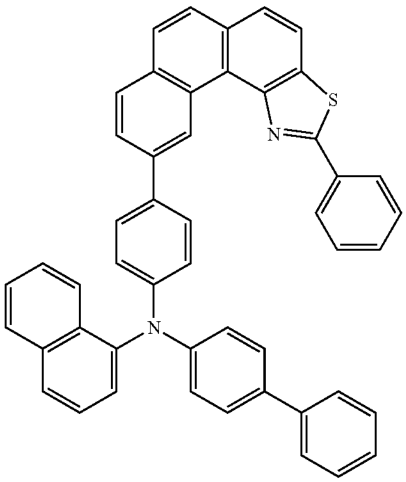
H-158
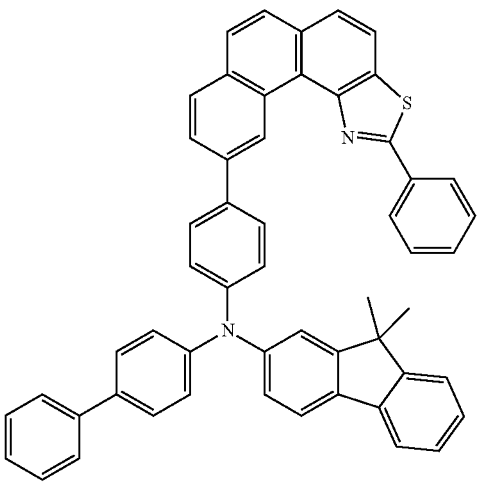
H-159
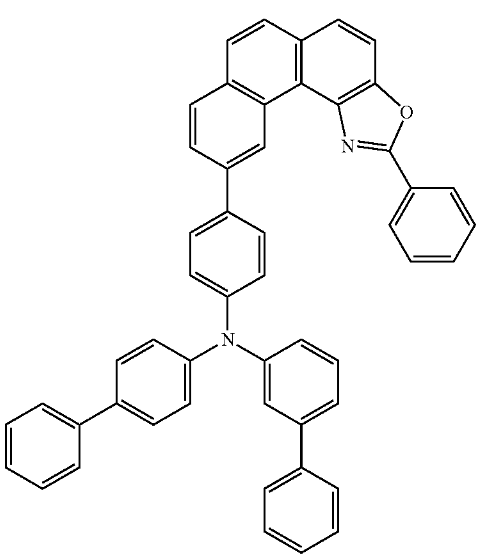
H-160
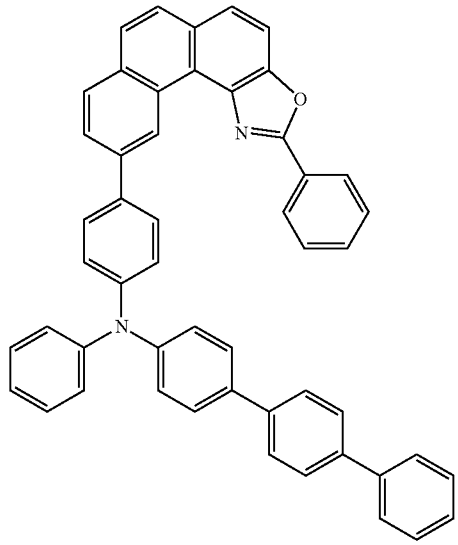
H-161
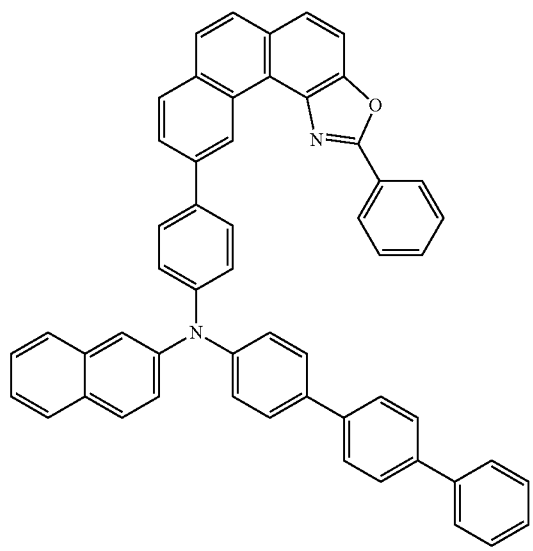
H-162
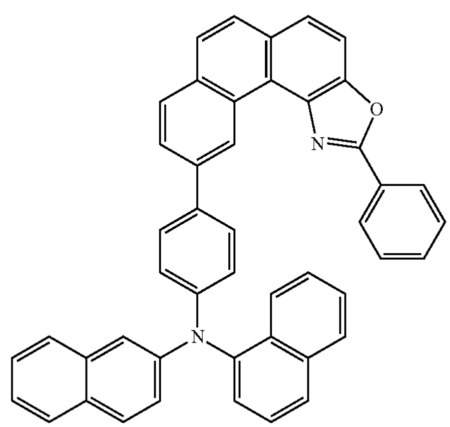

H-163
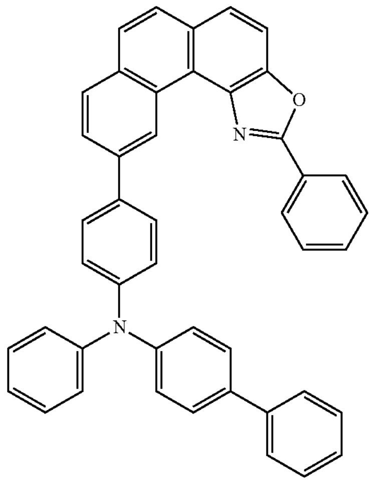
H-164
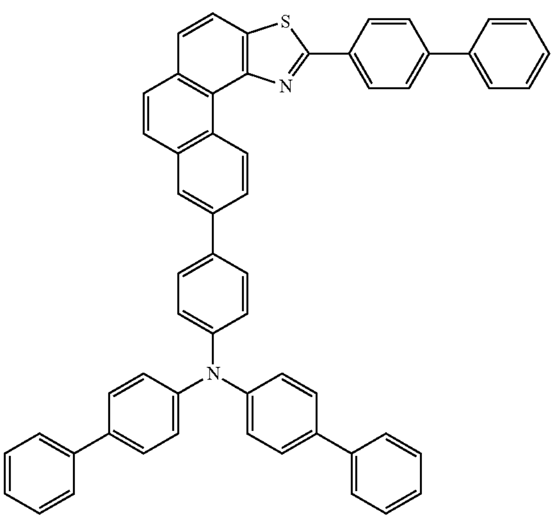
H-165
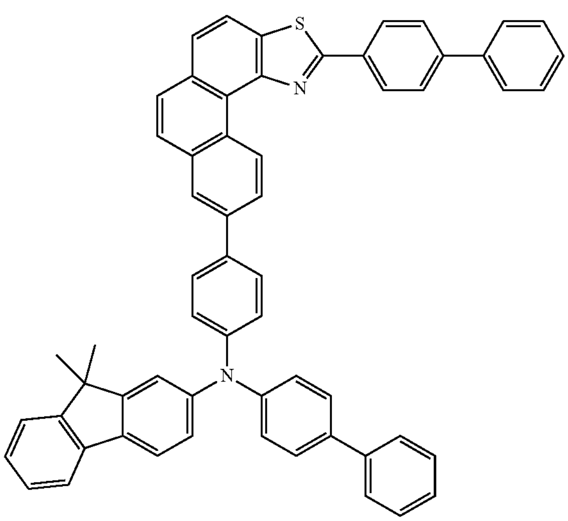
H-166
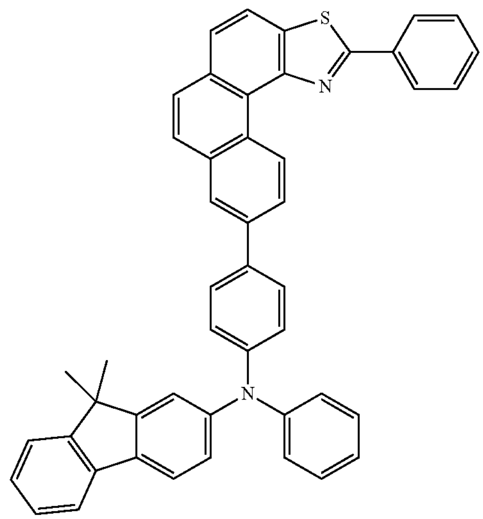
H-167
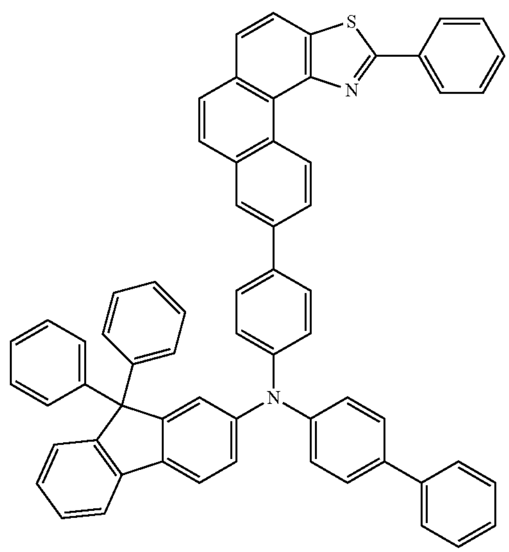
H-168
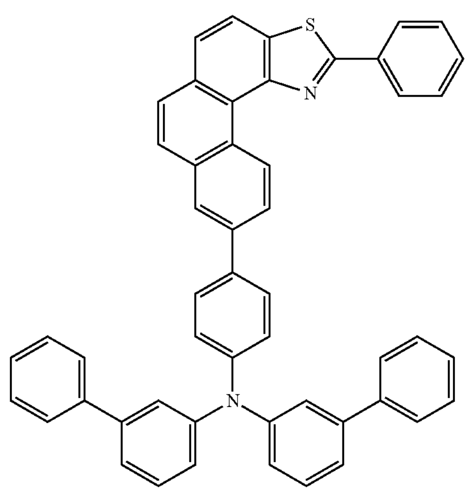

-continued
H-169
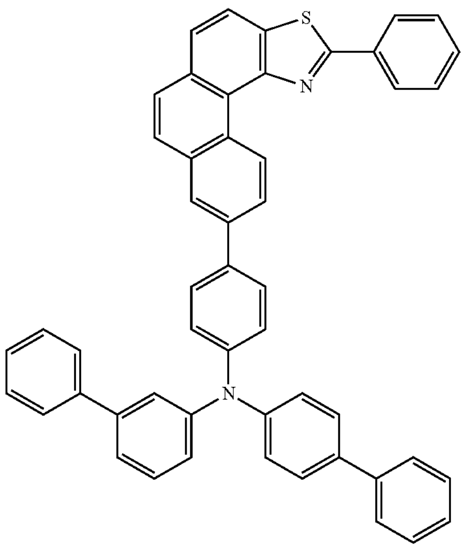
H-170
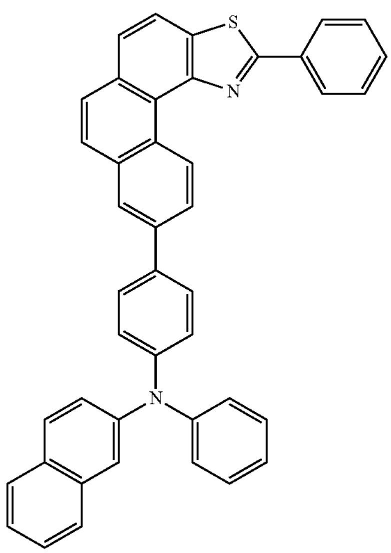
H-171
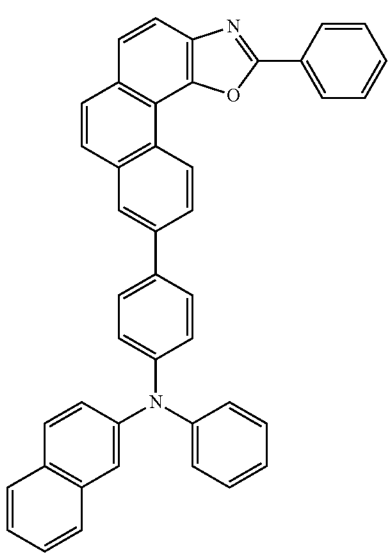
-continued
H-172
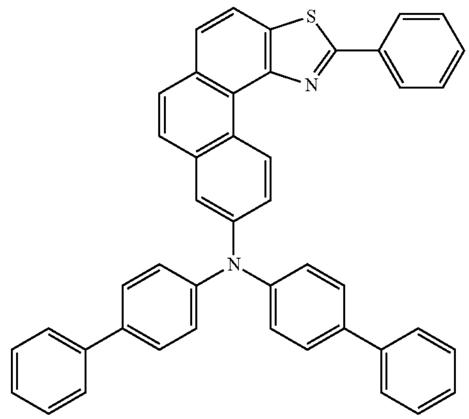
H-173
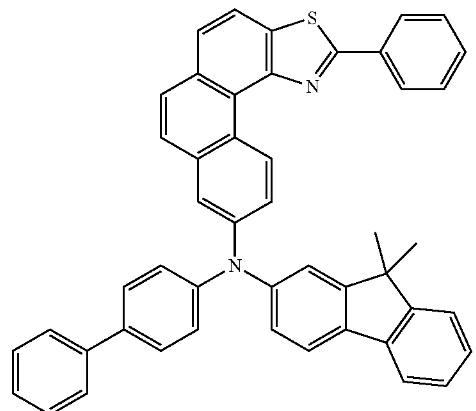
H-174
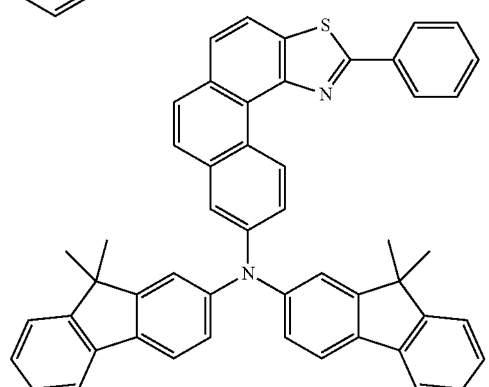
H-175
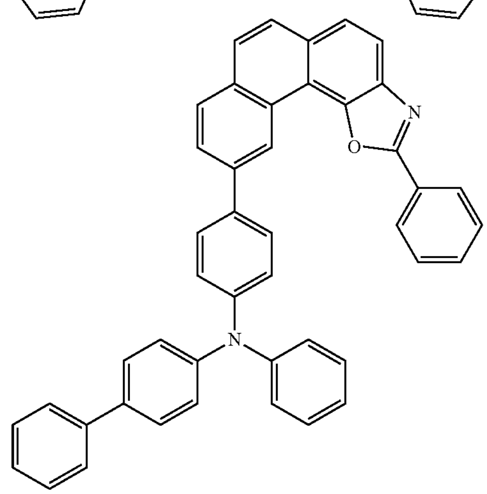

H-176
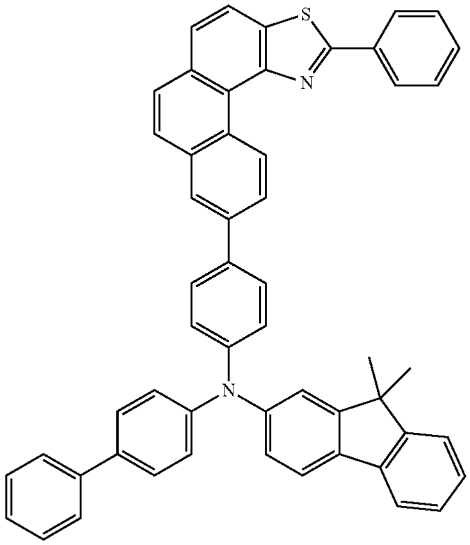
H-177
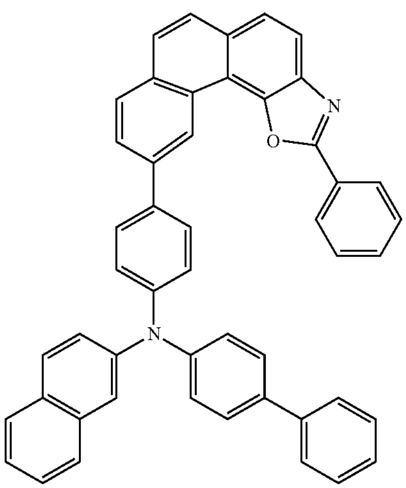
H-178
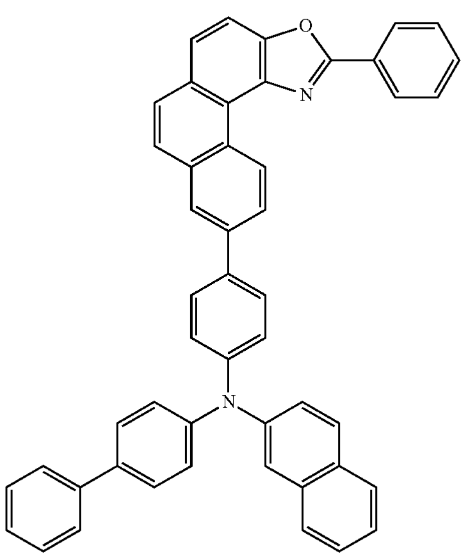
H-179
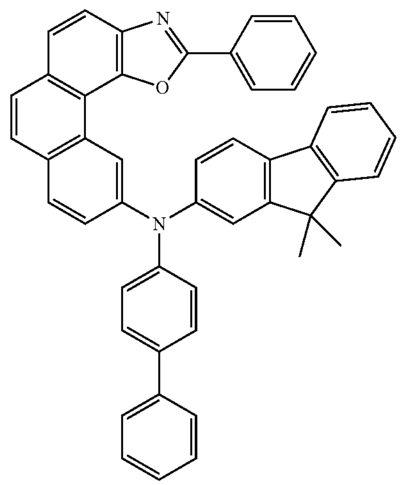
H-180
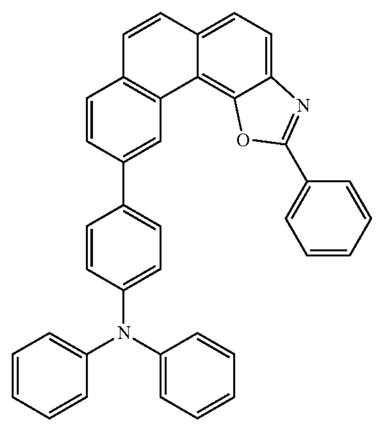
H-181
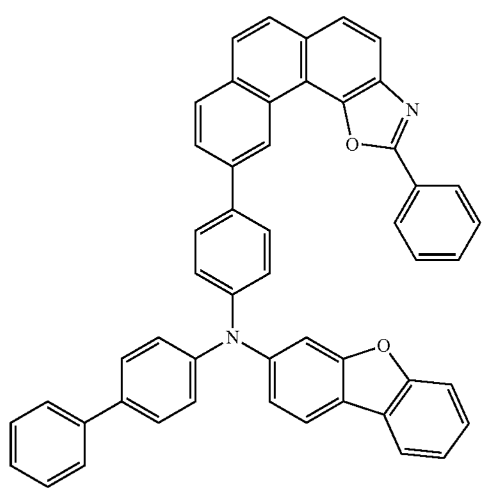

H-182
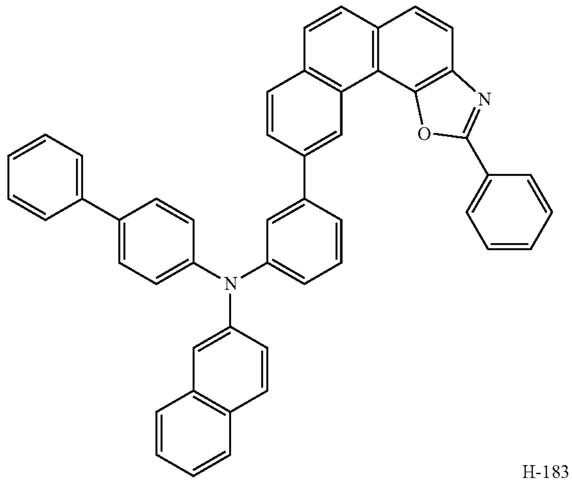
H-183
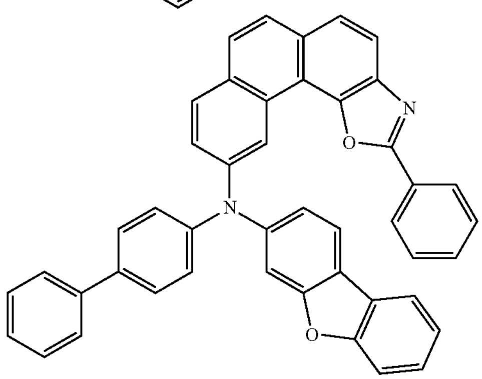
H-184
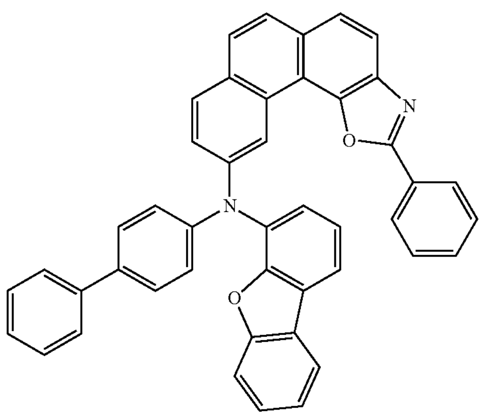
H-185
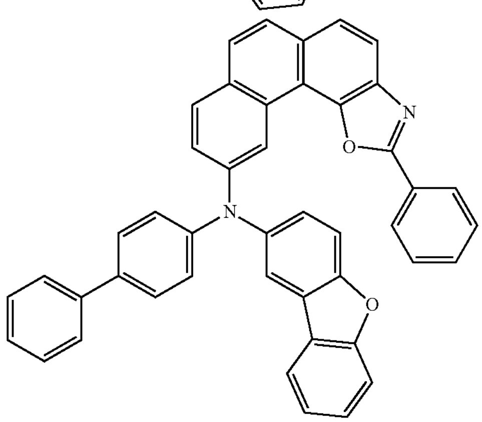
H-186
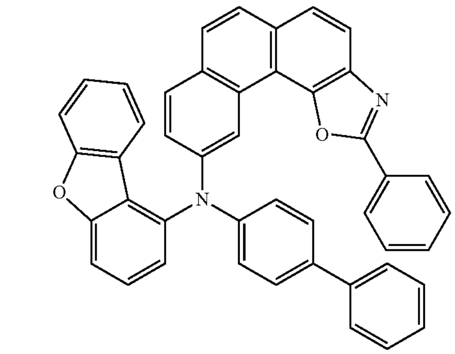
H-187
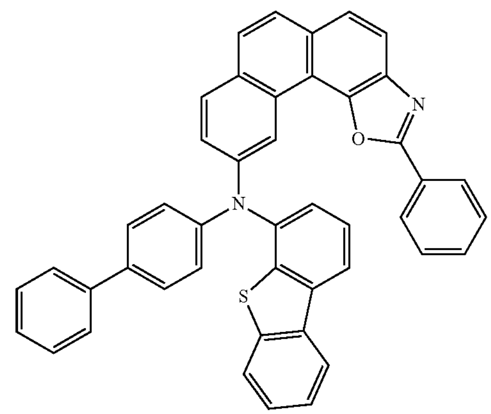
H-188
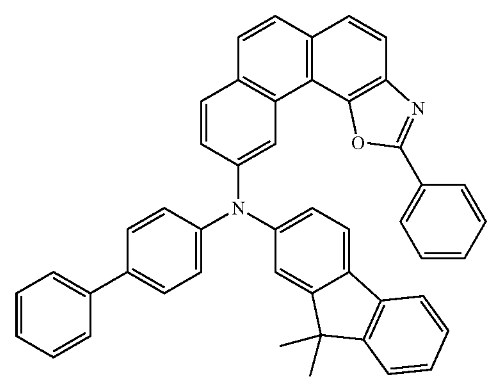
H-189
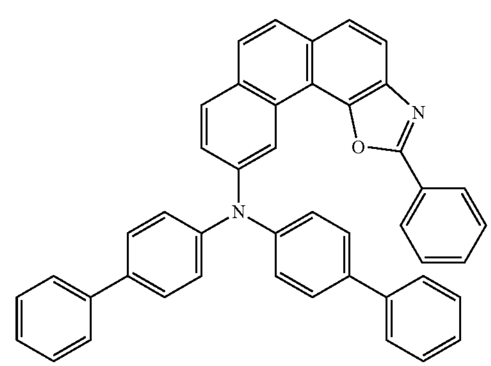

-continued
H-190
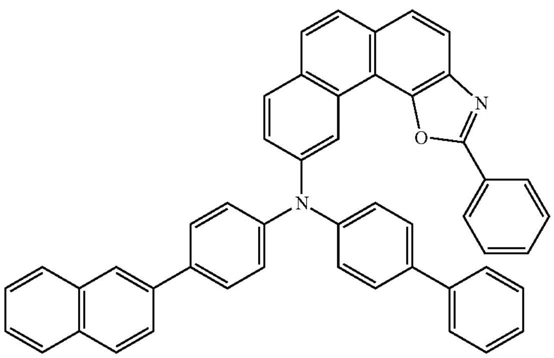
H-191
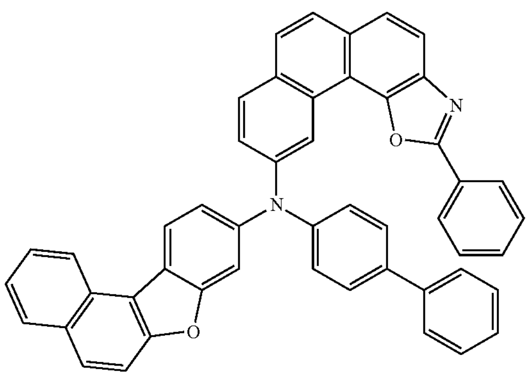
H-192
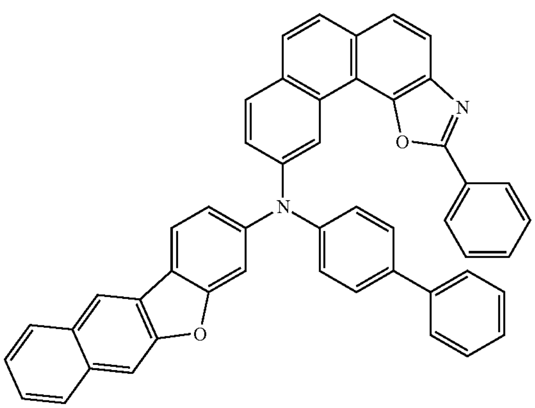
H-193
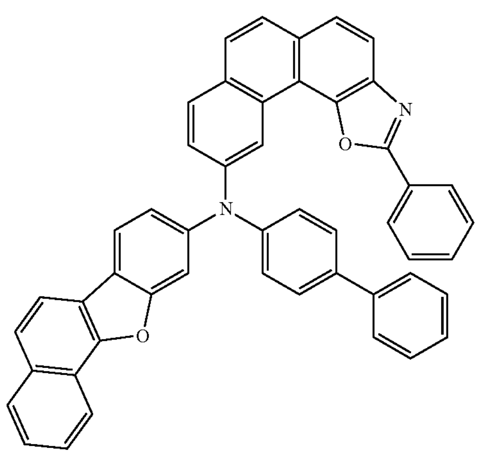
-continued
H-194
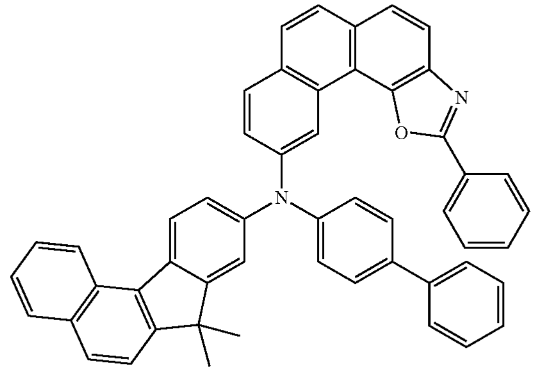
H-195
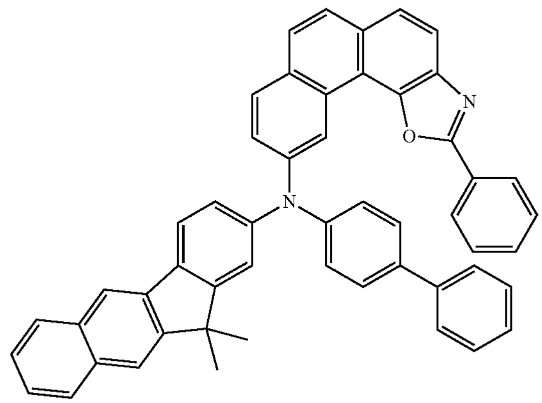
H-196
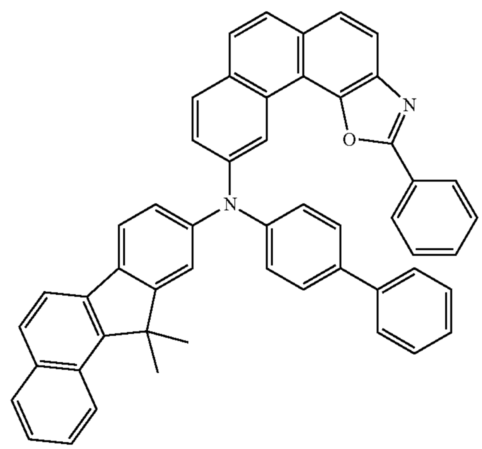
H-197
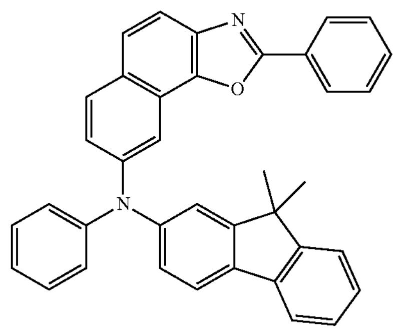

-continued
H-198
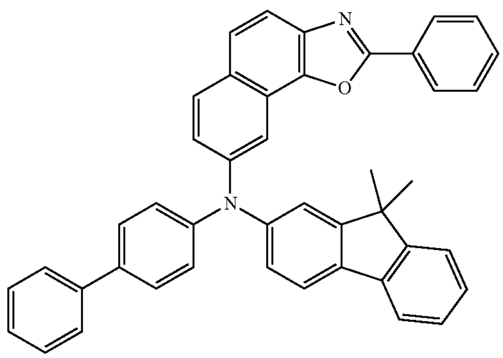
H-199
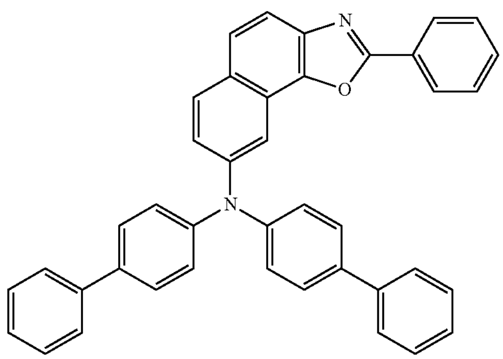
H-200
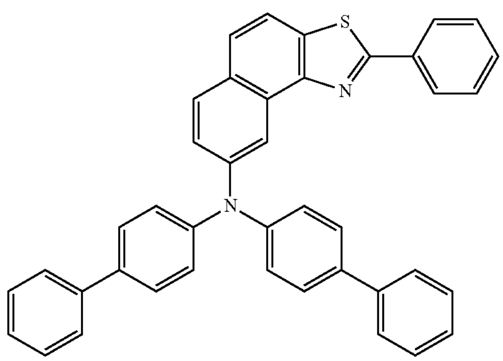
H-201
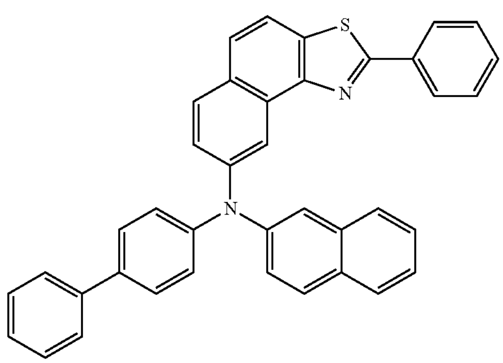
-continued
H-202
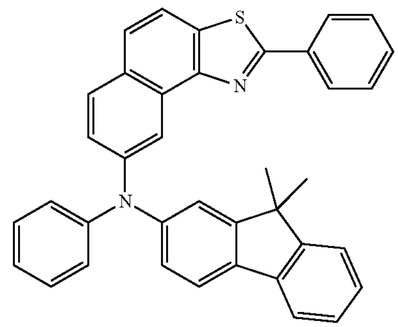
H-203
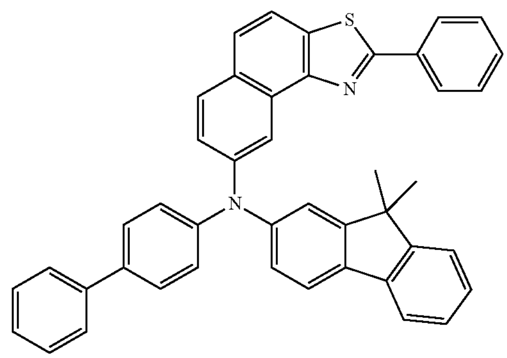
H-204
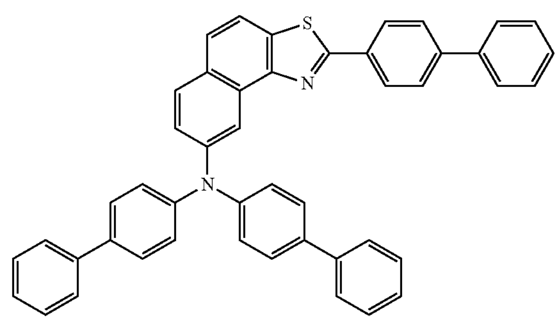
H-205
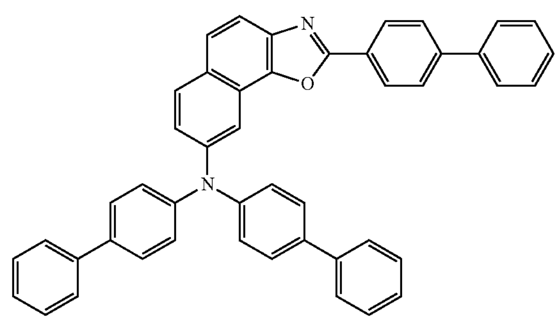

-continued
H-206
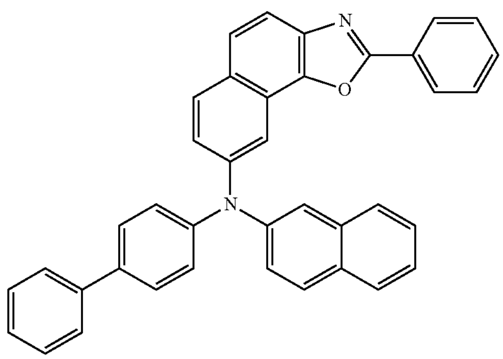
H-207
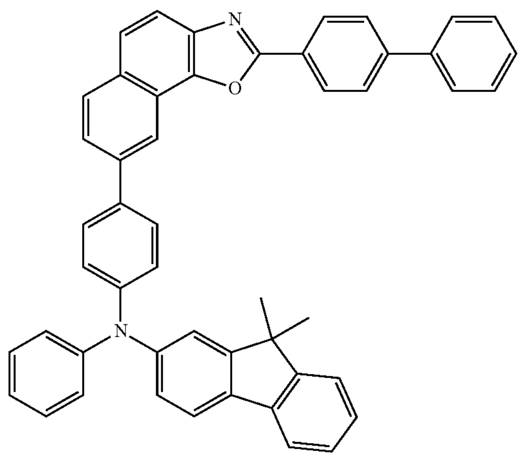
H-208
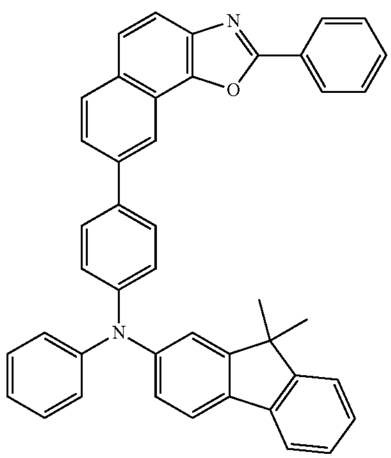
H-209
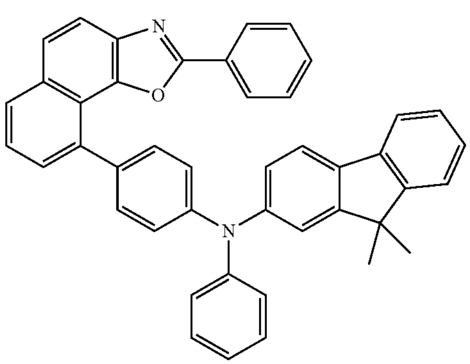
-continued
H-210
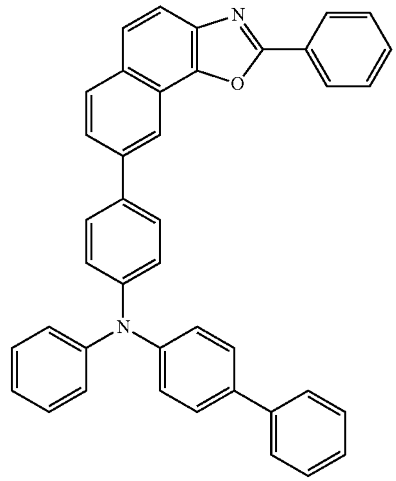
H-211
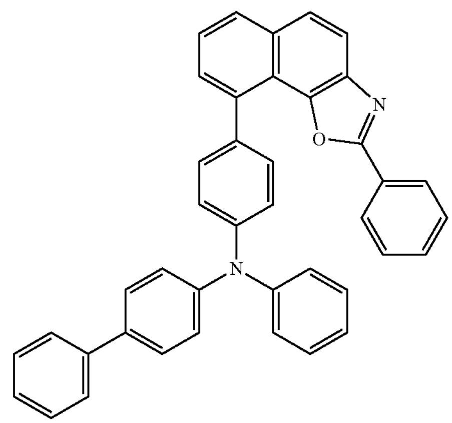
H-212
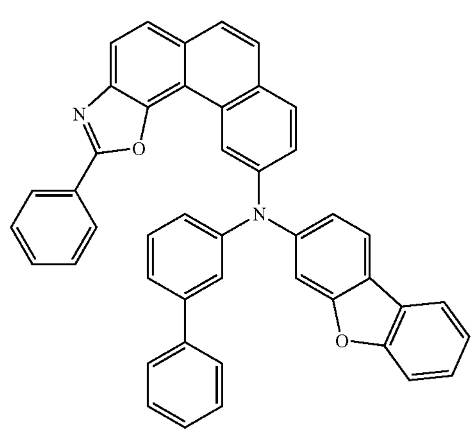

H-213
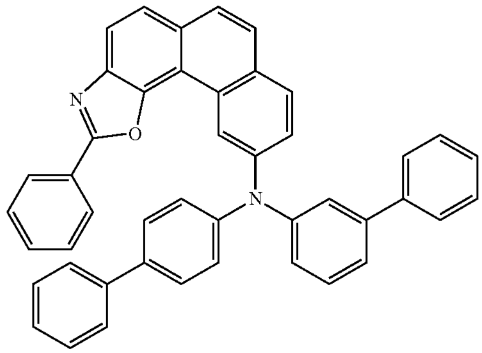
H-214
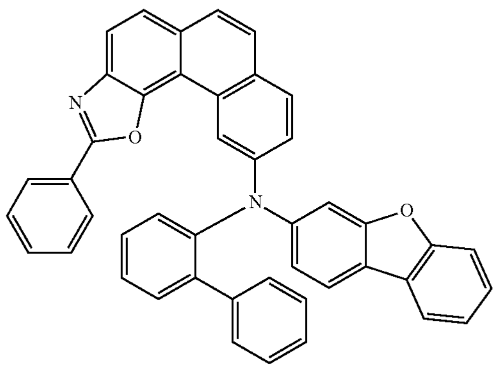
H-215
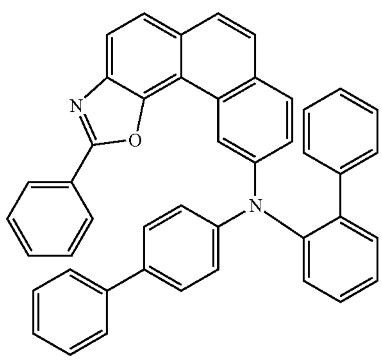
H-216
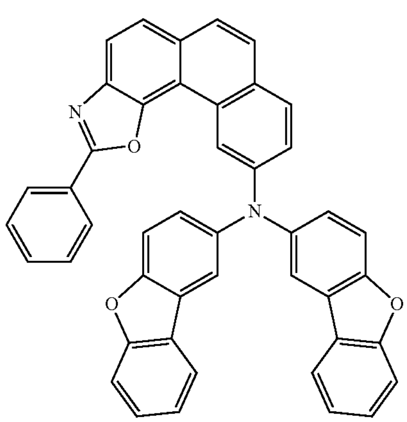
H-217
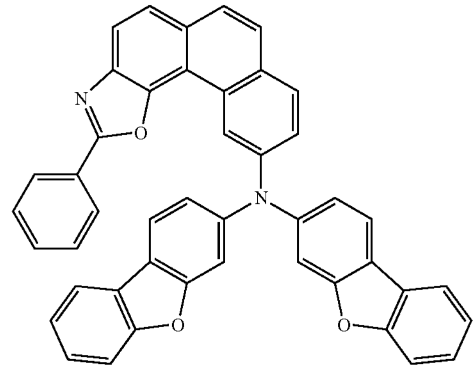
H-218
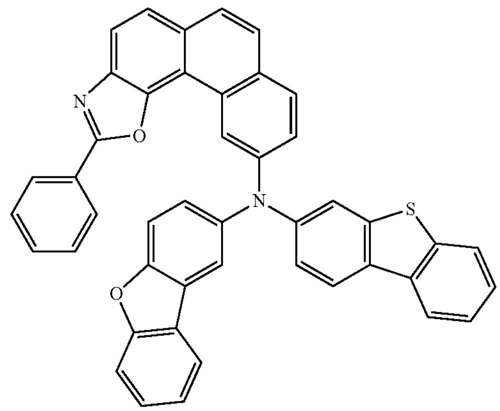
H-219
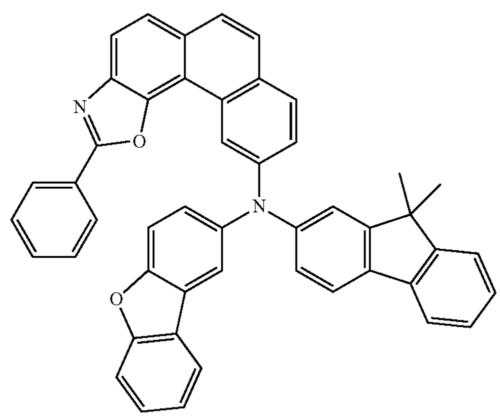
H-220
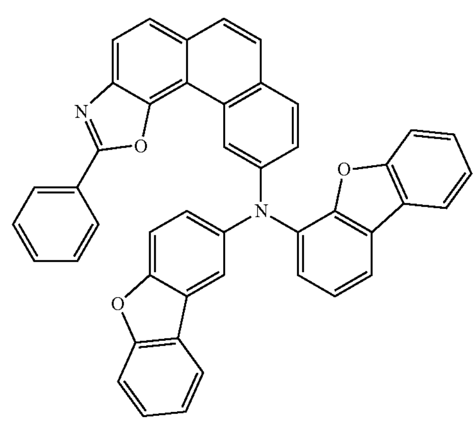

-continued
H-221
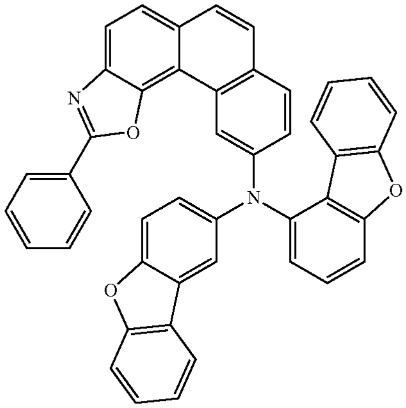
H-222
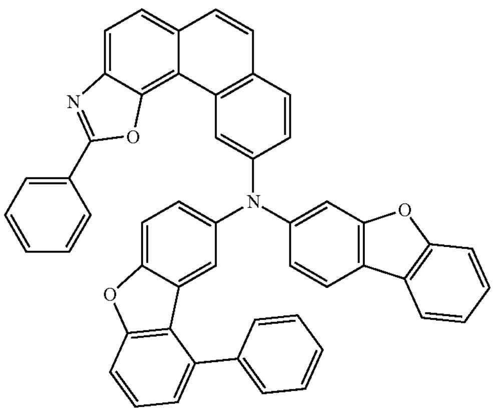
H-223
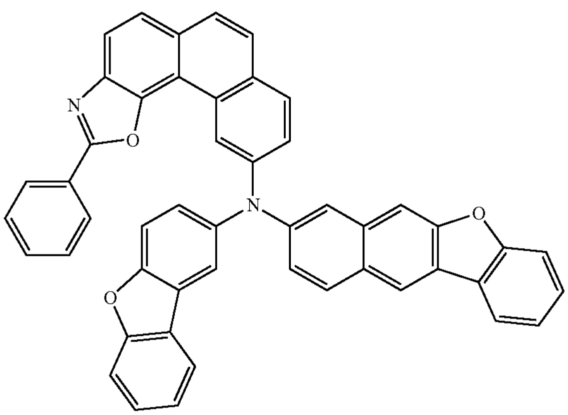
H-224
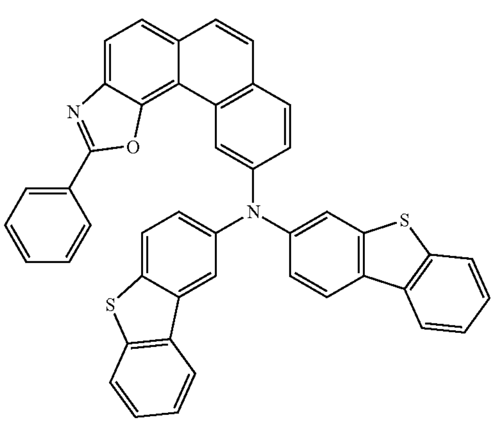
-continued
H-225
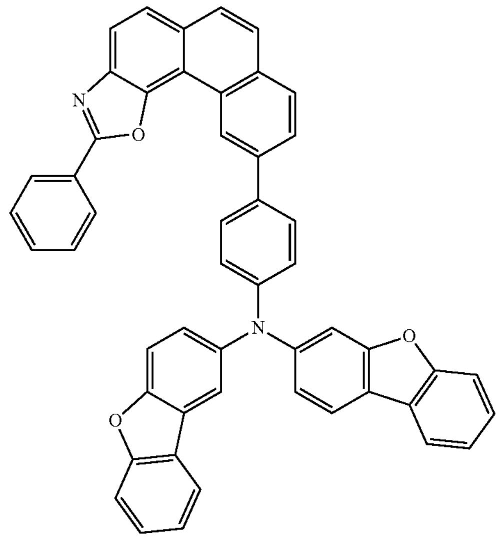
H-226
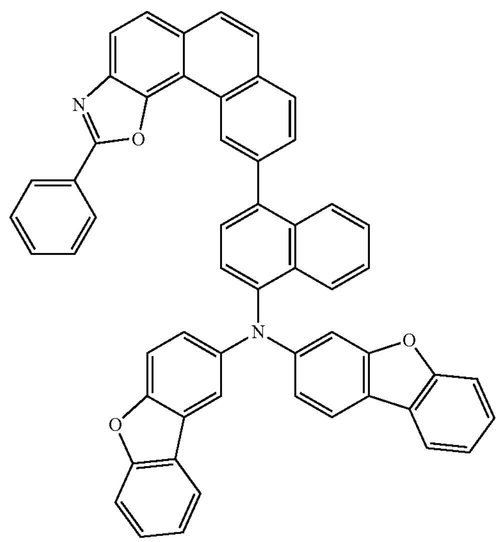
H-227
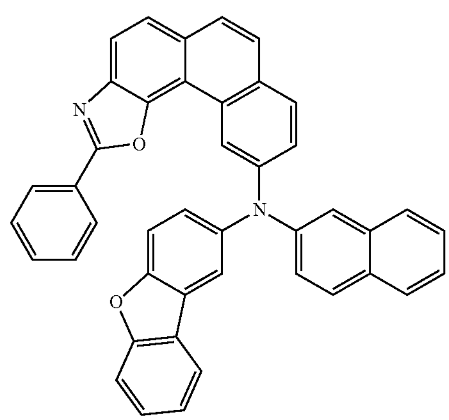

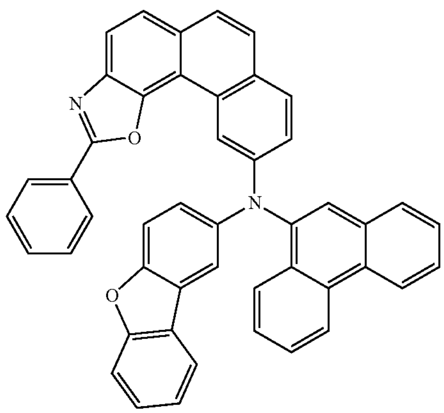
H-228
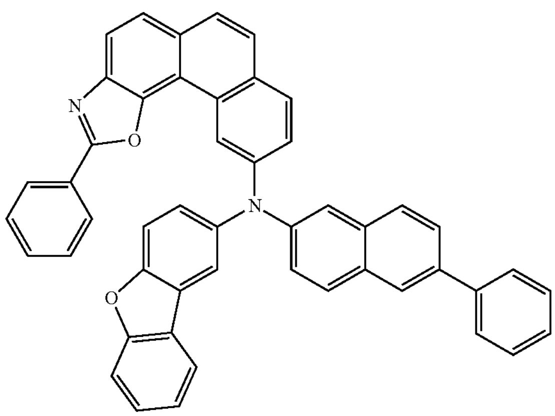
H-229
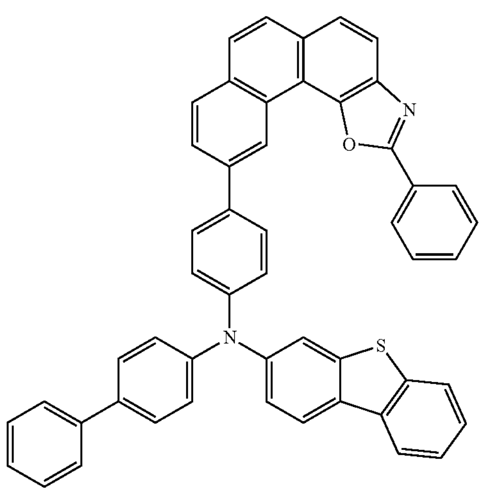
H-230
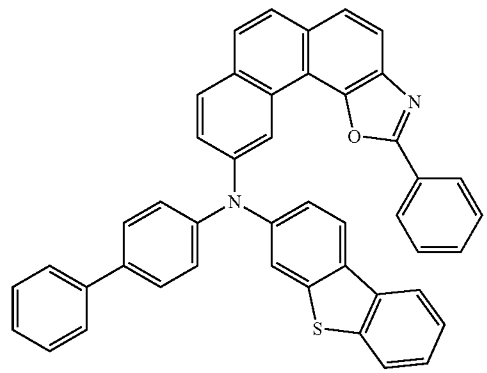
H-231
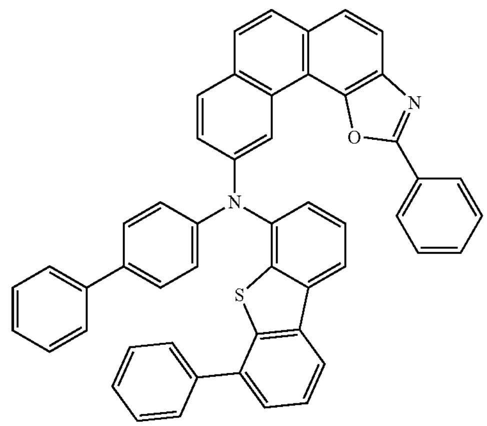
H-232
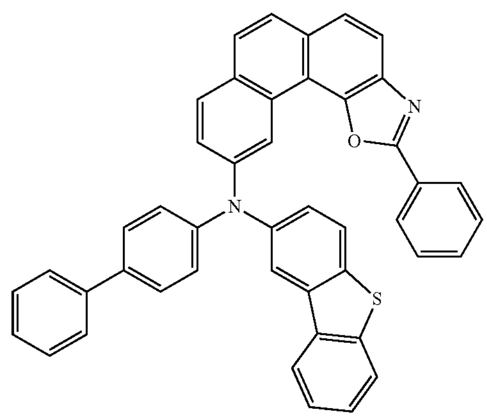
H-233
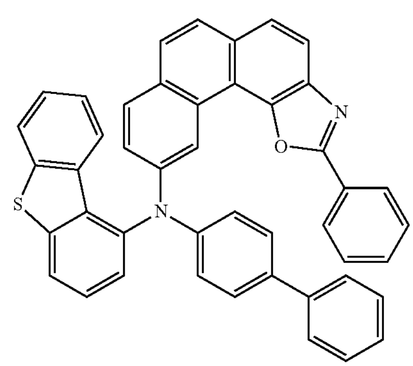
H-234

-continued
H-235
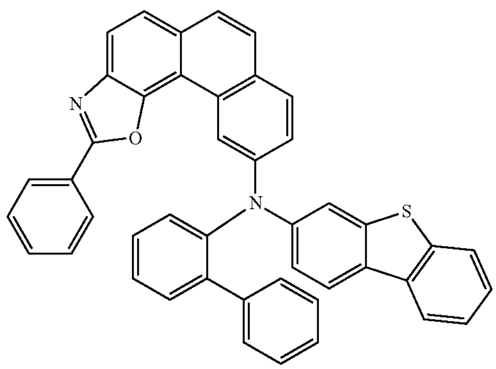
H-236
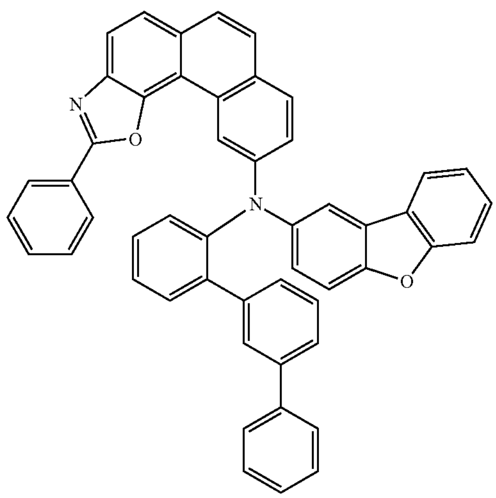
H-237
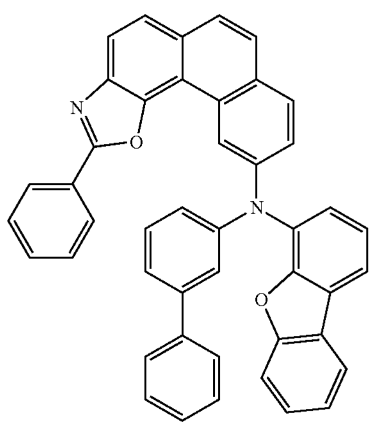
-continued
H-238
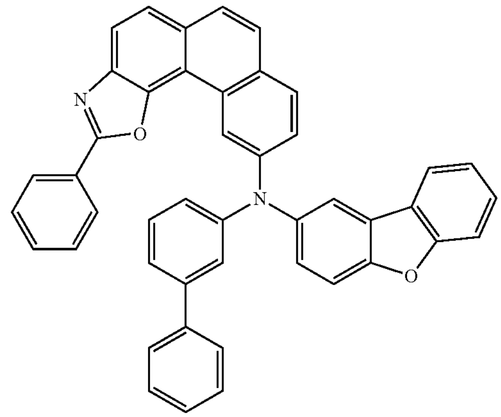
H-239
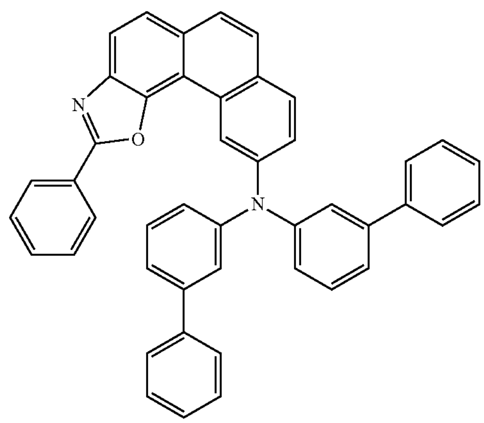
and
H-240
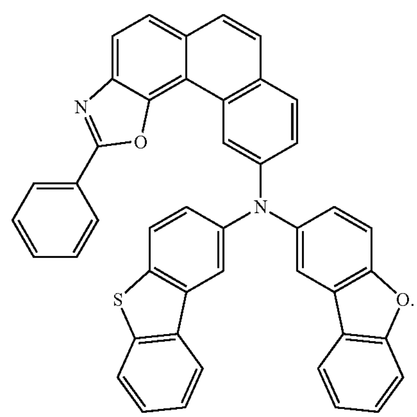
* * * * *